US008503186B2

(12) United States Patent
Lin et al.

(10) Patent No.: US 8,503,186 B2
(45) Date of Patent: Aug. 6, 2013

(54) SYSTEM-IN PACKAGES

(75) Inventors: Mou-Shiung Lin, Hsin-Chu (TW); Jin-Yuan Lee, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 289 days.

(21) Appl. No.: 12/841,981

(22) Filed: Jul. 22, 2010

(65) Prior Publication Data

US 2011/0026232 A1 Feb. 3, 2011

Related U.S. Application Data

(60) Provisional application No. 61/229,756, filed on Jul. 30, 2009.

(51) Int. Cl.
*H05K 7/02* (2006.01)

(52) U.S. Cl.
USPC ........... 361/760; 257/433; 257/686; 257/773; 257/774; 361/704; 361/762; 361/764

(58) Field of Classification Search
USPC ......... 257/686, 773, 774, E23.174; 361/704, 361/760, 762, 764
See application file for complete search history.

(56) References Cited

U.S. PATENT DOCUMENTS

| | | | | |
|---|---|---|---|---|
| 6,288,449 B1 * | 9/2001 | Bhowmik et al. | | 257/762 |
| 2005/0056903 A1 | 3/2005 | Yamamoto et al. | | |
| 2005/0122698 A1 * | 6/2005 | Ho et al. | | 361/761 |
| 2007/0120241 A1 | 5/2007 | Trezza et al. | | |
| 2008/0124845 A1 | 5/2008 | Yu et al. | | |
| 2008/0197469 A1 | 8/2008 | Yang et al. | | |
| 2009/0023243 A1 * | 1/2009 | Koyanagi | | 438/107 |
| 2009/0149023 A1 * | 6/2009 | Koyanagi | | 438/666 |
| 2010/0290191 A1 * | 11/2010 | Lin et al. | | 361/704 |

FOREIGN PATENT DOCUMENTS

EP 0635885 1/1995

OTHER PUBLICATIONS

PCT International Search Report and Written Opinion for International Application No. PCT/US2010/042958 dated Dec. 15, 2010.
Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.
Edelstein, D.C., "Advantages of Copper Interconnects," Proceedings of the 12th International IEEE VLSI Multilevel Interconnection Conference (1995) pp. 301-307.
Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

(Continued)

*Primary Examiner* — Matthew W Such
*Assistant Examiner* — David Spalla
(74) *Attorney, Agent, or Firm* — Seyfarth Shaw LLP

(57) ABSTRACT

System-in packages, or multichip modules, are described which can include multi-layer chips and multi-layer dummy substrates over a carrier, multiple through vias blindly or completely through the multi-layer chips and completely through the multi-layer dummy substrates, multiple metal plugs in the through vias, and multiple metal interconnects, connected to the metal plugs, between the multi-layer chips. The multi-layer chips can be connected to each other or to an external circuit or structure, such as mother board, ball grid array (BGA) substrate, printed circuit board, metal substrate, glass substrate, or ceramic substrate, through the metal plugs and the metal interconnects.

20 Claims, 244 Drawing Sheets

(56) References Cited

OTHER PUBLICATIONS

Gao, X. et al. "An improved electrostatic discharge protection structure for reducing triggering voltage and parasitic capacitance," Solid-State Electronics, 27 (2003), pp. 1105-1110.
Yeoh, A. et al. "Copper Die Bumps (First Level Interconnect) and Low-K Dielectrics in 65nm High Volume Manufacturing," Electronic Components and Technology Conference (2006) pp. 1611-1615.
Roesch, W. et al. "Cycling copper flip chip interconnects," Microelectronics Reliability, 44 (2004) pp. 1047-1054.
Lee, Y-H. et al. "Effect of ESD Layout on the Assembly Yield and Reliability," International Electron Devices Meeting (2006) pp. 1-4.
Yeoh, T-S. "ESD Effects on Power Supply Clamps," Proceedings of the 6th International Symposium on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.
Venkatesan, S. et al. "A High Performance 1.8V, 0.20 pm CMOS Technology with Cooper Metallization," Technical Digest IEEE International Electron Devices Meeting (1997) pp. 769-772.
Jenei, S. et al. "High Q Inductor Add-on Module in Thick Cu/SiLK™ single damascene," Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.
Sakran, N. et al. "The Implementation of the 65nm Dual-Core 64b Merom Processor," IEEE International Solid-State Circuits Conference, Session 5, Microprocessor, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.
Kurd, N. et al. "Next Generation Intel® Micro-architecture (Nehalem) Clocking Architecture," Symposium on VLSI Circuits Digest of Technical Papers (2008) pp. 62-63.
Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device,"Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
Megic Corp. "MEGIC way to system solutions through bumping and redistribution,"(Brochure) (Feb. 6, 2004) pp. 1-3.
Lin, M.S. "Post Passivation Technology™ MEGIC® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.
Chiang, C., Ph.D; "TSV-EDS Challenges & Solutions"; Synopsys, Inc.; Sep. 10, 2008; pp. 1-22.
De Moor, P., et al.; "Recent Advances in 3D Integrations at IMEC"; Mater. Res. Soc. Symp. Proc.; vol. 970; 2007; pp. 1-10.
Deptuch, G. et al.; "3D-IC Technology for Future Detectors"; Fermilab; Feb. 17, 2009; pp. 1-32.
Ehrmann, O.; "Future Directions in Hybridization of Pixel Detectors"; Fraunhofer Institut for Reliability and Microintegration IZM; Sep. 9-12, 2002; pp. 1-38.
Ehrmann, O.; "Wafer Level System Integration"; Fraunhofer Institut for Reliability and Microintegration IZM; pp. 1-42.
Fukushima, T. et al.; "New Three-Dimensional Integration Technology Using Self-Assembly Technique"; downloaded Feb. 28, 2010; IEEE Xplore; pp. 1-4.
Gruber, P. et al.; "3D Packaging Micro Bumping"; IBM T.J. Watson Research Center; Jul. 16, 2008; pp. 1-21.
Gupta, S. et al.; "Techniques for Producing 3D ICs with High-Density Interconnect", Tezzaron Semiconductor Corporation; pp. 1-5.
Ishino, M. et al.; "Latest ASET Activities for System-Integration R&D in Japan"; ASET; Sep. 2001; pp. 1-26.
Iwasaki, T. et al.; Development of 30 Micron Pitch Bump Interconnections for COC-FCBGA; 2006; IEEE; pp. 1216-1222.
Kawano, M. et al.; "A 3D Packaging Technology for 4 Gbit Stacked DRAM With 3 Gbps Data Transfer"; NEC Electronics; downloaded Jul. 8, 2010 from IEEE Xplore; pp. 1-4.
Koyanagi, M. et al.; "Neuromorphic Vision Chip Fabricated Using Three-Dimensional Integration Technology"; IEEE International Solid-State Circuits Conference; 2001; pp. 1-3.
Koyanagi, M. et al.; "Three-Dimension Integration Technology Based on Wafer Bonding With Vertical Buried Interconnections"; downloaded Mar. 8, 2010; IEEE Xplore; pp. 2799-2808.
Kurino H., et al.; "Intelligent Image Sensor Chip With Three Dimensional Structure"; downloaded Jul. 8, 2010 from IEEE Xplore (IEDM 99); pp. 879-882.
Kurino, H. et al.; "Three-Dimensional Integration Technology for Real Time Micro-Vision System"; downloaded Dec. 17, 2009; IEEE Xplore; pp. 203-212.
Lee, K.W. et al.; Three-Dimensional Shared Memory Fabricated Using Wafer Stacking Technology; Dept. of Machine Intelligence and System Engineering; Tohoku University; downloaded Jul. 8, 2010 from IEEE Xplore; pp. 165-168.
Mitsuhashi, T. et al.; "Development of 3D-Packaging Process Technology for Stacked Memory Chips"; Mater. Res. Soc. Symp. vol. 970; 2007; pp. 1-8.
Ohdomari, I.; "Prospect for Future Applications of Si Nano-Technology"; Ambient SoC Symp.; pp. 1-56.
Ono, T., et al.; "Three-Dimensional Processor System Fabricated by Wafer Stacking Technology"; Dept. of Machine Intelligence and System Engineering; Tohoku University; 2002 Cool Chips V (Apr. 19, 2002) pp. 1-9.
Prismark Partners LLC; "3D Packaging: PoP, TSS/TSV, Face to Face Bonding"; Sep. 9, 2009; pp. 1-128.
Reif, R. et al. Fabrication Technologies for Three-Dimensional Integrated Circuites; downloaded Jul. 20, 2010; IEEE Xplore; pp. 1-5.
Sony, "Sony Leads the Industry in Mass Producing Devices that Achieve the Same Performance as Embedded DRAM LSIs in the Low-Cost SiP Process"; pp. 1-4.
Swinnen, B. et al; "Introduction to IMEC's Research Programs on 3D-Technology 3D-WLP/3D-SIC"; imec; 2007; pp. 1-72.
Yarema R.; "3D Technology Issues and On-Going Developments at FNAL"; ILC Vertec Workshop; Apr. 23, 2008; Mennagio, Italy; pp. 1-47.
Yarema, R.; "Development of 3D Integrated Circuits for HEP"; 12th LHC Electronics Workshop; Sep. 25-29, 2006; Valencia, Spain; pp. 1-51.
Hu C.K., et al., "Copper-Polyimide Wiring Technology for VLSI Circuits," Materials Research Society Symposium Proceedings VLSI V, 1990, pp. 369-373.

* cited by examiner

SYSTEM-IN PACKAGES

RELATED APPLICATION

This application claims priority to U.S. provisional application No. 61/229,756, filed on Jul. 30, 2009, which is incorporated herein by reference in its entirety.

BACKGROUND OF THE DISCLOSURE

1. Field of the Disclosure

The disclosure relates to system-in packages, and more particularly, to system-in packages that include through vias formed in stacked chips and in stacked dummy substrates and utilize metal plugs formed in the through vias for electrical interconnection between the stacked chips.

2. Brief Description of the Related Art

Semiconductor wafers are processed to produce IC (integrated circuit) chips having ever-increasing device density and shrinking feature geometries. Multiple conductive and insulating layers are required to enable the interconnection and isolation of the large number of semiconductor devices in different layers. Such large scale integration results in an increasing number of electrical connections between various layers and semiconductor devices. It also leads to an increasing number of leads to the resultant IC chip. These leads are exposed through a passivation layer of the IC chip, terminating in I/O pads that allow connections to external contact structures in a chip package.

Wafer-Level Packaging (WLP) commonly refers to the technology of packaging an IC chip at wafer level, instead of the traditional process of assembling the package of each individual unit after wafer dicing. WLP allows for the integration of wafer fabrication, packaging, test, and burn-in at the wafer level, before being singulated by dicing for final assembly into a chip carrier package, e.g., a ball grid array (BGA) package. The advantages offered by WLP include less size (reduced footprint and thickness), lesser weight, relatively easier assembly process, lower overall production costs, and improvement in electrical performance. WLP therefore streamlines the manufacturing process undergone by a device from silicon start to customer shipment. While WLP is a high throughput and low cost approach to IC chip packaging, it however invites significant challenges in manufacturability and structural reliability.

SUMMARY OF THE DISCLOSURE

The present disclosure is directed to a system-in package or multichip module that include multi-layer chips and multi-layer dummy substrates over a carrier, multiple through vias blindly or completely through the multi-layer chips and completely through the multi-layer dummy substrates, multiple metal plugs in the through vias, and multiple metal interconnects, connected to the metal plugs, between the multi-layer chips. The multi-layer chips can be connected to each other or to an external circuit of the system-in package or multichip module, such as mother board, ball grid array (BGA) substrate, printed circuit board, metal substrate, glass substrate, or ceramic substrate, through the metal plugs and the metal interconnects.

Exemplary embodiments of the present disclosure provide system-in packages or multichip modules having multi-layer chips and using metal plugs blindly or completely through the multi-layer chips for inter-chip interconnection or intra-chip interconnection. In one aspect, the invention is directed to a system-in package comprising a carrier, and a first chip over said carrier, wherein said first chip comprises a first semiconductor substrate having a thickness between 1 and 50 micrometers, a first metal layer under a bottom surface of said first semiconductor substrate, and a dielectric layer under said bottom surface of said first semiconductor substrate and over said first metal layer. The system-in package further includes a second chip over said carrier, wherein said second chip comprises a second semiconductor substrate, wherein said second semiconductor substrate has a top surface substantially coplanar with a top surface of said first semiconductor substrate, wherein said second chip is separated from said first chip. Also included are a gap filling material disposed in a gap between said first chip and said second chip, a first metal plug in said first chip, wherein said first metal plug passes through said first semiconductor substrate and said dielectric layer and contacts said first metal layer, and a first insulating material enclosing said first metal plug, wherein said first insulating material is enclosed by said first semiconductor substrate. The system-in package further includes a first dielectric structure on said top surface of said first semiconductor substrate, on said top surface of said second semiconductor substrate, and on said gap filling material, and a first metal interconnect in said first dielectric structure and over said first chip, wherein said first metal interconnect is connected to said first metal plug. Also included in the system-in package are a third chip over said first dielectric structure and over said first metal interconnect, wherein said third chip comprises a third semiconductor substrate having a thickness between 1 and 50 micrometers, and a second metal plug in said third chip, wherein said second metal plug passes through said third chip and contacts said first metal interconnect. The system-in package further includes a second insulating material enclosing said second metal plug, wherein said second insulating material is enclosed by said third semiconductor substrate, a second dielectric structure on a top surface of said third semiconductor substrate, and a second metal interconnect in said second dielectric structure and over said third chip, wherein said second metal interconnect is connected to said second metal plug.

Furthermore, exemplary embodiments can provide for ease for manufacturing multi-layer chip integration.

Furthermore, exemplary embodiments can provide dummy substrates placed between chips to achieve good uniformity of silicon thinning.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
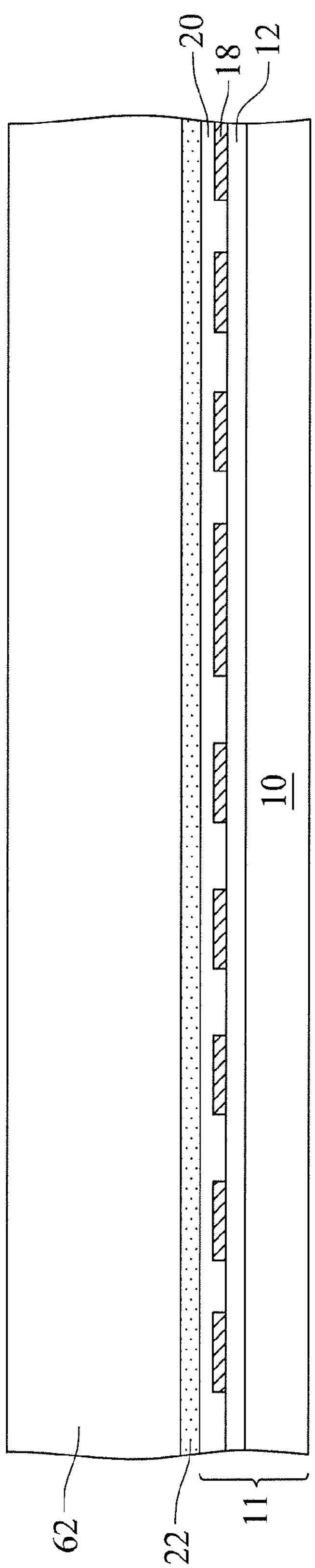
FIGS. 1-82 show a process for forming a system-in package or multichip module according to an exemplary embodiment of the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Figure 82:
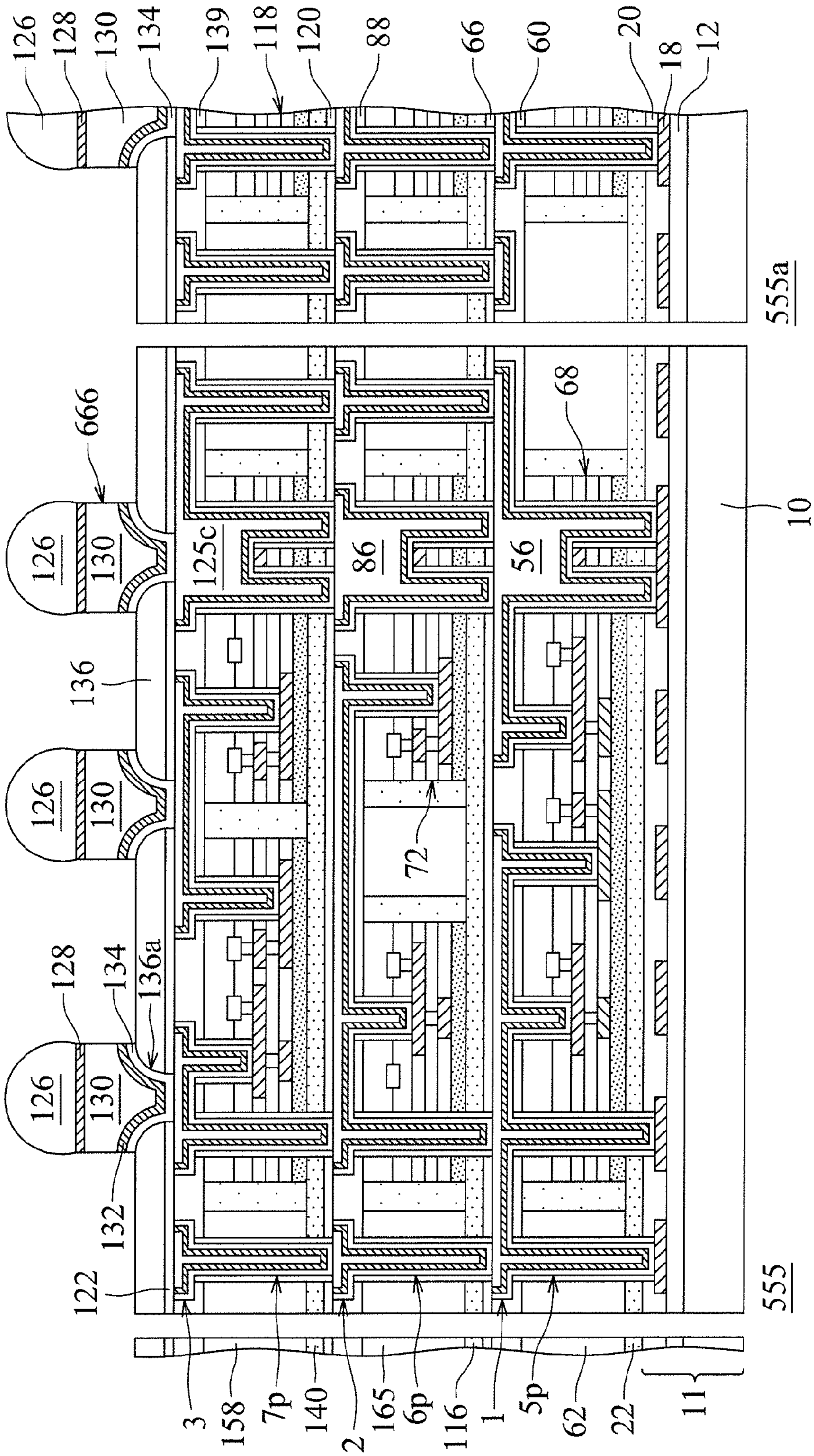

FIGS. 1-82 show a process for forming a system-in package or multichip module according to an exemplary embodiment of the present disclosure.

Referring to FIG. 1, a dummy substrate 62 can be attached onto a carrier 11, e.g., by the following steps. First, a glue layer 22 having a thickness, e.g., between 3 and 100 micrometers, and preferably between 5 and 10 micrometers or between 10 and 30 micrometers, can be formed on a top surface of the carrier 11 or on a bottom surface of the dummy substrate 62 by using, e.g., a spin coating process, a lamination process, a spraying process, a dispensing process, or a screen printing process. Next, the glue layer 22 can be optionally pre-cured or baked. Next, the dummy substrate 62 can be placed over the carrier 11 with the glue layer 22 between the carrier 11 and the dummy substrate 62. Next, the glue layer 22 can be cured again in a temperature between 180 degrees centigrade and 350 degrees centigrade with a mechanical or thermal pressure on the glue layer 22. Accordingly, the dummy substrate 62 can be joined with the carrier 11 using the glue layer 22. The glue layer 22 can be a polymer layer, such as a layer of epoxy, polyimide, benzocyclobutene (BCB), polybenzoxazole (PBO), poly-phenylene oxide (PPO), or silosane, with a thickness, e.g., between 3 and 100 micrometers, and preferably between 5 and 10 micrometers or between 10 and 30 micrometers.

Alternatively, the glue layer 22 can be replaced with a silicon-oxide layer that can be formed on the dielectric or insulating layer 20 of the carrier 11. In this case, the dummy substrate 62 can be joined with the carrier 11, e.g., by bonding a silicon-oxide layer of the dummy substrate 62 onto the silicon-oxide layer 22. The silicon-oxide layer of the dummy substrate 62 contacts the silicon-oxide layer 22.

The dummy substrate 62 can, for example, be a round wafer, a dummy silicon wafer, a rectangular panel, or a substrate of polysilicon, glass, silicon or ceramic. The dummy substrate 62, before being ground or polished as mentioned in the following processes, may have a thickness, e.g., greater than 100 micrometers, such as between 100 and 1,500 micrometers, and preferably between 200 and 500 micrometers or between 100 and 300 micrometers.

In one embodiment, there are no circuits preformed in the dummy substrate 62 or on a top or bottom surface of the dummy substrate 62 before the dummy substrate 62 is joined with the carrier 11. The dummy substrate 62 may have a top surface with a profile that is substantially same as that of a top surface of the carrier 11.

The carrier 11 can be a wafer, a panel, a print circuit board (PCB), or an organic ball-grid-array (BGA) substrate, and the carrier 11 can include a substrate 10, a dielectric layer 12 on a top side of the substrate 10, a conductive layer 18 on the dielectric layer 12, and a dielectric or insulating layer 20 on the conductive layer 18. The substrate 10 can be a silicon substrate, a glass substrate, a ceramic substrate, an aluminum substrate, a copper substrate, or an organic polymer substrate. The substrate 10 can have a thickness, e.g., between 10 and 1,000 micrometers, between 10 and 100 micrometers, or between 100 and 500 micrometers. The dielectric layer 12 can be a layer of silicon oxide (such as $SiO_2$), silicon nitride (such as $Si_3N_4$), silicon carbon nitride (such as SiCN), silicon oxynitride (such as SiON), silicon oxycarbide (such as SiOC), or polymer (such as polyimide, benzocyclobutene (BCB), polybenzoxazole (PBO), poly-phenylene oxide (PPO), epoxy, or silosane). The dielectric layer 12 may have a thickness, e.g., between 0.3 and 30 micrometers, and preferably between 1 and 10 micrometers. The conductive layer 18, for example, can be a patterned metal layer, and the patterned metal layer may include an adhesion/barrier layer, such as a layer of titanium, a titanium-tungsten alloy, titanium nitride, chromium, tantalum, tantalum nitride, nickel or nickel vanadium, with a thickness, e.g., between 1 nanometer and 0.5 micrometers, a sputtered seed layer, such as a layer of copper, silver, gold, or a titanium-copper alloy, with a thickness, e.g., between 10 nanometers and 0.8 micrometers on the adhesion/barrier layer, and an electroplated metal layer, such as a layer of copper, silver or gold with a thickness, e.g., between 10 nanometers and 2 micrometers, and preferably between 50 nanometers and 1 micrometer, or with a thickness, e.g., between 2 and 30 micrometers, and preferably between 3 and 10 micrometers, on the sputtered seed layer. The dielectric or insulating layer 20, for example, can be a layer of silicon oxide (such as $SiO_2$), silicon nitride (such as $Si_3N_4$), silicon carbon nitride (such as SiCN), silicon oxynitride (such as SiON), silicon oxycarbide (such as SiOC), solder mask, or polymer (such as polyimide, benzocyclobutene (BCB), polybenzoxazole (PBO), poly-phenylene oxide (PPO), epoxy, or silosane). The thickness of the dielectric or insulating layer 20 above the conductive layer 18 may be in the range between 0.3 and 30 micrometers, and preferably between 1 and 10 micrometers.

In a first embodiment, the carrier 11 can be a round wafer including the silicon substrate 10, multiple active devices, such as transistors, in and/or over the silicon substrate 10, the dielectric layer 12 on the silicon substrate 10, the patterned metal layer 18 on the dielectric layer 12, and the dielectric or insulating layer 20, such as a layer of silicon oxide (such as $SiO_2$), silicon nitride (such as $Si_3N_4$), silicon oxynitride (such as SiON), silicon oxycarbide (such as SiOC), silicon carbon nitride (such as SiCN), or polymer (such as polyimide, benzocyclobutene, polybenzoxazole, or poly-phenylene oxide), on the patterned metal layer 18.

In a second embodiment, the carrier 11 can be a round wafer including the silicon substrate 10, multiple passive devices, such as resistors, inductors or capacitors, in and/or over the silicon substrate 10, the dielectric layer 12 on the silicon substrate 10, the patterned metal layer 18 on the dielectric layer 12, and the dielectric or insulating layer 20, such as a layer of silicon oxide (such as SiO2), silicon nitride (such as Si3N4), silicon carbon nitride (such as SiCN), silicon oxynitride (such as SiON), silicon oxycarbide (such as SiOC), or polymer (such as polyimide, benzocyclobutene, polybenzoxazole, or poly-phenylene oxide), on the patterned metal layer 18 and over the passive devices, but not including any active device, such as transistor, in and/or over the silicon substrate 10.

In a third embodiment, the carrier 11 can be a rectangular panel including the glass substrate 10, the dielectric layer 12 on the glass substrate 10, the conductive layer 18, such as indium-tin-oxide (ITO) layer, on the dielectric layer 12, and the dielectric or insulating layer 20 on the conductive layer 18.

In a fourth embodiment, the carrier 11 can be a print circuit board (PCB) or an organic ball-grid-array (BGA) substrate including the organic polymer substrate 10, the dielectric layer 12 on the organic polymer substrate 10, the patterned metal layer 18 on the dielectric layer 12, and the dielectric or insulating layer 20, such as a layer of solder mask or polymer (such as epoxy), on the patterned metal layer 18.

Alternatively, the carrier 11 can be formed without the layers 12, 18 and 20 over the substrate 10, i.e., the carrier 11 only has the substrate 10 without any circuit in the carrier 11. In this case, the layer 22 can be directly formed on the substrate 10.

Figure 2:
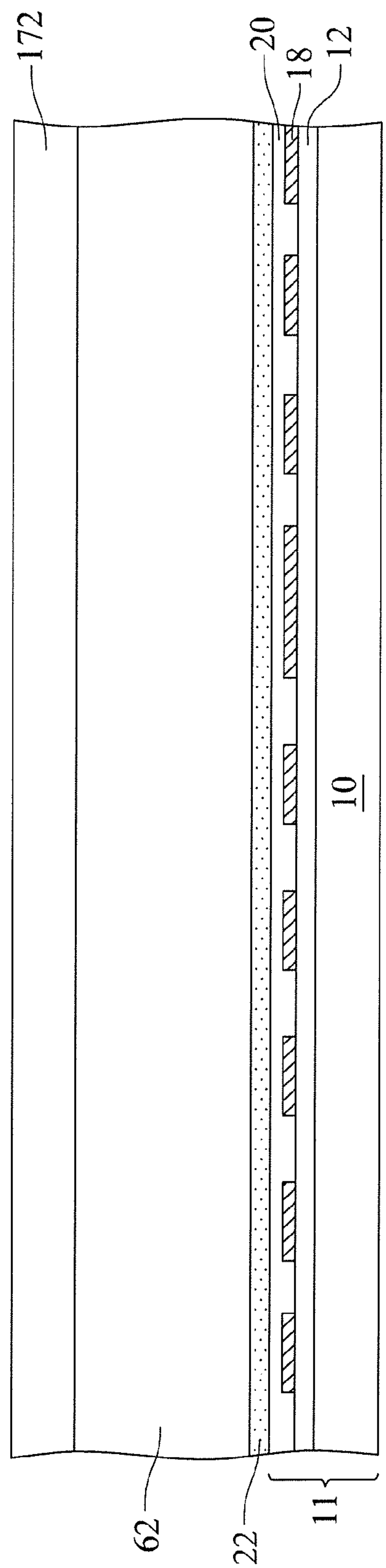
Figure 3:
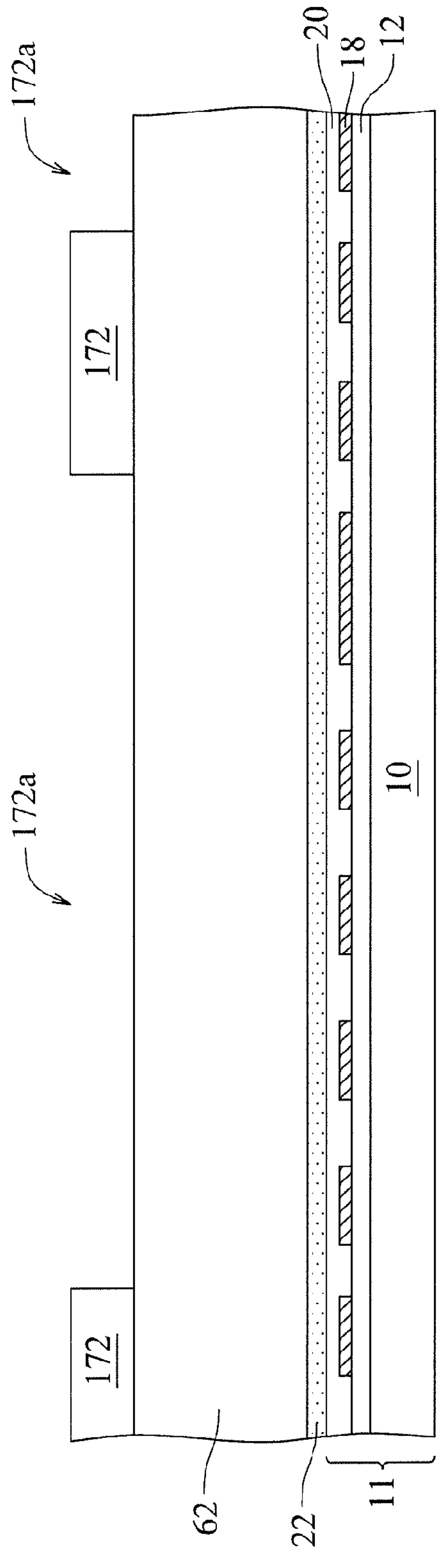
Figure 4:
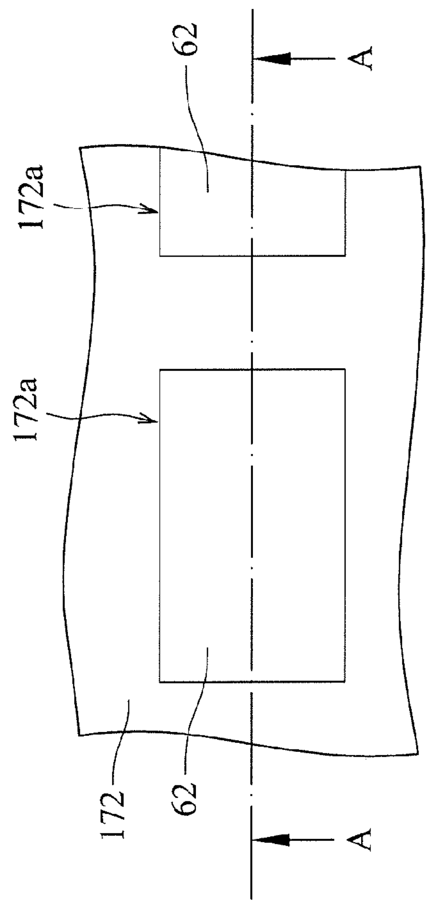

Next, referring to FIG. 2, a photoresist layer 172 can be formed on the dummy substrate 62 by using, e.g., a spin coating process, a screen printing process, or a lamination process. Next, referring to FIG. 3, a photo exposure process and a development process can be employed to form multiple openings 172*a*, exposing multiple regions of the dummy substrate 62, in the photoresist layer 172. The photoresist layer 172, after the photo exposure process and the development process, may have a thickness, e.g., between 10 and 200 micrometers. FIG. 4 shows a schematic top view of the photoresist layer 172 with the openings 172*a* as shown in FIG. 3, and FIG. 3 can be a cross-sectional view cut along the line A-A shown in FIG. 4.

Figure 5:
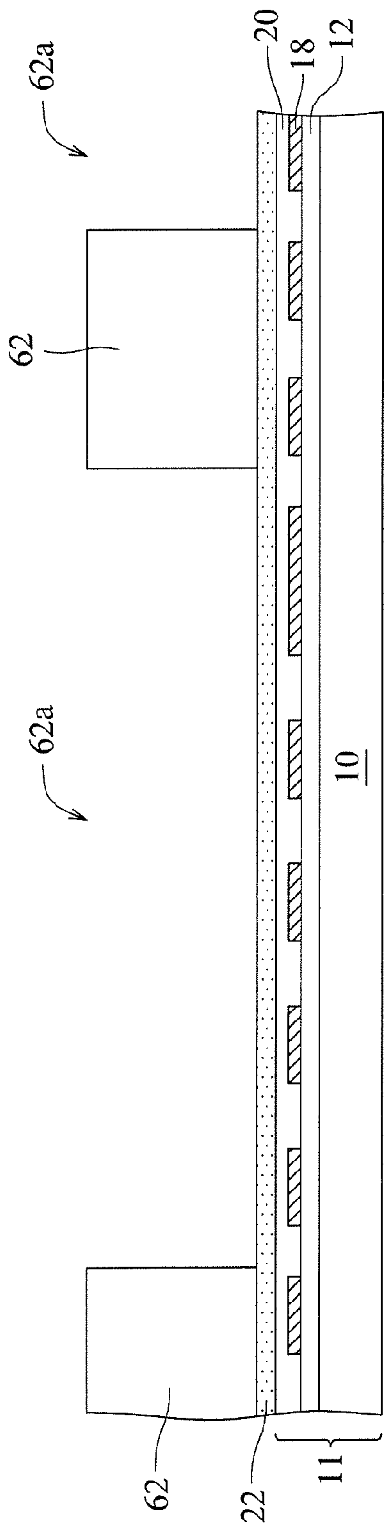
Figure 6:
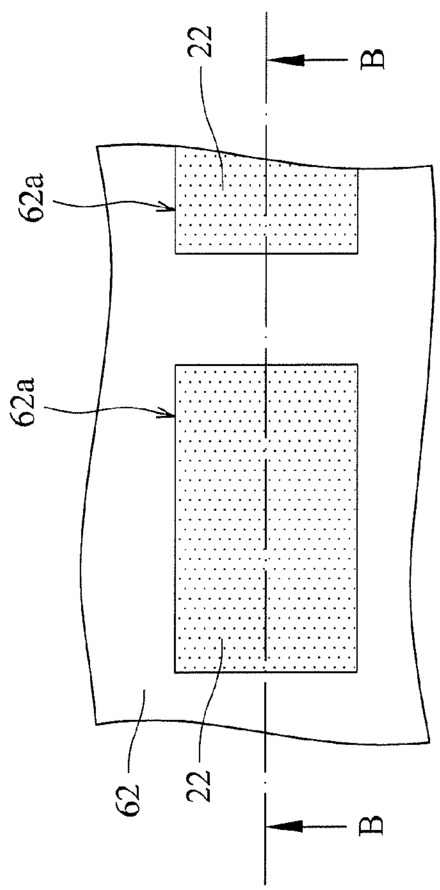

Next, referring to FIG. 5, multiple openings 62*a* are formed in the dummy substrate 62 and under the openings 172*a* in the photoresist layer 172, exposing the glue layer 22, using a chemical etching process or a plasma etching process, and then the patterned photoresist layer 172 is removed by using, e.g., an organic chemical. Alternatively, when the glue layer 22 is replaced with the silicon-oxide layer and the dummy substrate 62 has the silicon-oxide layer bonded with the silicon-oxide layer 22, the openings 62*a* are formed in the dummy substrate 62 and under the openings 172*a* in the photoresist layer 172, exposing the silicon-oxide layer of the dummy substrate 62, using a chemical etching process or a plasma etching process, and then the patterned photoresist 172 is removed by using, e.g., an organic chemical. FIG. 6 shows a schematic top view of the dummy substrate 62 with the openings 62*a* as shown in FIG. 5, and FIG. 5 can be a cross-sectional view cut along the line B-B shown in FIG. 6.

Alternatively, a hard mask (not shown), such as silicon oxide or silicon nitride, may be formed on the dummy substrate 62 shown in FIG. 5, e.g., by the following steps. First, the hard mask of silicon oxide or silicon nitride can be formed on the dummy substrate 62 shown in FIG. 1. Next, the photoresist layer 172 can be formed on the hard mask by using, e.g., a spin coating process, a screen printing process, or a lamination process. Next, a photo exposure process and a development process can be employed to form multiple openings 172*a*, exposing multiple regions of the hard mask, in the photoresist layer 172. Next, multiple openings are formed in the hard mask and under the openings 172*a* in the photoresist layer 172, exposing multiple regions of the dummy substrate 62, by using, e.g., a wet etching process or a plasma etching process. Next, the patterned photoresist layer 172 can be removed by using, e.g., an organic chemical. Next, multiple openings 62*a* are formed in the dummy substrate 62 and under the openings in the hard mask, exposing the glue layer 22, by using, e.g., a chemical etching process or a plasma etching process. Alternatively, when the glue layer 22 is replaced with the silicon-oxide layer and the dummy substrate 62 has the silicon-oxide layer bonded with the silicon-oxide layer 22, the openings 62*a* are formed in the dummy substrate 62 and under the openings in the hard mask, exposing the silicon-oxide layer of the dummy substrate 62, by using, e.g., a chemical etching process or a plasma etching process. The hard mask will be removed by the following grinding or polishing process.

Figure 7:
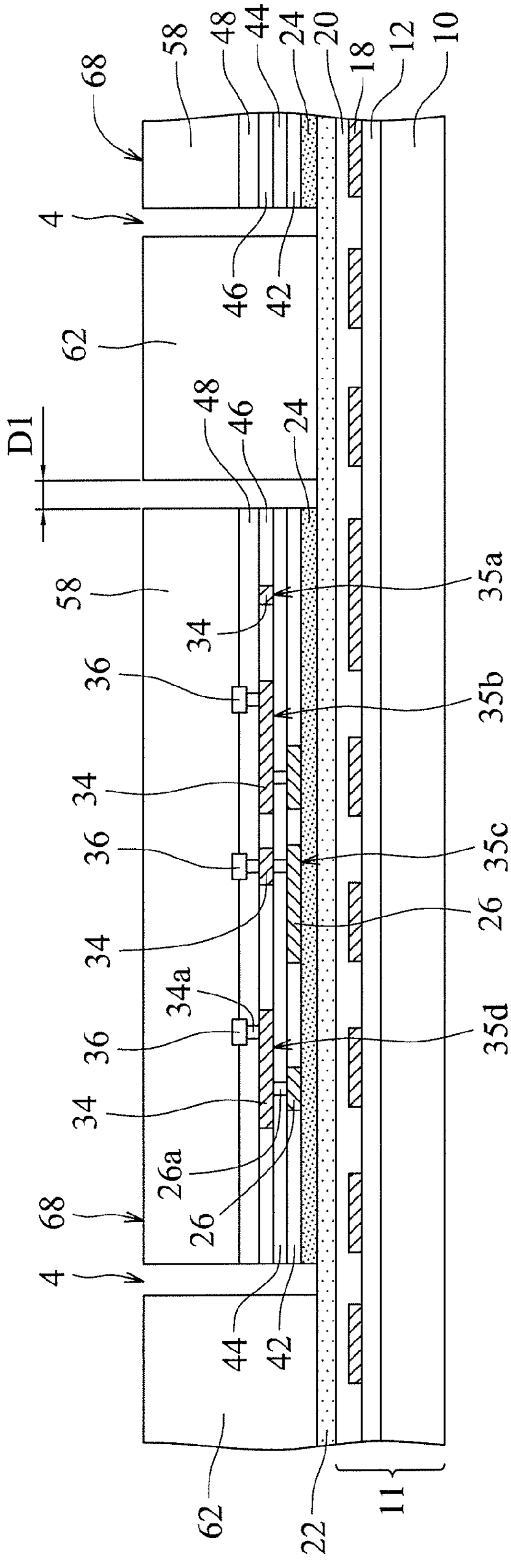
Figure 8:
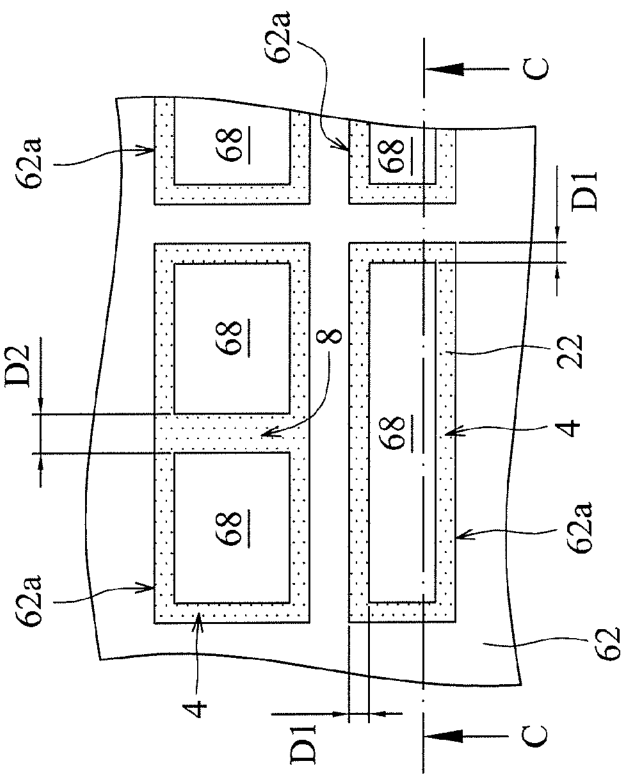

Next, referring to FIG. 7, multiple chips 68 are mounted over the carrier 11 and in the openings 62*a* in the dummy substrate 62, and the chips 68 have active sides at bottoms of the chips 68 and backsides at tops of the chips 68. In one case, one of the chips 68 may have different circuit designs from those of another one of the chips 68. Also, in another case, one of the chips 68 may have same circuit designs as those of another one of the chips 68. Alternatively, one of the chips 68 may have a different area (top surface) or size from that of another one of the chips 68. Also, in another case, one of the chips 68 may have a same area (top surface) or size as that of another one of the chips 68. FIG. 8 is an example of a schematical top view showing the chips 68 mounted in the openings 62*a* in the dummy substrate 62, and FIG. 7 is a cross-sectional view cut along the line C-C shown in the schematical top view of FIG. 8.

Mounting the chips 68 over the carrier 11 and in the openings 62*a* can be performed, e.g., by first forming a glue material (not shown) on the active sides of the chips 68 or on the glue layer 22, next placing the chips 68 in the openings 62*a* and over the glue layer 22 with the glue material contacting the glue layer 22, and then curing the glue material in a temperature between 180 degrees centigrade and 350 degrees centigrade with a mechanical or thermal pressure on the glue material. Accordingly, the chips 68 can be joined with the carrier 11 using the glue material.

Each of the chips 68 can include a semiconductor substrate 58, multiple semiconductor devices 36 in and/or on the semiconductor substrate 58, a passivation layer 24 under the semiconductor substrate 58, multiple dielectric layers 42, 44, 46 and 48 between the semiconductor substrate 58 and the passivation layer 24, a patterned metal layer 26 between the semiconductor substrate 58 and the passivation layer 24, an interconnection layer 34 between the semiconductor substrate 58 and the passivation layer 24, multiple via plugs 26*a* in the dielectric layer 44, and multiple via plugs 34*a* in the dielectric layer 48. The semiconductor substrate 58 is at the backside of each chip 68, and the semiconductor devices 36, the passivation layer 24, the patterned metal layer 26, the interconnection layer 34, the dielectric layers 42, 44, 46 and 48, and the via plugs 26*a* and 34*a* are at the active side of each chip 68.

The semiconductor substrate 58 can be a suitable substrate, such as silicon substrate, silicon-germanium (SiGe) substrate, or gallium-arsenide (GaAs) substrate. The semiconductor substrate 58 before being thinned as mentioned in the following processes may have a thickness, e.g., greater than 100 micrometers, such as between 100 and 500 micrometers, and preferably between 150 and 250 micrometers or between 100 and 300 micrometers.

Each of the semiconductor devices 36 can be a P-channel metal-oxide-semiconductor (PMOS) transistor, an N-channel metal-oxide-semiconductor (NMOS) transistor, a bipolar transistor, or a double-diffused metal-oxide-semiconductor (DMOS) transistor. Each of the semiconductor devices 36 can be provided for a NOR gate, a NAND gate, an AND gate, an OR gate, a flash memory cell, a static-random-access-memory (SRAM) cell, a dynamic-random-access-memory (DRAM) cell, a non-volatile memory cell, an erasable programmable read-only memory (EPROM) cell, a read-only memory (ROM) cell, a magnetic-random-access-memory (MRAM) cell, a sense amplifier, an inverter, an operational amplifier, an adder, a multiplexer, a diplexer, a multiplier, an analog-to-digital (A/D) converter, a digital-to-analog (D/A) converter, an analog circuit, a complementary-metal-oxide-semiconductor (CMOS) sensor, or a charge coupled device (CCD).

The passivation layer 24 may include or can be an inorganic dielectric layer having a bottom surface attached to the glue layer 22, and the inorganic dielectric layer can be a layer of silicon nitride (such as $Si_3N_4$), silicon carbon nitride (such as SiCN) or silicon oxynitride (such as SiON) with a thickness, e.g., between 0.3 and 1.5 micrometers. Alternatively, each of the chips 68 may further contain an organic polymer layer, such as a layer of polyimide, benzocyclobutene (BCB), polybenzoxazole (PBO), poly-phenylene oxide (PPO), epoxy, or silosane, with a thickness, e.g., greater than 3 micrometers, such as between 3 and 20 micrometers, and preferably between 5 and 12 micrometers, under and on the bottom surface of the inorganic dielectric layer of the passivation layer 24. In this case, the organic polymer layer has a bottom surface attached to the glue layer 22. The organic polymer layer has a top surface contacting the bottom surface of the inorganic dielectric layer of the passivation layer 24.

Alternatively, multiple openings (not shown) each having a width, e.g., between 0.5 and 100 micrometers, and preferably between 20 and 60 micrometers, may be formed in the passivation layer 24 and expose multiple contact points of the patterned metal layer 26.

The dielectric layer 42 can be between the passivation layer 24 and the dielectric layer 44. The dielectric layer 44 can be between the dielectric layers 42 and 46 and between the layers 26 and 34. The dielectric layer 46 can be between the dielectric layers 44 and 48. Each of the dielectric layers 42, 44 and 46 may include silicon oxide (such as $SiO_2$), silicon nitride (such as $Si_3N_4$), silicon carbon nitride (such as SiCN), silicon oxynitride (such as SiON), silicon oxycarbide (such as SiOC), or a low-k material having a dielectric constant between 1.8 and 3 (such as fluorinated silicate glass (FSG) or Black-diamond). Each of the dielectric layers 42, 44 and 46 may have a thickness, e.g., between 10 nanometers and 2 micrometers or between 50 nanometers and 1 micrometer.

The dielectric layer 48 between the dielectric layer 46 and the semiconductor substrate 58 and between the interconnection layer 34 and the semiconductor substrate 58 may include or can be a layer of phosphorous silicate glass (PSG), boro-phospho-silicate glass (BPSG), silicon oxide (such as $SiO_2$), silicon nitride (such as $Si_3N_4$), silicon carbon nitride (such as SiCN), silicon oxynitride (such as SiON), or a low-k material having a dielectric constant between 1.8 and 3 (such as fluorinated silicate glass (FSG) or Black-diamond). The dielectric layer 48 may have a thickness, e.g., between 10 nanometers and 1 micrometer.

The patterned metal layer 26, for example, may include an aluminum-copper-alloy layer having a thickness, e.g., between 0.3 and 3 micrometers and a titanium-containing layer having a thickness, e.g., smaller than 0.2 micrometers, such as between 0.02 and 0.15 micrometers. The titanium-containing layer can be between the dielectric layer 44 and the aluminum-copper-alloy layer and on the aluminum-copper-alloy layer, and the aluminum-copper-alloy layer can be between the passivation layer 24 and the titanium-containing layer. The titanium-containing layer can be a single layer of titanium, titanium nitride, or a titanium-tungsten alloy having a thickness, e.g., smaller than 0.2 micrometers, such as between 0.02 and 0.15 micrometers.

Alternatively, the patterned metal layer 26 may include a nickel layer having a thickness, e.g., between 0.5 and 3 micrometers and a gold layer having a thickness, e.g., between 0.01 and 1 micrometers under and on the nickel layer, in the view from the side of the dielectric layer 44 to the side of the passivation layer 24. The nickel layer is between the dielectric layer 44 and the gold layer, and the gold layer is between the nickel layer and the passivation layer 24.

Alternatively, the patterned metal layer 26 can be formed by a damascene or double-damascene process including an electroplating process and a chemical mechanical polishing (CMP) process and can be composed of an electroplated copper layer having a bottom contacting the passivation layer 24, an adhesion/barrier metal layer at a top and sidewalls of the electroplated copper layer, and a seed layer between the electroplated copper layer and the adhesion/barrier metal layer and on the top and sidewalls of the electroplated copper layer. The adhesion/barrier metal layer has a first portion between the top of the electroplated copper layer and the dielectric layer 44 and a second portion at the sidewalls of the electroplated copper layer. The electroplated copper layer may have a thickness, e.g., smaller than 1.5 micrometers, such as between 0.15 and 1.2 micrometers, or smaller than 3 micrometers, such as between 0.3 and 3 micrometers. The electroplated copper layer may have a width, e.g., smaller than 1 micrometer, such as between 0.05 and 1 micrometers. The seed layer may include or can be a layer of copper or a titanium-copper alloy formed by a suitable process, such as sputtering process. The adhesion/barrier metal layer may include or can be a layer of titanium, a titanium-tungsten alloy, titanium nitride, chromium, tantalum or tantalum nitride formed by a suitable process, such as sputtering process. The adhesion/barrier metal layer may have a thickness, e.g., smaller than 0.1 micrometers, such as between 0.005 and 0.1 micrometers. The sidewalls of the electroplated copper layer are covered by the adhesion/barrier metal layer and the seed layer.

The interconnection layer 34, for example, may include carbon nanotube. Alternatively, the interconnection layer 34 can be composed of a patterned metal layer in the dielectric layer 46. In a first alternative, the patterned metal layer 34 may include an aluminum-copper-alloy layer having a thickness, e.g., between 10 nanometers and 2 micrometers and a titanium-containing layer, such as a single layer of titanium nitride, titanium-tungsten alloy or titanium, having a thickness, e.g., smaller than 0.2 micrometers, such as between 0.02 and 0.15 micrometers. The titanium-containing layer can be between the dielectric layer 48 and the aluminum-copper-alloy layer and on the aluminum-copper-alloy layer, and the aluminum-copper-alloy layer can be in the dielectric layer 46. In a second alternative, the patterned metal layer 34 can be formed by a damascene or double-damascene process including an electroplating process and a chemical mechanical polishing (CMP) process and can be composed of an electroplated copper layer having a bottom contacting the dielectric layer 44, an adhesion/barrier metal layer at a top and sidewalls of the electroplated copper layer, and a seed layer between the electroplated copper layer and the adhesion/barrier metal layer and on the top and sidewalls of the electroplated copper layer. The adhesion/barrier metal layer has a first portion between the top of the electroplated copper layer and the dielectric layer 48 and a second portion at the sidewalls of the electroplated copper layer. The electroplated copper layer may have a thickness, e.g., smaller than 2 micrometers, such as between 0.15 and 1 micrometers or between 10 nanometers and 2 micrometers. The electroplated copper layer may have a width, e.g., smaller than 1 micrometer, such as between 0.05 and 1 micrometers. The seed layer may include or can be a layer of copper or a titanium-copper alloy formed by a suitable process, such as sputtering process. The adhesion/barrier metal layer may include or can be a layer of titanium, a titanium-tungsten alloy, titanium nitride, chromium, tantalum or tantalum nitride formed by a suitable process, such as sputtering process. The adhesion/barrier metal layer may have a thickness, e.g., smaller than 0.1 micrometers, such as between 0.005 and 0.1 micrometers. The sidewalls of the electroplated copper layer are covered by the adhesion/barrier metal layer and the seed layer.

The patterned metal layer 26 in the dielectric layer 42 can be connected to the interconnection layer 34 in the dielectric layer 46 through the via plugs 26*a* in the dielectric layer 44. The interconnection layer 34 in the dielectric layer 46 can be connected to the semiconductor devices 36 through the via plugs 34*a* in the dielectric layer 48. The via plugs 26*a* may include electroplated copper, tungsten, or carbon nanotube in the dielectric layer 44. The via plugs 34*a* may include electroplated copper, tungsten, or carbon nanotube in the dielectric layer 48.

Each of the chips 68 may include multiple interconnects or metal traces 35*a*, 35*b*, 35*c* and 35*d* provided by the patterned metal layer 26, the interconnection layer 34 and the via plugs 26*a* and 34*a*. Each of the interconnects or metal traces 35*a*, 35*b*, 35*c* and 35*d* can be connected to one or more of the semiconductor devices 36 and can be a signal trace, a bit line, a clock bus, a power plane, a power bus, a power trace, a ground plane, a ground bus, or a ground trace.

Alternatively, each of the chips 68 may further include a patterned metal layer (not shown), having a thickness greater than that of the patterned metal layer 26 and greater than that of the interconnection layer 34, between the glue layer 22 and the passivation layer 24. The patterned metal layer under the passivation layer 24 may include an electroplated metal layer under the passivation layer 24, an adhesion/barrier metal layer between the electroplated metal layer and the passivation layer 24, and a seed layer between the electroplated metal layer and the adhesion/barrier metal layer. In the view from the side of the passivation layer 24 to the side of the glue layer 22, the adhesion/barrier metal layer can be on the seed layer, and the seed layer can be on the electroplated metal layer. Sidewalls of the electroplated metal layer are not covered by the adhesion/barrier metal layer and the seed layer. The adhesion/barrier metal layer may include or can be a layer of titanium, a titanium-tungsten alloy, titanium nitride, chromium, tantalum, tantalum nitride or nickel with a thickness, e.g., smaller than 0.6 micrometers, such as between 1 nanometer and 0.5 micrometers or between 0.005 and 0.1 micrometers. The seed layer may include or can be a layer of copper, a titanium-copper alloy, silver, gold, or nickel with a thickness, e.g., smaller than 0.8 micrometers, such as between 5 nanometers and 0.1 micrometers or between 10 nanometers and 0.8 micrometers. Each of the adhesion/barrier metal layer and the seed layer can be formed by a suitable process, such as sputtering process. The electroplated metal layer may include or can be a layer of electroplated copper, electroplated silver or electroplated gold with a thickness, e.g., greater than 2 micrometers, such as between 2 and 30 micrometers, and preferably between 3 and 10 micrometers or between 5 and 25 micrometers.

Alternatively, when the silicon-oxide layer of the dummy substrate 62 remains on the silicon-oxide layer 22, after forming the openings 62*a*, and is exposed by the openings 62*a* in the dummy substrate 62, mounting the chips 68 over the carrier 11 and in the openings 62*a* can be performed, e.g., by bonding another silicon-oxide layer of the passivation layer 24, at the active side of each chip 68, with the remaining silicon-oxide layer of the dummy substrate 62 under the passivation layer 24. The silicon-oxide layer of the passivation layer 24 contacts the silicon-oxide layer of the dummy substrate 62. Accordingly, the chips 68 can be joined with the carrier 11 using these silicon-oxide layers.

Alternatively, another technique to form the structure illustrated in FIGS. 7 and 8 is performed by first providing a patterned dummy substrate 62, such as patterned dummy wafer, patterned panel, patterned silicon frame, or patterned substrate of polysilicon, glass, silicon, ceramic, or polymer, with multiple openings 62*a* passing through the patterned dummy substrate 62, next joining the patterned dummy substrate 62 with the carrier 11 using the layer 22, which can be referred to as the steps illustrated in FIG. 1, and then mounting the chips 68 over the carrier 11 and in the openings 62*a* in the patterned dummy substrate 62, which can be referred to as the steps illustrated in FIG. 7.

As shown in FIGS. 7 and 8, there are multiple gaps 4 each between the dummy substrate 62 and one of the chips 68, and there are multiple gaps 8 (one of them is shown) each between neighboring two chips 68. Each of the gaps 4 may have a transverse distance or spacing D1, e.g., between 1 and 200 micrometers, between 1 and 50 micrometers or between 1 and 10 micrometers, and preferably between 1 and 5 micrometers. Each of the gaps 8 may have a transverse distance or spacing D2, e.g., between 1 and 200 micrometers, between 1 and 50 micrometers or between 1 and 10 micrometers, and preferably between 1 and 5 micrometers.

Figure 9:
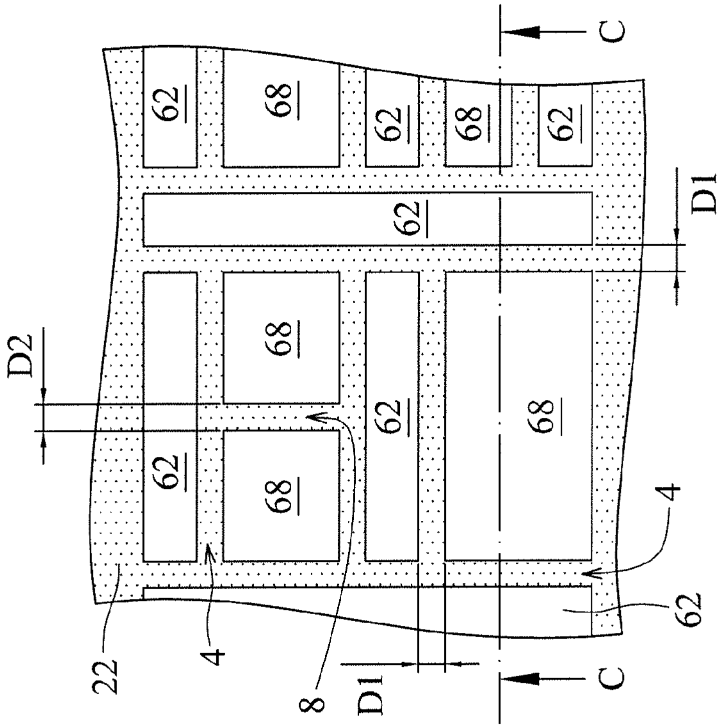

FIG. 9 shows another technique to form the structure with the same cross-sectional view as shown in FIG. 7. FIG. 7 is a cross-sectional view cut along the line C-C shown in a schematical top view of FIG. 9. The structure shown in FIGS. 7 and 9 can be formed, e.g., by the following steps. First, the previously described glue layer 22 can be formed on the previously described carrier 11 by using, e.g., a spin coating process, a laminating process, a spraying process, a dispensing process, or a screen printing process. The glue layer 22 can be formed on the dielectric or insulating layer 20 of the carrier 11 or formed on the substrate 10 of the carrier 11 if the carrier 11 is formed without the layers 12, 18 and 20. Next, the glue layer 22 can be optionally pre-cured or baked. Next, the previously described chips 68 and multiple separate dummy substrates 62 can be placed on the glue layer 22. When a gap between neighboring two chips 68 is too great, such as greater than 500 or 1,000 micrometers, one or more of the separate dummy substrates 62 can be placed in the gap. Alternatively, when a gap between neighboring two chips 68 is small enough, such as smaller than 500 or 1,000 micrometers, there can be no separate dummy substrates 62 placed in the gap. Next, the glue layer 22 can be cured again in a temperature between 180 degrees centigrade and 350 degrees centigrade with a mechanical or thermal pressure on the glue layer 22. Accordingly, the separate dummy substrates 62 and the chips 68 can be joined with the carrier 11 using the glue layer 22. The separate dummy substrates 62, for example, can be separate silicon bars, separate dummy chips, separate dummy silicon dies, or separate substrates of polysilicon, glass, silicon, or ceramic.

Alternatively, referring to FIGS. 7 and 9, the glue layer 22 can be replaced with a silicon-oxide layer that is formed on the dielectric or insulating layer 20 of the carrier 11 or formed on the substrate 10 of the carrier 11 if the carrier 11 is formed without the layers 12, 18 and 20. In this case, joining the chips 68 with the carrier 11 and joining the separate dummy substrates 62 with the carrier 11 can be performed, e.g., by bonding another silicon-oxide layer of the passivation layer 24, at the active side of each chip 68, with the silicon-oxide layer 22 and by bonding another silicon-oxide layer of each of the separate dummy substrates 62 with the silicon-oxide layer 22. The silicon-oxide layer of the passivation layer 24 of each chip 68 contacts the silicon-oxide layer 22, and the silicon-oxide layer of each of the separate dummy substrates 62 contacts the silicon-oxide layer 22. Accordingly, the chips 68 and the separate dummy substrates 62 can be joined with the carrier 11 using these silicon-oxide layers.

As shown in FIGS. 7 and 9, there are multiple gaps 4 each between one of the chips 68 and one of the separate dummy substrates 62, and there are multiple gaps 8 (one of them is shown) each between neighboring two chips 68. Each of the gaps 4 may have a transverse distance or spacing D1, e.g., between 1 and 200 micrometers, between 1 and 50 micrometers or between 1 and 10 micrometers, and preferably between 1 and 5 micrometers. Each of the gaps 8 may have a transverse distance or spacing D2, e.g., smaller than 500 micrometers, such as between 1 and 200 micrometers, between 1 and 50 micrometers, or between 1 and 10 micrometers, and preferably between 1 and 5 micrometers. In one embodiment, there are no circuits preformed in each separate dummy substrate 62 or on a top or bottom surface of each separate dummy substrate 62 before the separate dummy substrates 62 are joined with the carrier 11.

Figure 10:
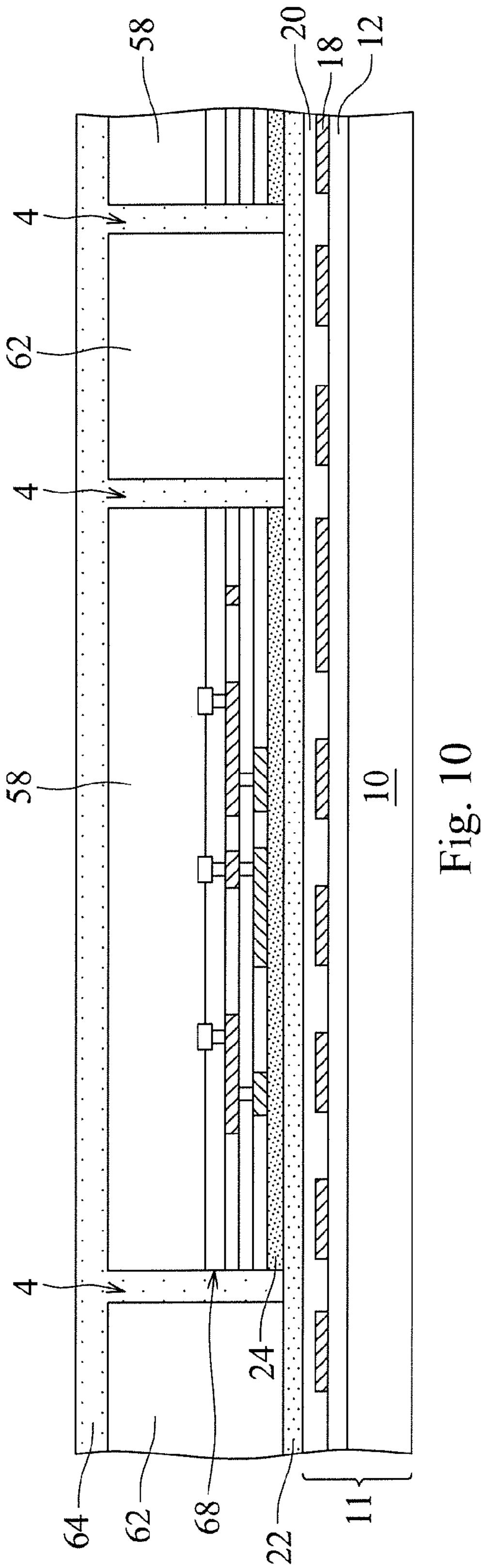

Referring to FIG. 10, after the steps illustrated in FIGS. 7 and 8 or in FIGS. 7 and 9, an encapsulation/gap filling material 64, such as polysilicon, silicon oxide, or a polymer, can be formed on a backside of the semiconductor substrate 58 of each chip 68, on the dummy substrate(s) 62, and in the gaps 4 and 8. If the encapsulation/gap filling material 64 is polysilicon, the polysilicon can be formed by a chemical vapor deposition (CVD) process or a plasma-enhanced chemical vapor deposition (PECVD) process. If the encapsulation/gap filling material 64 is silicon oxide, the silicon oxide can be formed by a chemical vapor deposition (CVD) process, a plasma-enhanced chemical vapor deposition (PECVD) process, or an atmospheric pressure chemical vapor deposition (APCVD) process. If the encapsulation/gap filling material 64 is a polymer, such as polyimide, epoxy, benzocyclobutane (BCB), polybenzoxazole (PBO), or poly-phenylene oxide (PPO), the polymer can be formed by a process including a spin coating process, a dispensing process, a molding process, or a screen printing process.

Figure 11:
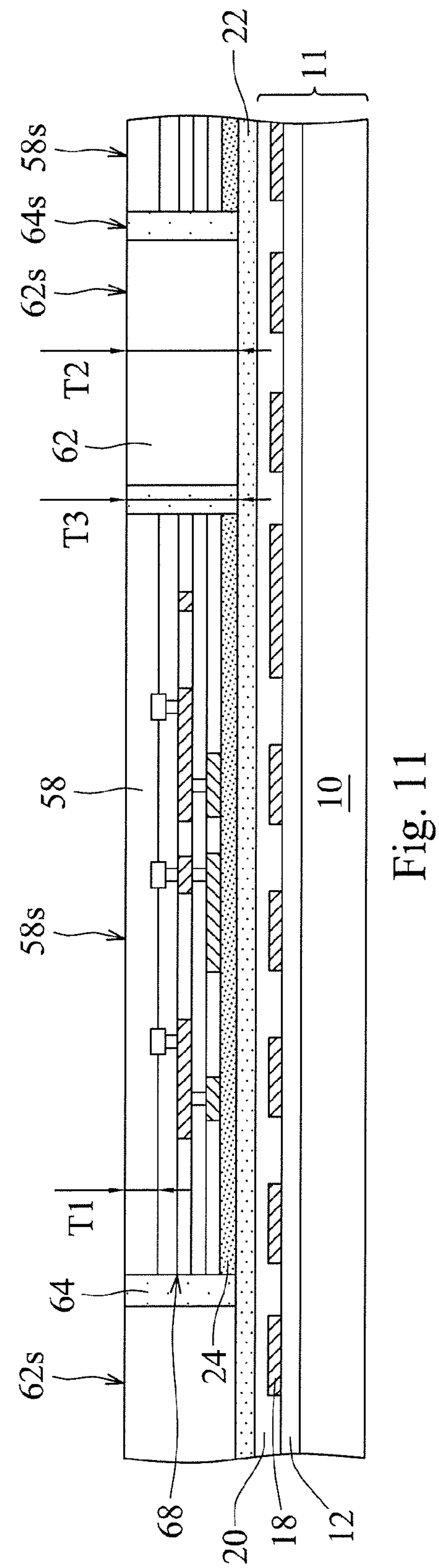

Next, referring to FIG. 11, the encapsulation/gap filling material 64, the backside of the semiconductor substrate 58 of each chip 68, and the dummy substrate(s) 62 are ground or polished by, e.g., a chemical-mechanical-polishing (CMP) process, a mechanical polishing process, a mechanical grinding process, or a process including mechanical polishing and chemical etching until the semiconductor substrate 58 of one of the chips 68 is thinned to a thickness T1, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Preferably, each of the chips 68, after the grinding or polishing process, may have a thickness, e.g., between 3 and 105 micrometers, and preferably between 3 and 30 micrometers or between 5 and 25 micrometers. After the grinding or polishing process, the dummy substrate(s) 62 can be thinned to a thickness T2, e.g., between 3 and 100 micrometers, and preferably between 3 and 30 micrometers or between 5 and 25 micrometers, and the encapsulation/gap filling material 64 remaining in the gaps 4 and 8 may have a vertical thickness T3, e.g., between 3 and 100 micrometers, and preferably between 3 and 30 micrometers or between 5 and 25 micrometers. The ground or polished surface **58*s* of the semiconductor substrate 58, at the backside of each chip 68, and the ground or polished surface(s) 62*s* of the dummy substrate(s) 62 can be substantially flat and not covered by the encapsulation/gap filling material 64. The ground or polished surface(s) 62*s* may be substantially coplanar with the ground or polished surface 58*s* of each chip 68 and with the ground or polished surface 64*s* of the encapsulation/gap filling material 64 in the gaps 4 and 8**.

Figure 12:
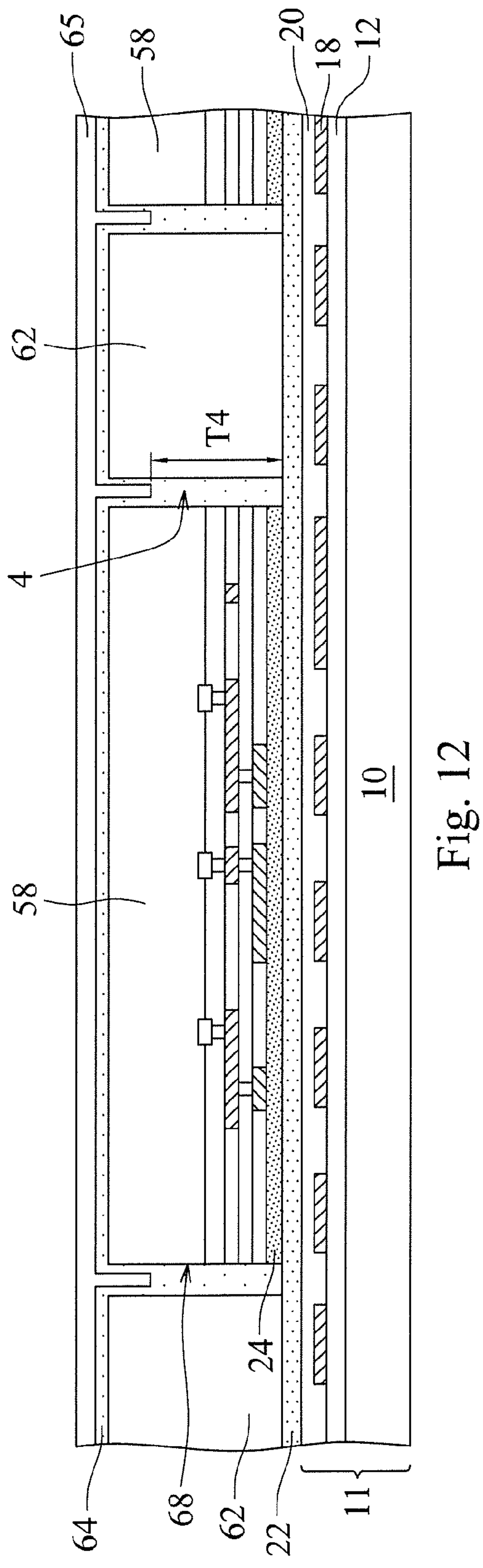
Figure 13:
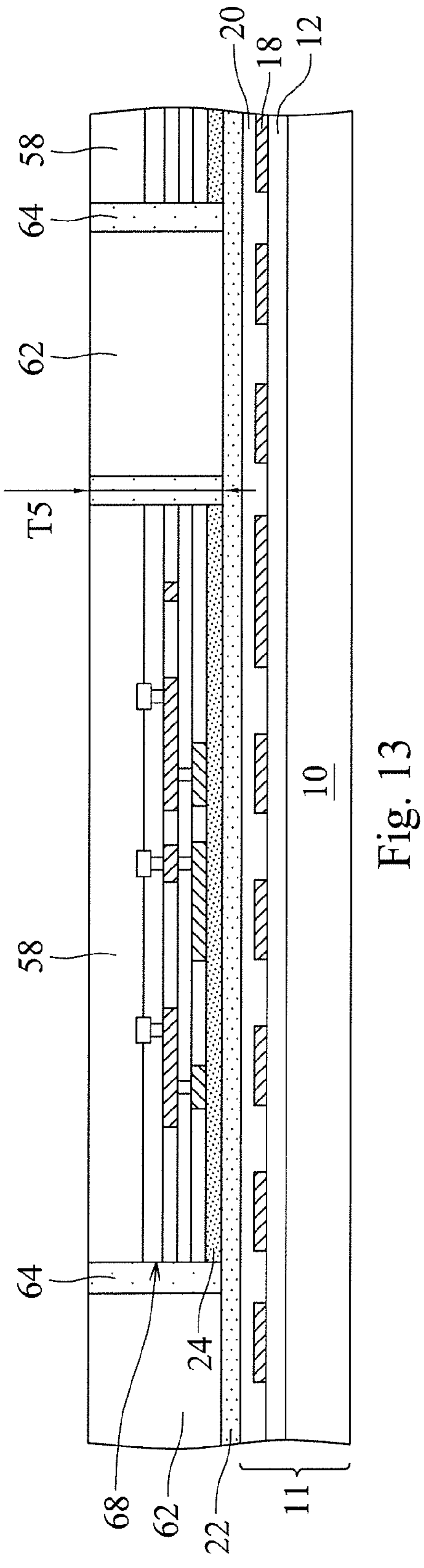

Alternatively, FIGS. 12 and 13 show another technique to form the structure illustrated in FIG. 11. Referring to FIG. 12, after the steps illustrated in FIGS. 7 and 8 or in FIGS. 7 and 9, an encapsulation/gap filling material 64, such as polysilicon or silicon oxide, can be formed on the backside of the semiconductor substrate 58 of each chip 68, on the dummy substrate(s) 62 and in the gaps 4 and 8, and then a polymer 65, such as molding compound, polyimide, epoxy, benzocyclobutane (BCB), polybenzoxazole (PBO), or poly-phenylene oxide (PPO), can be formed on the encapsulation/gap filling material 64 and in the gaps 4 and 8. The encapsulation/gap filling material 64 in the gaps 4 and 8 may have a vertical thickness T4, e.g., between 10 and 100 micrometers, and preferably between 10 and 50 micrometers or between 20 and 50 micrometers.

Next, referring to FIG. 13, a mechanical grinding process can be performed, e.g., by using an abrasive or grinding pad with water to grind the polymer 65, the encapsulation/gap filling material 64, the backside of the semiconductor substrate 58 of each chip 68 and the dummy substrate(s) 62 until all of the polymer 65 is removed and until a predetermined vertical thickness T5 of the encapsulation/gap filling material 64 in the gaps 4 and 8 is reached. The predetermined vertical thickness T5 can be, e.g., between 10 and 100 micrometers, and preferably between 10 and 50 micrometers or between 20 and 50 micrometers. The abrasive or grinding pad can be provided with rough grit having an average grain size, e.g., between 0.5 and 15 micrometers for performing the mechanical grinding process. Thereafter, a chemical-mechanical-polishing (CMP) process can be performed, e.g., by using a polish pad with a slurry containing chemicals and a fine abrasive like silica with an average grain size, e.g., between 0.02 and 0.05 micrometers to polish the backside of the semiconductor substrate 58 of each chip 68, the dummy substrate(s) 62 and the encapsulation/gap filling material 64 in the gaps 4 and 8 until the semiconductor substrate 58 of one of the chips 68 is thinned to the thickness T1 between 1 and 30 micrometers, and preferably between 2 and 5 micrometers, between 2 and 10 micrometers, between 2 and 20 micrometers, or between 3 and 30 micrometers, as shown in FIG. 11.

After the chemical-mechanical-polishing (CMP) process, the polished surface 58*s* of the semiconductor substrate 58, at the backside of each chip 68, and the polished surface(s) 62*s* of the dummy substrate(s) 62 can be substantially flat and not covered by the encapsulation/gap filling material 64. The polished surface(s) 62*s* may be substantially coplanar with the polished surface 58*s* of each chip 68 and with the polished surface 64*s* of the encapsulation/gap filling material 64 in the gaps 4 and 8. The polished surfaces 58*s*, 62*s* and 64*s* may have a micro-roughness, e.g., less than 20 nanometers. The chemical-mechanical-polishing (CMP) process, using a very fine abrasive like silica and a relatively weak chemical attack, will create the surfaces 58*s*, 62*s* and 64*s* almost without deformation and scratches, and this means that the chemical-mechanical-polishing (CMP) process is very well suited for the final polishing step, creating the clean surfaces 58*s*, 62*s* and 64*s*. Using the mechanical grinding process and the chemical-mechanical-polishing (CMP) process can be performed to create a very thin semiconductor substrate 10 of each chip 68. Accordingly, after the chemical-mechanical-polishing (CMP) process, each of the chips 68 can be thinned to a thickness, e.g., between 3 and 35 micrometers, and preferably between 5 and 10 micrometers or between 5 and 25 micrometers, the dummy substrate(s) 62 can be thinned to the thickness T2, e.g., between 3 and 35 micrometers, and preferably between 5 and 10 micrometers or between 5 and 25 micrometers, and the encapsulation/gap filling material 64 in the gaps 4 and 8 can be thinned to the thickness T3, e.g., between 3 and 35 micrometers, and preferably between 5 and 10 micrometers or between 5 and 25 micrometers.

Figure 14:
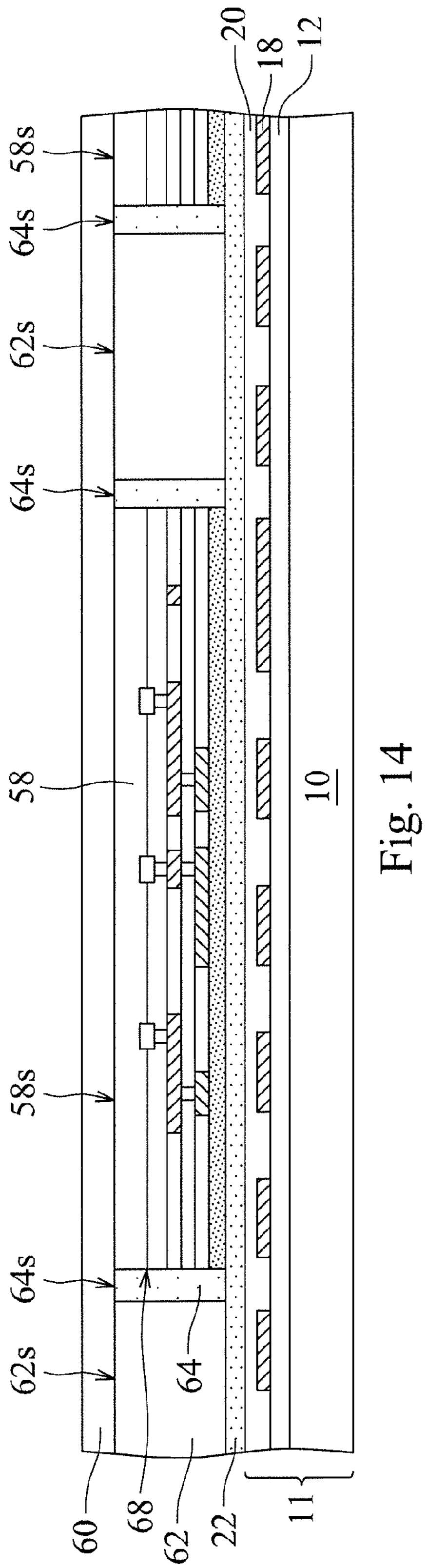

Referring to FIG. 14, after forming the structure illustrated in FIG. 11, a dielectric layer 60 can be formed on the surface 58*s* of the semiconductor substrate 58 of each chip 68, on the surface(s) 62*s* of the dummy substrate(s) 62, and on the surface 64*s* of the encapsulation/gap filling material 64. The dielectric layer 60 may have a thickness, e.g., between 0.5 and 30 micrometers, and preferably between 1 and 20 micrometers, between 1 and 10 micrometers, between 1 and 5 micrometers, or between 1 and 3 micrometers.

The dielectric layer 60, for example, can be an inorganic layer formed by, e.g., a chemical vapor deposition (CVD) process or a plasma-enhanced chemical vapor deposition (PECVD) process. The inorganic layer can be, e.g., a layer of silicon oxide (such as $SiO_2$), silicon nitride (such as $Si_3N_4$), silicon carbon nitride (such as SiCN), silicon oxynitride (such as SiON), or silicon oxycarbide (such as SiOC), or a layer including silicon oxide, silicon nitride, silicon carbon nitride and silicon oxynitride. The inorganic layer may have a thickness, e.g., between 0.5 and 30 micrometers, and preferably between 1 and 20 micrometers, between 1 and 10 micrometers, between 1 and 5 micrometers, or between 1 and 3 micrometers.

Alternatively, the dielectric layer 60 can be a polymer layer, such as a layer of polyimide, epoxy, benzocyclobutane (BCB), polybenzoxazole (PBO), or poly-phenylene oxide (PPO), formed by, e.g., a process including a spin coating process, a dispensing process, a molding process, or a screen printing process. The polymer layer may have a thickness, e.g., between 0.5 and 30 micrometers, and preferably between 1 and 20 micrometers, between 1 and 10 micrometers, between 1 and 5 micrometers, or between 1 and 3 micrometers.

Alternatively, the dielectric layer 60 can be composed of multiple inorganic layers which include an etch stop layer, such as etch stop layer of silicon oxynitride. The etch stop layer will later be used to stop etching when etching patterns into the dielectric layer 60. In this case, the dielectric layer 60, for example, can be composed of a first silicon-oxide layer on the surfaces 58*s*, 62*s* and 64*s*, a silicon-oxynitride layer, used as the etch stop layer, on the first silicon-oxide layer, and a second silicon-oxide layer having a thickness, e.g., between 0.1 and 5 micrometers or between 0.3 and 1.5 micrometers on the silicon-oxynitride layer.

Figure 15:
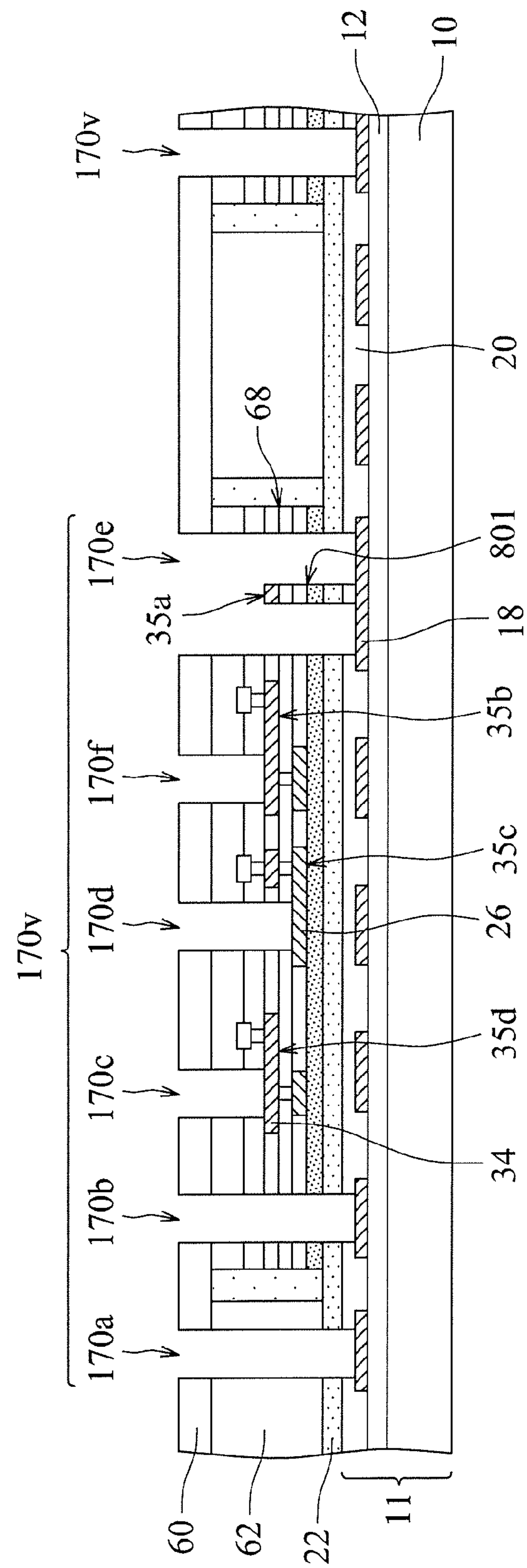

Next, referring to FIG. 15, multiple through vias 170*v*, including through vias 170*a*, 170*b*, 170*c*, 170*d*, 170*e* and 170*f*, are formed in the chips 68 and in the dummy substrate(s) 62, exposing the conductive layer 18 of the carrier 11 and exposing the layers 26 and 34 of the chips 68, by, e.g., the following steps. First, a photoresist layer, such as positive-type photo-sensitive resist layer or negative-type photo-sensitive resist layer, is formed on the dielectric layer 60 by using a suitable process, such as spin coating process or lamination process. Next, a photo exposure process using a 1X stepper and a development process using a chemical solution can be employed to form multiple openings, exposing the dielectric layer 60, in the photoresist layer. The photoresist layer may have a thickness, e.g., between 3 and 50 micrometers. Next, the dielectric layer 60 under the openings in the photoresist layer is removed by using a suitable process, such as anisotropic plasma etching process. Next, the dummy substrate(s) 62 under the openings in the photoresist layer and the chips 68 under the openings in the photoresist layer are etched away until predetermined regions of the layers 26 and 34 in the chips 68 and predetermined regions of the conductive layer 18 in the carrier 11 are exposed by the openings in the photoresist layer. Next, the photoresist layer is removed by using, e.g., an organic chemical. Accordingly, the through vias 170*v*, including the vias 170*a*-170*f*, are formed in the chips 68 and in the dummy substrate(s) 62, exposing the predetermined regions of the conductive layer 18 of the carrier 11 and exposing the predetermined regions of the layers 26 and 34 of the chips 68. The through via 170*a* is formed in the dummy substrate 62, and the through vias 170*b*, 170*c*, 170*d*, 170*e* and 170*f* are formed in the same chip 68.

Alternatively, another technique to form the through vias 170*v* in the chips 68 and in the dummy substrate(s) 62 can be performed by the following steps. First, a photoresist layer, such as positive-type photo-sensitive resist layer or negative-type photo-sensitive resist layer, can be formed on the dielectric layer 60 by using, e.g., a spin coating process or a lamination process. Next, a photo exposure process using a 1X stepper and a development process using a chemical solution can be employed to form multiple openings, exposing the dielectric layer 60, in the photoresist layer. Next, multiple openings are formed in the dielectric layer 60 and under the openings in the photoresist layer, exposing the dummy substrate(s) 62 and the semiconductor substrates 58 of the chips 68, by removing the dielectric layer 60 under the openings in the photoresist layer using, e.g., an anisotropic plasma etching process. Next, the photoresist layer is removed by using, e.g., an organic chemical. Next, the dummy substrate(s) 62 under the openings in the dielectric layer 60 and the chips 68 under the openings in the dielectric layer 60 can be etched away until the predetermined regions of the layers 26 and 34 of the chips 68 and the predetermined regions of the conductive layer 18 of the carrier 11 are exposed by the openings in the dielectric layer 60. Accordingly, the through vias 170*v*, including the through vias 170*a*, 170*b*, 170*c*, 170*d*, 170*e* and 170*f*, can be formed in the chips 68 and in the dummy substrate(s) 62, exposing the conductive layer 18 of the carrier 11 and exposing the layers 26 and 34 of the chips 68. The through via 170*a* is formed in the dummy substrate 62, and the through vias 170*b*, 170*c*, 170*d*, 170*e* and 170*f* are formed in the same chip 68. Each of the through vias 170*v*, such as the through via 170*a*, 170*b*, 170*c*, 170*d*, 170*e* or 170*f*, may have a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers.

Figure 18:
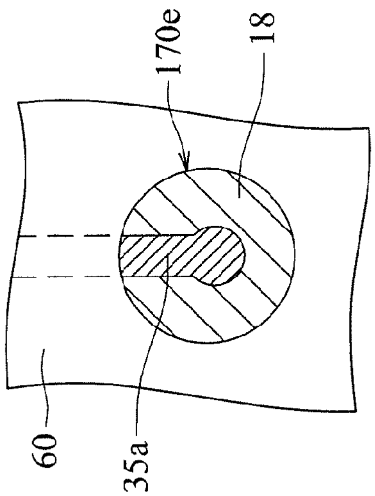
Figure 17:
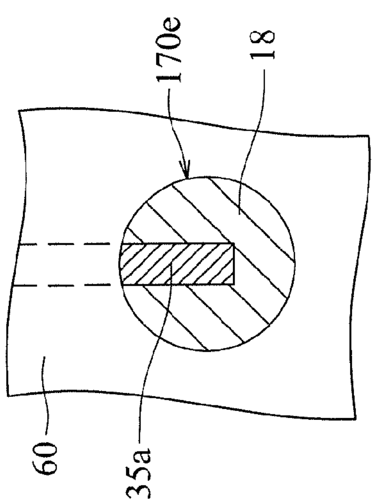
Figure 16:
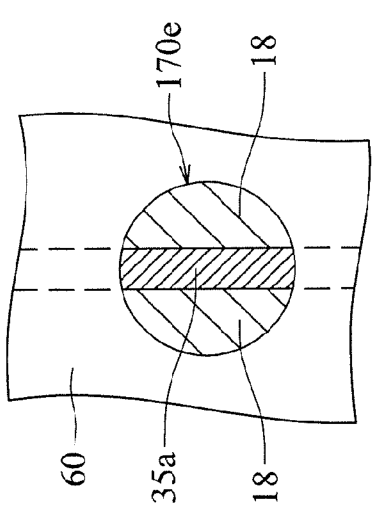

One of the through vias 170*v*, such as the through via 170*a*, passes through the dielectric layer 60, the dummy substrate 62, the glue layer or silicon-oxide layer 22, and the dielectric or insulating layer 20 of the carrier 11, exposing the conductive layer 18 of the carrier 11. Another one of the through vias 170*v*, such as the through via 170*b*, passes through the dielectric layer 60, through the semiconductor substrate 58, dielectric layers 42, 44, 46 and 48, and passivation layer 24 of one of the chips 68, through the glue layer or silicon-oxide layer 22, and through the dielectric or insulating layer 20 of the carrier 11, exposing the conductive layer 18 of the carrier 11. Another one of the through vias 170*v*, such as the through via 170*c*, passes through the dielectric layer 60 and through the semiconductor substrate 58 and dielectric layer 48 of one of the chips 68, exposing the interconnect or metal trace 35*d* in the interconnection layer 34 of the one of the chips 68. Another one of the through vias 170*v*, such as the through via 170*d*, passes through the dielectric layer 60 and through the semiconductor substrate 58 and dielectric layers 44, 46 and 48 of one of the chips 68, exposing the interconnect or metal trace 35*c* in the patterned metal layer 26 of the one of the chips 68. Another one of the through vias 170*v*, such as the through via 170*f*, passes through the dielectric layer 60 and through the semiconductor substrate 58 and dielectric layer 48 of one of the chips 68, exposing the interconnect or metal trace 35*b* in the interconnection layer 34 of the one of the chips 68. Another one of the through vias 170*v*, such as the through via 170*e*, passes through the dielectric layer 60, through the semiconductor substrate 58, dielectric layers 42, 44, 46 and 48, and passivation layer 24 of one of the chips 68, through the glue layer or silicon-oxide layer 22, and through the dielectric or insulating layer 20 of the carrier 11, exposing the interconnect or metal trace 35*a* in the interconnection layer 34 of the one of the chips 68 and exposing the conductive layer 18 of the carrier 11. A supporter 801 provided by the layers 20, 22, 24, 42 and 44 is between the conductive layer 18 of the carrier 11 and the interconnect or metal trace 35*a* in the interconnection layer 34 exposed by the through via 170*e* for the purpose of supporting the exposed interconnect or metal trace 35*a*. The supporter 801 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers. FIGS. 16-18 are three examples of schematic top perspective views showing the through via 170*e* and the interconnect or metal trace 35*a* illustrated in FIG. 15.

As shown in FIGS. 15 and 16, the through via 170*e* in one of the chips 68 exposes the interconnect or metal trace 35*a* in the one of the chips 68 and exposes two regions of the conductive layer 18 in the carrier 11 under the one of the chips 68. The interconnect or metal trace 35*a* has a line-shaped region, exposed by the through via 170*e*, extending in a horizontal direction from a side of the through via 170*e* to the opposite side of the through via 170*e* through a center of the through via 170*e*. The previously described supporter 801, between the conductive layer 18 of the carrier 11 and the exposed line-shaped region of the interconnect or metal trace 35*a* in the interconnection layer 34, can be line-shaped, like the exposed line-shaped region of the interconnect or metal trace 35*a*. Preferably, the through via 170*e* can be, but is not limited to, a circular shape from a top perspective view.

As shown in FIGS. 15 and 17, the through via 170*e* in one of the chips 68 exposes the interconnect or metal trace 35*a* in the one of the chips 68 and exposes a region of the conductive layer 18 in the carrier 11 under the one of the chips 68. The interconnect or metal trace 35*a* has a peninsula region, exposed by the through via 170*e*, extending in a horizontal direction from one side of the through via 170*e* at least to a center of the through via 170*e*, but does not reach to the opposite side of the through via 170*e*; the interconnect or metal trace 35*a* has an end exposed by the through via 170*e*. The previously described supporter 801, between the conductive layer 18 of the carrier 11 and the exposed peninsula region of the interconnect or metal trace 35*a* in the interconnection layer 34, can be peninsula-shaped, like the exposed peninsula region of the interconnect or metal trace 35*a*. Preferably, the through via 170*e* can be, but is not limited to, a circular shape from a top perspective view.

As shown in FIGS. 15 and 18, the through via 170*e* in one of the chips 68 exposes the interconnect or metal trace 35*a* in the one of the chips 68 and exposes a region of the conductive layer 18 in the carrier 11 under the one of the chips 68. The interconnect or metal trace 35*a* has a peninsula region, exposed by the through via 170*e*, extending in a horizontal direction from one side of the through via 170*e* at least to a center of the through via 170*e*, but does not reach to the opposite side of the through via 170*e*; the interconnect or metal trace 35*a* has a circular end exposed by the through via 170*e*. The previously described supporter 801, between the conductive layer 18 of the carrier 11 and the exposed peninsula region of the interconnect or metal trace 35*a* in the interconnection layer 34, can be peninsula-shaped, like the exposed peninsula region of the interconnect or metal trace 35*a*. Preferably, the through via 170*e* can be, but is not limited to, a circular shape from a top perspective view.

Figure 16A:
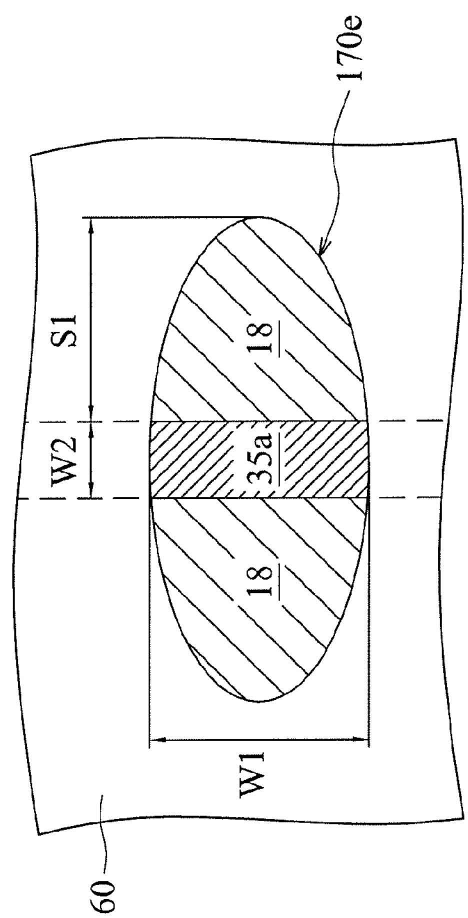

FIG. 16A is an example of a schematic top perspective view showing the through via 170*e* and the interconnect or metal trace 35*a* illustrated in FIG. 15. In this case, the through via 170*e* can be, but is not limited to, oval-shaped and has a width W1, e.g., between 1 and 30 micrometers, and preferably between 1 and 20 micrometers, between 1 and 10 micrometers, between 1 and 5 micrometers, or between 3 and 10 micrometers. The oval-shaped through via 170*e* in one of the chips 68 exposes the interconnect or metal trace 35*a* in the one of the chips 68 and exposes two regions of the conductive layer 18 in the carrier 11 under the one of the chips 68. The interconnect or metal trace 35*a* has a line-shaped region, exposed by the oval-shaped through via 170*e*, extending in a horizontal direction from a side of the oval-shaped through via 170*e* to the opposite side of the oval-shaped through via 170*e* through a center of the oval-shaped through via 170*e*. The previously described supporter 801, between the conductive layer 18 of the carrier 11 and the exposed line-shaped region of the interconnect or metal trace 35*a* in the interconnection layer 34, can be line-shaped, like the exposed line-shaped region of the interconnect or metal trace 35*a*. The interconnect or metal trace 35*a* exposed by the oval-shaped through via 170*e* has a width W2, e.g., between 0.3 and 30 micrometers, and preferably between 0.3 and 20 micrometers, between 0.3 and 10 micrometers, between 0.3 and 5 micrometers, or between 0.3 and 1 micrometers. A horizontal distance S1 between an endpoint of the long axis of the oval-shaped through via 170*e* and an edge, which is closer to the endpoint than the other opposite edge, of the interconnect or metal trace 35*a* exposed by the oval-shaped through via 170*e* can be, e.g., between 1 and 30 micrometers, and preferably between 1 and 20 micrometers, between 1 and 10 micrometers, between 1 and 5 micrometers, or between 3 and 10 micrometers.

Figure 19:
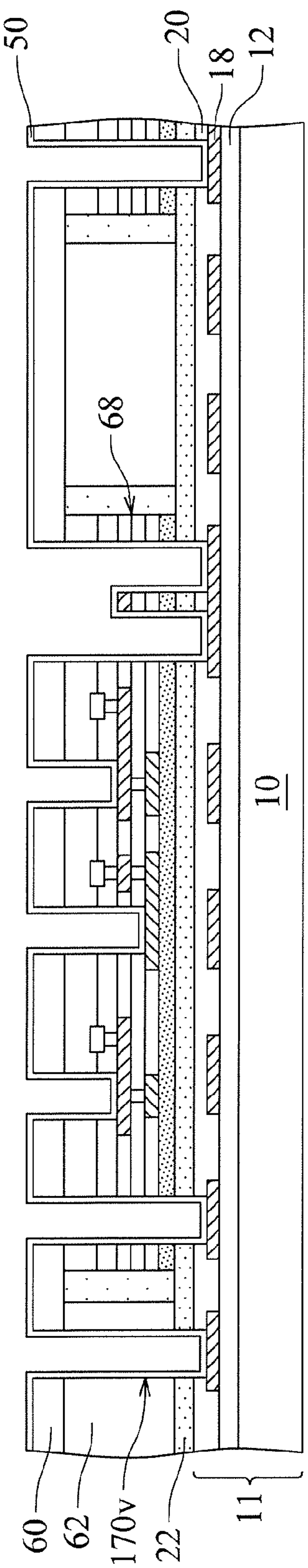

Next, referring to FIG. 19, a dielectric layer 50 is formed on a top surface of the dielectric layer 60, on the conductive layer 18, exposed by the through vias 170*v* (such as the through vias 170*a*, 170*b* and 170*e*), of the carrier 11, on the layers 26 and 34, exposed by the through vias 170*v* (such as the through vias 170*c*, 170*d*, 170*e* and 170*f*), of the chips 68, and on sidewalls of the through vias 170*v*.

The dielectric layer 50 can be composed of an insulating material. For example, the dielectric layer 50 can be an inorganic layer having a thickness, e.g., between 20 nanometers and 1 micrometer, and the inorganic layer can be a layer of silicon oxide (such as $SiO_2$), silicon nitride (such as $Si_3N_4$), silicon carbon nitride (such as SiCN), silicon oxynitride (such as SiON), or silicon oxycarbide (such as SiOC). Alternatively, the dielectric layer 50 can be a polymer layer having a thickness, e.g., between 1 and 10 micrometers, and preferably between 1 and 5 micrometers, and the polymer layer can be a layer of polyimide, benzocyclobutene (BCB), epoxy, polyphenylene oxide (PPO), or polybenzoxazole (PBO).

Figure 20:
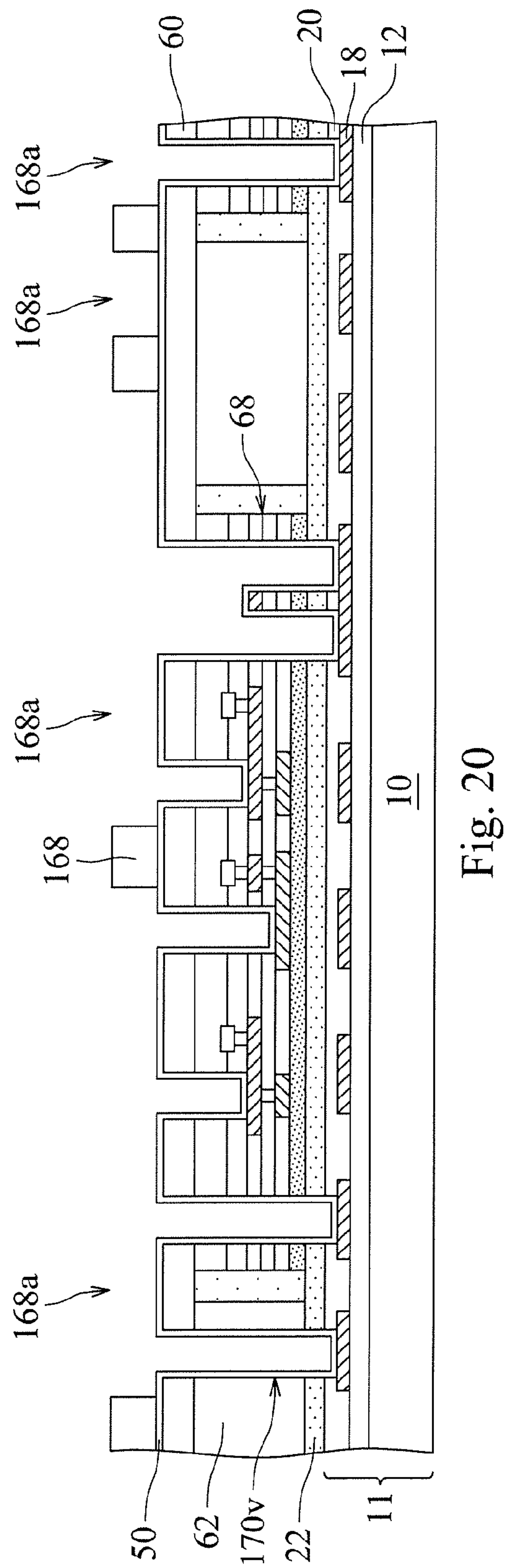

Next, referring to FIG. 20, a photoresist layer 168, such as positive-type photo-sensitive resist layer or negative-type photo-sensitive resist layer, can be formed on the dielectric layer 50 by using, e.g., a spin coating process or a lamination process. Next, a photo exposure process using a 1X stepper and a development process using a wet chemical can be employed to form multiple openings 168*a*, exposing the dielectric layer 50, in the photoresist layer 168. The photoresist layer 168 may have a thickness, e.g., between 0.5 and 30 micrometers.

Figure 21:
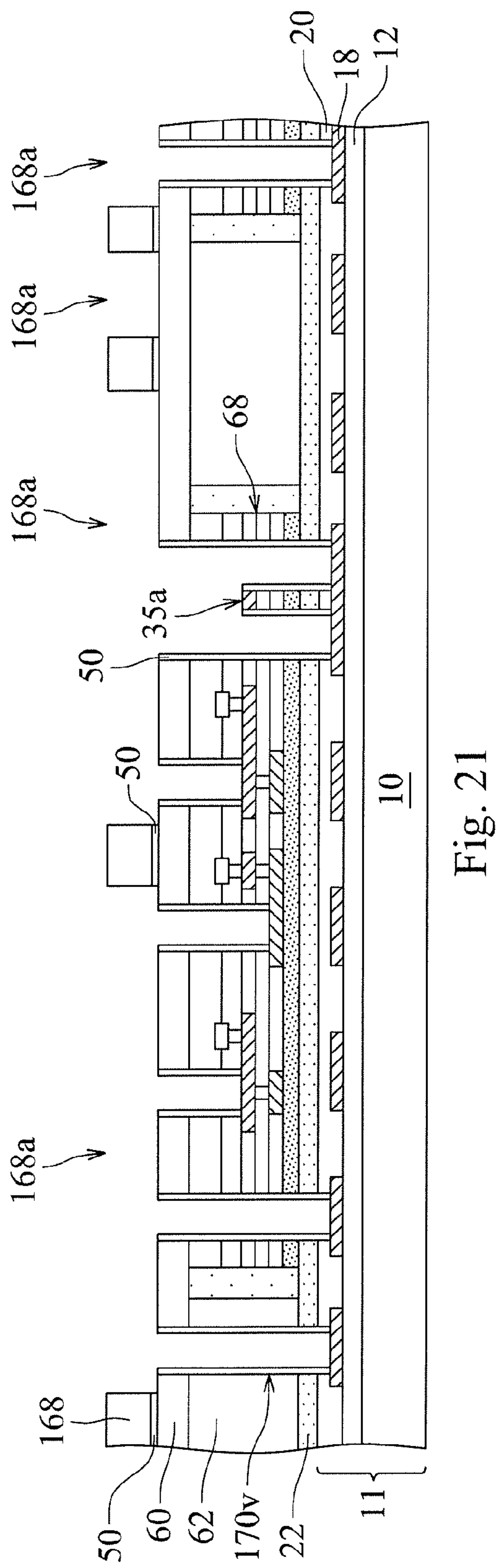

Next, referring to FIG. 21, the dielectric layer 50 formed on the layers 18, 26 and 34 and on the top surface of the dielectric layer 60 under the openings 168*a* can be removed by, e.g., etching the dielectric layer 50 under the openings 168*a* using an anisotropic plasma etching process. The dielectric layer 50 at bottoms of the through vias 170*v*, on the top surface of the dielectric layer 60 under the openings 168*a*, and on a top surface of the interconnect or metal trace 35*a* over the supporter 801 can be etched away. Accordingly, the layers 18, 26 and 34 at the bottoms of the through vias 170*v*, the top surface of the dielectric layer 60 under the openings 168*a*, and the interconnect or metal trace 35*a* over the supporter 801 are exposed by the openings 168*a*, and the dielectric layer 50 remains on the sidewalls of the through vias 170*v*, so called as sidewall dielectric layers in the through vias 170*v*. The sidewall dielectric layers 50 are formed on the sidewalls of the through vias 170*v* in the chips 68 or in the dummy substrate(s) 62 and are enclosed by the semiconductor substrates 58 of the chips 68 or by the dummy substrate(s) 62.

Figure 22:
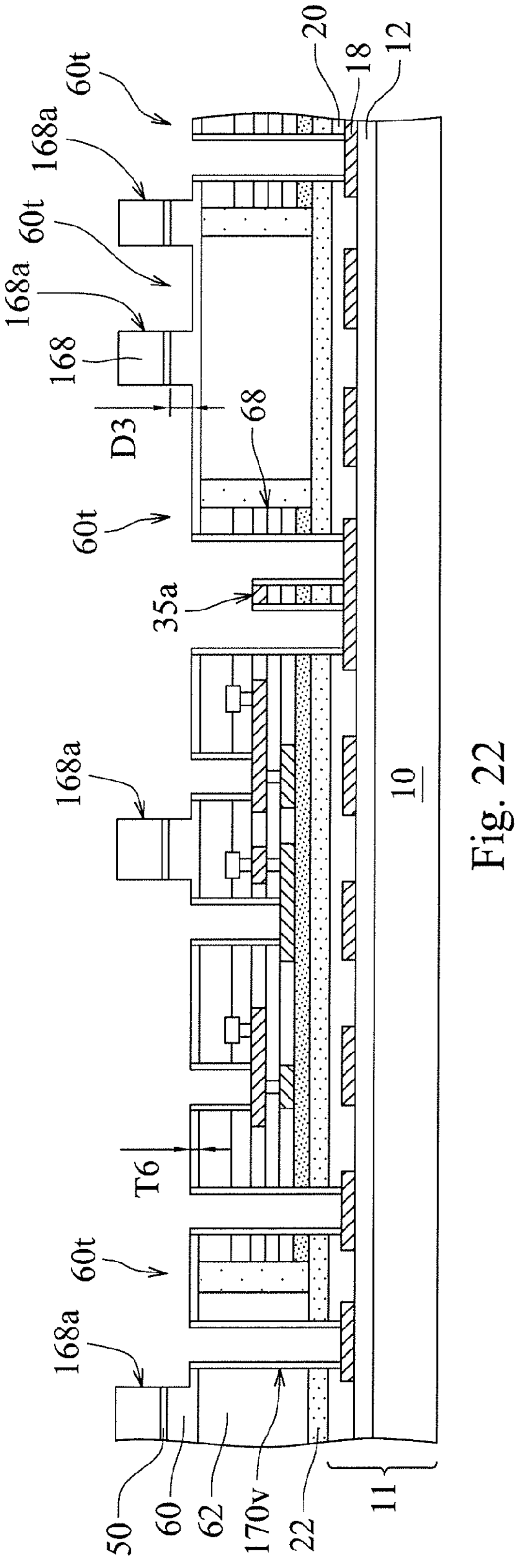

Next, referring to FIG. 22, multiple trenches 60*t*, damascene openings, are formed in the dielectric layer 60 by etching the dielectric layer 60 and the sidewall dielectric layers 50 under the openings 168*a* to a depth D3, e.g., between 0.1 and 5 micrometers, and preferably between 0.5 and 3 micrometers, using, e.g., an anisotropic plasma etching process. Preferably, the dielectric layer 60 and the sidewall dielectric layers 50 have a same material, such as silicon nitride, silicon oxide, or silicon oxynitride. After the etching process, the dielectric layer 60 under the trenches 60*t* has a remaining thickness T6, e.g., between 0.1 and 5 micrometers, and preferably between 0.3 and 5 micrometers, between 0.5 and 2 micrometers, between 0.1 and 3 micrometers, or between 0.2 and 1.5 micrometers.

Alternatively, an etching-stop technique may be applied to the process of forming the trenches 60*t* in the dielectric layer 60. In this case, the dielectric layer 60 is composed of the previously described inorganic layers, e.g., including the first silicon-oxide layer on the surfaces 58*s*, 62*s* and 64*s*, the silicon-oxynitride layer, used as the etch stop layer, on the first silicon-oxide layer, and the second silicon-oxide layer on the silicon-oxynitride layer. The trenches 60*t* can be formed in the dielectric layer 60 by etching the second silicon-oxide layer of the dielectric layer 60 under the openings 168*a* and the sidewall dielectric layers 50 under the openings 168*a* until the silicon-oxynitride layer of the dielectric layer 60 is exposed by the openings 168*a*. Accordingly, the trenches 60*t* are formed in the second silicon-oxide layer of the dielectric layer 60, and the remaining dielectric layer 60, composed of the silicon-oxynitride layer and the first silicon-oxide layer, under the trenches 60*t* has a thickness T6, e.g., between 0.1 and 5 micrometers, and preferably between 0.3 and 5 micrometers, between 0.5 and 2 micrometers, between 0.1 and 3 micrometers, or between 0.2 and 1.5 micrometers.

Figure 23:
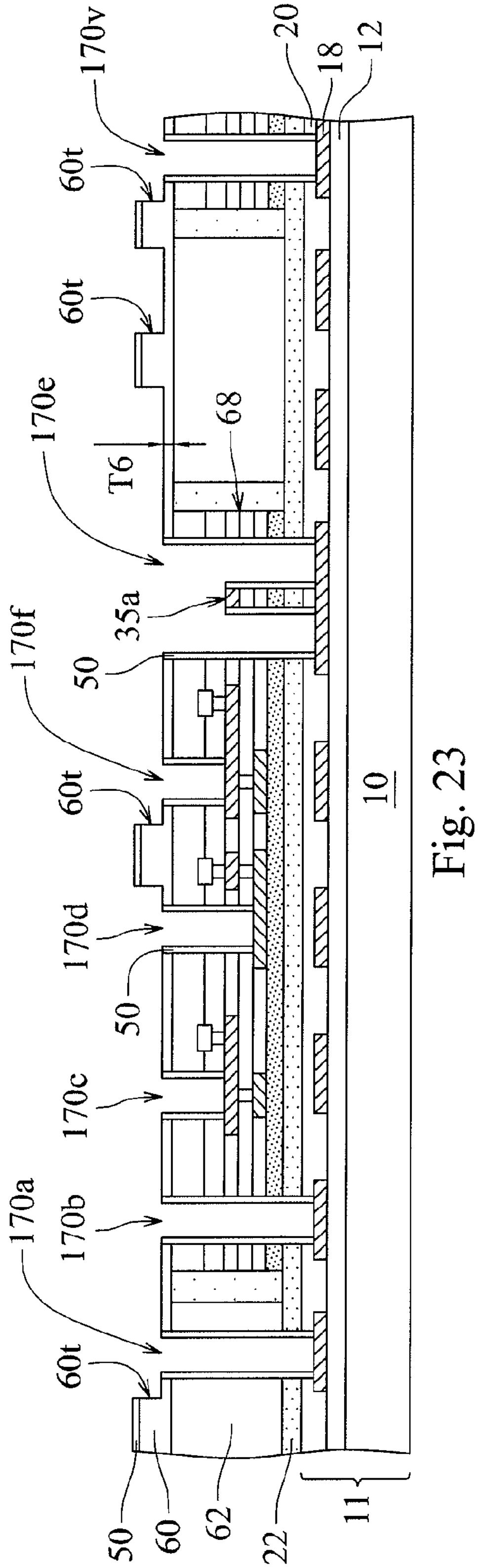
Figure 24:
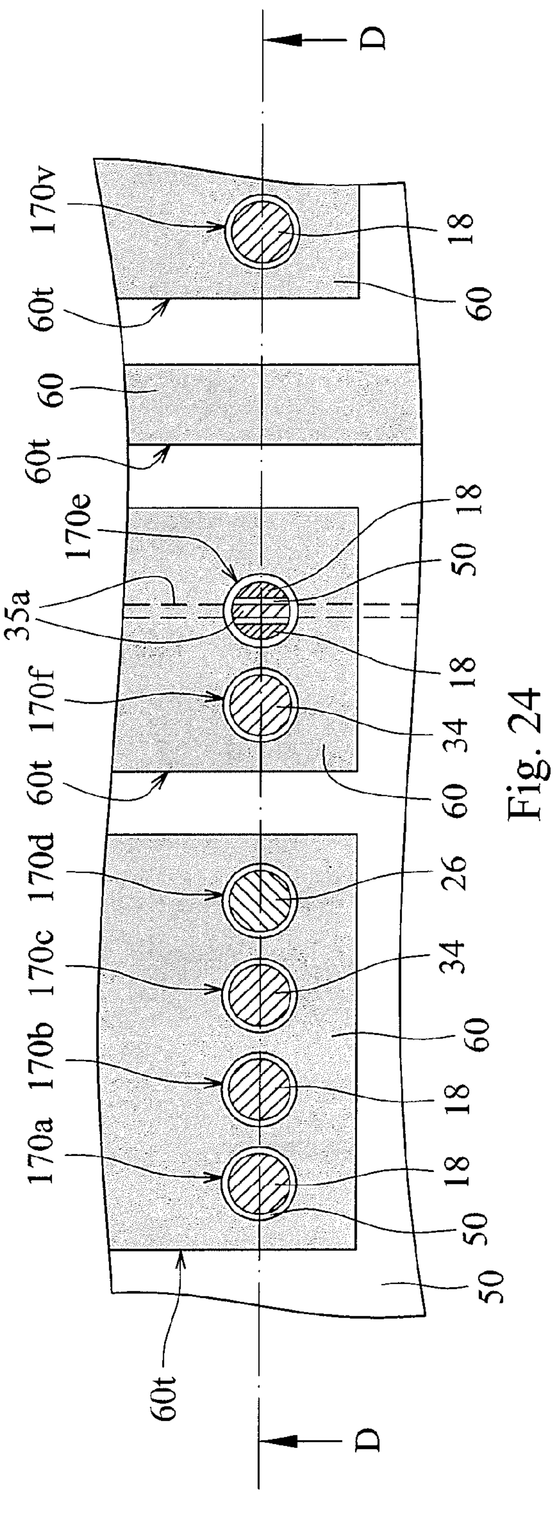

Next, referring to FIG. 23, the photoresist layer 168 is removed by using, e.g., an organic chemical. The trenches 60*t* formed in the dielectric layer 60 are used to provide spaces having inter-chip interconnects and intra-chip interconnects formed therein. The sidewall dielectric layers 50 formed on the sidewalls of the through vias 170*v* (such as the through vias 170*b*, 170*c*, 170*d*, 170*e* and 170*f*) in the chips 68 can prevent transition metals, such as copper, sodium or moisture from penetrating into IC devices of the chips 68. FIG. 24 is a schematic top perspective view showing the through vias 170*v*, the trenches 60*t* and the sidewall dielectric layers 50 shown in FIG. 23 according an embodiment of the present invention, and FIG. 23 is a cross-sectional view cut along the line D-D shown in FIG. 24.

Figure 25:
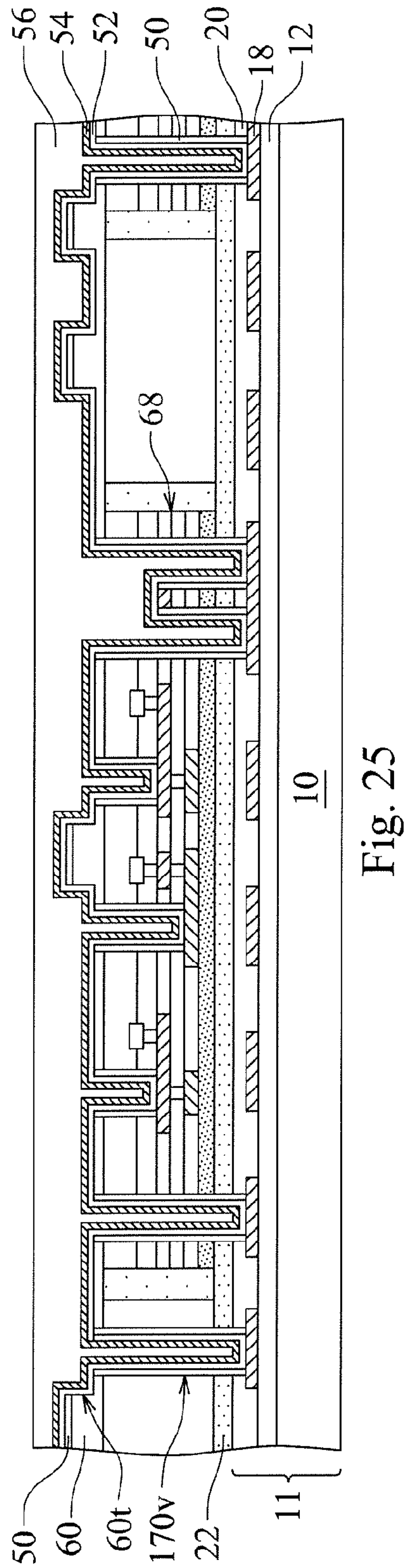

Next, referring to FIG. 25, an adhesion/barrier layer 52 having a thickness smaller than 1 micrometer, such as between 1 nanometer and 0.5 micrometers, and preferably between 0.1 and 0.2 micrometers, can be formed on the layers 18, 26 and 34 exposed by the through vias 170*v*, on sidewalls and bottoms of the trenches 60*t*, on the dielectric layer 50, and on the interconnect or metal trace 35*a* that is on the supporter 801. The adhesion/barrier layer 52 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 54 having a thickness smaller than 1 micrometer, such as between 10 nanometers and 0.8 micrometers, and preferably between 80 nanometers and 0.15 micrometers, can be formed on the adhesion/barrier layer 52 by a physical vapor deposition (PVD) process, such as sputtering process or evaporation process, by a chemical-vapor deposition (CVD) process, or by other thin-film deposition processes, such as atomic layer deposition (ALD). Next, a conduction layer 56 having a thickness, e.g., between 0.5 and 20 micrometers or between 0.5 and 10 micrometers, and preferably between 1 and 5 micrometers, can be formed on the seed layer 54 by using, e.g., an electroplating process.

The adhesion/barrier layer 52 may include or can be a layer of titanium, a titanium-tungsten alloy, titanium nitride, chromium, tantalum, tantalum nitride, nickel, or nickel vanadium having a thickness, e.g., smaller than 1 micrometer, such as between 1 nanometer and 0.5 micrometers, and preferably between 0.1 and 0.2 micrometers. The seed layer 54 may include or can be a layer of copper, a titanium-copper alloy, nickel, gold, or silver having a thickness, e.g., smaller than 1 micrometer, such as between 10 nanometers and 0.8 micrometers, and preferably between 80 nanometers and 0.15 micrometers. The conduction layer 56 may include or can be an electroplated metal layer of copper, gold, or silver having a thickness, e.g., between 0.5 and 20 micrometers or between 0.5 and 10 micrometers, and preferably between 1 and 5 micrometers.

Figure 26:
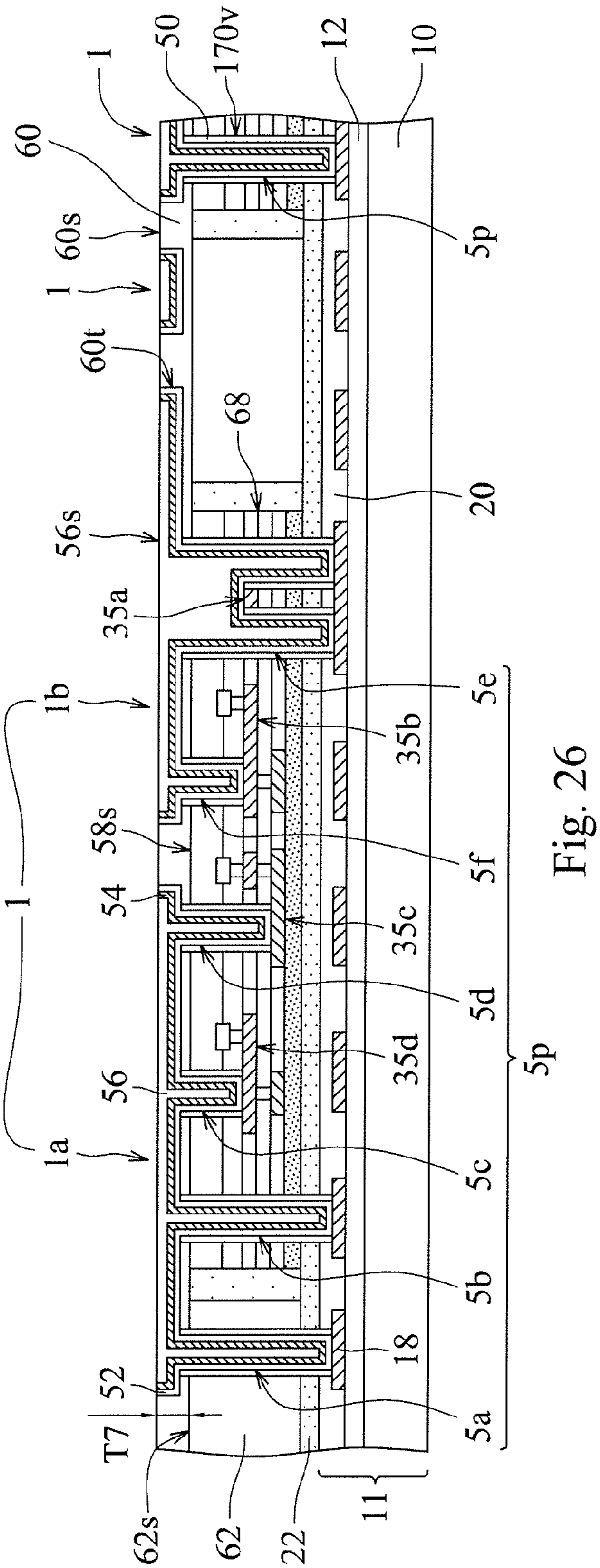

Next, referring to FIG. 26, by using a grinding or polishing process, such as chemical-mechanical-polishing (CMP) process, mechanical polishing process, mechanical grinding process, or a process including mechanical polishing and chemical etching, the layers 52, 54 and 56 outside the trenches 60*t* can be removed, and the dielectric layer 50 on the top surface of the dielectric layer 60 can be removed. Accordingly, the dielectric layer 60 has an exposed top surface 60*s* that can be substantially coplanar with the ground or polished surface 56*s* of the conduction layer 56 in the trenches 60*t*, and the surfaces 56*s* and 60*s* can be substantially flat. The dielectric layer 60 has a thickness T7, between the exposed top surface 60*s* and the surface 58*s* or 62*s*, e.g., between 1 and 10 micrometers, and preferably between 1 and 3 micrometers or between 2 and 5 micrometers. The adhesion/barrier layer 52 and the seed layer 54 are at sidewalls and a bottom of the conduction layer 56 in the trenches 60*t*, and the sidewalls and the bottom of the conduction layer 56 in the trenches 60*t* are covered by the adhesion/barrier layer 52 and the seed layer 54.

In a first alternative, after the steps of removing the layers 52, 54 and 56 outside the trenches 60*t* and removing the dielectric layer 50 on the top surface of the dielectric layer 60, the adhesion/barrier layer 52 can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 60*t*, on the layers 18, 26 and 34 at the bottoms of the through vias 170*v*, on the sidewall dielectric layers 50, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer. The conduction layer 56 can be an electroplated copper layer on the single layer of copper or a titanium-copper alloy, in the trenches 60*t*, and in the through vias 170*v*. The electroplated copper layer in the trenches 60*t* may have a thickness, e.g., between 0.1 and 5 micrometers, and preferably between 0.5 and 3 micrometers.

In a second alternative, after the steps of removing the layers 52, 54 and 56 outside the trenches 60*t* and removing the dielectric layer 50 on the top surface of the dielectric layer 60, the adhesion/barrier layer 52 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 60*t*, on the layers 18, 26 and 34 at the bottoms of the through vias 170*v*, on the sidewall dielectric layers 50, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer. The conduction layer 56 can be an electroplated copper layer on the single layer of copper or a titanium-copper alloy, in the trenches 60*t*, and in the through vias 170*v*. The electroplated copper layer in the trenches 60*t* may have a thickness, e.g., between 0.1 and 5 micrometers, and preferably between 0.5 and 3 micrometers.

In a third alternative, after the steps of removing the layers 52, 54 and 56 outside the trenches 60*t* and removing the dielectric layer 50 on the top surface of the dielectric layer 60, the adhesion/barrier layer 52 can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 60*t*, on the layers 18, 26 and 34 at the bottoms of the through vias 170*v*, on the sidewall dielectric layers 50, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer. The conduction layer 56 can be an electroplated copper layer on the single layer of copper or a titanium-copper alloy, in the trenches 60*t*, and in the through vias 170*v*. The electroplated copper layer in the trenches 60*t* may have a thickness, e.g., between 0.1 and 5 micrometers, and preferably between 0.5 and 3 micrometers.

After the steps of removing the layers 52, 54 and 56 outside the trenches 60*t* and removing the dielectric layer 50 on the top surface of the dielectric layer 60, the layers 52, 54 and 56 in the trenches 60*t* compose multiple metal interconnects (or damascene metal traces) 1, including metal interconnects (or damascene metal traces) 1*a* and 1*b*, in the trenches 60*t*. The layers 52, 54 and 56 in the through vias 170*v* compose multiple metal plugs (or metal vias) 5*p* in the through vias 170*v*, including metal plugs (or metal vias) 5*a*, 5*b*, 5*c*, 5*d*, 5*e* and 5*f* in the through vias 170*a*, 170*b*, 170*c*, 170*d*, 170*e* and 170*f* as shown in FIG. 23, respectively. Each of the metal plugs 5*p* in the chips 68 and in the dummy substrate(s) 62 is enclosed by one of the sidewall dielectric layers 50 in the through vias 170*v*. The metal plug 5*a* is formed in the dummy substrate 62, and the metal plugs 5*b*, 5*c*, 5*d*, 5*e* and 5*f* are formed in the same chip 68. The supporter 801 and the interconnect or metal trace 35*a*, in the interconnection layer 34, on the supporter 801 can be between two portions, lower than a horizontal level, at which a top surface of the interconnection layer 34 is positioned, of the metal plug 5*e*. These metal plugs 5*p* formed in the chips 68 and in the dummy substrate(s) 62 can connect the metal interconnects 1 and the semiconductor devices 36 in the chips 68 and connect the metal interconnects 1 and multiple contact points of the conductive layer 18 in the carrier 11. The metal interconnects 1, such as 1*a* and 1*b*, in the trenches 60*t* may have a thickness, e.g., between 0.1 and 5 micrometers, and preferably between 1 and 3 micrometers.

For example, one of the metal plugs 5*p*, such as the metal plug 5*a*, can be formed in the dummy substrate 62 and formed on a first contact point of the conductive layer 18 at a bottom of one of the through vias 170*v*, such as the through via 170*a*. Another one of the metal plugs 5*p*, such as the metal plug 5*b*, can be formed in one of the chips 68 and formed on a second contact point of the conductive layer 18 at a bottom of another one of the through vias 170*v*, such as the through via 170*b*. Another one of the metal plugs 5*p*, such as the metal plug 5*c*, can be formed in one of the chips 68 and formed on a contact point, at a bottom of another one of the through vias 170*v*

(such as the through via 170*c*), of the interconnect or metal trace 35*d* in the interconnection layer 34 of the one of the chips 68. Another one of the metal plugs 5*p*, such as the metal plug 5*d*, can be formed in one of the chips 68 and formed on a contact point, at a bottom of another one of the through vias 170*v* (such as the through via 170*d*), of the interconnect or metal trace 35*c* in the patterned metal layer 26 of the one of the chips 68. Another one of the metal plugs 5*p*, such as the metal plug 5*f*, can be formed in one of the chips 68 and formed on a contact point, at a bottom of another one of the through vias 170*v* (such as the through via 170*f*), of the interconnect or metal trace 35*b* in the interconnection layer 34 of the one of the chips 68. Another one of the metal plugs 5*p*, such as the metal plug 5*e*, can be formed in one of the chips 68, formed on a contact point of the interconnect or metal trace 35*a* over a supporter (such as the supporter 801) that is between two lower left and right portions of the another one of the metal plugs 5*p* (such as the metal plug 5*e*), and formed on a third contact point of the conductive layer 18 at a bottom of one of the through vias 170*v* (such as the through via 170*e*). The previously described first, second and third contact points of the conductive layer 18 can be separated from one another by the dielectric or insulating layer 20 of the carrier 11.

One of the metal interconnects 1, such as 1*a* or 1*b*, can be formed over the dummy substrate(s) 62, over multiple of the chips 68, and across multiple edges of the multiple of the chips 68. The metal interconnect 1*a* can be connected to the previously described first contact point of the conductive layer 18 at the bottom of the through via 170*a* through the metal plug 5*a* in the dummy substrate 62, can be connected to the previously described second contact point of the conductive layer 18 at the bottom of the through via 170*b* through the metal plug 5*b* in one of the chips 68, can be connected to the contact point, at the bottom of the through via 170*c*, of the interconnect or metal trace 35*d* in the one of the chips 68 through the metal plug 5*c* in the one of the chips 68, and can be connected to the contact point, at the bottom of the through via 170*d*, of the interconnect or metal trace 35*c* in the one of the chips 68 through the metal plug 5*d* in the one of the chips 68. The metal interconnect 1*b* can be connected to the contact point, at the bottom of the through via 170*f*, of the interconnect or metal trace 35*b* in the one of the chips 68 through the metal plug 5*f* in the one of the chips 68, can be connected to the previously described third contact point of the conductive layer 18 at the bottom of the through via 170*e* through the metal plug 5*e* in the one of the chips 68, and can be connected to the interconnect or metal trace 35*a* on the supporter 801 through the metal plug 5*e* in the one of the chips 68. The metal interconnect 1*a* can be further connected to one or more of the semiconductor devices 36 in another one of chips 68 through one or more of the metal plugs 5*p* in the another one of chips 68. The metal interconnect 1*b* can be further connected to one or more of the semiconductor devices 36 in another one of chips 68 through one or more of the metal plugs 5*p* in the another one of chips 68.

Accordingly, one of the semiconductor devices 36 in one of the chips 68 can be connected to another one of the semiconductor devices 36 in the one of the chips 68 or in another one of the chips 68 through one of the metal interconnects 1, such as 1*a* or 1*b*, and can be connected to a contact point, at a bottom of one of the through vias 170*v* (such as the through via 170*a*, 170*b* or 170*e*), of the conductive layer 18 in the carrier 11 through the one of the metal interconnects 1. Each of the metal interconnects 1 can be a signal trace, a bit line, a clock bus, a power plane, a power bus, a power trace, a ground plane, a ground bus, or a ground trace.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

Figure 27:
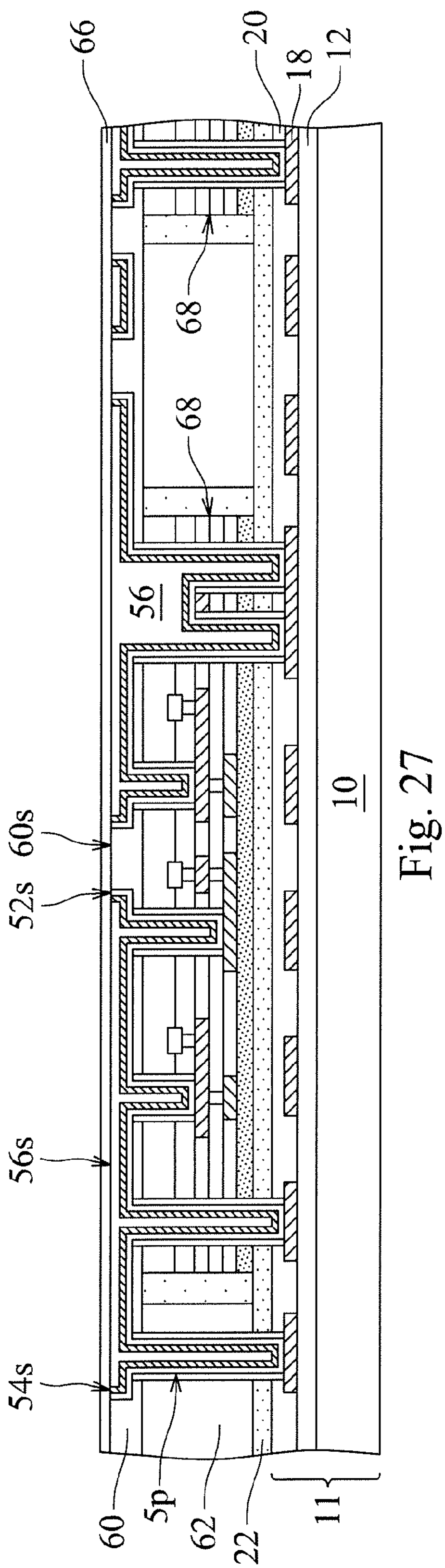

Referring to FIG. 27, after forming the structure illustrated in FIG. 26, an insulating or dielectric layer 66 can be formed on the ground or polished surface 52*s* of the adhesion/barrier layer 52, on the ground or polished surface 54*s* of the seed layer 54, on the ground or polished surface 56*s* of the conduction layer 56, and on the exposed top surface 60*s* of the dielectric layer 60. The insulating or dielectric layer 66 may have a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers.

The insulating or dielectric layer 66, for example, may include or can be a layer of silicon oxide (such as $SiO_2$), silicon nitride (such as $Si_3N_4$), silicon carbon nitride (such as SiCN), silicon oxynitride (such as SiON), or silicon oxycarbide (such as SiOC) with a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers, formed by a chemical vapor deposition (CVD) process or a plasma-enhanced chemical vapor deposition (PECVD) process.

Alternatively, the insulating or dielectric layer 66 may include or can be a polymer layer with a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers, formed by, e.g., a process including a spin coating process and a curing process. The polymer layer can be a layer of polyimide, benzocyclobutene (BCB), epoxy, polybenzoxazole (PBO), or poly-phenylene oxide (PPO).

Figure 28:
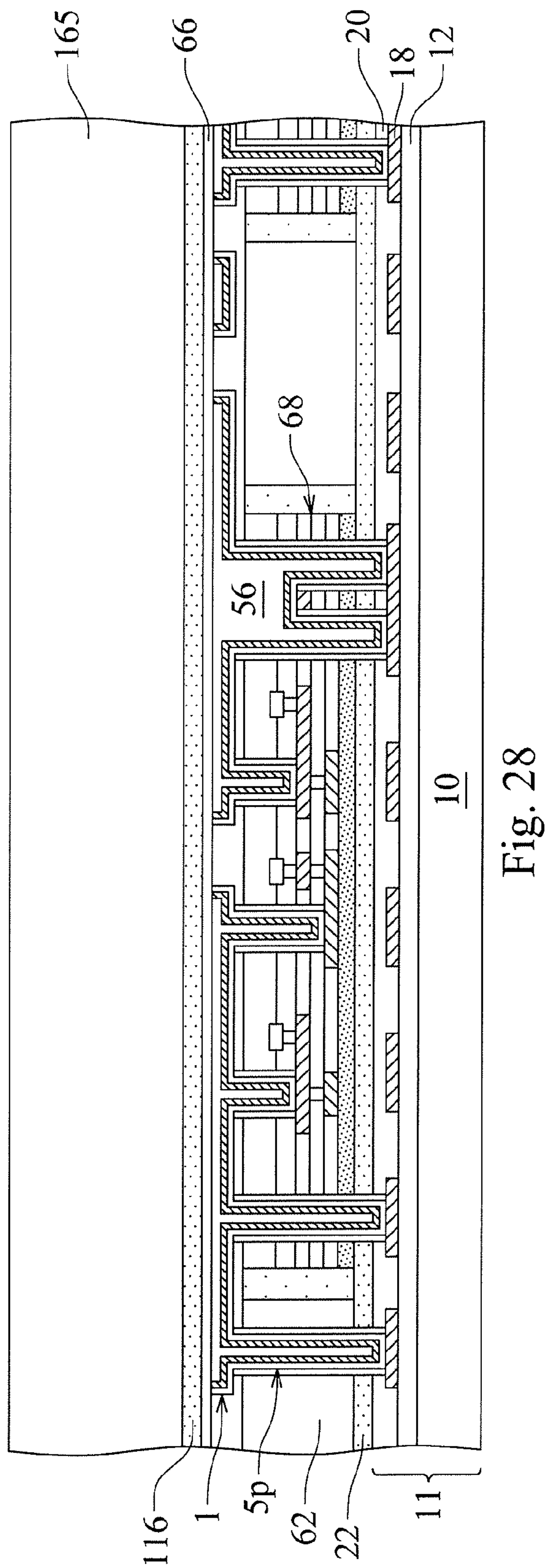

Next, referring to FIG. 28, a dummy substrate 165 can be attached onto the insulating or dielectric layer 66, e.g., by the following steps. First, a glue layer 116 having a thickness, e.g., between 3 and 100 micrometers, and preferably between 5 and 10 micrometers or between 10 and 30 micrometers, can be formed on a top surface of the insulating or dielectric layer 66 or on a bottom surface of the dummy substrate 165 by using, e.g., a spin coating process, a lamination process, a spraying process, a dispensing process, or a screen printing process. Next, the glue layer 116 can be optionally pre-cured or baked. Next, the dummy substrate 165 can be placed over the insulating or dielectric layer 66 with the glue layer 116 between the insulating or dielectric layer 66 and the dummy substrate 165. Next, the glue layer 116 can be cured again in a temperature between 180 degrees centigrade and 350 degrees centigrade with a mechanical or thermal pressure on the glue layer 116. Accordingly, the dummy substrate 165 can be joined with the insulating or dielectric layer 66 using the glue layer 116. The glue layer 116 can be a polymer layer, such as a layer of epoxy, polyimide, benzocyclobutene (BCB), polybenzoxazole (PBO), poly-phenylene oxide (PPO), or silosane, with a thickness, e.g., between 3 and 100 micrometers, and preferably between 5 and 10 micrometers or between 10 and 30 micrometers.

Alternatively, the glue layer 116 can be replaced with an inorganic insulating layer, such as silicon oxide, that can be formed on the insulating or dielectric layer 66. In this case, the dummy substrate 165 can be joined with the insulating or dielectric layer 66, e.g., by bonding an inorganic insulating layer, such as silicon oxide, of the dummy substrate 165 onto the inorganic insulating layer 116, such as silicon oxide. The silicon-oxide layer of the dummy substrate 165 contacts the silicon-oxide layer 116.

The dummy substrate 165 can be a round wafer, a dummy silicon wafer, a rectangular panel, or a substrate of polysilicon, glass, silicon or ceramic. The dummy substrate 165, before being ground or polished as mentioned in the following processes, may have a thickness, e.g., greater than 100 micrometers, such as between 100 and 1,500 micrometers, and preferably between 200 and 500 micrometers or between 100 and 300 micrometers.

In one embodiment, there are no circuits preformed in the dummy substrate 165 or on a top or bottom surface of the dummy substrate 165 before the dummy substrate 165 is joined with the insulating or dielectric layer 66. The dummy substrate 165 may have a top surface with the profile that is substantially same as that of the top surface of the carrier 11.

Figure 29:
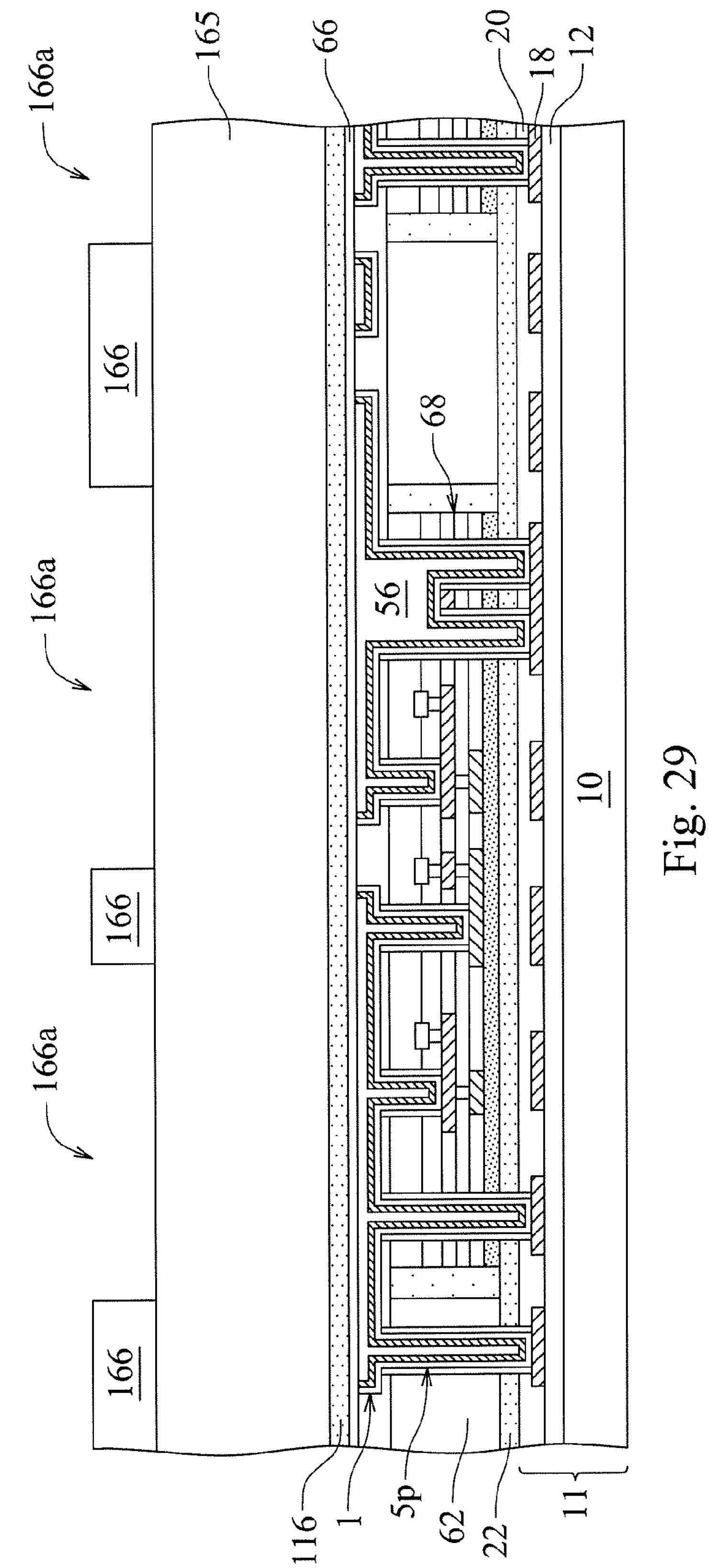
Figure 30:
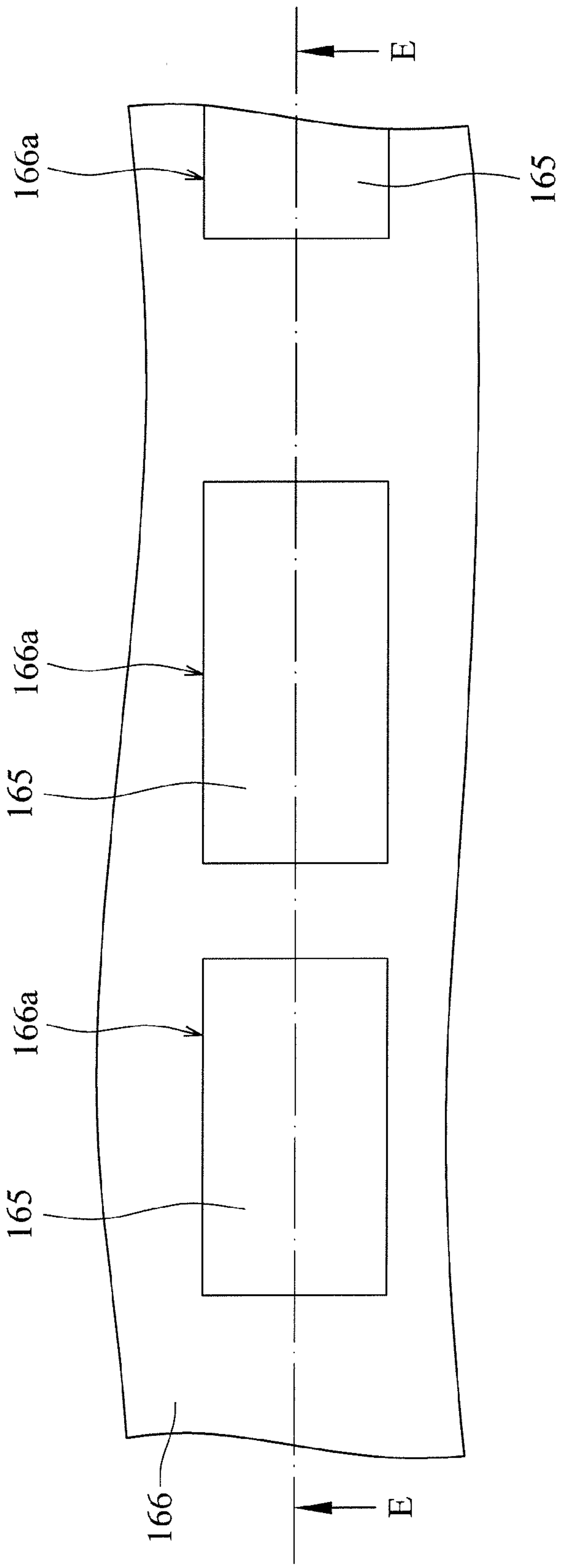

Next, referring to FIG. 29, a photoresist layer 166 can be formed on the dummy substrate 165 by using, e.g., a spin coating process, a screen printing process, or a lamination process, and then a photo exposure process and a development process can be employed to form multiple openings **166*a*, exposing multiple regions of the dummy substrate 165, in the photoresist layer 166. The photoresist layer 166, after the photo exposure process and the development process, may have a thickness, e.g., between 10 and 200 micrometers. FIG. 30 shows a schematic top view of the photoresist layer 166 with the openings 166*a* as shown in FIG. 29, and FIG. 30 can be a cross-sectional view cut along the line E-E shown in FIG. 29**.

Figure 31:
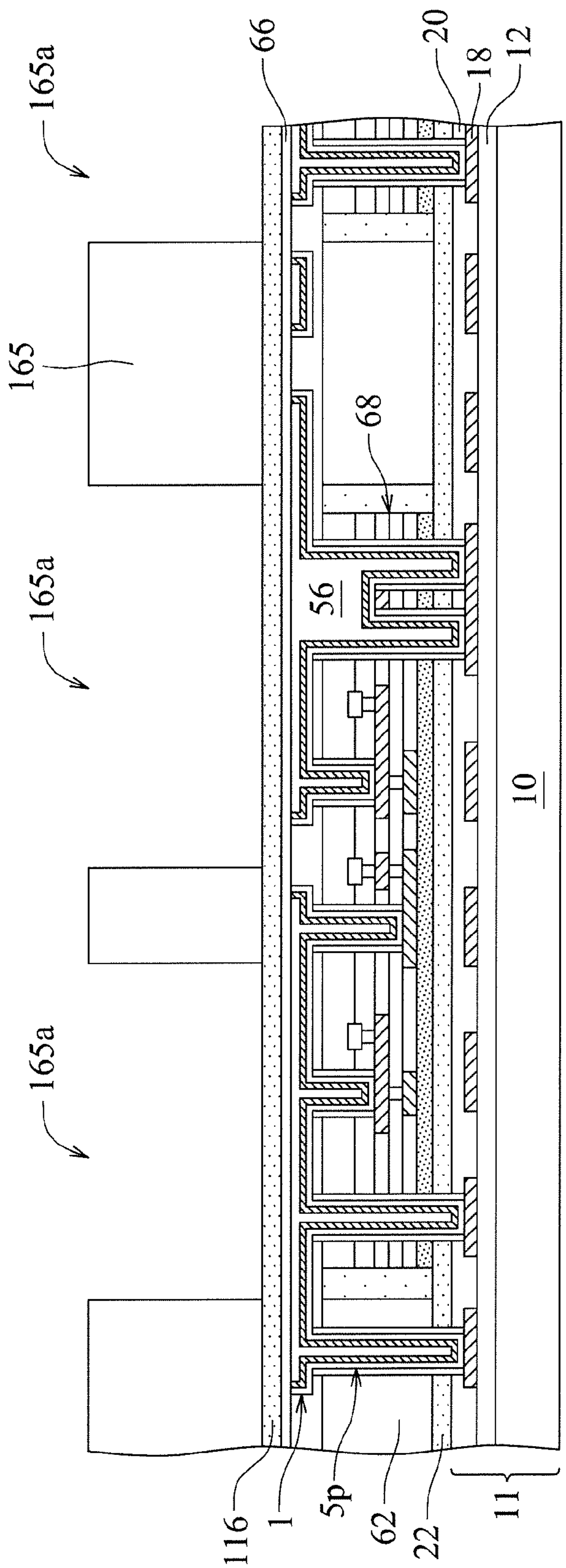
Figure 32:
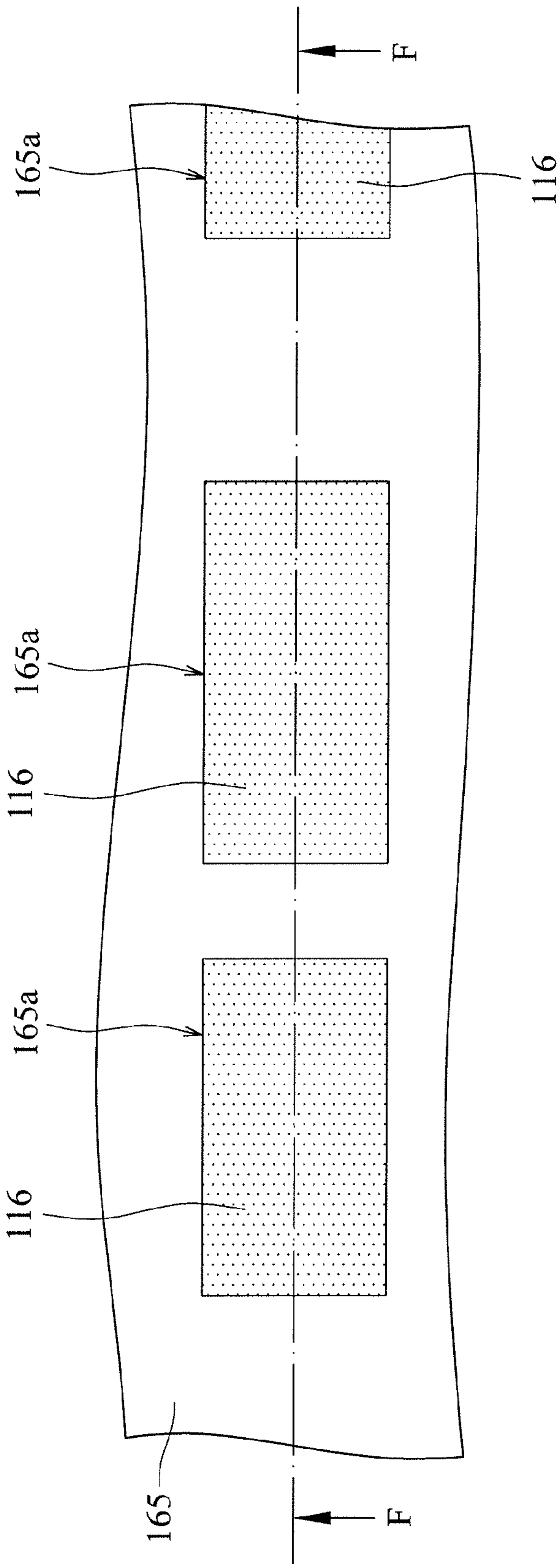

Next, referring to FIG. 31, multiple openings **165*a* are formed in the dummy substrate 165 and under the openings 166*a* in the photoresist layer 166, exposing the glue layer 116, by using, e.g., a chemical etching process or a plasma etching process, and then the patterned photoresist layer 166 is removed by using, e.g., an organic chemical. Alternatively, when the glue layer 116 is replaced with the silicon-oxide layer and the dummy substrate 165 has the silicon-oxide layer bonded with the silicon-oxide layer 116, the openings 165*a* are formed in the dummy substrate 165 and under the openings 166*a* in the photoresist layer 166, exposing the silicon-oxide layer of the dummy substrate 165, by using, e.g., a chemical etching process or a plasma etching process, and then the patterned photoresist 166 is removed by using, e.g., an organic chemical. FIG. 32 shows a schematic top view of the dummy substrate 165 with the openings 165*a* as shown in FIG. 31, and FIG. 31 can be a cross-sectional view cut along the line F-F shown in FIG. 32**.

Alternatively, a hard mask (not shown), such as silicon oxide or silicon nitride, may be formed on the dummy substrate 165 shown in FIG. 31, e.g., by the following steps. First, the hard mask of silicon oxide or silicon nitride can be formed on the dummy substrate 165 shown in FIG. 28. Next, the photoresist layer 166 can be formed on the hard mask by using, e.g., a spin coating process, a screen printing process, or a lamination process. Next, a photo exposure process and a development process can be employed to form multiple openings **166*a*, exposing multiple regions of the hard mask, in the photoresist layer 166. Next, multiple openings are formed in the hard mask and under the openings 166*a* in the photoresist layer 166, exposing multiple regions of the dummy substrate 165, by using, e.g., a wet etching process or a plasma etching process. Next, the patterned photoresist layer 166 is removed by using, e.g., an organic chemical. Next, multiple openings 165*a* are formed in the dummy substrate 165 and under the openings in the hard mask, exposing the glue layer 116, by using, e.g., a chemical etching process or a plasma etching process. Alternatively, when the glue layer 116 is replaced with the silicon-oxide layer and the dummy substrate 165 has the silicon-oxide layer bonded with the silicon-oxide layer 116, the openings 165*a* are formed in the dummy substrate 165 and under the openings in the hard mask, exposing the silicon-oxide layer of the dummy substrate 165**, by using, e.g., a chemical etching process or a plasma etching process. The hard mask will be removed by the following grinding or polishing process.

Figure 33:
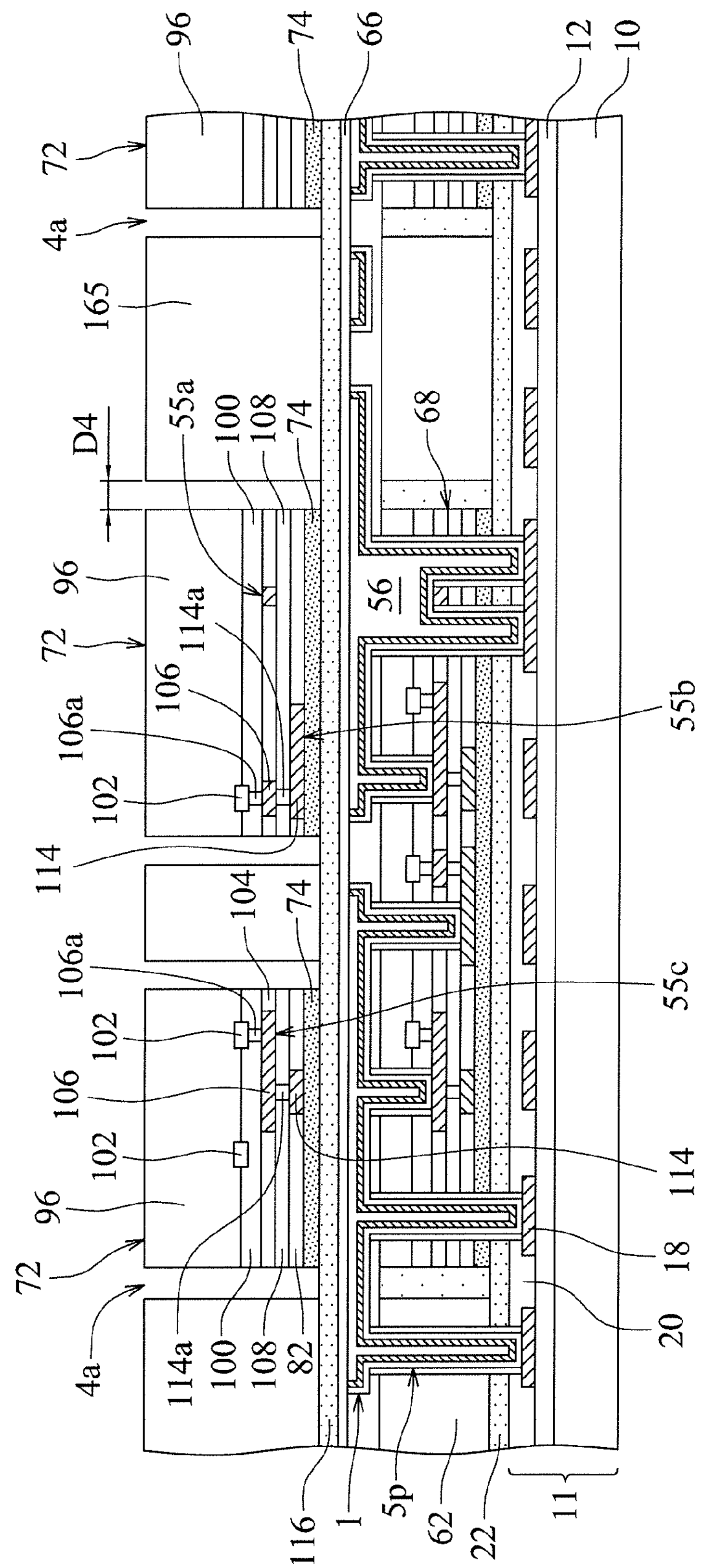
Figure 34:
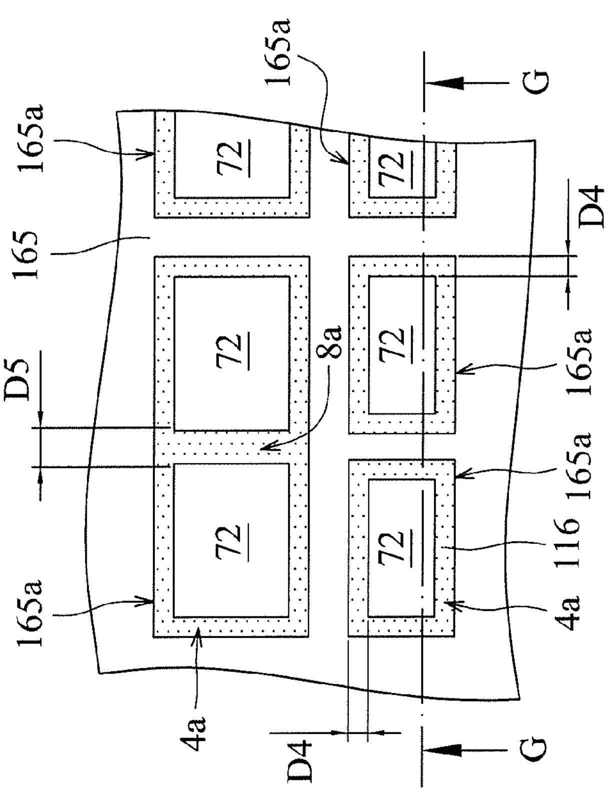

Next, referring to FIG. 33, multiple chips 72 can be mounted over the insulating or dielectric layer 66 and in the openings **165*a* in the dummy substrate 165, and the chips 72 have active sides at bottoms of the chips 72 and backsides at tops of the chips 72. In one case, one of the chips 72 may have different circuit designs from those of another one of the chips 72. Also, in another case, one of the chips 72 may have same circuit designs as those of another one of the chips 72. Alternatively, one of the chips 72 may have a different area (top surface) or size from that of another one of the chips 72. Also, in another case, one of the chips 72 may have a same area (top surface) or size as that of another one of the chips 72. FIG. 34 is an example of a schematical top view showing the chips 72 mounted in the openings 165*a* in the dummy substrate 165, and FIG. 33 is a cross-sectional view cut along the line G-G shown in the schematical top view of FIG. 34**.

Mounting the chips 72 over the insulating or dielectric layer 66 and in the openings **165*a* can be performed, e.g., by first forming a glue material (not shown) on the active sides of the chips 72 or on the glue layer 116, next placing the chips 72 in the openings 165*a* and over the glue layer 116 with the glue material contacting the glue layer 116, and then curing the glue material in a temperature between 180 degrees centigrade and 350 degrees centigrade with a mechanical or thermal pressure on the glue material. Accordingly, the chips 72 can be joined with the glue layer 116** using the glue material.

Each of the chips 72 can include a semiconductor substrate 96, multiple semiconductor devices 102 in and/or on the semiconductor substrate 96, a passivation layer 74 under the semiconductor substrate 96, multiple dielectric layers 82, 108, 104 and 100 between the semiconductor substrate 96 and the passivation layer 74, a patterned metal layer 114 between the semiconductor substrate 96 and the passivation layer 74, an interconnection layer 106 between the semiconductor substrate 96 and the passivation layer 74, multiple via plugs **114*a* in the dielectric layer 108, and multiple via plugs 106*a* in the dielectric layer 100. The semiconductor substrate 96 is at the backside of each chip 72, and the semiconductor devices 102, the passivation layer 74, the patterned metal layer 114, the interconnection layer 106, the dielectric layers 82, 108, 104 and 100, and the via plugs 106*a* and 114*a* are at the active side of each chip 72**.

The semiconductor substrate 96 can be a suitable substrate, such as silicon substrate, silicon-germanium (SiGe) substrate, or gallium-arsenide (GaAs) substrate. The semiconductor substrate 96 before being thinned as mentioned in the following processes may have a thickness, e.g., greater than 100 micrometers, such as between 100 and 500 micrometers, and preferably between 150 and 250 micrometers or between 100 and 300 micrometers.

Each of the semiconductor devices 102 can be a bipolar transistor, a P-channel metal-oxide-semiconductor (PMOS) transistor, an N-channel metal-oxide-semiconductor (NMOS) transistor, or a double-diffused metal-oxide-semiconductor (DMOS) transistor. Each of the semiconductor devices 102 can be provided for a NOR gate, a NAND gate, an AND gate, an OR gate, a static-random-access-memory (SRAM) cell, a dynamic-random-access-memory (DRAM)

cell, a flash memory cell, a non-volatile memory cell, an erasable programmable read-only memory (EPROM) cell, a read-only memory (ROM) cell, a magnetic-random-access-memory (MRAM) cell, a sense amplifier, an inverter, an operational amplifier, an adder, a multiplexer, a diplexer, a multiplier, an analog-to-digital (A/D) converter, a digital-to-analog (D/A) converter, an analog circuit, a complementary-metal-oxide-semiconductor (CMOS) sensor, or a charge coupled device (CCD).

The passivation layer 74 may include or can be an inorganic dielectric layer having a bottom surface attached to the glue layer 116, and the inorganic dielectric layer can be a layer of silicon nitride (such as $Si_3N_4$), silicon carbon nitride (such as SiCN) or silicon oxynitride (such as SiON) with a thickness, e.g., between 0.3 and 1.5 micrometers. Alternatively, each of the chips 72 may further contain an organic polymer layer, such as a layer of polyimide, benzocyclobutene (BCB), polybenzoxazole (PBO), poly-phenylene oxide (PPO), epoxy, or silosane, with a thickness, e.g., greater than 3 micrometers, such as between 3 and 20 micrometers, and preferably between 5 and 12 micrometers, under and on the bottom surface of the inorganic dielectric layer of the passivation layer 74. In this case, the organic polymer layer has a bottom surface attached to the glue layer 116. The organic polymer layer has a top surface contacting the bottom surface of the inorganic dielectric layer of the passivation layer 74.

Alternatively, multiple openings (not shown) each having a width, e.g., between 0.5 and 100 micrometers, and preferably between 20 and 60 micrometers, may be formed in the passivation layer 74 and expose multiple contact points of the patterned metal layer 114.

The dielectric layer 82 can be between the passivation layer 74 and the dielectric layer 108. The dielectric layer 108 can be between the dielectric layers 82 and 104 and between the layers 106 and 114. The dielectric layer 104 can be between the dielectric layers 100 and 108. Each of the dielectric layers 82, 108 and 104 may include silicon oxide (such as $SiO_2$), silicon nitride (such as $Si_3N_4$), silicon carbon nitride (such as SiCN), silicon oxynitride (such as SiON), silicon oxycarbide (such as SiOC), or a low-k material having a dielectric constant between 1.8 and 3 (such as fluorinated silicate glass (FSG) or Black-diamond). Each of the dielectric layers 82, 108 and 104 may have a thickness, e.g., between 10 nanometers and 2 micrometers, and preferably between 50 nanometers and 1 micrometer.

The dielectric layer 100 between the dielectric layer 104 and the semiconductor substrate 96 and between the interconnection layer 106 and the semiconductor substrate 96 may include or can be a layer of phosphorous silicate glass (PSG), borophospho-silicate glass (BPSG), silicon oxide (such as $SiO_2$), silicon nitride (such as $Si_3N_4$), silicon carbon nitride (such as SiCN), silicon oxynitride (such as SiON), or a low-k material having a dielectric constant between 1.8 and 3 (such as fluorinated silicate glass (FSG) or Black-diamond). The dielectric layer 100 may have a thickness, e.g., between 10 nanometers and 1 micrometer.

The patterned metal layer 114, for example, may include an aluminum-copper-alloy layer having a thickness, e.g., between 0.3 and 3 micrometers and a titanium-containing layer having a thickness, e.g., smaller than 0.2 micrometers, such as between 0.02 and 0.15 micrometers. The titanium-containing layer can be between the dielectric layer 108 and the aluminum-copper-alloy layer and on the aluminum-copper-alloy layer, and the aluminum-copper-alloy layer is between the passivation layer 74 and the titanium-containing layer. The titanium-containing layer can be a single layer of titanium, titanium nitride, or a titanium-tungsten alloy having a thickness, e.g., smaller than 0.2 micrometers, such as between 0.02 and 0.15 micrometers.

Alternatively, the patterned metal layer 114 may include a nickel layer having a thickness, e.g., between 0.5 and 3 micrometers, and a gold layer having a thickness, e.g., between 0.01 and 1 micrometers under and on the nickel layer, in the view from the side of the dielectric layer 108 to the side of the passivation layer 74. The nickel layer is between the dielectric layer 108 and the gold layer, and the gold layer is between the nickel layer and the passivation layer 74.

Alternatively, the patterned metal layer 114 can be formed by a damascene or double-damascene process including an electroplating process and a chemical mechanical polishing (CMP) process and can be composed of an electroplated copper layer having a bottom contacting the passivation layer 74, an adhesion/barrier metal layer at a top and sidewalls of the electroplated copper layer, and a seed layer between the electroplated copper layer and the adhesion/barrier metal layer and on the top and sidewalls of the electroplated copper layer. The adhesion/barrier metal layer has a first portion between the top of the electroplated copper layer and the dielectric layer 108 and a second portion at the sidewalls of the electroplated copper layer. The electroplated copper layer may have a thickness, e.g., smaller than 1.5 micrometers, such as between 0.15 and 1.2 micrometers, or smaller than 3 micrometers, such as between 0.3 and 3 micrometers. The electroplated copper layer may have a width, e.g., smaller than 1 micrometer, such as between 0.05 and 1 micrometers. The seed layer may include or can be a layer of copper or a titanium-copper alloy formed by a suitable process, such as sputtering process. The adhesion/barrier metal layer may include or can be a layer of titanium, a titanium-tungsten alloy, titanium nitride, chromium, tantalum, or tantalum nitride formed by a suitable process, such as sputtering process. The adhesion/barrier metal layer may have a thickness, e.g., smaller than 0.1 micrometers, such as between 0.005 and 0.1 micrometers. The sidewalls of the electroplated copper layer are covered by the adhesion/barrier metal layer and the seed layer.

The interconnection layer 106, for example, may include carbon nanotube. Alternatively, the interconnection layer 106 can be composed of a patterned metal layer in the dielectric layer 104. In a first alternative, the patterned metal layer 106 may include an aluminum-copper-alloy layer having a thickness, e.g., between 10 nanometers and 2 micrometers and a titanium-containing layer, such as a single layer of titanium nitride, titanium-tungsten alloy or titanium, having a thickness, e.g., smaller than 0.2 micrometers, such as between 0.02 and 0.15 micrometers. The titanium-containing layer can be on the aluminum-copper-alloy layer and between the dielectric layer 100 and the aluminum-copper-alloy layer, and the aluminum-copper-alloy layer can be in the dielectric layer 104. In a second alternative, the patterned metal layer 106 can be formed by a damascene or double-damascene process including an electroplating process and a chemical mechanical polishing (CMP) process and can be composed of an electroplated copper layer having a bottom contacting the dielectric layer 108, an adhesion/barrier metal layer at a top and sidewalls of the electroplated copper layer, and a seed layer between the electroplated copper layer and the adhesion/barrier metal layer and on the top and sidewalls of the electroplated copper layer. The adhesion/barrier metal layer has a first portion between the top of the electroplated copper layer and the dielectric layer 100 and a second portion at the sidewalls of the electroplated copper layer. The electroplated copper layer may have a thickness, e.g., smaller than 2 micrometers, such as between 0.15 and 1 micrometers or between 10 nanometers and 2 micrometers. The electroplated copper layer may have a width, e.g., smaller than 1 micrometer, such as between 0.05 and 1 micrometers. The seed layer may include or can be a layer of copper or a titanium-copper alloy formed by a suitable process, such as sputtering process. The adhesion/barrier metal layer may include or can be a layer of titanium, titanium nitride, a titanium-tungsten alloy, chromium, tantalum or tantalum nitride formed by a suitable process, such as sputtering process. The adhesion/barrier metal layer may have a thickness, e.g., smaller than 0.1 micrometers, such as between 0.005 and 0.1 micrometers. The sidewalls of the electroplated copper layer are covered by the adhesion/barrier metal layer and the seed layer.

The patterned metal layer 114 in the dielectric layer 82 can be connected to the interconnection layer 106 in the dielectric layer 104 through the via plugs 114*a* in the dielectric layer 108. The interconnection layer 106 in the dielectric layer 104 can be connected to the semiconductor devices 102 through the via plugs 106*a* in the dielectric layer 100. The via plugs 114*a* may include electroplated copper, tungsten, or carbon nanotube in the dielectric layer 108. The via plugs 106*a* may include electroplated copper, tungsten, or carbon nanotube in the dielectric layer 100.

Each of the chips 72 may include multiple interconnects or metal traces 55*a*, 55*b* and 55*c* provided by the interconnection layer 106, the patterned metal layer 114 and the via plugs 106*a* and 114*a*. Each of the interconnects or metal traces 55*a*, 55*b* and 55*c* can be connected to one or more of the semiconductor devices 102 and can be a signal trace, a bit line, a clock bus, a power plane, a power bus, a power trace, a ground plane, a ground bus, or a ground trace.

Alternatively, each of the chips 72 may further include a patterned metal layer (not shown), having a thickness greater than that of the patterned metal layer 114 and greater than that of the interconnection layer 106, between the glue layer 116 and the passivation layer 74. The patterned metal layer under the passivation layer 74 may include an electroplated metal layer under the passivation layer 74, an adhesion/barrier metal layer between the electroplated metal layer and the passivation layer 74, and a seed layer between the electroplated metal layer and the adhesion/barrier metal layer. In the view from the side of the passivation layer 74 to the side of the glue layer 116, the adhesion/barrier metal layer can be on the seed layer, and the seed layer can be on the electroplated metal layer. Sidewalls of the electroplated metal layer are not covered by the adhesion/barrier metal layer and the seed layer. The adhesion/barrier metal layer may include or can be a layer of titanium, a titanium-tungsten alloy, titanium nitride, chromium, tantalum, tantalum nitride, or nickel with a thickness, e.g., smaller than 0.6 micrometers, such as between 1 nanometer and 0.5 micrometers or between 0.005 and 0.1 micrometers. The seed layer may include or can be a layer of copper, a titanium-copper alloy, silver, gold, or nickel with a thickness, e.g., smaller than 0.8 micrometers, such as between 5 nanometers and 0.1 micrometers or between 10 nanometers and 0.8 micrometers. Each of the adhesion/barrier metal layer and the seed layer can be formed by a suitable process, such as sputtering process. The electroplated metal layer may include or can be a layer of electroplated copper, electroplated silver, or electroplated gold with a thickness, e.g., greater than 2 micrometers, such as between 2 and 30 micrometers, and preferably between 3 and 10 micrometers or between 5 and 25 micrometers.

Alternatively, when the silicon-oxide layer of the dummy substrate 165 remains on the silicon-oxide layer 116, after forming the openings 165*a*, and is exposed by the openings 165*a* in the dummy substrate 165, mounting the chips 72 over the insulating or dielectric layer 66 and in the openings 165*a* can be performed, e.g., by bonding another silicon-oxide layer of the passivation layer 74, at the active side of each chip 72, with the remaining silicon-oxide layer of the dummy substrate 165 under the passivation layer 74. The silicon-oxide layer of the passivation layer 74 contacts the silicon-oxide layer of the dummy substrate 165. Accordingly, the chips 72 can be joined with the insulating or dielectric layer 66 using these silicon-oxide layers.

Alternatively, another technique to form the structure illustrated in FIGS. 33 and 34 is performed by first providing a patterned dummy substrate 165, such as patterned dummy wafer, patterned panel, patterned silicon frame, or patterned substrate of polysilicon, glass, silicon, ceramic, or polymer, with multiple openings 165*a* passing through the patterned dummy substrate 165, next joining the patterned dummy substrate 165 with the insulating or dielectric layer 66 using the layer 116, which can be referred to as the steps illustrated in FIG. 28, and then mounting the chips 72 over the insulating or dielectric layer 66 and in the openings 165*a* in the patterned dummy substrate 165, which can be referred to as the steps illustrated in FIG. 33.

As shown in FIGS. 33 and 34, there are multiple gaps 4*a* each between the dummy substrate 165 and one of the chips 72, and there are multiple gaps 8*a* (one of them is shown) each between neighboring two chips 72. Each of the gaps 4*a* may have a transverse distance or spacing D4, e.g., between 1 and 200 micrometers, between 1 and 50 micrometers, or between 1 and 10 micrometers, and preferably between 1 and 5 micrometers. Each of the gaps 8*a* may have a transverse distance or spacing D5, e.g., between 1 and 200 micrometers, between 1 and 50 micrometers, or between 1 and 10 micrometers, and preferably between 1 and 5 micrometers.

Figure 35:
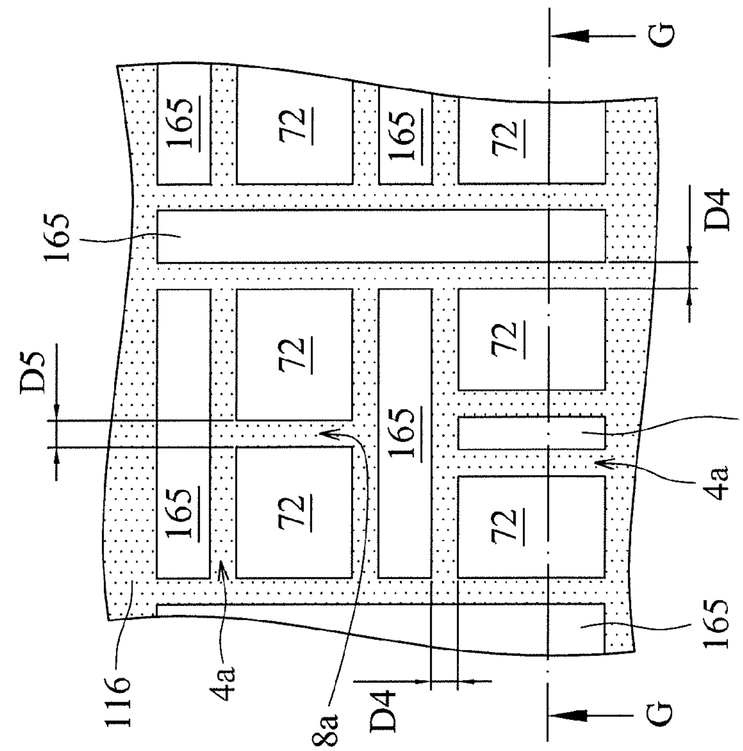

FIG. 35 shows another technique to form the structure with the same cross-sectional view as shown in FIG. 33. FIG. 33 is a cross-sectional view cut along the line G-G shown in a schematical top view of FIG. 35. The structure shown in FIGS. 33 and 35 can be formed, e.g., by the following steps. First, the previously described glue layer 116 can be formed on the insulating or dielectric layer 66 shown in FIG. 27 by using, e.g., a spin coating process, a laminating process, a spraying process, a dispensing process, or a screen printing process. Next, the glue layer 116 can be optionally pre-cured or baked. Next, the previously described chips 72 and multiple separate dummy substrates 165 can be placed on the glue layer 116. When a gap between neighboring two chips 72 is too great, such as greater than 500 or 1,000 micrometers, one or more of the separate dummy substrates 165 can be placed in the gap. Alternatively, when a gap between neighboring two chips 72 is small enough, such as smaller than 500 or 1,000 micrometers, there can be no separate dummy substrates 165 placed in the gap. Next, the glue layer 116 can be cured again in a temperature between 180 degrees centigrade and 350 degrees centigrade with a mechanical or thermal pressure on the glue layer 116. Accordingly, the separate dummy substrates 165 and the chips 72 can be joined with the insulating or dielectric layer 66 using the glue layer 116. The separate dummy substrates 165, for example, can be separate silicon bars, separate dummy chips, separate dummy silicon dies, or separate substrates of polysilicon, glass, silicon, or ceramic.

Alternatively, referring to FIGS. 33 and 35, the glue layer 116 can be replaced with a silicon-oxide layer that is formed on the insulating or dielectric layer 66. In this case, joining the chips 72 with the layer 66 and joining the separate dummy substrates 165 with the layer 66 can be performed, e.g., by bonding another silicon-oxide layer of the passivation layer 74, at the active side of each chip 72, with the silicon-oxide layer 116 and by bonding another silicon-oxide layer of each of the separate dummy substrates 165 with the silicon-oxide layer 116. The silicon-oxide layer of the passivation layer 74 of each chip 72 contacts the silicon-oxide layer 116, and the silicon-oxide layer of each of the separate dummy substrates 165 contacts the silicon-oxide layer 116. Accordingly, the chips 72 and the separate dummy substrates 165 can be joined with the insulating or dielectric layer 66 using these silicon-oxide layers.

As shown in FIGS. 33 and 35, there are multiple gaps 4*a* each between one of the chips 72 and one of the separate dummy substrates 165, and there are multiple gaps 8*a* (one of them is shown) each between neighboring two chips 72. Each of the gaps 4*a* may have a transverse distance or spacing D4, e.g., between 1 and 200 micrometers, between 1 and 50 micrometers, or between 1 and 10 micrometers, and preferably between 1 and 5 micrometers. Each of the gaps 8*a* may have a transverse distance or spacing D5, e.g., smaller than 500 micrometers, such as between 1 and 200 micrometers, between 1 and 50 micrometers, or between 1 and 10 micrometers, and preferably between 1 and 5 micrometers. In one embodiment, there are no circuits preformed in each separate dummy substrate 165 or on a top or bottom surface of each separate dummy substrate 165 before the separate dummy substrates 165 are joined with the insulating or dielectric layer 66.

Figure 36:
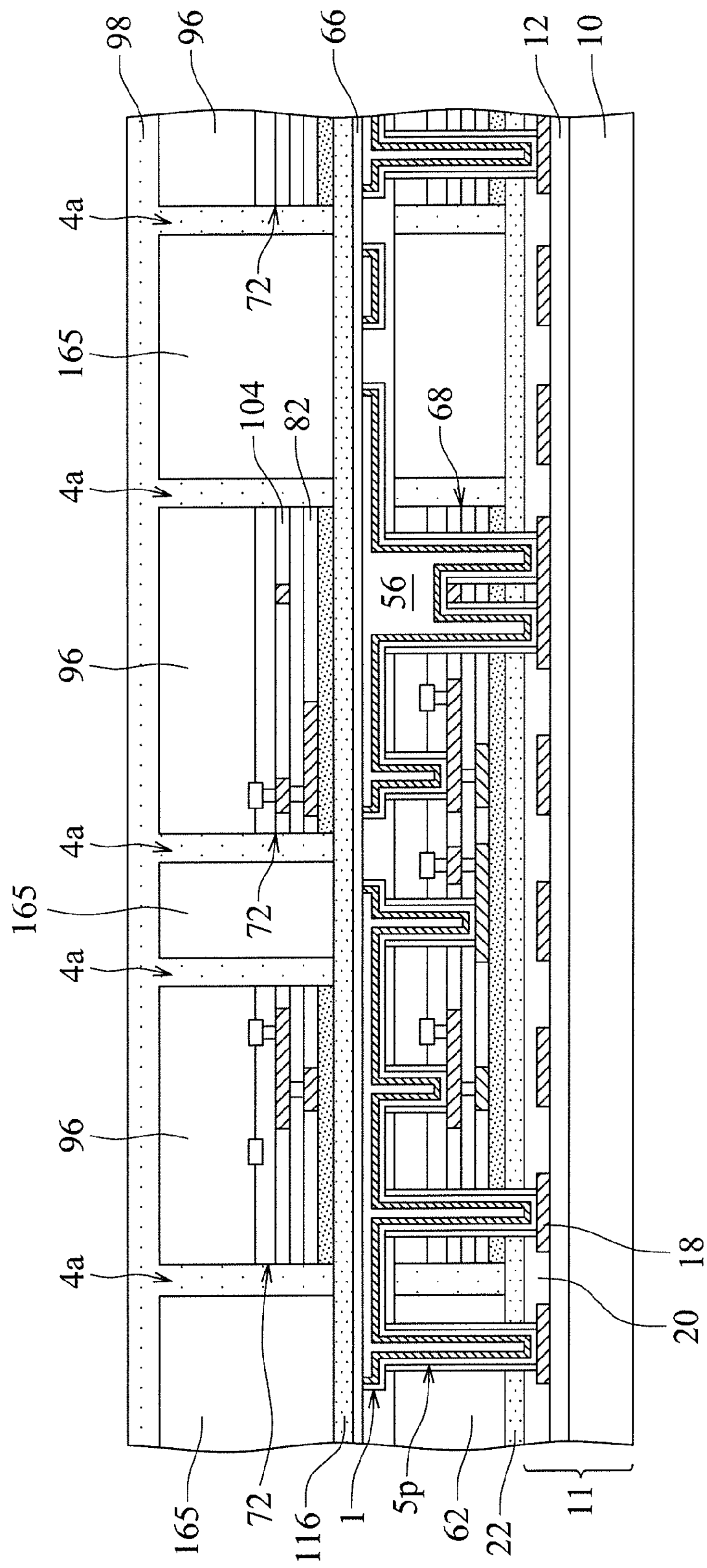

Referring to FIG. 36, after the steps illustrated in FIGS. 33 and 34 or in FIGS. 33 and 35, an encapsulation/gap filling material 98, such as polysilicon, silicon oxide, or a polymer, can be formed on a backside of the semiconductor substrate 96 of each chip 72, on the dummy substrate(s) 165, and in the gaps 4*a* and 8*a*. If the encapsulation/gap filling material 98 is polysilicon, the polysilicon can be formed by a chemical vapor deposition (CVD) process or a plasma-enhanced chemical vapor deposition (PECVD) process. If the encapsulation/gap filling material 98 is silicon oxide, the silicon oxide can be formed by a chemical vapor deposition (CVD) process, a plasma-enhanced chemical vapor deposition (PECVD) process, or an atmospheric pressure chemical vapor deposition (APCVD) process. If the encapsulation/gap filling material 98 is a polymer, such as polyimide, epoxy, benzocyclobutane (BCB), polybenzoxazole (PBO), or polyphenylene oxide (PPO), the polymer can be formed by a process including a spin coating process, a dispensing process, a molding process, or a screen printing process.

Figure 37:
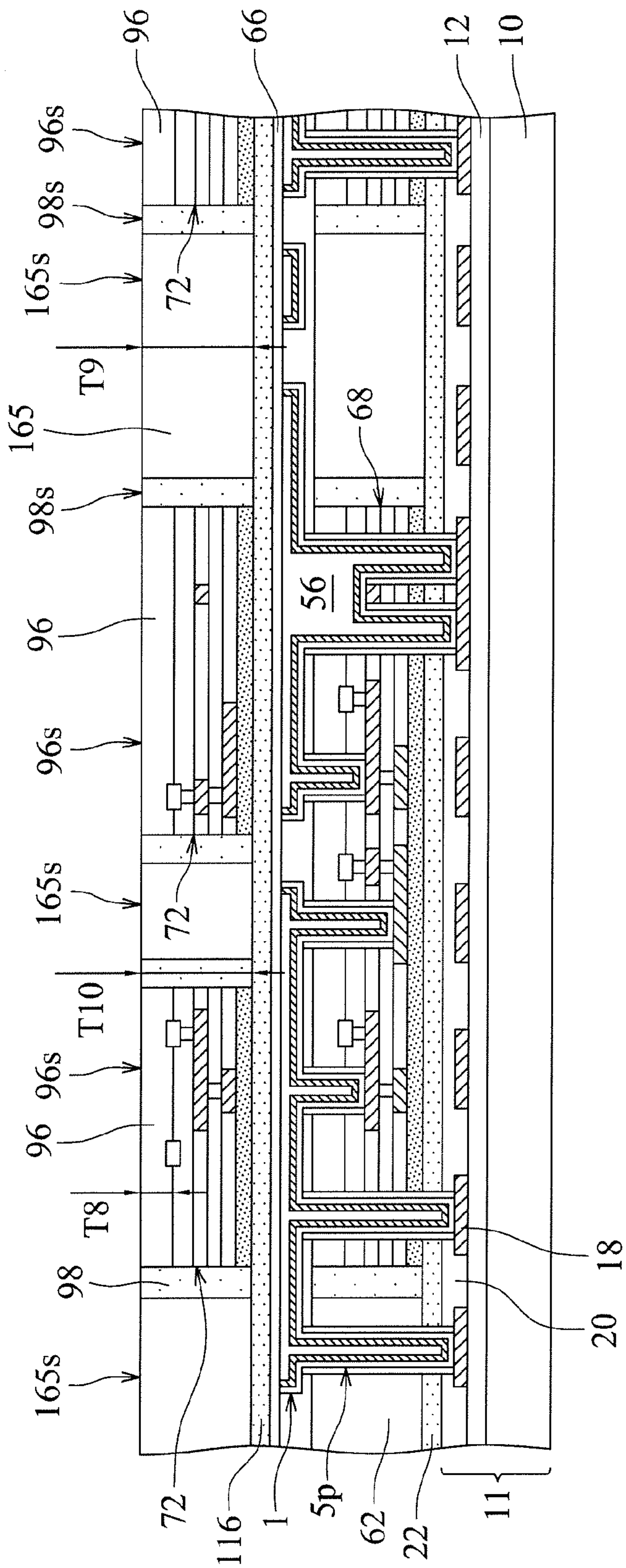

Next, referring to FIG. 37, the encapsulation/gap filling material 98, the backside of the semiconductor substrate 96 of each chip 72, and the dummy substrate(s) 165 are ground or polished by, e.g., a chemical-mechanical-polishing (CMP) process, a mechanical polishing process, a mechanical grinding process, or a process including mechanical polishing and chemical etching until the semiconductor substrate 96 of one of the chips 72 is thinned to a thickness T8, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Preferably, each of the chips 72, after the grinding or polishing process, may have a thickness, e.g., between 3 and 105 micrometers, and preferably between 3 and 30 micrometers or between 5 and 25 micrometers. After the grinding or polishing process, the dummy substrate(s) 165 can be thinned to a thickness T9, e.g., between 3 and 100 micrometers, and preferably between 3 and 30 micrometers or between 5 and 25 micrometers, and the encapsulation/gap filling material 98 remaining in the gaps 4*a* and 8*a* may have a vertical thickness T10, e.g., between 3 and 100 micrometers, and preferably between 3 and 30 micrometers or between 5 and 25 micrometers. The ground or polished surface 96*s* of the semiconductor substrate 96, at the backside of each chip 72, and the ground or polished surface(s) 165*s* of the dummy substrate(s) 165 can be substantially flat and not covered by the encapsulation/gap filling material 98. The ground or polished surface(s) 165*s* may be substantially coplanar with the ground or polished surface 96*s* of each chip 72 and with the ground or polished surface 98*s* of the encapsulation/gap filling material 98 in the gaps 4*a* and 8*a*.

Figure 38:
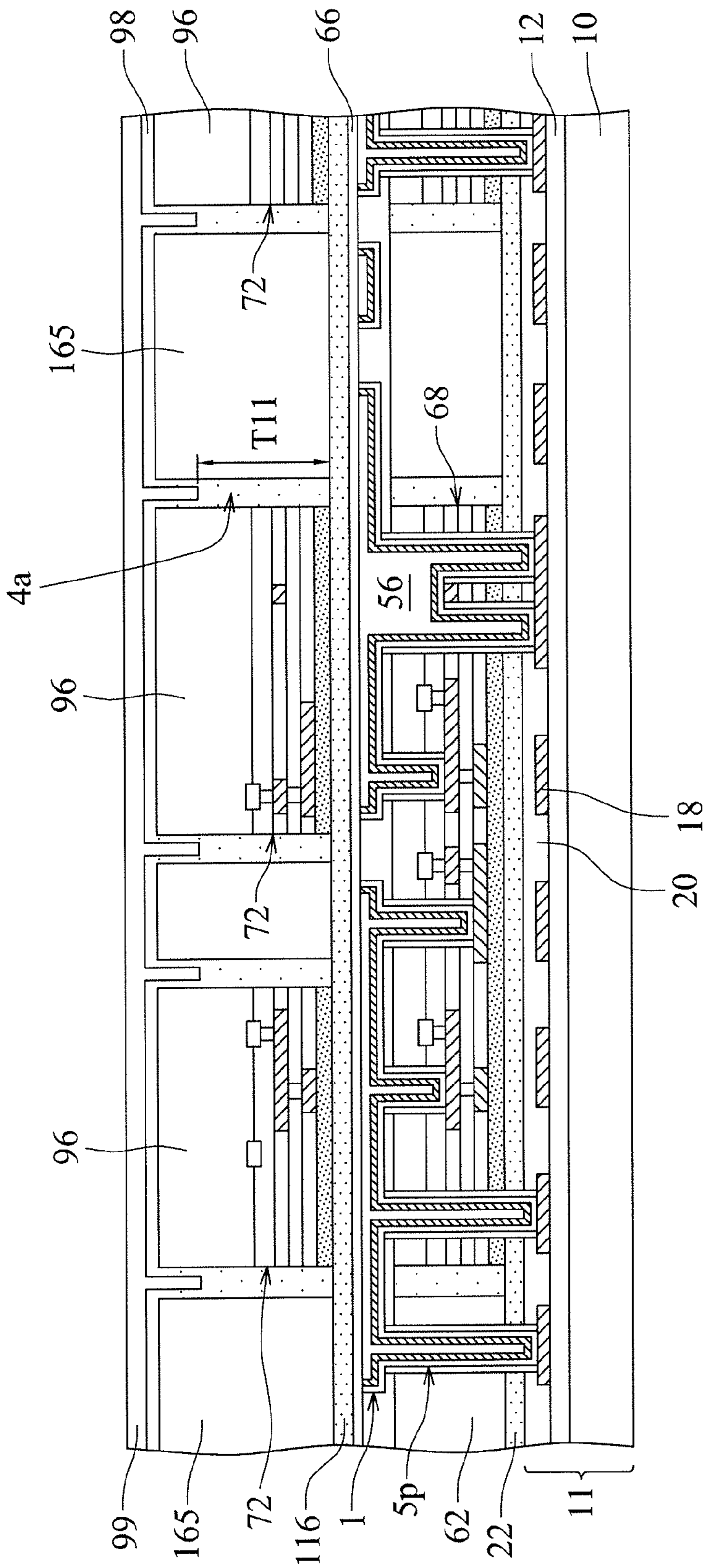
Figure 39:
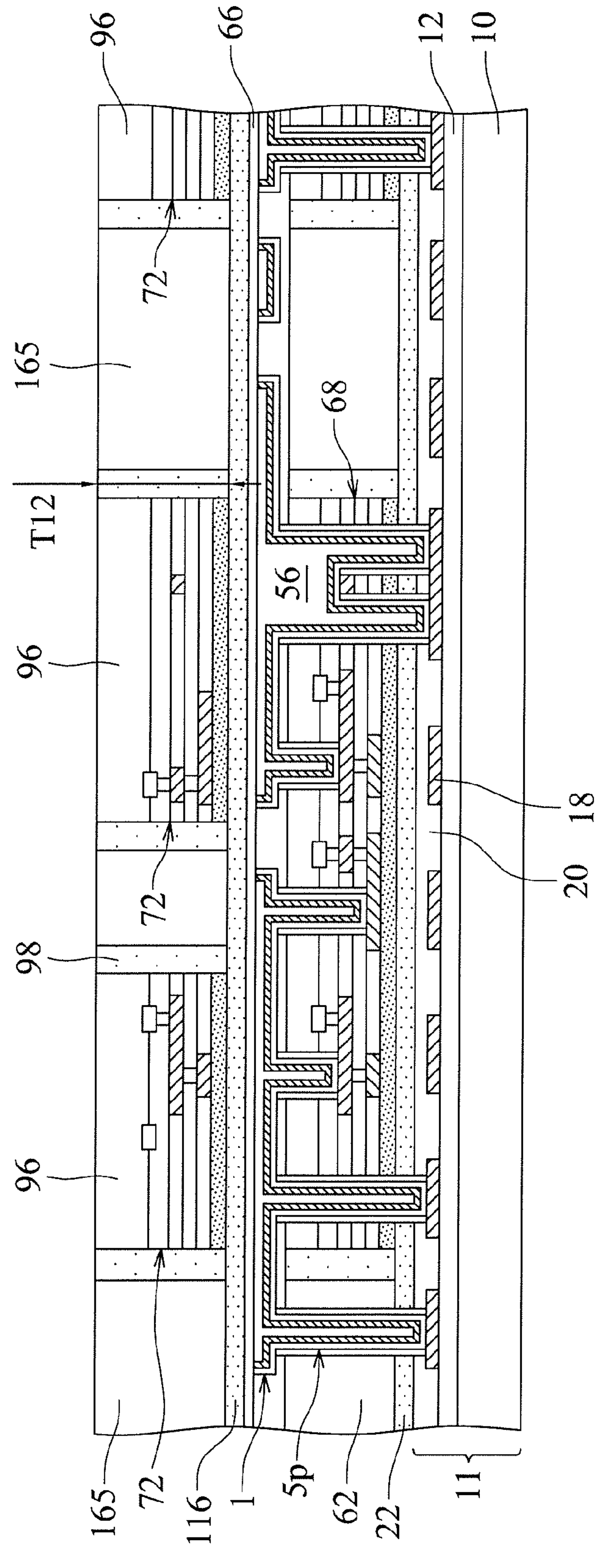

Alternatively, FIGS. 38 and 39 show another technique to form the structure illustrated in FIG. 37. Referring to FIG. 38, after the steps illustrated in FIGS. 33 and 34 or in FIGS. 33 and 35, an encapsulation/gap filling material 98, such as polysilicon or silicon oxide, can be formed on the backside of the semiconductor substrate 96 of each chip 72, on the dummy substrate(s) 165 and in the gaps 4*a* and 8*a*, and then a polymer 99, such as molding compound, polyimide, epoxy, benzocyclobutane (BCB), polybenzoxazole (PBO), or polyphenylene oxide (PPO), can be formed on the encapsulation/gap filling material 98 and in the gaps 4*a* and 8*a*. The encapsulation/gap filling material 98 in the gaps 4*a* and 8*a* may have a vertical thickness T11, e.g., between 10 and 100 micrometers, and preferably between 10 and 50 micrometers or between 20 and 50 micrometers.

Next, referring to FIG. 39, a mechanical grinding process can be performed, e.g., by using an abrasive or grinding pad with water to grind the polymer 99, the encapsulation/gap filling material 98, the backside of the semiconductor substrate 96 of each chip 72 and the dummy substrate(s) 165 until all of the polymer 99 is removed and until a predetermined vertical thickness T12 of the encapsulation/gap filling material 98 in the gaps 4*a* and 8*a* is reached. The predetermined vertical thickness T12 can be, e.g., between 10 and 100 micrometers, and preferably between 10 and 50 micrometers or between 20 and 50 micrometers. The abrasive or grinding pad can be provided with rough grit having an average grain size, e.g., between 0.5 and micrometers for performing the mechanical grinding process. Thereafter, a chemical-mechanical-polishing (CMP) process can be performed, e.g., by using a polish pad with a slurry containing chemicals and a fine abrasive like silica with an average grain size, e.g., between 0.02 and 0.05 micrometers to polish the dummy substrate(s) 165, the backside of the semiconductor substrate 96 of each chip 72 and the encapsulation/gap filling material 98 in the gaps 4*a* and 8*a* until the semiconductor substrate 96 of one of the chips 72 is thinned to the thickness T8 between 1 and 30 micrometers, and preferably between 2 and 5 micrometers, between 2 and 10 micrometers, between 2 and 20 micrometers, or between 3 and 30 micrometers, as shown in FIG. 37.

After the chemical-mechanical-polishing (CMP) process, the polished surface 96*s* of the semiconductor substrate 96, at the backside of each chip 72, and the polished surface(s) 165*s* of the dummy substrate(s) 165 can be substantially flat and not covered by the encapsulation/gap filling material 98. The polished surface(s) 165*s* may be substantially coplanar with the polished surface 96*s* of each chip 72 and with the polished surface 98*s* of the encapsulation/gap filling material 98 in the gaps 4*a* and 8*a*. The polished surfaces 96*s*, 165*s* and 98*s* may have a micro-roughness, e.g., less than 20 nanometers. The chemical-mechanical-polishing (CMP) process, using a very fine abrasive like silica and a relatively weak chemical attack, will create the surfaces 96*s*, 165*s* and 98*s* almost without deformation and scratches, and this means that the chemical-mechanical-polishing (CMP) process is very well suited for the final polishing step, creating the clean surfaces 96*s*, 165*s* and 98*s*. Using the mechanical grinding process and the chemical-mechanical-polishing (CMP) process can be performed to create a very thin semiconductor substrate 96 of each chip 72. Accordingly, after the chemical-mechanical-polishing (CMP) process, each of the chips 72 can be thinned to a thickness, e.g., between 3 and 35 micrometers, and preferably between 5 and 10 micrometers or between 5 and 25 micrometers, the dummy substrate(s) 165 can be thinned to the thickness T9, e.g., between 3 and 35 micrometers, and preferably between 5 and 10 micrometers or between 5 and 25 micrometers, and the encapsulation/gap filling material 98 in the gaps 4*a* and 8*a* can be thinned to the thickness T10, e.g., between 3 and 35 micrometers, and preferably between 5 and 10 micrometers or between 5 and 25 micrometers.

Figure 40:
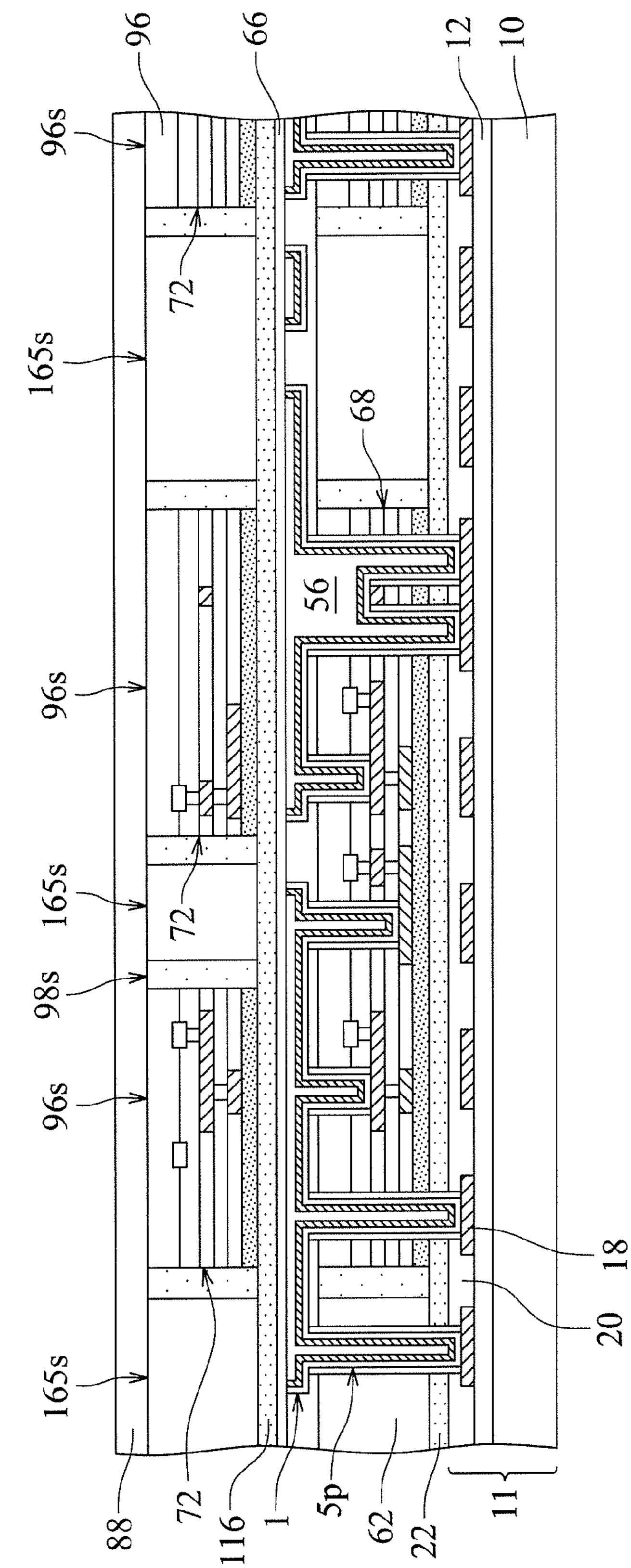

Referring to FIG. 40, after forming the structure illustrated in FIG. 37, a dielectric layer 88 is formed on the surfaces 96*s*, 165*s* and 98*s*. The dielectric layer 88 may have a thickness, e.g., between 0.5 and 30 micrometers, and preferably between 1 and 20 micrometers, between 1 and 10 micrometers, between 1 and 5 micrometers, or between 1 and 3 micrometers.

The dielectric layer 88, for example, can be an inorganic layer formed by, e.g., a chemical vapor deposition (CVD) process or a plasma-enhanced chemical vapor deposition (PECVD) process. The inorganic layer can be, e.g., a layer of silicon oxide (such as $SiO_2$), silicon nitride (such as $Si_3N_4$), silicon carbon nitride (such as SiCN), silicon oxynitride (such as SiON), or silicon oxycarbide (such as SiOC), or a layer including silicon oxide, silicon nitride, silicon carbon nitride and silicon oxynitride. The inorganic layer may have a thickness, e.g., between 0.5 and 30 micrometers, and preferably between 1 and 20 micrometers, between 1 and 10 micrometers, between 1 and 5 micrometers, or between 1 and 3 micrometers.

Alternatively, the dielectric layer 88 can be a polymer layer, such as a layer of polyimide, epoxy, benzocyclobutane (BCB), polybenzoxazole (PBO), or poly-phenylene oxide (PPO), formed by, e.g., a process including a spin coating process, a dispensing process, a molding process, or a screen printing process. The polymer layer may have a thickness, e.g., between 0.5 and 30 micrometers, and preferably between 1 and 20 micrometers, between 1 and 10 micrometers, between 1 and 5 micrometers, or between 1 and 3 micrometers.

Alternatively, the dielectric layer 88 can be composed of multiple inorganic layers which include an etch stop layer, such as etch stop layer of silicon oxynitride. The etch stop layer will later be used to stop etching when etching patterns into the dielectric layer 88. In this case, the dielectric layer 88, for example, can be composed of a first silicon-oxide layer on the surfaces 96*s*, 165*s* and 98*s*, a silicon-oxynitride layer, used as the etch stop layer, on the first silicon-oxide layer, and a second silicon-oxide layer having a thickness, e.g., between 0.1 and 5 micrometers or between 0.3 and 1.5 micrometers on the silicon-oxynitride layer.

Figure 41:
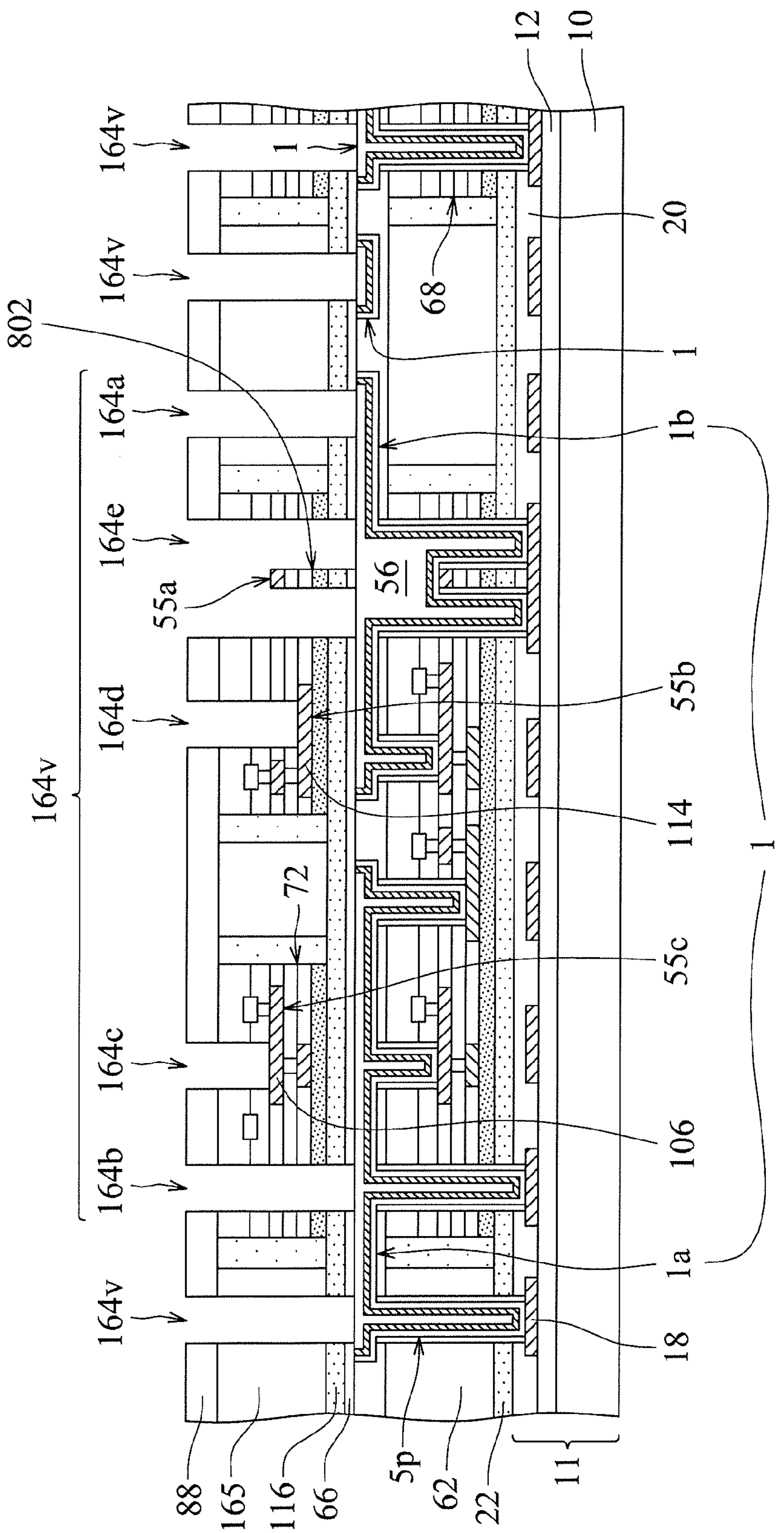

Next, referring to FIG. 41, multiple through vias 164*v*, including through vias 164*a*, 164*b*, 164*c*, 164*d* and 164*e*, are formed in the chips 72 and in the dummy substrate(s) 165, exposing the conduction layer 56 of the metal interconnects 1 and exposing the layers 114 and 106 of the chips 72, by the following steps. First, a photoresist layer, such as positive-type photo-sensitive resist layer or negative-type photo-sensitive resist layer, is formed on the dielectric layer 88 by using a suitable process, such as spin coating process or lamination process. Next, a photo exposure process using a 1X stepper and a development process using a chemical solution can be employed to form multiple openings, exposing the dielectric layer 88, in the photoresist layer. The photoresist layer may have a thickness, e.g., between 3 and 50 micrometers. Next, the dielectric layer 88 under the openings in the photoresist layer is removed by using a suitable process, such as anisotropic plasma etching process. Next, the dummy substrate(s) 165 under the openings in the photoresist layer and the chips 72 under the openings in the photoresist layer are etched away until predetermined regions of the layers 106 and 114 in the chips 72 and predetermined regions of the conduction layer 56 of the metal interconnects 1 are exposed by the openings in the photoresist layer. Next, the photoresist layer is removed by using, e.g., an organic chemical. Accordingly, the through vias 164*v*, including the vias 164*a*-164*e*, are formed in the chips 72 and in the dummy substrate(s) 165, exposing the predetermined regions of the conduction layer 56 of the metal interconnects 1 and exposing the predetermined regions of the layers 114 and 106 of the chips 72. The through via 164*a* is formed in the dummy substrate 165, the through vias 164*b* and 164*c* are formed in one of the chips 72, and the through vias 164*d* and 164*e* are formed in another one of the chips 72.

Alternatively, another technique to form the through vias 164*v* in the chips 72 and in the dummy substrate(s) 165 can be performed by the following steps. First, a photoresist layer, such as positive-type photo-sensitive resist layer or negative-type photo-sensitive resist layer, can be formed on the dielectric layer 88 by using, e.g., a spin coating process or a lamination process. Next, a photo exposure process using a 1X stepper and a development process using a chemical solution can be employed to form multiple openings, exposing the dielectric layer 88, in the photoresist layer. Next, multiple openings are formed in the dielectric layer 88 and under the openings in the photoresist layer, exposing the dummy substrate(s) 165 and the semiconductor substrates 96 of the chips 72, by removing the dielectric layer 88 under the openings in the photoresist layer using, e.g., an anisotropic plasma etching process. Next, the photoresist layer is removed by using, e.g., an organic chemical. Next, the dummy substrate(s) 165 under the openings in the dielectric layer 88 and the chips 72 under the openings in the dielectric layer 88 can be etched away until the predetermined regions of the layers 114 and 106 in the chips 72 and the predetermined regions of the conduction layer 56 of the metal interconnects 1 are exposed by the openings in the dielectric layer 88. Accordingly, the through vias 164*v*, including the through vias 164*a*, 164*b*, 164*c*, 164*d* and 164*e*, can be formed in the chips 72 and in the dummy substrate(s) 165, exposing the conduction layer 56 of the metal interconnects 1 and exposing the layers 114 and 106 of the chips 72. The through via 164*a* is formed in the dummy substrate 165, the through vias 164*b* and 164*c* are formed in one of the chips 72, and the through vias 164*d* and 164*e* are formed in another one of the chips 72. Each of the through vias 164*v*, such as the through via 164*a*, 164*b*, 164*c*, 164*d*, or 164*e*, may have a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers.

Figure 44:
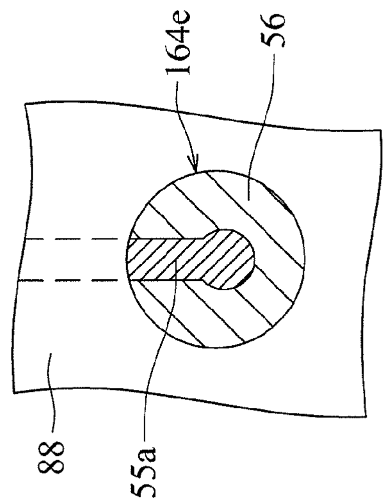
Figure 43:
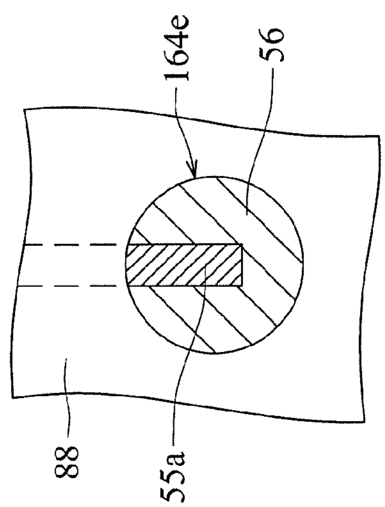
Figure 42:
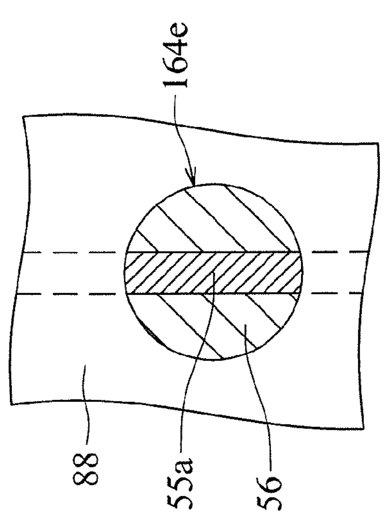

One of the through vias 164*v*, such as the through via 164*a*, passes through the dielectric layer 88, the dummy substrate 165, the layer 116, and the insulating or dielectric layer 66, exposing the conduction layer 56 of one of the metal interconnects 1. Another one of the through vias 164*v*, such as the through via 164*b*, passes through the dielectric layer 88, through the semiconductor substrate 96, dielectric layers 82,

108, 104 and 100, and passivation layer 74 of one of the chips 72, through the layer 116, and through the insulating or dielectric layer 66, exposing the conduction layer 56 of one of the metal interconnects 1. Another one of the through vias 164*v*, such as the through via 164*c*, passes through the dielectric layer 88 and through the semiconductor substrate 96 and dielectric layer 100 of one of the chips 72, exposing the interconnect or metal trace 55*c* in the interconnection layer 106 of the one of the chips 72. Another one of the through vias 164*v*, such as the through via 164*d*, passes through the dielectric layer 88 and through the semiconductor substrate 96 and dielectric layers 100, 104 and 108 of one of the chips 72, exposing the interconnect or metal trace 55*b* in the patterned metal layer 114 of the one of the chips 72. Another one of the through vias 164*v*, such as the through via 164*e*, passes through the dielectric layer 88, through the semiconductor substrate 96, dielectric layers 82, 108, 104 and 100, and passivation layer 74 of one of the chips 72, through the layer 116, and through the insulating or dielectric layer 66, exposing the interconnect or metal trace 55*a* in the interconnection layer 106 of the one of the chips 72 and exposing the conduction layer 56 of one of the metal interconnects 1. A supporter 802 provided by the layers 66, 116, 74, 82 and 108 is between the conduction layer 56 of the metal interconnect 1*b* and the interconnect or metal trace 55*a* in the interconnection layer 106 exposed by the through via 164*e* for the purpose of supporting the exposed interconnect or metal trace 55*a*. The supporter 802 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers. FIGS. 42-44 are three examples of schematic top perspective views showing the through via 164*e* and the interconnect or metal trace 55*a* illustrated in FIG. 41.

As shown in FIGS. 41 and 42, the through via 164*e* in one of the chips 72 exposes the interconnect or metal trace 55*a* in the one of the chips 72 and exposes two regions of the conduction layer 56 of the metal interconnect 1*b* that is under the one of the chips 72. The interconnect or metal trace 55*a* has a line-shaped region, exposed by the through via 164*e*, extending in a horizontal direction from a side of the through via 164*e* to the opposite side of the through via 164*e* through a center of the through via 164*e*. The previously described supporter 802, between the conduction layer 56 of the metal interconnect 1*b* and the exposed line-shaped region of the interconnect or metal trace 55*a* in the interconnection layer 106, can be line-shaped, like the exposed line-shaped region of the interconnect or metal trace 55*a*. Preferably, the through via 164*e* can be, but is not limited to, a circular shape from a top perspective view.

As shown in FIGS. 41 and 43, the through via 164*e* in one of the chips 72 exposes the interconnect or metal trace 55*a* in the one of the chips 72 and exposes a region of the conduction layer 56 of the metal interconnect 1*b* that is under the one of the chips 72. The interconnect or metal trace 55*a* has a peninsula region, exposed by the through via 164*e*, extending in a horizontal direction from one side of the through via 164*e* at least to a center of the through via 164*e*, but does not reach to the opposite side of the through via 164*e*; the interconnect or metal trace 55*a* has an end exposed by the through via 164*e*. The previously described supporter 802, between the conduction layer 56 of the metal interconnect 1*b* and the exposed peninsula region of the interconnect or metal trace 55*a* in the interconnection layer 106, can be peninsula-shaped, like the exposed peninsula region of the interconnect or metal trace 55*a*. Preferably, the through via 164*e* can be, but is not limited to, a circular shape from a top perspective view.

As shown in FIGS. 41 and 44, the through via 164*e* in one of the chips 72 exposes the interconnect or metal trace 55*a* in the one of the chips 72 and exposes a region of the conduction layer 56 of the metal interconnect 1*b* that is under the one of the chips 72. The interconnect or metal trace 55*a* has a peninsula region, exposed by the through via 164*e*, extending in a horizontal direction from one side of the through via 164*e* at least to a center of the through via 164*e*, but does not reach to the opposite side of the through via 164*e*; the interconnect or metal trace 55*a* has a circular end exposed by the through via 164*e*. The previously described supporter 802, between the conduction layer 56 of the metal interconnect 1*b* and the exposed peninsula region of the interconnect or metal trace 55*a* in the interconnection layer 106, can be peninsula-shaped, like the exposed peninsula region of the interconnect or metal trace 55*a*. Preferably, the through via 164*e* can be, but is not limited to, a circular shape from a top perspective view.

Figure 42A:
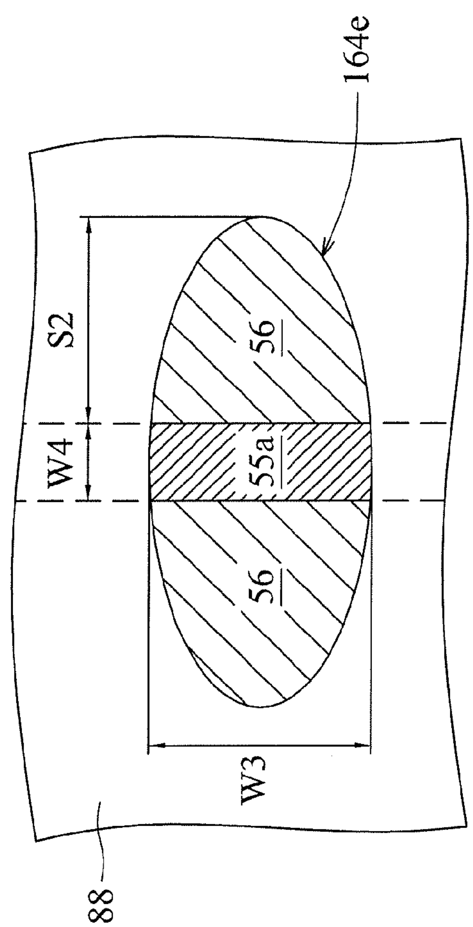

FIG. 42A is an example of a schematic top perspective view showing the through via 164*e* and the interconnect or metal trace 55*a* illustrated in FIG. 41. In this case, the through via 164*e* can be, but is not limited to, oval-shaped and has a width W3, e.g., between 1 and 30 micrometers, and preferably between 1 and 20 micrometers, between 1 and 10 micrometers, between 1 and 5 micrometers, or between 3 and 10 micrometers. The oval-shaped through via 164*e* in one of the chips 72 exposes the interconnect or metal trace 55*a* in the one of the chips 72 and exposes two regions of the conduction layer 56 of the metal interconnect 1*b* that is under the one of the chips 72. The interconnect or metal trace 55*a* has a line-shaped region, exposed by the oval-shaped through via 164*e*, extending in a horizontal direction from a side of the oval-shaped through via 164*e* to the opposite side of the oval-shaped through via 164*e* through a center of the oval-shaped through via 164*e*. The previously described supporter 802, between the conduction layer 56 of the metal interconnect 1*b* and the exposed line-shaped region of the interconnect or metal trace 55*a* in the interconnection layer 106, can be line-shaped, like the exposed line-shaped region of the interconnect or metal trace 55*a*. The interconnect or metal trace 55*a* exposed by the oval-shaped through via 164*e* has a width W4, e.g., between 0.3 and 30 micrometers, and preferably between 0.3 and 20 micrometers, between 0.3 and 10 micrometers, between 0.3 and 5 micrometers, or between 0.3 and 1 micrometers. A horizontal distance S2 between an endpoint of the long axis of the oval-shaped through via 164*e* and an edge, which is closer to the endpoint than the other opposite edge, of the interconnect or metal trace 55*a* exposed by the oval-shaped through via 164*e* can be, e.g., between 1 and 30 micrometers, and preferably between 1 and 20 micrometers, between 1 and 10 micrometers, between 1 and 5 micrometers, or between 3 and 10 micrometers.

Figure 45:
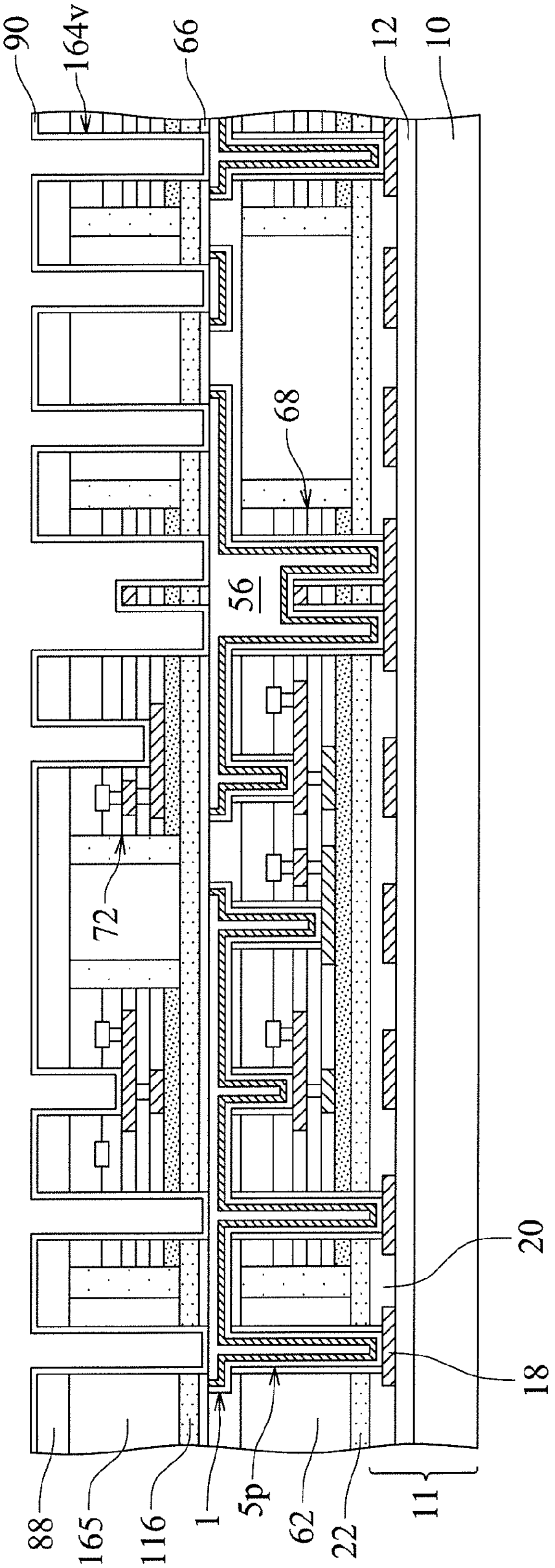

Next, referring to FIG. 45, a dielectric layer 90 is formed on a top surface of the dielectric layer 88, on the conduction layer 56, exposed by the through vias 164*v* (such as the through vias 164*a*, 164*b* and 164*e*), of the metal interconnects 1, on the layers 106 and 114, exposed by the through vias 164*v* (such as the through vias 164*c*, 164*d* and 164*e*), of the chips 72, and on sidewalls of the through vias 164*v*.

The dielectric layer 90 can be composed of an insulating material. For example, the dielectric layer 90 can be an inorganic layer having a thickness, e.g., between 20 nanometers and 1 micrometer, and the inorganic layer can be a layer of silicon oxide (such as $SiO_2$), silicon nitride (such as $Si_3N_4$), silicon carbon nitride (such as SiCN), silicon oxynitride (such as SiON), or silicon oxycarbide (such as SiOC). Alternatively, the dielectric layer 90 can be a polymer layer having a thickness, e.g., between 1 and 10 micrometers, and preferably between 1 and 5 micrometers, and the polymer layer can be a layer of polyimide, benzocyclobutene (BCB), epoxy, polyphenylene oxide (PPO), or polybenzoxazole (PBO).

Figure 46:
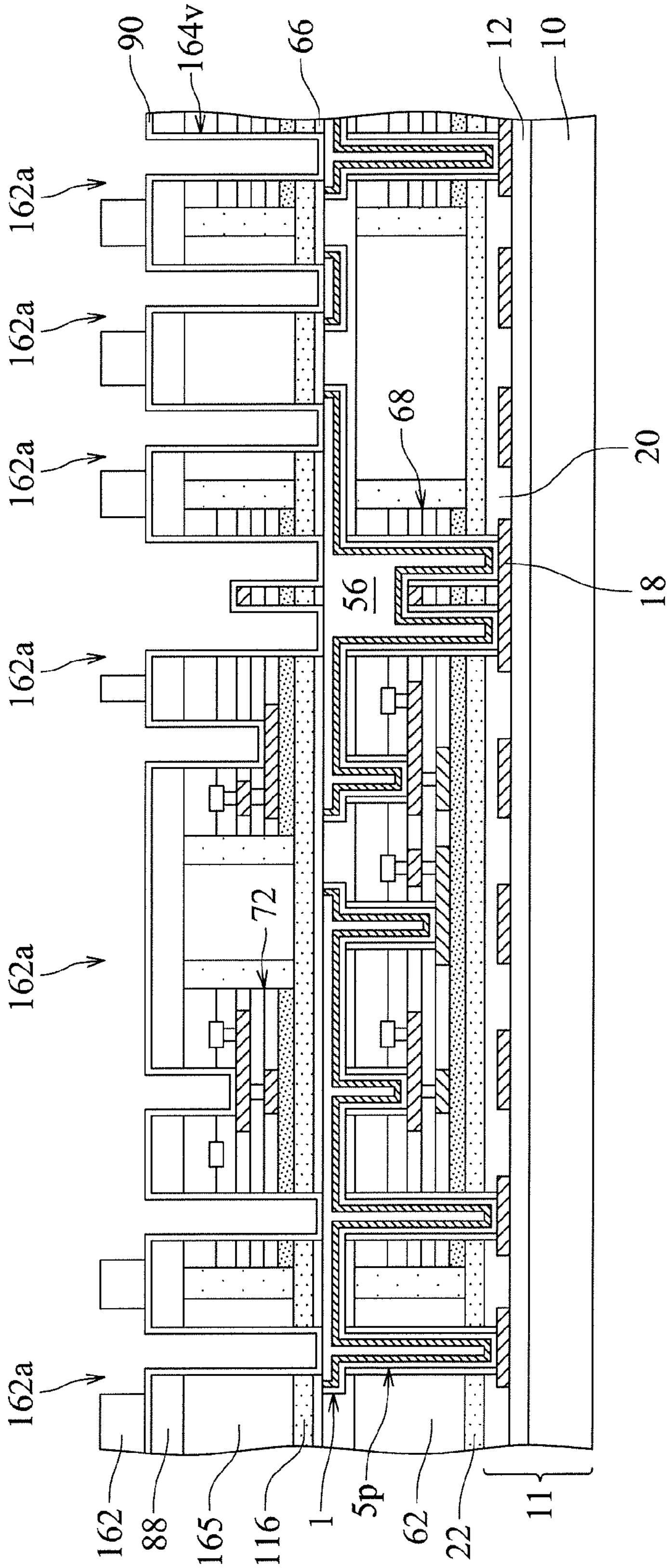

Next, referring to FIG. 46, a photoresist layer 162, such as positive-type photo-sensitive resist layer or negative-type photo-sensitive resist layer, can be formed on the dielectric layer 90 by using, e.g., a spin coating process or a lamination process. Next, a photo exposure process using a 1X stepper and a development process using a wet chemical can be employed to form multiple openings 162*a*, exposing the dielectric layer 90, in the photoresist layer 162. The photoresist layer 162 may have a thickness, e.g., between 0.5 and 30 micrometers.

Figure 47:
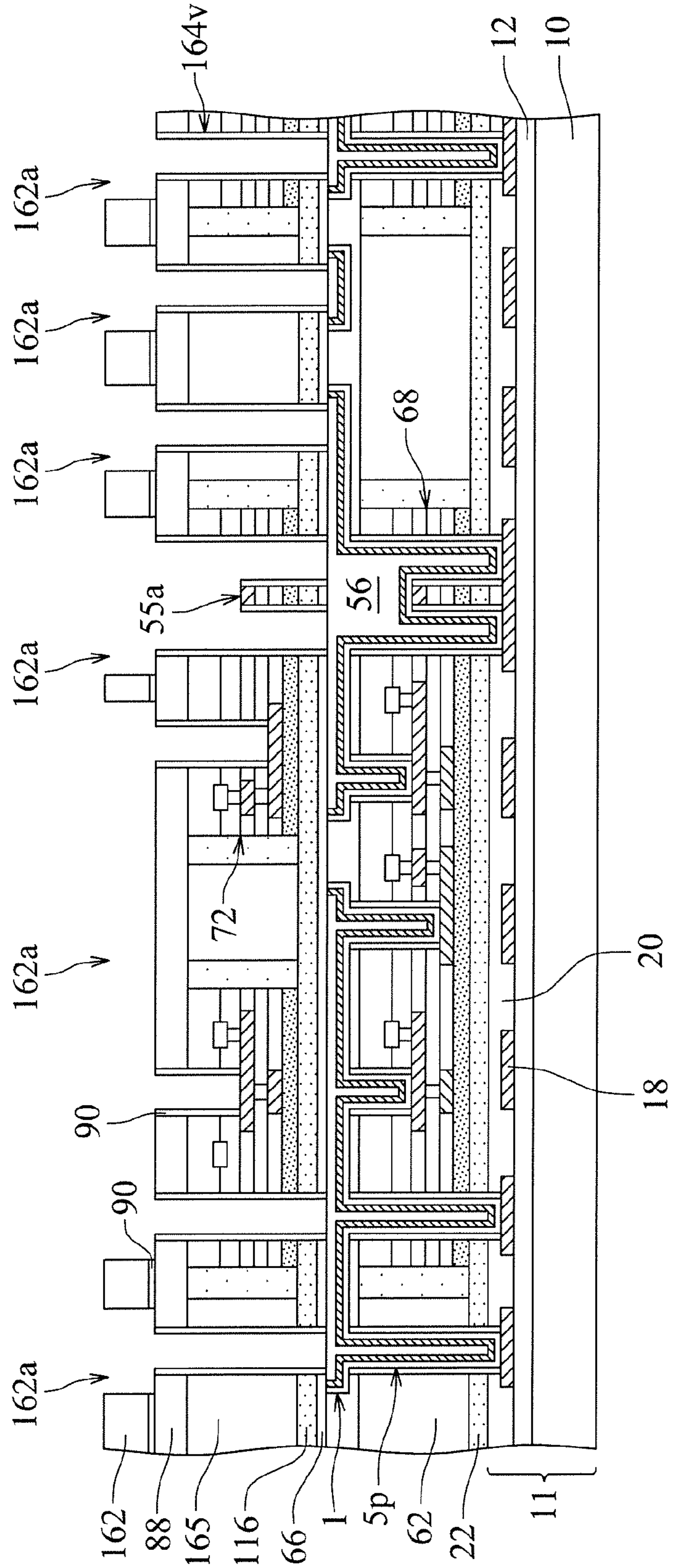

Next, referring to FIG. 47, the dielectric layer 90 formed on the layers 56, 106 and 114 and on the top surface of the dielectric layer 88 under the openings 162*a* can be removed by, e.g., etching the dielectric layer 90 under the openings 162*a* using an anisotropic plasma etching process. The dielectric layer 90 at bottoms of the through vias 164*v*, on the top surface of the dielectric layer 88 under the openings 162*a*, and on a top surface of the interconnect or metal trace 55*a* over the supporter 802 can be etched away. Accordingly, the layers 56, 106 and 114 at the bottoms of the through vias 164*v*, the top surface of the dielectric layer 88 under the openings 162*a*, and the interconnect or metal trace 55*a* over the supporter 802 are exposed by the openings 162*a*, and the dielectric layer 90 remains on the sidewalls of the through vias 164*v*, so called as sidewall dielectric layers in the through vias 164*v*. The sidewall dielectric layers 90 are formed on the sidewalls of the through vias 164*v* in the chips 72 or in the dummy substrate(s) 165 and are enclosed by the semiconductor substrates 96 of the chips 72 or by the dummy substrate(s) 165.

Figure 48:
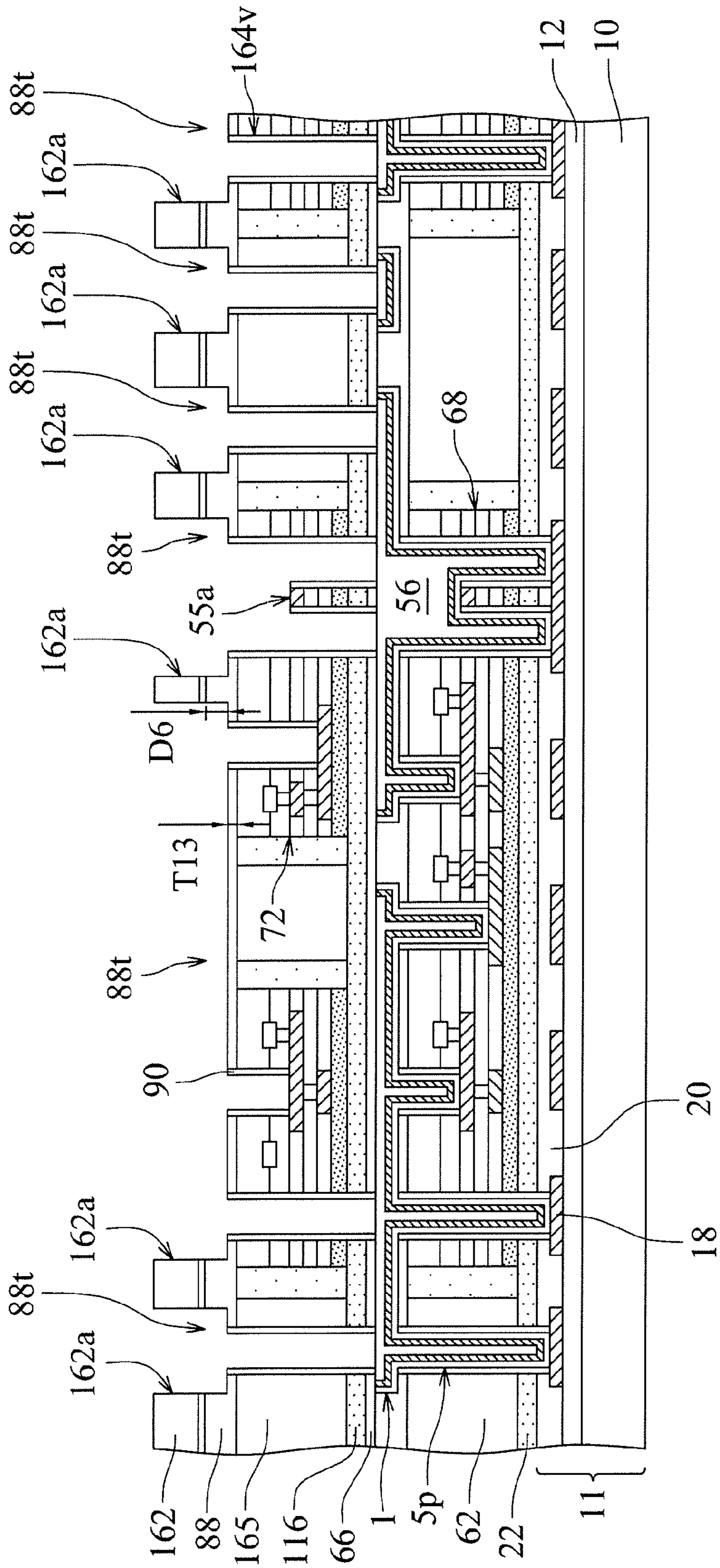

Next, referring to FIG. 48, multiple trenches 88*t*, damascene openings, can be formed in the dielectric layer 88 by etching the dielectric layer 88 and the sidewall dielectric layers 90 under the openings 162*a* to a depth D6, e.g., between 0.1 and 5 micrometers, and preferably between 0.5 and 3 micrometers, using, e.g., an anisotropic plasma etching process. Preferably, the dielectric layer 88 and the sidewall dielectric layers 90 have a same material, such as silicon nitride, silicon oxide, or silicon oxynitride. After the etching process, the dielectric layer 88 under the trenches 88*t* has a remaining thickness T13, e.g., between 0.1 and 5 micrometers, and preferably between 0.3 and 5 micrometers, between 0.5 and 2 micrometers, between 0.1 and 3 micrometers, or between 0.2 and 1.5 micrometers.

Alternatively, an etching-stop technique may be applied to the process of forming the trenches 88*t* in the dielectric layer 88. In this case, the dielectric layer 88 is composed of the previously described inorganic layers, e.g., including the first silicon-oxide layer on the surfaces 96*s*, 165*s* and 98*s*, the silicon-oxynitride layer, used as the etch stop layer, on the first silicon-oxide layer, and the second silicon-oxide layer on the silicon-oxynitride layer. The trenches 88*t* can be formed in the dielectric layer 88 by etching the second silicon-oxide layer of the dielectric layer 88 under the openings 162*a* and the sidewall dielectric layers 90 under the openings 162*a* until the silicon-oxynitride layer of the dielectric layer 88 is exposed by the openings 162*a*. Accordingly, the trenches 88*t* are formed in the second silicon-oxide layer of the dielectric layer 88, and the remaining dielectric layer 88, composed of the silicon-oxynitride layer and the first silicon-oxide layer, under the trenches 88*t* has a thickness T13, e.g., between 0.1 and 5 micrometers, and preferably between 0.3 and 5 micrometers, between 0.5 and 2 micrometers, between 0.1 and 3 micrometers, or between 0.2 and 1.5 micrometers.

Figure 49:
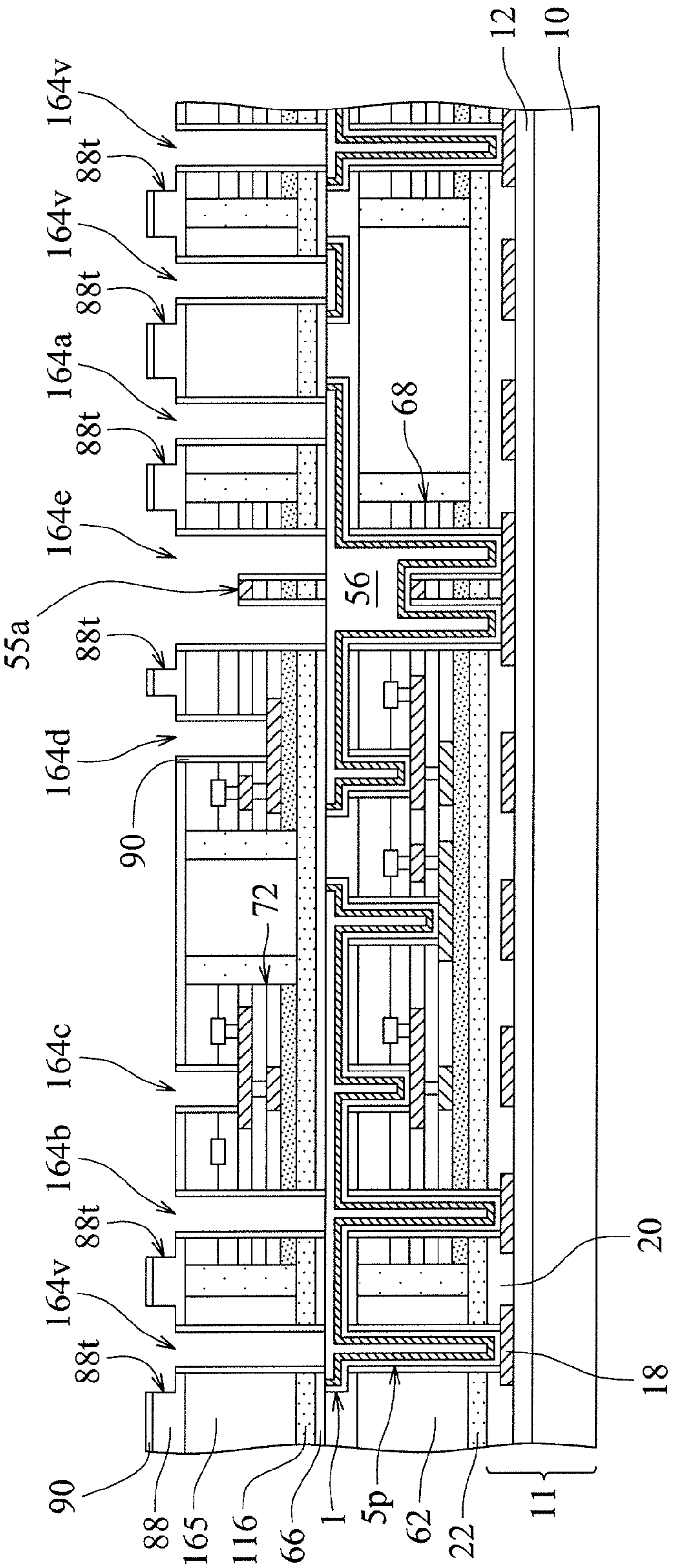
Figure 50:
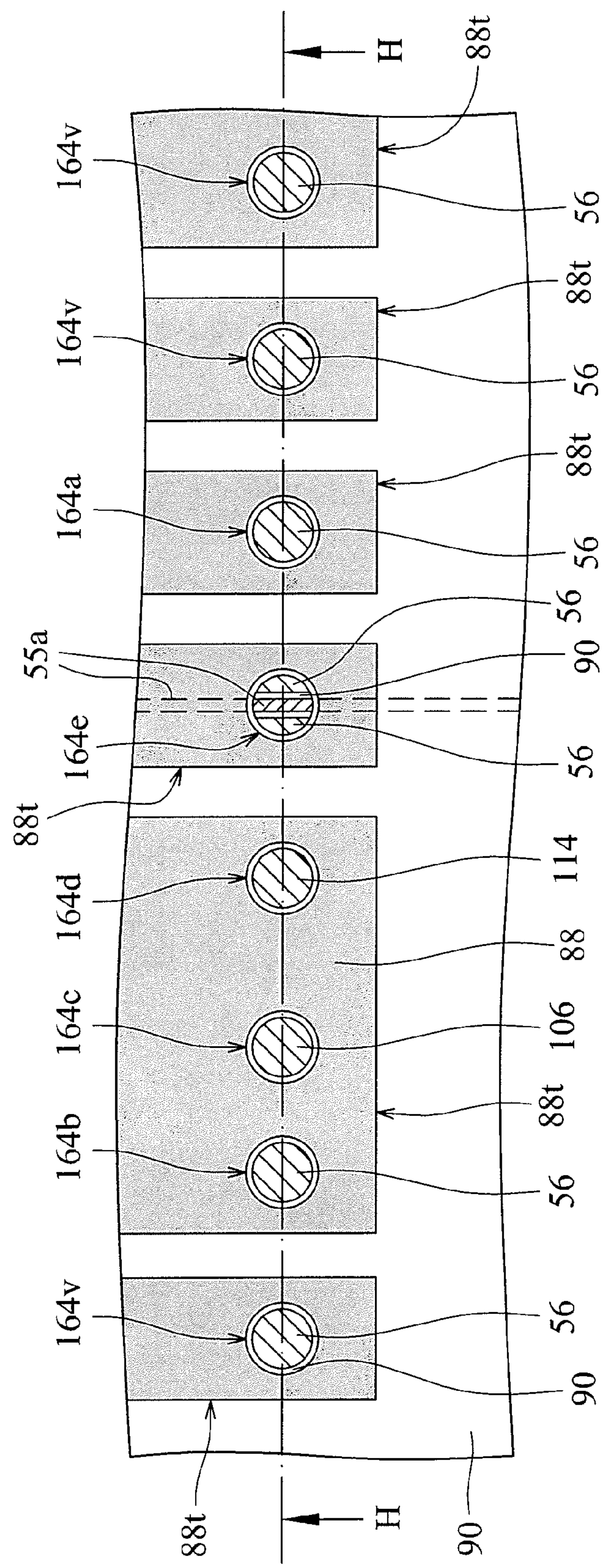

Next, referring to FIG. 49, the photoresist layer 162 is removed by using, e.g., an organic chemical. The trenches 88*t* formed in the dielectric layer 88 are used to provide spaces having inter-chip interconnects and intra-chip interconnects formed therein. The sidewall dielectric layers 90 formed on the sidewalls of the through vias 164*v* (such as the through vias 164*b*, 164*c*, 164*d* and 164*e*) in the chips 72 can prevent transition metals, such as copper, sodium or moisture from penetrating into IC devices of the chips 72. FIG. 50 is a schematic top perspective view showing the through vias 164*v*, the trenches 88*t* and the sidewall dielectric layers 90 shown in FIG. 49 according an embodiment of the present invention, and FIG. 49 is a cross-sectional view cut along the line H-H shown in FIG. 50.

Figure 51:
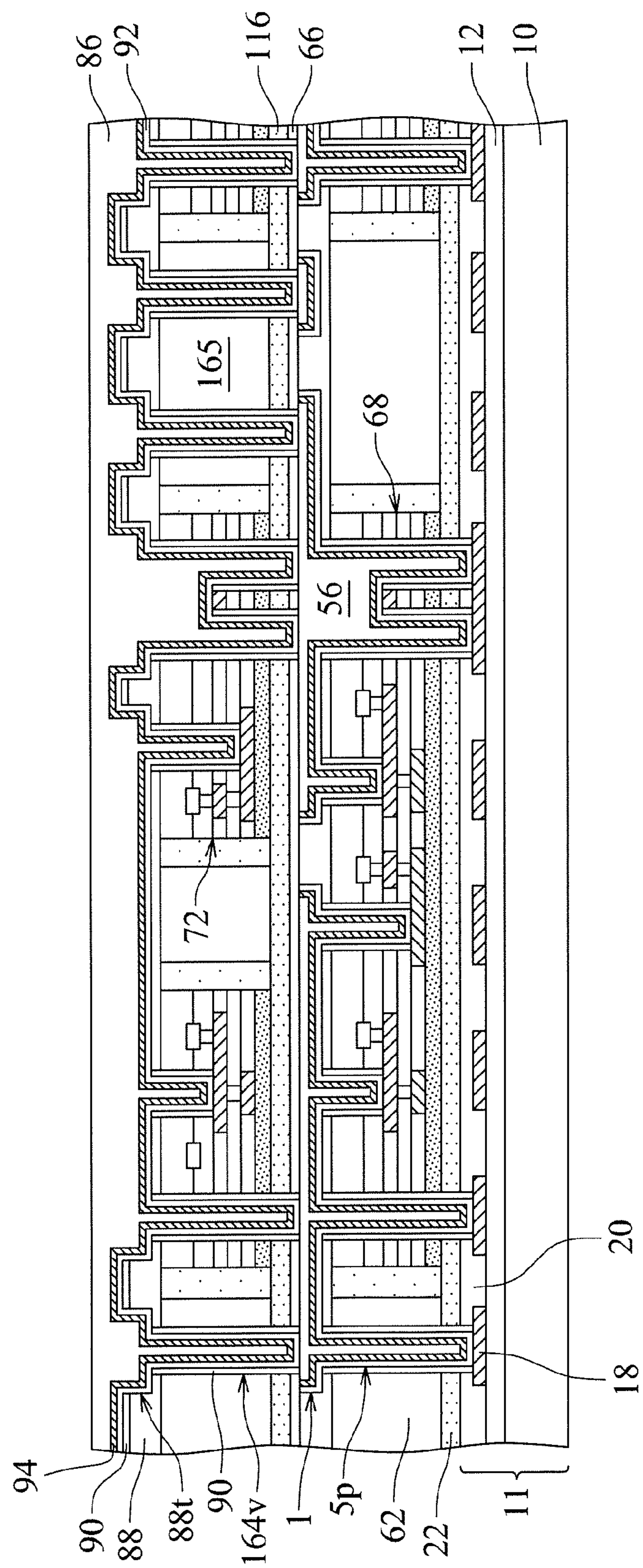

Next, referring to FIG. 51, an adhesion/barrier layer 92 having a thickness, e.g., smaller than 1 micrometer, such as between 1 nanometer and 0.5 micrometers, and preferably between 0.1 and 0.2 micrometers, can be formed on the layers 56, 106 and 114 exposed by the through vias 164*v*, on sidewalls and bottoms of the trenches 88*t*, on the dielectric layer 90, and on the interconnect or metal trace 55*a* that is on the supporter 802. The adhesion/barrier layer 92 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 94 having a thickness, e.g., smaller than 1 micrometer, such as between 10 nanometers and 0.8 micrometers, and preferably between 80 nanometers and 0.15 micrometers, can be formed on the adhesion/barrier layer 92 by a physical vapor deposition (PVD) process, such as sputtering process or evaporation process, by a chemical-vapor deposition (CVD) process, or by other thin-film deposition processes, such as atomic layer deposition (ALD). Next, a conduction layer 86 having a thickness, e.g., between 0.5 and 20 micrometers or between 0.5 and 10 micrometers, and preferably between 1 and 5 micrometers, can be formed on the seed layer 94 by using, e.g., an electroplating process.

The adhesion/barrier layer 92 may include or can be a layer of titanium, a titanium-tungsten alloy, titanium nitride, chromium, tantalum, tantalum nitride, nickel, or nickel vanadium having a thickness, e.g., smaller than 1 micrometer, such as between 1 nanometer and 0.5 micrometers, and preferably between 0.1 and 0.2 micrometers. The seed layer 94 may include or can be a layer of copper, a titanium-copper alloy, nickel, gold, or silver having a thickness, e.g., smaller than 1 micrometer, such as between 10 nanometers and 0.8 micrometers, and preferably between 80 nanometers and 0.15 micrometers. The conduction layer 86 may include or can be an electroplated metal layer of copper, gold, or silver having a thickness, e.g., between 0.5 and 20 micrometers or between 0.5 and 10 micrometers, and preferably between 1 and 5 micrometers.

Figure 52:
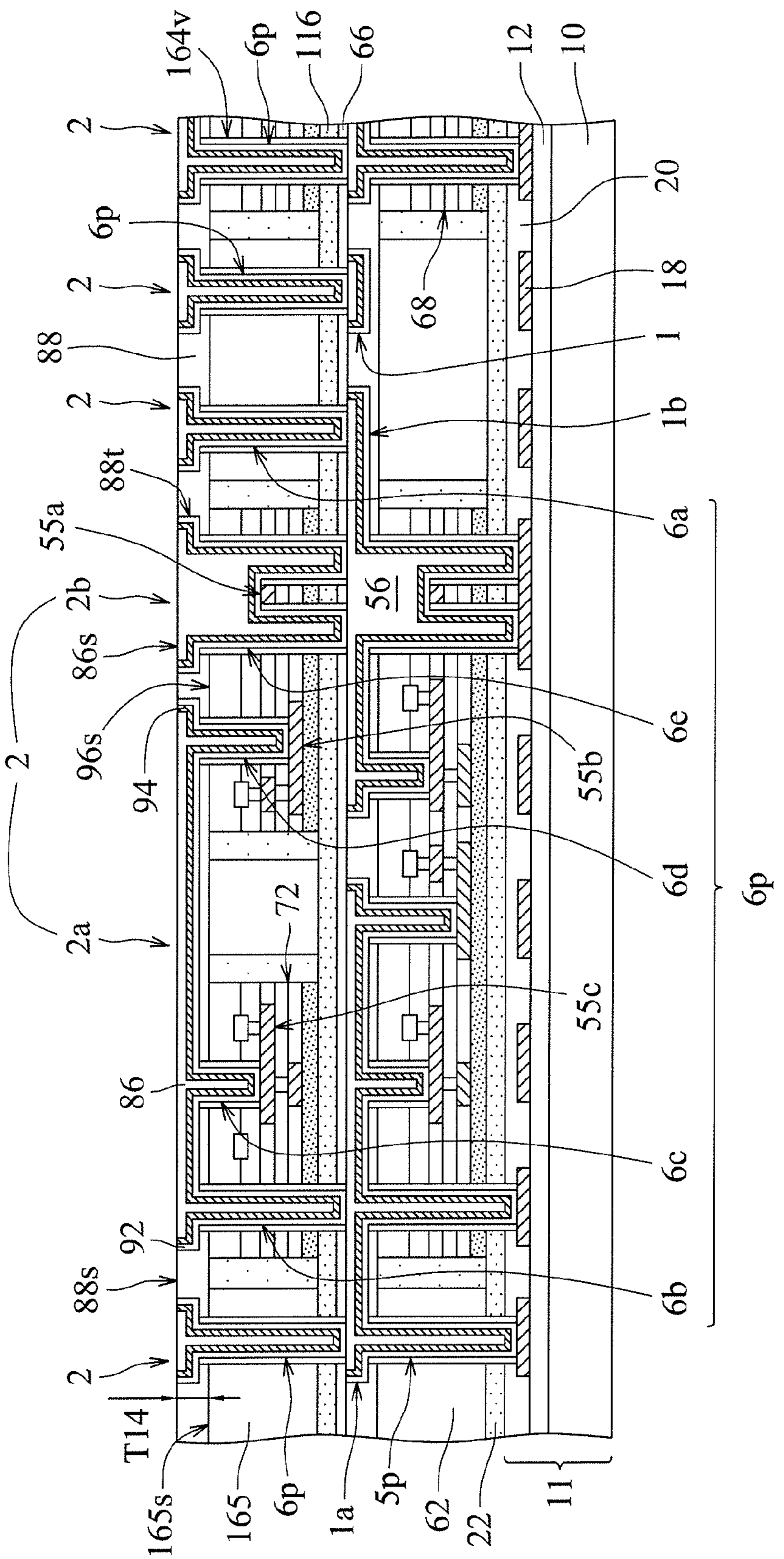

Next, referring to FIG. 52, by using a grinding or polishing process, such as chemical-mechanical-polishing (CMP) process, mechanical polishing process, mechanical grinding process, or a process including mechanical polishing and chemical etching, the layers 92, 94 and 86 outside the trenches 88*t* can be removed, and the dielectric layer 90 on the top surface of the dielectric layer 88 can be removed. Accordingly, the dielectric layer 88 has an exposed top surface 88*s* that can be substantially coplanar with the ground or polished surface 86*s* of the conduction layer 86 in the trenches 88*t*, and the surfaces 86*s* and 88*s* can be substantially flat. The dielectric layer 88 has a thickness T14, between the exposed top surface 88*s* and the surface 96*s* or 165*s*, e.g., between 1 and 10 micrometers, and preferably between 1 and 3 micrometers or between 2 and 5 micrometers. The adhesion/barrier layer 92 and the seed layer 94 are at sidewalls and a bottom of the conduction layer 86 in the trenches 88*t*, and the sidewalls and the bottom of the conduction layer 86 in the trenches 88*t* are covered by the adhesion/barrier layer 92 and the seed layer 94.

In a first alternative, after the steps of removing the layers 92, 94 and 86 outside the trenches 88*t* and removing the dielectric layer 90 on the top surface of the dielectric layer 88, the adhesion/barrier layer 92 can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 88*t*, on the layers 56, 106 and 114 at the bottoms of the through vias 164*v*, on the sidewall dielectric layers 90, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer. The conduction layer 86 can be an electroplated copper layer on the single layer of copper or a titanium-copper alloy, in the trenches 88*t*, and in the through vias 164*v*. The electroplated copper layer in the trenches 88*t* may have a thickness, e.g., between 0.1 and 5 micrometers, and preferably between 0.5 and 3 micrometers.

In a second alternative, after the steps of removing the layers 92, 94 and 86 outside the trenches 88*t* and removing the dielectric layer 90 on the top surface of the dielectric layer 88, the adhesion/barrier layer 92 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 88*t*, on the layers 56, 106 and 114 at the bottoms of the through vias 164*v*, on the sidewall dielectric layers 90, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer. The conduction layer 86 can be an electroplated copper layer on the single layer of copper or a titanium-copper alloy, in the trenches 88*t*, and in the through vias 164*v*. The electroplated copper layer in the trenches 88*t* may have a thickness, e.g., between 0.1 and 5 micrometers, and preferably between 0.5 and 3 micrometers.

In a third alternative, after the steps of removing the layers 92, 94 and 86 outside the trenches 88*t* and removing the dielectric layer 90 on the top surface of the dielectric layer 88, the adhesion/barrier layer 92 can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 88*t*, on the layers 56, 106 and 114 at the bottoms of the through vias 164*v*, on the sidewall dielectric layers 90, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer. The conduction layer 86 can be an electroplated copper layer on the single layer of copper or a titanium-copper alloy, in the trenches 88*t*, and in the through vias 164*v*. The electroplated copper layer in the trenches 88*t* may have a thickness, e.g., between 0.1 and 5 micrometers, and preferably between 0.5 and 3 micrometers.

After the steps of removing the layers 92, 94 and 86 outside the trenches 88*t* and removing the dielectric layer 90 on the top surface of the dielectric layer 88, the layers 92, 94 and 86 in the trenches 88*t* compose multiple metal interconnects (or damascene metal traces) 2, including metal interconnects 2*a* and 2*b*, in the trenches 88*t*. The layers 92, 94 and 86 in the through vias 164*v* compose multiple metal plugs (or metal vias) 6*p* in the through vias 164*v*, including metal plugs (or metal vias) 6*a*, 6*b*, 6*c*, 6*d* and 6*e* in the through vias 164*a*, 164*b*, 164*c*, 164*d* and 164*e* as shown in FIG. 49, respectively. Each of the metal plugs 6*p* in the chips 72 and in the dummy substrate(s) 165 is enclosed by one of the sidewall dielectric layers 90 in the through vias 164*v*. The metal plug 6*a* is formed in the dummy substrate 165, the metal plugs 6*b* and 6*c* are formed in one of the chips 72, and the metal plugs 6*d* and 6*e* are formed in another one of the chips 72. These metal plugs 6*p* formed in the chips 72 and in the dummy substrate(s) 165 can connect the metal interconnects 2 and the semiconductor devices 102 in the chips 72 and connect the metal interconnects 1 and 2. The supporter 802 and the interconnect or metal trace 55*a*, in the interconnection layer 106, on the supporter 802 can be between two portions, lower than a horizontal level, at which a top surface of the interconnection layer 106 is positioned, of the metal plug 6*e*. The metal interconnects 2, such as 2*a* and 2*b*, in the trenches 88*t* may have a thickness, e.g., between 0.1 and 5 micrometers, and preferably between 1 and 3 micrometers.

For example, one of the metal plugs 6*p*, such as the metal plug 6*a*, can be formed in the dummy substrate 165 and formed on a contact point, at a bottom of one of the through vias 164*v* (such as the through via 164*a*), of the conduction layer 56 of one of the metal interconnects 1, such as the metal interconnect 1*b*. Another one of the metal plugs 6*p*, such as the metal plug 6*e*, can be formed in one of the chips 72, formed on a contact point of the interconnect or metal trace 55*a* over a supporter (such as the supporter 802) that is between two lower left and right portions of the another one of the metal plugs 6*p* (such as the metal plug 6*e*), and formed on another contact point, at a bottom of another one of the through vias 164*v* (such as the through via 164*e*), of the conduction layer 56 in the one of the metal interconnects 1, such as the metal interconnect 1*b*. Another one of the metal plugs 6*p*, such as the metal plug 6*d*, can be formed in the one of the chips 72 and formed on a contact point, at a bottom of another one of the through vias 164*v* (such as the through via 164*d*), of the interconnect or metal trace 55*b* in the one of the chips 72. Another one of the metal plugs 6*p*, such as the metal plug 6*b*, can be formed in another one of the chips 72 and formed on another contact point, at a bottom of another one of the through vias 164*v* (such as the through via 164*b*), of the conduction layer 56 in another one of the metal interconnects 1, such as the metal interconnect 1*a*. Another one of the metal plugs 6*p*, such as the metal plug 6*c*, can be formed in the another one of the chips 72 and formed on a contact point, at a bottom of another one of the through vias 164*v* (such as the through via 164*c*), of the interconnect or metal trace 55*c* in the another one of the chips 72.

The metal interconnect 2*a* can be formed over the dummy substrate(s) 165, over multiple of the chips 72, and across multiple edges of the multiple of the chips 72. The metal interconnect 2*a* can be connected to a contact point, at a bottom of the through via 164*b*, of the metal interconnect 1*a* through the metal plug 6*b* in one of the chips 72, can be connected to a contact point, at a bottom of the through via 164*c*, of the interconnect or metal trace 55*c* in the one of the chips 72 through the metal plug 6*c* in the one of the chips 72, and can be connected to a contact point, at a bottom of the through via 164*d*, of the interconnect or metal trace 55*b* in another one of the chips 72 through the metal plug 6*d* in the another one of the chips 72. These contact points at the bottoms of the through vias 164*b*, 164*c* and 164*d* can be connected to each other through the metal interconnect 2*a*.

The metal interconnect 2*b* can be formed over multiple of the chips 72 to connect multiple of the semiconductor devices 102 in the multiple of the chips 72. The metal interconnect 2*b* can be connected to a contact point, at a bottom of the through via 164*e*, of the metal interconnect 1*b* through the metal plug 6*e* in one of the chips 72, can be connected to one or more of the semiconductor devices 102 in the one of the chips 72 through the metal plug 6*e* and the interconnect or metal trace 55*a* in the one of the chips 72, and can be connected to a contact point, at a bottom of another one of the through vias 164*v*, of the interconnect or metal trace 55*a*, 55*b* or 55*c* in another one of the chips 72 through another one of the metal plugs 6*p* in the another one of the chips 72.

Accordingly, one of the semiconductor devices 102 in one of the chips 72 can be connected to another one of the semiconductor devices 102 in the one of the chips 72 or in another one of the chips 72 through one of the metal interconnects 2, such as 2*a* or 2*b*, and can be connected to a contact point, at a bottom of one of the through vias 164*v* (such as the through via 164*a*, 164*b*, or 164*e*), of the conduction layer 56 of one of the metal interconnects 1, such as 1*a* or 1*b*, through the one of the metal interconnects 2. Each of the metal interconnects 2 can be a signal trace, a bit line, a clock bus, a power plane, a power bus, a power trace, a ground plane, a ground bus, or a ground trace.

Alternatively, the element 72 not only can indicate a chip, but also can indicate a wafer. When the element 72 is a wafer, the element 68 can be another wafer. Thereby, the process illustrated in the invention can be employed to the wafer-to-wafer bonding.

Figure 53:
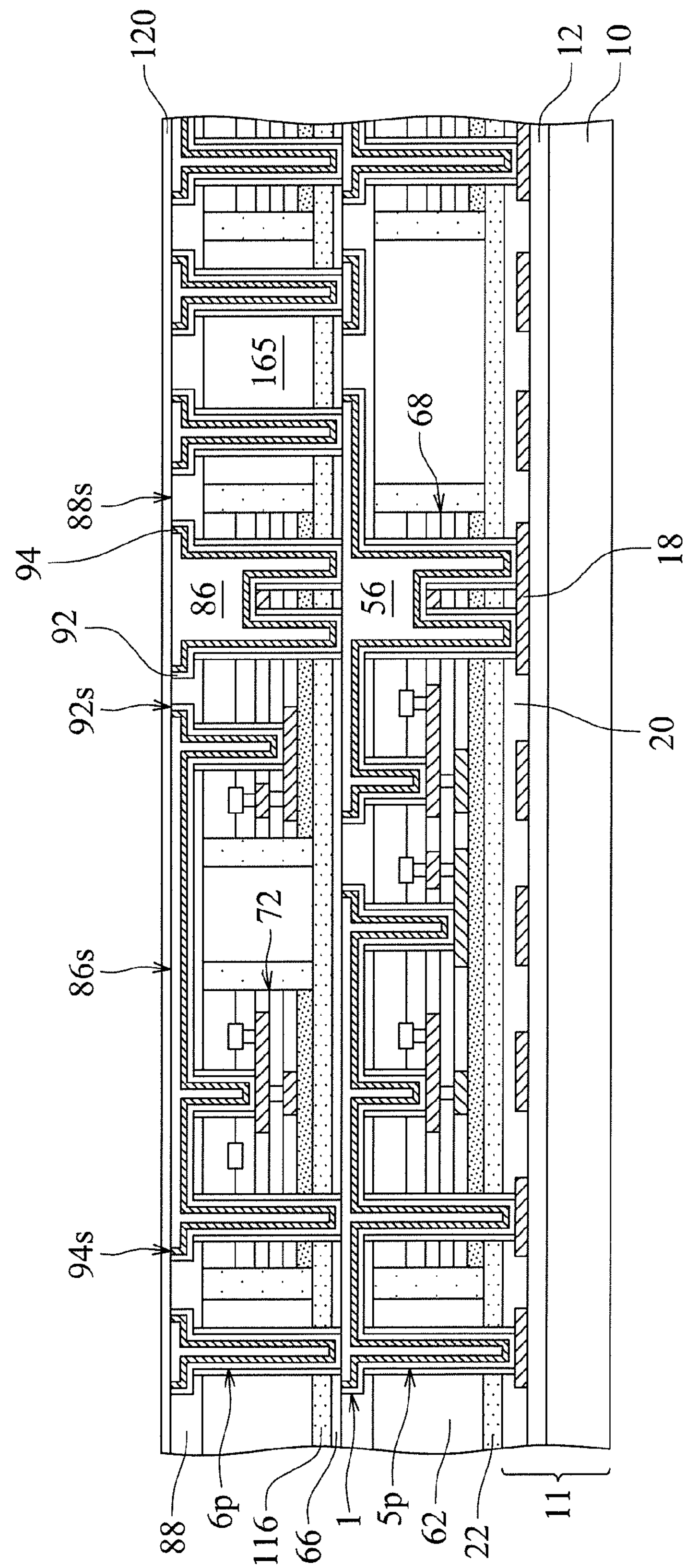

Referring to FIG. 53, after forming the structure illustrated in FIG. 52, an insulating or dielectric layer 120 can be formed on the ground or polished surface 92*s* of the adhesion/barrier layer 92, on the ground or polished surface 94*s* of the seed layer 94, on the ground or polished surface 86*s* of the conduction layer 86, and on the exposed top surface 88*s* of the dielectric layer 88. The insulating or dielectric layer 120 may have a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers.

The insulating or dielectric layer 120, for example, may include or can be a layer of silicon oxide (such as $SiO_2$), silicon nitride (such as $Si_3N_4$), silicon carbon nitride (such as SiCN), silicon oxynitride (such as SiON), or silicon oxycarbide (such as SiOC) with a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers, formed by a chemical vapor deposition (CVD) process or a plasma-enhanced chemical vapor deposition (PECVD) process.

Alternatively, the insulating or dielectric layer 120 may include or can be a polymer layer with a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers, formed by, e.g., a process including a spin coating process and a curing process. The polymer layer can be a layer of polyimide, benzocyclobutene (BCB), polybenzoxazole (PBO), poly-phenylene oxide (PPO), or epoxy.

Figure 54:
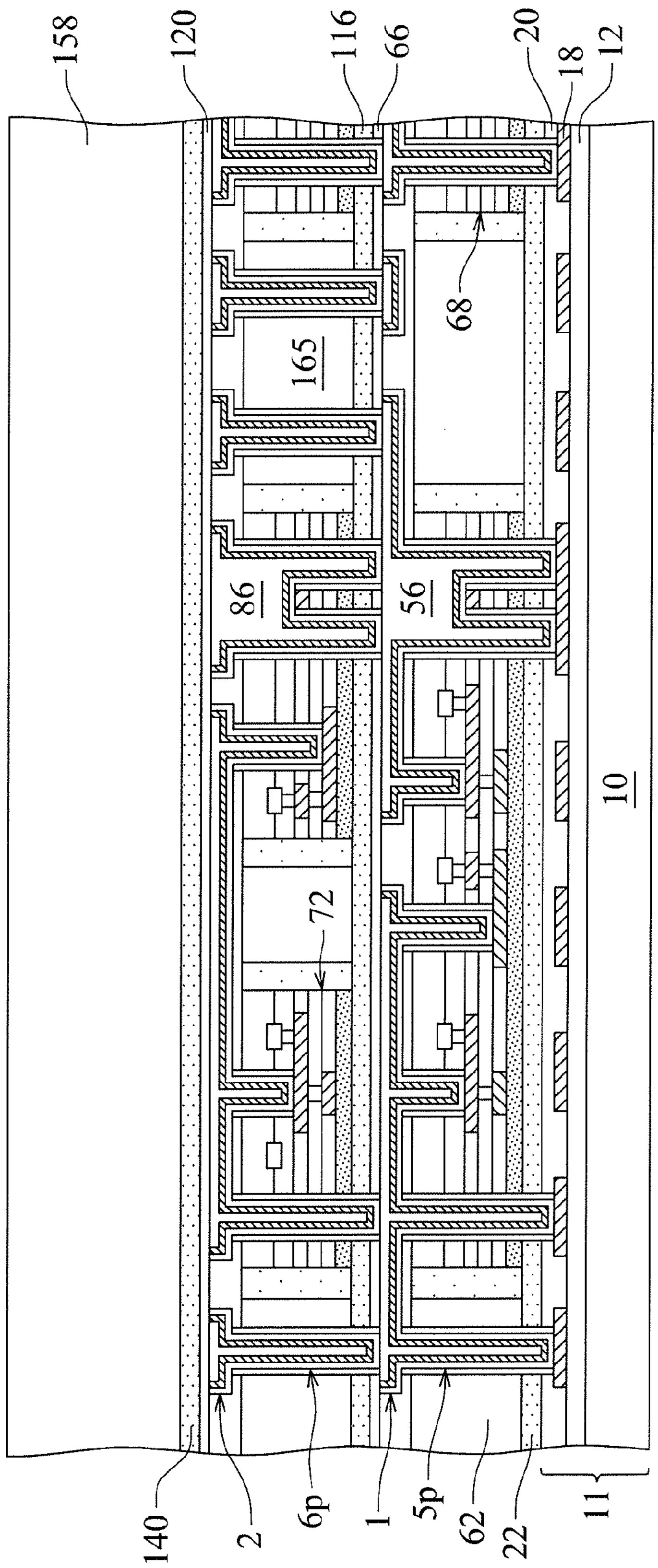

Next, referring to FIG. 54, a dummy substrate 158 can be attached onto the insulating or dielectric layer 120, e.g., by the following steps. First, a glue layer 140 having a thickness, e.g., between 3 and 100 micrometers, and preferably between 5 and 10 micrometers or between 10 and 30 micrometers, can be formed on a top surface of the insulating or dielectric layer 120 or on a bottom surface of the dummy substrate 158 by using, e.g., a spin coating process, a lamination process, a spraying process, a dispensing process, or a screen printing process. Next, the glue layer 140 can be optionally pre-cured or baked. Next, the dummy substrate 158 can be placed over the insulating or dielectric layer 120 with the glue layer 140 between the insulating or dielectric layer 120 and the dummy substrate 158. Next, the glue layer 140 can be cured again in a temperature between 180 degrees centigrade and 350 degrees centigrade with a mechanical or thermal pressure on the glue layer 140. Accordingly, the dummy substrate 158 can be joined with the insulating or dielectric layer 120 using the glue layer 140. The glue layer 140 can be a polymer layer, such as a layer of epoxy, polyimide, benzocyclobutene (BCB), polybenzoxazole (PBO), poly-phenylene oxide (PPO), or silosane, with a thickness, e.g., between 3 and 100 micrometers, and preferably between 5 and 10 micrometers or between 10 and 30 micrometers.

Alternatively, the glue layer 140 can be replaced with an inorganic insulating layer, such as silicon oxide, that can be formed on the insulating or dielectric layer 120. In this case, the dummy substrate 158 can be joined with the insulating or dielectric layer 120, e.g., by bonding an inorganic insulating layer, such as silicon oxide, of the dummy substrate 158 onto the inorganic insulating layer 140, such as silicon oxide. The silicon-oxide layer of the dummy substrate 158 contacts the silicon-oxide layer 140.

The dummy substrate 158 can be a round wafer, a dummy silicon wafer, a rectangular panel, or a substrate of polysilicon, glass, silicon or ceramic. The dummy substrate 158, before being ground or polished as mentioned in the following processes, may have a thickness, e.g., greater than 100 micrometers, such as between 100 and 1,500 micrometers, and preferably between 200 and 500 micrometers or between 100 and 300 micrometers.

In one embodiment, there are no circuits preformed in the dummy substrate 158 or on a top or bottom surface of the dummy substrate 158 before the dummy substrate 158 is joined with the insulating or dielectric layer 120. The dummy substrate 158 may have the top surface with a profile that is substantially same as that of the top surface of the carrier 11.

Figure 55:
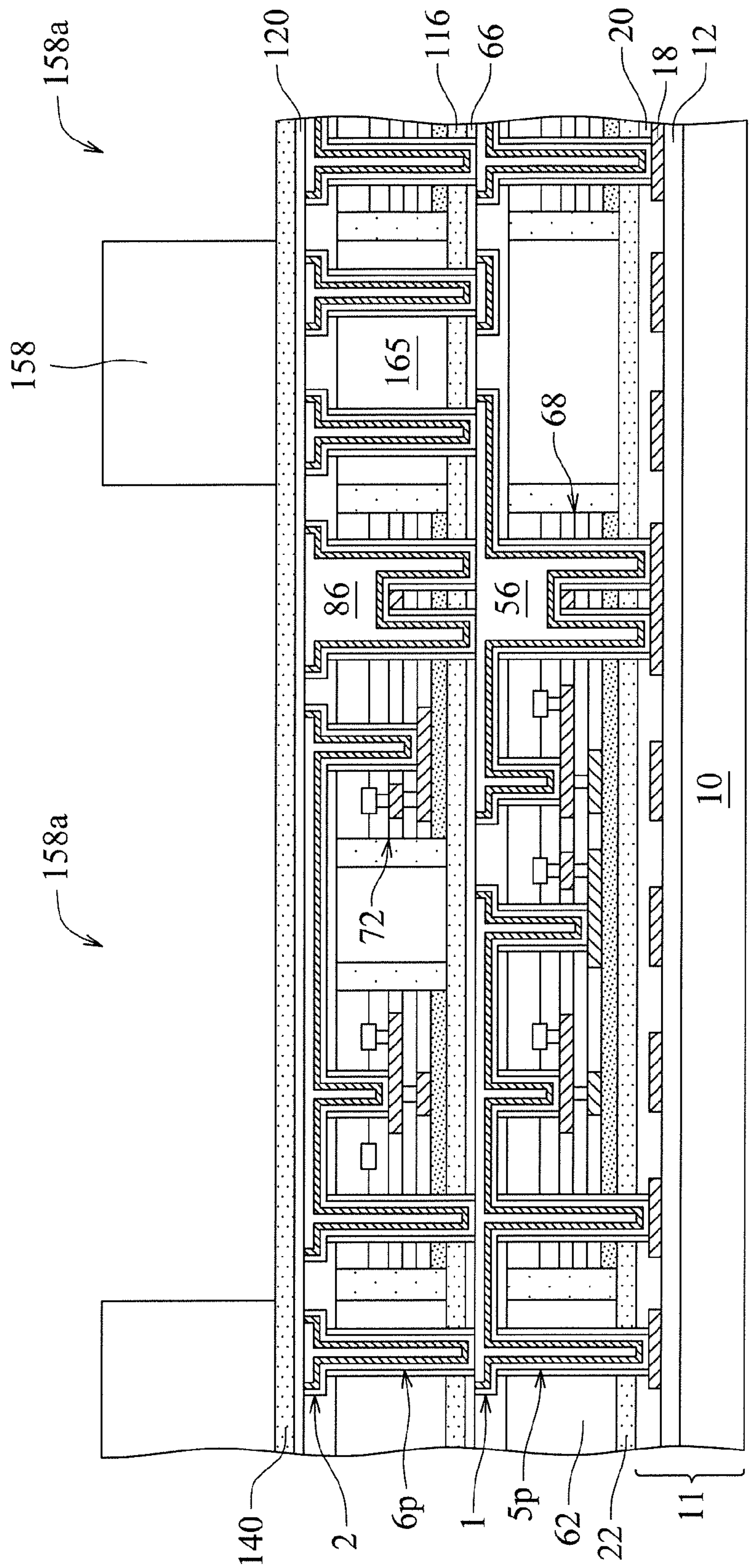
Figure 56:
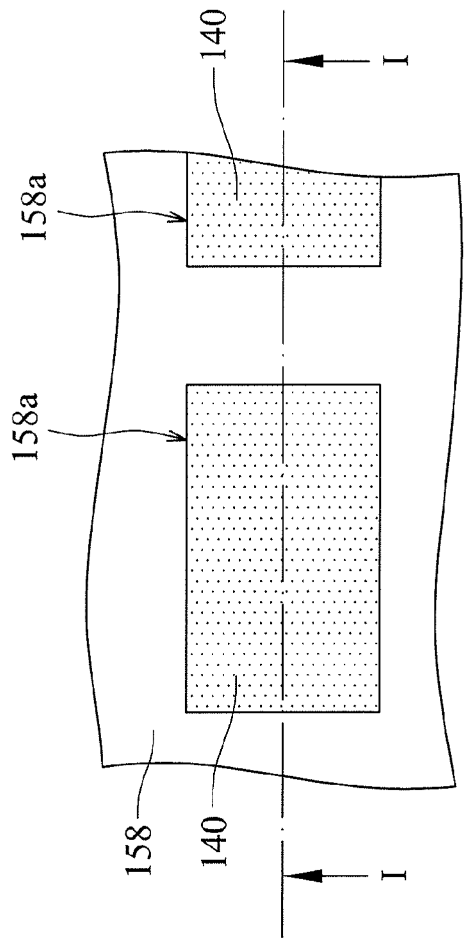

Next, referring to FIG. 55, multiple openings 158*a* are formed in the dummy substrate 158, exposing the glue layer 140, by a process, e.g., including a photolithography process and an etching process, which can be referred to as the previous illustration of FIGS. 29 and 31. Alternatively, when the glue layer 140 is replaced with the silicon-oxide layer and the dummy substrate 158 has the silicon-oxide layer bonded with the silicon-oxide layer 140, the openings 158*a* are formed in the dummy substrate 158, exposing the silicon-oxide layer of the dummy substrate 158, by a process, e.g., including a photolithography process and an etching process, which can be referred to as the previous illustration of FIGS. 29 and 31. FIG. 56 shows a schematic top view of the dummy substrate 158 with the openings 158a as shown in FIG. 55, and FIG. 55 can be a cross-sectional view cut along the line I-I shown in FIG. 56.

Alternatively, a hard mask (not shown), such as silicon oxide or silicon nitride, may be formed on the dummy substrate 158 shown in FIG. 55, e.g., by the following steps. First, the hard mask of silicon oxide or silicon nitride can be formed on the dummy substrate 158 shown in FIG. 54. Next, a photoresist layer can be formed on the hard mask by using, e.g., a spin coating process, a screen printing process, or a lamination process. Next, a photo exposure process and a development process can be employed to form multiple openings, exposing multiple regions of the hard mask, in the photoresist layer. Next, multiple openings are formed in the hard mask and under the openings in the photoresist layer, exposing multiple regions of the dummy substrate 158, by using, e.g., a wet etching process or a plasma etching process. Next, the photoresist layer is removed by using, e.g., an organic chemical. Next, multiple openings 158a are formed in the dummy substrate 158 and under the openings in the hard mask, exposing the glue layer 140, by using, e.g., a chemical etching process or a plasma etching process. Alternatively, when the glue layer 140 is replaced with the silicon-oxide layer and the dummy substrate 158 has the silicon-oxide layer bonded with the silicon-oxide layer 140, the openings 158a are formed in the dummy substrate 158 and under the openings in the hard mask, exposing the silicon-oxide layer of the dummy substrate 158, by using, e.g., a chemical etching process or a plasma etching process. The hard mask will be removed by the following grinding or polishing process.

Figure 57:
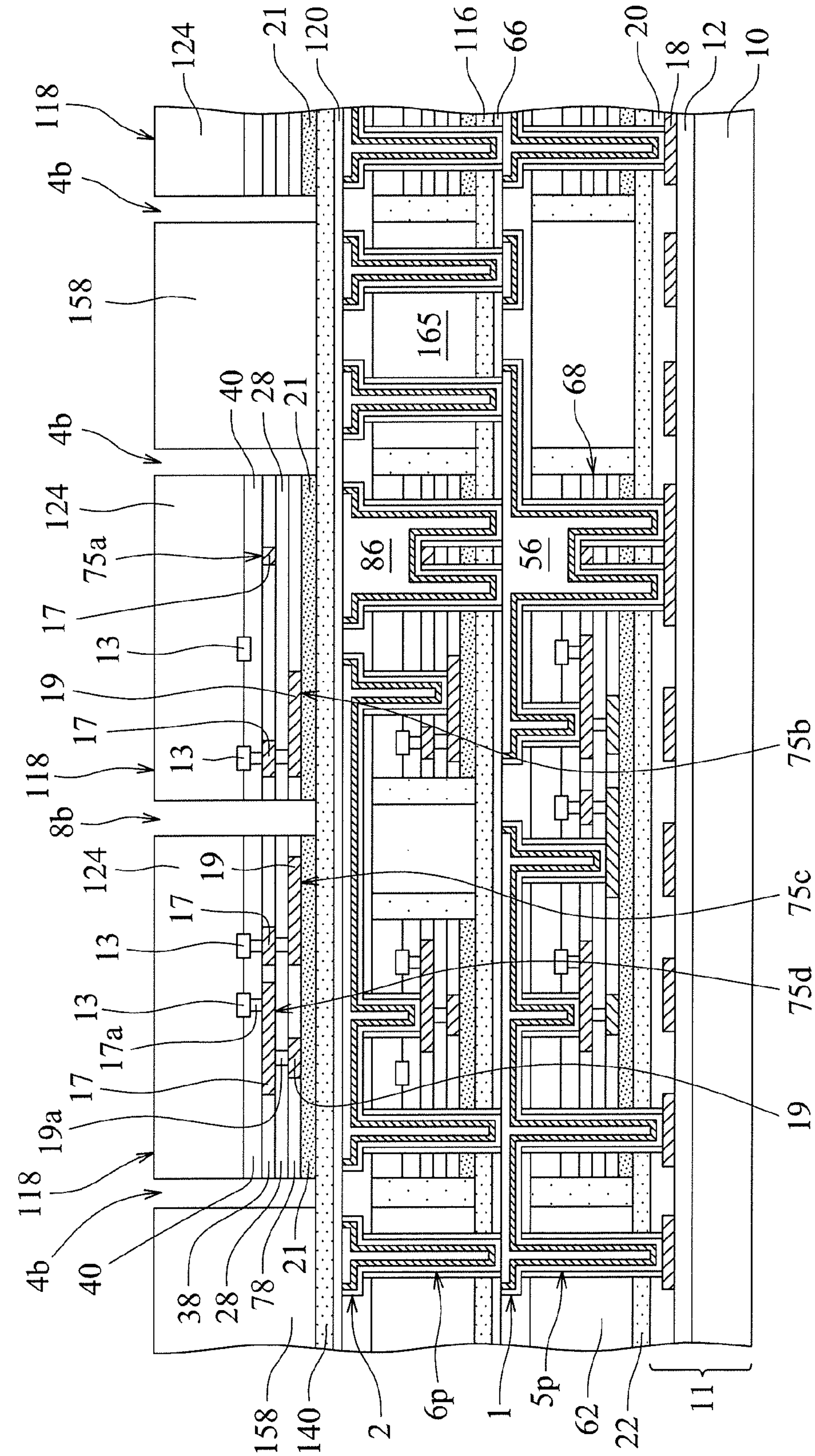
Figure 58:
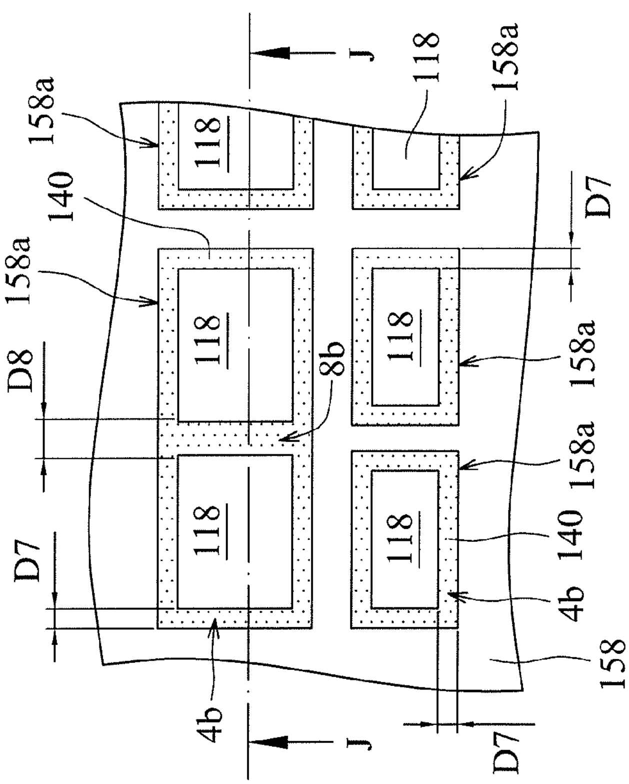

Next, referring to FIG. 57, multiple chips 118 can be mounted over the insulating or dielectric layer 120 and in the openings 158a in the dummy substrate 158, and the chips 118 have active sides at bottoms of the chips 118 and backsides at tops of the chips 118. In one case, one of the chips 118 may have different circuit designs from those of another one of the chips 118. Also, in another case, one of the chips 118 may have same circuit designs as those of another one of the chips 118. Alternatively, one of the chips 118 may have a different area (top surface) or size from that of another one of the chips 118. Also, in another case, one of the chips 118 may have a same area (top surface) or size as that of another one of the chips 118. FIG. 58 is an example of a schematical top view showing the chips 118 mounted in the openings 158a in the dummy substrate 158, and FIG. 57 is a cross-sectional view cut along the line J-J shown in the schematical top view of FIG. 58.

Mounting the chips 118 over the insulating or dielectric layer 120 and in the openings 158a can be performed, e.g., by first forming a glue material (not shown) on the active sides of the chips 118 or on the glue layer 140, next placing the chips 118 in the openings 158a and over the glue layer 140 with the glue material contacting the glue layer 140, and then curing the glue material in a temperature between 180 degrees centigrade and 350 degrees centigrade with a mechanical or thermal pressure on the glue material. Accordingly, the chips 118 can be joined with the glue layer 140 using the glue material.

Each of the chips 118 can include a semiconductor substrate 124, multiple semiconductor devices 13 in and/or on the semiconductor substrate 124, a passivation layer 21 under the semiconductor substrate 124, multiple dielectric layers 78, 28, 38 and 40 between the semiconductor substrate 124 and the passivation layer 21, a patterned metal layer 19 between the semiconductor substrate 124 and the passivation layer 21, an interconnection layer 17 between the semiconductor substrate 124 and the passivation layer 21, multiple via plugs 19a in the dielectric layer 28, and multiple via plugs 17a in the dielectric layer 40. The semiconductor substrate 124 is at the backside of each chip 118, and the semiconductor devices 13, the passivation layer 21, the patterned metal layer 19, the interconnection layer 17, the dielectric layers 78, 28, 38 and 40, and the via plugs 17a and 19a are at the active side of each chip 118.

The semiconductor substrate 124 can be a suitable substrate, such as silicon substrate, silicon-germanium (SiGe) substrate, or gallium-arsenide (GaAs) substrate. The semiconductor substrate 124 before being thinned as mentioned in the following processes may have a thickness, e.g., greater than 100 micrometers, such as between 100 and 500 micrometers, and preferably between 150 and 250 micrometers or between 100 and 300 micrometers.

Each of the semiconductor devices 13 can be a P-channel metal-oxide-semiconductor (PMOS) transistor, an N-channel metal-oxide-semiconductor (NMOS) transistor, a double-diffused metal-oxide-semiconductor (DMOS) transistor, or a bipolar transistor. Each of the semiconductor devices 13 can be provided for a NOR gate, a NAND gate, an AND gate, an OR gate, a static-random-access-memory (SRAM) cell, a dynamic-random-access-memory (DRAM) cell, a flash memory cell, a non-volatile memory cell, an erasable programmable read-only memory (EPROM) cell, a read-only memory (ROM) cell, a magnetic-random-access-memory (MRAM) cell, a sense amplifier, an inverter, an operational amplifier, an adder, a multiplexer, a diplexer, a multiplier, an analog-to-digital (A/D) converter, a digital-to-analog (D/A) converter, an analog circuit, a complementary-metal-oxide-semiconductor (CMOS) sensor, or a charge coupled device (CCD).

The passivation layer 21 may include or can be an inorganic dielectric layer having a bottom surface attached to the glue layer 140, and the inorganic dielectric layer can be a layer of silicon nitride (such as $Si_3N_4$), silicon carbon nitride (such as SiCN) or silicon oxynitride (such as SiON) with a thickness, e.g., between 0.3 and 1.5 micrometers. Alternatively, each of the chips 118 may further contain an organic polymer layer, such as a layer of polyimide, benzocyclobutene (BCB), polybenzoxazole (PBO), poly-phenylene oxide (PPO), epoxy, or silosane, with a thickness, e.g., greater than 3 micrometers, such as between 3 and 20 micrometers, and preferably between 5 and 12 micrometers, under and on the bottom surface of the inorganic dielectric layer of the passivation layer 21. In this case, the organic polymer layer has a bottom surface attached to the glue layer 140. The organic polymer layer has a top surface contacting the bottom surface of the inorganic dielectric layer of the passivation layer 21.

Alternatively, multiple openings (not shown) each having a width, e.g., between 0.5 and 100 micrometers, and preferably between 20 and 60 micrometers, may be formed in the passivation layer 21 and expose multiple contact points of the patterned metal layer 19.

The dielectric layer 78 can be between the passivation layer 21 and the dielectric layer 28. The dielectric layer 28 can be between the dielectric layers 78 and 38 and between the layers 17 and 19. The dielectric layer 38 can be between the dielectric layers 40 and 28. Each of the dielectric layers 78, 28 and 38 may include silicon oxide (such as $SiO_2$), silicon nitride (such as $Si_3N_4$), silicon carbon nitride (such as SiCN), silicon oxynitride (such as SiON), silicon oxycarbide (such as SiOC), or a low-k material having a dielectric constant between 1.8 and 3 (such as fluorinated silicate glass (FSG) or Black-diamond). Each of the dielectric layers 78, 28 and 38 may have a thickness, e.g., between 10 nanometers and 2 micrometers, and preferably between 50 nanometers and 1 micrometer.

The dielectric layer 40 between the dielectric layer 38 and the semiconductor substrate 124 and between the interconnection layer 17 and the semiconductor substrate 124 may include or can be a layer of phosphorous silicate glass (PSG), borophospho-silicate glass (BPSG), silicon oxide (such as $SiO_2$), silicon nitride (such as $Si_3N_4$), silicon carbon nitride (such as SiCN), silicon oxynitride (such as SiON), or a low-k material having a dielectric constant between 1.8 and 3 (such as fluorinated silicate glass (FSG) or Black-diamond). The dielectric layer 40 may have a thickness, e.g., between 10 nanometers and 1 micrometer.

The patterned metal layer 19, for example, may include an aluminum-copper-alloy layer having a thickness, e.g., between 0.3 and 3 micrometers and a titanium-containing layer having a thickness, e.g., smaller than 0.2 micrometers, such as between 0.02 and 0.15 micrometers. The titanium-containing layer can be between the dielectric layer 28 and the aluminum-copper-alloy layer and on the aluminum-copper-alloy layer, and the aluminum-copper-alloy layer can be between the passivation layer 21 and the titanium-containing layer. The titanium-containing layer can be a single layer of titanium, titanium nitride, or a titanium-tungsten alloy having a thickness, e.g., smaller than 0.2 micrometers, such as between 0.02 and 0.15 micrometers.

Alternatively, the patterned metal layer 19 may include a nickel layer having a thickness, e.g., between 0.5 and 3 micrometers, and a gold layer having a thickness, e.g., between 0.01 and 1 micrometers under and on the nickel layer, in the view from the side of the dielectric layer 28 to the side of the passivation layer 21. The nickel layer is between the dielectric layer 28 and the gold layer, and the gold layer is between the nickel layer and the passivation layer 21.

Alternatively, the patterned metal layer 19 can be formed by a damascene or double-damascene process including an electroplating process and a chemical mechanical polishing (CMP) process and can be composed of an electroplated copper layer having a bottom contacting the passivation layer 21, an adhesion/barrier metal layer at a top and sidewalls of the electroplated copper layer, and a seed layer between the electroplated copper layer and the adhesion/barrier metal layer and on the top and sidewalls of the electroplated copper layer. The adhesion/barrier metal layer has a first portion between the top of the electroplated copper layer and the dielectric layer 28 and a second portion at the sidewalls of the electroplated copper layer. The electroplated copper layer may have a thickness, e.g., smaller than 1.5 micrometers, such as between 0.15 and 1.2 micrometers, or smaller than 3 micrometers, such as between 0.3 and 3 micrometers. The electroplated copper layer may have a width, e.g., smaller than 1 micrometer, such as between 0.05 and 1 micrometers. The seed layer may include or can be a layer of copper or a titanium-copper alloy formed by a suitable process, such as sputtering process. The adhesion/barrier metal layer may include or can be a layer of titanium, a titanium-tungsten alloy, titanium nitride, chromium, tantalum, or tantalum nitride formed by a suitable process, such as sputtering process. The adhesion/barrier metal layer may have a thickness, e.g., smaller than 0.1 micrometers, such as between 0.005 and 0.1 micrometers. The sidewalls of the electroplated copper layer are covered by the adhesion/barrier metal layer and the seed layer.

The interconnection layer 17, for example, may include carbon nanotube. Alternatively, the interconnection layer 17 can be composed of a patterned metal layer in the dielectric layer 38. In a first alternative, the patterned metal layer 17 may include an aluminum-copper-alloy layer having a thickness, e.g., between 10 nanometers and 2 micrometers and a titanium-containing layer, such as a single layer of titanium nitride, titanium-tungsten alloy or titanium, having a thickness, e.g., smaller than 0.2 micrometers, such as between 0.02 and 0.15 micrometers. The titanium-containing layer can be on the aluminum-copper-alloy layer and between the dielectric layer 40 and the aluminum-copper-alloy layer, and the aluminum-copper-alloy layer can be in the dielectric layer 38. In a second alternative, the patterned metal layer 17 can be formed by a damascene or double-damascene process including an electroplating process and a chemical mechanical polishing (CMP) process and can be composed of an electroplated copper layer having a bottom contacting the dielectric layer 28, an adhesion/barrier metal layer at a top and sidewalls of the electroplated copper layer, and a seed layer between the electroplated copper layer and the adhesion/barrier metal layer and on the top and sidewalls of the electroplated copper layer. The adhesion/barrier metal layer has a first portion between the top of the electroplated copper layer and the dielectric layer 40 and a second portion at the sidewalls of the electroplated copper layer. The electroplated copper layer may have a thickness, e.g., smaller than 2 micrometers, such as between 0.15 and 1 micrometers or between 10 nanometers and 2 micrometers. The electroplated copper layer may have a width, e.g., smaller than 1 micrometer, such as between 0.05 and 1 micrometers. The seed layer may include or can be a layer of copper or a titanium-copper alloy formed by a suitable process, such as sputtering process. The adhesion/barrier metal layer may include or can be a layer of titanium, titanium nitride, a titanium-tungsten alloy, chromium, tantalum or tantalum nitride formed by a suitable process, such as sputtering process. The adhesion/barrier metal layer may have a thickness, e.g., smaller than 0.1 micrometers, such as between 0.005 and 0.1 micrometers. The sidewalls of the electroplated copper layer are covered by the adhesion/barrier metal layer and the seed layer.

The patterned metal layer 19 in the dielectric layer 78 can be connected to the interconnection layer 17 in the dielectric layer 38 through the via plugs 19*a* in the dielectric layer 28. The interconnection layer 17 in the dielectric layer 38 can be connected to the semiconductor devices 13 through the via plugs 17*a* in the dielectric layer 40. The via plugs 19*a* may include electroplated copper, tungsten, or carbon nanotube in the dielectric layer 28. The via plugs 17*a* may include electroplated copper, tungsten, or carbon nanotube in the dielectric layer 40.

Each of the chips 118 may include multiple interconnects or metal traces 75*a*, 75*b*, 75*c* and 75*d* provided by the interconnection layer 17, the patterned metal layer 19 and the via plugs 17*a* and 19*a*. Each of the interconnects or metal traces 75*a*, 75*b*, 75*c* and 75*d* can be connected to one or more of the semiconductor devices 13 and can be a signal trace, a bit line, a clock bus, a power plane, a power bus, a power trace, a ground plane, a ground bus, or a ground trace.

Alternatively, each of the chips 118 may further include a patterned metal layer (not shown), having a thickness greater than that of the patterned metal layer 19 and greater than that of the interconnection layer 17, between the glue layer 140 and the passivation layer 21. The patterned metal layer under the passivation layer 21 may include an electroplated metal layer under the passivation layer 21, an adhesion/barrier metal layer between the electroplated metal layer and the passivation layer 21, and a seed layer between the electroplated metal layer and the adhesion/barrier metal layer. In the view from the side of the passivation layer 21 to the side of the glue layer 140, the adhesion/barrier metal layer can be on the seed layer, and the seed layer can be on the electroplated metal layer. Sidewalls of the electroplated metal layer are not covered by the adhesion/barrier metal layer and the seed layer. The adhesion/barrier metal layer may include or can be a layer of titanium, a titanium-tungsten alloy, titanium nitride, chromium, tantalum, tantalum nitride, or nickel with a thickness, e.g., smaller than 0.6 micrometers, such as between 1 nanometer and 0.5 micrometers or between 0.005 and 0.1 micrometers. The seed layer may include or can be a layer of copper, a titanium-copper alloy, silver, gold, or nickel with a thickness, e.g., smaller than 0.8 micrometers, such as between 5 nanometers and 0.1 micrometers or between 10 nanometers and 0.8 micrometers. Each of the adhesion/barrier metal layer and the seed layer can be formed by a suitable process, such as sputtering process. The electroplated metal layer may include or can be a layer of electroplated copper, electroplated silver, or electroplated gold with a thickness, e.g., greater than 2 micrometers, such as between 2 and 30 micrometers, and preferably between 3 and 10 micrometers or between 5 and 25 micrometers.

Alternatively, when the silicon-oxide layer of the dummy substrate 158 remains on the silicon-oxide layer 140, after forming the openings 158*a*, and is exposed by the openings 158*a* in the dummy substrate 158, mounting the chips 118 over the insulating or dielectric layer 120 and in the openings 158*a* can be performed, e.g., by bonding another silicon-oxide layer of the passivation layer 21, at the active side of each chip 118, with the remaining silicon-oxide layer of the dummy substrate 158 under the passivation layer 21. The silicon-oxide layer of the passivation layer 21 contacts the silicon-oxide layer of the dummy substrate 158. Accordingly, the chips 118 can be joined with the insulating or dielectric layer 120 using these silicon-oxide layers.

Alternatively, another technique to form the structure illustrated in FIGS. 57 and 58 is performed by first providing a patterned dummy substrate 158, such as patterned dummy wafer, patterned panel, patterned silicon frame, or patterned substrate of polysilicon, glass, silicon, ceramic, or polymer, with multiple openings 158*a* passing through the patterned dummy substrate 158, next joining the patterned dummy substrate 158 with the insulating or dielectric layer 120 using the layer 140, which can be referred to as the steps illustrated in FIG. 54, and then mounting the chips 118 over the insulating or dielectric layer 120 and in the openings 158*a* in the patterned dummy substrate 158, which can be referred to as the steps illustrated in FIG. 57.

As shown in FIGS. 57 and 58, there are multiple gaps 4*b* each between the dummy substrate 158 and one of the chips 118, and there are multiple gaps 8*b* (one of them is shown) each between neighboring two chips 118. Each of the gaps 4*b* may have a transverse distance or spacing D7, e.g., between 1 and 200 micrometers, between 1 and 50 micrometers, or between 1 and 10 micrometers, and preferably between 1 and 5 micrometers. Each of the gaps 8*b* may have a transverse distance or spacing D8, e.g., between 1 and 200 micrometers, between 1 and 50 micrometers, or between 1 and 10 micrometers, and preferably between 1 and 5 micrometers.

Figure 59:
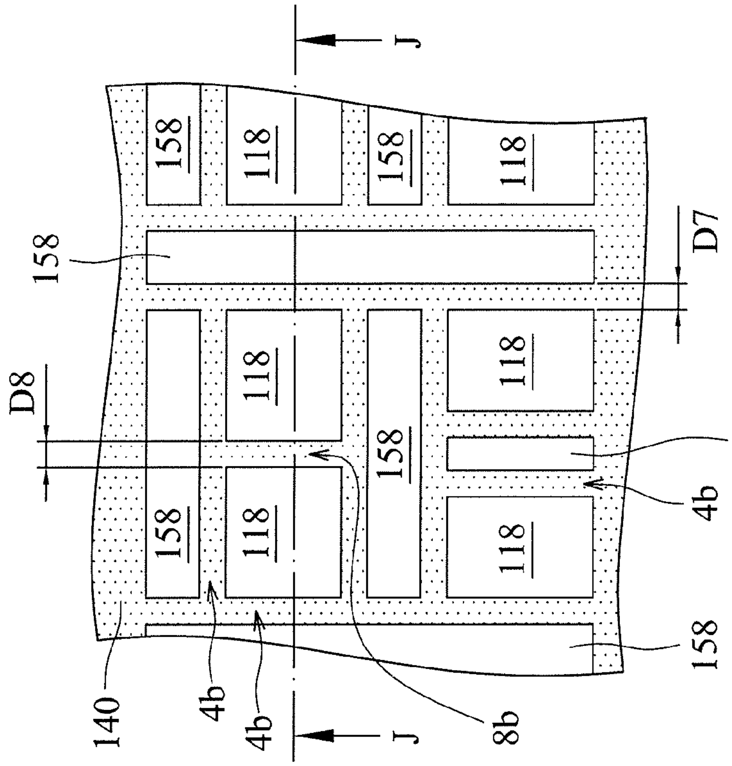

FIG. 59 shows another technique to form the structure with the same cross-sectional view as shown in FIG. 57. FIG. 57 is a cross-sectional view cut along the line J-J shown in a schematical top view of FIG. 59. The structure shown in FIGS. 57 and 59 can be formed, e.g., by the following steps. First, the previously described glue layer 140 can be formed on the insulating or dielectric layer 120 shown in FIG. 53 by using, e.g., a spin coating process, a laminating process, a spraying process, a dispensing process, or a screen printing process. Next, the glue layer 140 can be optionally pre-cured or baked. Next, the previously described chips 118 and multiple separate dummy substrates 158 can be placed on the glue layer 140. When a gap between neighboring two chips 118 is too great, such as greater than 500 or 1,000 micrometers, one or more of the separate dummy substrates 158 can be placed in the gap. Alternatively, when a gap between neighboring two chips 118 is small enough, such as smaller than 500 or 1,000 micrometers, there can be no separate dummy substrates 158 placed in the gap. Next, the glue layer 140 can be cured again in a temperature between 180 degrees centigrade and 350 degrees centigrade with a mechanical or thermal pressure on the glue layer 140. Accordingly, the separate dummy substrates 158 and the chips 118 can be joined with the insulating or dielectric layer 120 using the glue layer 140. The separate dummy substrates 158, for example, can be separate silicon bars, separate dummy chips, separate dummy silicon dies, or separate substrates of polysilicon, glass, silicon, or ceramic.

Alternatively, referring to FIGS. 57 and 59, the glue layer 140 can be replaced with a silicon-oxide layer that is formed on the insulating or dielectric layer 120. In this case, joining the chips 118 with the layer 120 and joining the separate dummy substrates 158 with the layer 120 can be performed, e.g., by bonding another silicon-oxide layer of the passivation layer 21, at the active side of each chip 118, with the silicon-oxide layer 140 and by bonding another silicon-oxide layer of each of the separate dummy substrates 158 with the silicon-oxide layer 140. The silicon-oxide layer of the passivation layer 21 of each chip 118 contacts the silicon-oxide layer 140, and the silicon-oxide layer of each of the separate dummy substrates 158 contacts the silicon-oxide layer 140. Accordingly, the chips 118 and the separate dummy substrates 158 can be joined with the insulating or dielectric layer 120 using these silicon-oxide layers.

As shown in FIGS. 57 and 59, there are multiple gaps 4*b* each between one of the chips 118 and one of the separate dummy substrates 158, and there are multiple gaps 8*b* (one of them is shown) each between neighboring two chips 118. Each of the gaps 4*b* may have a transverse distance or spacing D7, e.g., between 1 and 200 micrometers, between 1 and 50 micrometers, or between 1 and 10 micrometers, and preferably between 1 and 5 micrometers. Each of the gaps 8*b* may have a transverse distance or spacing D8, e.g., smaller than 500 micrometers, such as between 1 and 200 micrometers, between 1 and 50 micrometers, or between 1 and 10 micrometers, and preferably between 1 and 5 micrometers. In one embodiment, there are no circuits preformed in each separate dummy substrate 158 or on a top or bottom surface of each separate dummy substrate 158 before the separate dummy substrates 158 are joined with the insulating or dielectric layer 120.

Figure 60:
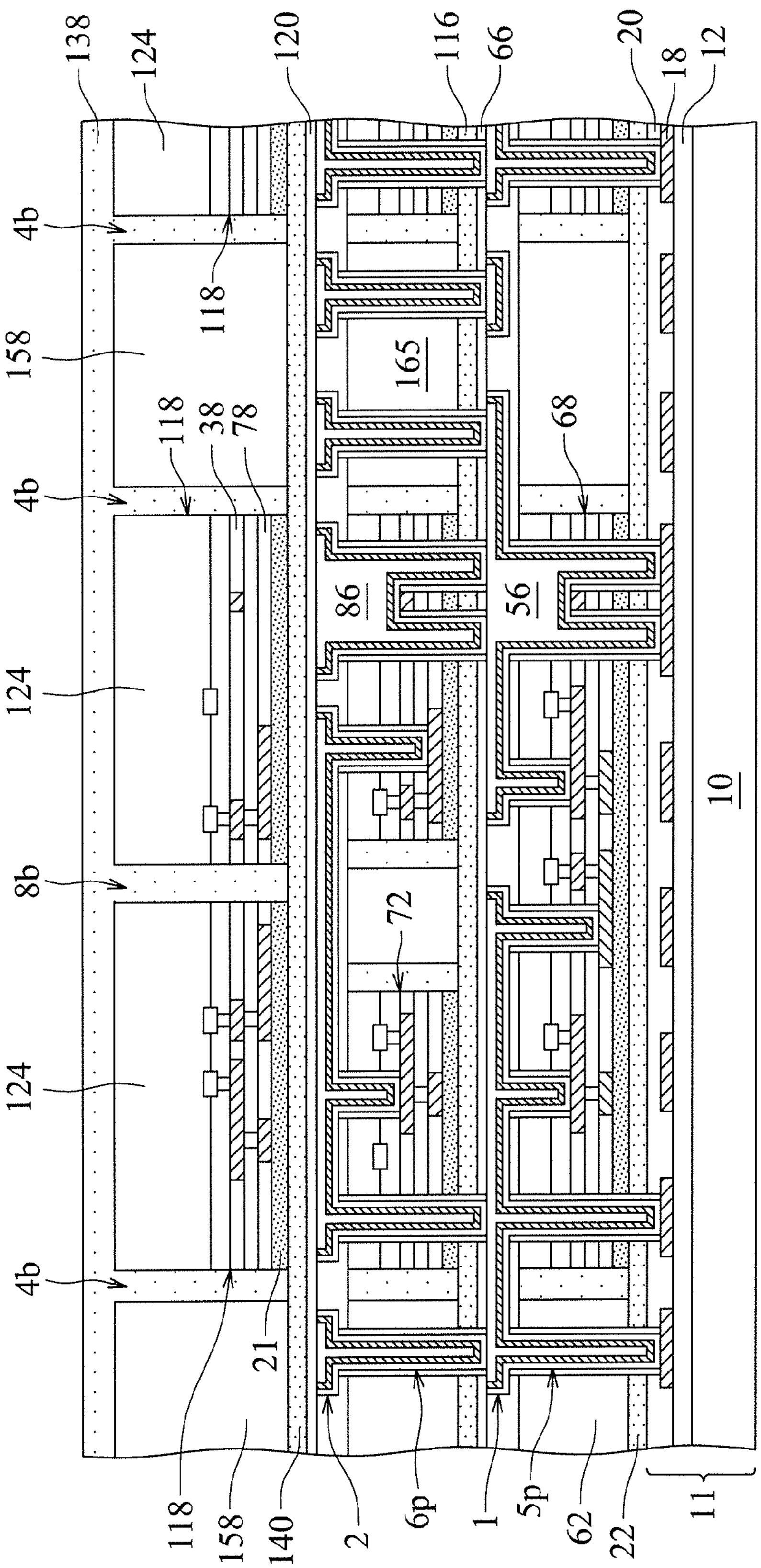

Referring to FIG. 60, after the steps illustrated in FIGS. 57 and 58 or in FIGS. 57 and 59, an encapsulation/gap filling material 138, such as polysilicon, silicon oxide, or a polymer, is formed on a backside of the semiconductor substrate 124 of each chip 118, on the dummy substrate(s) 158, and in the gaps 4*b* and 8*b*. If the encapsulation/gap filling material 138 is polysilicon, the polysilicon can be formed by a chemical vapor deposition (CVD) process or a plasma-enhanced chemical vapor deposition (PECVD) process. If the encapsulation/gap filling material 138 is silicon oxide, the silicon oxide can be formed by a chemical vapor deposition (CVD) process, a plasma-enhanced chemical vapor deposition (PECVD) process, or an atmospheric pressure chemical vapor deposition (APCVD) process. If the encapsulation/gap filling material 138 is a polymer, such as polyimide, epoxy, benzocyclobutane (BCB), polybenzoxazole (PBO), or polyphenylene oxide (PPO), the polymer can be formed by a process including a spin coating process, a dispensing process, a molding process, or a screen printing process.

Figure 61:
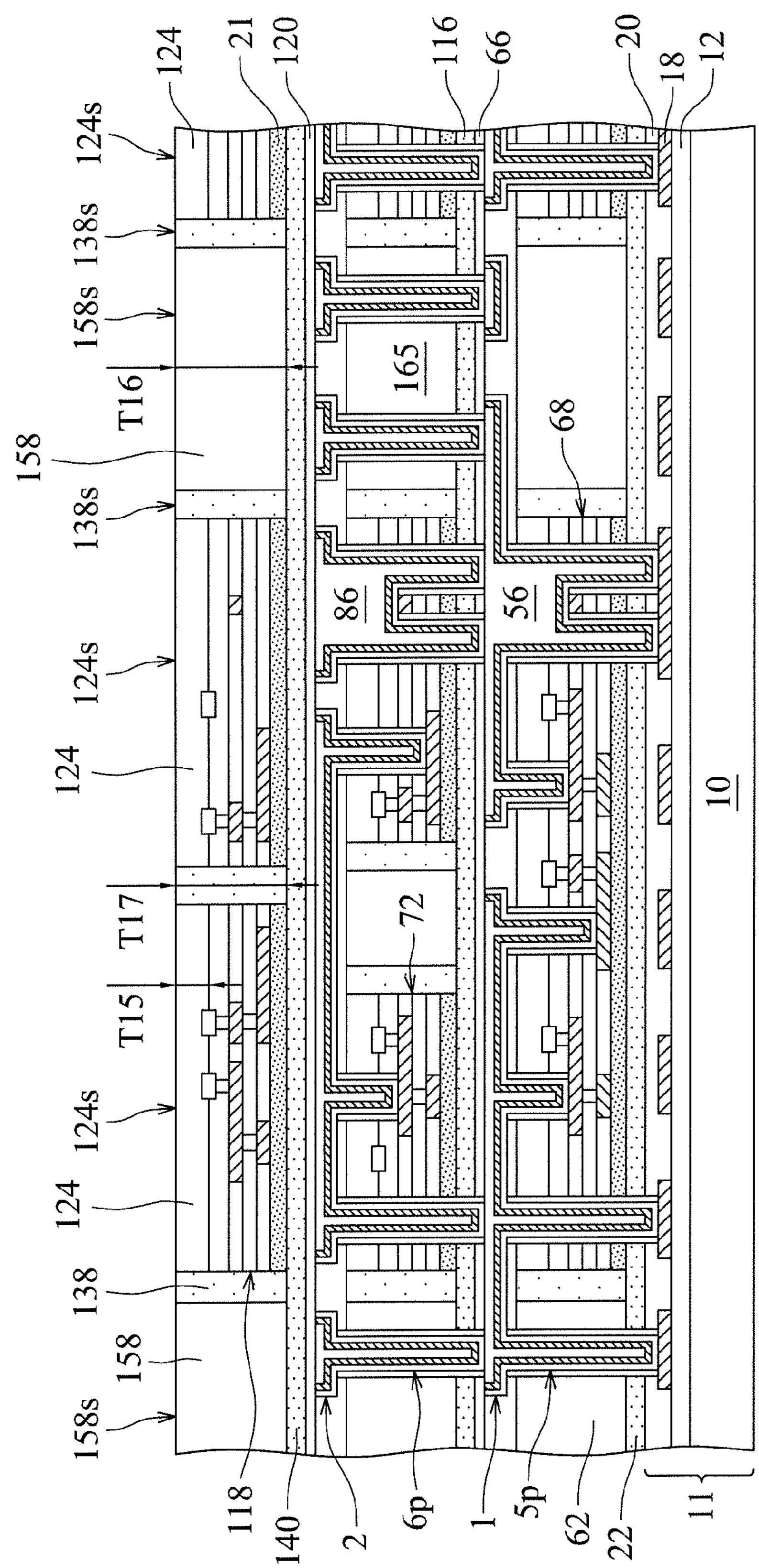

Next, referring to FIG. 61, the encapsulation/gap filling material 138, the backside of the semiconductor substrate 124 of each chip 118, and the dummy substrate(s) 158 are ground or polished by a suitable process, such as chemical-mechanical-polishing (CMP) process, mechanical polishing process, mechanical grinding process, or a process including mechanical polishing and chemical etching, until the semiconductor substrate 124 of one of the chips 118 is thinned to a thickness T15, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Preferably, each of the chips 118, after the grinding or polishing process, may have a thickness, e.g., between 3 and 105 micrometers, and preferably between 3 and 30 micrometers or between 5 and 25 micrometers. After the grinding or polishing process, the dummy substrate(s) 158 can be thinned to a thickness T16, e.g., between 3 and 100 micrometers, and preferably between 3 and 30 micrometers or between 5 and 25 micrometers, and the encapsulation/gap filling material 138 remaining in the gaps **4*b* and 8*b* may have a vertical thickness T17, e.g., between 3 and 100 micrometers, and preferably between 3 and 30 micrometers or between 5 and 25 micrometers. The ground or polished surface 124*s* of the semiconductor substrate 124, at the backside of each chip 118, and the ground or polished surface(s) 158*s* of the dummy substrate(s) 158 can be substantially flat and not covered by the encapsulation/gap filling material 138. The ground or polished surface(s) 158*s* may be substantially coplanar with the ground or polished surface 124*s* of each chip 118 and with the ground or polished surface 138*s* of the encapsulation/gap filling material 138 in the gaps 4*b* and 8*b***.

Figure 62:
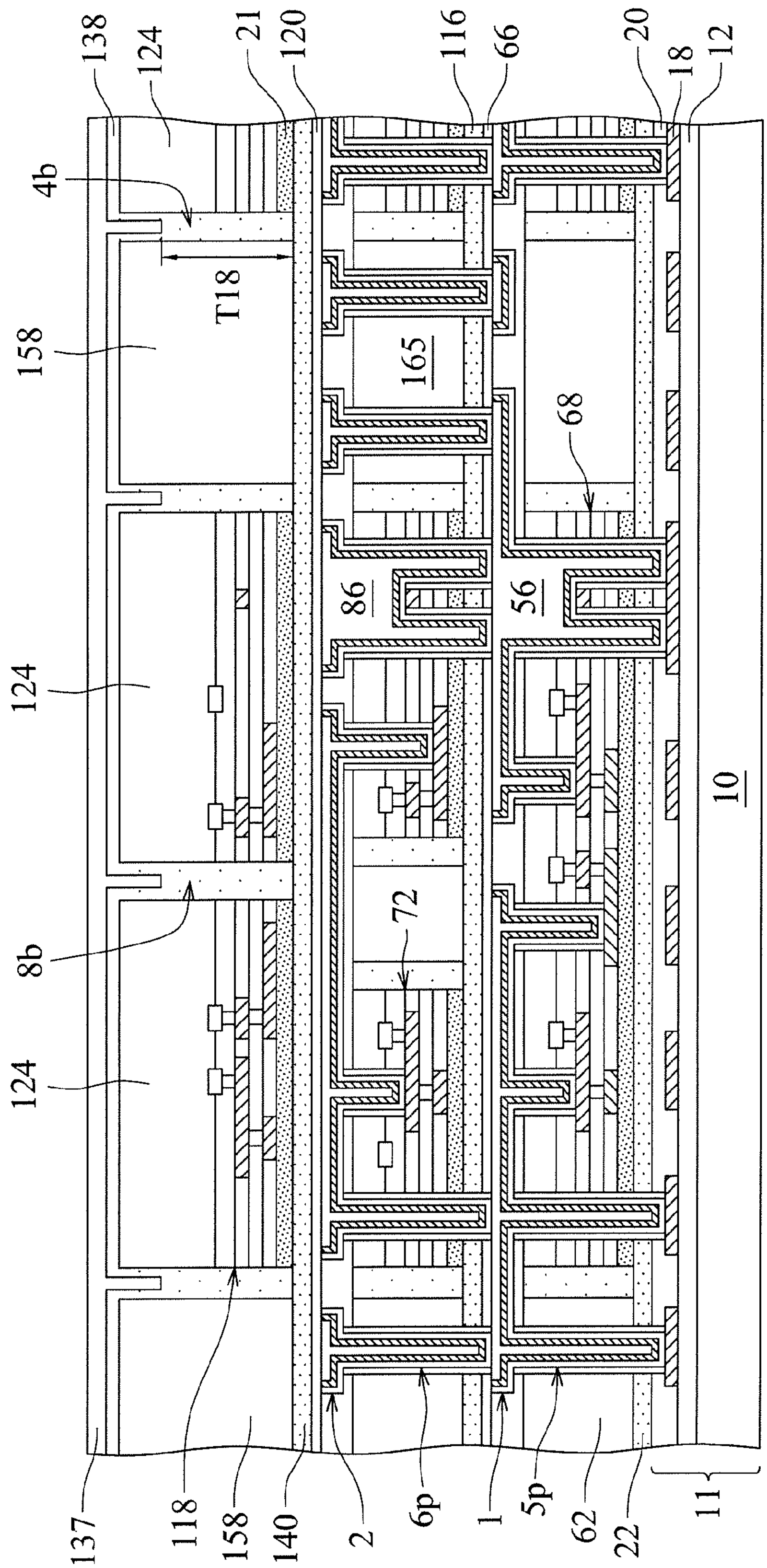
Figure 63:
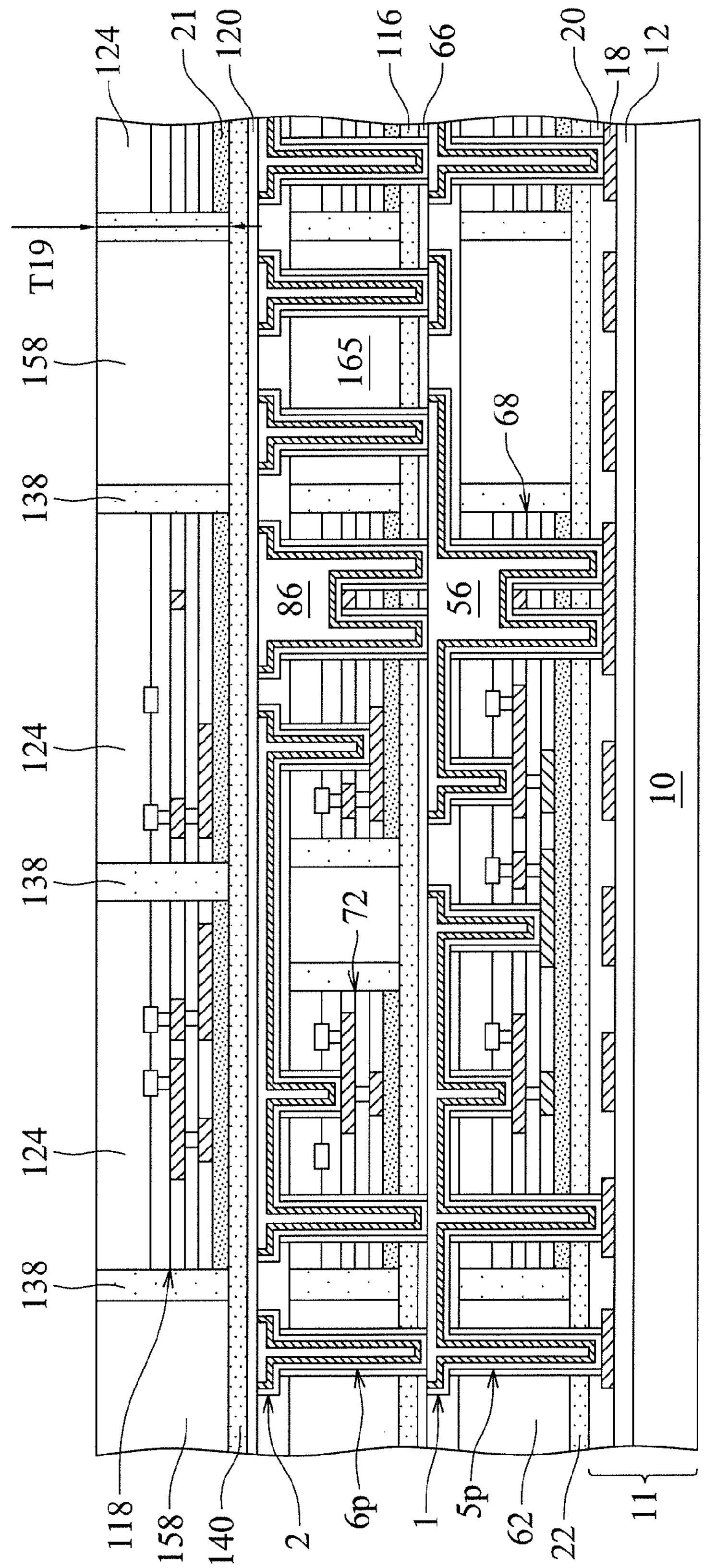

Alternatively, FIGS. 62 and 63 show another technique to form the structure illustrated in FIG. 61. Referring to FIG. 62, after the steps illustrated in FIGS. 57 and 58 or in FIGS. 57 and 59, an encapsulation/gap filling material 138, such as polysilicon or silicon oxide, can be formed on the backside of the semiconductor substrate 124 of each chip 118, on the dummy substrate(s) 158 and in the gaps **4*b* and 8*b*, and then a polymer 137, such as molding compound, polyimide, epoxy, benzocyclobutane (BCB), polybenzoxazole (PBO), or poly-phenylene oxide (PPO), can be formed on the encapsulation/gap filling material 138 and in the gaps 4*b* and 8*b*. The encapsulation/gap filling material 138 in the gaps 4*b* and 8*b* may have a vertical thickness T18**, e.g., between 10 and 100 micrometers, and preferably between 10 and 50 micrometers or between 20 and 50 micrometers.

Next, referring to FIG. 63, a mechanical grinding process can be performed, e.g., by using an abrasive or grinding pad with water to grind the polymer 137, the encapsulation/gap filling material 138, the backside of the semiconductor substrate 124 of each chip 118 and the dummy substrate(s) 158 until all of the polymer 137 is removed and until a predetermined vertical thickness T19 of the encapsulation/gap filling material 138 in the gaps **4*b* and 8*b* is reached. The predetermined vertical thickness T19 can be, e.g., between 10 and 100 micrometers, and preferably between 10 and 50 micrometers or between 20 and 50 micrometers. The abrasive or grinding pad can be provided with rough grit having an average grain size, e.g., between 0.5 and 15 micrometers for performing the mechanical grinding process. Thereafter, a chemical-mechanical-polishing (CMP) process can be performed, e.g., by using a polish pad with a slurry containing chemicals and a fine abrasive like silica with an average grain size, e.g., between 0.02 and 0.05 micrometers to polish the dummy substrate(s) 158, the backside of the semiconductor substrate 124 of each chip 118 and the encapsulation/gap filling material 138 in the gaps 4*b* and 8*b* until the semiconductor substrate 124 of one of the chips 118 is thinned to the thickness T15 between 1 and 30 micrometers, and preferably between 2 and 5 micrometers, between 2 and 10 micrometers, between 2 and 20 micrometers, or between 3 and 30 micrometers, as shown in FIG. 61**.

After the chemical-mechanical-polishing (CMP) process, the polished surface **124*s* of the semiconductor substrate 124, at the backside of each chip 118, and the polished surface(s) 158*s* of the dummy substrate(s) 158 can be substantially flat and not covered by the encapsulation/gap filling material 138. The polished surface(s) 158*s* may be substantially coplanar with the polished surface 124*s* of each chip 118 and with the polished surface 138*s* of the encapsulation/gap filling material 138 in the gaps 4*b* and 8*b*. The polished surfaces 124*s*, 158*s* and 138*s* have a micro-roughness, e.g., less than 20 nanometers. The chemical-mechanical-polishing (CMP) process, using a very fine abrasive like silica and a relatively weak chemical attack, will create the surfaces 124*s*, 158*s* and 138*s* almost without deformation and scratches, and this means that the chemical-mechanical-polishing (CMP) process is very well suited for the final polishing step, creating the clean surfaces 124*s*, 158*s* and 138*s*. Using the mechanical grinding process and the chemical-mechanical-polishing (CMP) process can be performed to create a very thin semiconductor substrate 124 of each chip 118. Accordingly, after the chemical-mechanical-polishing (CMP) process, each of the chips 118 can be thinned to a thickness, e.g., between 3 and 35 micrometers, and preferably between 5 and 10 micrometers or between 5 and 25 micrometers, the dummy substrate(s) 158 can be thinned to the thickness T16, e.g., between 3 and 35 micrometers, and preferably between 5 and 10 micrometers or between 5 and 25 micrometers, and the encapsulation/gap filling material 138 in the gaps 4*b* and 8*b* can be thinned to the thickness T17**, e.g., between 3 and 35 micrometers, and preferably between 5 and 10 micrometers or between 5 and 25 micrometers.

Figure 64:
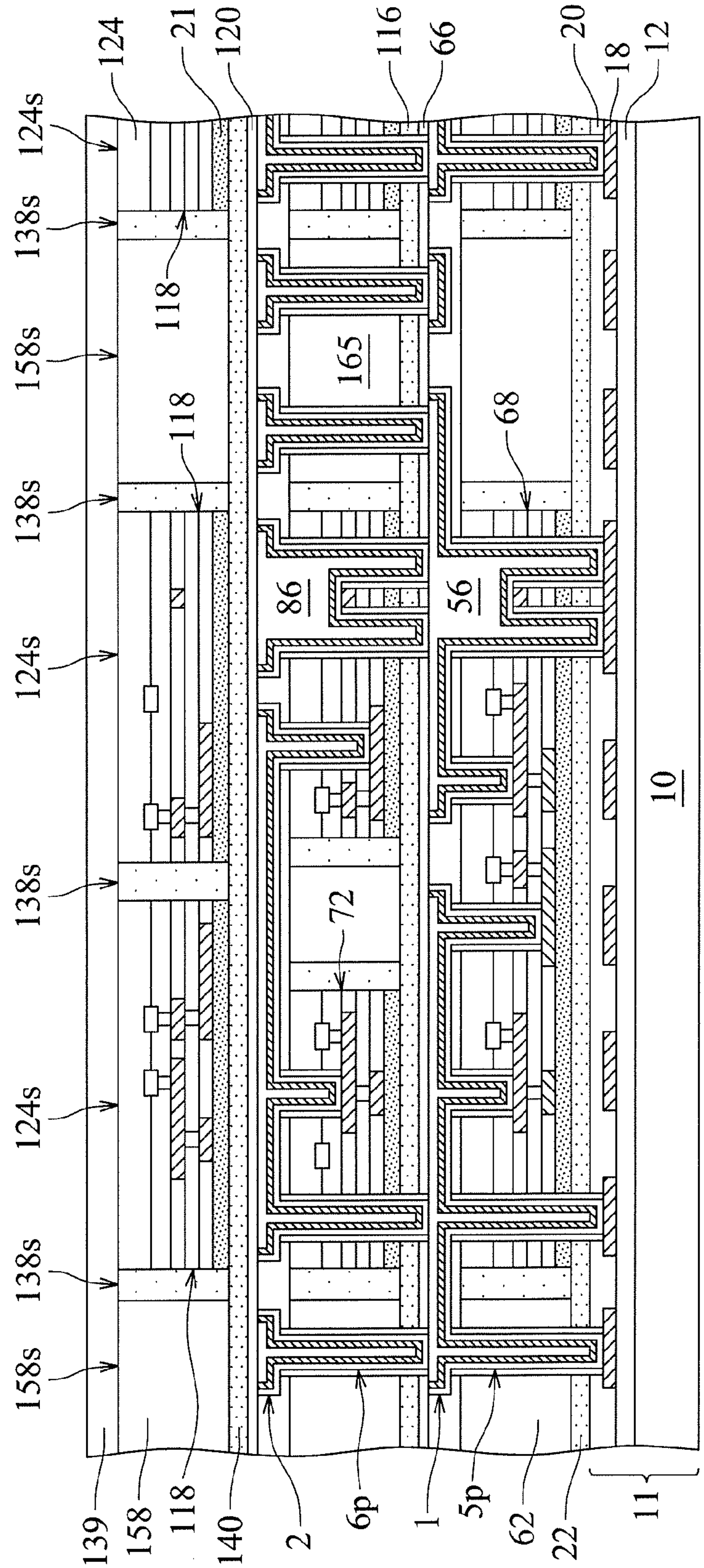

Referring to FIG. 64, after forming the structure illustrated in FIG. 61, a dielectric layer 139 is formed on the surfaces **124*s*, 158*s* and 138*s*. The dielectric layer 139** may have a thickness, e.g., between 0.5 and 30 micrometers, and preferably between 1 and 20 micrometers, between 1 and 10 micrometers, between 1 and 5 micrometers, or between 1 and 3 micrometers.

The dielectric layer 139, for example, can be an inorganic layer formed by, e.g., a chemical vapor deposition (CVD) process or a plasma-enhanced chemical vapor deposition (PECVD) process. The inorganic layer can be, e.g., a layer of silicon oxide (such as $SiO_2$), silicon nitride (such as $Si_3N_4$), silicon carbon nitride (such as SiCN), silicon oxynitride (such as SiON), or silicon oxycarbide (such as SiOC), or a layer including silicon oxide, silicon nitride, silicon carbon nitride and silicon oxynitride. The inorganic layer may have a thickness, e.g., between 0.5 and 30 micrometers, and preferably between 1 and 20 micrometers, between 1 and 10 micrometers, between 1 and 5 micrometers, or between 1 and 3 micrometers.

Alternatively, the dielectric layer 139 can be a polymer layer, such as a layer of polyimide, epoxy, benzocyclobutane (BCB), polybenzoxazole (PBO), or poly-phenylene oxide (PPO), formed by, e.g., a process including a spin coating process, a dispensing process, a molding process, or a screen printing process. The polymer layer may have a thickness, e.g., between 0.5 and 30 micrometers, and preferably between 1 and 20 micrometers, between 1 and 10 micrometers, between 1 and 5 micrometers, or between 1 and 3 micrometers.

Alternatively, the dielectric layer 139 can be composed of multiple inorganic layers which include an etch stop layer, such as etch stop layer of silicon oxynitride. The etch stop layer will later be used to stop etching when etching patterns into the dielectric layer 139. In this case, the dielectric layer 139, for example, can be composed of a first silicon-oxide layer on the surfaces 124*s*, 158*s* and 138*s*, a silicon-oxynitride layer, used as the etch stop layer, on the first silicon-oxide layer, and a second silicon-oxide layer having a thickness, e.g., between 0.1 and 5 micrometers or between 0.3 and 1.5 micrometers on the silicon-oxynitride layer.

Figure 65:
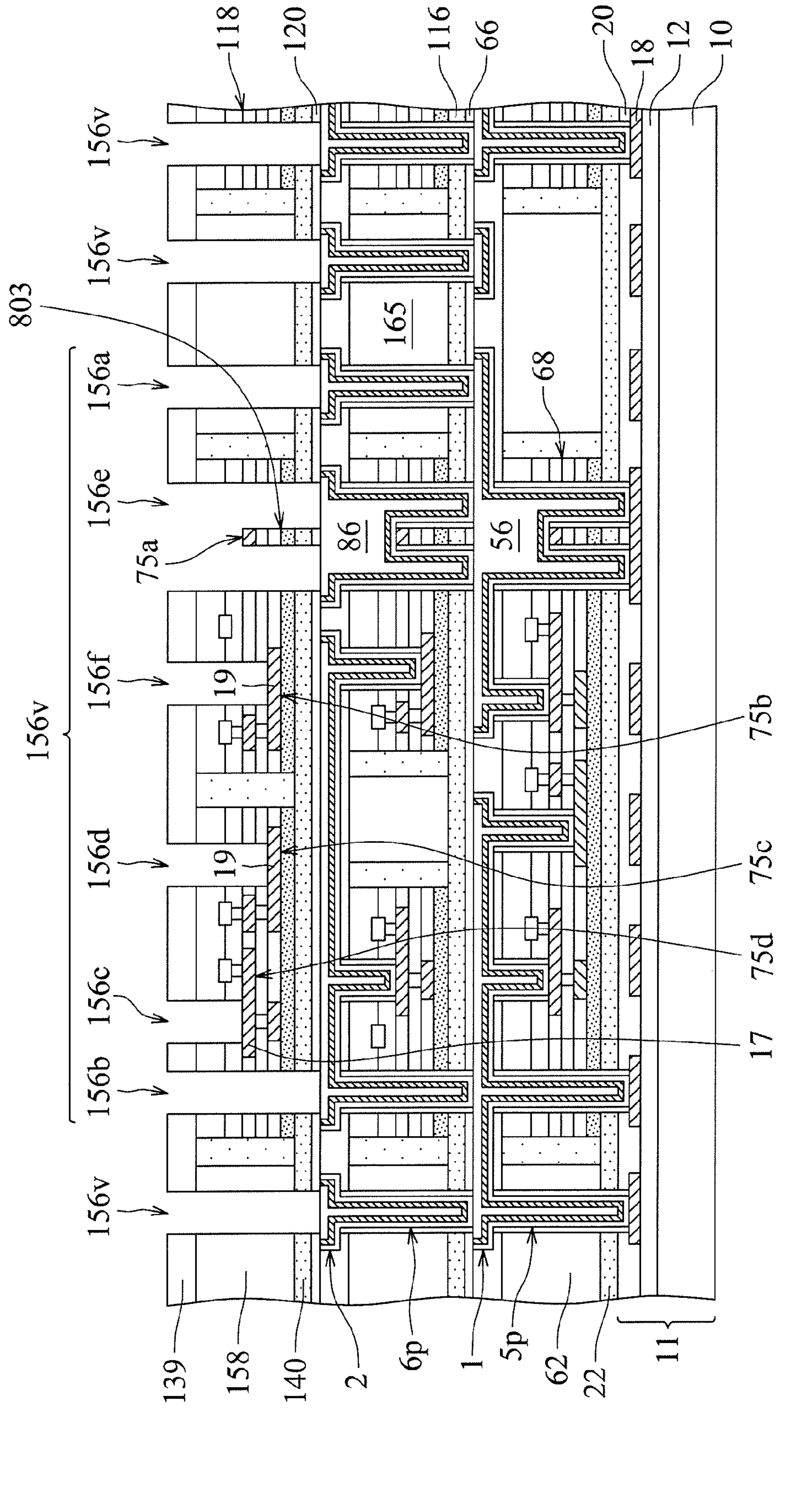

Next, referring to FIG. 65, multiple through vias 156*v*, including through vias 156*a*, 156*b*, 156*c*, 156*d*, 156*e* and 156*f*, are formed in the chips 118 and in the dummy substrate(s) 158, exposing the conduction layer 86 of the metal interconnects 2 and exposing the layers 17 and 19 of the chips 118, by the following steps. First, a photoresist layer, such as positive-type photo-sensitive resist layer or negative-type photo-sensitive resist layer, is formed on the dielectric layer 139 by using a suitable process, such as spin coating process or lamination process. Next, a photo exposure process using a 1X stepper and a development process using a chemical solution can be employed to form multiple openings, exposing the dielectric layer 139, in the photoresist layer. The photoresist layer may have a thickness, e.g., between 3 and 50 micrometers. Next, the dielectric layer 139 under the openings in the photoresist layer is removed by using a suitable process, such as anisotropic plasma etching process. Next, the dummy substrate(s) 158 under the openings in the photoresist layer and the chips 118 under the openings in the photoresist layer are etched away until predetermined regions of the layers 17 and 19 in the chips 118 and predetermined regions of the conduction layer 86 of the metal interconnects 2 are exposed by the openings in the photoresist layer. Next, the photoresist layer is removed by using, e.g., an organic chemical. Accordingly, the through vias 156*v*, including the vias 156*a*-156*f*, are formed in the chips 118 and in the dummy substrate(s) 158, exposing the predetermined regions of the conduction layer 86 of the metal interconnects 2 and exposing the predetermined regions of the layers 17 and 19 of the chips 118. The through via 156*a* is formed in the dummy substrate 158, the through vias 156*b*, 156*c* and 156*d* are formed in one of the chips 118, and the through vias 156*e* and 156*f* are formed in another one of the chips 118.

Alternatively, another technique to form the through vias 156*v* in the chips 118 and in the dummy substrate(s) 158 can be performed by the following steps. First, a photoresist layer, such as positive-type photo-sensitive resist layer or negative-type photo-sensitive resist layer, can be formed on the dielectric layer 139 by using, e.g., a spin coating process or a lamination process. Next, a photo exposure process using a 1X stepper and a development process using a chemical solution can be employed to form multiple openings, exposing the dielectric layer 139, in the photoresist layer. Next, multiple openings are formed in the dielectric layer 139 and under the openings in the photoresist layer, exposing the dummy substrate(s) 158 and the semiconductor substrates 124 of the chips 118, by removing the dielectric layer 139 under the openings in the photoresist layer using, e.g., an anisotropic plasma etching process. Next, the photoresist layer is removed by using, e.g., an organic chemical. Next, the dummy substrate(s) 158 under the openings in the dielectric layer 139 and the chips 118 under the openings in the dielectric layer 139 can be etched away until the predetermined regions of the layers 17 and 19 in the chips 118 and the predetermined regions of the conduction layer 86 of the metal interconnects 2 are exposed by the openings in the dielectric layer 139. Accordingly, the through vias 156*v*, including the through vias 156*a*, 156*b*, 156*c*, 156*d*, 156*e* and 156*f*, can be formed in the chips 118 and in the dummy substrate(s) 158, exposing the conduction layer 86 of the metal interconnects 2 and exposing the layers 17 and 19 of the chips 118. The through via 156*a* is formed in the dummy substrate 158, the through vias 156*b*, 156*c* and 156*d* are formed in one of the chips 118, and the through vias 156*e* and 156*f* are formed in another one of the chips 118. Each of the through vias 156*v*, such as the through via 156*a*, 156*b*, 156*c*, 156*d*, 156*e*, or 156*f*, may have a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers.

Figure 66:
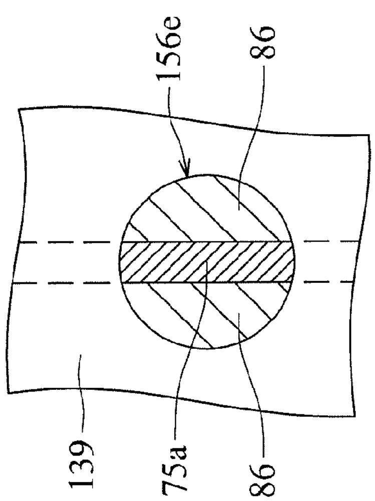
Figure 67:
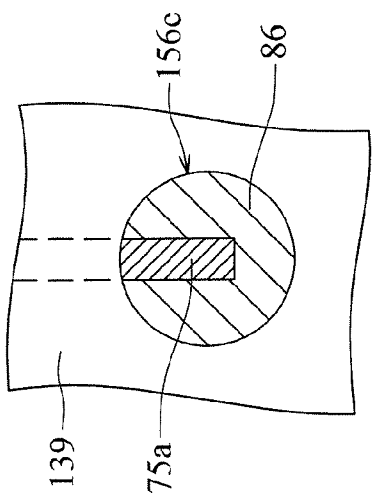
Figure 68:
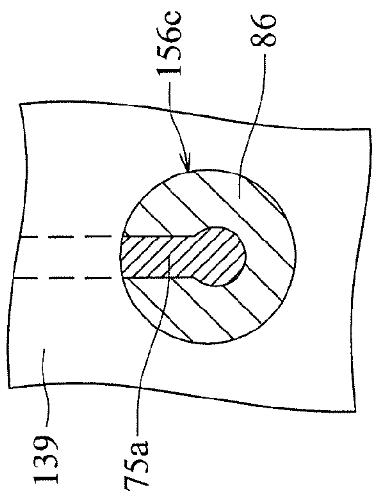

One of the through vias 156*v*, such as the through via 156*a*, passes through the dielectric layer 139, the dummy substrate 158, the layer 140, and the insulating or dielectric layer 120, exposing the conduction layer 86 of one of the metal interconnects 2. Another one of the through vias 156*v*, such as the through via 156*b*, passes through the dielectric layer 139, through the semiconductor substrate 124, dielectric layers 78, 28, 38 and 40, and passivation layer 21 of one of the chips 118, through the layer 140, and through the insulating or dielectric layer 120, exposing the conduction layer 86 of one of the metal interconnects 2. Another one of the through vias 156*v*, such as the through via 156*c*, passes through the dielectric layer 139 and through the semiconductor substrate 124 and dielectric layer 40 of one of the chips 118, exposing the interconnect or metal trace 75*d* in the interconnection layer 17 of the one of the chips 118. Another one of the through vias 156*v*, such as the through via 156*d*, passes through the dielectric layer 139 and through the semiconductor substrate 124 and dielectric layers 40, 38 and 28 of one of the chips 118, exposing the interconnect or metal trace 75*c* in the patterned metal layer 19 of the one of the chips 118. Another one of the through vias 156*v*, such as the through via 156*f*, passes through the dielectric layer 139 and through the semiconductor substrate 124 and dielectric layers 40, 38 and 28 of one of the chips 118, exposing the interconnect or metal trace 75*b* in the patterned metal layer 19 of the one of the chips 118. Another one of the through vias 156*v*, such as the through via 156*e*, passes through the dielectric layer 139, through the semiconductor substrate 124, dielectric layers 78, 28, 38 and 40, and passivation layer 21 of one of the chips 118, through the layer 140, and through the insulating or dielectric layer 120, exposing the interconnect or metal trace 75*a* in the interconnection layer 17 of the one of the chips 118 and exposing the conduction layer 86 of one of the metal interconnects 2. A supporter 803 provided by the layers 120, 140, 21, 78 and 28 is between the conduction layer 86 of the metal interconnect 2*b* and the interconnect or metal trace 75*a* in the interconnection layer 17 exposed by the through via 156*e* for the purpose of supporting the exposed interconnect or metal trace 75*a*. The supporter 803 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers. FIGS. 66-68 are three examples of schematic top perspective views showing the through via 156*e* and the interconnect or metal trace 75*a* illustrated in FIG. 65.

As shown in FIGS. 65 and 66, the through via 156*e* in one of the chips 118 exposes the interconnect or metal trace 75*a* in the one of the chips 118 and exposes two regions of the conduction layer 86 of the metal interconnect 2*b* that is under the one of the chips 118. The interconnect or metal trace 75*a* has a line-shaped region, exposed by the through via 156*e*, extending in a horizontal direction from a side of the through via 156*e* to the opposite side of the through via 156*e* through a center of the through via 156*e*. The previously described supporter 803, between the conduction layer 86 of the metal interconnect 2*b* and the exposed line-shaped region of the interconnect or metal trace 75*a* in the interconnection layer 17, can be line-shaped, like the exposed line-shaped region of the interconnect or metal trace 75*a*. Preferably, the through via 156*e* can be, but is not limited to, a circular shape from a top perspective view.

As shown in FIGS. 65 and 67, the through via 156*e* in one of the chips 118 exposes the interconnect or metal trace 75*a* in the one of the chips 118 and exposes a region of the conduction layer 86 of the metal interconnect 2*b* that is under the one of the chips 118. The interconnect or metal trace 75*a* has a peninsula region, exposed by the through via 156*e*, extending in a horizontal direction from one side of the through via 156*e* at least to a center of the through via 156*e*, but does not reach to the opposite side of the through via 156*e*; the interconnect or metal trace 75*a* has an end exposed by the through via 156*e*. The previously described supporter 803, between the conduction layer 86 of the metal interconnect 2*b* and the exposed peninsula region of the interconnect or metal trace 75*a* in the interconnection layer 17, can be peninsula-shaped, like the exposed peninsula region of the interconnect or metal trace 75*a*. Preferably, the through via 156*e* can be, but is not limited to, a circular shape from a top perspective view.

As shown in FIGS. 65 and 68, the through via 156*e* in one of the chips 118 exposes the interconnect or metal trace 75*a* in the one of the chips 118 and exposes a region of the conduction layer 86 of the metal interconnect 2*b* that is under the one of the chips 118. The interconnect or metal trace 75*a* has a peninsula region, exposed by the through via 156*e*, extending in a horizontal direction from one side of the through via 156*e* at least to a center of the through via 156*e*, but does not reach to the opposite side of the through via 156*e*; the interconnect or metal trace 75*a* has a circular end exposed by the through via 156*e*. The previously described supporter 803, between the conduction layer 86 of the metal interconnect 2*b* and the exposed peninsula region of the interconnect or metal trace 75*a* in the interconnection layer 17, can be peninsula-shaped, like the exposed peninsula region of the interconnect or metal trace 75*a*. Preferably, the through via 156*e* can be, but is not limited to, a circular shape from a top perspective view.

Figure 66A:
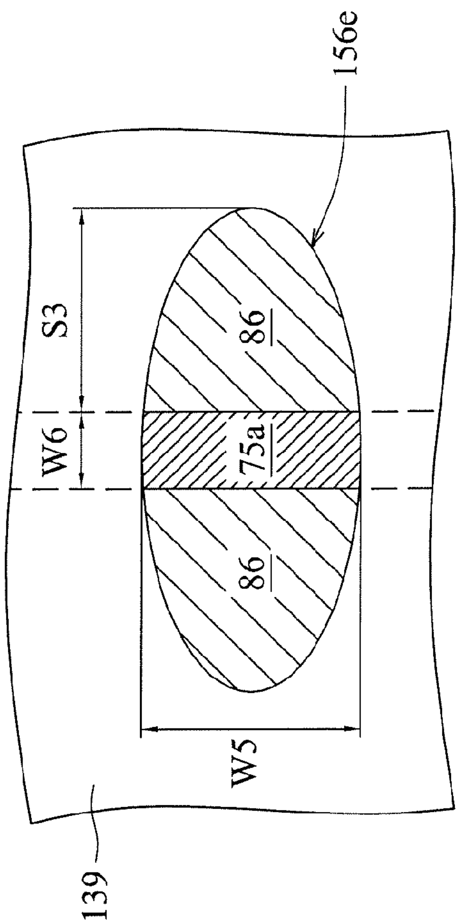

FIG. 66A is an example of a schematic top perspective view showing the through via 156*e* and the interconnect or metal trace 75*a* illustrated in FIG. 65. In this case, the through via 156*e* can be, but is not limited to, oval-shaped and has a width W5, e.g., between 1 and 30 micrometers, and preferably between 1 and 20 micrometers, between 1 and 10 micrometers, between 1 and 5 micrometers, or between 3 and 10 micrometers. The oval-shaped through via 156*e* in one of the chips 118 exposes the interconnect or metal trace 75*a* in the one of the chips 118 and exposes two regions of the conduction layer 86 of the metal interconnect 2*b* that is under the one of the chips 118. The interconnect or metal trace 75*a* has a line-shaped region, exposed by the oval-shaped through via 156*e*, extending in a horizontal direction from a side of the oval-shaped through via 156*e* to the opposite side of the oval-shaped through via 156*e* through a center of the oval-shaped through via 156*e*. The previously described supporter 803, between the conduction layer 86 of the metal interconnect 2*b* and the exposed line-shaped region of the interconnect or metal trace 75*a* in the interconnection layer 17, can be line-shaped, like the exposed line-shaped region of the interconnect or metal trace 75*a*. The interconnect or metal trace 75*a* exposed by the oval-shaped through via 156*e* has a width W6, e.g., between 0.3 and 30 micrometers, and preferably between 0.3 and 20 micrometers, between 0.3 and 10 micrometers, between 0.3 and 5 micrometers, or between 0.3 and 1 micrometers. A horizontal distance S3 between an endpoint of the long axis of the oval-shaped through via 156*e* and an edge, which is closer to the endpoint than the other opposite edge, of the interconnect or metal trace 75*a* exposed by the oval-shaped through via 156*e* can be, e.g., between 1 and 30 micrometers, and preferably between 1 and 20 micrometers, between 1 and 10 micrometers, between 1 and 5 micrometers, or between 3 and 10 micrometers.

Figure 69:
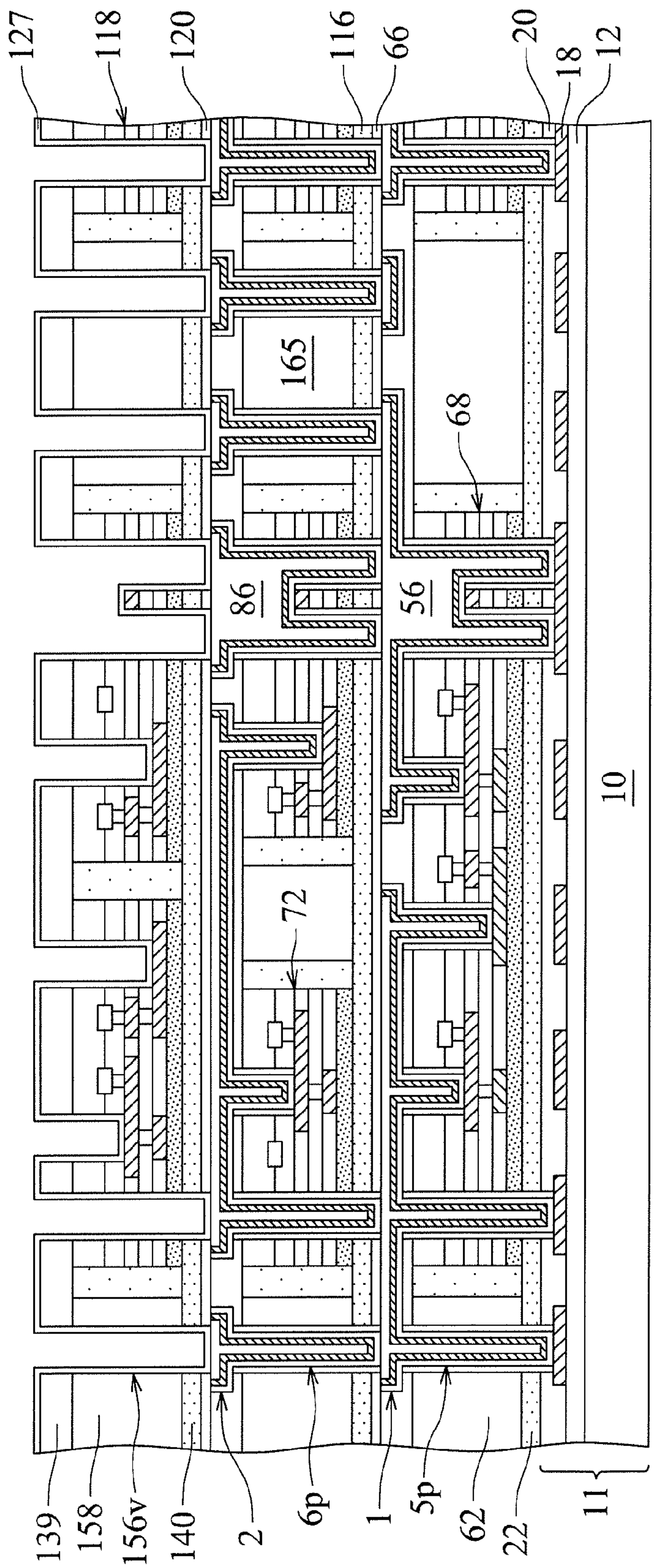

Next, referring to FIG. 69, a dielectric layer 127 can be formed on a top surface of the dielectric layer 139, on the conduction layer 86, exposed by the through vias 156*v* (such as the through vias 156*a*, 156*b* and 156*e*), of the metal interconnects 2, on the layers 17 and 19, exposed by the through vias 156*v* (such as the through vias 156*c*, 156*d*, 156*e* and 156*f*), of the chips 118, and on sidewalls of the through vias 156*v*.

The dielectric layer 127 can be composed of an insulating material. For example, the dielectric layer 127 can be an inorganic layer having a thickness, e.g., between 20 nanometers and 1 micrometer, and the inorganic layer can be a layer of silicon oxide (such as $SiO_2$), silicon nitride (such as $Si_3N_4$), silicon carbon nitride (such as SiCN), silicon oxynitride (such as SiON), or silicon oxycarbide (such as SiOC). Alternatively, the dielectric layer 127 can be a polymer layer having a thickness, e.g., between 1 and 10 micrometers, and preferably between 1 and 5 micrometers, and the polymer layer can be a layer of polyimide, benzocyclobutene (BCB), epoxy, poly-phenylene oxide (PPO), or polybenzoxazole (PBO).

Figure 70:
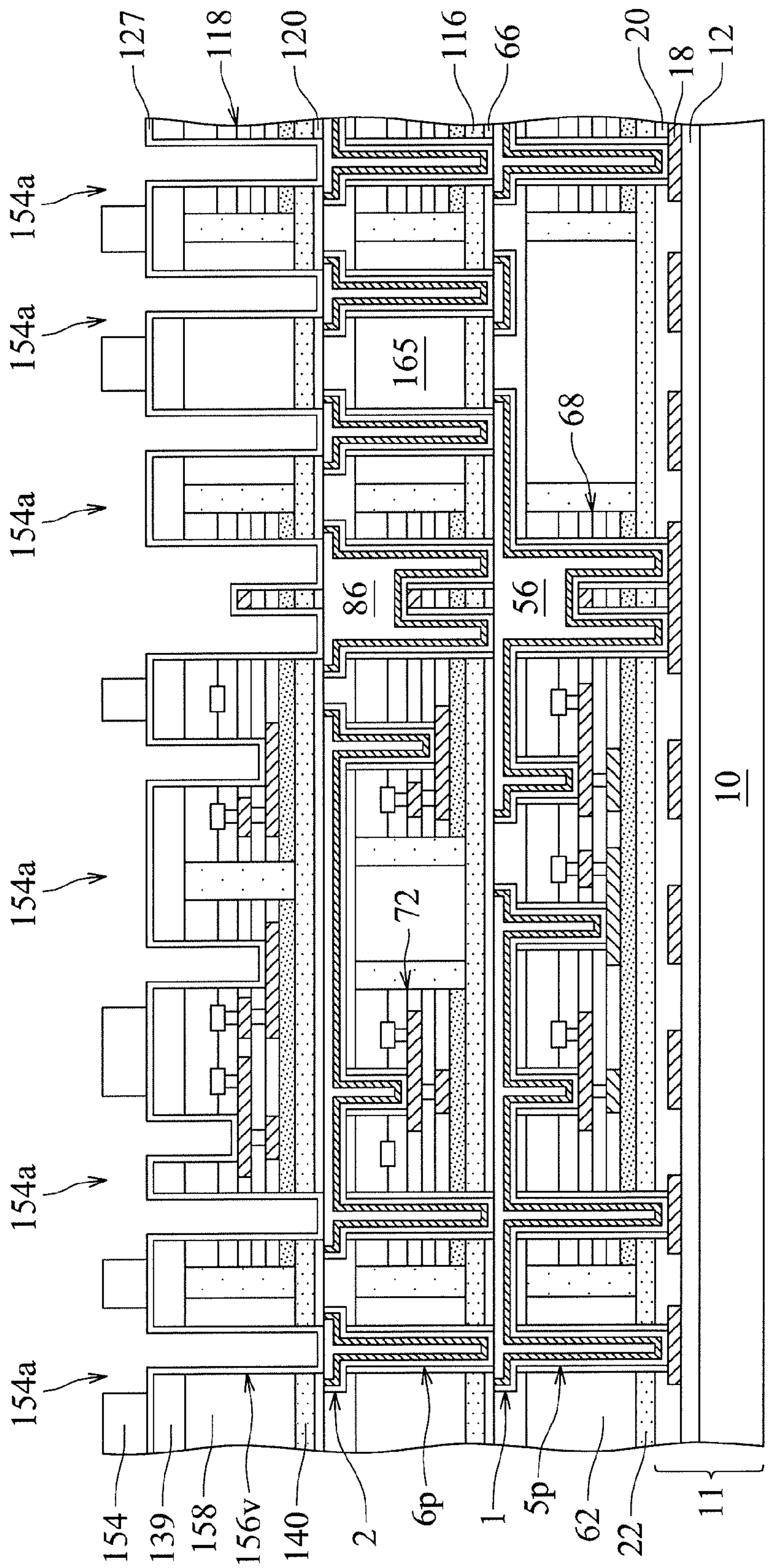

Next, referring to FIG. 70, a photoresist layer 154, such as positive-type photo-sensitive resist layer or negative-type photo-sensitive resist layer, can be formed on the dielectric layer 127 by using, e.g., a spin coating process or a lamination process, and then a photo exposure process using a 1X stepper and a development process using a wet chemical can be employed to form multiple openings 154*a*, exposing the dielectric layer 127, in the photoresist layer 154. The photoresist layer 154 may have a thickness, e.g., between 0.5 and 30 micrometers.

Figure 71:
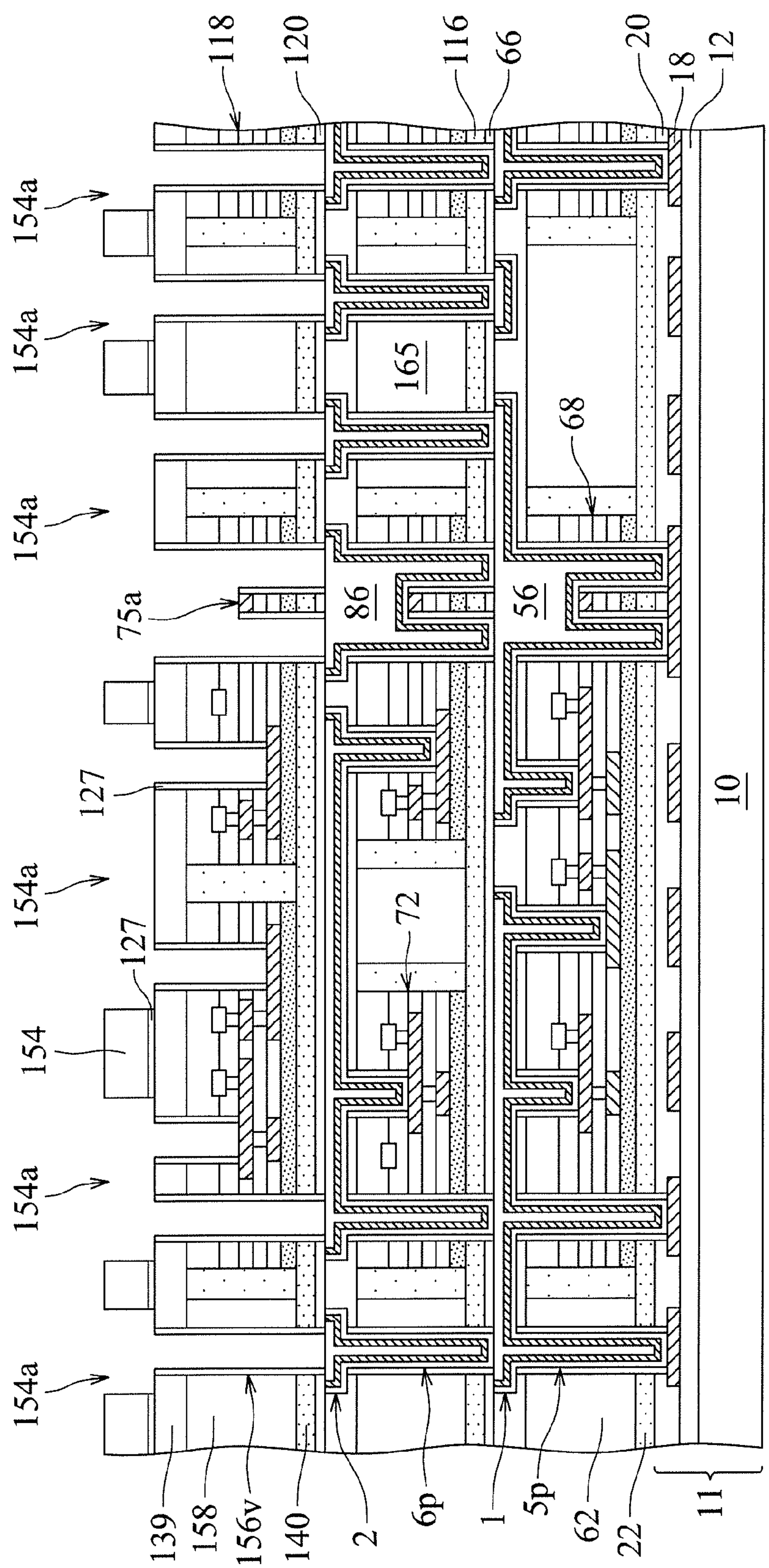

Next, referring to FIG. 71, the dielectric layer 127 formed on the layers 17, 19 and 86 and on the top surface of the dielectric layer 139 under the openings 154*a* can be removed by, e.g., etching the dielectric layer 127 under the openings 154*a* using an anisotropic plasma etching process. The dielectric layer 127 at bottoms of the through vias 156*v*, on the top surface of the dielectric layer 139 under the openings 154*a*, and on a top surface of the interconnect or metal trace 75*a* over the supporter 803 can be etched away. Accordingly, the layers 17, 19 and 86 at the bottoms of the through vias 156*v*, the top surface of the dielectric layer 139 under of the openings 154*a*, and the interconnect or metal trace 75*a* over the supporter 803 are exposed by the openings 154*a*, and the dielectric layer 127 remains on the sidewalls of the through vias 156*v*, so called as sidewall dielectric layers in the through vias 156*v*. The sidewall dielectric layers 127 are formed on the sidewalls of the through vias 156*v* in the chips 118 or in the dummy substrate(s) 158 and are enclosed by the semiconductor substrates 124 of the chips 118 or by the dummy substrate(s) 158.

Figure 72:
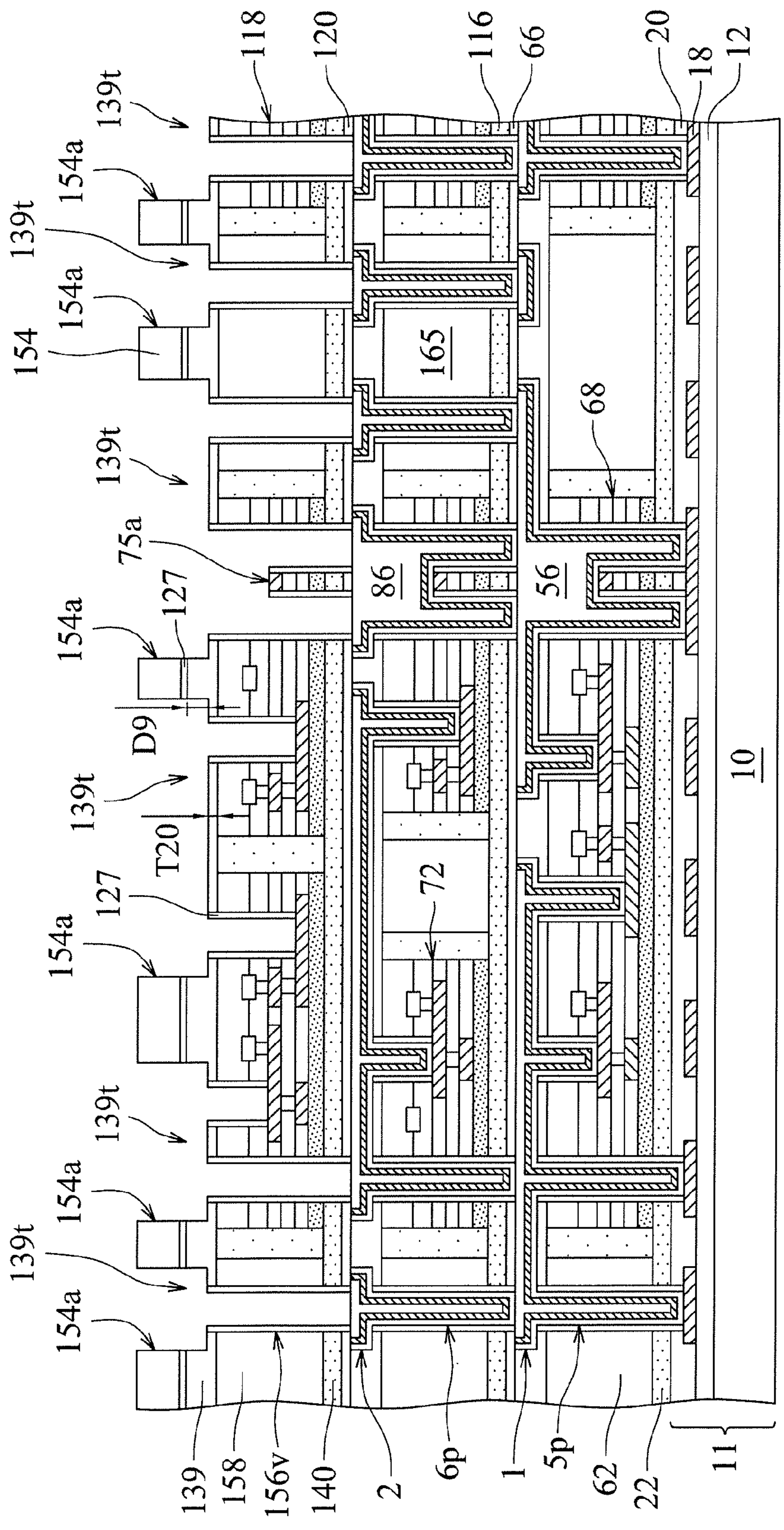

Next, referring to FIG. 72, multiple trenches 139*t*, damascene openings, can be formed in the dielectric layer 139 by etching the dielectric layer 139 and the sidewall dielectric layers 127 under the openings 154*a* to a depth D9, e.g., between 0.1 and 5 micrometers, and preferably between 0.5 and 3 micrometers, using, e.g., an anisotropic plasma etching process. Preferably, the dielectric layer 139 and the sidewall dielectric layers 127 have a same material, such as silicon nitride, silicon oxide, or silicon oxynitride. After the etching process, the dielectric layer 139 under the trenches 139*t* has a remaining thickness T20, e.g., between 0.1 and 5 micrometers, and preferably between 0.3 and 5 micrometers, between 0.5 and 2 micrometers, between 0.1 and 3 micrometers, or between 0.2 and 1.5 micrometers.

Alternatively, an etching-stop technique may be applied to the process of forming the trenches 139*t* in the dielectric layer 139. In this case, the dielectric layer 139 is composed of the previously described inorganic layers, e.g., including the first silicon-oxide layer on the surfaces 124*s*, 138*s* and 158*s*, the silicon-oxynitride layer, used as the etch stop layer, on the first silicon-oxide layer, and the second silicon-oxide layer on the silicon-oxynitride layer. The trenches 139*t* can be formed in the dielectric layer 139 by etching the second silicon-oxide layer of the dielectric layer 139 under the openings 154*a* and the sidewall dielectric layers 127 under the openings 154*a* until the silicon-oxynitride layer of the dielectric layer 139 is exposed by the openings 154*a*. Accordingly, the trenches 139*t* are formed in the second silicon-oxide layer of the dielectric layer 139, and the remaining dielectric layer 139, composed of the silicon-oxynitride layer and the first silicon-oxide layer, under the trenches 139*t* has a thickness T20, e.g., between 0.1 and 5 micrometers, and preferably between 0.3 and 5 micrometers, between 0.5 and 2 micrometers, between 0.1 and 3 micrometers, or between 0.2 and 1.5 micrometers.

Figure 73:
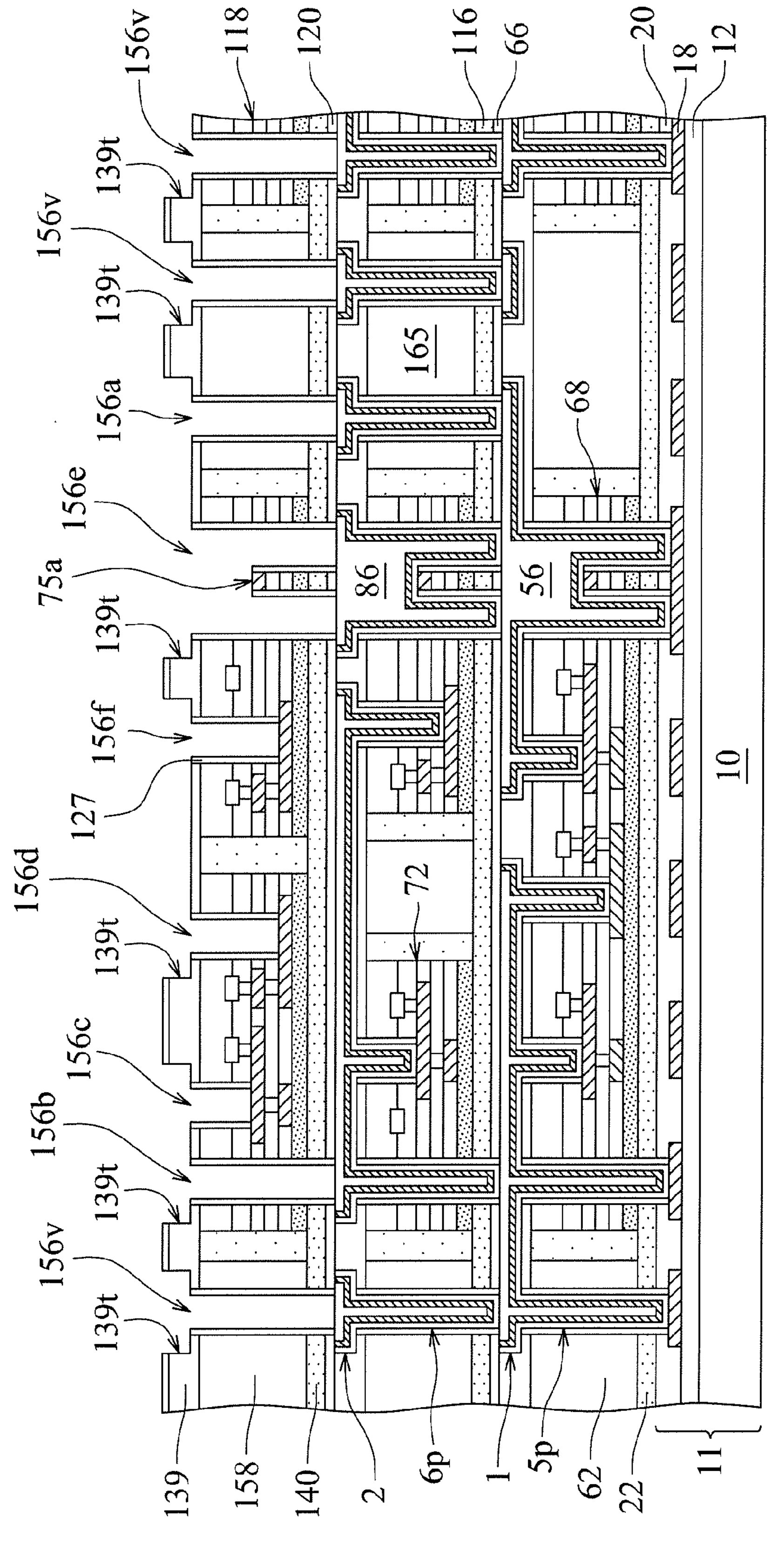
Figure 74:
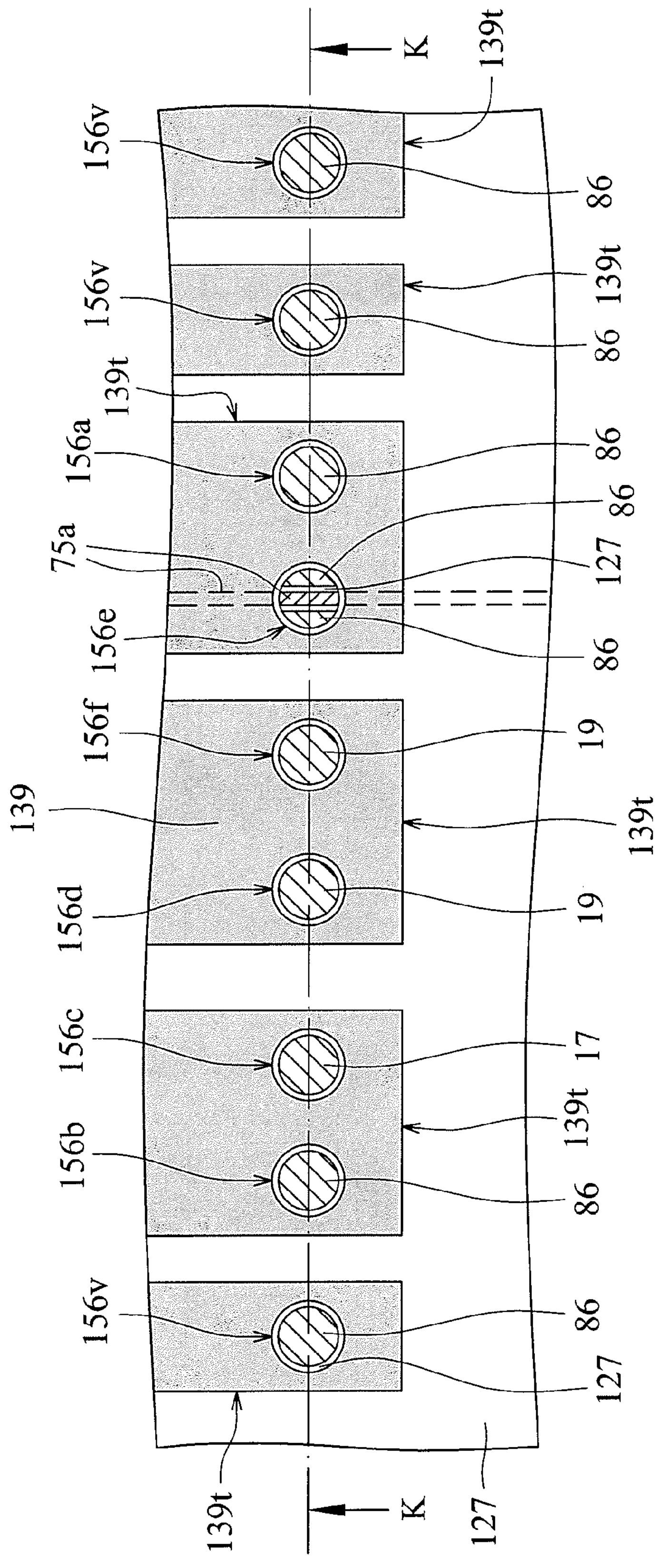

Next, referring to FIG. 73, the photoresist layer 154 is removed by using, e.g., an organic chemical. The trenches 139*t* formed in the dielectric layer 139 are used to provide spaces having inter-chip interconnects and intra-chip interconnects formed therein. The sidewall dielectric layers 127 formed on the sidewalls of the through vias 156*v* (such as the through vias 156*b*, 156*c*, 156*d*, 156*e* and 156*f*) in the chips 118 can prevent transition metals, such as copper, sodium or moisture from penetrating into IC devices of the chips 118. FIG. 74 is a schematic top perspective view showing the through vias 156*v*, the trenches 139*t* and the sidewall dielectric layers 127 illustrated in FIG. 73 according an embodiment of the present invention, and FIG. 73 is a cross-sectional view cut along the line K-K shown in FIG. 74.

Figure 75:
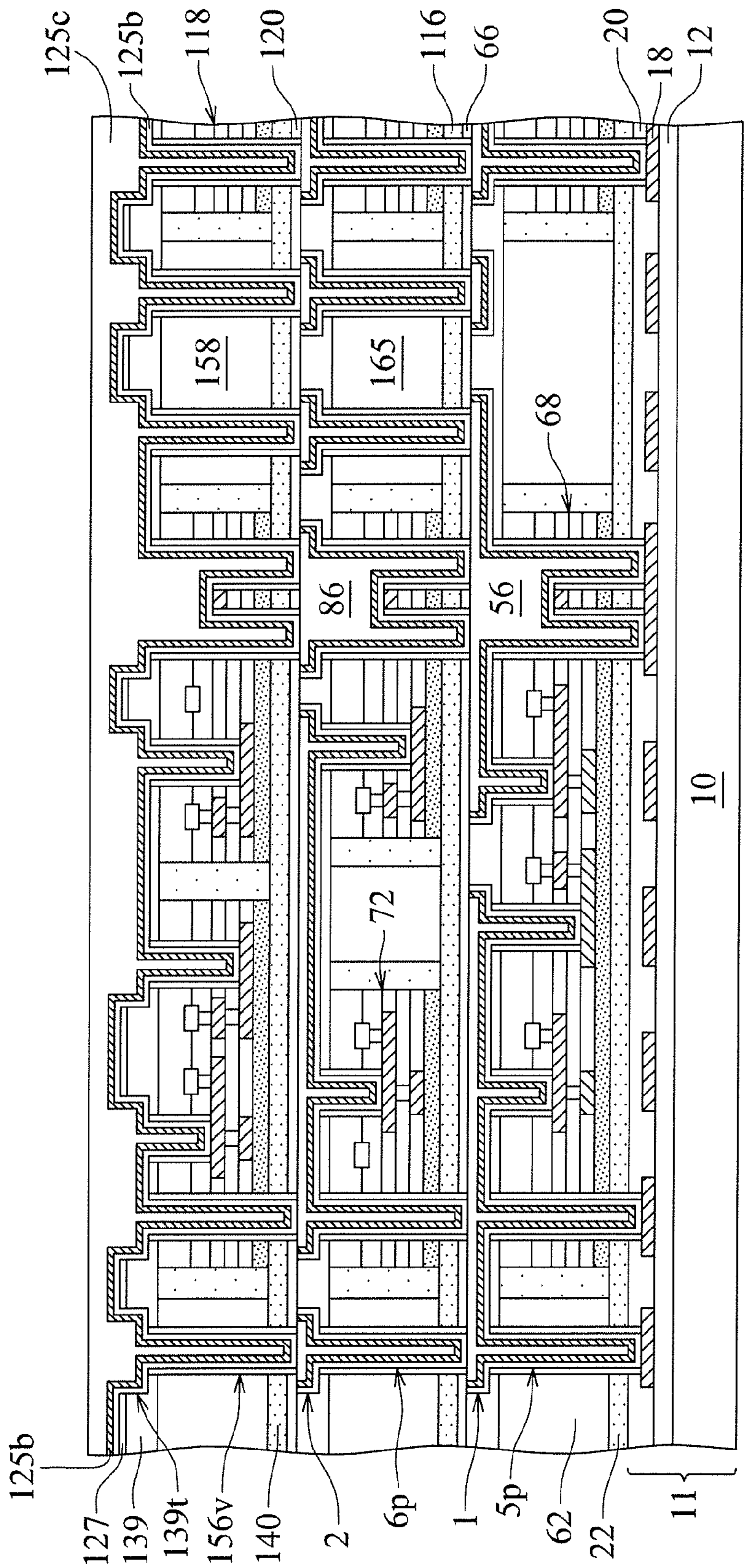

Next, referring to FIG. 75, an adhesion/barrier layer 125*a* having a thickness, e.g., smaller than 1 micrometer, such as between 1 nanometer and 0.5 micrometers, and preferably between 0.1 and 0.2 micrometers, is formed on the layers 17, 19 and 86 exposed by the through vias 156*v*, on sidewalls and bottoms of the trenches 139*t*, on the dielectric layer 127, and on the interconnect or metal trace 75*a* that is on the supporter 803. The adhesion/barrier layer 125*a* can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 125*b* having a thickness, e.g., smaller than 1 micrometer, such as between 10 nanometers and 0.8 micrometers, and preferably between 80 nanometers and 0.15 micrometers, can be formed on the adhesion/barrier layer 125*a* by a physical vapor deposition (PVD) process, such as sputtering process or evaporation process, by a chemical-vapor deposition (CVD) process, or by other thin-film deposition processes, such as atomic layer deposition (ALD). Next, a conduction layer 125*c* having a thickness, e.g., between 0.5 and 20 micrometers or between 0.5 and 10 micrometers, and preferably between 1 and 5 micrometers, can be formed on the seed layer 125*b* by using, e.g., an electroplating process.

The adhesion/barrier layer 125*a* may include or can be a layer of titanium, a titanium-tungsten alloy, titanium nitride, chromium, tantalum, tantalum nitride, nickel, or nickel vanadium having a thickness, e.g., smaller than 1 micrometer, such as between 1 nanometer and 0.5 micrometers, and preferably between 0.1 and 0.2 micrometers. The seed layer 125*b* may include or can be a layer of copper, a titanium-copper alloy, nickel, gold, or silver having a thickness, e.g., smaller than 1 micrometer, such as between 10 nanometers and 0.8 micrometers, and preferably between 80 nanometers and 0.15 micrometers. The conduction layer 125*c* may include or can be an electroplated metal layer of copper, gold, or silver having a thickness, e.g., between 0.5 and 20 micrometers or between 0.5 and 10 micrometers, and preferably between 1 and 5 micrometers.

Figure 76:
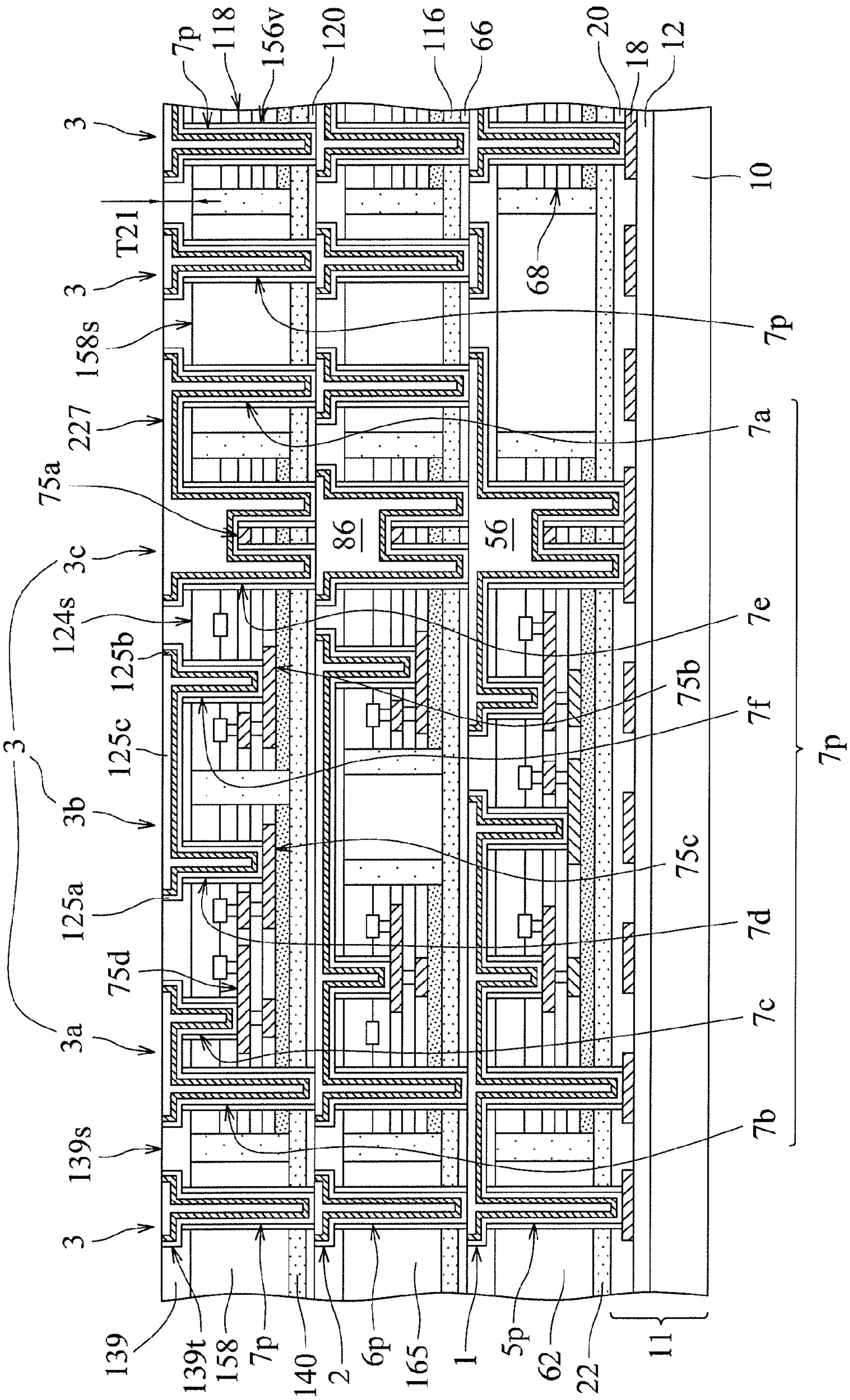

Next, referring to FIG. 76, by using a grinding or polishing process, such as chemical-mechanical-polishing (CMP) process, mechanical polishing process, mechanical grinding process, or a process including mechanical polishing and chemical etching, the layers 125*a*, 125*b* and 125*c* outside the trenches 139*t* can be removed, and the dielectric layer 127 on the top surface of the dielectric layer 139 can be removed. Accordingly, the dielectric layer 139 has an exposed top surface 139*s* that can be substantially coplanar with the ground or polished surface 227 of the conduction layer 125*c* in the trenches 139*t*, and the surfaces 139*s* and 227 can be substantially flat. The dielectric layer 139 has a thickness T21, between the exposed top surface 139*s* and the surface 124*s* or 158*s*, e.g., between 1 and 10 micrometers, and preferably between 1 and 3 micrometers or between 2 and 5 micrometers. The adhesion/barrier layer 125*a* and the seed layer 125*b* are at sidewalls and a bottom of the conduction layer 125*c* in the trenches 139*t*, and the sidewalls and the bottom of the conduction layer 125*c* in the trenches 139*t* are covered by the adhesion/barrier layer 125*a* and the seed layer 125*b*.

In a first alternative, after the steps of removing the layers 125*a*, 125*b* and 125*c* outside the trenches 139*t* and removing the dielectric layer 127 on the top surface of the dielectric layer 139, the adhesion/barrier layer 125*a* can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 139*t*, on the layers 17, 19 and 86 at the bottoms of the through vias 156*v*, on the sidewall dielectric layers 127, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer. The conduction layer 125*c* can be an electroplated copper layer on the single layer of copper or a titanium-copper alloy, in the trenches 139*t*, and in the through vias 156*v*. The electroplated copper layer in the trenches 139*t* may have a thickness, e.g., between 0.1 and 5 micrometers, and preferably between 0.5 and 3 micrometers.

In a second alternative, after the steps of removing the layers 125*a*, 125*b* and 125*c* outside the trenches 139*t* and removing the dielectric layer 127 on the top surface of the dielectric layer 139, the adhesion/barrier layer 125*a* can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 139*t*, on the layers 17, 19 and 86 at the bottoms of the through vias 156*v*, on the sidewall dielectric layers 127, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer. The conduction layer 125*c* can be an electroplated copper layer on the single layer of copper or a titanium-copper alloy, in the trenches 139*t*, and in the through vias 156*v*. The electroplated copper layer in the trenches 139*t* may have a thickness, e.g., between 0.1 and 5 micrometers, and preferably between 0.5 and 3 micrometers.

In a third alternative, after the steps of removing the layers 125*a*, 125*b* and 125*c* outside the trenches 139*t* and removing the dielectric layer 127 on the top surface of the dielectric layer 139, the adhesion/barrier layer 125*a* can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 139*t*, on the layers 17, 19 and 86 at the bottoms of the through vias 156*v*, on the sidewall dielectric layers 127, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer. The conduction layer 125*c* can be an electroplated copper layer on the single layer of copper or a titanium-copper alloy, in the trenches 139*t*, and in the through vias 156*v*. The electroplated copper layer in the trenches 139*t* may have a thickness, e.g., between 0.1 and 5 micrometers, and preferably between 0.5 and 3 micrometers.

After the steps of removing the layers 125*a*, 125*b* and 125*c* outside the trenches 139*t* and removing the dielectric layer 127 on the top surface of the dielectric layer 139, the layers 125*a*, 125*b* and 125*c* in the trenches 139*t* compose multiple metal interconnects (or damascene metal traces) 3, including metal interconnects (or damascene metal traces) 3*a*, 3*b* and 3*c*, in the trenches 139*t*. The layers 125*a*, 125*b* and 125*c* in the through vias 156*v* compose multiple metal plugs (or metal vias) 7*p* in the through vias 156*v*, including metal plugs (or metal vias) 7*a*, 7*b*, 7*c*, 7*d*, 7*e* and 7*f* in the through vias 156*a*, 156*b*, 156*c*, 156*d*, 156*e* and 156*f* as shown in FIG. 73, respectively. Each of the metal plugs 7*p* in the chips 118 and in the dummy substrate(s) 158 is enclosed by one of the sidewall dielectric layers 127 in the through vias 156*v*. The metal plug 7*a* is formed in the dummy substrate 158, the metal plugs 7*b*, 7*c* and 7*d* are formed in one of the chips 118, and the metal plugs 7*f* and 7*e* are formed in another one of the chips 118. The supporter 803 and the interconnect or metal trace 75*a*, in the interconnection layer 17, on the supporter 803 can be between two portions, lower than a horizontal level, at which a top surface of the interconnection layer 17 is positioned, of the metal plug 7*e*. These metal plugs 7*p* formed in the chips 118 and in the dummy substrate(s) 158 can connect the metal interconnects 3 and the semiconductor devices 13 in the chips 118 and connect the metal interconnects 2 and 3. The metal interconnects 3, such as 3*a*, 3*b* and 3*c*, in the trenches 139*t* may have a thickness, e.g., between 0.1 and 5 micrometers, and preferably between 1 and 3 micrometers.

One of the metal plugs 7*p*, such as the metal plug 7*a*, can be formed in the dummy substrate 158 and formed on a contact point, at a bottom of one of the through vias 156*v* (such as the through via 156*a*), of the conduction layer 86 of one of the metal interconnects 2. Another one of the metal plugs 7*p*, such as the metal plug 7*b*, can be formed in one of the chips 118 and formed on another contact point, at a bottom of another one of the through vias 156*v* (such as the through via 156*b*), of the conduction layer 86 in another one of the metal interconnects 2, such as the metal interconnect 2*a*. Another one of the metal plugs 7*p*, such as the metal plug 7*c*, can be formed in the one of the chips 118 and formed on a contact point, at a bottom of another one of the through vias 156*v* (such as the through via 156*c*), of the interconnect or metal trace 75*d* in the one of the chips 118. Another one of the metal plugs 7*p*, such as the metal plug 7*d*, can be formed in the one of the chips 118 and formed on a contact point, at a bottom of another one of the through vias 156*v* (such as the through via 156*d*), of the interconnect or metal trace 75*c* in the one of the chips 118. Another one of the metal plugs 7*p*, such as the metal plug 7*f*, can be formed in another one of the chips 118 and formed on a contact point, at a bottom of another one of the through vias 156*v* (such as the through via 156*f*), of the interconnect or metal trace 75*b* in the another one of the chips 118. Another one of the metal plugs 7*p*, such as the metal plug 7*e*, can be formed in the another one of the chips 118, formed on a contact point of the interconnect or metal trace 75*a* over a supporter (such as the supporter 803) that is between two lower left and right portions of the another one of the metal plugs 7*p* (such as the metal plug 7*e*), and formed on another contact point, at a bottom of another one of the through vias 156*v* (such as the through via 156*e*), of the conduction layer 86 in another one of the metal interconnects 2, such as the metal interconnect 2*b*.

The metal interconnect 3*a* can be formed over one or more of the chips 118. The metal interconnect 3*b* can be formed over multiple of the chips 118 and across multiple edges of the multiple of the chips 118. The metal interconnect 3*c* can be formed over one or more of the chips 118 and over the dummy substrate(s) 158.

The metal interconnect 3*a* can be connected to a contact point, at a bottom of the through via 156*b*, of the metal interconnect 2*a* through the metal plug 7*b* in one of the chips 118 and can be connected to a contact point, at a bottom of the through via 156*c*, of the interconnect or metal trace 75*d* in the one of the chips 118 through the metal plug 7*c* in the one of the chips 118. The metal interconnect 3*b* can be connected to a contact point, at a bottom of the through via 156*d*, of the interconnect or metal trace 75*c* in the one of the chips 118 through the metal plug 7*d* in the one of the chips 118 and can be connected to a contact point, at a bottom of the through via 156*f*, of the interconnect or metal trace 75*b* in another one of the chips 118 through the metal plug 7*f* in the another one of the chips 118. The metal interconnect 3*c* can be connected to a contact point, at a bottom of the through via 156*e*, of the metal interconnect 2*b* through the metal plug 7*e* in the another one of the chips 118, can be connected to one or more of the semiconductor devices 13 in the another one of the chips 118 through the metal plug 7*e* and the interconnect or metal trace 75*a* in the another one of the chips 118, and can be connected to a contact point, at a bottom of the through via 156*a*, of another one of the metal interconnects 1 through the metal plug 7*a* in the dummy substrate 158. Accordingly, the contact points at the bottoms of the through vias 156*b* and 156*c* can be connected to each other through the metal interconnect 3*a*, the contact points at the bottoms of the through vias 156*d* and 156*f* can be connected to each other through the metal interconnect 3*b*, and the contact points at the bottoms of the through vias 156*a* and 156*e* can be connected to each other through the metal interconnect 3*c*.

According, one of the semiconductor devices 13 in one of the chips 118 can be connected to another one of the semiconductor devices 13 in the one of the chips 118 or in another one of the chips 118 through one of the metal interconnects 3, such as 3*a* or 3*b*, and can be connected to a contact point, at a bottom of one of the through vias 156*v* (such as the through via 156*a*, 156*b*, or 156*e*), of the conduction layer 86 of one of the metal interconnects 2, such as 2*a* or 2*b*, through the one of the metal interconnects 3. Each of the metal interconnects 3 can be a signal trace, a bit line, a clock bus, a power plane, a power bus, a power trace, a ground plane, a ground bus, or a ground trace.

Alternatively, the element 118 not only can indicate a chip, but also can indicate a wafer. When the element 118 is a wafer, the element 72 can be another wafer. Thereby, the process illustrated in the invention can be employed to the wafer-to-wafer bonding.

Figure 77:
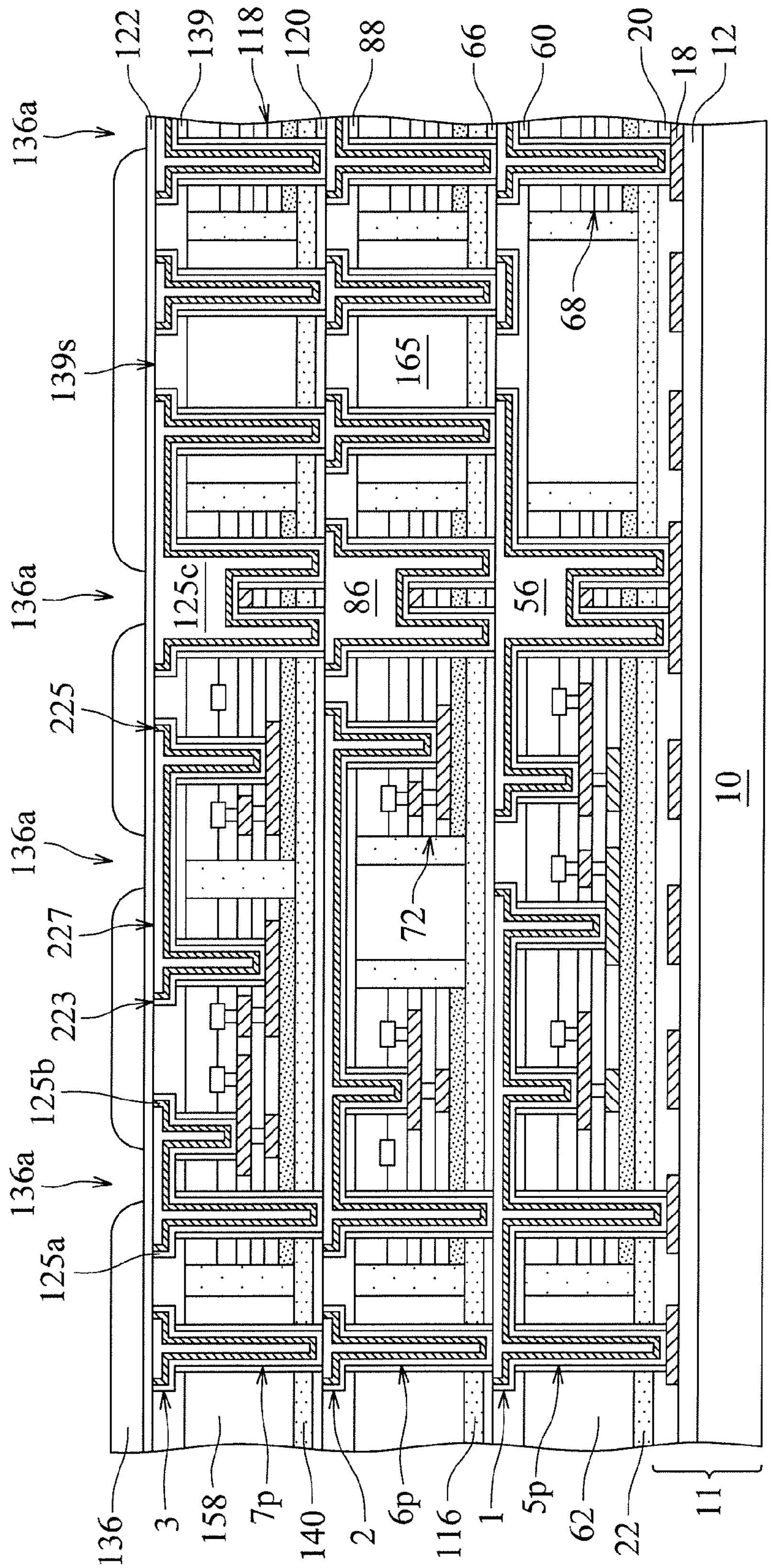

Referring to FIG. 77, after forming the structure illustrated in FIG. 76, an insulating or dielectric layer 122 can be formed on the ground or polished surface 223 of the adhesion/barrier layer 125*a*, on the ground or polished surface 225 of the seed layer 125*b*, on the ground or polished surface 227 of the conduction layer 125*c*, and on the exposed top surface 139*s* of the dielectric layer 139. Next, a polymer layer 136, such as photosensitive polymer layer, can be formed on the insulating or dielectric layer 122 by using, e.g., a spin coating process. Next, a photo exposure process and a chemical development process can be employed to form multiple openings 136*a*, exposing multiple regions of the insulating or dielectric layer 122, in the polymer layer 136. Next, the polymer layer 136 can be cured in a temperature between 180 degrees centigrade and 300 degrees centigrade or between 180 degrees centigrade and 250 degrees centigrade. The polymer layer 136 after being cured may have a thickness, e.g., between 1 and 20 micrometers, and preferably between 2 and 15 micrometers or between 5 and 10 micrometers. The polymer layer 136 can be a polyimide layer, a benzocyclobutene (BCB) layer, a polybenzoxazole (PBO) layer, a poly-phenylene oxide (PPO) layer, an epoxy layer, or a layer of SU-8.

The insulating or dielectric layer 122 may have a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers. The insulating or dielectric layer 122, for example, may include or can be a layer of silicon oxide (such as $SiO_2$), silicon nitride (such as $Si_3N_4$), silicon carbon nitride (such as SiCN), silicon oxynitride (such as SiON), or silicon oxycarbide (such as SiOC) with a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers, formed by a chemical vapor deposition (CVD) process or a plasma-enhanced chemical vapor deposition (PECVD) process. Alternatively, the insulating or dielectric layer 122 may include or can be a polymer layer with a thickness, e.g., between 0.05 and 20 micrometers, and preferably between 0.05 and 5 micrometers, between 0.05 and 3 micrometers, between 0.05 and 1 micrometers, or between 0.05 and 0.5 micrometers, formed by, e.g., a process including a spin coating process and a curing process, and the polymer layer can be a layer of polyimide, benzocyclobutene (BCB), polybenzoxazole (PBO), poly-phenylene oxide (PPO), or epoxy.

Figure 78:
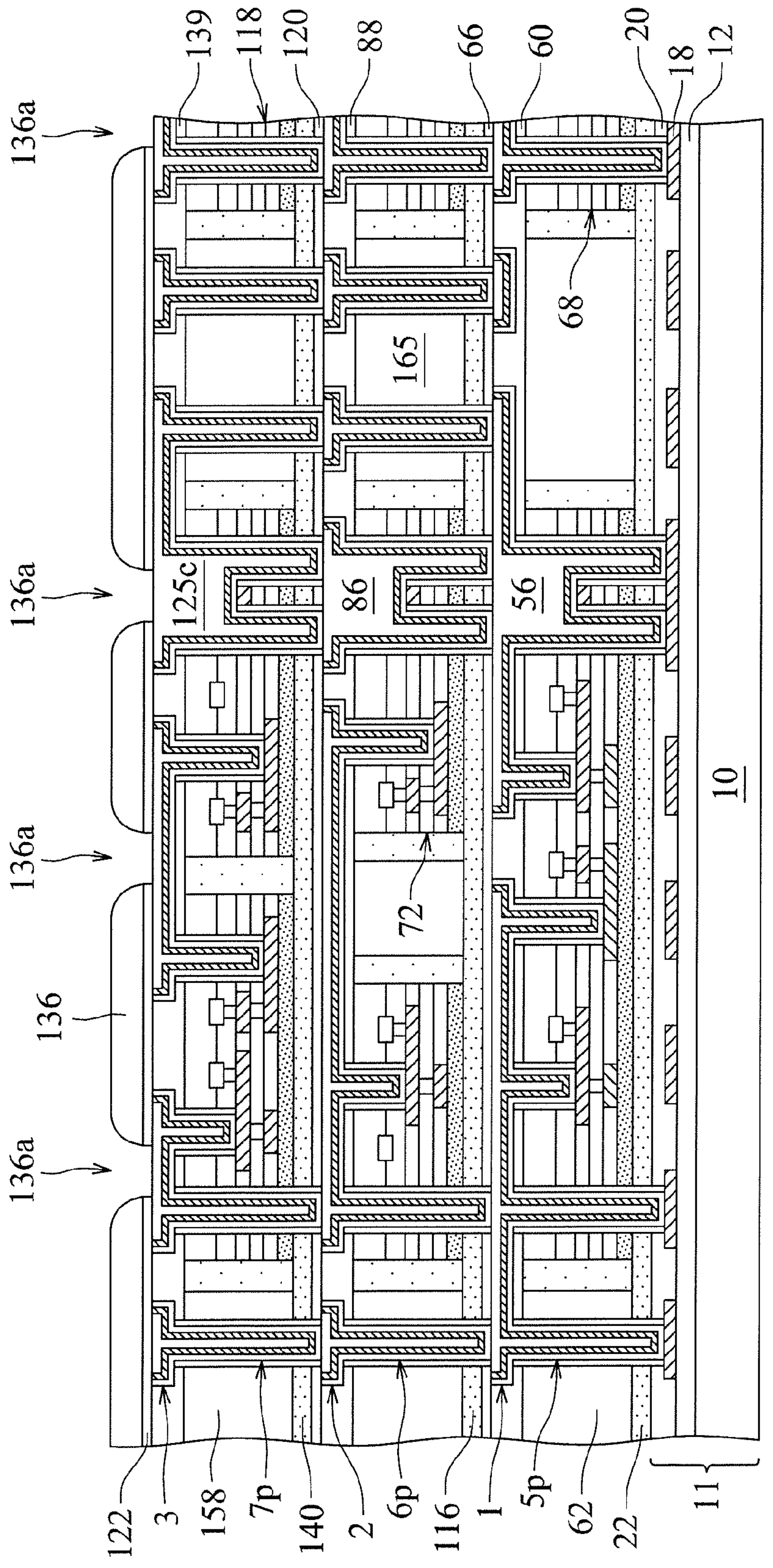

Next, referring to FIG. 78, the insulating or dielectric layer 122 under the openings 136*a* in the polymer layer 136 can be removed by an etching process. Accordingly, multiple openings can be formed in the insulating or dielectric layer 122 and under the openings 136*a* and expose multiple contact points, serving as power pads, ground pads, or signal input/output (I/O) pads, of the conduction layer 125*c* of the metal interconnects 3.

Figure 79:
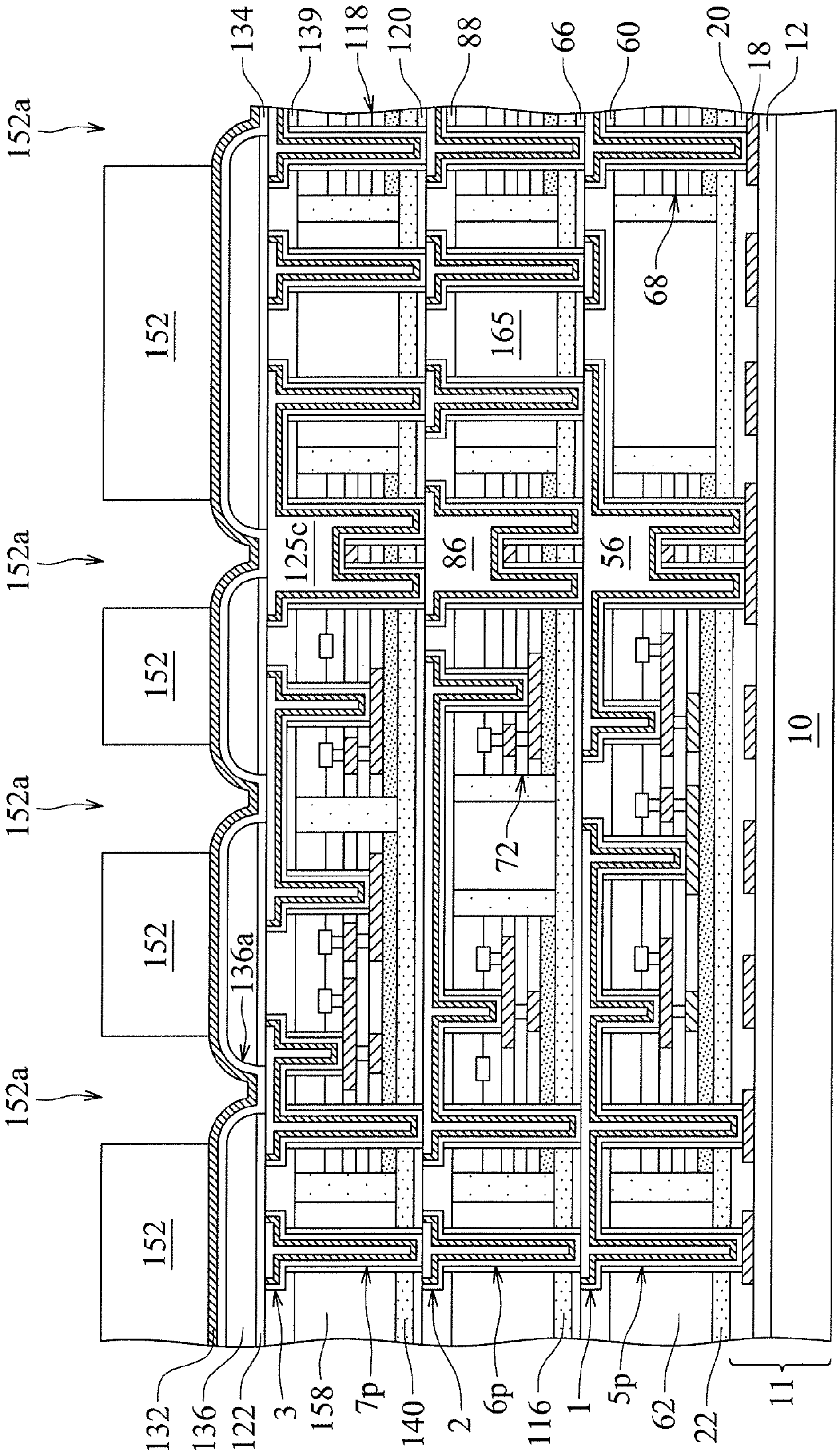

Next, referring to FIG. 79, an adhesion/barrier layer 134 having a thickness smaller than 1 micrometer, such as between 1 nanometer and 0.5 micrometers, can be formed on the polymer layer 136 and on the contact points, exposed by the openings in the insulating or dielectric layer 122 and under the openings 136*a* in the polymer layer 136, of the conduction layer 125*c* of the metal interconnects 3 by a physical vapor deposition (PVD) process, such as sputtering process or evaporation process, by a chemical-vapor deposition (CVD) process, or by other thin-film deposition processes, such as atomic layer deposition (ALD). Next, a seed layer 132 having a thickness smaller than 1 micrometer, such as between 10 nanometers and 0.8 micrometers, can be formed on the adhesion/barrier layer 134 by a physical vapor deposition (PVD) process, such as sputtering process or evaporation process, by a chemical-vapor deposition (CVD) process, or by other thin-film deposition processes, such as atomic layer deposition (ALD). Next, a photoresist layer 152, such as positive-type photoresist layer or negative-type photoresist layer, having a thickness, e.g., between 20 and 200 micrometers, between 20 and 150 micrometers, between 20 and 130 micrometers, between 20 and 100 micrometers or between 20 and 50 micrometers can be formed on the seed layer 132 by, e.g., a spin-on coating process or a lamination process. Next, the photoresist layer 152 is patterned with the processes of photo exposure and chemical development to form multiple openings 152*a*, exposing multiple regions of the seed layer 132, in the photoresist layer 152. A 1X stepper or 1X contact aligner can be used to expose the photoresist layer 152 during the process of photo exposure.

The adhesion/barrier layer 134 may include or can be a layer of titanium, a titanium-tungsten alloy, titanium nitride, chromium, tantalum, tantalum nitride, nickel, or nickel vanadium having a thickness smaller than 1 micrometer, such as between 1 nanometer and 0.5 micrometers, and preferably between 0.1 and 0.2 micrometers. The seed layer 132 may include or can be a layer of copper, a titanium-copper alloy, nickel, gold or silver having a thickness smaller than 1 micrometer, such as between 10 nanometers and 0.8 micrometers, and preferably between 80 nanometers and 0.15 micrometers.

For example, when the adhesion/barrier layer 134 is formed by a suitable process or processes, e.g., by sputtering a titanium-containing layer, such as a single layer of titanium, a titanium-tungsten alloy or titanium nitride, having a thickness smaller than 1 micrometer, such as between 1 nanometer and 0.5 micrometers, and preferably between 0.1 and 0.2 micrometers, on the polymer layer 136 and on the contact points, exposed by the openings in the insulating or dielectric layer 122 and under the openings 136*a* in the polymer layer 136, of the conduction layer 125*c* of the metal interconnects 3, the seed layer 132 can be formed by a suitable process or processes, e.g., by sputtering a layer of copper, a titanium-copper alloy, nickel, gold or silver with a thickness smaller than 1 micrometer, such as between 10 nanometers and 0.8 micrometers, and preferably between 80 nanometers and 0.15 micrometers, on the titanium-containing layer.

Alternatively, when the adhesion/barrier layer 134 is formed by a suitable process or processes, e.g., by sputtering a tantalum-containing layer, such as a single layer of tantalum or tantalum nitride, having a thickness smaller than 1 micrometer, such as between 1 nanometer and 0.5 micrometers, and preferably between 0.1 and 0.2 micrometers, on the polymer layer 136 and on the contact points, exposed by the openings in the insulating or dielectric layer 122 and under the openings 136*a* in the polymer layer 136, of the conduction layer 125*c* of the metal interconnects 3, the seed layer 132 can be formed by a suitable process or processes, e.g., by sputtering a layer of copper, a titanium-copper alloy, nickel, gold or silver with a thickness smaller than 1 micrometer, such as between 10 nanometers and 0.8 micrometers, and preferably between 80 nanometers and 0.15 micrometers, on the tantalum-containing layer.

Figure 80:
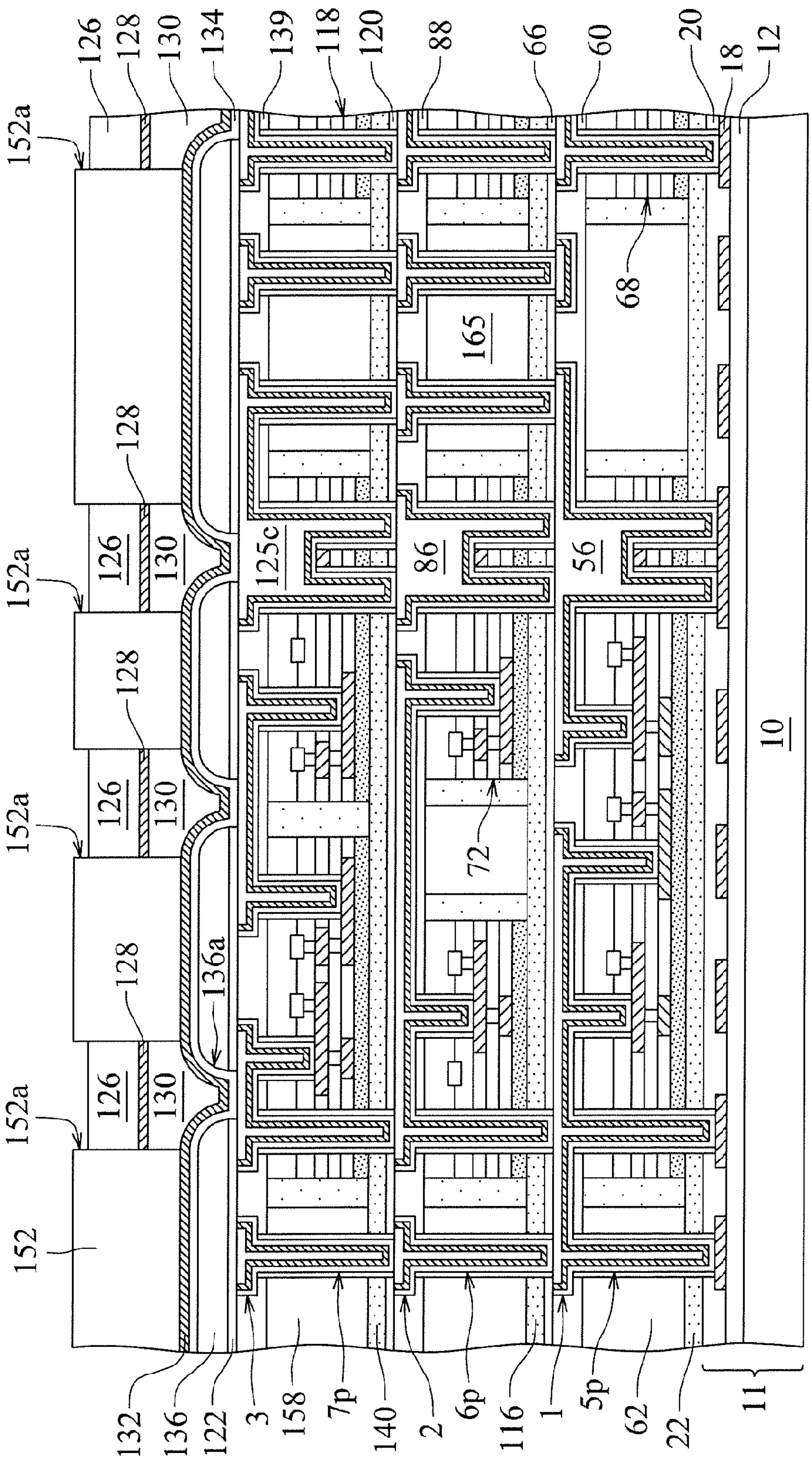

Next, referring to FIG. 80, a conduction layer 130 having a thickness greater than 1 micrometer, such as between 1 and 100 micrometers, between 1 and 50 micrometers, between 1 and 20 micrometers or between 1 and 10 micrometers, can be formed in the openings 152*a* and on the regions, exposed by the openings 152*a*, of the seed layer 132 by using, e.g., an electroplating process. Next, a barrier layer 128 having a thickness, e.g., between 0.5 and 10 micrometers, between 0.5 and 5 micrometers or between 0.5 and 3 micrometers can be formed in the openings 152*a* and on the conduction layer 130 by using, e.g., an electroplating process or an electroless plating process. Next, a solder wetting layer, such as gold layer, can be optionally formed in the openings 152*a* and on the barrier layer 128 by using, e.g., an electroplating process or an electroless plating process. Next, a solder layer 126 having a thickness, e.g., greater than 5 micrometers can be formed in the openings 152*a* and on the barrier layer 128 or solder wetting layer by using, e.g., an electroplating process.

The conduction layer 130 can be a metal layer that may include or can be a layer of copper, gold or silver with a thickness greater than 1 micrometer, such as between 1 and 100 micrometers, between 1 and 50 micrometers, between 1 and 20 micrometers or between 1 and 10 micrometers, formed by an electroplating process. The barrier layer 128 can be a metal layer that may include or can be a layer of nickel, nickel vanadium or a nickel alloy with a thickness, e.g., between 0.5 and 10 micrometers, between 0.5 and 5 micrometers or between 0.5 and 3 micrometers formed by an electroplating process. The solder layer 126 can be a bismuth-containing layer, an indium-containing layer or a tin-containing layer of a tin-lead alloy, a tin-silver alloy, a tin-silver-copper alloy or a tin-gold alloy with a thickness greater than 5 micrometers.

Figure 81:
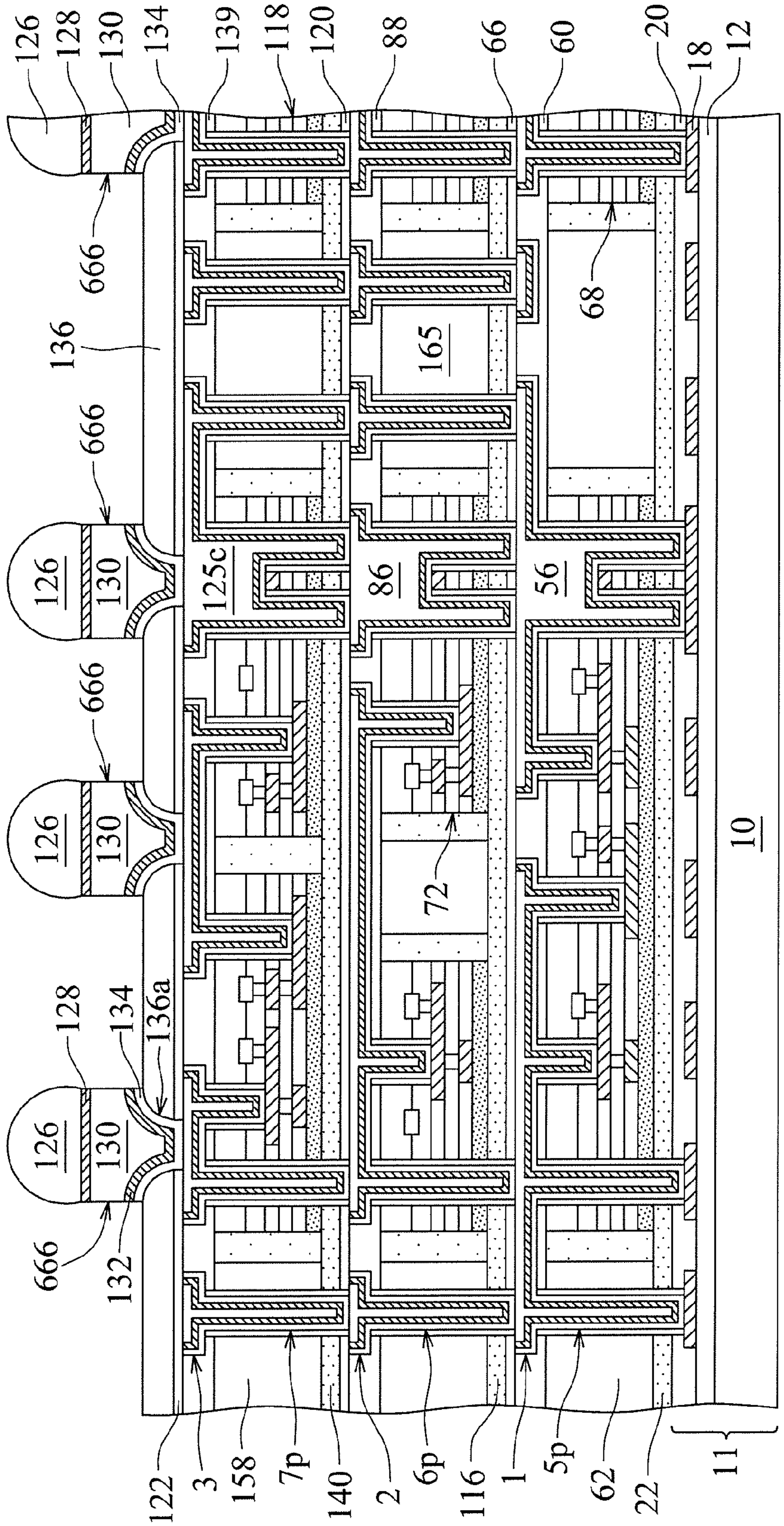

Referring to FIG. 81, after forming the solder layer 126 illustrated in FIG. 80, the photoresist layer 152 is removed using, e.g., an organic chemical solution. Next, the seed layer 132 not under the conduction layer 130 is removed by using, e.g., a wet chemical etching process or dry plasma etching process. Next, the adhesion/barrier layer 134 not under the conduction layer 130 is removed by using, e.g., a wet chemical etching process or a dry plasma etching process. Next, the solder layer 126 can be formed with multiple solid solder bumps or balls 126 on the barrier layer 128 or on the solder wetting layer by, e.g., a flux coating process, a re-flow process and a flux cleaning process, subsequently. The solder bumps or balls 126 are used for external connection.

Accordingly, the layers 128, 130, 132 and 134 compose an under bump metallurgic (UBM) layer 666 on the polymer layer 136 and on the contact points, at bottoms of the openings in the insulating or dielectric layer 122 and under the openings 136*a* in the polymer layer 136, of the conduction layer 125*c* of the metal interconnects 3, and the solder bumps or balls 126 can be formed on the UBM layer 666. Alternatively, the UBM layer 666 may further include the solder wetting layer illustrated in FIG. 80 on the barrier layer 128, and the solder bumps or balls 126 can be formed on the solder wetting layer of the UBM layer 666.

The solder bumps or balls 126 may have a bump height, e.g., greater than 5 micrometers, such as between 5 and 200 micrometers, and preferably between 10 and 100 micrometers or between 10 and 30 micrometers, and a width or diameter, e.g., between 10 and 200 micrometers, and preferably between 50 and 100 micrometers or between 10 and 30 micrometers. The solder bumps or balls 126 may include bismuth, indium, tin, a tin-lead alloy, a tin-silver alloy, a tin-silver-copper alloy, or a tin-gold alloy. Each of the interconnects 3, such as the interconnect 3*a*, 3*b* or 3*c* as shown in FIG. 76, can be connected to one or more of the solder bumps or balls 126 through the UBM layer 666.

Next, referring to FIG. 82, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in packages or multichip modules 555 and 555*a*.

Alternatively, before the singulation process, multiple metal plugs or vias can be formed in multiple openings in the substrate 10 and the dielectric layer 12 of the carrier 11, passing through the substrate 10 and the dielectric layer 12, and connected to the conductive layer 18 of the carrier 11. The metal plugs or vias may include or can be copper, aluminum, gold, or nickel. Alternatively, the metal plugs or vias may further include titanium, a titanium-tungsten alloy, titanium nitride, tantalum, tantalum nitride, a titanium-copper alloy, or chromium. Next, multiple metal traces can be formed at a bottom side of the substrate 10 and connected to the conductive layer 18 of the carrier 11 through the metal plugs or vias. Each of the metal traces may include a layer of titanium, a titanium-tungsten alloy, titanium nitride, chromium, tantalum, tantalum nitride, or a titanium-copper alloy under the bottom side of the substrate 10, and an electroplated metal layer under the layer of titanium, a titanium-tungsten alloy, titanium nitride, chromium, tantalum, tantalum nitride, or a titanium-copper alloy. The electroplated metal layer may include or can be a layer of copper, gold, aluminum, or nickel. Next, multiple passive components, such as capacitors, inductors or resistors, can be attached to the bottom side of the substrate 10 and boned with the metal traces using solders. The solders may include bismuth, indium, tin, a tin-lead alloy, a tin-silver alloy, a tin-silver-copper alloy, a tin-gold alloy, or a tin-copper alloy. After the passive components are boned with the metal traces, the singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as the system-in packages or multichip modules 555 and 555*a*.

Accordingly, the system-in package or multichip module 555 can have one of the passive components that has a first terminal connected to the metal plug 5*a* or 5*b* as shown in FIG. 26 through, in sequence, one of the solders, one of the metal traces at the bottom side of the substrate 10, one of the metal plugs or vias in the substrate 10, and a metal interconnect of the conductive layer 18 at the top side of the substrate

10, and has a second terminal connected to the metal plug 5*e* as shown in FIG. 26 through, in sequence, another one of the solders, another one of the metal traces at the bottom side of the substrate 10, another one of the metal plugs or vias in the substrate 10, and another metal interconnect of the conductive layer 18 at the top side of the substrate 10.

The system-in package or multichip module 555 can be connected to and bonded with a carrier, such as mother board, printed circuit board (PCB), ball-grid-array (BGA) substrate, metal substrate, glass substrate, or ceramic substrate, using the solder bumps or balls 126. For example, referring to FIG. 83, the system-in package or multichip module 555 can be bonded with a top side of a carrier 176 using, e.g., a flip chip technology of joining the solder bumps or balls 126 with a solder or gold layer preformed on the top side of the carrier 176. Next, an under fill 174 can be formed between the polymer layer 136 of the system-in package or multichip module 555 and the top side of the carrier 176 and encloses the solder bumps or balls 126. The under fill 174 may include epoxy, glass filler or carbon filler, and the glass filler or carbon filler can be distributed in the epoxy. Next, multiple solder balls 178 can be formed on a bottom side of the carrier 176. Each of the solder balls 178 can be a ball of a Sn—Ag alloy, a Sn—Ag—Cu alloy, a Sn—Au alloy, or a Sn—Pb alloy having a diameter between 0.25 and 1.2 millimeters. The carrier 176 may have a thickness, e.g., between 0.1 and 2 millimeters and can be a ball-grid-array (BGA) substrate or a print circuit board (PCB). The carrier 176 may include a core containing BT, FR4, epoxy and glass fiber, and multiple metal layers at both sides of the core.

Figure 84:
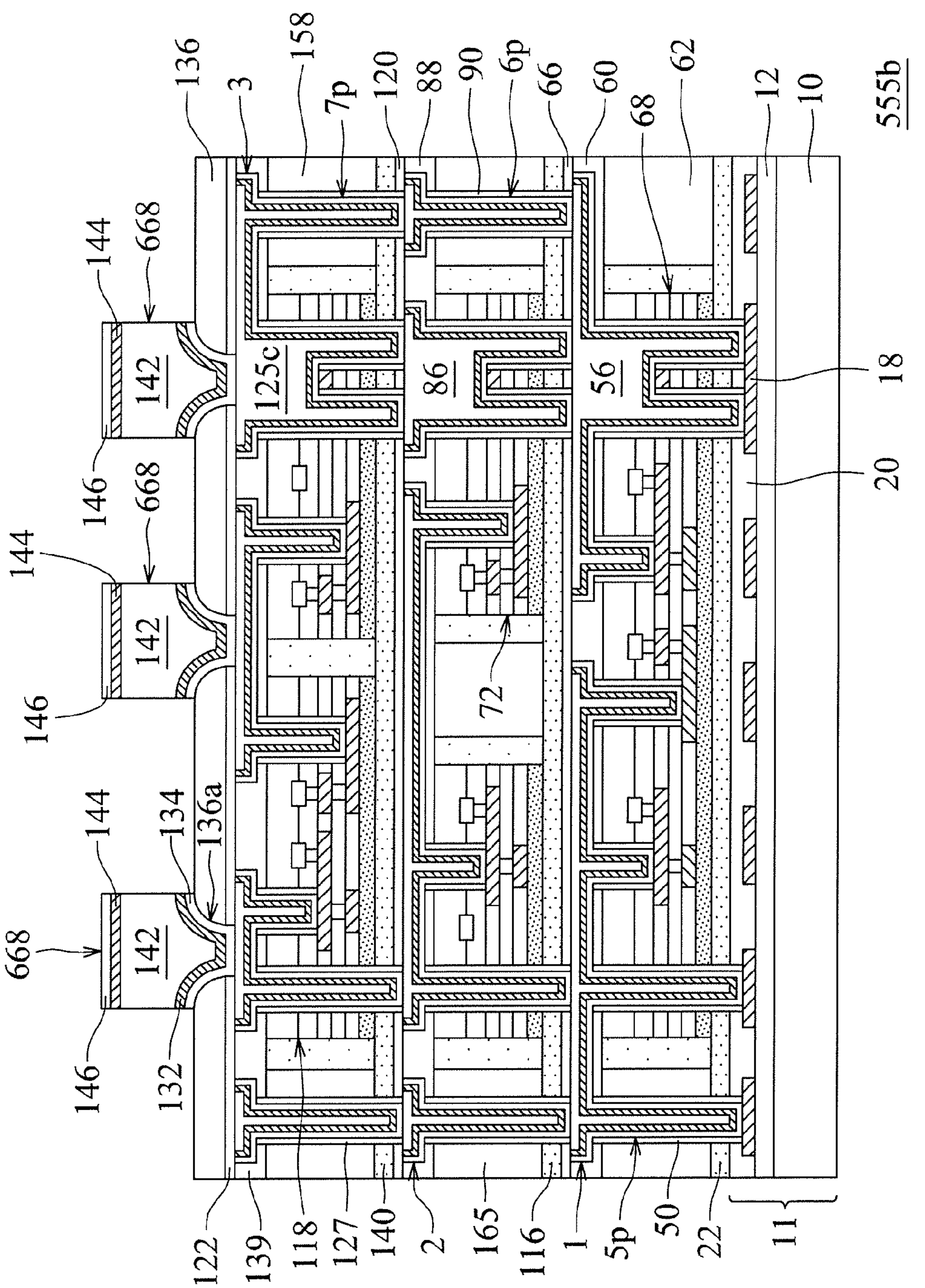
FIG. 84 shows a cross-sectional view of a system-in package or multichip module according to an embodiment of the present disclosure.

FIG. 84 shows another system-in package or multichip module according to another embodiment of the present disclosure, which can be formed by the following steps. After the steps illustrated in FIG. 79, a metal layer 142, such as a layer of copper, gold or silver, having a thickness, e.g., between 10 and 100 micrometers, and preferably between 20 and 60 micrometers, can be formed on the regions, exposed by the openings 152*a* in the photoresist layer 152, of the seed layer 132 and in the openings 152*a* by using, e.g., an electroplating process. Next, a barrier layer 144, such as a layer of nickel or a nickel-vanadium alloy, having a thickness, e.g., between 0.2 and 10 micrometers, and preferably between 1 and 5 micrometers, can be formed in the openings 152*a* and on the metal layer 142 by using, e.g., an electroplating process or an electroless plating process. Next, a solder wetting layer 146, such as a layer of gold, silver, copper or tin, having a thickness, e.g., between 0.02 and 5 micrometers, and preferably between 0.1 and 1 micrometers, can be formed in the openings 152*a* and on the barrier layer 144 by using, e.g., an electroplating process or an electroless plating process. Next, the photoresist layer 152 is removed using, e.g., an organic chemical solution. Next, the seed layer 132 not under the metal layer 142 is removed by using, e.g., a wet chemical etching process or a dry plasma etching process. Next, the adhesion/barrier layer 134 not under the metal layer 142 is removed by using, e.g., a wet chemical etching process or a dry plasma etching process. Accordingly, the layers 132, 134, 142, 144 and 146 compose multiple metal bumps 668 on the polymer layer 136 and on the contact points, at the bottoms of the openings in the insulating or dielectric layer 122 and under the openings 136*a* in the polymer layer 136, of the conduction layer 125*c* of the metal interconnects 3. The metal bumps 668 may have a width, e.g., between 20 and 400 micrometers, and preferably between 50 and 100 micrometers, and a height, e.g., between 10 and 100 micrometers, and preferably between 20 and 60 micrometers. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in package or multichip module 555*b* as shown in FIG. 84. In the system-in package or multichip module 555*b*, each of the interconnects 3, such as the interconnect 3*a*, 3*b* or 3*c* as shown in FIG. 76, can be connected to one or more of the metal bumps 668, and the metal bumps 668 can be used for external connection.

Figure 85:
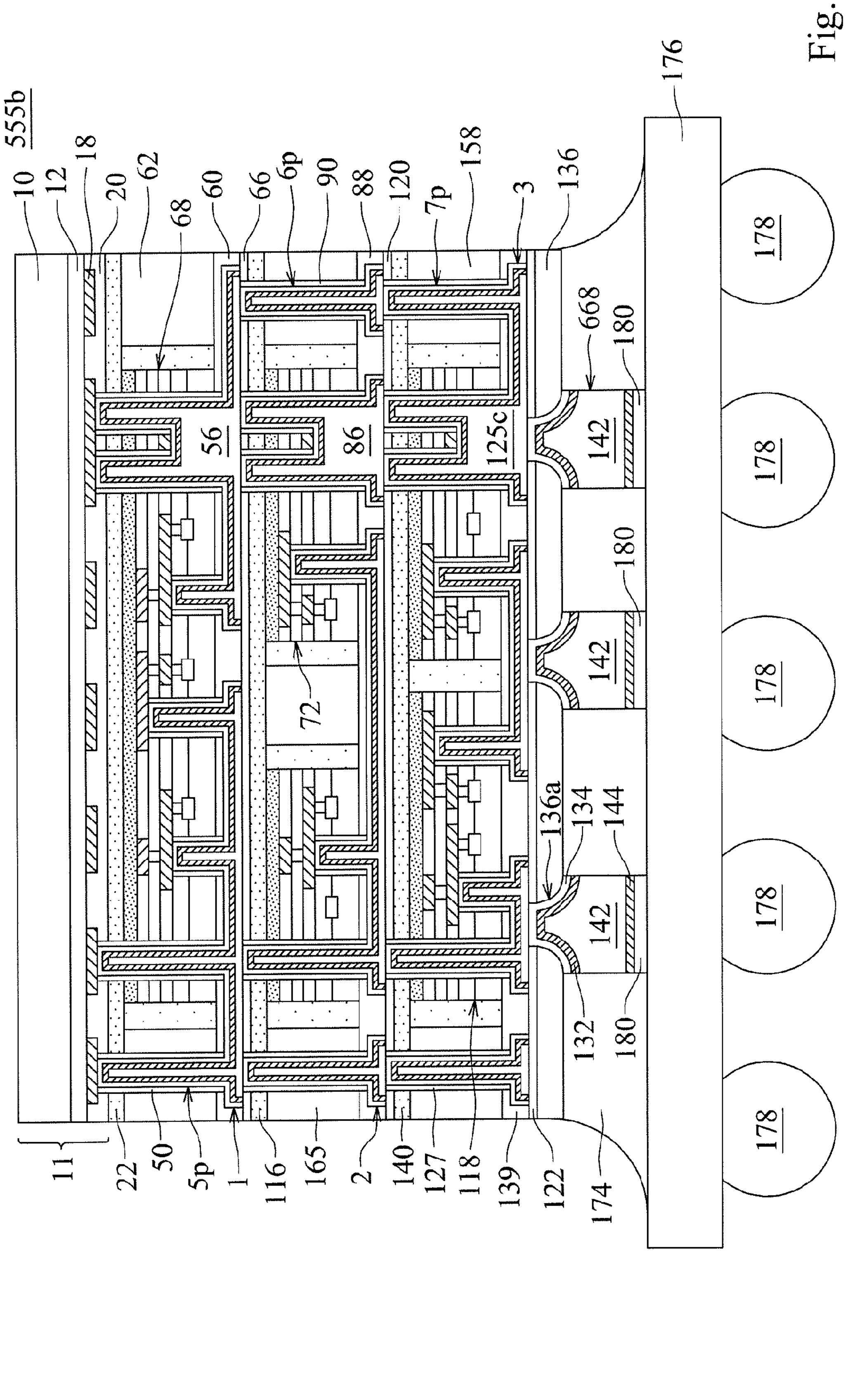
FIG. 85 shows a cross-sectional view of a multichip package according to an embodiment of the present disclosure.

The system-in package or multichip module 555*b* can be connected to and bonded with a carrier, such as mother board, printed circuit board (PCB), ball-grid-array (BGA) substrate, metal substrate, glass substrate, or ceramic substrate, using the metal bumps 668. For example, referring to FIG. 85, the system-in package or multichip module 555*b* can be bonded with the top side of the carrier 176 illustrated in FIG. 83 using, e.g., a flip chip technology of joining the solder wetting layer 146 of the metal bumps 668 with a solder or gold layer preformed on the top side of the carrier 176. After joining the solder wetting layer 146 with the solder or gold layer preformed on the top side of the carrier 176, multiple metal joints 180 are formed between the barrier layer 144 of the metal bumps 668 and the top side of the carrier 176. The metal joints 180 can be a layer of a Sn—Ag alloy, a Sn—Ag—Cu alloy, a Sn—Au alloy, or a Sn—Pb alloy having a thickness between 5 and 50 micrometers. Alternatively, the metal joints 180 can be a gold layer having a thickness between 0.1 and 10 micrometers. Next, the under fill 174 illustrated in FIG. 83 can be formed between the polymer layer 136 of the system-in package or multichip module 555*b* and the top side of the carrier 176 and encloses the metal bumps 668 and the metal joints 180. Next, the solder balls 178 illustrated in FIG. 83 can be formed on the bottom side of the carrier 176.

Alternatively, the insulating or dielectric layer 122 as shown FIGS. 77-85 can be omitted. In this case, the polymer layer 136 is formed on the surfaces 223, 225, 227 and 139*s*, and the contact points of the conduction layer 125*c* of the metal interconnects 3 are exposed by and at ends of the openings 136*a* in the polymer layer 136. Further, the adhesion/barrier layer 134 is formed on the contact points, exposed by and at the ends of the openings 136*a* in the polymer layer 136, of the conduction layer 125*c* of the metal interconnects 3.

Figure 86:
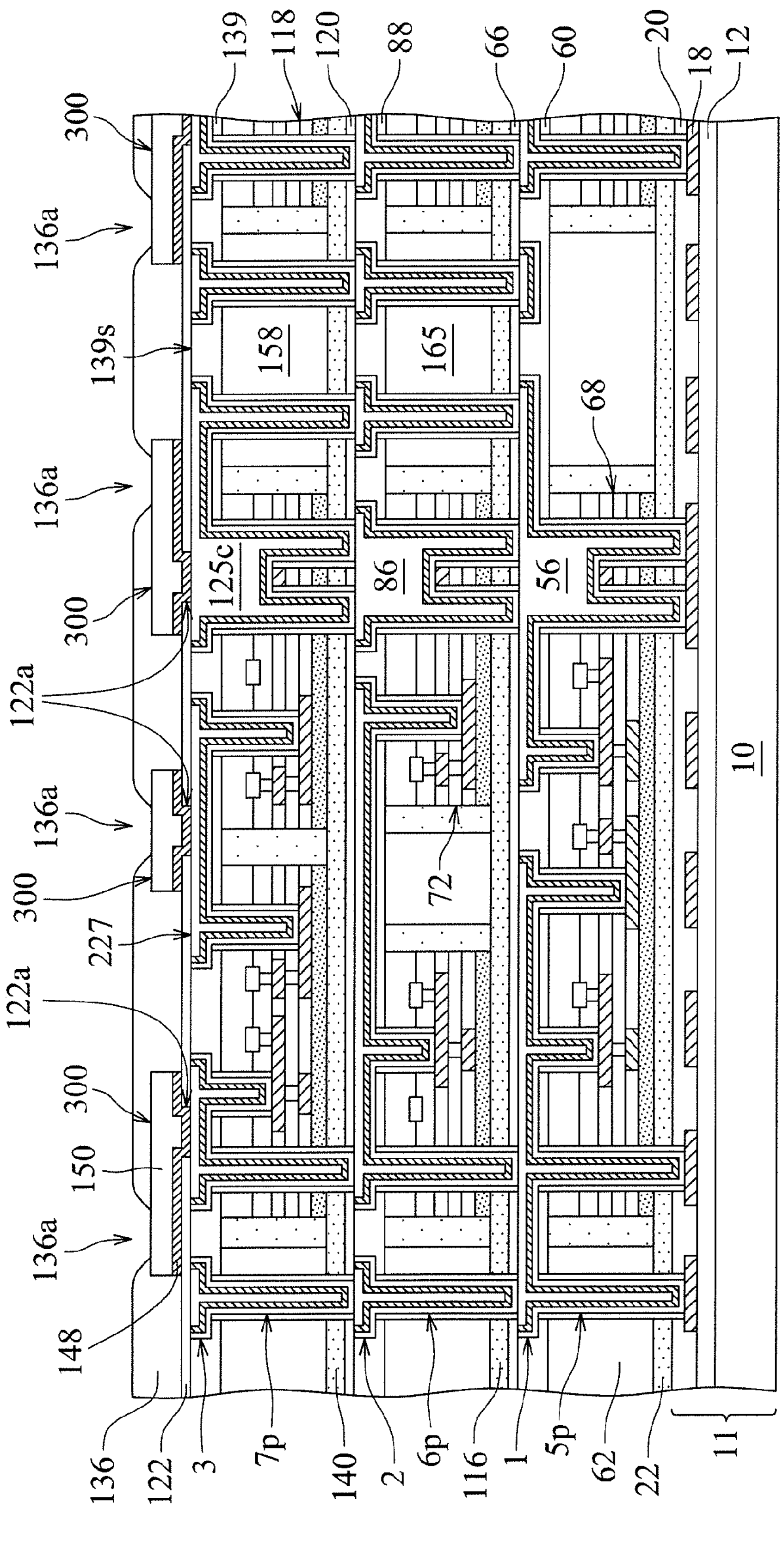
FIGS. 86 and 87 are cross-sectional views showing a process for forming a system-in package or multichip module according to an embodiment of the present disclosure.
Figure 87:
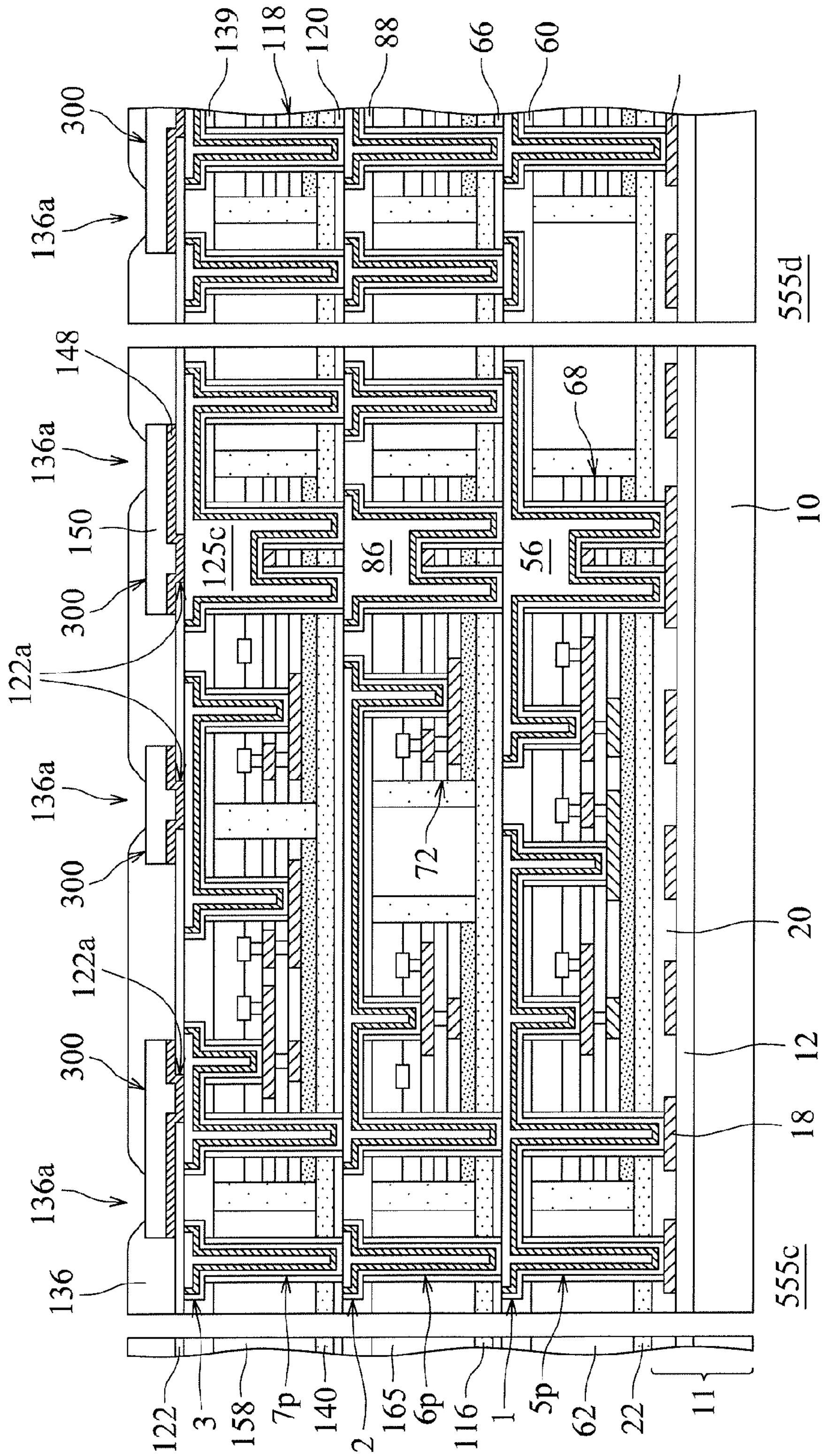

FIGS. 86 and 87 show a process for forming another system-in package or multichip module according to another embodiment of the present disclosure. Referring to FIG. 86, after forming the structure illustrated in FIG. 76, the insulating or dielectric layer 122 illustrated in FIG. 77 can be formed on the ground or polished surfaces of the layers 125*a* and 125*b*, on the ground or polished surface 227 of the conduction layer 125*c*, and on the exposed top surface 139*s* of the dielectric layer 139. Next, multiple openings 122*a* are formed in the insulating or dielectric layer 122 using, e.g., a photolithography process and a dielectric etching process and expose multiple regions of the conduction layer 125*c* of the metal interconnects 3. Next, multiple metal interconnects or traces 300 can be formed on the insulating or dielectric layer 122 and on the regions, exposed by the openings 122*a* in the layer 122, of the conduction layer 125*c* of the metal interconnects 3. Next, a polymer layer 136, such as photosensitive polymer layer, can be formed on the insulating or dielectric layer 122 and on the metal interconnects or traces 300 by using, e.g., a spin coating process. Next, a photo exposure process and a chemical development process can be employed to form multiple openings 136*a*, exposing multiple contact points of the metal interconnects or traces 300, in the polymer layer 136. Next, the polymer layer 136 can be cured in a temperature between 180 degrees centigrade and 300 degrees centigrade or between 180 degrees centigrade and 250 degrees centigrade. The polymer layer 136 after being cured may have a thickness, e.g., between 1 and 20 micrometers, and preferably between 2 and 15 micrometers or between 5 and 10 micrometers. The polymer layer 136 can be a polyimide layer, a benzocyclobutene (BCB) layer, a polybenzoxazole (PBO) layer, a poly-phenylene oxide (PPO) layer, an epoxy layer, or a layer of SU-8.

Each of the metal interconnects or traces 300 can be a signal trace, a bit line, a clock bus, a power plane, a power bus, a power trace, a ground plane, a ground bus, or a ground trace. In a first alternative, the metal interconnects or traces 300 can be formed by the following steps. First, a metal layer 148 can be formed on the insulating or dielectric layer 122 and on the regions, exposed by the openings 122*a* in the layer 122, of the conduction layer 125*c* of the metal interconnects 3 by sputtering an adhesion/barrier layer with a thickness smaller than 1 micrometer, such as between 1 nanometer and 0.5 micrometers, on the insulating or dielectric layer 122 and on the regions, exposed by the openings 122*a* in the layer 122, of the layer 125*c* of the metal interconnects 3, and then sputtering a seed layer with a thickness smaller than 1 micrometer, such as between 10 nanometers and 0.8 micrometers, on the adhesion/barrier layer. The adhesion/barrier layer may include or can be a layer of titanium, a titanium-tungsten alloy, titanium nitride, chromium, tantalum, tantalum nitride, nickel, or nickel vanadium having a thickness smaller than 1 micrometer, such as between 1 nanometer and 0.5 micrometers. The seed layer may include or can be a layer of copper, a titanium-copper alloy, nickel, gold, or silver having a thickness smaller than 1 micrometer, such as between 10 nanometers and 0.8 micrometers. Next, a patterned photoresist layer can be formed on the seed layer of the metal layer 148, and multiple openings in the patterned photoresist layer expose multiple regions of the seed layer. Next, a conduction layer 150 can be formed on the regions, exposed by the openings in the patterned photoresist layer, of the seed layer of the metal layer 148 by using an electroplating process. The conduction layer 150, for example, can be a gold layer, used for bonding with gold, copper, or aluminum wirebonded wires in the following process, with a thickness between 0.5 and 5 micrometers formed on the seed layer, preferably the previously described gold seed layer, of the metal layer 148 by an electroplating process. Alternatively, the conduction layer 150 can be a copper layer, used for bonding with gold, copper, or aluminum wirebonded wires in the following process, with a thickness between 2 and 10 micrometers formed on the seed layer, preferably the previously described copper or titanium-copper-alloy seed layer, of the metal layer 148 by an electroplating process. Alternatively, the conduction layer 150 may include a nickel layer having a thickness between 1 and 10 micrometers formed on or over the seed layer, preferably the previously described copper or titanium-copper-alloy seed layer, of the metal layer 148 by an electroplating process or an electroless plating process, and a gold layer, used for bonding with gold, copper, or aluminum wirebonded wires in the following process, having a thickness between 0.01 and 2 micrometers formed on the nickel layer by an electroplating process or an electroless plating process. Next, the patterned photoresist layer can be removed. Next, the metal layer 148 not under the conduction layer 150 can be removed by an etching process. Accordingly, the metal interconnects or traces 300 can be composed of the metal layer 148 and the conduction layer 150, and sidewalls of the conduction layer 150 are not covered by the metal layer 148.

In a second alternative, the metal interconnects or traces 300 can be formed by the following steps. First, an adhesion/barrier layer 148 having a thickness smaller than 1 micrometer, such as between 1 nanometer and 0.5 micrometers, can be formed on the insulating or dielectric layer 122 and on the regions, exposed by the openings 122*a* in the layer 122, of the conduction layer 125*c* of the metal interconnects 3 by a sputtering process. The adhesion/barrier layer 148 can be a layer of titanium, a titanium-tungsten alloy, titanium nitride, chromium, tantalum, tantalum nitride, nickel, or nickel vanadium having a thickness smaller than 1 micrometer, such as between 1 nanometer and 0.5 micrometers. Next, a wirebondable conduction layer 150 having a thickness between 0.5 and 5 micrometers can be formed on the adhesion/barrier layer 148 by a sputtering process. The wirebondable conduction layer 150 can be a layer of an aluminum-copper alloy, used for bonding with gold, copper, or aluminum wirebonded wires in the following process, having a thickness between 0.5 and 5 micrometers formed by a sputtering process. Next, a patterned photoresist layer can be formed on the wirebondable conduction layer 150. Next, by using an etching process, the wirebondable conduction layer 150 not under the patterned photoresist layer and the adhesion/barrier layer 148 not under the patterned photoresist layer can be removed. Next, the patterned photoresist layer can be removed. Accordingly, the metal interconnects or traces 300 can be composed of the adhesion/barrier layer 148 and the wirebondable conduction layer 150, and sidewalls of the wirebondable conduction layer 150 are not covered by the adhesion/barrier layer 148.

Next, referring to FIG. 87, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in packages or multichip modules 555*c* and 555*d*.

Figure 83:
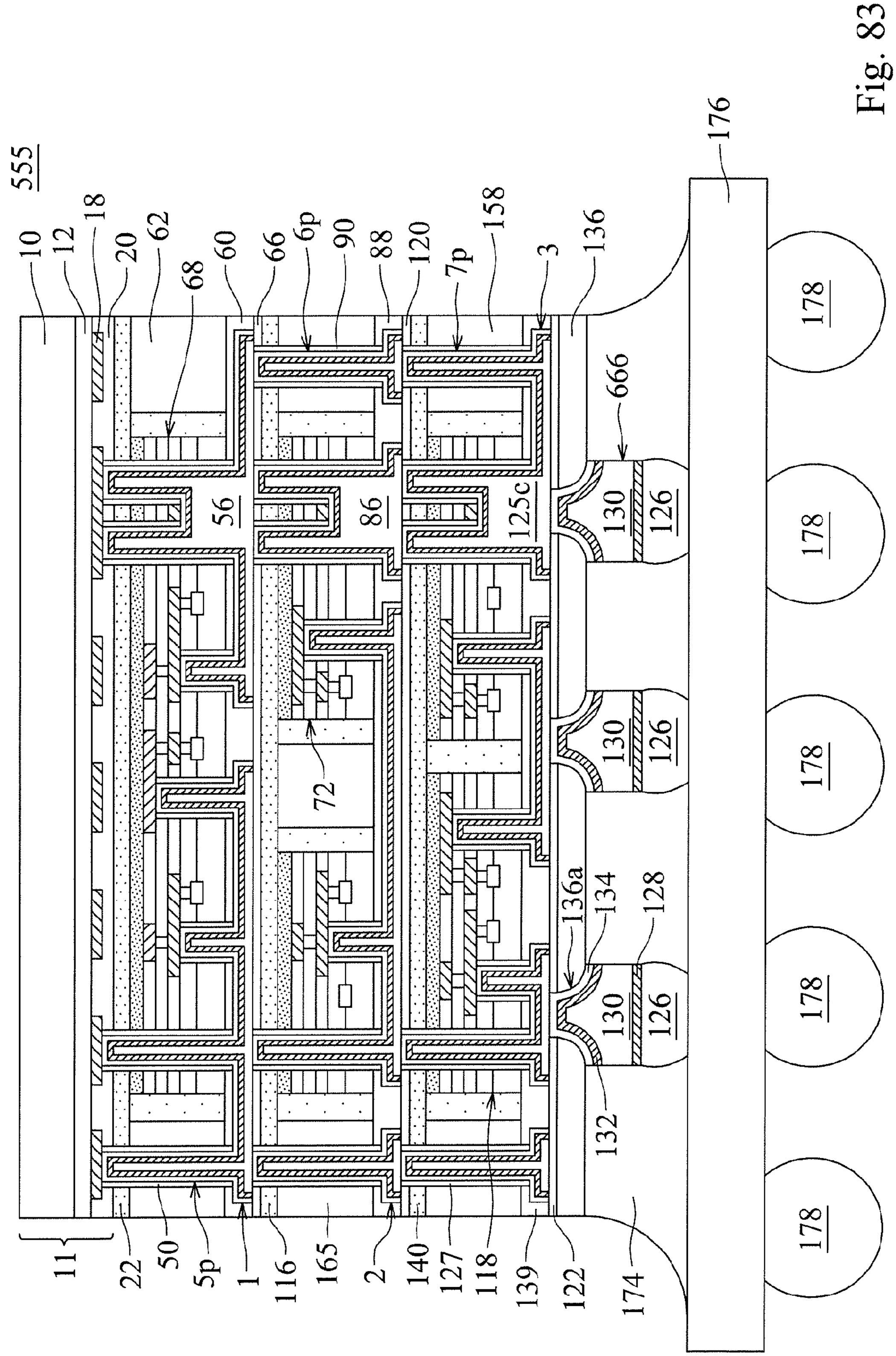
FIG. 83 shows a cross-sectional view of a multichip package according to an embodiment of the present disclosure.
Figure 88:
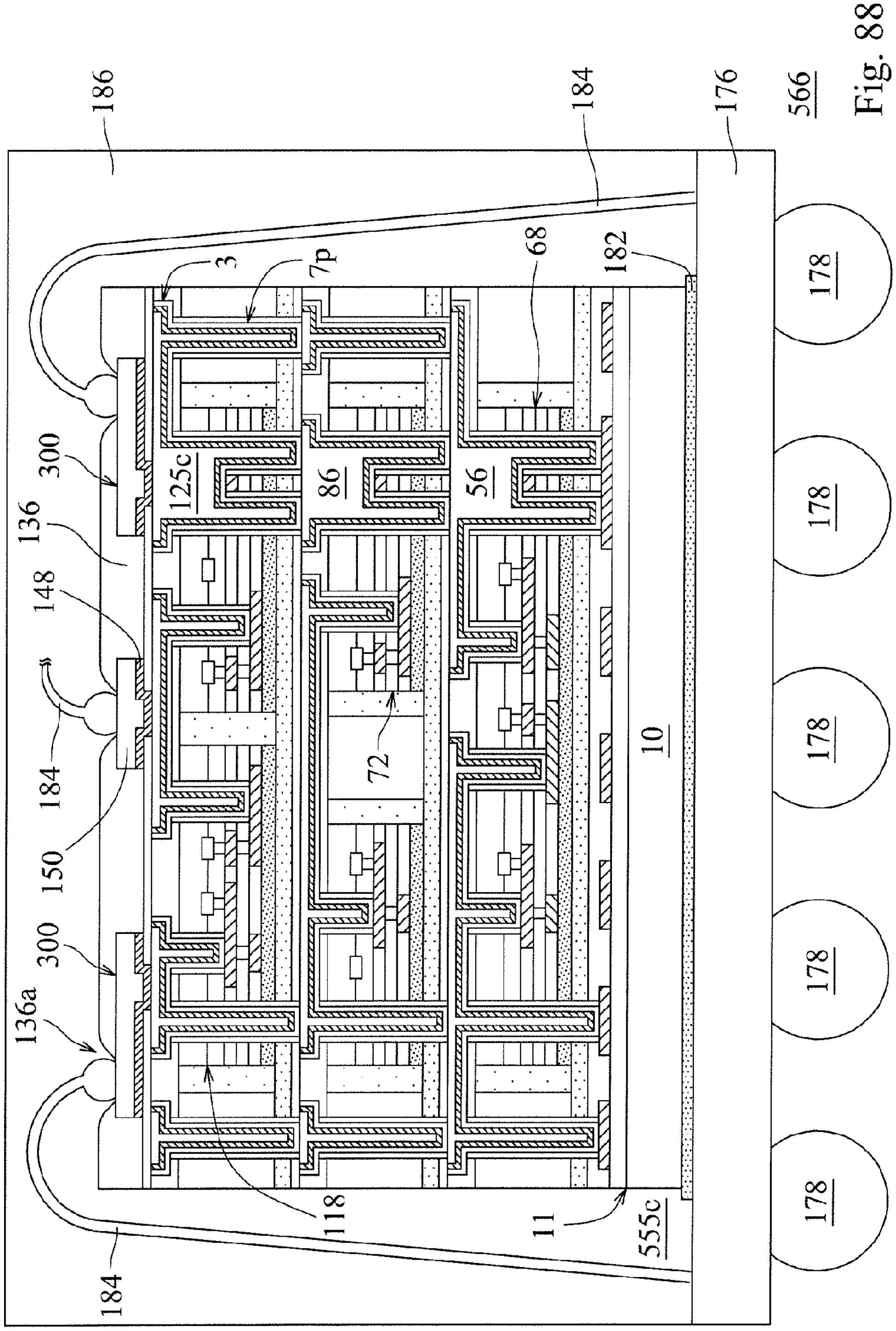
FIG. 88 shows a cross-sectional view of a multichip package according to an embodiment of the present disclosure.

FIG. 88 shows a multichip package 566 including the system-in package or multichip module 555*c* connected to the carrier 176 illustrated in FIG. 83 through wirebonded wires 184, which can be formed by, e.g., the following steps. First, a plurality of the system-in package or multichip module 555*c* can be joined with the carrier 176 shown in FIG. 83 by, e.g., forming a glue layer 182 with a thickness between 20 and 150 micrometers on the top side of the carrier 176, and then attaching the plurality of the system-in package or multichip module 555*c* to the top side of the carrier 11 using the glue layer 182. The glue layer 182 can be a polymer layer, such as a layer of epoxy, polyimide, benzocyclobutene (BCB), polybenzoxazole (PBO), poly-phenylene oxide (PPO), silosane, or SU-8, with a thickness, e.g., between 20 and 150 micrometers. Next, multiple wires 184, such as gold wires, copper wires, or aluminum wires, can be wirebonded onto the top side of the carrier 176 and onto the contact points, exposed by the openings 136*a* in the polymer layer 136, of the conduction layer 150 of the metal interconnects or traces 300 by a wirebonding process. Accordingly, the metal interconnects or traces 300 of the plurality of the system-in package or multichip module 555*c* can be physically and electrically connected to the carrier 176 through the wirebonded wires 184. Next, a molding compound 186 can be formed on the plurality of the system-in package or multichip module 555*c*, on the top side of the carrier 176 and on the wirebonded wires 184, encapsulating the wirebonded wires 184 and the plurality of the system-in package or multichip module 555*c*, by a molding process. The molding compound 186 may include epoxy, carbon filler or glass filler, and the glass filler or carbon filler can be distributed in the epoxy. Next, the solder balls 178 illustrated in FIG. 83 can be formed on the bottom side of the carrier 176. Thereafter, a singulation process can be performed to cut the carrier 176 and the molding compound 186 and to singularize a plurality of the multichip package 566. The multichip package 566 can be connected to a carrier, such as mother board, ball-grid-array (BGA) substrate, printed circuit board, metal substrate, glass substrate, or ceramic substrate, through the solder balls 178.

Figure 89:
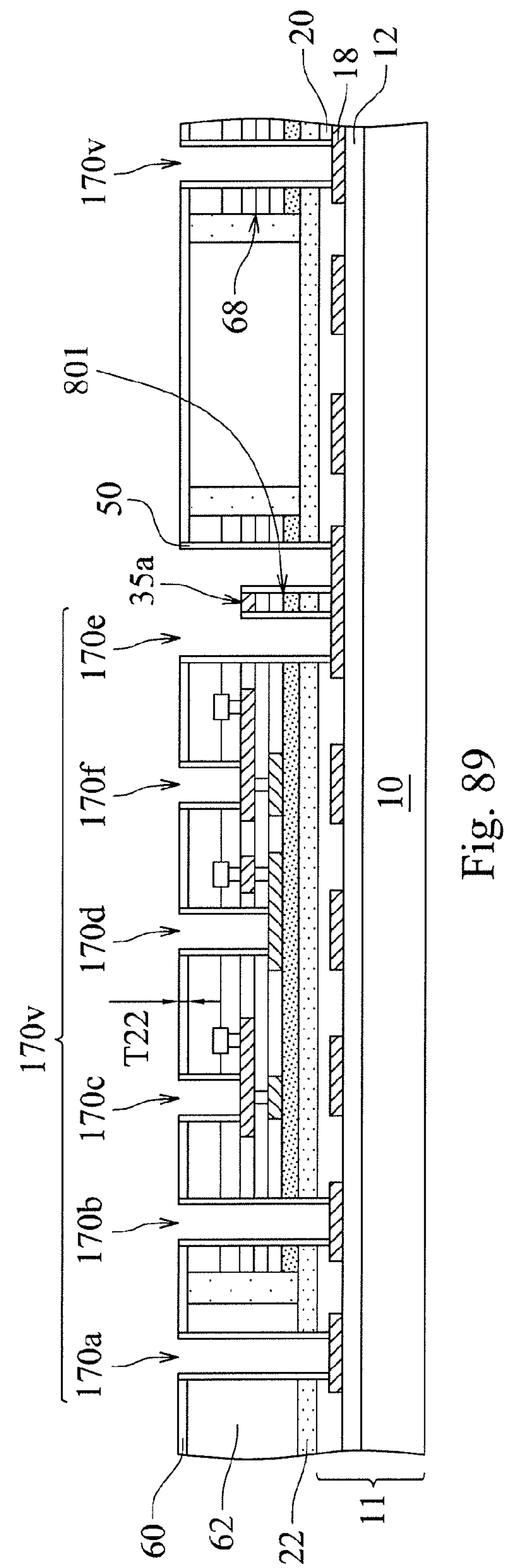
FIGS. 89-103 show a process for forming a system-in package or multichip module according to an embodiment of the present disclosure.

FIGS. 89-103 show a process for forming another system-in package or multichip module according to another embodiment of the present disclosure. Referring to FIG. 89, after forming the structure illustrated in FIG. 19, by using an etching process (such as anisotropic etching process), the dielectric layer 50 formed on the layers 18, 26 and 34 and on the top surface of the dielectric layer 60 can be etched away, and a top portion of the dielectric layer 60 can be further etched away. After the etching process, the dielectric layer 60 may have a remaining thickness T22 between 0.3 and 5 micrometers, between 0.5 and 2 micrometers, between 0.05 and 2 micrometers, between 0.05 and 1 micrometers, between 0.05 and 0.5 micrometers, or between 0.05 and 0.3 micrometers.

Alternatively, an etching-stop technique may be applied to the process of etching away the top portion of the dielectric layer 60. In this case, the dielectric layer 60 is composed of the previously described inorganic layers, e.g., including the first silicon-oxide layer on the surfaces 58*s*, 62*s* and 64*s*, the silicon-oxynitride layer, used as the etch stop layer, on the first silicon-oxide layer, and the second silicon-oxide layer on the silicon-oxynitride layer. During the etching process, the top portion of the dielectric layer 60, that is, the second silicon-oxide layer, can be etched away until the etch stop layer, that is, the silicon-oxynitride layer, is exposed and all of the second silicon-oxide layer is removed. The remaining dielectric layer 60, composed of the silicon-oxynitride layer and the first silicon-oxide layer, may have a thickness T22 between 0.3 and 5 micrometers, between 0.5 and 2 micrometers, between 0.05 and 2 micrometers, between 0.05 and 1 micrometers, between 0.05 and 0.5 micrometers, or between 0.05 and 0.3 micrometers.

Accordingly, the dielectric layer 50 at bottoms of the through vias 170*v*, on the top surface of the dielectric layer 60 and on a top surface of the interconnect or metal trace 35*a* on the supporter 801 can be etched away, and the dielectric layer 50 remains on the sidewalls of the through vias 170*v*, so called as sidewall dielectric layers in the through vias 170*v*. The sidewall dielectric layers 50 are formed on the sidewalls of the through vias 170*v* in the chips 68 or in the dummy substrate(s) 62 and are enclosed by the semiconductor substrates 58 of the chips 68 or by the dummy substrate(s) 62.

Figure 90:
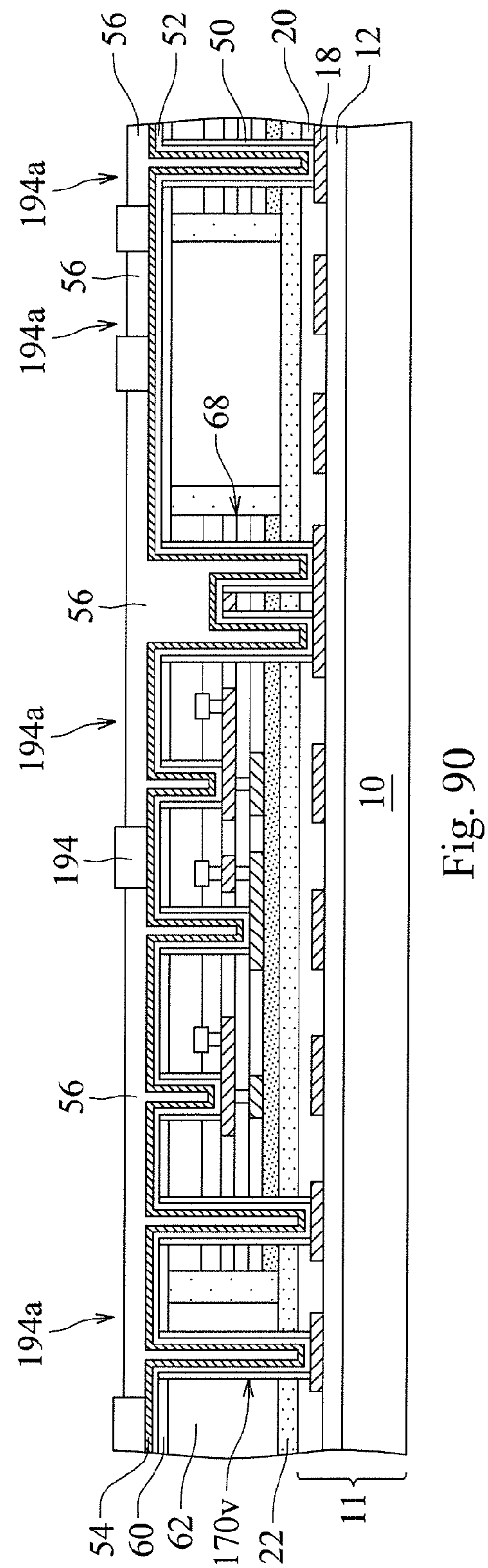

Next, referring to FIG. 90, an adhesion/barrier layer 52 having a thickness smaller than 1 micrometer, such as between 1 nanometer and 0.5 micrometers, and preferably between 0.1 and 0.2 micrometers, can be formed on the layers 18, 26 and 34 exposed by the through vias 170*v*, on the etched surface of the dielectric layer 60, on the sidewall dielectric layers 50, and on the interconnect or metal trace 35*a* that is on the supporter 801. The adhesion/barrier layer 52 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 54 having a thickness smaller than 1 micrometer, such as between 10 nanometers and 0.8 micrometers, and preferably between 80 nanometers and 0.15 micrometers, can be formed on the adhesion/barrier layer 52 by a physical vapor deposition (PVD) process, such as sputtering process or evaporation process, by a chemical-vapor deposition (CVD) process, or by other thin-film deposition processes, such as atomic layer deposition (ALD). Next, a photoresist layer 194 can be formed on the seed layer 54 by using, e.g., a spin coating process, a screen printing process, or a lamination process. Next, a photo exposure process and a development process can be employed to form multiple openings 194*a*, exposing multiple regions of the seed layer 54, in the photoresist layer 194. The patterned photoresist layer 194 may have a thickness, e.g., between 1 and 30 micrometers, and preferably between 1 and 20 micrometers or between 1 and 10 micrometers. Next, a conduction layer 56 having a thickness greater than 1 micrometer, such as between 1 and 20 micrometers, and preferably between 1 and 10 micrometers, between 1 and 5 micrometers, or between 2 and 20 micrometers, can be formed on the regions, exposed by the openings 194*a* in the layer 194, of the seed layer 54 by using, e.g., an electroplating process.

The adhesion/barrier layer 52 may include or can be a layer of titanium, a titanium-tungsten alloy, titanium nitride, chromium, tantalum, tantalum nitride, nickel, or nickel vanadium having a thickness smaller than 1 micrometer, such as between 1 nanometer and 0.5 micrometers, and preferably between 0.1 and 0.2 micrometers. The seed layer 54 may include or can be a layer of copper, a titanium-copper alloy, nickel, gold, or silver having a thickness smaller than 1 micrometer, such as between 10 nanometers and 0.8 micrometers, and preferably between 80 nanometers and 0.15 micrometers. The conduction layer 56 may include or can be an electroplated metal layer of copper, gold, or silver having a thickness greater than 1 micrometer, such as between 1 and 20 micrometers, and preferably between 1 and 10 micrometers, between 1 and 5 micrometers, or between 2 and 20 micrometers.

For example, the adhesion/barrier layer 52 can be a titanium-containing layer, such as a single layer of titanium-tungsten alloy, titanium, or titanium nitride, with a thickness smaller than 1 micrometer, such as between 1 nanometer and 0.5 micrometers, and preferably between 0.1 and 0.2 micrometers, on the layers 18, 26 and 34 exposed by the through vias 170*v*, on the etched surface of the dielectric layer 60, on the sidewall dielectric layers 50, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer. The conduction layer 56 can be an electroplated copper layer having a thickness greater than 1 micrometer, such as between 1 and 20 micrometers, and preferably between 1 and 10 micrometers, between 1 and 5 micrometers, or between 2 and 20 micrometers, on the single layer of copper or a titanium-copper alloy.

Alternatively, the adhesion/barrier layer 52 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the layers 18, 26 and 34 exposed by the through vias 170*v*, on the etched surface of the dielectric layer 60, on the sidewall dielectric layers 50, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer. The conduction layer 56 can be an electroplated copper layer having a thickness greater than 1 micrometer, such as between 1 and 20 micrometers, and preferably between 1 and 10 micrometers, between 1 and 5 micrometers, or between 2 and 20 micrometers, on the single layer of copper or a titanium-copper alloy.

Alternatively, the adhesion/barrier layer 52 can be a chromium-containing layer, such as a single layer of chromium, with a thickness smaller than 1 micrometer, such as between 1 nanometer and 0.5 micrometers, and preferably between 0.1 and 0.2 micrometers, on the layers 18, 26 and 34 exposed by the through vias 170*v*, on the etched surface of the dielectric layer 60, on the sidewall dielectric layers 50, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer. The conduction layer 56 can be an electroplated copper layer having a thickness greater than 1 micrometer, such as between 1 and 20 micrometers, and preferably between 1 and 10 micrometers, between 1 and 5 micrometers, or between 2 and 20 micrometers, on the single layer of copper or a titanium-copper alloy.

Figure 91:
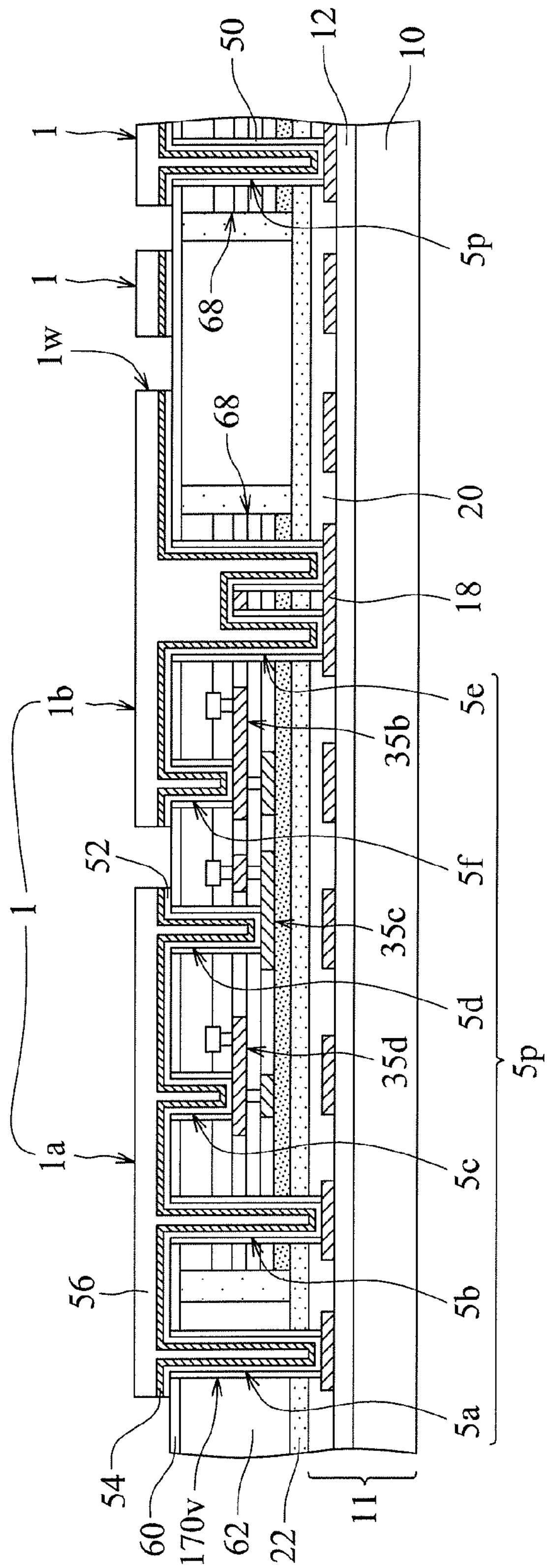

Next, referring to FIG. 91, the photoresist layer 194 is removed using, e.g., an organic chemical solution. Next, the seed layer 54 not under the conduction layer 56 is removed by using, e.g., a wet chemical etching process or a dry plasma etching process. Next, the adhesion/barrier layer 52 not under the conduction layer 56 is removed by using, e.g., a wet chemical etching process or a dry plasma etching process. Accordingly, the layers 52, 54 and 56 over the dielectric layer 60 and over the through vias 170*v* compose multiple metal interconnects 1, including metal interconnects 1*a* and 1*b*, over the dielectric layer 60 and over the through vias 170*v*. The adhesion/barrier layer 52 and the seed layer 54 of the metal interconnects 1 over the dielectric layer 60 are not at any sidewall 1*w* of the conduction layer 56 of the metal interconnects 1 over the dielectric layer 60, but under a bottom of the conduction layer 56 of the metal interconnects 1 over the dielectric layer 60. The sidewalls 1*w* of the conduction layer 56 of the metal interconnects 1 over the dielectric layer 60 are not covered by the layers 52 and 54. The layers 52, 54 and 56 in the through vias 170*v* compose multiple metal plugs (or metal vias) 5*p* in the through vias 170*v*, including metal plugs (or metal vias) 5*a*, 5*b*, 5*c*, 5*d*, 5*e* and 5*f* in the through vias 170*a*, 170*b*, 170*c*, 170*d*, 170*e* and 170*f* as shown in FIG. 89, respectively. Each of the metal plugs 5*p* in the chips 68 and in the dummy substrate(s) 62 is enclosed by one of the sidewall dielectric layers 50 in the through vias 170*v*. The metal plug 5*a* is formed in the dummy substrate 62, and the metal plugs 5*b*, 5*c*, 5*d*, 5*e* and 5*f* are formed in the same chip 68. The supporter 801 and the interconnect or metal trace 35*a*, in the interconnection layer 34, on the supporter 801 can be between two portions, lower than a horizontal level, at which a top surface of the interconnection layer 34 is positioned, of the metal plug 5*e*. These metal plugs 5*p* formed in the chips 68 and in the dummy substrate(s) 62 can connect the metal interconnects 1 and the semiconductor devices 36 in the chips 68 and connect the metal interconnects 1 and multiple contact points of the conductive layer 18 in the carrier 11.

For example, one of the metal plugs 5*p*, such as the metal plug 5*a*, can be formed in the dummy substrate 62 and formed on a first contact point of the conductive layer 18 at a bottom of one of the through vias 170*v*, such as the through via 170*a*. Another one of the metal plugs 5*p*, such as the metal plug 5*b*, can be formed in one of the chips 68 and formed on a second contact point of the conductive layer 18 at a bottom of another one of the through vias 170*v*, such as the through via 170*b*. Another one of the metal plugs 5*p*, such as the metal plug 5*c*, can be formed in one of the chips 68 and formed on a contact point, at a bottom of another one of the through vias 170*v* (such as the through via 170*c*), of the interconnect or metal trace 35*d* in the interconnection layer 34 of the one of the chips 68. Another one of the metal plugs 5*p*, such as the metal plug 5*d*, can be formed in one of the chips 68 and formed on a contact point, at a bottom of another one of the through vias 170*v* (such as the through via 170*d*), of the interconnect or metal trace 35*c* in the patterned metal layer 26 of the one of the chips 68. Another one of the metal plugs 5*p*, such as the metal plug 5*f*, can be formed in one of the chips 68 and formed on a contact point, at a bottom of another one of the through vias 170*v* (such as the through via 170*f*), of the interconnect or metal trace 35*b* in the interconnection layer 34 of the one of the chips 68. Another one of the metal plugs 5*p*, such as the metal plug 5*e*, can be formed in one of the chips 68, formed on a contact point of the interconnect or metal trace 35*a* over a supporter (such as the supporter 801) that is between two lower left and right portions of the another one of the metal plugs 5*p* (such as the metal plug 5*e*), and formed on a third contact point of the conductive layer 18 at a bottom of one of the through vias 170*v* (such as the through via 170*e*). The previously described first, second and third contact points of the conductive layer 18 can be separated from one another by the dielectric or insulating layer 20 of the carrier 11.

One of the metal interconnects 1, such as 1*a* or 1*b*, can be formed over the dummy substrate(s) 62, over multiple of the chips 68, and across multiple edges of the multiple of the chips 68. The metal interconnect 1*a* can be connected to the previously described first contact point of the conductive layer 18 at the bottom of the through via 170*a* through the metal plug 5*a* in the dummy substrate 62, can be connected to the previously described second contact point of the conductive layer 18 at the bottom of the through via 170*b* through the metal plug 5*b* in one of the chips 68, can be connected to the contact point, at the bottom of the through via 170*c*, of the interconnect or metal trace 35*d* in the one of the chips 68 through the metal plug 5*c* in the one of the chips 68, and can be connected to the contact point, at the bottom of the through via 170*d*, of the interconnect or metal trace 35*c* in the one of the chips 68 through the metal plug 5*d* in the one of the chips 68. The metal interconnect 1*b* can be connected to the contact point, at the bottom of the through via 170*f*, of the interconnect or metal trace 35*b* in the one of the chips 68 through the metal plug 5*f* in the one of the chips 68, can be connected to the previously described third contact point of the conductive layer 18 at the bottom of the through via 170*e* through the metal plug 5*e* in the one of the chips 68, and can be connected to the interconnect or metal trace 35*a* on the supporter 801 through the metal plug 5*e* in the one of the chips 68. The metal interconnect 1*a* can be further connected to one or more of the semiconductor devices 36 in another one of chips 68 through one or more of the metal plugs 5*p* in the another one of chips 68. The metal interconnect 1*b* can be further connected to one or more of the semiconductor devices 36 in another one of chips 68 through one or more of the metal plugs 5*p* in the another one of chips 68.

Accordingly, one of the semiconductor devices 36 in one of the chips 68 can be connected to another one of the semiconductor devices 36 in the one of the chips 68 or in another one of the chips 68 through one of the metal interconnects 1, such as 1*a* or 1*b*, and can be connected to a contact point, at a bottom of one of the through vias 170*v* (such as the through via 170*a*, 170*b* or 170*e*), of the conductive layer 18 in the carrier 11 through the one of the metal interconnects 1. Each of the metal interconnects 1 can be a signal trace, a bit line, a clock bus, a power plane, a power bus, a power trace, a ground plane, a ground bus, or a ground trace.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

Figure 92:
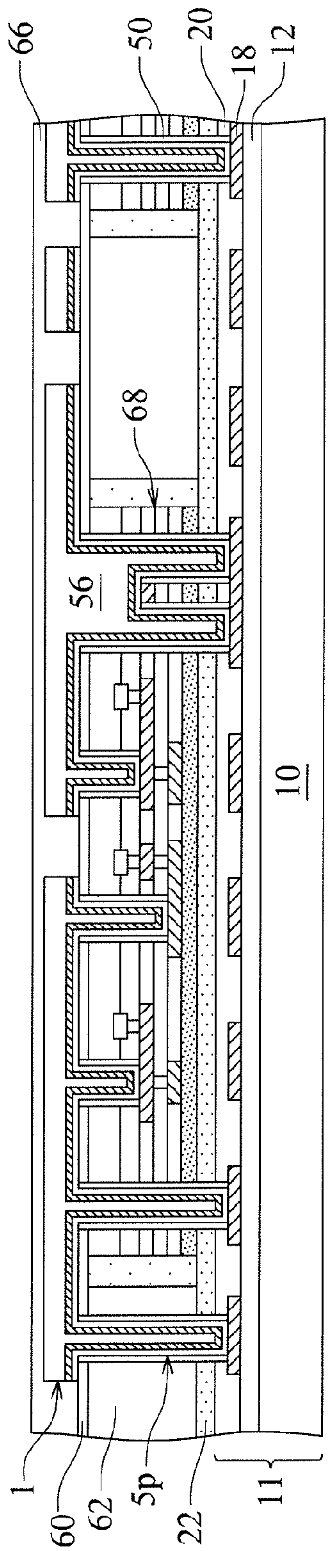

Next, referring to FIG. 92, an insulating or dielectric layer 66 having a thickness, e.g., between 0.3 and 10 micrometers, and preferably between 0.3 and 5 micrometers, between 0.3 and 3 micrometers, between 0.3 and 2 micrometers, or between 0.3 and 1 micrometers, can be formed on the conduction layer 56 of the metal interconnects 1, on the etched surface of the dielectric layer 60, and in gaps between the metal interconnects 1.

The insulating or dielectric layer 66, for example, may include or can be a polymer layer, such as a layer of polyimide, benzocyclobutene (BCB), epoxy, poly-phenylene oxide (PPO), or polybenzoxazole (PBO), on the conduction layer 56 of the metal interconnects 1, on the etched surface of the dielectric layer 60, and in the gaps between the metal interconnects 1. The polymer layer on the conduction layer 56 may have a thickness, e.g., between 0.3 and 10 micrometers, and preferably between 0.3 and 5 micrometers, between 0.3 and 3 micrometers, between 0.3 and 2 micrometers, or between 0.3 and 1 micrometers.

Alternatively, the insulating or dielectric layer 66 may include or can be an inorganic layer, such as a layer of silicon oxide (such as $SiO_2$), silicon nitride (such as $Si_3N_4$), silicon carbon nitride (such as SiCN), silicon oxynitride (such as SiON), or silicon oxycarbide (such as SiOC), on the conduction layer 56 of the metal interconnects 1, on the etched surface of the dielectric layer 60, and in the gaps between the metal interconnects 1. The inorganic layer on the conduction layer 56 may have a thickness, e.g., between 0.3 and 10 micrometers, and preferably between 0.3 and 5 micrometers, between 0.3 and 3 micrometers, between 0.3 and 2 micrometers, or between 0.3 and 1 micrometers.

Figure 93:
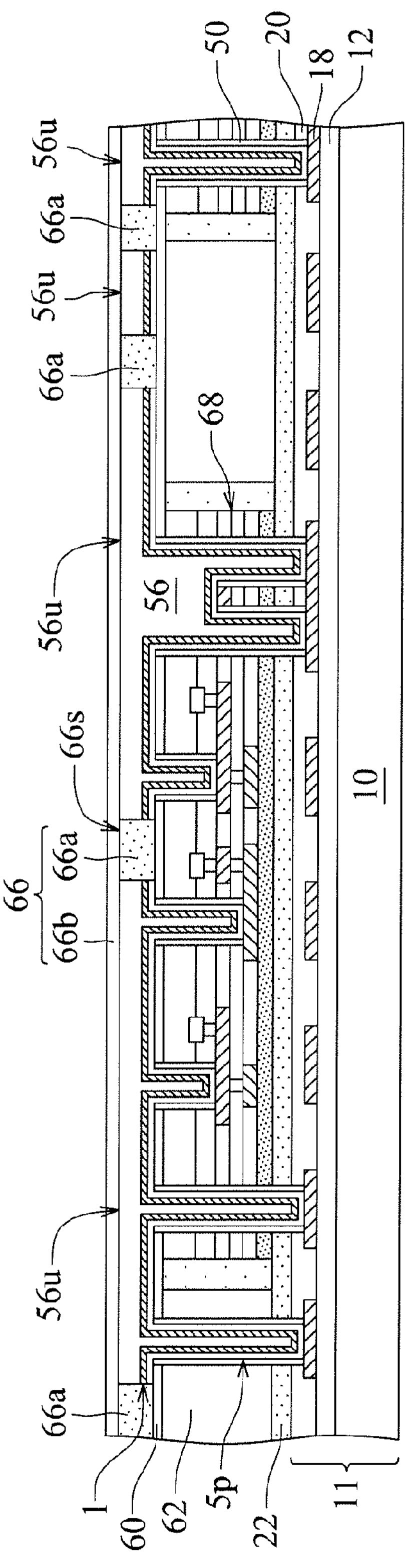

Alternatively, referring to FIG. 93, the insulating or dielectric layer 66 as shown in FIG. 92 can be formed by the following steps. First, a polymer layer 66*a*, such as a layer of polyimide, benzocyclobutene (BCB), epoxy, poly-phenylene oxide (PPO), or polybenzoxazole (PBO), is formed on the conduction layer 56 of the metal interconnects 1, on the etched surface of the dielectric layer 60, and in the gaps between the metal interconnects 1. Next, the polymer layer 66*a* is ground or polished by, e.g., a mechanical grinding process, a mechanical polishing process, a chemical-mechanical-polishing (CMP) process, or a process including mechanical polishing and chemical etching until the conduction layer 56 of the metal interconnects 1 has a top surface 56*u* not covered by the polymer layer 66*a*. Accordingly, the polymer layer 66*a* remains on the etched surface of the dielectric layer 60 and in the gaps between the metal interconnects 1 and has a thickness, e.g., greater than 1 micrometer, such as between 1 and 20 micrometers, and preferably between 1 and 10 micrometers, between 1 and 5 micrometers, or between 2 and 20 micrometers. The ground or polished surface 66*s* of the polymer layer 66*a* can be substantially flat and substantially coplanar with the top surface 56*u* of the conduction layer 56. Next, an inorganic layer 66*b*, such as a layer of silicon oxide, silicon nitride, silicon carbon nitride, silicon oxynitride, or silicon oxycarbide, having a thickness, e.g., between 0.1 and 3 micrometers, and preferably between 0.2 and 1.5 micrometers, is formed on the top surface 56*u* of the conduction layer 56 and on the ground or polished surface 66*s* of the polymer layer 66*a*. Accordingly, the insulating or dielectric layer 66 as shown in FIG. 92 also can be provided with the polymer layer 66*a* and the inorganic layer 66*b* as shown in FIG. 93.

Figure 94:
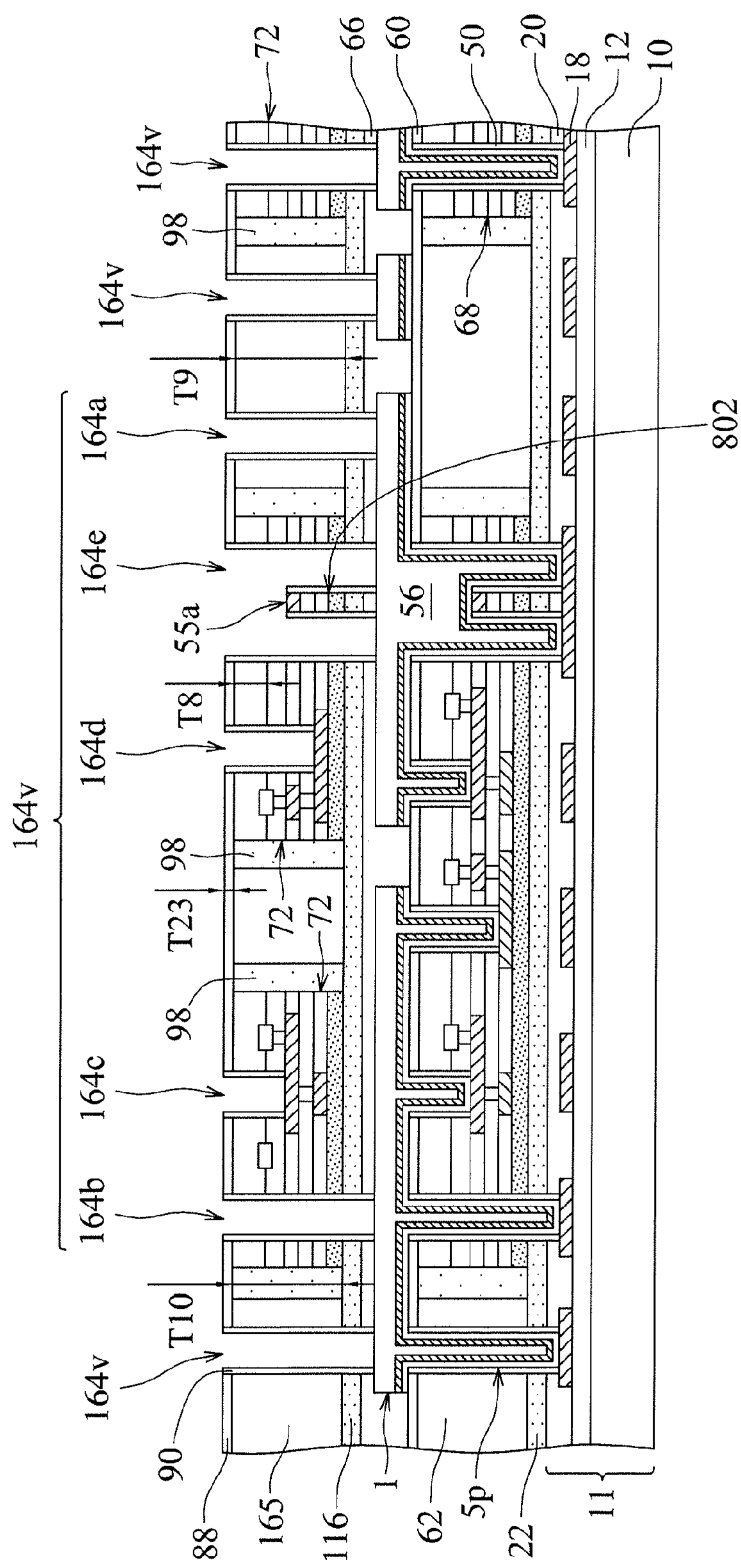

Referring to FIG. 94, after forming the insulating or dielectric layer 66, the following steps can be subsequently performed as illustrated in FIGS. 28-45 to place the chips 72 and the dummy substrate(s) 165 over the layer 116 formed on the layer 66, to form the encapsulation/gap filling material 98 on the backside of the semiconductor substrate 96 of each chip 72, on the dummy substrate(s) 165, and in the gaps 4*a* and 8*a*, to grind or polish the encapsulation/gap filling material 98, the backside of the semiconductor substrate 96 of each chip 72, and the dummy substrate(s) 165, to form the dielectric layer 88 on the ground or polished surfaces 96*s*, 165*s* and 98*s*, to form the through vias 164*v* in the chips 72 and in the dummy substrate(s) 165, and to form the dielectric layer 90 on the top surface of the dielectric layer 88, on the layers 56, 106 and 114 exposed by the through vias 164*v*, and on the sidewalls of the through vias 164*v*. Next, by using an etching process (such as anisotropic etching process), the dielectric layer 90 formed on the layers 56, 106 and 114 and on the top surface of the dielectric layer 88 is etched away, and a top portion of the dielectric layer 88 is further etched away. After the etching process, the dielectric layer 88 may have a remaining thickness T23 between 0.3 and 5 micrometers, between 0.5 and 2 micrometers, between 0.05 and 2 micrometers, between 0.05 and 1 micrometers, between 0.05 and 0.5 micrometers, or between 0.05 and 0.3 micrometers.

Alternatively, an etching-stop technique may be applied to the process of etching away the top portion of the dielectric layer 88. In this case, the dielectric layer 88 is composed of the previously described inorganic layers, e.g., including the first silicon-oxide layer on the surfaces 96*s*, 98*s* and 165*s*, the silicon-oxynitride layer, used as the etch stop layer, on the first silicon-oxide layer, and the second silicon-oxide layer on the silicon-oxynitride layer. During the etching process, the top portion of the dielectric layer 88, that is, the second silicon-oxide layer, can be etched away until the etch stop layer, that is, the silicon-oxynitride layer, is exposed and all of the second silicon-oxide layer is removed. The remaining dielectric layer 88, composed of the silicon-oxynitride layer and the first silicon-oxide layer, may have a thickness T23 between 0.3 and 5 micrometers, between 0.5 and 2 micrometers, between 0.05 and 2 micrometers, between 0.05 and 1 micrometers, between 0.05 and 0.5 micrometers, or between 0.05 and 0.3 micrometers.

Accordingly, the dielectric layer 90 at bottoms of the through vias 164*v*, on the top surface of the dielectric layer 88 and on a top surface of the interconnect or metal trace 55*a* on the supporter 802 is etched away, and the dielectric layer 90 remains on the sidewalls of the through vias 164*v*, so called as sidewall dielectric layers in the through vias 164*v*. The sidewall dielectric layers 90 are formed on the sidewalls of the through vias 164*v* in the chips 72 or in the dummy substrate(s) 165 and are enclosed by the semiconductor substrates 96 of the chips 72 or by the dummy substrate(s) 165.

Figure 95:
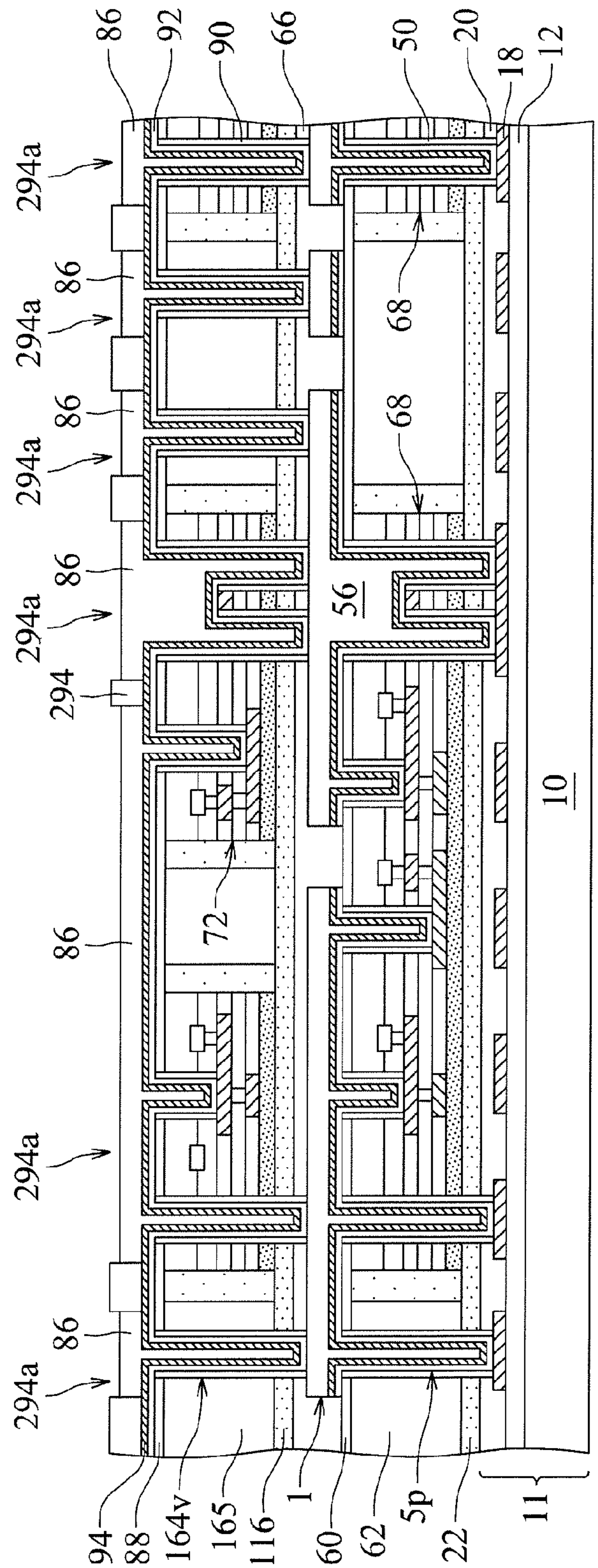

Next, referring to FIG. 95, an adhesion/barrier layer 92 having a thickness smaller than 1 micrometer, such as between 1 nanometer and 0.5 micrometers, and preferably between 0.1 and 0.2 micrometers, can be formed on the layers 56, 106 and 114 exposed by the through vias 164*v*, on the etched surface of the dielectric layer 88, on the sidewall dielectric layers 90, and on the interconnect or metal trace 55*a* that is on the supporter 802. The adhesion/barrier layer 92 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 94 having a thickness smaller than 1 micrometer, such as between 10 nanometers and 0.8 micrometers, and preferably between 80 nanometers and 0.15 micrometers, can be formed on the adhesion/barrier layer 92 by a physical vapor deposition (PVD) process, such as sputtering process or evaporation process, by a chemical-vapor deposition (CVD) process, or by other thin-film deposition processes, such as atomic layer deposition (ALD). Next, a photoresist layer 294 can be formed on the seed layer 94 by using, e.g., a spin coating process, a screen printing process, or a lamination process. Next, a photo exposure process and a development process can be employed to form multiple openings 294*a*, exposing multiple regions of the seed layer 94, in the photoresist layer 294. The patterned photoresist layer 294 may have a thickness, e.g., between 1 and 30 micrometers, and preferably between 1 and 20 micrometers or between 1 and 10 micrometers. Next, a conduction layer 86 having a thickness greater than 1 micrometer, such as between 1 and 20 micrometers, and preferably between 1 and 10 micrometers, between 1 and 5 micrometers, or between 2 and 20 micrometers, can be formed on the regions, exposed by the openings 294*a* in the layer 294, of the seed layer 94 by using a suitable process, such as electroplating process.

The adhesion/barrier layer 92 may include or can be a layer of titanium, a titanium-tungsten alloy, titanium nitride, chromium, tantalum, tantalum nitride, nickel, or nickel vanadium having a thickness smaller than 1 micrometer, such as between 1 nanometer and 0.5 micrometers, and preferably between 0.1 and 0.2 micrometers. The seed layer 94 may include or can be a layer of copper, a titanium-copper alloy, nickel, gold, or silver having a thickness smaller than 1 micrometer, such as between 10 nanometers and 0.8 micrometers, and preferably between 80 nanometers and 0.15 micrometers. The conduction layer 86 may include or can be an electroplated metal layer of copper, gold, or silver having a thickness greater than 1 micrometer, such as between 1 and 20 micrometers, and preferably between 1 and 10 micrometers, between 1 and 5 micrometers, or between 2 and 20 micrometers.

For example, the adhesion/barrier layer 92 can be a titanium-containing layer, such as a single layer of titanium-tungsten alloy, titanium, or titanium nitride, with a thickness smaller than 1 micrometer, such as between 1 nanometer and 0.5 micrometers, and preferably between 0.1 and 0.2 micrometers, on the layers 56, 106 and 114 exposed by the through vias 164*v*, on the etched surface of the dielectric layer 88, on the sidewall dielectric layers 90, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer. The conduction layer 86 can be an electroplated copper layer having a thickness greater than 1 micrometer, such as between 1 and 20 micrometers, and preferably between 1 and 10 micrometers, between 1 and 5 micrometers, or between 2 and 20 micrometers, on the single layer of copper or a titanium-copper alloy.

Alternatively, the adhesion/barrier layer 92 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the layers 56, 106 and 114 exposed by the through vias 164*v*, on the etched surface of the dielectric layer 88, on the sidewall dielectric layers 90, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer. The conduction layer 86 can be an electroplated copper layer having a thickness greater than 1 micrometer, such as between 1 and 20 micrometers, and preferably between 1 and 10 micrometers, between 1 and 5 micrometers, or between 2 and 20 micrometers, on the single layer of copper or a titanium-copper alloy.

Alternatively, the adhesion/barrier layer 92 can be a chromium-containing layer, such as a single layer of chromium, with a thickness smaller than 1 micrometer, such as between 1 nanometer and 0.5 micrometers, and preferably between 0.1 and 0.2 micrometers, on the layers 56, 106 and 114 exposed by the through vias 164*v*, on the etched surface of the dielectric layer 88, on the sidewall dielectric layers 90, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer. The conduction layer 86 can be an electroplated copper layer having a thickness greater than 1 micrometer, such as between 1 and 20 micrometers, and preferably between 1 and 10 micrometers, between 1 and 5 micrometers, or between 2 and 20 micrometers, on the single layer of copper or a titanium-copper alloy.

Figure 96:
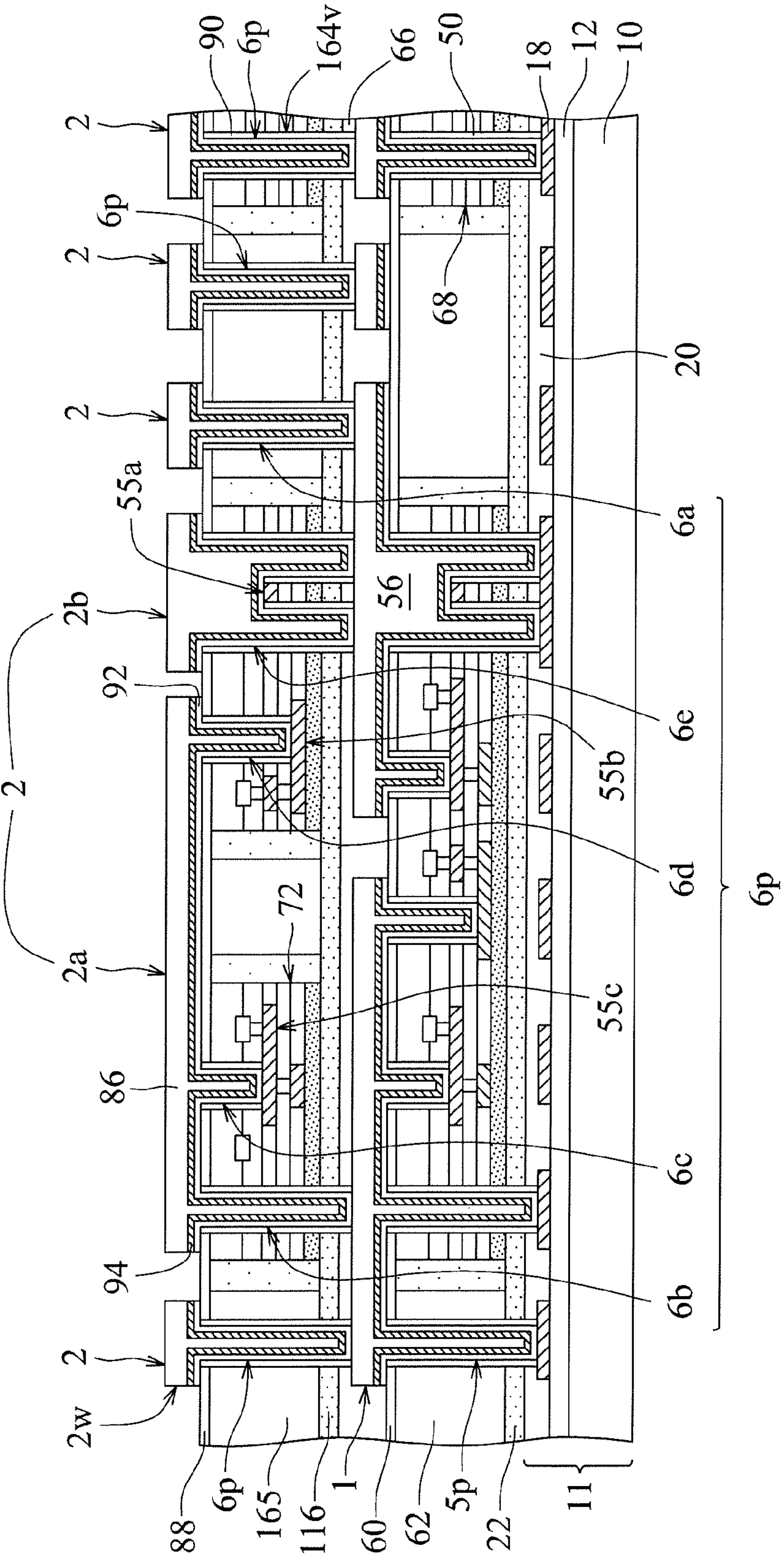

Next, referring to FIG. 96, the photoresist layer 294 is removed using, e.g., an organic chemical solution. Next, the seed layer 94 not under the conduction layer 86 is removed by using, e.g., a wet chemical etching process or a dry plasma etching process. Next, the adhesion/barrier layer 92 not under the conduction layer 86 is removed by using, e.g., a wet chemical etching process or a dry plasma etching process. Accordingly, the layers 92, 94 and 86 over the dielectric layer 88 and over the through vias 164*v* compose multiple metal interconnects 2, including two metal interconnects 2*a* and 2*b*, over the dielectric layer 88 and over the through vias 164*v*. The adhesion/barrier layer 92 and the seed layer 94 of the metal interconnects 2 over the dielectric layer 88 are not at any sidewall 2*w* of the conduction layer 86 of the metal interconnects 2 over the dielectric layer 88, but under a bottom of the conduction layer 86 of the metal interconnects 2 over the dielectric layer 88. The sidewalls 2*w* of the conduction layer 86 of the metal interconnects 2 over the dielectric layer 88 are not covered by the layers 92 and 94. The layers 92, 94 and 86 in the through vias 164*v* compose multiple metal plugs (or metal vias) 6*p* in the through vias 164*v*, including metal plugs (or metal vias) 6*a*, 6*b*, 6*c*, 6*d* and 6*e* in the through vias 164*a*, 164*b*, 164*c*, 164*d* and 164*e* as shown in FIG. 94, respectively. Each of the metal plugs 6*p* in the chips 72 and in the dummy substrate(s) 165 is enclosed by one of the sidewall dielectric layers 90 in the through vias 164*v*. The metal plug 6*a* is formed in the dummy substrate 165, the metal plugs 6*b* and 6*c* are formed in one of the chips 72, and the metal plugs 6*d* and 6*e* are formed in another one of the chips 72. The supporter 802 and the interconnect or metal trace 55*a*, in the interconnection layer 106, on the supporter 802 can be between two portions, lower than a horizontal level, at which a top surface of the interconnection layer 106 is positioned, of the metal plug 6*e*. These metal plugs 6*p* formed in the chips 72 and in the dummy substrate(s) 165 can connect the metal interconnects 2 and the semiconductor devices 102 in the chips 72 and connect the metal interconnects 1 and 2.

For example, one of the metal plugs 6*p*, such as the metal plug 6*a*, can be formed in the dummy substrate 165 and formed on a contact point, at a bottom of one of the through vias 164*v* (such as the through via 164*a*), of the conduction layer 56 of one of the metal interconnects 1, such as the metal interconnect 1*b*. Another one of the metal plugs 6*p*, such as the metal plug 6*e*, can be formed in one of the chips 72, formed on a contact point of the interconnect or metal trace 55*a* over a supporter (such as the supporter 802) that is between two lower left and right portions of the another one of the metal plugs 6*p* (such as the metal plug 6*e*), and formed on another contact point, at a bottom of another one of the through vias 164*v* (such as the through via 164*e*), of the conduction layer 56 in the one of the metal interconnects 1, such as the metal interconnect 1*b*. Another one of the metal plugs 6*p*, such as the metal plug 6*d*, can be formed in the one of the chips 72 and formed on a contact point, at a bottom of another one of the through vias 164*v* (such as the through via 164*d*), of the interconnect or metal trace 55*b* in the one of the chips 72. Another one of the metal plugs 6*p*, such as the metal plug 6*b*, can be formed in another one of the chips 72 and formed on another contact point, at a bottom of another one of the through vias 164*v* (such as the through via 164*b*), of the conduction layer 56 in another one of the metal interconnects 1, such as the metal interconnect 1*a*. Another one of the metal plugs 6*p*, such as the metal plug 6*c*, can be formed in the another one of the chips 72 and formed on a contact point, at a bottom of another one of the through vias 164*v* (such as the through via 164*c*), of the interconnect or metal trace 55*c* in the another one of the chips 72.

The metal interconnect 2*a* can be formed over the dummy substrate(s) 165, over multiple of the chips 72, and across multiple edges of the multiple of the chips 72. The metal interconnect 2*a* can be connected to a contact point, at a bottom of the through via 164*b*, of the metal interconnect 1*a* through the metal plug 6*b* in one of the chips 72, can be connected to a contact point, at a bottom of the through via 164*c*, of the interconnect or metal trace 55*c* in the one of the chips 72 through the metal plug 6*c* in the one of the chips 72, and can be connected to a contact point, at a bottom of the through via 164*d*, of the interconnect or metal trace 55*b* in another one of the chips 72 through the metal plug 6*d* in the another one of the chips 72. These contact points at the bottoms of the through vias 164*b*, 164*c* and 164*d* can be connected to each other through the metal interconnect 2*a*.

The metal interconnect 2*b* can be formed over multiple of the chips 72 to connect multiple of the semiconductor devices 102 in the multiple of the chips 72. The metal interconnect 2*b* can be connected to a contact point, at a bottom of the through via 164*e*, of the metal interconnect 1*b* through the metal plug 6*e* in one of the chips 72, can be connected to one or more of the semiconductor devices 102 in the one of the chips 72 through the metal plug 6*e* and the interconnect or metal trace 55*a* in the one of the chips 72, and can be connected to a contact point, at a bottom of another one of the through vias 164*v*, of the interconnect or metal trace 55*a*, 55*b* or 55*c* in another one of the chips 72 through another one of the metal plugs 6*p* in the another one of the chips 72.

Accordingly, one of the semiconductor devices 102 in one of the chips 72 can be connected to another one of the semiconductor devices 102 in the one of the chips 72 or in another one of the chips 72 through one of the metal interconnects 2, such as 2*a* or 2*b*, and can be connected to a contact point, at a bottom of one of the through vias 164*v* (such as the through via 164*a*, 164*b*, or 164*e*), of the conduction layer 56 of one of the metal interconnects 1, such as 1*a* or 1*b*, through the one of the metal interconnects 2. Each of the metal interconnects 2 can be a signal trace, a bit line, a clock bus, a power plane, a power bus, a power trace, a ground plane, a ground bus, or a ground trace.

Alternatively, the element 72 not only can indicate a chip, but also can indicate a wafer. When the element 72 is a wafer, the element 68 can be another wafer. Thereby, the process illustrated in the invention can be employed to the wafer-to-wafer bonding.

Figure 97:
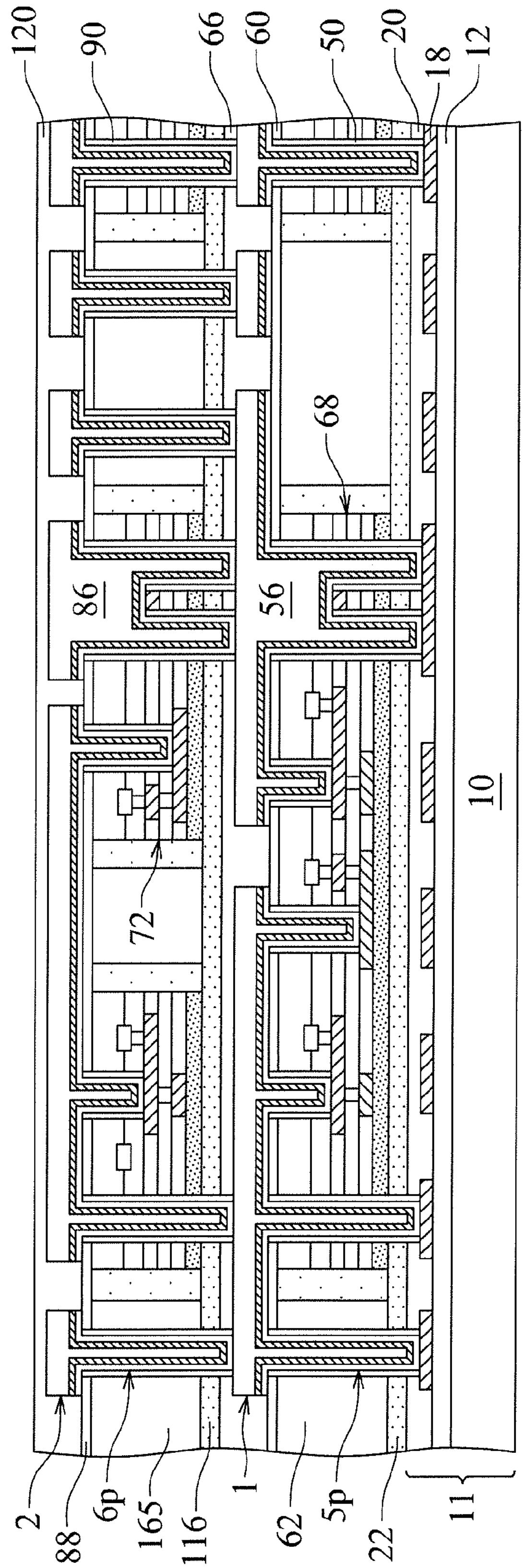

Next, referring to FIG. 97, an insulating or dielectric layer 120 having a thickness, e.g., between 0.3 and 10 micrometers, and preferably between 0.3 and 5 micrometers, between 0.3 and 3 micrometers, between 0.3 and 2 micrometers, or between 0.3 and 1 micrometers, is formed on the conduction layer 86 of the metal interconnects 2, on the etched surface of the dielectric layer 88, and in gaps between the metal interconnects 2.

The insulating or dielectric layer 120, for example, may include or can be a polymer layer, such as a layer of polyimide, benzocyclobutene (BCB), epoxy, poly-phenylene oxide (PPO), or polybenzoxazole (PBO), on the conduction layer 86 of the metal interconnects 2, on the etched surface of the dielectric layer 88, and in the gaps between the metal interconnects 2. The polymer layer on the conduction layer 86 may have a thickness, e.g., between 0.3 and 10 micrometers, and preferably between 0.3 and 5 micrometers, between 0.3 and 3 micrometers, between 0.3 and 2 micrometers, or between 0.3 and 1 micrometers.

Alternatively, the insulating or dielectric layer 120 may include or can be an inorganic layer, such as a layer of silicon oxide (such as $SiO_2$), silicon nitride (such as $Si_3N_4$), silicon carbon nitride (such as SiCN), silicon oxynitride (such as SiON), or silicon oxycarbide (such as SiOC), on the conduction layer 86 of the metal interconnects 2, on the etched surface of the dielectric layer 88, and in the gaps between the metal interconnects 2. The inorganic layer on the conduction layer 86 may have a thickness, e.g., between 0.3 and 10 micrometers, and preferably between 0.3 and 5 micrometers, between 0.3 and 3 micrometers, between 0.3 and 2 micrometers, or between 0.3 and 1 micrometers.

Figure 98:
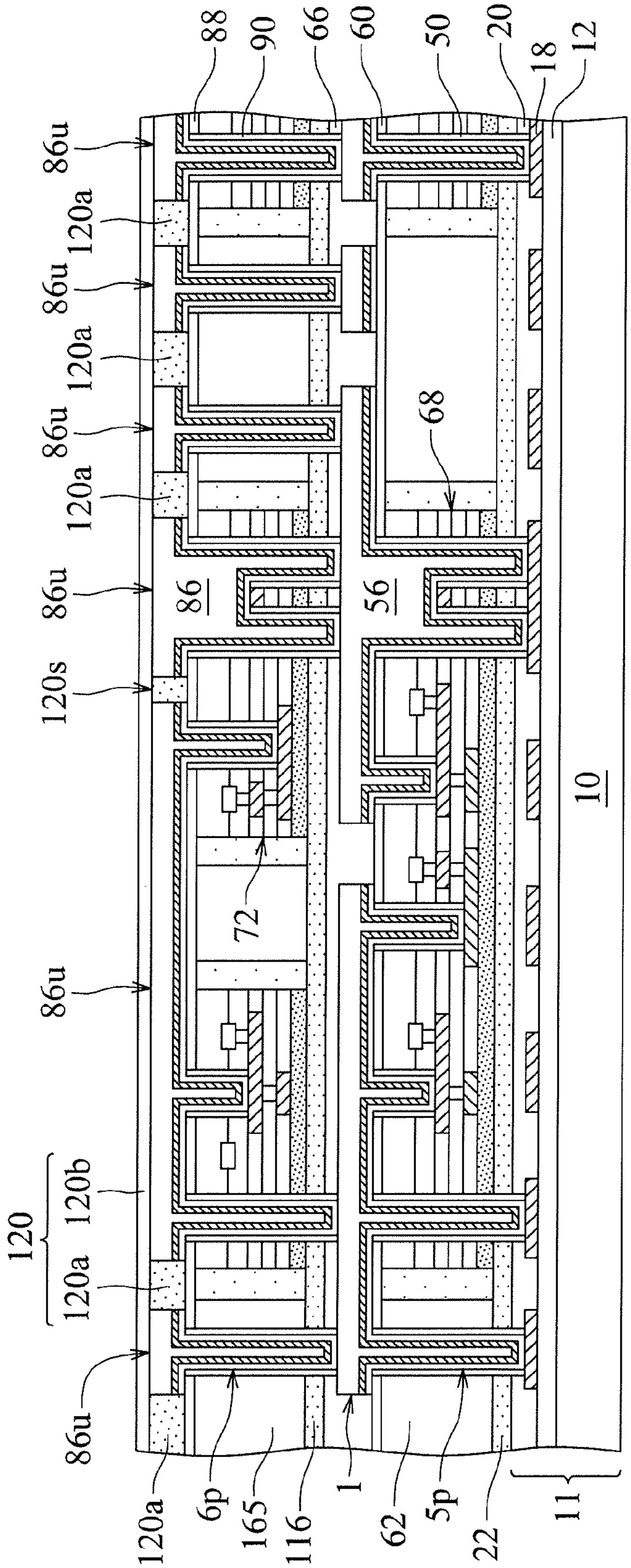

Alternatively, referring to FIG. 98, the insulating or dielectric layer 120 as shown in FIG. 97 can be formed by the following steps. First, a polymer layer 120*a*, such as a layer of polyimide, benzocyclobutene (BCB), epoxy, poly-phenylene oxide (PPO), or polybenzoxazole (PBO), is formed on the conduction layer 86 of the metal interconnects 2, on the etched surface of the dielectric layer 88, and in the gaps between the metal interconnects 2. Next, the polymer layer 120*a* is ground or polished by, e.g., a mechanical grinding process, a mechanical polishing process, a chemical-mechanical-polishing (CMP) process, or a process including mechanical polishing and chemical etching until the conduction layer 86 of the metal interconnects 2 has a top surface 86*u* not covered by the polymer layer 120*a*. Accordingly, the polymer layer 120*a* remains on the dielectric layer 88 and in the gaps between the metal interconnects 2 and has a thickness, e.g., greater than 1 micrometer, such as between 1 and 20 micrometers, and preferably between 1 and 10 micrometers, between 1 and 5 micrometers, or between 2 and 20 micrometers. The ground or polished surface 120*s* of the polymer layer 120*a* can be substantially flat and substantially coplanar with the top surface 86*u* of the conduction layer 86. Next, an inorganic layer 120*b*, such as a layer of silicon oxide, silicon nitride, silicon carbon nitride, silicon oxynitride, or silicon oxycarbide, having a thickness, e.g., between 0.1 and 3 micrometers, and preferably between 0.2 and 1.5 micrometers, is formed on the top surface 86*u* of the conduction layer 86 and on the ground or polished surface 120*s* of the polymer layer 120*a*. Accordingly, the insulating or dielectric layer 120 as shown in FIG. 97 can be composed of the polymer layer 120*a* and the inorganic layer 120*b* as shown in FIG. 98.

Figure 99:
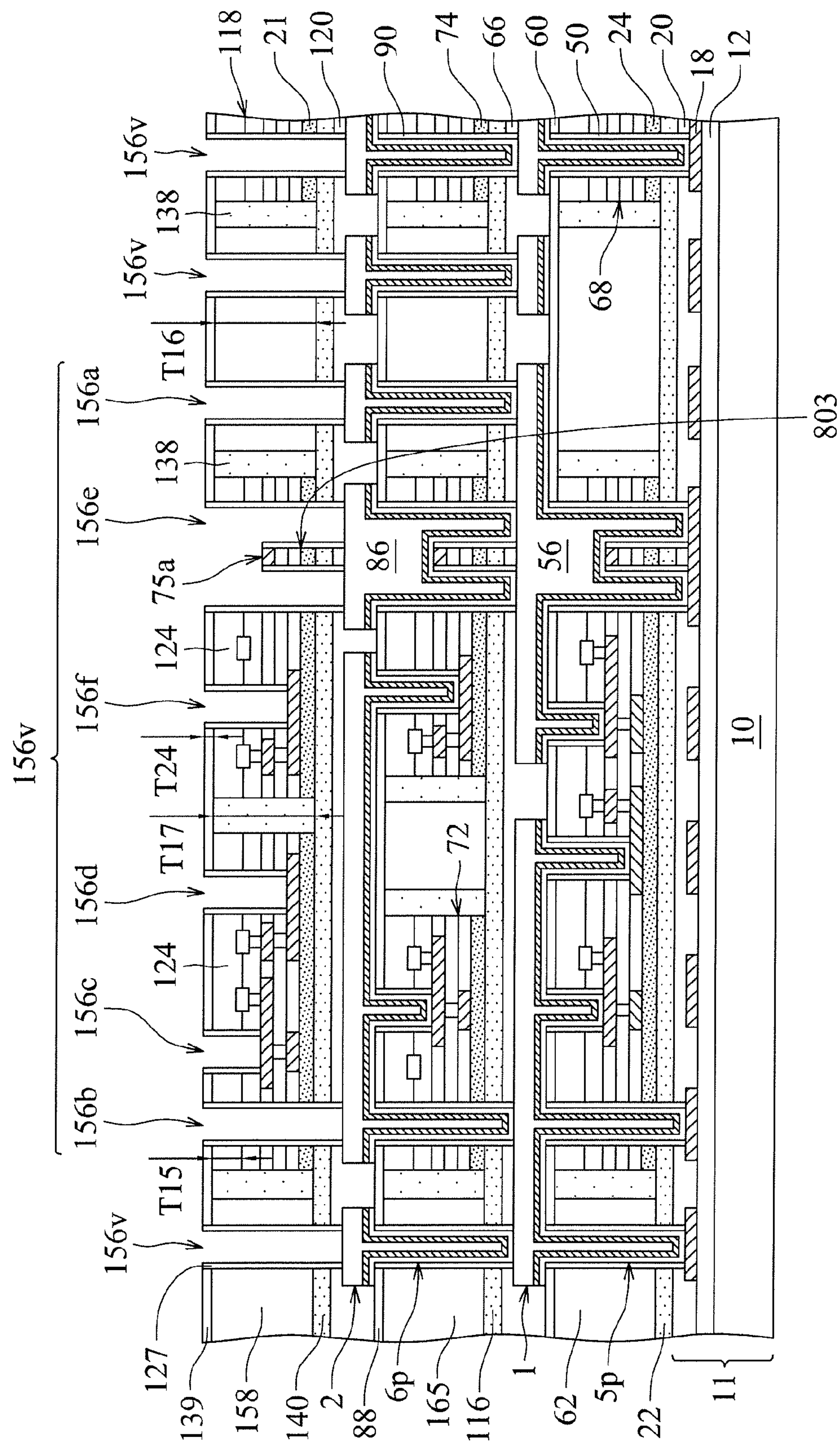

Referring to FIG. 99, after forming the insulating or dielectric layer 120, the following steps can be subsequently performed as illustrated in FIGS. 54-69 to place the chips 118 and the dummy substrate(s) 158 over the layer 140 formed on the layer 120, to form the encapsulation/gap filling material 138 on the backside of the semiconductor substrate 124 of each chip 118, on the dummy substrate(s) 158, and in the gaps 4*b* and 8*b*, to grind or polish the encapsulation/gap filling material 138, the backside of the semiconductor substrate 124 of each chip 118, and the dummy substrate(s) 158, to form the dielectric layer 139 on the ground or polished surfaces 124*s*, 138*s* and 158*s*, to form the through vias 156*v* in the chips 118 and in the dummy substrate(s) 158, and to form the dielectric layer 127 on the top surface of the dielectric layer 139, on the layers 17, 19 and 86 exposed by the through vias 156*v*, and on the sidewalls of the through vias 156*v*. Next, by using an etching process (such as anisotropic etching process), the dielectric layer 127 formed on the layers 17, 19 and 86 and on the top surface of the dielectric layer 139 is etched away, and a top portion of the dielectric layer 139 is further etched away. After the etching process, the dielectric layer 139 may have a remaining thickness T24 between 0.3 and 5 micrometers, between 0.5 and 2 micrometers, between 0.05 and 2 micrometers, between 0.05 and 1 micrometers, between 0.05 and 0.5 micrometers, or between 0.05 and 0.3 micrometers.

Alternatively, an etching-stop technique may be applied to the process of etching away the top portion of the dielectric layer 139. In this case, the dielectric layer 139 is composed of the previously described inorganic layers, e.g., including the first silicon-oxide layer on the surfaces 124*s*, 138*s* and 158*s*, the silicon-oxynitride layer, used as the etch stop layer, on the first silicon-oxide layer, and the second silicon-oxide layer on the silicon-oxynitride layer. During the etching process, the top portion of the dielectric layer 139, that is, the second silicon-oxide layer, can be etched away until the etch stop layer, that is, the silicon-oxynitride layer, is exposed and all of the second silicon-oxide layer is removed. The remaining dielectric layer 139, composed of the silicon-oxynitride layer and the first silicon-oxide layer, may have a thickness T24 between 0.3 and 5 micrometers, between 0.5 and 2 micrometers, between 0.05 and 2 micrometers, between 0.05 and 1 micrometers, between 0.05 and 0.5 micrometers, or between 0.05 and 0.3 micrometers.

Accordingly, the dielectric layer 127 at bottoms of the through vias 156*v*, on the top surface of the dielectric layer 139 and on a top surface of the interconnect or metal trace 75*a* on the supporter 803 is etched away, and the dielectric layer 127 remains on the sidewalls of the through vias 156*v*, so called as sidewall dielectric layers in the through vias 156*v*. The sidewall dielectric layers 127 are formed on the sidewalls of the through vias 156*v* in the chips 118 or in the dummy substrate(s) 158 and are enclosed by the semiconductor substrates 124 of the chips 118 or by the dummy substrate(s) 158.

Figure 100:
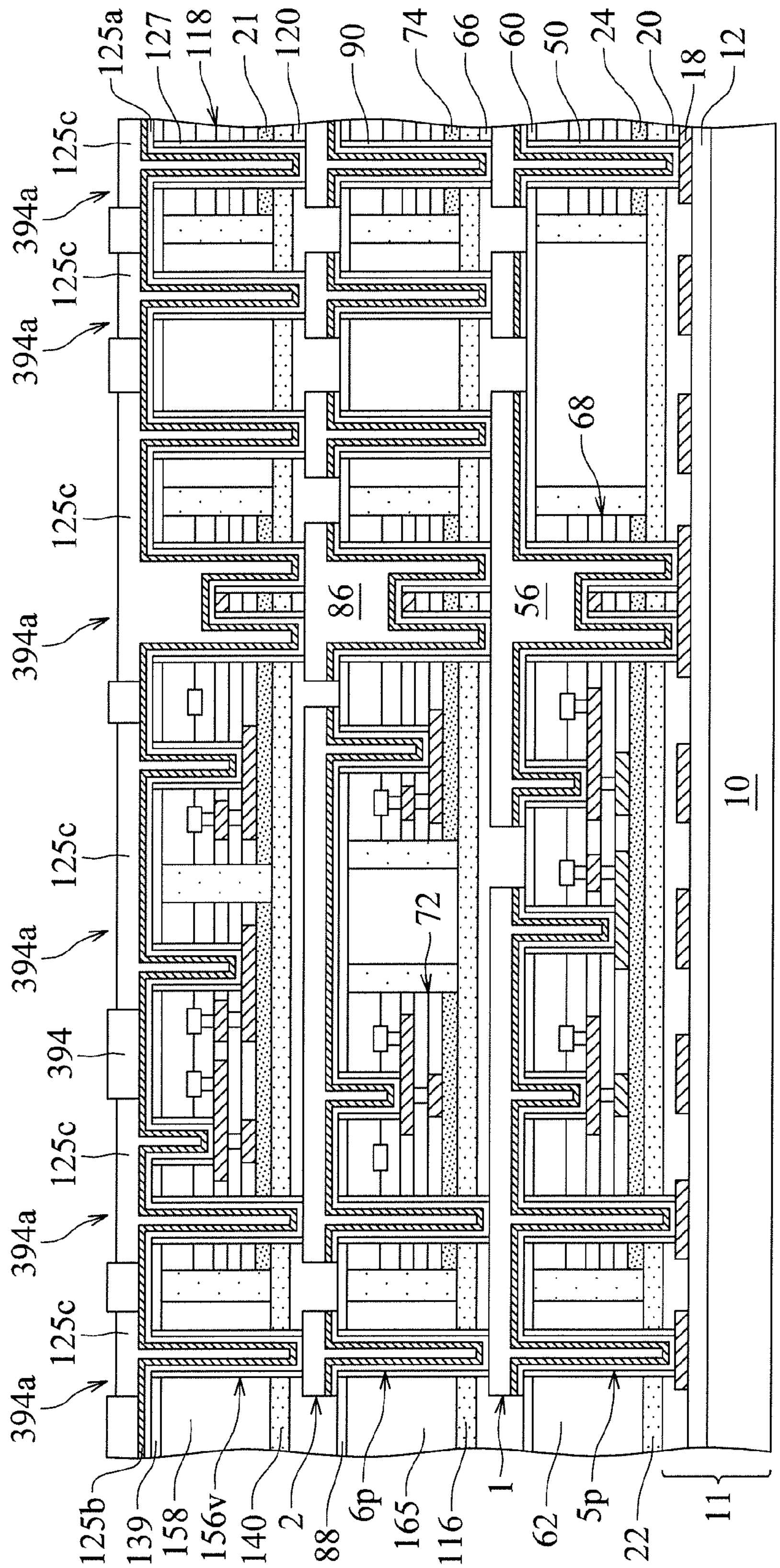

Next, referring to FIG. 100, an adhesion/barrier layer 125*a* having a thickness smaller than 1 micrometer, such as between 1 nanometer and 0.5 micrometers, and preferably between 0.1 and 0.2 micrometers, can be formed on the layers 17, 19 and 86 exposed by the through vias 156*v*, on the etched surface of the dielectric layer 139, on the sidewall dielectric layers 127, and on the interconnect or metal trace 75*a* that is on the supporter 803. The adhesion/barrier layer 125*a* can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 125*b* having a thickness smaller than 1 micrometer, such as between 10 nanometers and 0.8 micrometers, and preferably between 80 nanometers and 0.15 micrometers, can be formed on the adhesion/barrier layer 125*a* by a physical vapor deposition (PVD) process, such as sputtering process or evaporation process, by a chemical-vapor deposition (CVD) process, or by other thin-film deposition processes, such as atomic layer deposition (ALD). Next, a photoresist layer 394 can be formed on the seed layer 125*b* by using, e.g., a spin coating process, a screen printing process, or a lamination process. Next, a photo exposure process and a development process can be employed to form multiple openings 394*a*, exposing multiple regions of the seed layer 125*b*, in the photoresist layer 394. The patterned photoresist layer 394 may have a thickness, e.g., between 1 and 30 micrometers, and preferably between 1 and 20 micrometers or between 1 and 10 micrometers. Next, a conduction layer 125*c* having a thickness greater than 1 micrometer, such as between 1 and 20 micrometers, and preferably between 1 and 10 micrometers or between 1 and 5 micrometers, can be formed on the regions, exposed by the openings 394*a* in the layer 394, of the seed layer 125*b* by using, e.g., an electroplating process.

The adhesion/barrier layer 125*a* may include or can be a layer of titanium, a titanium-tungsten alloy, titanium nitride, chromium, tantalum, tantalum nitride, nickel, or nickel vanadium having a thickness smaller than 1 micrometer, such as between 1 nanometer and 0.5 micrometers, and preferably between 0.1 and 0.2 micrometers. The seed layer 125*b* may include or can be a layer of copper, a titanium-copper alloy, nickel, gold, or silver having a thickness smaller than 1 micrometer, such as between 10 nanometers and 0.8 micrometers, and preferably between 80 nanometers and 0.15 micrometers. The conduction layer 125*c* may include or can be an electroplated metal layer of copper, gold, or silver having a thickness greater than 1 micrometer, such as between 1 and 20 micrometers, and preferably between 1 and 10 micrometers or between 1 and 5 micrometers.

For example, the adhesion/barrier layer 125*a* can be a titanium-containing layer, such as a single layer of titanium-tungsten alloy, titanium, or titanium nitride, with a thickness smaller than 1 micrometer, such as between 1 nanometer and 0.5 micrometers, and preferably between 0.1 and 0.2 micrometers, on the layers 17, 19 and 86 exposed by the through vias 156*v*, on the etched surface of the dielectric layer 139, on the sidewall dielectric layers 127, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer. The conduction layer 125*c* can be an electroplated copper layer having a thickness greater than 1 micrometer, such as between 1 and 20 micrometers, and preferably between 1 and 10 micrometers or between 1 and 5 micrometers, on the single layer of copper or a titanium-copper alloy.

Alternatively, the adhesion/barrier layer 125*a* can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the layers 17, 19 and 86 exposed by the through vias 156*v*, on the etched surface of the dielectric layer 139, on the sidewall dielectric layers 127, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer. The conduction layer 125*c* can be an electroplated copper layer having a thickness greater than 1 micrometer, such as between 1 and 20 micrometers, and preferably between 1 and 10 micrometers or between 1 and 5 micrometers, on the single layer of copper or a titanium-copper alloy.

Alternatively, the adhesion/barrier layer 125*a* can be a chromium-containing layer, such as a single layer of chromium, with a thickness smaller than 1 micrometer, such as between 1 nanometer and 0.5 micrometers, and preferably between 0.1 and 0.2 micrometers, on the layers 17, 19 and 86 exposed by the through vias 156*v*, on the etched surface of the dielectric layer 139, on the sidewall dielectric layers 127, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer. The conduction layer 125*c* can be an electroplated copper layer having a thickness greater than 1 micrometer, such as between 1 and 20 micrometers, and preferably between 1 and 10 micrometers or between 1 and 5 micrometers, on the single layer of copper or a titanium-copper alloy.

Figure 101:
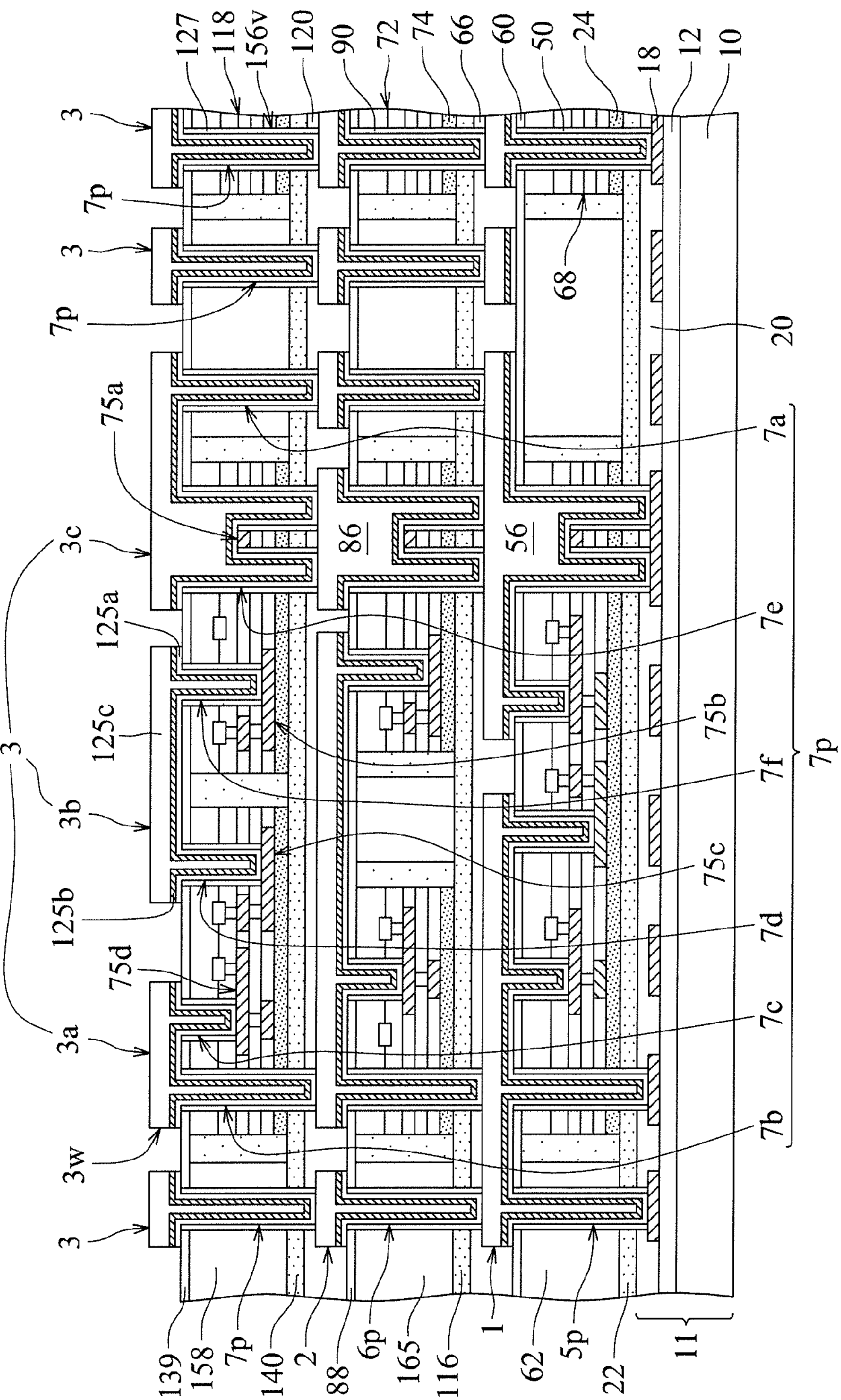

Next, referring to FIG. 101, the patterned photoresist layer 394 is removed using, e.g., an organic chemical solution. Next, the seed layer 125*b* not under the conduction layer 125*c* is removed by using, e.g., a wet chemical etching process or a dry plasma etching process. Next, the adhesion/barrier layer 125*a* not under the conduction layer 125*c* is removed by using, e.g., a wet chemical etching process or a dry plasma etching process. Accordingly, the layers 125*a*, 125*b* and 125*c* over the dielectric layer 139 and over the through vias 156*v* compose multiple metal interconnects 3, including metal interconnects 3*a*, 3*b* and 3*c*, over the dielectric layer 139 and over the through vias 156*v*. The adhesion/barrier layer 125*a* and the seed layer 125*b* of the metal interconnects 3 over the dielectric layer 139 are not at any sidewall 3*w* of the conduction layer 125*c* of the metal interconnects 3 over the dielectric layer 139, but under a bottom of the conduction layer 125*c* of the metal interconnects 3 over the dielectric layer 139. The sidewalls 3*w* of the conduction layer 125*c* of the metal interconnects 3 over the dielectric layer 139 are not covered by the layers 125*a* and 125*b*. The layers 125*a*, 125*b* and 125*c* in the through vias 156*v* compose multiple metal plugs (or metal vias) 7*p* in the through vias 156*v*, including metal plugs (or metal vias) 7*a*, 7*b*, 7*c*, 7*d*, 7*e* and 7*f* in the through vias 156*a*, 156*b*, 156*c*, 156*d*, 156*e* and 156*f* as shown in FIGS. 73 and 99, respectively. Each of the metal plugs 7*p* in the chips 118 and in the dummy substrate(s) 158 is enclosed by one of the sidewall dielectric layers 127 in the through vias 156*v*. The metal plug 7*a* is formed in the dummy substrate 158, the metal plugs 7*b*, 7*c* and 7*d* are formed in one of the chips 118, and the metal plugs 7*f* and 7*e* are formed in another one of the chips 118. The supporter 803 and the interconnect or metal trace 75*a*, in the interconnection layer 17, on the supporter 803 can be between two portions, lower than a horizontal level, at which a top surface of the interconnection layer 17 is positioned, of the metal plug 7*e*. These metal plugs 7*p* formed in the chips 118 and in the dummy substrate(s) 158 can connect the metal interconnects 3 and the semiconductor devices 13 in the chips 118 and connect the metal interconnects 2 and 3.

One of the metal plugs 7*p*, such as the metal plug 7*a*, can be formed in the dummy substrate 158 and formed on a contact point, at a bottom of one of the through vias 156*v* (such as the through via 156*a*), of the conduction layer 86 of one of the metal interconnects 2. Another one of the metal plugs 7*p*, such as the metal plug 7*b*, can be formed in one of the chips 118 and formed on another contact point, at a bottom of another one of the through vias 156*v* (such as the through via 156*b*), of the conduction layer 86 in another one of the metal interconnects 2, such as the metal interconnect 2*a*. Another one of the metal plugs 7*p*, such as the metal plug 7*c*, can be formed in the one of the chips 118 and formed on a contact point, at a bottom of another one of the through vias 156*v* (such as the through via 156*c*), of the interconnect or metal trace 75*d* in the one of the chips 118. Another one of the metal plugs 7*p*, such as the metal plug 7*d*, can be formed in the one of the chips 118 and formed on a contact point, at a bottom of another one of the through vias 156*v* (such as the through via 156*d*), of the interconnect or metal trace 75*c* in the one of the chips 118. Another one of the metal plugs 7*p*, such as the metal plug 7*f*, can be formed in another one of the chips 118 and formed on a contact point, at a bottom of another one of the through vias 156*v* (such as the through via 156*f*), of the interconnect or metal trace 75*b* in the another one of the chips 118. Another one of the metal plugs 7*p*, such as the metal plug 7*e*, can be formed in the another one of the chips 118, formed on a contact point of the interconnect or metal trace 75*a* over a supporter (such as the supporter 803) that is between two lower left and right portions of the another one of the metal plugs 7*p* (such as the metal plug 7*e*), and formed on another contact point, at a bottom of another one of the through vias 156*v* (such as the through via 156*e*), of the conduction layer 86 in another one of the metal interconnects 2, such as the metal interconnect 2*b*.

The metal interconnect 3*a* can be formed over one or more of the chips 118. The metal interconnect 3*b* can be formed over multiple of the chips 118 and across multiple edges of the multiple of the chips 118. The metal interconnect 3*c* can be formed over one or more of the chips 118 and over the dummy substrate(s) 158.

The metal interconnect 3*a* can be connected to a contact point, at a bottom of the through via 156*b*, of the metal interconnect 2*a* through the metal plug 7*b* in one of the chips 118 and can be connected to a contact point, at a bottom of the through via 156*c*, of the interconnect or metal trace 75*d* in the one of the chips 118 through the metal plug 7*c* in the one of the chips 118. The metal interconnect 3*b* can be connected to a contact point, at a bottom of the through via 156*d*, of the interconnect or metal trace 75*c* in the one of the chips 118 through the metal plug 7*d* in the one of the chips 118 and can be connected to a contact point, at a bottom of the through via 156*f*, of the interconnect or metal trace 75*b* in another one of the chips 118 through the metal plug 7*f* in the another one of the chips 118. The metal interconnect 3*c* can be connected to a contact point, at a bottom of the through via 156*e*, of the metal interconnect 2*b* through the metal plug 7*e* in the another one of the chips 118, can be connected to one or more of the semiconductor devices 13 in the another one of the chips 118 through the metal plug 7*e* and the interconnect or metal trace 75*a* in the another one of the chips 118, and can be connected to a contact point, at a bottom of the through via 156*a*, of another one of the metal interconnects 1 through the metal plug 7*a* in the dummy substrate 158. Accordingly, the contact points at the bottoms of the through vias 156*b* and 156*c* can be connected to each other through the metal interconnect 3*a*, the contact points at the bottoms of the through vias 156*d* and 156*f* can be connected to each other through the metal interconnect 3*b*, and the contact points at the bottoms of the through vias 156*a* and 156*e* can be connected to each other through the metal interconnect 3*c*.

According, one of the semiconductor devices 13 in one of the chips 118 can be connected to another one of the semiconductor devices 13 in the one of the chips 118 or in another one of the chips 118 through one of the metal interconnects 3, such as 3*a* or 3*b*, and can be connected to a contact point, at a bottom of one of the through vias 156*v* (such as the through via 156*a*, 156*b*, or 156*e*), of the conduction layer 86 of one of the metal interconnects 2, such as 2*a* or 2*b*, through the one of the metal interconnects 3. Each of the metal interconnects 3 can be a signal trace, a bit line, a clock bus, a power plane, a power bus, a power trace, a ground plane, a ground bus, or a ground trace.

Alternatively, the element 118 not only can indicate a chip, but also can indicate a wafer. When the element 118 is a wafer, the element 72 can be another wafer. Thereby, the process illustrated in the invention can be employed to the wafer-to-wafer bonding.

Figure 102:
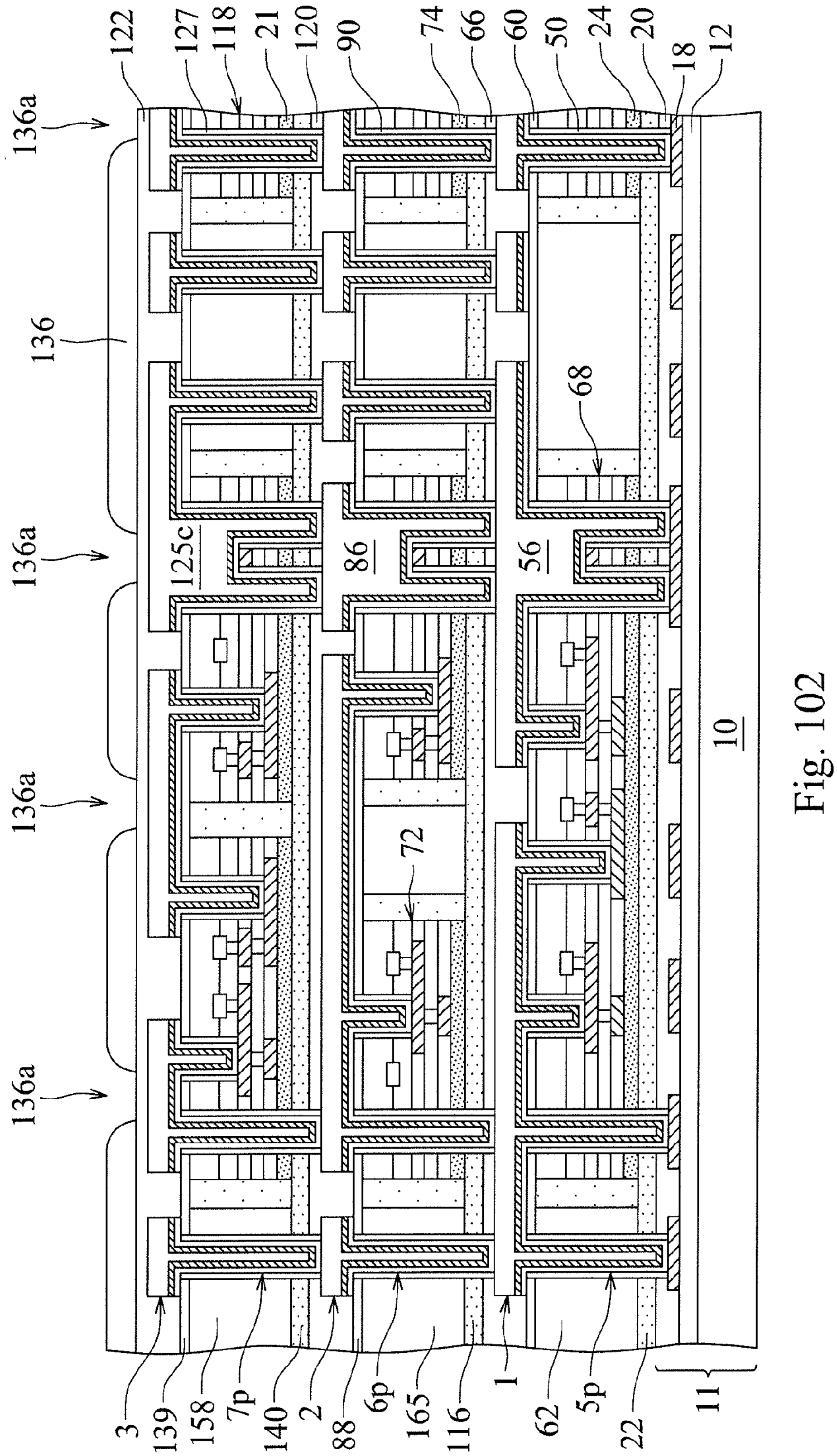

Next, referring to FIG. 102, an insulating or dielectric layer 122 having a thickness, e.g., between 0.3 and 10 micrometers, and preferably between 0.3 and 5 micrometers, between 0.3 and 3 micrometers, between 0.3 and 2 micrometers, or between 0.3 and 1 micrometers, is formed on the conduction layer 125*c* of the metal interconnects 3, on the etched surface of the dielectric layer 139, and in gaps between the metal interconnects 3. Next, a polymer layer 136, such as photosensitive polymer layer, is formed on the insulating or dielectric layer 122 by using, e.g., a spin coating process. Next, a photo exposure process and a chemical development process can be employed to form multiple openings 136*a*, exposing multiple regions of the insulating or dielectric layer 122, in the polymer layer 136. Next, the polymer layer 136 can be cured in a temperature between 180 degrees centigrade and 300 degrees centigrade or between 180 degrees centigrade and 250 degrees centigrade. The polymer layer 136 after being cured may have a thickness, e.g., between 1 and 20 micrometers, and preferably between 2 and 15 micrometers or between 5 and 10 micrometers. The polymer layer 136 can be a polyimide layer, a benzocyclobutene (BCB) layer, a polybenzoxazole (PBO) layer, a poly-phenylene oxide (PPO) layer, an epoxy layer, or a layer of SU-8.

The insulating or dielectric layer 122, for example, may include or can be an inorganic layer, such as a layer of silicon oxide (such as $SiO_2$), silicon nitride (such as $Si_3N_4$), silicon carbon nitride (such as SiCN), silicon oxynitride (such as SiON), or silicon oxycarbide (such as SiOC), with a thickness, e.g., between 0.3 and 10 micrometers, and preferably between 0.3 and 5 micrometers, between 0.3 and 3 micrometers, between 0.3 and 2 micrometers, or between 0.3 and 1 micrometers, formed by a process, e.g., including a chemical vapor deposition (CVD) process or a plasma-enhanced chemical vapor deposition (PECVD) process. Alternatively, the insulating or dielectric layer 122 may include or can be a polymer layer, such as a layer of polyimide, benzocyclobutene (BCB), epoxy, poly-phenylene oxide (PPO), or polybenzoxazole (PBO), with a thickness, e.g., between 0.3 and 10 micrometers, and preferably between 0.3 and 5 micrometers, between 0.3 and 3 micrometers, between 0.3 and 2 micrometers, or between 0.3 and 1 micrometers, formed by, e.g., using a spin coating process and then using a thermal curing process in a temperature between 150 degrees centigrade and 300 degrees centigrade.

Figure 103:
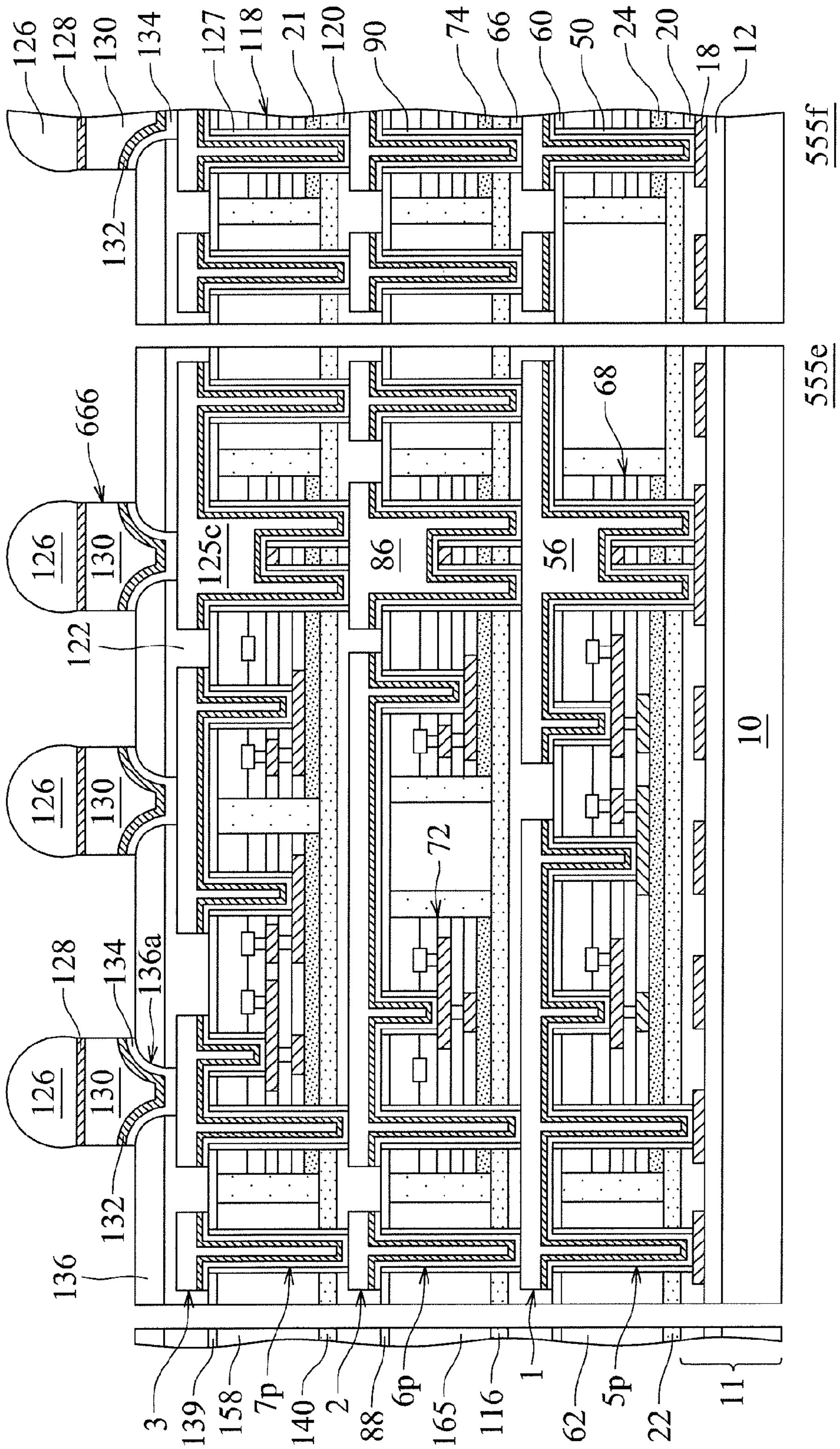

Referring to FIG. 103, after forming the structure illustrated in FIG. 102, forming an under bump metallurgic (UBM) layer 666 on the polymer layer 136 and on multiple contact points, at bottoms of multiple openings in the insulating or dielectric layer 122 and under the openings 136*a* in the polymer layer 136, of the conduction layer 125*c* of the metal interconnects 3, forming multiple solder bumps or balls 126 on the UBM layer 666, and singularizing multiple system-in packages or multichip modules, such as system-in packages or multichip modules 555*e* and 555*f*, can be referred to as the steps illustrated in FIGS. 78-82.

In some cases, the system-in package or multichip module 555*e* may further include multiple metal plugs or vias in the carrier 11, multiple metal traces under the carrier 11, and multiple passive components under the carrier 11. The metal plugs or vias can be formed in multiple openings in the substrate 10 and the dielectric layer 12 of the carrier 11, passing through the substrate 10 and the dielectric layer 12, and connected to the conductive layer 18 of the carrier 11. The metal plugs or vias may include or can be copper, aluminum, gold, or nickel. Alternatively, the metal plugs or vias may further include titanium, a titanium-tungsten alloy, titanium nitride, tantalum, tantalum nitride, a titanium-copper alloy, or chromium. The metal traces can be formed at a bottom side of the substrate 10 of the carrier 11 and connected to the conductive layer 18 of the carrier 11 through the metal plugs or vias. Each of the metal traces may include an electroplated metal layer and a layer of titanium, a titanium-tungsten alloy, titanium nitride, chromium, tantalum, tantalum nitride, or a titanium-copper alloy, and the electroplated metal layer may include or can be a layer of copper, gold, aluminum, or nickel. The passive components, such as capacitors, inductors, or resistors, can be boned with the metal traces using solders. One of the passive components can be connected to one of the metal plugs 5*p*, such as the metal plug 5*a*, 5*b*, 5*c*, 5*d*, 5*e* or 5*f*, through, in sequence, one of the solders, one of the metal traces at a bottom side of the substrate 10, one of the metal plugs or vias in the substrate 10, and a metal interconnect of the conductive layer 18 at the top side of the substrate 10. The solders may include bismuth, indium, tin, a tin-lead alloy, a tin-silver alloy, a tin-silver-copper alloy, a tin-gold alloy, or a tin-copper alloy.

Figure 104:
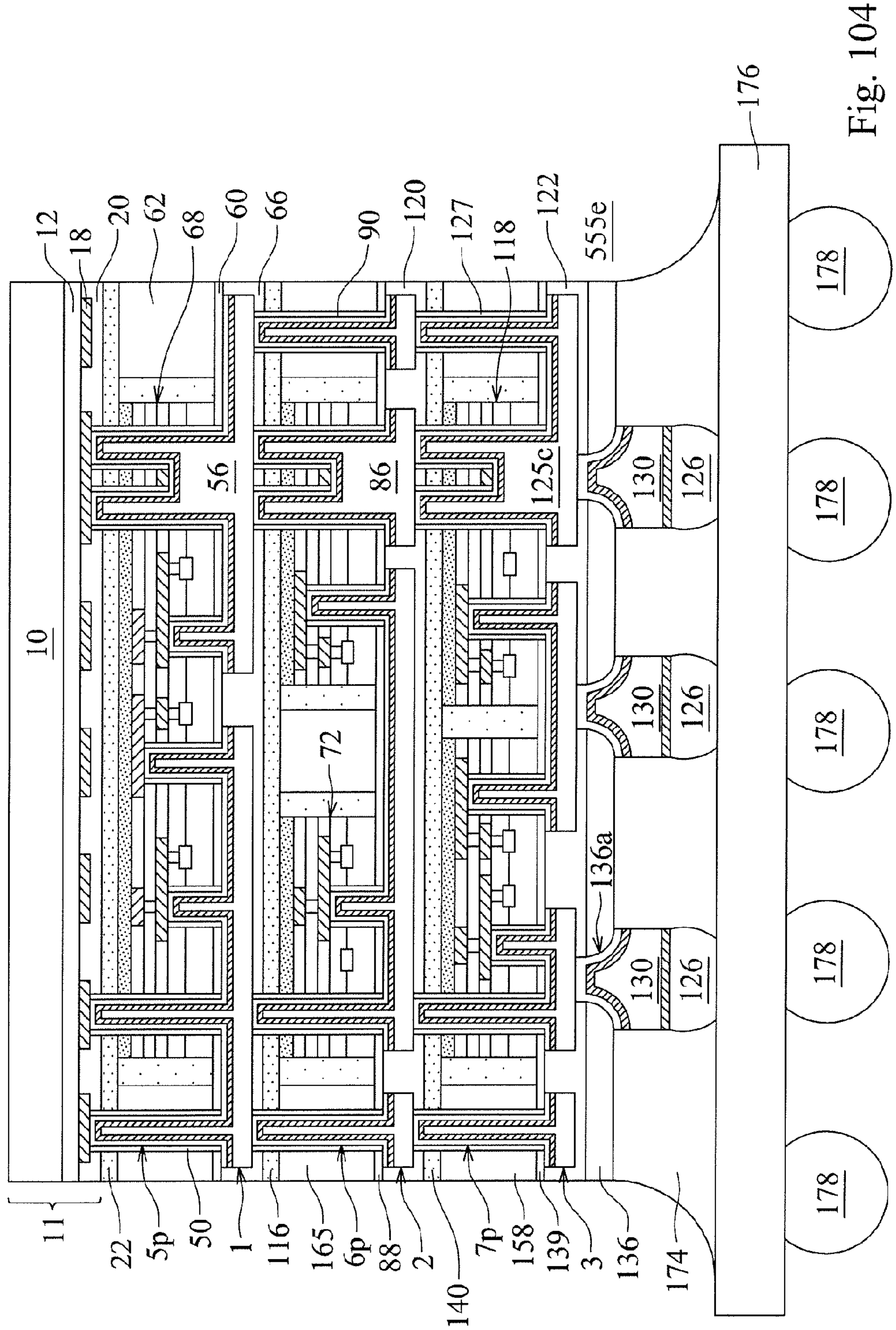
FIG. 104 shows a cross-sectional view of a multichip package according to an embodiment of the present disclosure.

The system-in package or multichip module 555*e* can be connected to and bonded with a carrier, such as mother board, printed circuit board (PCB), ball-grid-array (BGA) substrate, metal substrate, glass substrate, or ceramic substrate, using the solder bumps or balls 126. For example, referring to FIG. 104, the system-in package or multichip module 555*e* can be bonded with the top side of the carrier 176 illustrated in FIG. 83 using, e.g., a flip chip technology of joining the solder bumps or balls 126 with a solder or gold layer preformed on the top side of the carrier 176. Next, the under fill 174 illustrated in FIG. 83 can be formed between the polymer layer 136 of the system-in package or multichip module 555*e* and the top side of the carrier 176 and encloses the solder bumps or balls 126. Next, the solder balls 178 illustrated in FIG. 83 can be formed on the bottom side of the carrier 176.

Figure 105:
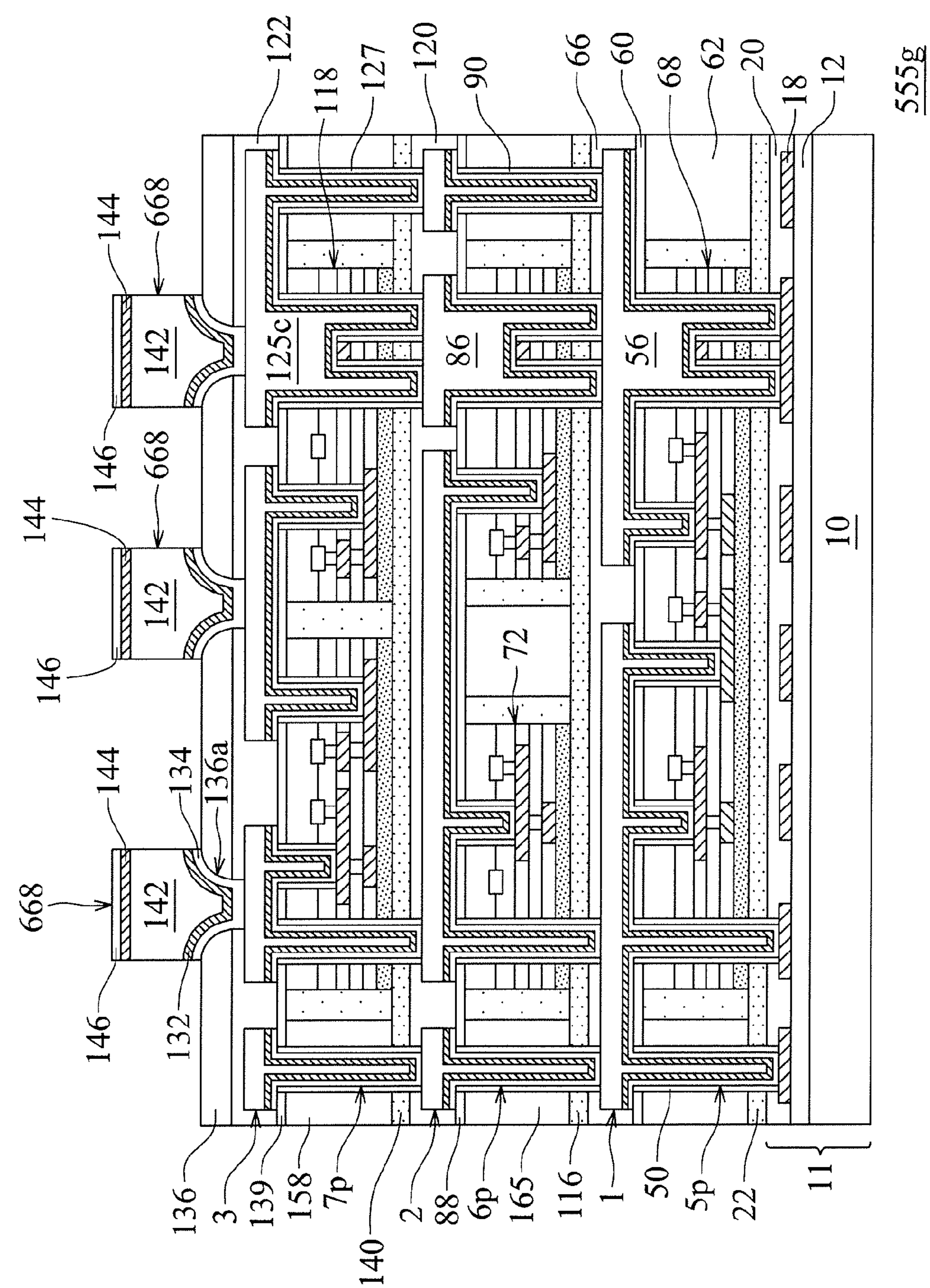
FIG. 105 shows a cross-sectional view of a system-in package or multichip module according to an embodiment of the present disclosure.

FIG. 105 shows another system-in package or multichip module according to another embodiment of the present disclosure, which can be formed by the following steps. After forming the structure illustrated in FIG. 102, forming multiple openings in the insulating or dielectric layer 122 and under the openings 136*a* in the polymer layer 136, forming an adhesion/barrier layer 134 on the polymer layer 136 and on multiple contact points, exposed by the openings in the insulating or dielectric layer 122 and under the openings 136*a* in the polymer layer 136, of the conduction layer 125*c* of the metal interconnects 3, forming a seed layer 132 on the adhesion/barrier layer 134, forming a photoresist layer 152 on the seed layer 132, and forming multiple openings 152*a* in the photoresist layer 152 can be referred to as the steps illustrated in FIGS. 78 and 79. Next, forming a metal layer 142 on multiple regions, exposed by the openings 152*a* in the photoresist layer 152, of the seed layer 132 and in the openings 152*a*, forming a barrier layer 144 in the openings 152*a* and on the metal layer 142, forming a solder wetting layer 146 in the openings 152*a* and on the barrier layer 144, removing the photoresist layer 152, removing the seed layer 132 not under the metal layer 142, and removing the adhesion/barrier layer 134 not under the metal layer 142 can be referred to as the steps illustrated in FIG. 84. Accordingly, the layers 132, 134, 142, 144 and 146 compose multiple metal bumps 668 on the polymer layer 136 and on the contact points, at the bottoms of the openings in the insulating or dielectric layer 122 and under the openings 136*a* in the polymer layer 136, of the conduction layer 125*c* of the metal interconnects 3. The metal bumps 668 may have a width, e.g., between 20 and 400 micrometers, and preferably between 50 and 100 micrometers, and a height, e.g., between 10 and 100 micrometers, and preferably between 20 and 60 micrometers. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in package or multichip module 555*g* as shown in FIG. 105. In the system-in package or multichip module 555*g*, each of the interconnects 3 can be connected to one or more of the metal bumps 668, and the metal bumps 668 can be used for external connection.

Figure 106:
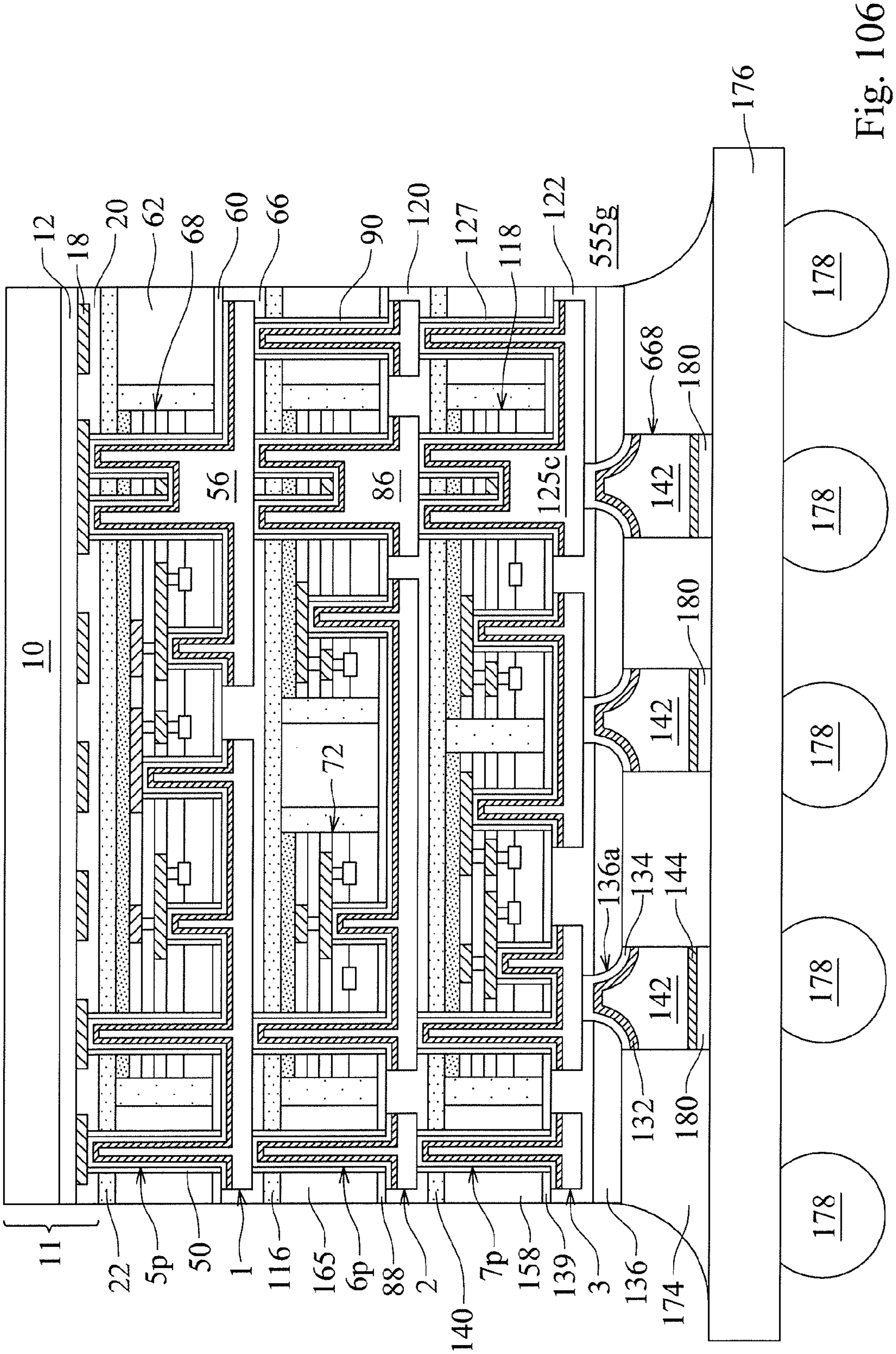
FIG. 106 shows a cross-sectional view of a multichip package according to an embodiment of the present disclosure.

The system-in package or multichip module 555*g* can be connected to and bonded with a carrier, such as mother board, printed circuit board (PCB), ball-grid-array (BGA) substrate, metal substrate, glass substrate, or ceramic substrate, using the metal bumps 668. For example, referring to FIG. 106, the system-in package or multichip module 555*g* can be bonded with the top side of the carrier 176 illustrated in FIG. 83 using, e.g., a flip chip technology of joining the solder wetting layer 146 of the metal bumps 668 with a solder or gold layer preformed on the top side of the carrier 176. After joining the solder wetting layer 146 with the solder or gold layer preformed on the top side of the carrier 176, multiple metal joints 180 are formed between the barrier layer 144 of the metal bumps 668 and the top side of the carrier 176. The metal joints 180 can be a layer of a Sn—Ag alloy, a Sn—Ag—Cu alloy, a Sn—Au alloy, or a Sn—Pb alloy having a thickness between 5 and 50 micrometers. Next, the under fill 174 illustrated in FIG. 83 can be formed between the polymer layer 136 of the system-in package or multichip module 555*g* and the top side of the carrier 176 and encloses the metal bumps 668 and the metal joints 180. Next, the solder balls 178 illustrated in FIG. 83 can be formed on the bottom side of the carrier 176.

Alternatively, the insulating or dielectric layer 122 as shown FIGS. 102-106 can be omitted. In this case, the polymer layer 136 is formed on the conduction layer 125*c* of the metal interconnects 3, on the etched surface of the dielectric layer 139, and in the gaps between the metal interconnects 3, and the contact points of the conduction layer 125*c* of the metal interconnects 3 are exposed by and at ends of the openings 136*a* in the polymer layer 136. Further, the adhesion/barrier layer 134 is formed on the contact points, exposed by and at the ends of the openings 136*a* in the polymer layer 136, of the conduction layer 125*c* of the metal interconnects 3.

Figure 107:
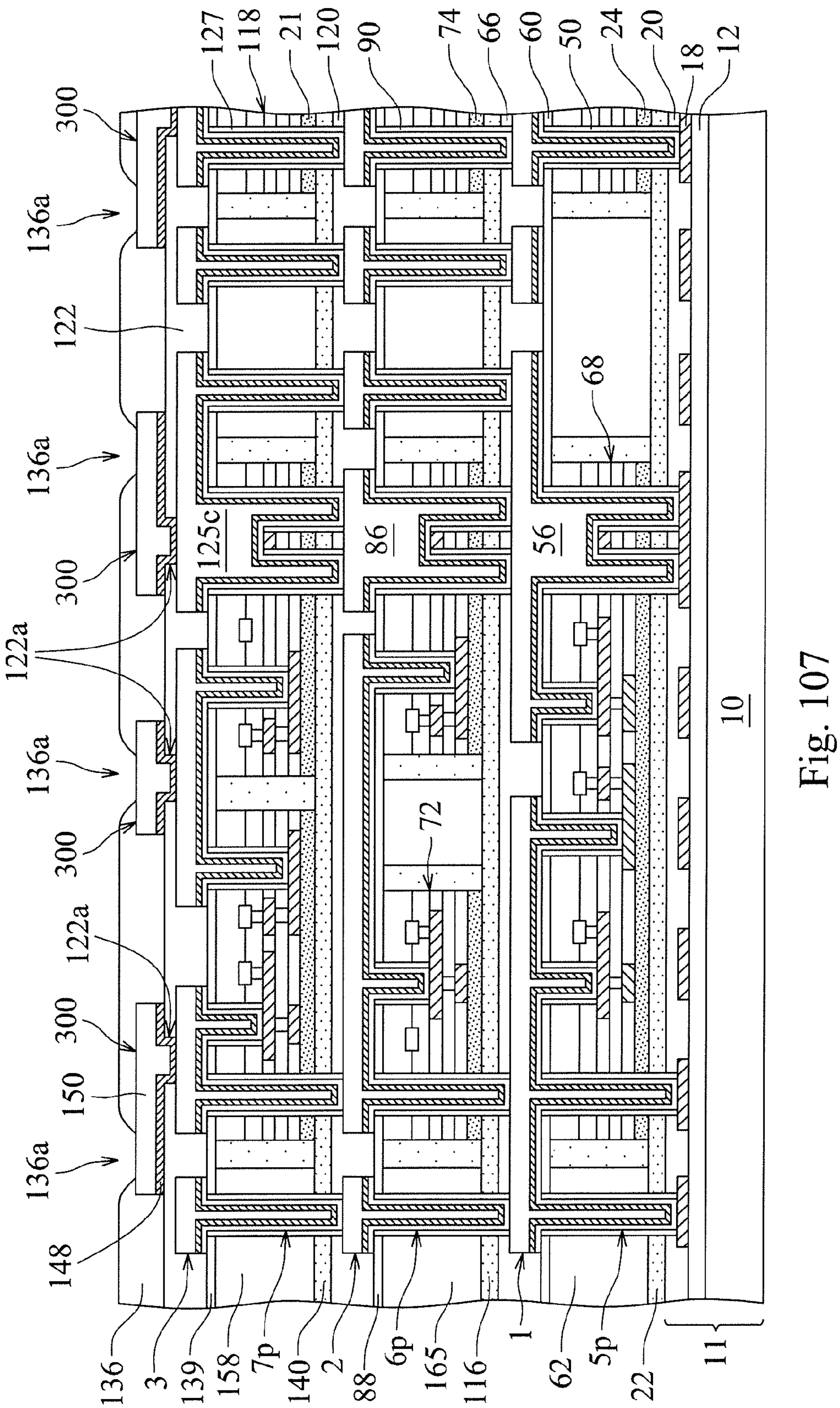
FIGS. 107 and 108 are cross-sectional views showing a process for forming a system-in package or multichip module according to an embodiment of the present disclosure.
Figure 108:
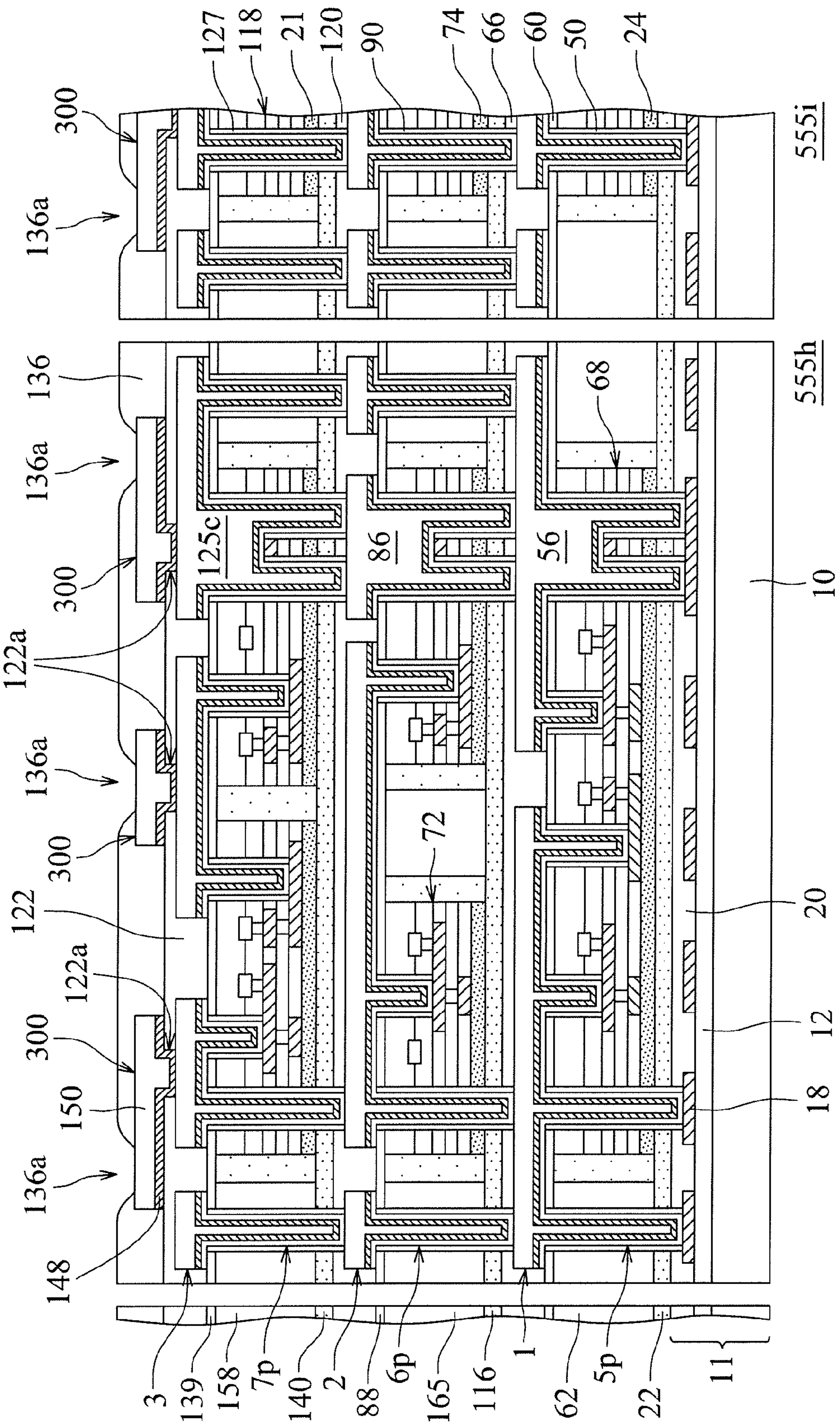

FIGS. 107 and 108 show a process for forming another system-in package or multichip module according to another embodiment of the present disclosure. Referring to FIG. 107, after forming the structure illustrated in FIG. 101, an insulating or dielectric layer 122 can be formed on the conduction layer 125*c* of the metal interconnects 3, on the etched surface of the dielectric layer 139, and in gaps between the metal interconnects 3. The specifications of the layer 122 shown in FIG. 107 can be referred to as the specifications of the layer 122 as illustrated in FIG. 102. Next, multiple openings 122*a* can be formed in the insulating or dielectric layer 122 and expose multiple regions of the conduction layer 125*c* of the metal interconnects 3. Next, the metal interconnects or traces 300 illustrated in FIG. 86 can be formed on the insulating or dielectric layer 122 and on the regions, exposed by the openings 122*a* in the layer 122, of the conduction layer 125*c* of the metal interconnects 3. The metal interconnects or traces 300 can be composed of the layers 148 and 150 illustrated in FIG. 86, and the steps of forming the metal interconnects or traces 300 shown in FIG. 107 can be referred to as the steps of forming the metal interconnects or traces 300 as illustrated in FIG. 86. Next, a polymer layer 136, such as photosensitive polymer layer, can be formed on the insulating or dielectric layer 122 and on the metal interconnects or traces 300 by using, e.g., a spin coating process. Next, a photo exposure process and a chemical development process can be employed to form multiple openings 136*a*, exposing multiple contact points of the metal interconnects or traces 300, in the polymer layer 136. Next, the polymer layer 136 can be cured in a temperature between 180 degrees centigrade and 300 degrees centigrade or between 180 degrees centigrade and 250 degrees centigrade. The polymer layer 136 after being cured may have a thickness, e.g., between 1 and 20 micrometers, and preferably between 2 and 15 micrometers or between 5 and 10 micrometers. The polymer layer 136 can be a polyimide layer, a benzocyclobutene (BCB) layer, a polybenzoxazole (PBO) layer, a poly-phenylene oxide (PPO) layer, an epoxy layer, or a layer of SU-8.

Next, referring to FIG. 108, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in packages or multichip modules 555*h* and 555*i*.

Figure 109:
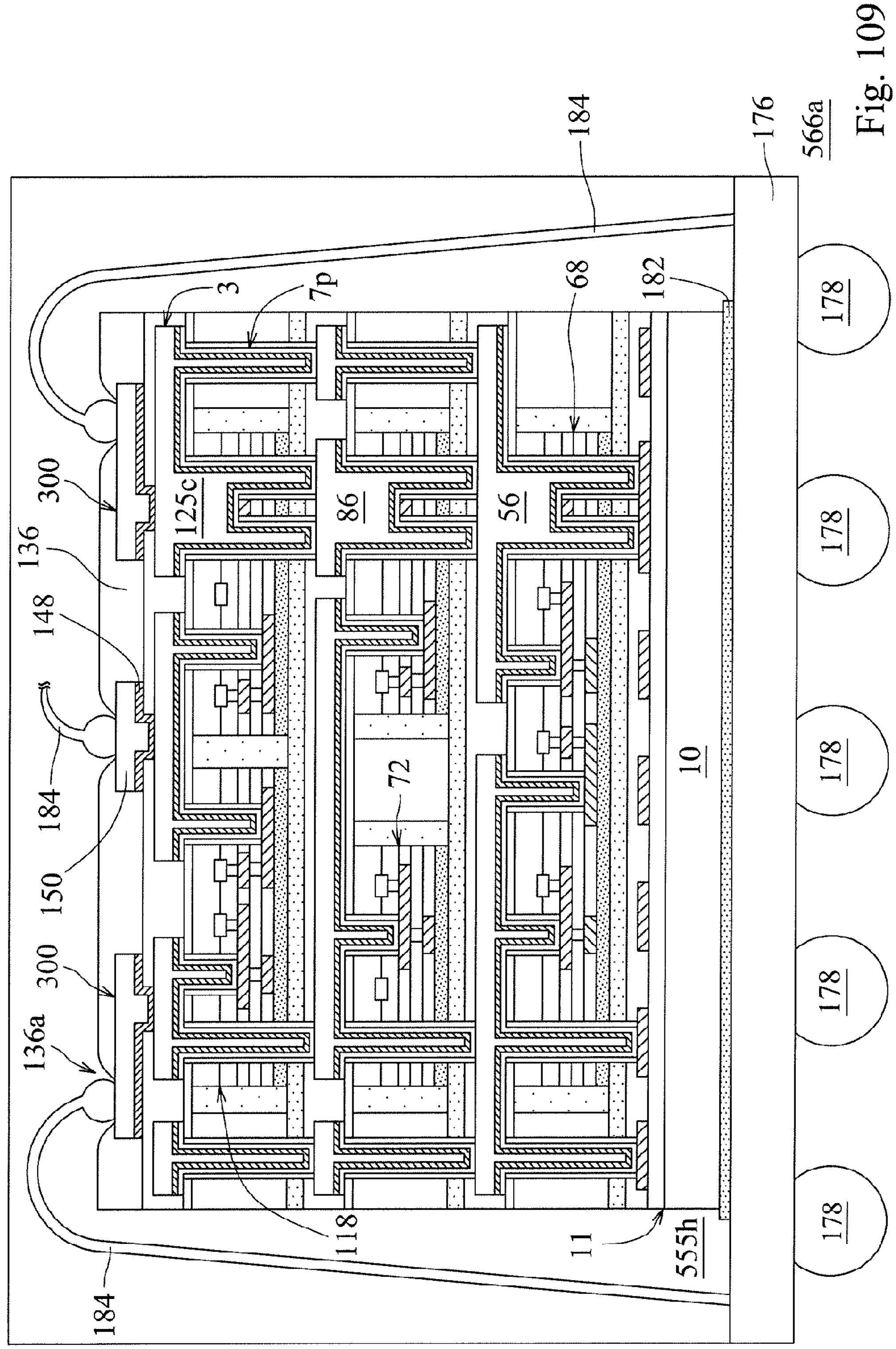
FIG. 109 shows a cross-sectional view of a multichip package according to an embodiment of the present disclosure.

FIG. 109 shows a multichip package 566*a* including the system-in package or multichip module 555*h* connected to the carrier 176 illustrated in FIG. 83 through wirebonded wires 184. The multichip package 566*a* is similar to the multichip package 566 shown in FIG. 88 except that the system-in package or multichip module 555*c* shown in FIG. 88 is replaced with the system-in package or multichip module 555*h*. The steps of forming the multichip package 566*a* packaged with the system-in package or multichip module 555*h* can be referred to as the steps of forming the multichip package 566 packaged with the system-in package or multichip module 555*c* as illustrated in FIG. 88. The specifications of the glue layer 182, the wirebonded wires 184, and the molding compound 186 shown in FIG. 109 can be referred to as the specifications of the glue layer 182, the wirebonded wires 184, and the molding compound 186 as illustrated in FIG. 88, respectively. The specifications of the solder balls 178 shown in FIG. 109 can be referred to as the specifications of the solder balls 178 as illustrated in FIG. 83. The multichip package 566*a* can be connected to a carrier, such as mother board, ball-grid-array (BGA) substrate, printed circuit board, metal substrate, glass substrate, or ceramic substrate, through the solder balls 178.

Figure 110:
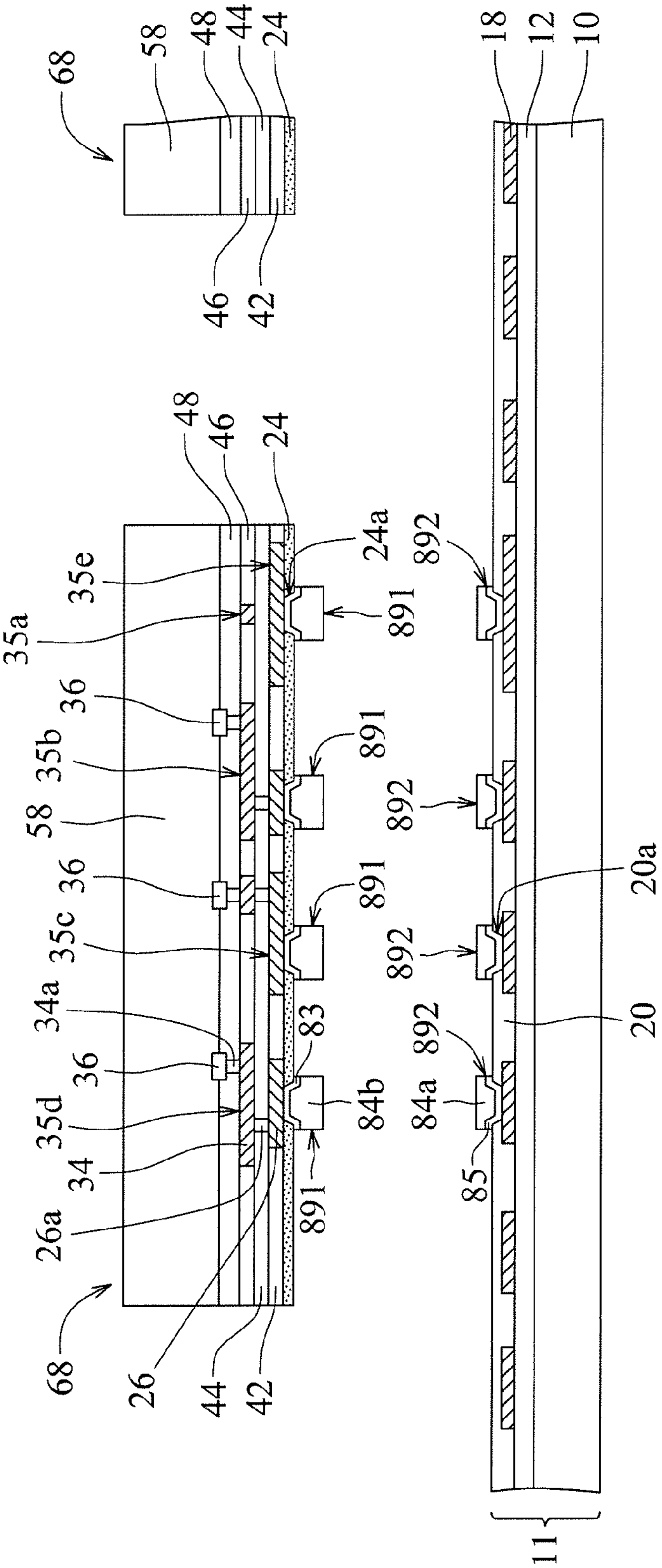
FIGS. 110-128 show a process for forming a system-in package or multichip module according to an embodiment of the present disclosure.

FIGS. 110-128 show a process for forming another system-in package or multichip module according to another embodiment of the present disclosure. Referring to FIG. 110, multiple chips 68 are provided before bonding with a carrier 11. The chips 68 shown in FIG. 110 are similar to the chips 68 shown in FIG. 7 except that each of the chips 68 shown in FIG. 110 further includes multiple metal bumps 891 under and on multiple contact points, exposed by and at ends of multiple openings 24*a* in the passivation layer 24, of the patterned metal layer 26 and further includes an interconnect or metal trace 35*e* provided by the patterned metal layer 26. The interconnect or metal trace 35*e* can be connected to one or more of the semiconductor devices 36, but can be disconnected from the interconnect or metal trace 35*a*, 35*b*, 35*c* or 35*d*. The interconnect or metal trace 35*e* can be a signal trace, a bit line, a clock bus, a power plane, a power bus, a power trace, a ground plane, a ground bus, or a ground trace. The element of the chips 68 in FIG. 110 indicated by a same reference number as indicates the element of the chips 68 in FIG. 7 has a same material and spec as the element of the chips 68 illustrated in FIG. 7. In one case, one of the chips 68 may have different circuit designs from those of another one of the chips 68. Also, in another case, one of the chips 68 may have same circuit designs as those of another one of the chips 68. Alternatively, one of the chips 68 may have a different area (top surface) or size from that of another one of the chips 68. Also, in another case, one of the chips 68 may have a same area (top surface) or size as that of another one of the chips 68. The carrier 11 shown in FIG. 110 is similar to that shown in FIG. 1 except that the carrier 11 shown in FIG. 110 further includes multiple metal pads 892 on multiple contact points, at bottoms of multiple openings 20*a* in the dielectric or insulating layer 20, of the conductive layer 18. The contact points, at the bottoms of the openings 20*a*, of the conductive layer 18 can be separated from one another by the dielectric or insulating layer 20 of the carrier 11.

The metal pads 892 can be composed of two metal layers 84*a* and 85. The metal layer 85, such as nickel layer, may have a thickness, e.g., between 2 and 10 micrometers and can be formed on the contact points, at the bottoms of the openings 20*a*, of the conductive layer 18 of the carrier 11 by, e.g., an electroplating or electroless plating process. The metal layer 84*a*, such as a layer of solder or gold, may have a thickness, e.g., between 2 and 15 micrometers and can be formed on the metal layer 85, such as nickel layer, by, e.g., an electroplating or electroless plating process.

The metal bumps 891 can be composed of one or more metal layers, such as metal layers 83 and 84*b*. The metal layer 83 may include an adhesion/barrier layer, such as a layer of titanium, titanium nitride, a titanium-tungsten alloy, tantalum, tantalum nitride, or chromium, with a thickness smaller than 1 micrometer, such as between 1 nanometer and 0.5 micrometers, formed under and on the contact points, at the tops of the openings 24*a*, of the patterned metal layer 26 of each chip 68 by, e.g., a sputtering process. The metal layer 83 may further include a seed layer, such as a layer of a titanium-copper alloy, copper, gold, or nickel, with a thickness smaller than 1 micrometer, such as between 10 nanometers and 0.8 micrometers, formed under and on the adhesion/barrier layer by, e.g., a sputtering process. The metal layer 84*b*, for example, may include a copper layer with a thickness, e.g., between 0.5 and 20 micrometers, and preferably between 2 and 10 micrometers, formed under and on the seed layer, preferably the copper or titanium-copper-alloy seed layer, of the metal layer 83 by, e.g., an electroplating process, a nickel layer with a thickness, e.g., between 0.1 and 10 micrometers, and preferably between 0.2 and 5 micrometers, formed under and on the copper layer by, e.g., an electroplating or electroless plating process, and a solder layer of bismuth, indium, tin, a tin-lead alloy, a tin-silver alloy, a tin-copper alloy, or a tin-silver-copper alloy, used for bonding with the metal layer 84*a* (such as a layer of solder or gold) of the metal pads 892, formed under and on the nickel layer by, e.g., an electroplating process. Alternatively, the metal layer 84*b* may include a copper layer with a thickness, e.g., between 2 and 100 micrometers, and preferably between 5 and 50 micrometers, formed under and on the seed layer, preferably the copper or titanium-copper-alloy seed layer, of the metal layer 83 by an electroplating process, a nickel layer with a thickness, e.g., between 2 and 10 micrometers, and preferably between 2 and 5 micrometers, formed under and on the copper layer by an electroplating or electroless plating process, and a gold layer, used for bonding with the metal layer 84*a* (such as a layer of solder or gold) of the metal pads 892, formed under and on the nickel layer by an electroplating or electroless plating process. Alternatively, the metal layer 84*b* may include a nickel layer with a thickness, e.g., between 2 and 50 micrometers, and preferably between 5 and 25 micrometers, formed under and on the seed layer, preferably the copper or titanium-copper-alloy seed layer, of the metal layer 83 by, e.g., an electroplating process, and a solder layer of bismuth, indium, tin, a tin-lead alloy, a tin-silver alloy, a tin-copper alloy, or a tin-silver-copper alloy, used for bonding with the metal layer 84*a* (such as a layer of solder or gold) of the metal pads 892, formed under and on the nickel layer by, e.g., an electroplating or electroless plating process.

Figure 111:
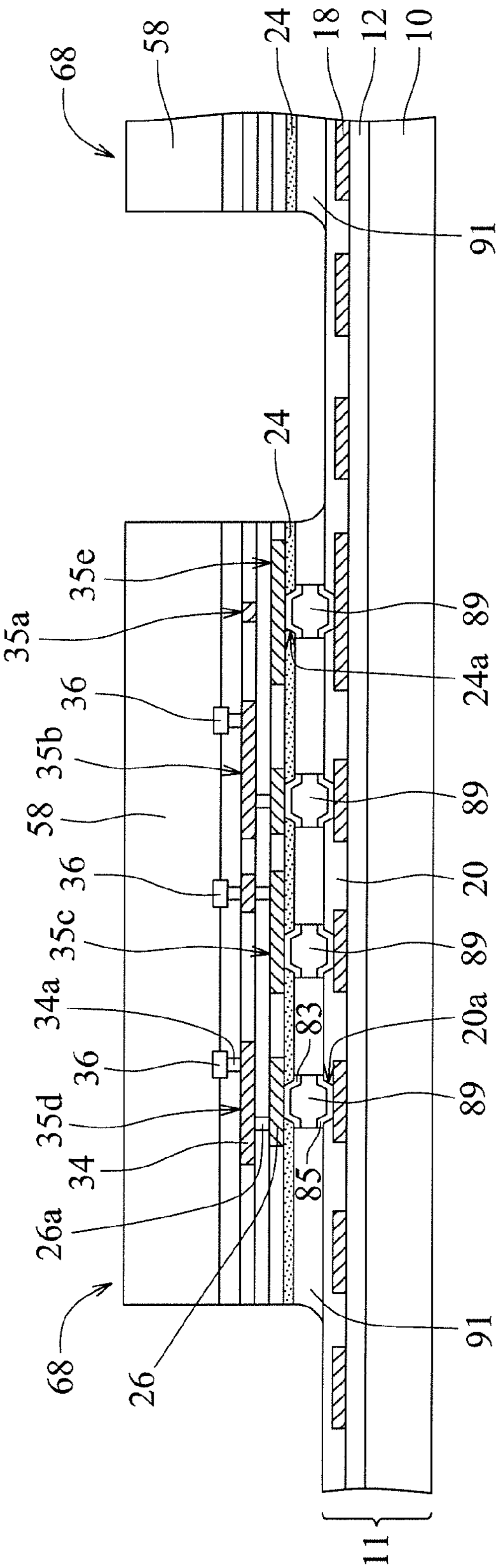

Referring to FIG. 111, the chips 68 can be bonded with the carrier 11 using, e.g., a flip chip technology of joining the metal bumps 891 of the chips 68 with the metal pads 892 of the carrier 11. In this process, the metal bumps 891 can be placed over the metal pads 892, and then the bottommost layer, the previously described solder or gold layer, of the metal layer 84*b* of the metal bumps 891 and the topmost layer, the previously described solder or gold layer, of the metal layer 84*a* of the metal pads 892 can be melted or integrated into multiple metal joints 89 using a suitable process, such as heating or reflow process. Accordingly, the metal joints 89 can be formed between active sides of the chips 68 and a top side of the carrier 11. Each of the metal joints 89 may be a layer of bismuth, indium, a tin-lead alloy, a tin-silver alloy, a tin-copper alloy, a tin-silver-copper alloy, a tin-gold alloy, or gold having a thickness, e.g., between 5 and 50 micrometers between the metal layer 85 and the previously described nickel layer in the remaining metal layer 84*b*, not shown in FIG. 111 but illustrated in FIG. 110, under and on the metal layer 83. The metal joints 89 can connect the interconnects or metal traces 35*b*, 35*c*, 35*d* and 35*e* of the chips 68 to multiple metal interconnects or traces of the conductive layer 18 of the carrier 11. Next, an under fill 91 can be formed between the passivation layer 24 of each chip 68 and the top side of the carrier 11 and encloses the metal joints 89. The under fill 91 may include epoxy, glass filler or carbon filler, and the glass filler or carbon filler can be distributed in the epoxy.

Figure 112:
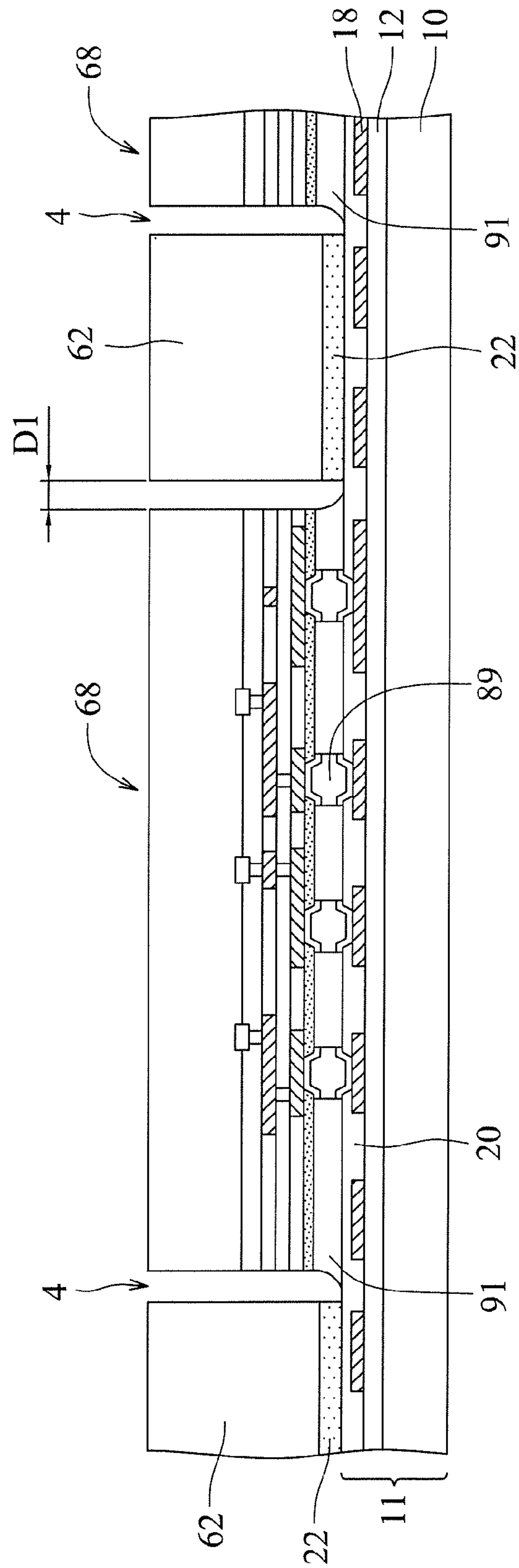

Next, referring to FIG. 112, multiple separate dummy substrates 62 can be joined with the top side of the carrier 11 using a glue layer 22. The glue layer 22 can be a polymer layer, such as a layer of epoxy, polyimide, benzocyclobutene (BCB), polybenzoxazole (PBO), poly-phenylene oxide (PPO), or silosane, with a thickness, e.g., between 3 and 100 micrometers, and preferably between 5 and 10 micrometers or between 10 and 30 micrometers. When a gap between neighboring two chips 68 is too great, such as greater than 500 or 1,000 micrometers, one or more of the separate dummy substrates 62 can be placed in the gap. Alternatively, when a gap between neighboring two chips 68 is small enough, such as smaller than 500 or 1,000 micrometers, there can be no separate dummy substrates 62 placed in the gap. The separate dummy substrates 62, for example, can be separate silicon bars, separate dummy chips, separate dummy silicon dies, or separate substrates of polysilicon, glass, silicon, or ceramic. In one embodiment, there are no circuits preformed in each separate dummy substrate 62 or on a top or bottom surface of each separate dummy substrate 62 before the separate dummy substrates 62 are joined with the carrier 11.

Alternatively, the glue layer 22 can be replaced with a silicon-oxide layer that is preformed on a bottom side of each of the separate dummy substrates 62. In this case, joining the separate dummy substrates 62 with the top side of the carrier 11 can be performed by bonding the silicon-oxide layer 22 preformed on each of the separate dummy substrates 62 with another silicon-oxide layer of the dielectric or insulating layer 20 of the carrier 11. Accordingly, the separate dummy substrates 62 can be joined with the carrier 11 using these silicon-oxide layers.

Figure 113:
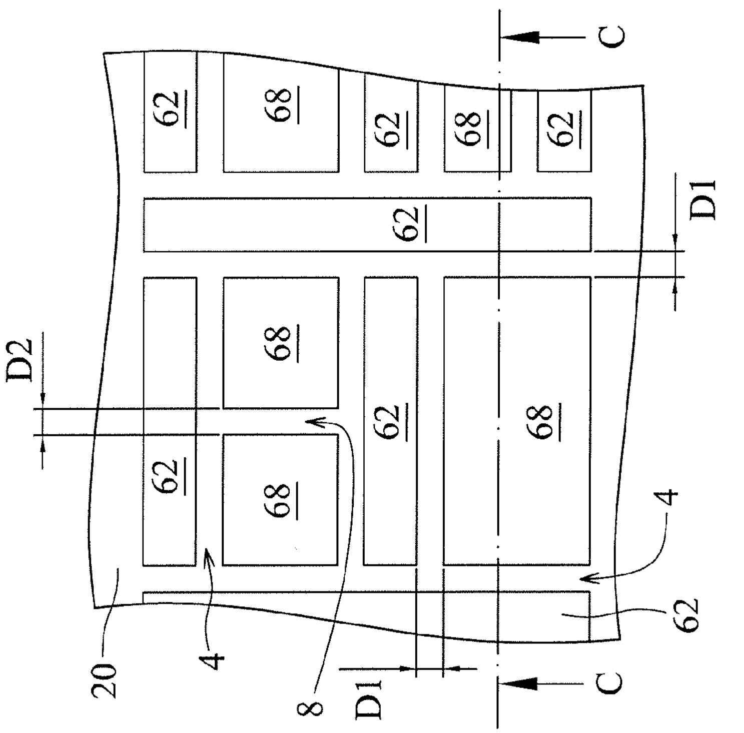

FIG. 113 is a schematical top view showing the separate dummy substrates 62 and the chips 68 shown in FIG. 112 according to an embodiment, and FIG. 112 is the cross-sectional view cut along the line C-C shown in FIG. 113. As shown in FIGS. 112 and 113, there are multiple gaps 4 each between one of the chips 68 and one of the separate dummy substrates 62, and there are multiple gaps 8 (one of them is shown) each between neighboring two chips 68. Each of the gaps 4 may have a transverse distance or spacing D1, e.g., between 1 and 200 micrometers, between 1 and 50 micrometers or between 1 and 10 micrometers, and preferably between 1 and 5 micrometers. Each of the gaps 8 may have a transverse distance or spacing D2, e.g., smaller than 500 micrometers, such as between 1 and 200 micrometers, between 1 and 50 micrometers, or between 1 and 10 micrometers, and preferably between 1 and 5 micrometers.

Figure 114:
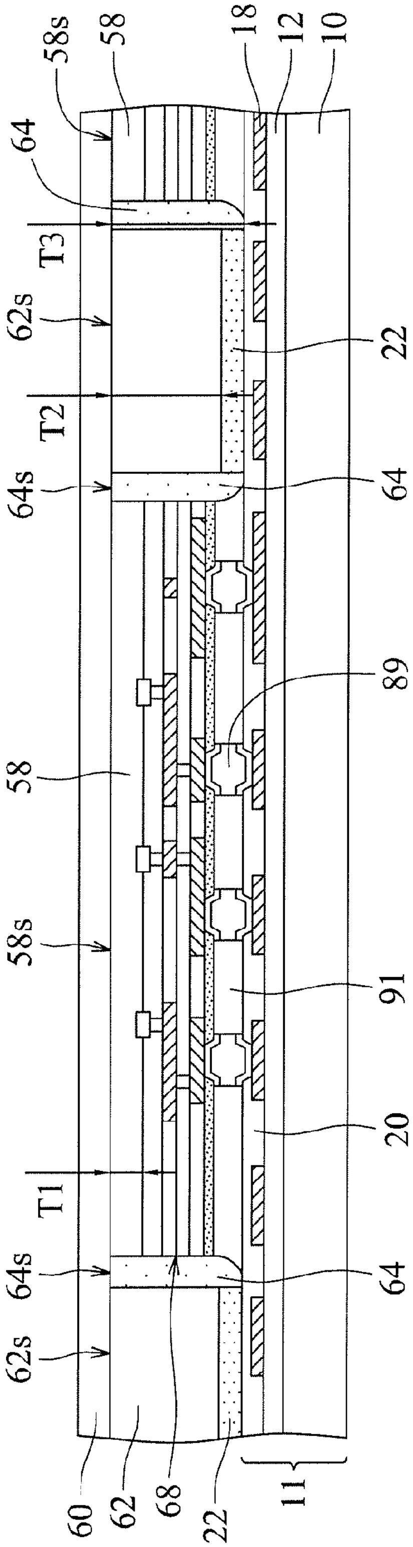

After the separate dummy substrates 62 are joined with the carrier 11, the structure shown in FIG. 114 can be formed by the following steps. After forming the structure illustrated in FIG. 112, the encapsulation/gap filling material 64 illustrated in FIG. 10 can be formed on a backside of the semiconductor substrate 58 of each chip 68, on top sides of the separate dummy substrates 62, and in the gaps 4 and 8. Next, the encapsulation/gap filling material 64, the backside of the semiconductor substrate 58 of each chip 68, and the separate dummy substrates 62 are ground or polished by, e.g., a chemical-mechanical-polishing (CMP) process, a mechanical polishing process, a mechanical grinding process, or a process including mechanical polishing and chemical etching until the semiconductor substrate 58 of one of the chips 68 is thinned to a thickness T1, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Preferably, each of the chips 68, after the grinding or polishing process, may have a thickness, e.g., between 3 and 105 micrometers, and preferably between 3 and 30 micrometers or between 5 and 25 micrometers. After the grinding or polishing process, one of the separate dummy substrates 62 can be thinned to a thickness T2, e.g., between 3 and 100 micrometers, and preferably between 3 and 30 micrometers or between 5 and 25 micrometers, and the encapsulation/gap filling material 64 remaining in the gaps 4 and 8 may have a vertical thickness T3, e.g., between 3 and 100 micrometers, and preferably between 3 and 30 micrometers or between 5 and 25 micrometers. The ground or polished surface **58*s* of the semiconductor substrate 58, at the backside of each chip 68, and the ground or polished surfaces 62*s* of the separate dummy substrates 62 can be substantially flat and not covered by the encapsulation/gap filling material 64. The ground or polished surfaces 62*s* may be substantially coplanar with the ground or polished surface 58*s* of each chip 68 and with the ground or polished surface 64*s* of the encapsulation/gap filling material 64 in the gaps 4 and 8. After the encapsulation/gap filling material 64, the backside of the semiconductor substrate 58 of each chip 68, and the separate dummy substrates 62 are ground or polished by the above mentioned process, the dielectric layer 60 illustrated in FIG. 14 can be formed on the ground or polished surface 58*s* of the semiconductor substrate 58 of each chip 68, on the ground or polished surfaces 62*s* of the separate dummy substrates 62, and on the ground or polished surface 64*s* of the encapsulation/gap filling material 64**.

Alternatively, the structure shown in FIG. 114 can be formed by the following steps. After the separate dummy substrates 62 are joined with the carrier 11, the encapsulation/gap filling material 64 illustrated in FIG. 12 can be formed on backsides of the semiconductor substrates 58 of the chips 68, on top sides of the separate dummy substrates 62, and in the gaps 4 and 8. Next, the polymer 65 illustrated in FIG. 12 can be formed on the encapsulation/gap filling material 64 and in the gaps 4 and 8. Next, the steps illustrated in FIG. 13 can be performed to remove the polymer layer 65, to remove the encapsulation/gap filling material 64 not in the gaps 4 and 8, to thin the semiconductor substrates 58 of the chips 68, and to thin the separate dummy substrates 62. Accordingly, the polished surface **58*s* of the semiconductor substrate 58, at the backside of each chip 68, and the polished surfaces 62*s* of the separate dummy substrates 62 can be substantially flat and not covered by the encapsulation/gap filling material 64. The polished surfaces 62*s* may be substantially coplanar with the polished surface 58*s* of each chip 68 and with the polished surface 64*s* of the encapsulation/gap filling material 64 in the gaps 4 and 8. The polished surfaces 58*s*, 62*s* and 64*s* may have a micro-roughness, e.g., less than 20 nanometers. Each of the chips 68 can be thinned to a thickness, e.g., between 3 and 35 micrometers, and preferably between 5 and 10 micrometers or between 5 and 25 micrometers. The semiconductor substrate 58 of one of the chips 68 can be thinned to the thickness T1 between 1 and 30 micrometers, and preferably between 2 and 5 micrometers, between 2 and 10 micrometers, between 2 and 20 micrometers, or between 3 and 30 micrometers. Each of the separate dummy substrates 62 can be thinned to the thickness T2, e.g., between 3 and 35 micrometers, and preferably between 5 and 10 micrometers or between 5 and 25 micrometers. The encapsulation/gap filling material 64 in the gaps 4 and 8 can be thinned to the thickness T3, e.g., between 3 and 35 micrometers, and preferably between 5 and 10 micrometers or between 5 and 25 micrometers. Thereafter, the dielectric layer 60 illustrated in FIG. 14 can be formed on the polished surface 58*s* of the semiconductor substrate 58 of each chip 68, on the polished surfaces 62*s* of the separate dummy substrates 62, and on the polished surface 64*s* of the encapsulation/gap filling material 64**.

Figure 115:
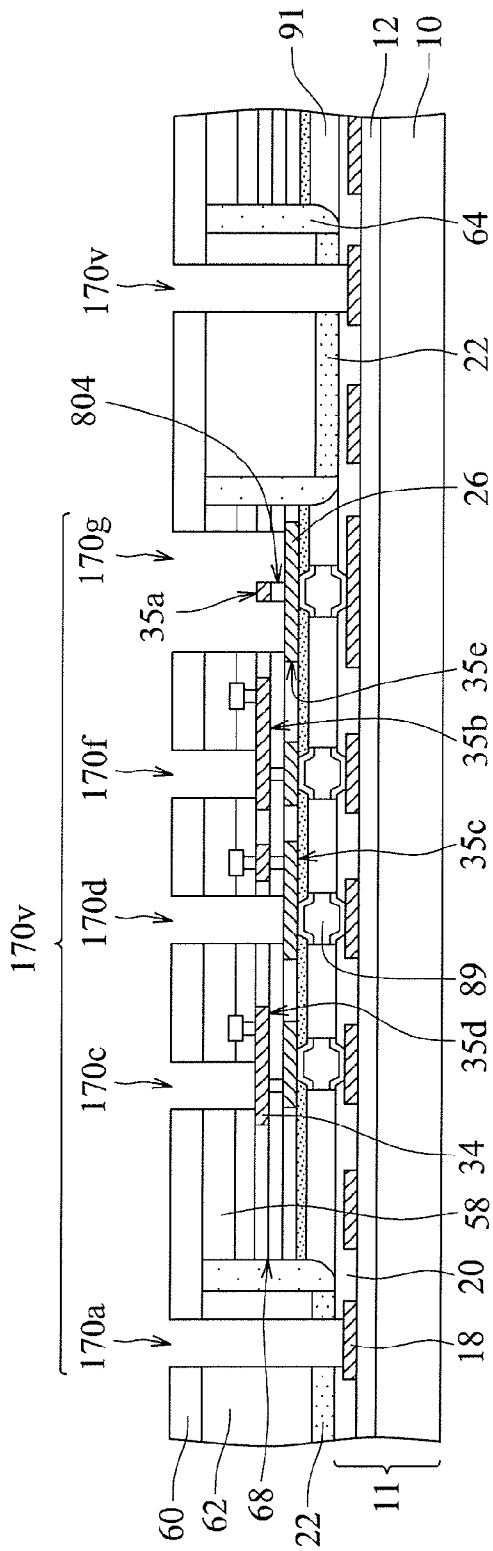

Referring to FIG. 115, after forming the structure illustrated in FIG. 114, multiple through vias **170*v*, including through vias 170*a*, 170*c*, 170*d*, 170*f* and 170*g*, can be formed in the chips 68 and in the separate dummy substrates 62, exposing the conductive layer 18 of the carrier 11 and exposing the layers 26 and 34 of the chips 68, by a suitable process or processes, e.g., by the following steps. First, a photoresist layer, such as positive-type photo-sensitive resist layer or negative-type photo-sensitive resist layer, can be formed on the dielectric layer 60 by using, e.g., a spin coating process or a lamination process. Next, a photo exposure process using a 1X stepper and a development process using a chemical solution can be employed to form multiple openings, exposing the dielectric layer 60, in the photoresist layer. The photoresist layer may have a thickness, e.g., between 3 and 50 micrometers. Next, the dielectric layer 60 under the openings in the photoresist layer can be removed by using, e.g., an anisotropic plasma etching process. Next, the separate dummy substrates 62 under the openings in the photoresist layer and the chips 68 under the openings in the photoresist layer can be etched away until predetermined regions of the layers 26 and 34 in the chips 68 and predetermined regions of the conductive layer 18 in the carrier 11 are exposed by the openings in the photoresist layer. Next, the photoresist layer can be removed by using, e.g., an organic chemical. Accordingly, the through vias 170***v*, including the through vias 170*a*, 170*c*, 170*d*, 170*f* and 170*g*, can be formed in the chips 68 and in the separate dummy substrates 62, exposing multiple regions of the conductive layer 18 of the carrier 11 and exposing multiple regions of the layers 26 and 34 of the chips 68. The through via 170*a* is formed in one of the separate dummy substrates 62, and the through vias 170*c*, 170*d*, 170*f* and 170*g* are formed in the same chip 68. Each of the through vias 170*v*, such as the through via 170*a*, 170*c*, 170*d*, 170*f*, or 170*g*, may have a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers.

One of the through vias 170*v*, such as the through via 170*a*, passes through the dielectric layer 60, one of the separate dummy substrates 62, the glue layer or silicon-oxide layer 22, and the dielectric or insulating layer 20 of the carrier 11, exposing a region of the conductive layer 18 of the carrier 11. Another one of the through vias 170*v*, such as the through via 170*c*, passes through the dielectric layer 60 and through the semiconductor substrate 58 and dielectric layer 48 of one of the chips 68, exposing the interconnect or metal trace 35*d* in the interconnection layer 34 of the one of the chips 68. Another one of the through vias 170*v*, such as the through via 170*d*, passes through the dielectric layer 60 and through the semiconductor substrate 58 and dielectric layers 44, 46 and 48 of one of the chips 68, exposing the interconnect or metal trace 35*c* in the patterned metal layer 26 of the one of the chips 68. Another one of the through vias 170*v*, such as the through via 170*f*, passes through the dielectric layer 60 and through the semiconductor substrate 58 and dielectric layer 48 of one of the chips 68, exposing the interconnect or metal trace 35*b* in the interconnection layer 34 of the one of the chips 68. Another one of the through vias 170*v*, such as the through via 170*g*, passes through the dielectric layer 60 and through the semiconductor substrate 58 and dielectric layers 44, 46 and 48 of one of the chips 68, exposing the interconnect or metal trace 35*a* in the interconnection layer 34 of the one of the chips 68 and exposing the interconnect or metal trace 35*e* in the patterned metal layer 26 of the one of the chips 68. A supporter 804 provided by the dielectric layer 44 is between the interconnect or metal trace 35*a* exposed by the through via 170*g* and the interconnect or metal trace 35*e* under the through via 170*g* for the purpose of supporting the exposed interconnect or metal trace 35*a*. The supporter 804 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers. FIGS. 116-119 are three examples of schematic top perspective views showing the through via 170g and the interconnects or metal traces 35*a* and 35*e* illustrated in FIG. 115.

Figure 116:
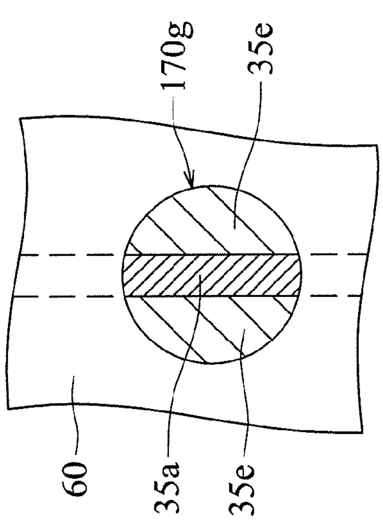

As shown in FIGS. 115 and 116, the through via 170*g* in one of the chips 68 exposes the interconnect or metal trace 35*a* in the one of the chips 68 and exposes two regions of the interconnect or metal trace 35*e* in the one of the chips 68. The interconnect or metal trace 35*a* has a line-shaped region, exposed by the through via 170*g*, extending in a horizontal direction from a side of the through via 170*g* to the opposite side of the through via 170*g* through a center of the through via 170*g*. The supporter 804, between the interconnect or metal trace 35*e* under the through via 170*g* and the exposed line-shaped region of the interconnect or metal trace 35*a* in the interconnection layer 34, can be line-shaped, like the exposed line-shaped region of the interconnect or metal trace 35*a*. Preferably, the through via 170*g* can be, but is not limited to, a circular shape from a top perspective view.

Figure 117:
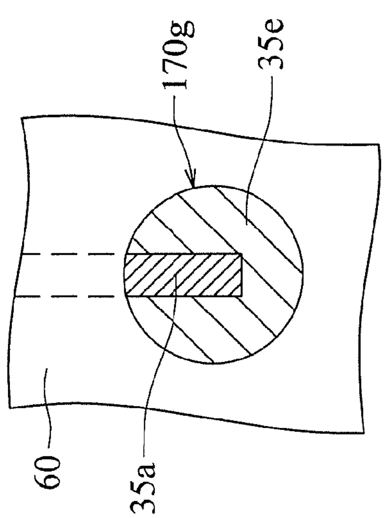

As shown in FIGS. 115 and 117, the through via 170*g* in one of the chips 68 exposes the interconnect or metal trace 35*a* in the one of the chips 68 and exposes a region of the interconnect or metal trace 35*e* in the one of the chips 68. The interconnect or metal trace 35*a* has a peninsula region, exposed by the through via 170*g*, extending in a horizontal direction from one side of the through via 170*g* at least to a center of the through via 170*g*, but does not reach to the opposite side of the through via 170*g*; the interconnect or metal trace 35*a* has an end exposed by the through via 170*g*. The supporter 804, between the interconnect or metal trace 35*e* under the through via 170*g* and the exposed peninsula region of the interconnect or metal trace 35*a* in the interconnection layer 34, can be peninsula-shaped, like the exposed peninsula region of the interconnect or metal trace 35*a*. Preferably, the through via 170*g* can be, but is not limited to, a circular shape from a top perspective view.

Figure 118:
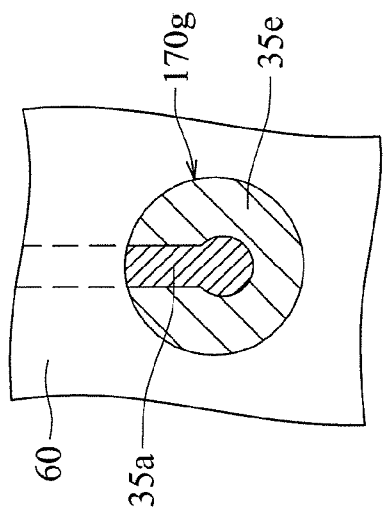

As shown in FIGS. 115 and 118, the through via 170*g* in one of the chips 68 exposes the interconnect or metal trace 35*a* in the one of the chips 68 and exposes a region of the interconnect or metal trace 35*e* in the one of the chips 68. The interconnect or metal trace 35*a* has a peninsula region, exposed by the through via 170*g*, extending in a horizontal direction from one side of the through via 170*g* at least to a center of the through via 170*g*, but does not reach to the opposite side of the through via 170*g*; the interconnect or metal trace 35*a* has a circular end exposed by the through via 170*g*. The supporter 804, between the interconnect or metal trace 35*e* under the through via 170*g* and the exposed peninsula region of the interconnect or metal trace 35*a* in the interconnection layer 34, can be peninsula-shaped, like the exposed peninsula region of the interconnect or metal trace 35*a*. Preferably, the through via 170*g* can be, but is not limited to, a circular shape from a top perspective view.

Figure 119:
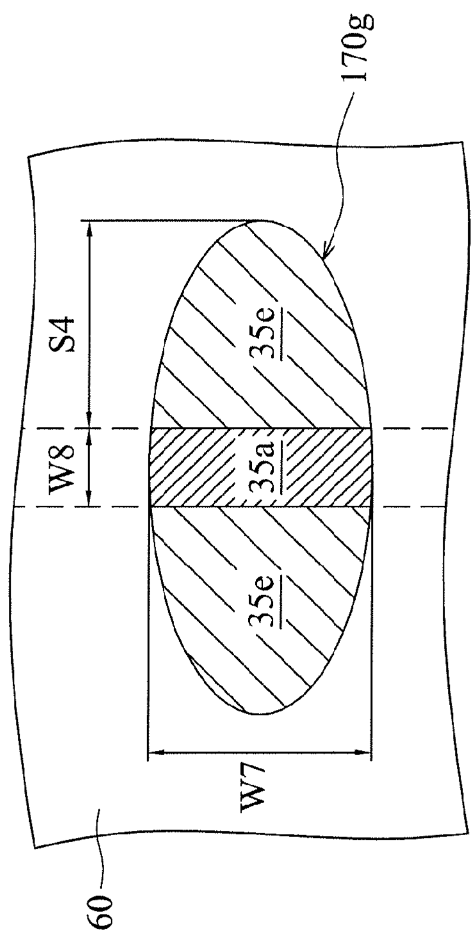

FIG. 119 is an example of a schematic top perspective view showing the through via 170*g* and the interconnects or metal traces 35*a* and 35*e* illustrated in FIG. 115. In this case, the through via 170*g* can be, but is not limited to, oval-shaped and has a width W7, e.g., between 1 and 30 micrometers, and preferably between 1 and 20 micrometers, between 1 and 10 micrometers, between 1 and 5 micrometers, or between 3 and 10 micrometers. The oval-shaped through via 170*g* in one of the chips 68 exposes the interconnect or metal trace 35*a* in the one of the chips 68 and exposes two regions of the interconnect or metal trace 35*e* in the one of the chips 68. The interconnect or metal trace 35*a* has a line-shaped region, exposed by the oval-shaped through via 170*g*, extending in a horizontal direction from a side of the oval-shaped through via 170*g* to the opposite side of the oval-shaped through via 170*g* through a center of the oval-shaped through via 170*g*. The supporter 804, between the interconnect or metal trace 35*e* under the through via 170*g* and the exposed line-shaped region of the interconnect or metal trace 35*a* in the interconnection layer 34, can be line-shaped, like the exposed line-shaped region of the interconnect or metal trace 35*a*. The interconnect or metal trace 35*a* exposed by the oval-shaped through via 170*g* has a width W8, e.g., between 0.3 and 30 micrometers, and preferably between 0.3 and 20 micrometers, between 0.3 and 10 micrometers, between 0.3 and 5 micrometers, or between 0.3 and 1 micrometers. A horizontal distance S4 between an endpoint of the long axis of the oval-shaped through via 170*g* and an edge, which is closer to the endpoint than the other opposite edge, of the interconnect or metal trace 35*a* exposed by the oval-shaped through via 170*g* can be, e.g., between 1 and 30 micrometers, and preferably between 1 and 20 micrometers, between 1 and 10 micrometers, between 1 and 5 micrometers, or between 3 and 10 micrometers.

Figure 120:
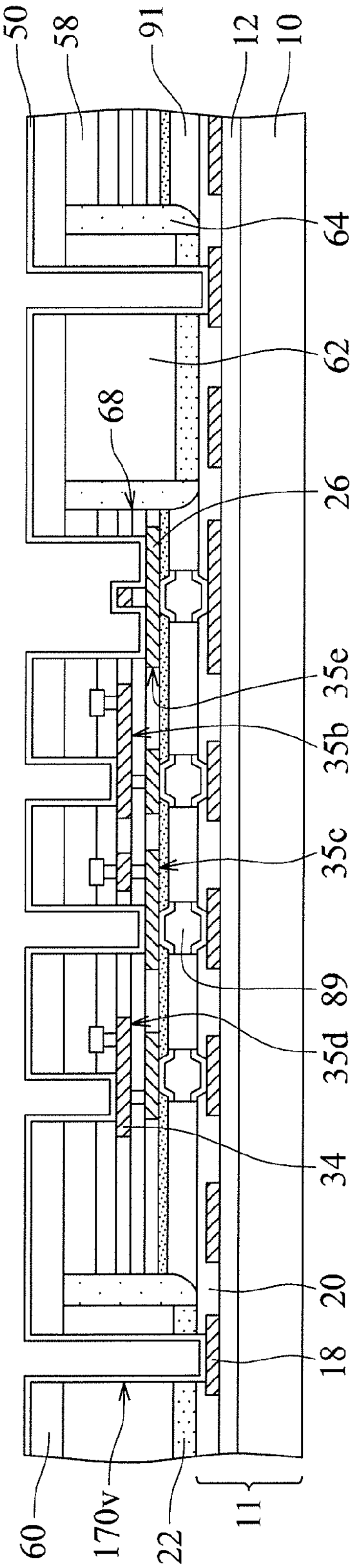

Next, referring to FIG. 120, a dielectric layer 50 can be formed on a top surface of the dielectric layer 60, on the conductive layer 18, exposed by the through vias 170*v* (such as the through via 170*a*), of the carrier 11, on the layers 26 and 34, exposed by the through vias 170*v* (such as the through vias 170*c*, 170*d*, 170*f* and 170*g*), of the chips 68, and on sidewalls of the through vias 170*v*. The specifications of the dielectric layer 50 shown in FIG. 120 can be referred to as the specifications of the dielectric layer 50 as illustrated in FIG. 19.

Figure 121:
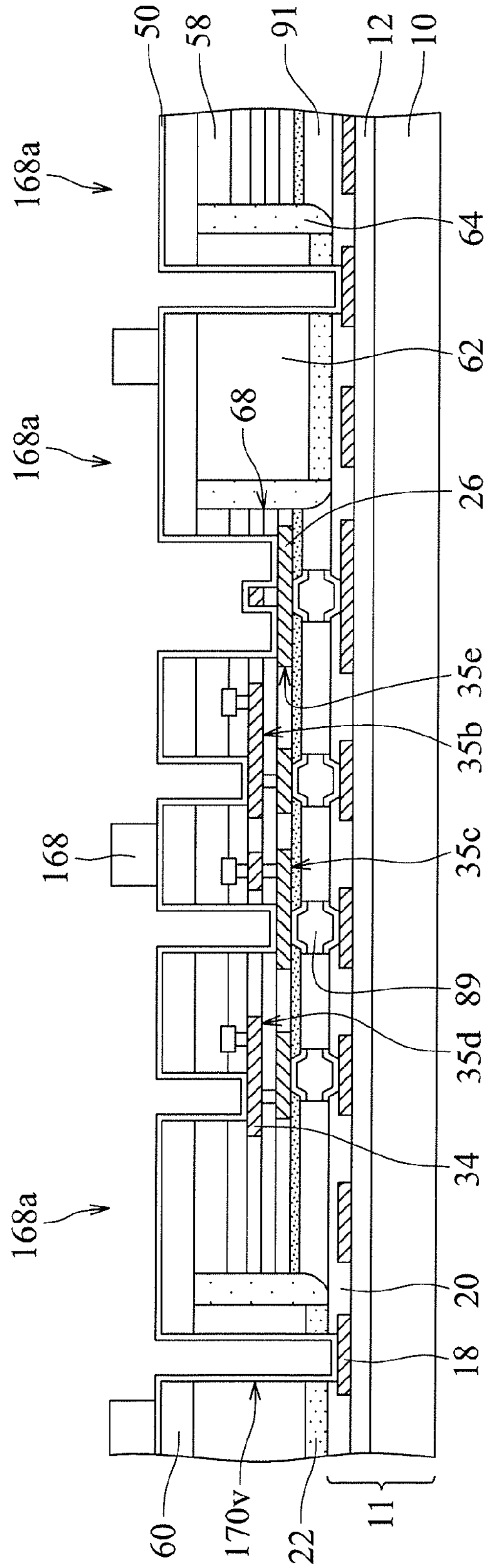

Next, referring to FIG. 121, a photoresist layer 168, such as positive-type photo-sensitive resist layer or negative-type photo-sensitive resist layer, can be formed on the dielectric layer 50 by using, e.g., a spin coating process or a lamination process. Next, a photo exposure process using a 1X stepper and a development process using a wet chemical can be employed to form multiple openings 168*a*, exposing the dielectric layer 50, in the photoresist layer 168. The photoresist layer 168 may have a thickness, e.g., between 0.5 and 30 micrometers.

Figure 122:
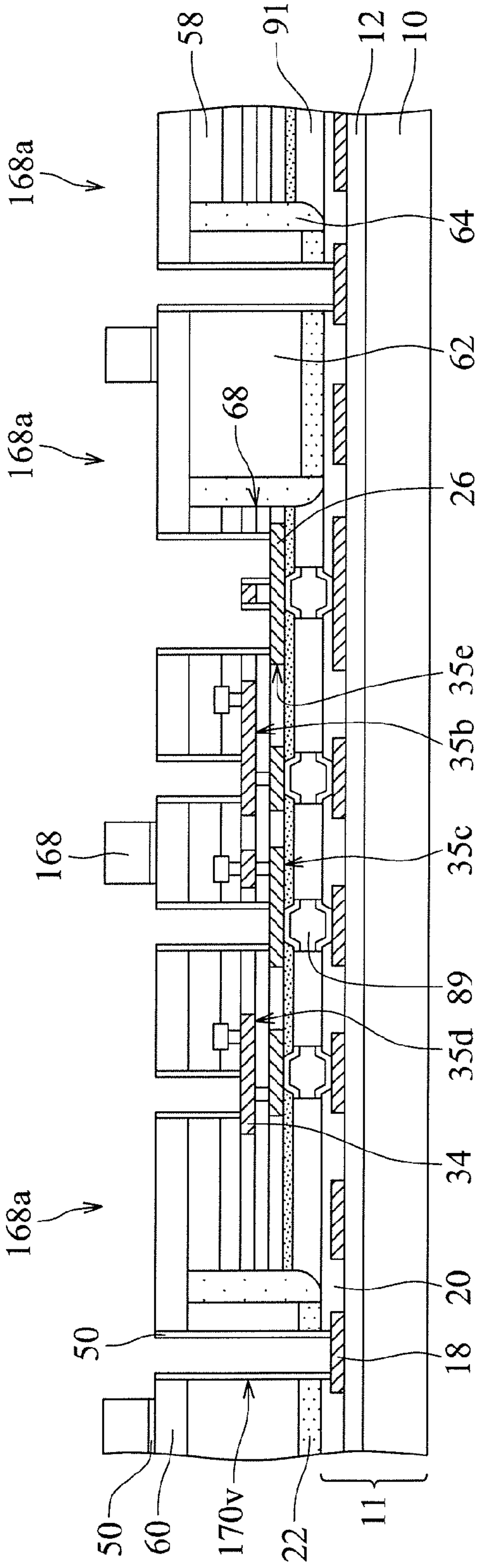

Next, referring to FIG. 122, the dielectric layer 50 formed on the layers 18, 26 and 34 and on the top surface of the dielectric layer 60 under the openings 168*a* can be removed by, e.g., etching the dielectric layer 50 under the openings 168*a* using an anisotropic plasma etching process. The dielectric layer 50 at bottoms of the through vias 170*v*, on the top surface of the dielectric layer 60 under the openings 168*a*, and on a top surface of the interconnect or metal trace 35*a* over the supporter 804 can be etched away. Accordingly, the layers 18, 26 and 34 at the bottoms of the through vias 170*v*, the top surface of the dielectric layer 60 under the openings 168*a*, and the interconnect or metal trace 35*a* over the supporter 804 are exposed by the openings 168*a*, and the dielectric layer 50 remains on the sidewalls of the through vias 170*v*, so called as sidewall dielectric layers in the through vias 170*v*. The sidewall dielectric layers 50 are formed on the sidewalls of the through vias 170*v* in the chips 68 or in the dummy substrate(s) 62 and are enclosed by the semiconductor substrates 58 of the chips 68 or by the dummy substrate(s) 62.

Figure 123:
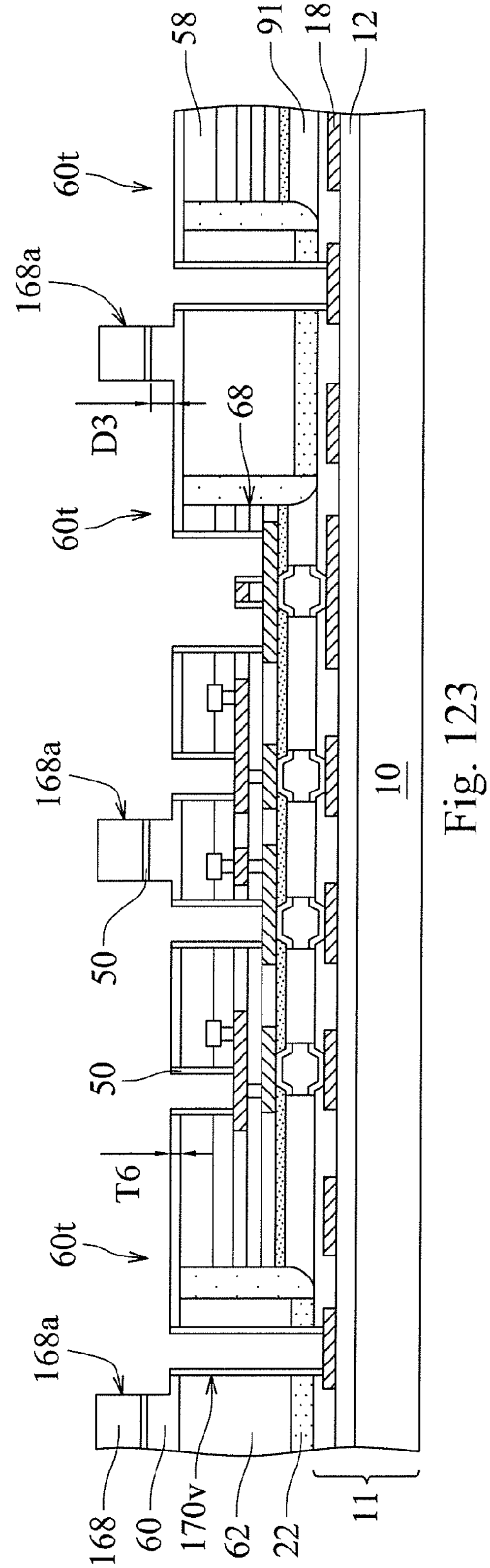

Next, referring to FIG. 123, multiple trenches 60*t*, damascene openings, can be formed in the dielectric layer 60 by etching the dielectric layer 60 and the sidewall dielectric layers 50 under the openings 168*a* to a depth D3, e.g., between 0.1 and 5 micrometers, and preferably between 0.5 and 3 micrometers, using, e.g., an anisotropic plasma etching process. Preferably, the dielectric layer 60 and the sidewall dielectric layers 50 have a same material, such as silicon nitride, silicon oxide, or silicon oxynitride. After the etching process, the dielectric layer 60 under the trenches 60*t* has a remaining thickness T6, e.g., between 0.1 and 5 micrometers, and preferably between 0.3 and 5 micrometers, between 0.5 and 2 micrometers, between 0.1 and 3 micrometers, or between 0.2 and 1.5 micrometers.

Alternatively, an etching-stop technique may be applied to the process of forming the trenches 60*t* in the dielectric layer 60. In this case, the dielectric layer 60 is composed of the previously described inorganic layers, e.g., including the first silicon-oxide layer on the surfaces 58*s*, 62*s* and 64*s*, the silicon-oxynitride layer, used as the etch stop layer, on the first silicon-oxide layer, and the second silicon-oxide layer on the silicon-oxynitride layer. The trenches 60*t* can be formed in the dielectric layer 60 by etching the second silicon-oxide layer of the dielectric layer 60 under the openings 168*a* and the sidewall dielectric layers 50 under the openings 168*a* until the silicon-oxynitride layer of the dielectric layer 60 is exposed by the openings 168*a*. Accordingly, the trenches 60*t* are formed in the second silicon-oxide layer of the dielectric layer 60, and the remaining dielectric layer 60, composed of the silicon-oxynitride layer and the first silicon-oxide layer, under the trenches 60*t* has a thickness T6, e.g., between 0.1 and 5 micrometers, and preferably between 0.3 and 5 micrometers, between 0.5 and 2 micrometers, between 0.1 and 3 micrometers, or between 0.2 and 1.5 micrometers.

Figure 124:
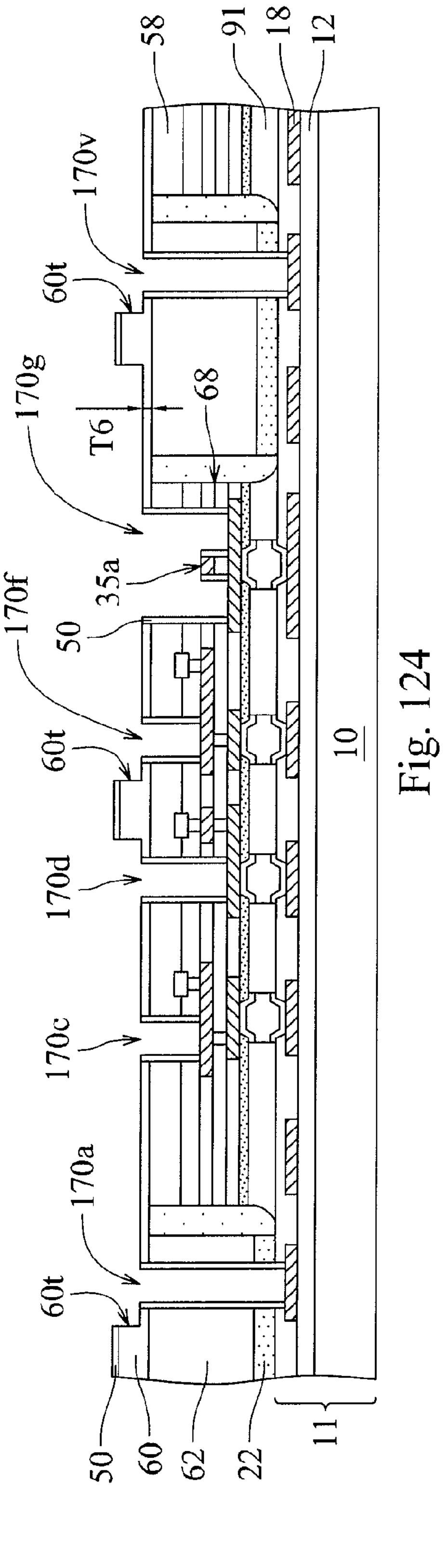
Figure 125:
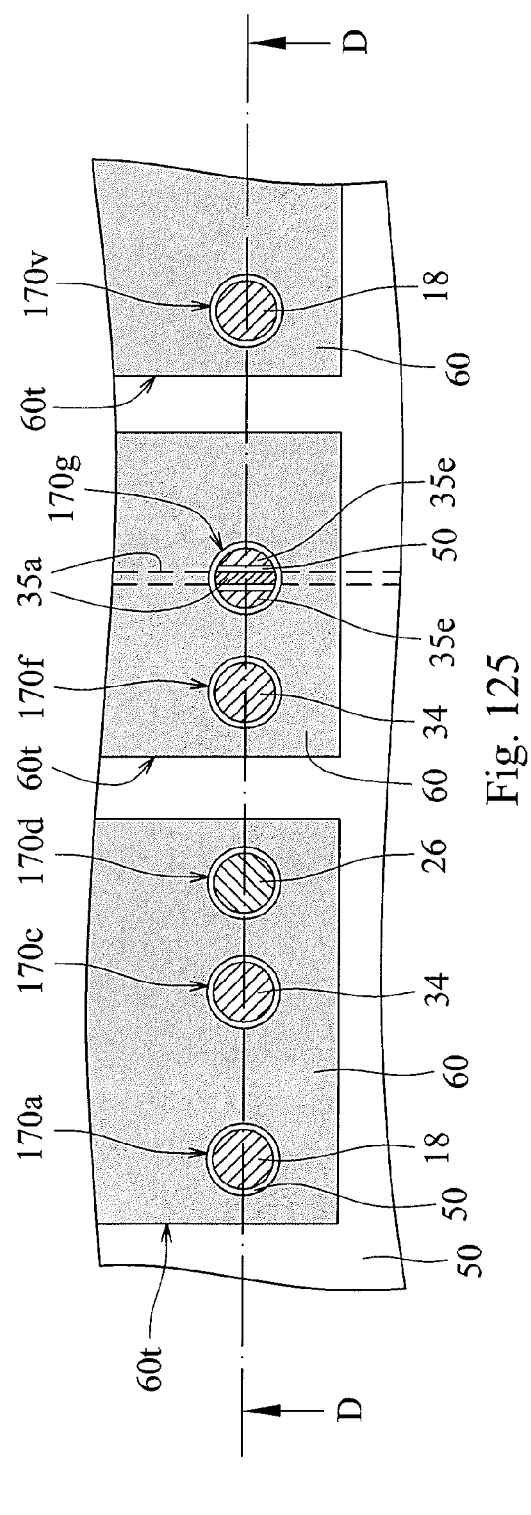

Next, referring to FIG. 124, the photoresist layer 168 is removed by using, e.g., an organic chemical. The trenches 60*t* formed in the dielectric layer 60 are used to provide spaces having inter-chip interconnects and intra-chip interconnects formed therein. The sidewall dielectric layers 50 formed on the sidewalls of the through vias 170*v* (such as the through vias 170*c*, 170*d*, 170*f* and 170*g*) in the chips 68 can prevent transition metals, such as copper, sodium or moisture from penetrating into IC devices of the chips 68. FIG. 125 is a schematic top perspective view showing the trenches 60*t*, the through vias 170*v* and the sidewall dielectric layers 50 shown in FIG. 124 according an embodiment of the present invention, and FIG. 124 is a cross-sectional view cut along the line D-D shown in FIG. 125.

Figure 126:
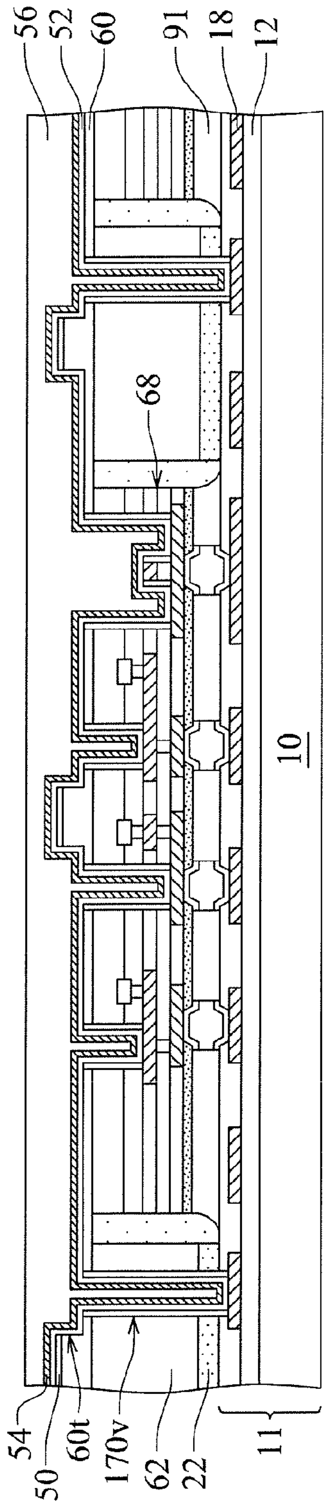

Next, referring to FIG. 126, forming an adhesion/barrier layer 52 on the layers 18, 26 and 34 exposed by the through vias 170*v*, on sidewalls and bottoms of the trenches 60*t*, on the dielectric layer 50, and on the interconnect or metal trace 35*a* that is on the supporter 804, forming a seed layer 54 on the adhesion/barrier layer 52, and forming a conduction layer 56 on the seed layer 54 can be referred to as the steps illustrated in FIG. 25. The specifications of the layers 52, 54 and 56 shown in FIG. 126 can be referred to as the specifications of the layers 52, 54 and 56 as illustrated in FIG. 25, respectively.

Figure 127:
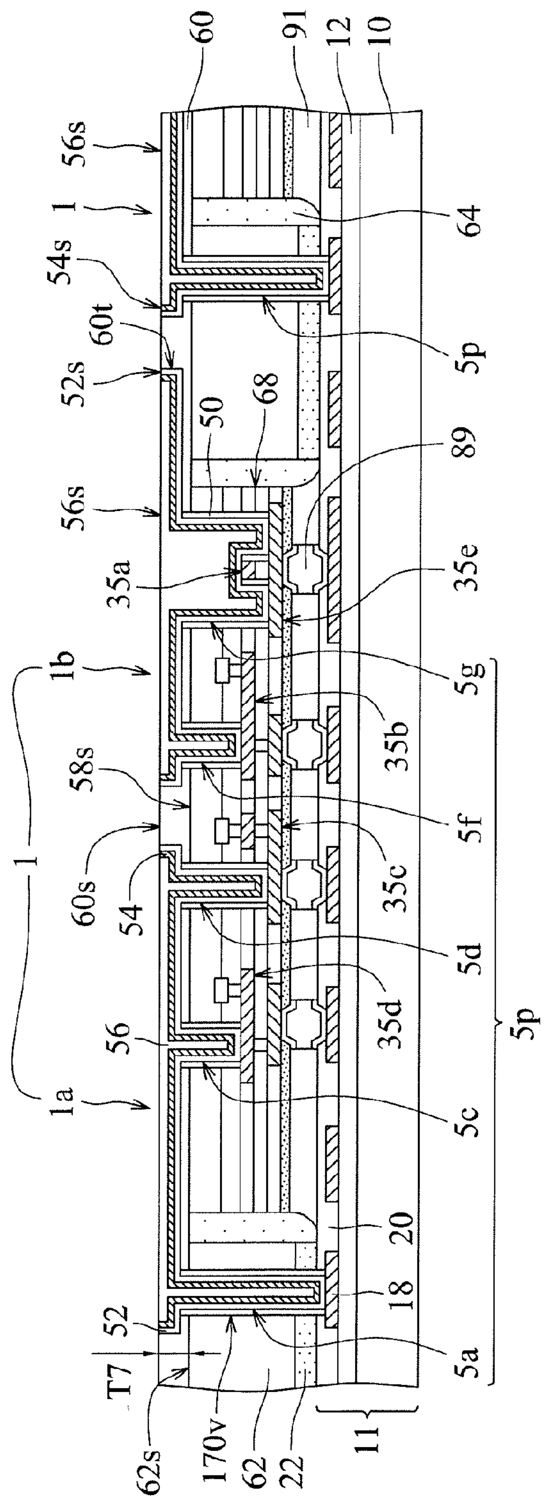

Next, referring to FIG. 127, by using a grinding or polishing process, such as chemical-mechanical-polishing (CMP) process, mechanical polishing process, mechanical grinding process, or a process including mechanical polishing and chemical etching, the layers 52, 54 and 56 outside the trenches 60*t* can be removed, and the dielectric layer 50 on the top surface of the dielectric layer 60 can be removed. Accordingly, the dielectric layer 60 has an exposed top surface 60*s* that can be substantially coplanar with the ground or polished surface 56*s* of the conduction layer 56 in the trenches 60*t*, and the surfaces 56*s* and 60*s* can be substantially flat. The dielectric layer 60 has a thickness T7, between the exposed top surface 60*s* and the surface 58*s* or 62*s*, e.g., between 1 and 10 micrometers, and preferably between 1 and 3 micrometers or between 2 and 5 micrometers. The adhesion/barrier layer 52 and the seed layer 54 are at sidewalls and a bottom of the conduction layer 56 in the trenches 60*t*, and the sidewalls and the bottom of the conduction layer 56 in the trenches 60*t* are covered by the adhesion/barrier layer 52 and the seed layer 54.

In a first alternative, after the steps of removing the layers 52, 54 and 56 outside the trenches 60*t* and removing the dielectric layer 50 on the top surface of the dielectric layer 60, the adhesion/barrier layer 52 can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 60*t*, on the layers 18, 26 and 34 at the bottoms of the through vias 170*v*, on the sidewall dielectric layers 50, and on the interconnect or metal trace 35*a* that is on the supporter 804. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer. The conduction layer 56 can be an electroplated copper layer on the single layer of copper or a titanium-copper alloy, in the trenches 60*t*, and in the through vias 170*v*. The electroplated copper layer in the trenches 60*t* may have a thickness, e.g., between 0.1 and 5 micrometers, and preferably between 0.5 and 3 micrometers.

In a second alternative, after the steps of removing the layers 52, 54 and 56 outside the trenches 60*t* and removing the dielectric layer 50 on the top surface of the dielectric layer 60, the adhesion/barrier layer 52 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 60*t*, on the layers 18, 26 and 34 at the bottoms of the through vias 170*v*, on the sidewall dielectric layers 50, and on the interconnect or metal trace 35*a* that is on the supporter 804. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer. The conduction layer 56 can be an electroplated copper layer on the single layer of copper or a titanium-copper alloy, in the trenches 60*t*, and in the through vias 170*v*. The electroplated copper layer in the trenches 60*t* may have a thickness, e.g., between 0.1 and 5 micrometers, and preferably between 0.5 and 3 micrometers.

In a third alternative, after the steps of removing the layers 52, 54 and 56 outside the trenches 60*t* and removing the dielectric layer 50 on the top surface of the dielectric layer 60, the adhesion/barrier layer 52 can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 60*t*, on the layers 18, 26 and 34 at the bottoms of the through vias 170*v*, on the sidewall dielectric layers 50, and on the interconnect or metal trace 35*a* that is on the supporter 804. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer. The conduction layer 56 can be an electroplated copper layer on the single layer of copper or a titanium-copper alloy, in the trenches 60*t*, and in the through vias 170*v*. The electroplated copper layer in the trenches 60*t* may have a thickness, e.g., between 0.1 and 5 micrometers, and preferably between 0.5 and 3 micrometers.

After the steps of removing the layers 52, 54 and 56 outside the trenches 60*t* and removing the dielectric layer 50 on the top surface of the dielectric layer 60, the layers 52, 54 and 56 in the trenches 60*t* compose multiple metal interconnects (or damascene metal traces) 1, including metal interconnects (or damascene metal traces) 1*a* and 1*b*, in the trenches 60*t*. The layers 52, 54 and 56 in the through vias 170*v* compose multiple metal plugs (or metal vias) 5*p* in the through vias 170*v*, including metal plugs (or metal vias) 5*a*, 5*c*, 5*d*, 5*f* and 5*g* in the through vias 170*a*, 170*c*, 170*d*, 170*f* and 170*g* as shown in FIG. 124, respectively. Each of the metal plugs 5*p* in the chips 68 and in the separate dummy substrates 62 is enclosed by one of the sidewall dielectric layers 50 in the through vias 170*v*. The metal plug 5*a* is formed in one of the separate dummy substrates 62, and the metal plugs 5*c*, 5*d*, 5*f* and 5*g* are formed in the same chip 68. The supporter 804 and the interconnect or metal trace 35*a*, in the interconnection layer 34, on the supporter 804 can be between two portions, lower than a horizontal level, at which a top surface of the interconnection layer 34 is positioned, of the metal plug 5*g*. These metal plugs 5*p* formed in the chips 68 and in the separate dummy substrates 62 can connect the metal interconnects 1 and the semiconductor devices 36 in the chips 68 and connect the metal interconnects 1 and multiple contact points of the conductive layer 18 in the carrier 11. The metal interconnects 1, such as 1*a* and 1*b*, in the trenches 60*t* may have a thickness, e.g., between 0.1 and 5 micrometers, and preferably between 1 and 3 micrometers.

For example, one of the metal plugs 5*p*, such as the metal plug 5*a*, can be formed in one of the separate dummy substrates 62 and formed on a contact point of the conductive layer 18 at a bottom of one of the through vias 170*v*, such as the through via 170*a*. Another one of the metal plugs 5*p*, such as the metal plug 5*c*, can be formed in one of the chips 68 and formed on a contact point, at a bottom of another one of the through vias 170*v* (such as the through via 170*c*), of the interconnect or metal trace 35*d* in the interconnection layer 34 of the one of the chips 68. Another one of the metal plugs 5*p*, such as the metal plug 5*d*, can be formed in one of the chips 68 and formed on a contact point, at a bottom of another one of the through vias 170*v* (such as the through via 170*d*), of the interconnect or metal trace 35*c* in the patterned metal layer 26 of the one of the chips 68. Another one of the metal plugs 5*p*, such as the metal plug 5*f*, can be formed in one of the chips 68 and formed on a contact point, at a bottom of another one of the through vias 170*v* (such as the through via 170*f*), of the interconnect or metal trace 35*b* in the interconnection layer 34 of the one of the chips 68. Another one of the metal plugs 5*p*, such as the metal plug 5*g*, can be formed in one of the chips 68, formed on a contact point of the interconnect or metal trace 35*a* over a supporter (such as the supporter 804) that is between two lower left and right portions of the another one of the metal plugs 5*p* (such as the metal plug 5*g*), and formed on one or more contact points of the interconnect or metal trace 35*e* under one of the through vias 170*v* (such as the through via 170*g*).

One of the metal interconnects 1, such as 1*a* or 1*b*, can be formed over multiple of the separate dummy substrates 62, over multiple of the chips 68, across multiple edges of the multiple of the chips 68, and across multiple edges of the multiple of the separate dummy substrates 62. The metal interconnect 1*a* can be connected to the contact point, at the bottom of the through via 170*a*, of the conductive layer 18 through the metal plug 5*a* in one of the separate dummy substrates 62, can be connected to the contact point, at the bottom of the through via 170*c*, of the interconnect or metal trace 35*d* in one of the chips 68 through the metal plug 5*c* in the one of the chips 68, and can be connected to the contact point, at the bottom of the through via 170*d*, of the interconnect or metal trace 35*c* in the one of the chips 68 through the metal plug 5*d* in the one of the chips 68. The metal interconnect 1*b* can be connected to the contact point, at the bottom of the through via 170*f*, of the interconnect or metal trace 35*b* in the one of the chips 68 through the metal plug 5*f* in the one of the chips 68, can be connected to the contact point(s), at the bottom of the through via 170*g*, of the interconnect or metal trace 35*e* in the one of the chips 68 through the metal plug 5*g* in the one of the chips 68, and can be connected to the interconnect or metal trace 35*a* on the supporter 804 through the metal plug 5*g*. The metal interconnect 1*a* can be further connected to one or more of the semiconductor devices 36 in another one of chips 68 through one or more of the metal plugs 5*p* in the another one of chips 68. The metal interconnect 1*b* can be further connected to one or more of the semiconductor devices 36 in another one of chips 68 through one or more of the metal plugs 5*p* in the another one of chips 68.

Accordingly, one of the semiconductor devices 36 in one of the chips 68 can be connected to another one of the semiconductor devices 36 in the one of the chips 68 or in another one of the chips 68 through one of the metal interconnects 1, such as 1*a* or 1*b*, and can be connected to a contact point, at a bottom of one of the through vias 170*v* (such as the through via 170*a*), of the conductive layer 18 in the carrier 11 through the one of the metal interconnects 1. Each of the metal interconnects 1 can be a signal trace, a bit line, a clock bus, a power plane, a power bus, a power trace, a ground plane, a ground bus, or a ground trace.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

Figure 128:
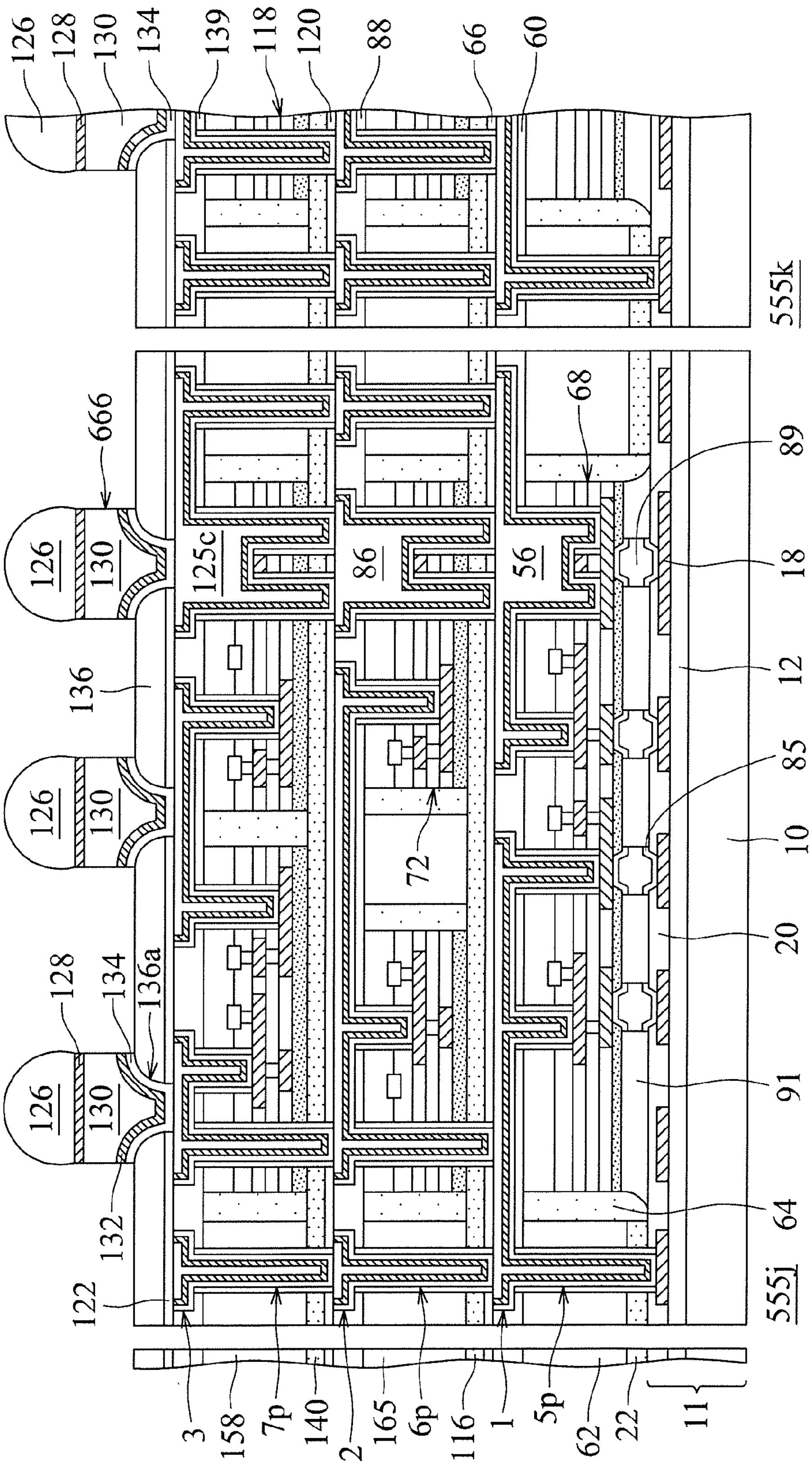

Referring to FIG. 128, after forming the structure shown in FIG. 127, the following steps can be subsequently performed as illustrated in FIGS. 27-81, and then a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in packages or multichip modules 555*j* and 555*k*.

Alternatively, before the singulation process, multiple metal plugs or vias can be formed in multiple openings in the substrate 10 and the dielectric layer 12 of the carrier 11, passing through the substrate 10 and the dielectric layer 12, and connected to the conductive layer 18 of the carrier 11. The metal plugs or vias may include or can be copper, aluminum, gold, or nickel. Alternatively, the metal plugs or vias may further include titanium, a titanium-tungsten alloy, titanium nitride, tantalum, tantalum nitride, a titanium-copper alloy, or chromium. Next, multiple metal traces can be formed at a bottom side of the substrate 10 and connected to the conductive layer 18 of the carrier 11 through the metal plugs or vias. Each of the metal traces may include a layer of titanium, a titanium-tungsten alloy, titanium nitride, chromium, tantalum, tantalum nitride, or a titanium-copper alloy under the bottom side of the substrate 10, and an electroplated metal layer under the layer of titanium, a titanium-tungsten alloy, titanium nitride, chromium, tantalum, tantalum nitride, or a titanium-copper alloy. The electroplated metal layer may include or can be a layer of copper, gold, aluminum, or nickel. Next, multiple passive components, such as capacitors, inductors or resistors, can be attached to the bottom side of the substrate 10 and boned with the metal traces using solders. The solders may include bismuth, indium, tin, a tin-lead alloy, a tin-silver alloy, a tin-silver-copper alloy, a tin-gold alloy, or a tin-copper alloy. After the passive components are boned with the metal traces, the singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as the system-in packages or multichip modules 555*j* and 555*k*.

Accordingly, the system-in package or multichip module 555*j* may have one of the passive components that has a first terminal connected to the metal plug 5*a* as shown in FIG. 127 through, in sequence, one of the solders, one of the metal traces at the bottom side of the substrate 10, one of the metal plugs or vias in the substrate 10, and a metal interconnect of the conductive layer 18 at the top side of the substrate 10, and has a second terminal connected to one of the metal joints 89, which can be connected to the metal plug 5*f* or 5*g* as shown in FIG. 127, through, in sequence, another one of the solders, another one of the metal traces at the bottom side of the substrate 10, another one of the metal plugs or vias in the substrate 10, and another metal interconnect of the conductive layer 18 at the top side of the substrate 10.

Alternatively, the system-in package or multichip module 555*j* may have one of the passive components that has a first terminal connected to one of the metal joints 89, which can be connected to the metal plug 5*c* or 5*d* as shown in FIG. 127, through, in sequence, one of the solders, one of the metal traces at the bottom side of the substrate 10, one of the metal plugs or vias in the substrate 10, and a metal interconnect of the conductive layer 18 at the top side of the substrate 10, and has a second terminal connected to another one of the metal joints 89, which can be connected to the metal plug 5*f* or 5*g* as shown in FIG. 127, through, in sequence, another one of the solders, another one of the metal traces at the bottom side of the substrate 10, another one of the metal plugs or vias in the substrate 10, and another metal interconnect of the conductive layer 18 at the top side of the substrate 10.

Figure 129:
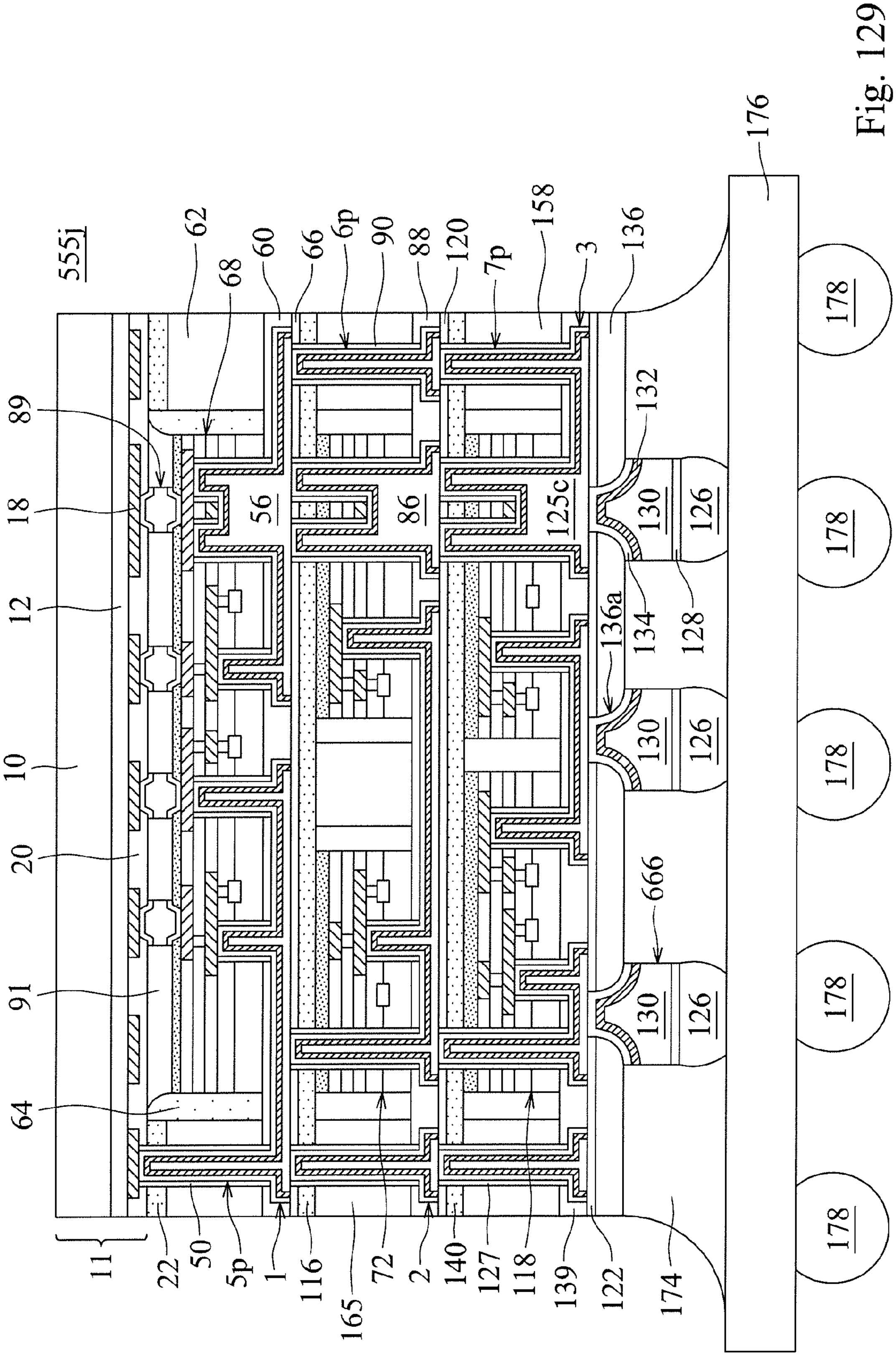
FIG. 129 shows a cross-sectional view of a multichip package according to an embodiment of the present disclosure.

The system-in package or multichip module 555*j* can be connected to and bonded with a carrier, such as mother board, printed circuit board (PCB), ball-grid-array (BGA) substrate, metal substrate, glass substrate, or ceramic substrate, using the solder bumps or balls 126. For example, referring to FIG. 129, the system-in package or multichip module 555*j* can be bonded with a top side of a carrier 176 using, e.g., a flip chip technology of joining the solder bumps or balls 126 with a solder or gold layer preformed on the top side of the carrier 176. Next, an under fill 174 can be formed between the polymer layer 136 of the system-in package or multichip module 555*j* and the top side of the carrier 176 and encloses the solder bumps or balls 126. Next, multiple solder balls 178 can be formed on a bottom side of the carrier 176. The specifications of the carrier 176, the under fill 174, and the solder balls 178 shown in FIG. 129 can be referred to as the specifications of the carrier 176, the under fill 174, and the solder balls 178 as illustrated in FIG. 83, respectively.

Figure 130:
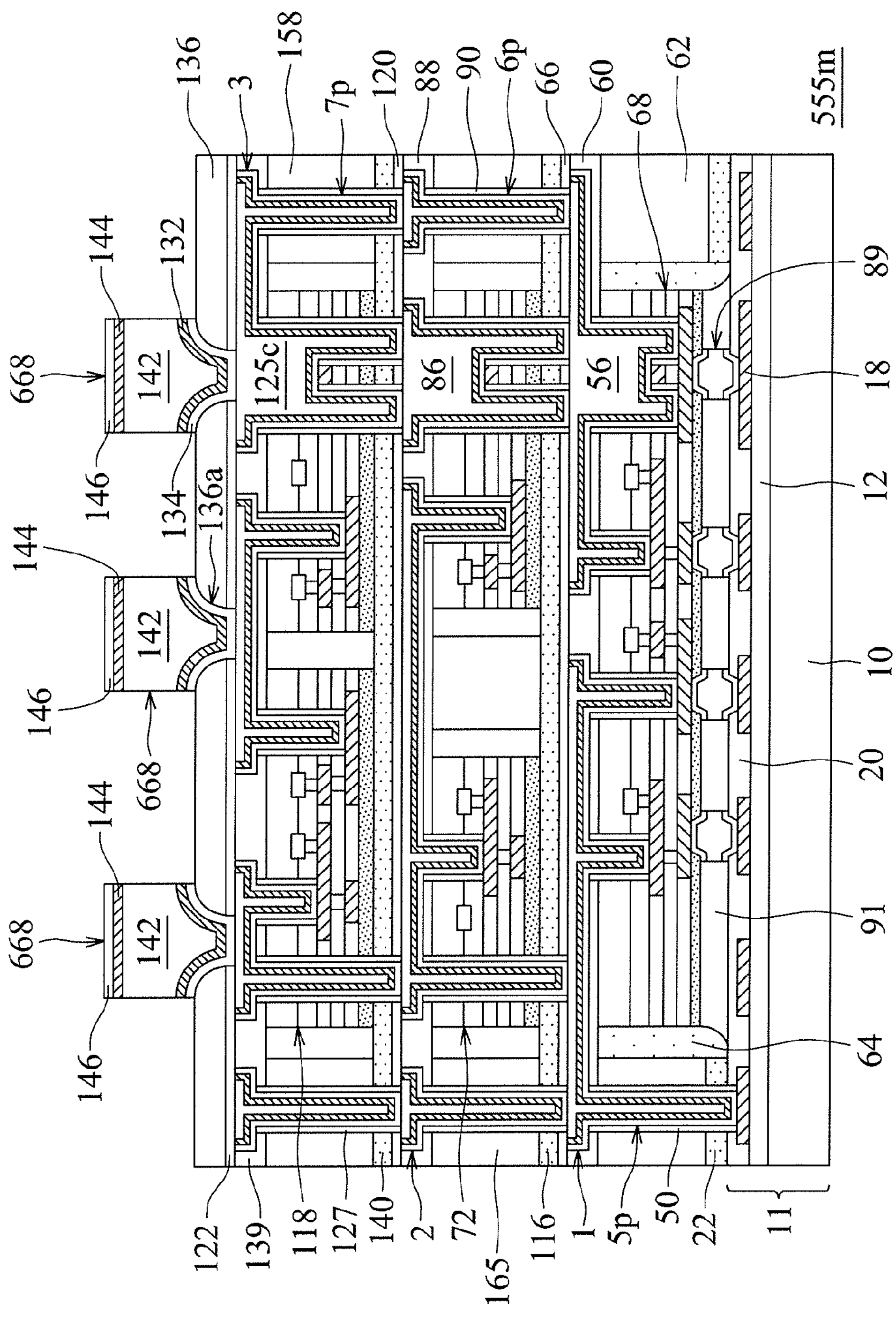
FIG. 130 shows a cross-sectional view of a system-in package or multichip module according to an embodiment of the present disclosure.

FIG. 130 shows another system-in package or multichip module according to another embodiment of the present disclosure, which can be formed by the following steps. After forming the structure shown in FIG. 127, the steps as illustrated in FIGS. 27-79 can be subsequently performed. Next, forming metal bumps 668 on the polymer layer 136 and on the contact points, at the bottoms of the openings in the insulating or dielectric layer 122 and under the openings 136*a* in the polymer layer 136, of the conduction layer 125*c* of the metal interconnects 3 can be referred to as the steps illustrated in FIG. 84. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in package or multichip module 555*m*. In the system-in package or multichip module 555*m*, each of the interconnects 3 can be connected to one or more of the metal bumps 668.

Figure 131:
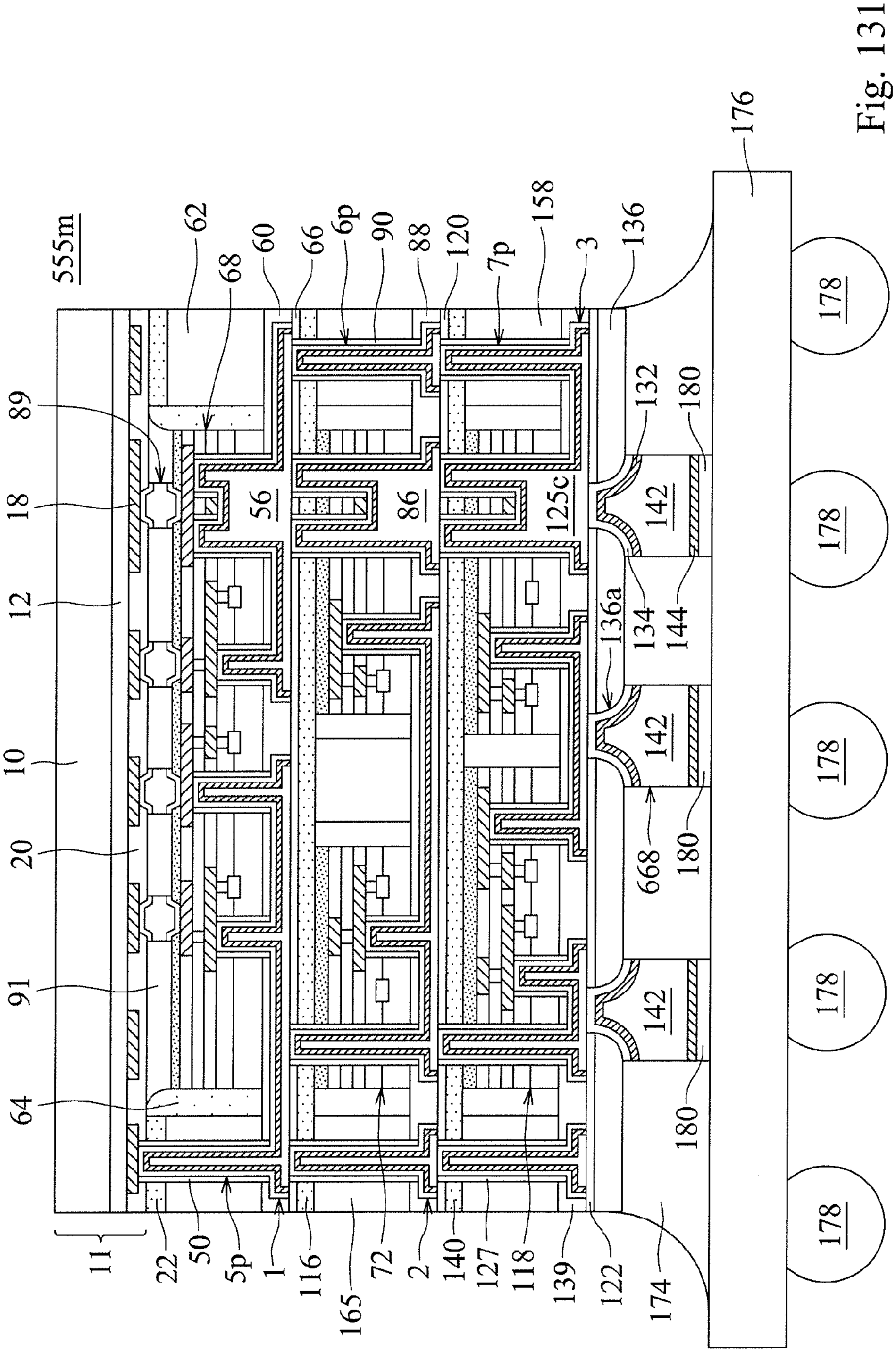
FIG. 131 shows a cross-sectional view of a multichip package according to an embodiment of the present disclosure.

The system-in package or multichip module 555*m* can be connected to and bonded with a carrier, such as mother board, printed circuit board (PCB), ball-grid-array (BGA) substrate, metal substrate, glass substrate, or ceramic substrate, using the metal bumps 668. For example, referring to FIG. 131, the system-in package or multichip module 555*m* can be bonded with the top side of the carrier 176 illustrated in FIG. 83 using, e.g., a flip chip technology of joining the solder wetting layer 146 of the metal bumps 668 with a solder or gold layer preformed on the top side of the carrier 176. After joining the solder wetting layer 146 with the solder or gold layer preformed on the top side of the carrier 176, multiple metal joints 180 are formed between the barrier layer 144 of the metal bumps 668 and the top side of the carrier 176. The metal joints 180 can be a layer of a Sn—Ag alloy, a Sn—Ag—Cu alloy, a Sn—Au alloy, or a Sn—Pb alloy having a thickness between 5 and 50 micrometers. Alternatively, the metal joints 180 can be a gold layer having a thickness between 0.1 and 10 micrometers. Next, the under fill 174 illustrated in FIG. 83 can be formed between the polymer layer 136 of the system-in package or multichip module 555*m* and the top side of the carrier 176 and encloses the metal bumps 668 and the metal joints 180. Next, the solder balls 178 illustrated in FIG. 83 can be formed on the bottom side of the carrier 176.

Alternatively, the insulating or dielectric layer 122 as shown FIGS. 128-131 can be omitted. In this case, the polymer layer 136 is formed on the surfaces 223, 225, 227 and 139*s*, and the contact points of the conduction layer 125*c* of the metal interconnects 3 are exposed by and at ends of the openings 136*a* in the polymer layer 136. Further, the adhesion/barrier layer 134 is formed on the contact points, exposed by and at the ends of the openings 136*a* in the polymer layer 136, of the conduction layer 125*c* of the metal interconnects 3.

Figure 132:
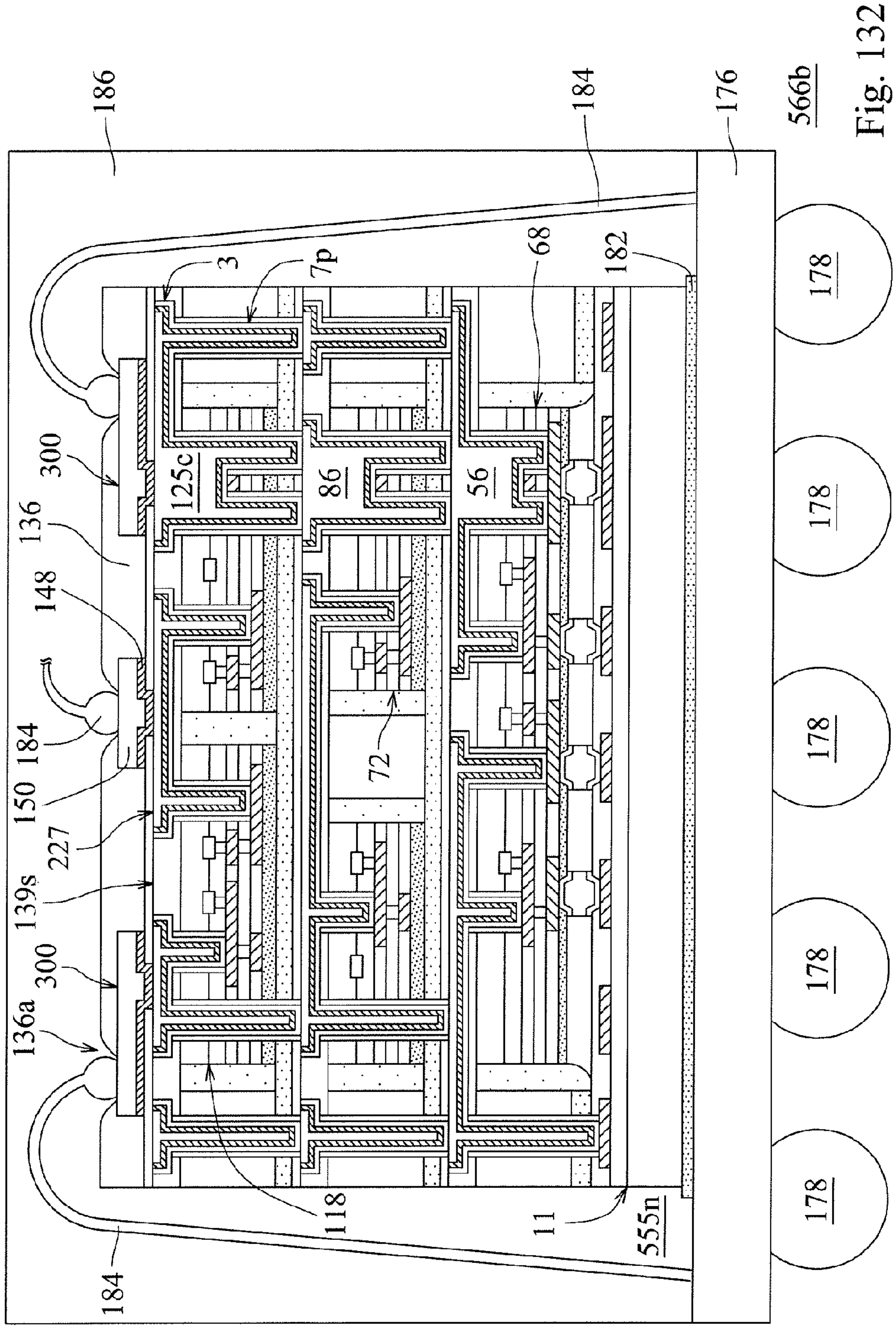
FIG. 132 shows a cross-sectional view of a multichip package according to an embodiment of the present disclosure.

FIG. 132 shows a multichip package 566*b* including a system-in package or multichip module 555*n* connected to the carrier 176 illustrated in FIG. 83 through wirebonded wires 184, which can be formed by, e.g., the following steps. After forming the structure shown in FIG. 127, the steps as illustrated in FIGS. 27-76 can be subsequently performed. Next, forming an insulating or dielectric layer 122 on the ground or polished surfaces of the layers 125*a* and 125*b*, on the ground or polished surface 227 of the conduction layer 125*c*, and on the exposed top surface 139*s* of the dielectric layer 139, forming multiple metal interconnects or traces 300 on the insulating or dielectric layer 122 and on multiple regions, exposed by multiple openings 122*a* in the layer 122, of the conduction layer 125*c* of the metal interconnects 3, and forming a polymer layer 136 on the insulating or dielectric layer 122 and on the metal interconnects or traces 300 can be referred to as the steps illustrated in FIG. 86. The polymer layer 136 after being cured may have a thickness, e.g., between 1 and 20 micrometers, and preferably between 2 and 15 micrometers or between 5 and 10 micrometers, and multiple openings 136*a* in the polymer layer 136 expose multiple contact points of the metal interconnects or traces 300. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as the system-in package or multichip module 555*n*.

Next, a plurality of the system-in package or multichip module 555*n* can be joined with the carrier 176 shown in FIG. 83 by, e.g., forming a glue layer 182 with a thickness between 20 and 150 micrometers on the top side of the carrier 176, and then attaching the plurality of the system-in package or multichip module 555*n* to the top side of the carrier 11 using the glue layer 182. The glue layer 182 can be a polymer layer, such as a layer of polyimide, benzocyclobutene (BCB), epoxy, polybenzoxazole (PBO), poly-phenylene oxide (PPO), silosane, or SU-8, with a thickness, e.g., between 20 and 150 micrometers. Next, multiple wires 184, such as gold wires, copper wires, or aluminum wires, can be wirebonded onto the top side of the carrier 176 and onto the contact points, exposed by the openings 136*a* in the polymer layer 136, of the conduction layer 150 of the metal interconnects or traces 300 by a wirebonding process. Accordingly, the metal interconnects or traces 300 of the plurality of the system-in package or multichip module 555*n* can be physically and electrically connected to the carrier 176 through the wirebonded wires 184. Next, a molding compound 186 can be formed on the plurality of the system-in package or multichip module 555*n*, on the top side of the carrier 176 and on the wirebonded wires 184, encapsulating the wirebonded wires 184 and the plurality of the system-in package or multichip module 555*n*, by a molding process. The molding compound 186 may include epoxy, carbon filler or glass filler, and the glass filler or carbon filler can be distributed in the epoxy. Next, the solder balls 178 illustrated in FIG. 83 can be formed on the bottom side of the carrier 176. Thereafter, a singulation process can be performed to cut the carrier 176 and the molding compound 186 and to singularize a plurality of the multichip package 566*b*. The multichip package 566*b* can be connected to a carrier, such as mother board, ball-grid-array (BGA) substrate, printed circuit board, metal substrate, glass substrate, or ceramic substrate, through the solder balls 178.

Figure 133:
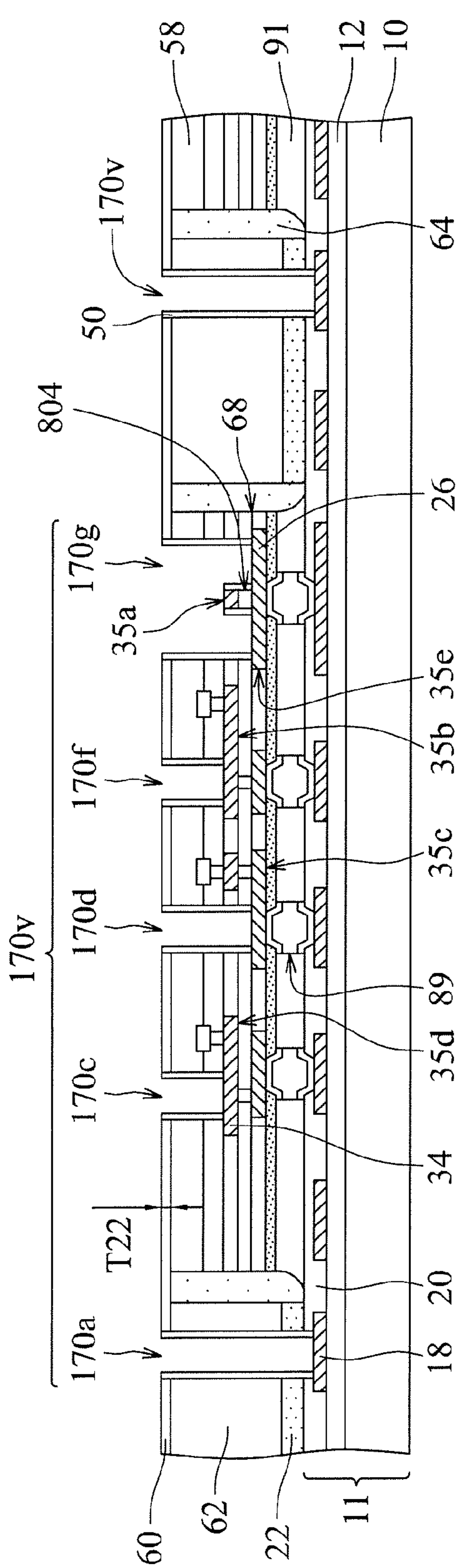
FIGS. 133-136 show a process for forming a system-in package or multichip module according to an embodiment of the present disclosure.

FIGS. 133-136 show a process for forming another system-in package or multichip module according to another embodiment of the present disclosure. Referring to FIG. 133, after forming the structure illustrated in FIG. 120, the dielectric layer 50 formed on the layers 18, 26 and 34 and on the top surface of the dielectric layer 60 is etched away, and a top portion of the dielectric layer 60 is etched away, which can be referred to as the steps illustrated in FIG. 89. Accordingly, the dielectric layer 50 at bottoms of the through vias 170*v*, on the top surface of the dielectric layer 60 and on a top surface of the interconnect or metal trace 35*a* over the supporter 804 is etched away, and the dielectric layer 50 remains on the sidewalls of the through vias 170*v*, so called as sidewall dielectric layers in the through vias 170*v*. The sidewall dielectric layers 50 are formed on the sidewalls of the through vias 170*v* in the chips 68 or in the dummy substrate(s) 62 and are enclosed by the semiconductor substrates 58 of the chips 68 or by the dummy substrate(s) 62. The dielectric layer 60 may have a remaining thickness T22 between 0.3 and 5 micrometers, between 0.5 and 2 micrometers, between 0.05 and 2 micrometers, between 0.05 and 1 micrometers, between 0.05 and 0.5 micrometers, or between 0.05 and 0.3 micrometers.

Figure 134:
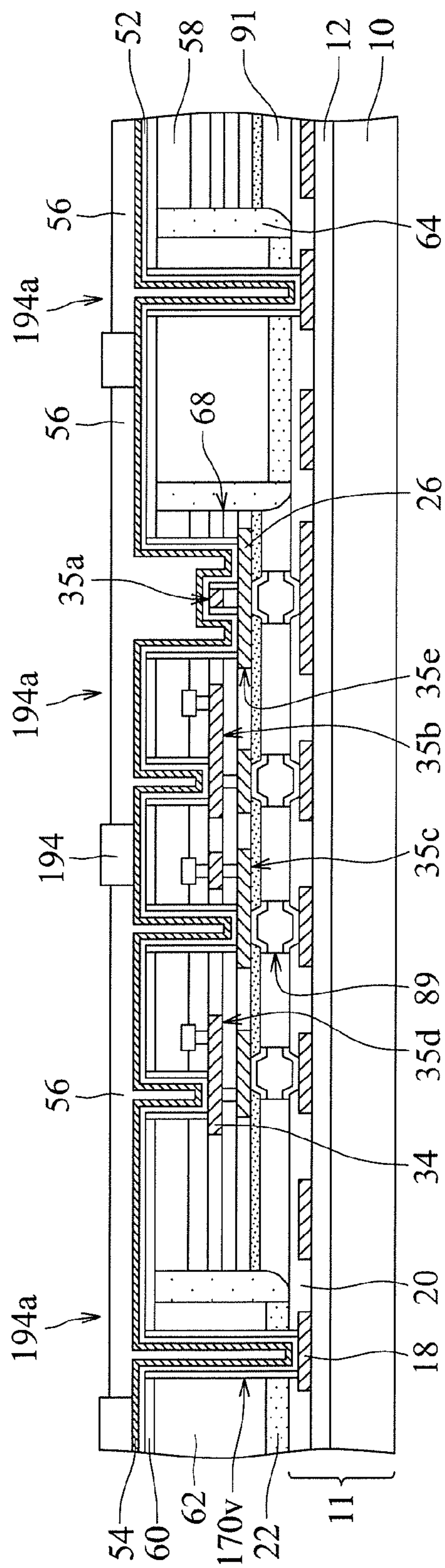

Next, referring to FIG. 134, forming an adhesion/barrier layer 52 on the layers 18, 26 and 34 exposed by the through vias 170*v*, on the etched surface of the dielectric layer 60, on the sidewall dielectric layers 50, and on the interconnect or metal trace 35*a* that is on the supporter 804, forming a seed layer 54 on the adhesion/barrier layer 52, forming a photoresist layer 194 on the seed layer 54, forming multiple openings 194*a* in the photoresist layer 194, and forming a conduction layer 56 on multiple regions, exposed by the openings 194*a* in the layer 194, of the seed layer 54 can be referred to as the steps illustrated in FIG. 90.

Figure 135:
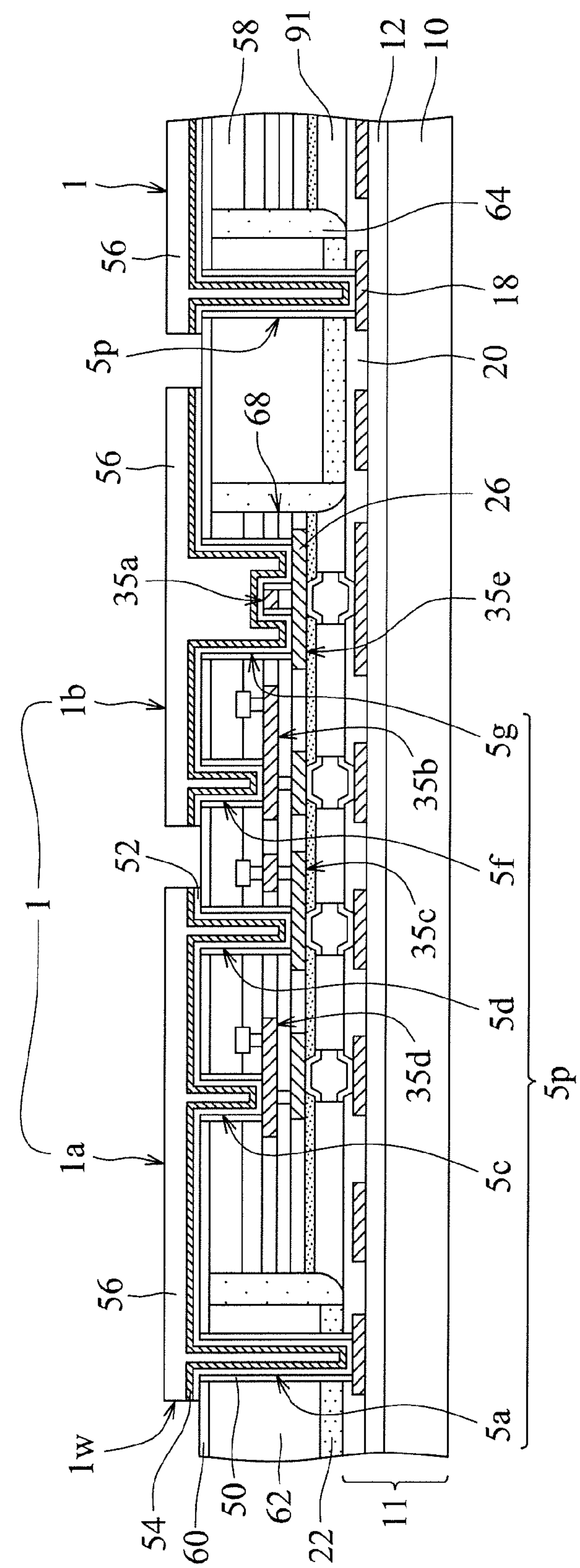

Next, referring to FIG. 135, the photoresist layer 194 is removed using, e.g., an organic chemical solution. Next, the seed layer 54 not under the conduction layer 56 is removed by a suitable process, such as wet chemical etching process or dry plasma etching process. Next, the adhesion/barrier layer 52 not under the conduction layer 56 is removed by a suitable process, such as wet chemical etching process or dry plasma etching process. Accordingly, the layers 52, 54 and 56 over the dielectric layer 60 and over the through vias 170*v* compose multiple metal interconnects 1, including metal interconnects 1*a* and 1*b*, over the dielectric layer 60 and over the through vias 170*v*. The adhesion/barrier layer 52 and the seed layer 54 of the metal interconnects 1 over the dielectric layer 60 are not at any sidewall 1*w* of the conduction layer 56 of the metal interconnects 1 over the dielectric layer 60, but under a bottom of the conduction layer 56 of the metal interconnects 1 over the dielectric layer 60. The sidewalls 1*w* of the conduction layer 56 of the metal interconnects 1 over the dielectric layer 60 are not covered by the layers 52 and 54. The layers 52, 54 and 56 in the through vias 170*v* compose multiple metal plugs (or metal vias) 5*p* in the through vias 170*v*, including metal plugs (or metal vias) 5*a*, 5*c*, 5*d*, 5*f* and 5*g* in the through vias 170*a*, 170*c*, 170*d*, 170*f* and 170*g* as shown in FIG. 133, respectively. Each of the metal plugs 5*p* in the chips 68 and in the separate dummy substrates 62 is enclosed by one of the sidewall dielectric layers 50 in the through vias 170*v*. The metal plug 5*a* is formed in one of the separate dummy substrates 62, and the metal plugs 5*c*, 5*d*, 5*f* and 5*g* are formed in the same chip 68. The supporter 804 and the interconnect or metal trace 35*a*, in the interconnection layer 34, on the supporter 804 can be between two portions, lower than a horizontal level, at which a top surface of the interconnection layer 34 is positioned, of the metal plug 5*g*. These metal plugs 5*p* formed in the chips 68 and in the separate dummy substrates 62 can connect the metal interconnects 1 and the semiconductor devices 36 of the chips 68 and connect the metal interconnects 1 and multiple contact points of the conductive layer 18 in the carrier 11.

For example, one of the metal plugs 5*p*, such as the metal plug 5*a*, can be formed in one of the separate dummy substrates 62 and formed on a contact point of the conductive layer 18 at a bottom of one of the through vias 170*v*, such as the through via 170*a*. Another one of the metal plugs 5*p*, such as the metal plug 5*c*, can be formed in one of the chips 68 and formed on a contact point, at a bottom of another one of the through vias 170*v* (such as the through via 170*c*), of the interconnect or metal trace 35*d* in the interconnection layer 34 of the one of the chips 68. Another one of the metal plugs 5*p*, such as the metal plug 5*d*, can be formed in one of the chips 68 and formed on a contact point, at a bottom of another one of the through vias 170*v* (such as the through via 170*d*), of the interconnect or metal trace 35*c* in the patterned metal layer 26 of the one of the chips 68. Another one of the metal plugs 5*p*, such as the metal plug 5*f*, can be formed in one of the chips 68 and formed on a contact point, at a bottom of another one of the through vias 170*v* (such as the through via 170*f*), of the interconnect or metal trace 35*b* in the interconnection layer 34 of the one of the chips 68. Another one of the metal plugs 5*p*, such as the metal plug 5*g*, can be formed in one of the chips 68, formed on a contact point of the interconnect or metal trace 35*a* over a supporter (such as the supporter 804) that is between two lower left and right portions of the another one of the metal plugs 5*p* (such as the metal plug 5*g*), and formed on one or more contact points of the interconnect or metal trace 35*e* under one of the through vias 170*v* (such as the through via 170*g*).

One of the metal interconnects 1, such as 1*a* or 1*b*, can be formed over multiple of the separate dummy substrates 62, over multiple of the chips 68, across multiple edges of the multiple of the chips 68, and across multiple edges of the multiple of the separate dummy substrates 62. The metal interconnect 1*a* can be connected to the contact point, at the bottom of the through via 170*a*, of the conductive layer 18 through the metal plug 5*a* in one of the separate dummy substrates 62, can be connected to the contact point, at the bottom of the through via 170*c*, of the interconnect or metal trace 35*d* in one of the chips 68 through the metal plug 5*c* in the one of the chips 68, and can be connected to the contact point, at the bottom of the through via 170*d*, of the interconnect or metal trace 35*c* in the one of the chips 68 through the metal plug 5*d* in the one of the chips 68. The metal interconnect 1*b* can be connected to the contact point, at the bottom of the through via 170*f*, of the interconnect or metal trace 35*b* in the one of the chips 68 through the metal plug 5*f* in the one of the chips 68, can be connected to the contact point(s), at the bottom of the through via 170*g*, of the interconnect or metal trace 35*e* in the one of the chips 68 through the metal plug 5*g* in the one of the chips 68, and can be connected to the interconnect or metal trace 35*a* on the supporter 804 through the metal plug 5*g*. The metal interconnect 1*a* can be further connected to one or more of the semiconductor devices 36 in another one of chips 68 through one or more of the metal plugs 5*p* in the another one of chips 68. The metal interconnect 1*b* can be further connected to one or more of the semiconductor devices 36 in another one of chips 68 through one or more of the metal plugs 5*p* in the another one of chips 68.

Accordingly, one of the semiconductor devices 36 in one of the chips 68 can be connected to another one of the semiconductor devices 36 in the one of the chips 68 or in another one of the chips 68 through one of the metal interconnects 1, such as 1*a* or 1*b*, and can be connected to a contact point, at a bottom of one of the through vias 170*v* (such as the through via 170*a*), of the conductive layer 18 in the carrier 11 through the one of the metal interconnects 1. Each of the metal interconnects 1 can be a signal trace, a bit line, a clock bus, a power plane, a power bus, a power trace, a ground plane, a ground bus, or a ground trace.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

Figure 136:
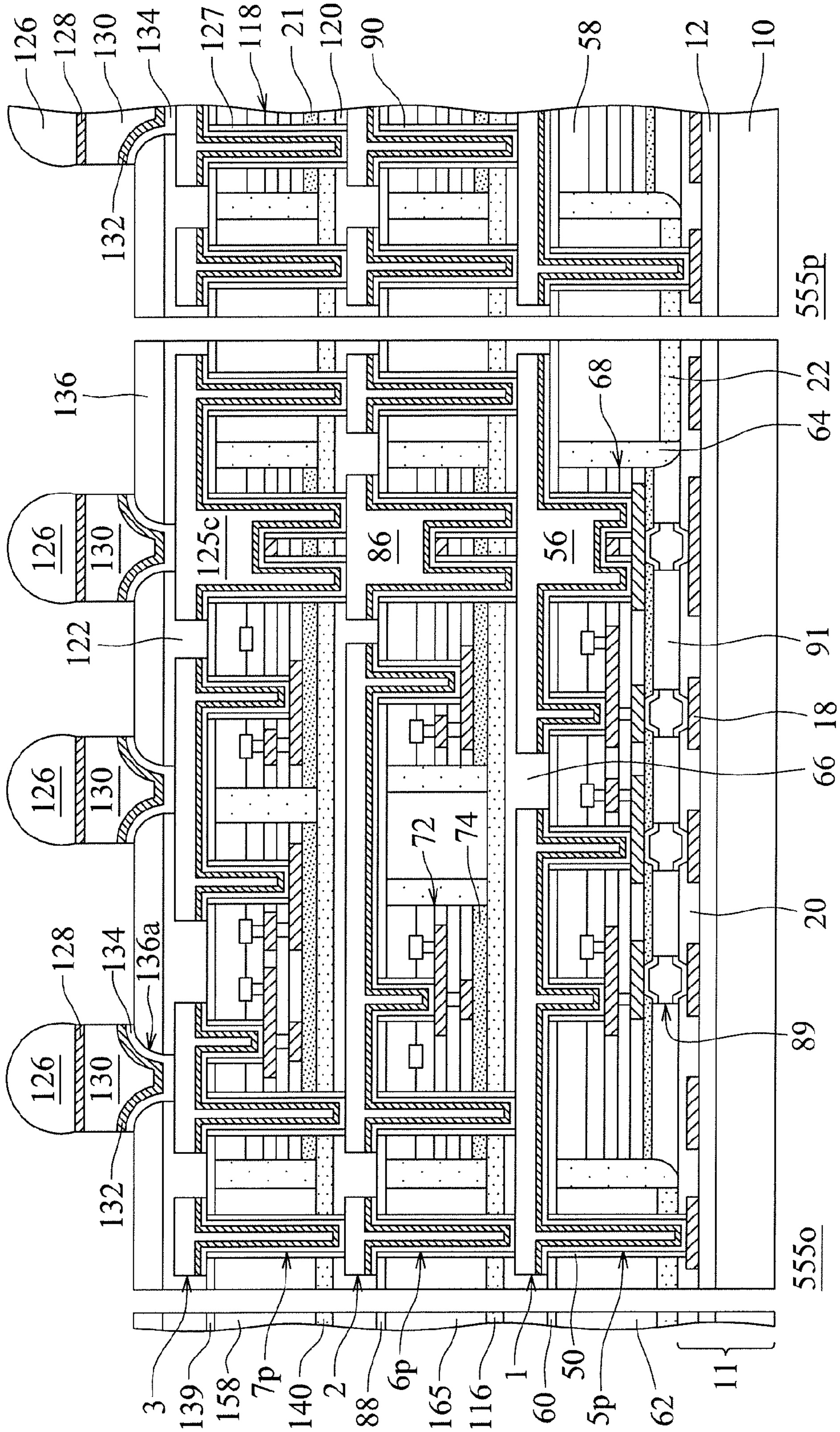

Referring to FIG. 136, after forming the structure illustrated in FIG. 135, the steps as illustrated in FIGS. 92-103 can be subsequently performed to form multiple system-in packages or multichip modules, such as system-in packages or multichip modules 555*o* and 555*p*.

In some cases, the system-in package or multichip module 555*o* may further include multiple metal plugs or vias in the carrier 11, multiple metal traces under the carrier 11, and multiple passive components under the carrier 11. The detailed description about the metal plugs or vias in the carrier 11 and about the metal traces under the carrier 11 can be referred to as those illustrated in FIG. 103. The passive components, such as capacitors, inductors, or resistors, can be boned with the metal traces using solders. One of the passive components can be connected to one of the metal plugs 5*p*, such as the metal plug 5*a*, 5*c*, 5*d*, 5*f*, or 5*g*, through, in sequence, one of the solders, one of the metal traces at a bottom side of the substrate 10, one of the metal plugs or vias in the substrate 10, and a metal interconnect of the conductive layer 18 at the top side of the substrate 10. The solders may include bismuth, indium, tin, a tin-lead alloy, a tin-silver alloy, a tin-silver-copper alloy, a tin-gold alloy, or a tin-copper alloy.

Figure 137:
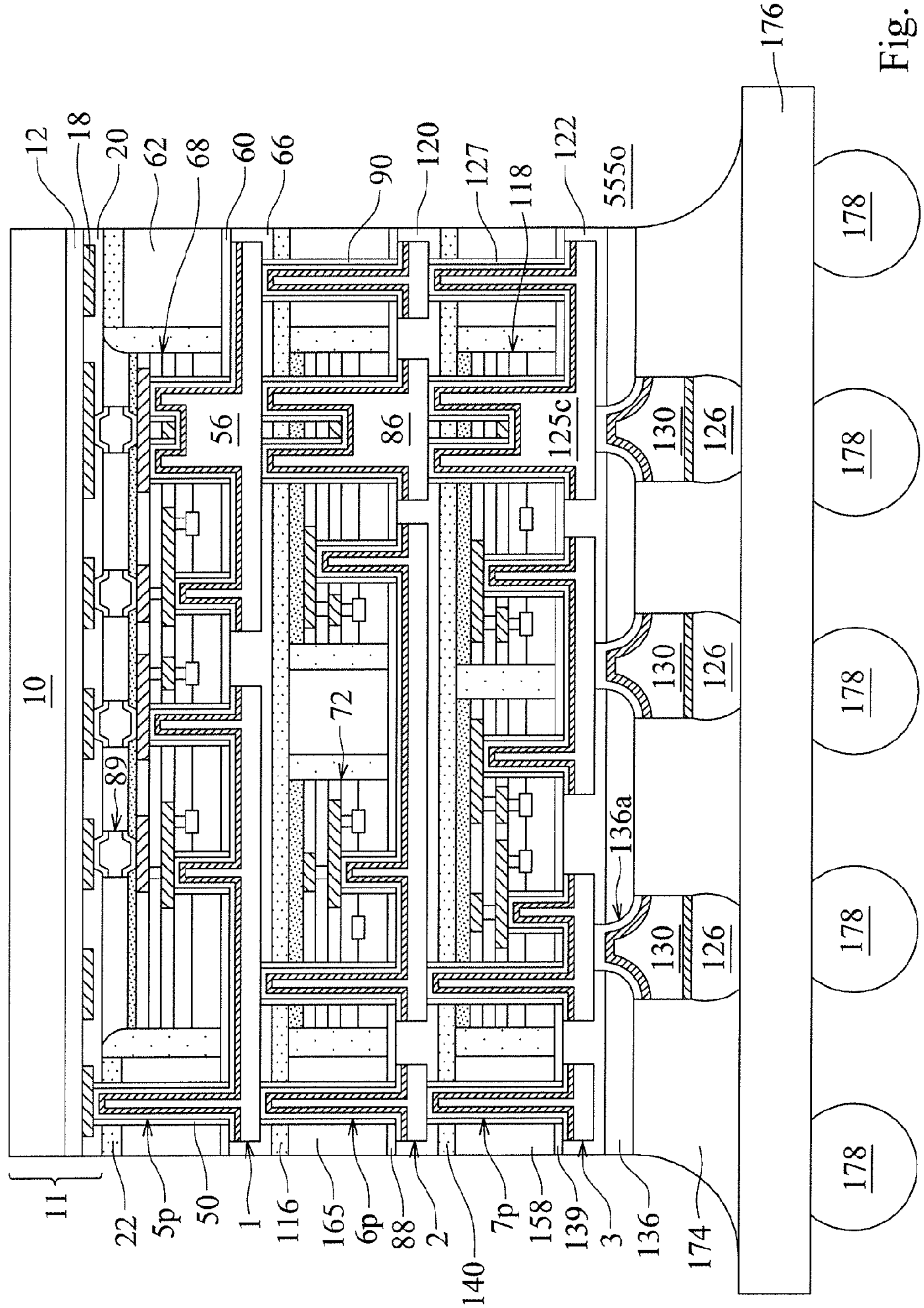
FIG. 137 shows a cross-sectional view of a multichip package according to an embodiment of the present disclosure.

The system-in package or multichip module 555*o* can be connected to and bonded with a carrier, such as mother board, printed circuit board (PCB), ball-grid-array (BGA) substrate, metal substrate, glass substrate, or ceramic substrate, using the solder bumps or balls 126. For example, referring to FIG. 137, the system-in package or multichip module 555*o* is bonded with the top side of the carrier 176 illustrated in FIG. 83 using, e.g., a flip chip technology of joining the solder bumps or balls 126 with a solder or gold layer preformed on the top side of the carrier 176. Next, the under fill 174 illustrated in FIG. 83 is formed between the polymer layer 136 of the system-in package or multichip module 555*o* and the top side of the carrier 176 and encloses the solder bumps or balls 126. Next, the solder balls 178 illustrated in FIG. 83 is formed on the bottom side of the carrier 176.

Figure 138:
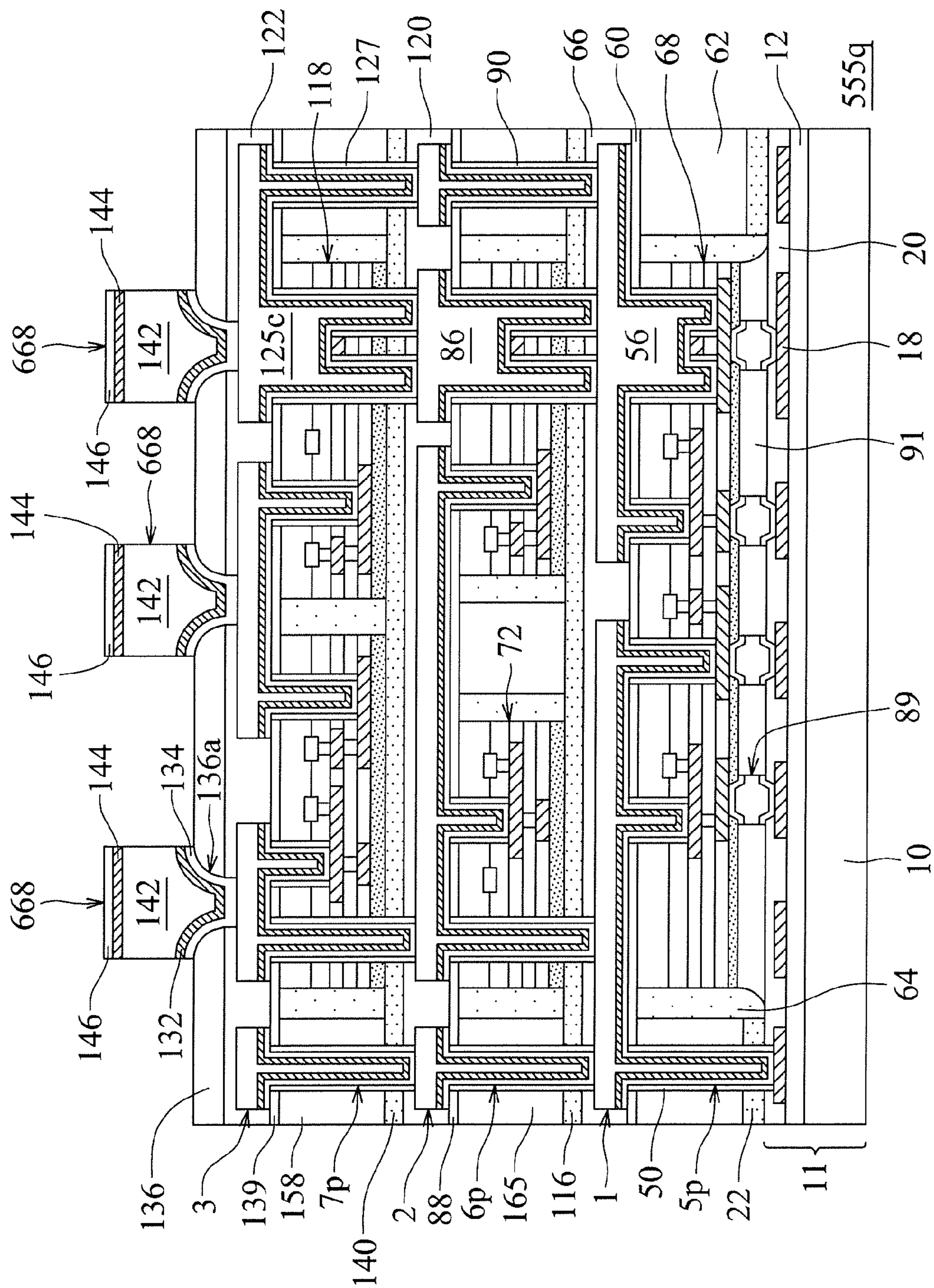
FIG. 138 shows a cross-sectional view of a system-in package or multichip module according to an embodiment of the present disclosure.

FIG. 138 shows another system-in package or multichip module according to another embodiment of the present disclosure, which can be formed by the following steps. After forming the structure illustrated in FIG. 135, the steps as illustrated in FIGS. 92-102 can be subsequently performed, and then the steps illustrated in FIGS. 78 and 79 can be subsequently performed. Next, forming metal bumps 668 on the polymer layer 136 and on the contact points, at the bottoms of the openings in the insulating or dielectric layer 122 and under the openings 136*a* in the polymer layer 136, of the conduction layer 125*c* of the metal interconnects 3 can be referred to as the steps illustrated in FIG. 84. Next, a singulation process is performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in package or multichip module 555*q*. In the system-in package or multichip module 555*q*, each of the interconnects 3 can be connected to one or more of the metal bumps 668.

Figure 139:
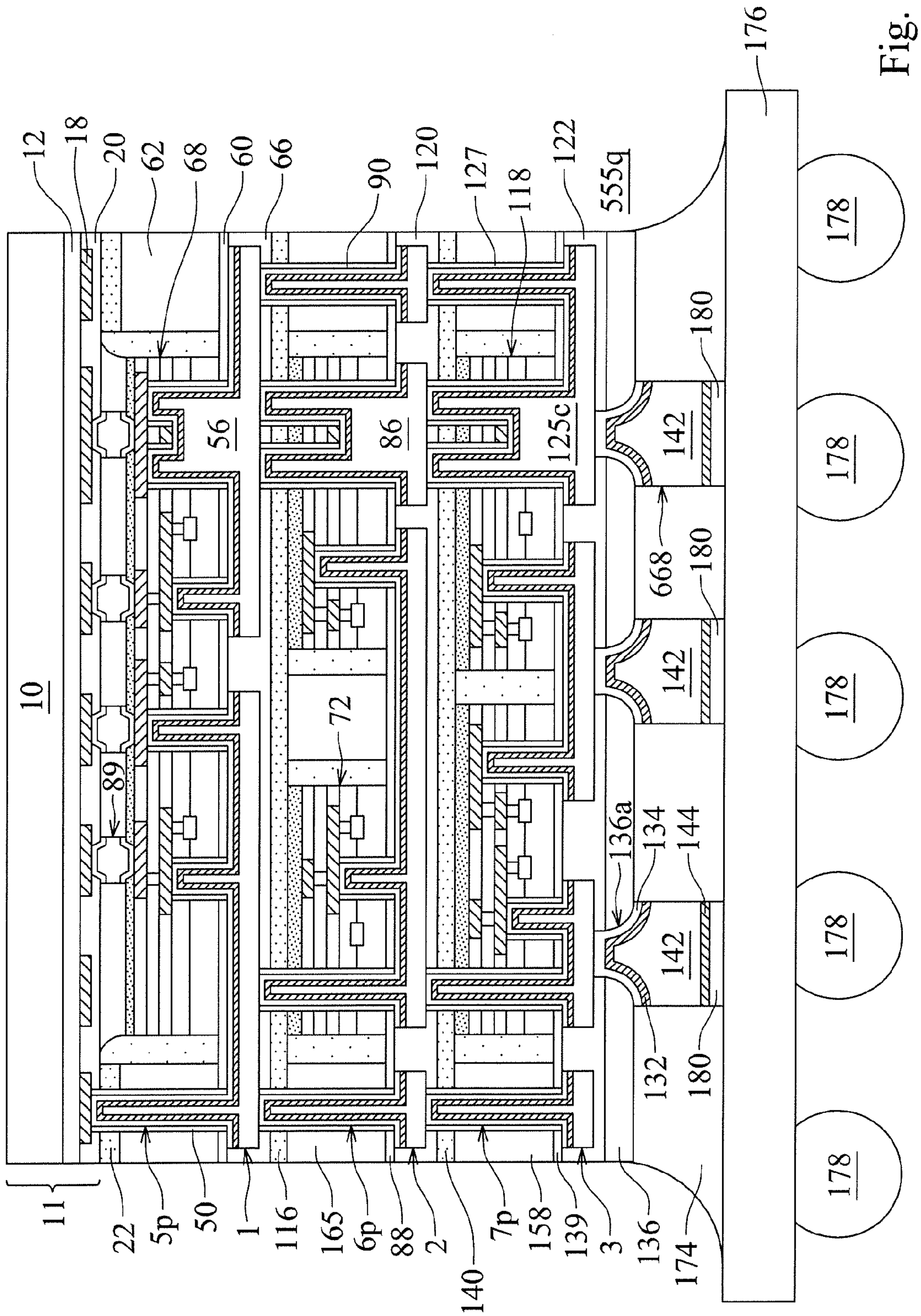
FIG. 139 shows a cross-sectional view of a multichip package according to an embodiment of the present disclosure.

The system-in package or multichip module 555*q* can be connected to and bonded with a carrier, such as mother board, printed circuit board (PCB), ball-grid-array (BGA) substrate, metal substrate, glass substrate, or ceramic substrate, using the metal bumps 668. For example, referring to FIG. 139, the system-in package or multichip module 555*q* is bonded with the top side of the carrier 176 illustrated in FIG. 83 using, e.g., a flip chip technology of joining the solder wetting layer 146 of the metal bumps 668 with a solder or gold layer preformed on the top side of the carrier 176. After joining the solder wetting layer 146 with the solder or gold layer preformed on the top side of the carrier 176, multiple metal joints 180 are formed between the barrier layer 144 of the metal bumps 668 and the top side of the carrier 176. The metal joints 180 can be a layer of a Sn—Ag alloy, a Sn—Ag—Cu alloy, a Sn—Au alloy, or a Sn—Pb alloy having a thickness between 5 and 50 micrometers. Alternatively, the metal joints 180 can be a gold layer having a thickness between 0.1 and 10 micrometers. Next, the under fill 174 illustrated in FIG. 83 is formed between the polymer layer 136 of the system-in package or multichip module 555*q* and the top side of the carrier 176 and encloses the metal bumps 668 and the metal joints 180. Next, the solder balls 178 illustrated in FIG. 83 is formed on the bottom side of the carrier 176.

Alternatively, the insulating or dielectric layer 122 as shown FIGS. 136-139 can be omitted. In this case, the polymer layer 136 is formed on the conduction layer 125*c* of the metal interconnects 3, on the etched surface of the dielectric layer 139, and in the gaps between the metal interconnects 3, and the contact points of the conduction layer 125*c* of the metal interconnects 3 are exposed by and at ends of the openings 136*a* in the polymer layer 136. Further, the adhesion/barrier layer 134 is formed on the contact points, exposed by and at the ends of the openings 136*a* in the polymer layer 136, of the conduction layer 125*c* of the metal interconnects 3.

Figure 140:
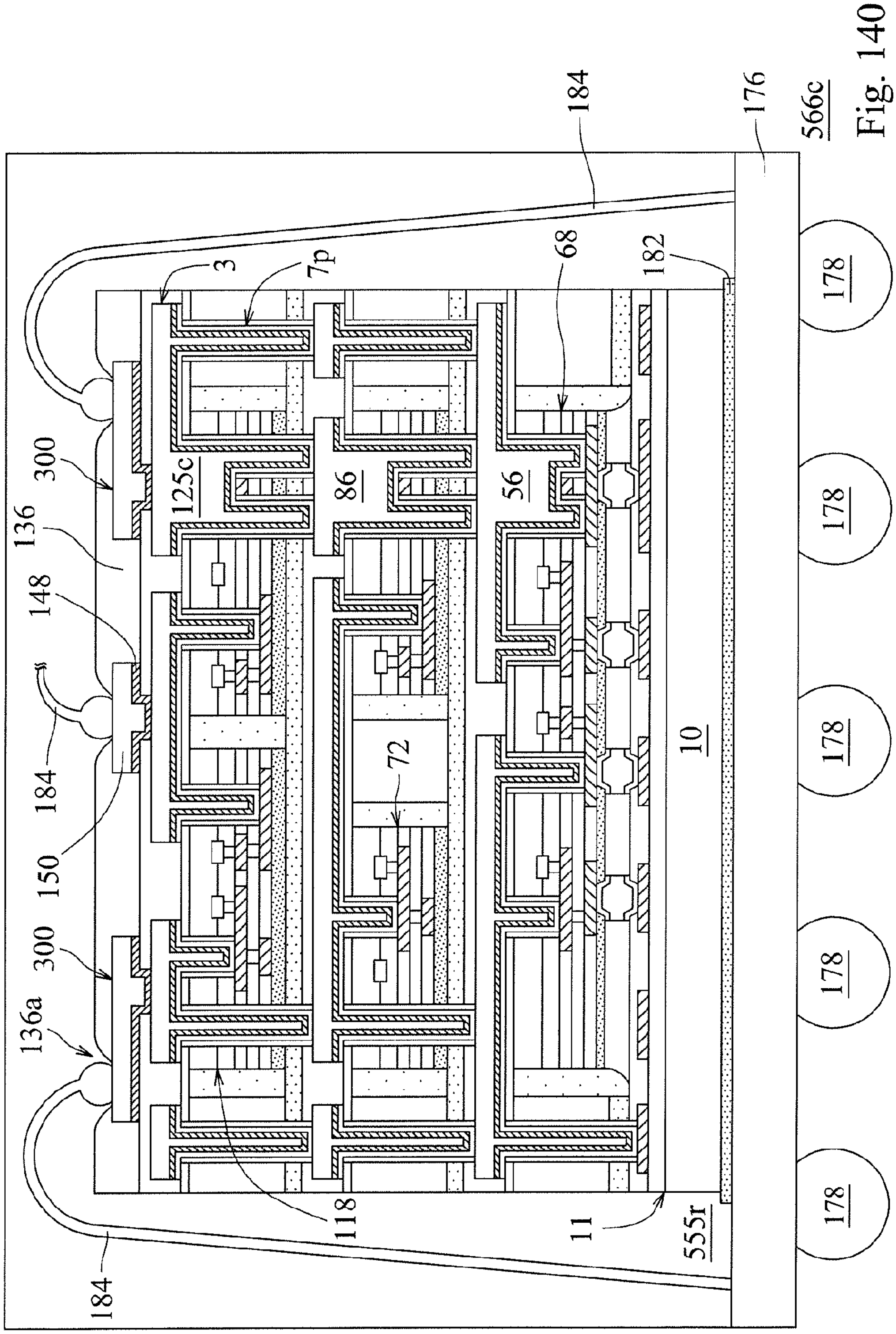
FIG. 140 shows a cross-sectional view of a multichip package according to an embodiment of the present disclosure.

FIG. 140 shows a multichip package 566*c* including a system-in package or multichip module 555*r* connected to the carrier 176 illustrated in FIG. 83 through wirebonded wires 184, which can be formed by, e.g., the following steps. After forming the structure shown in FIG. 135, the steps as illustrated in FIGS. 92-101 can be subsequently performed. Next, forming an insulating or dielectric layer 122 on the conduction layer 125*c* of the metal interconnects 3, on the etched surface of the dielectric layer 139, and in gaps between the metal interconnects 3, forming multiple metal interconnects or traces 300 on the insulating or dielectric layer 122 and on multiple regions, exposed by multiple openings 122*a* in the layer 122, of the conduction layer 125*c* of the metal interconnects 3, and forming a polymer layer 136 on the insulating or dielectric layer 122 and on the metal interconnects or traces 300 can be referred to as the steps illustrated in FIG. 107. The polymer layer 136 after being cured may have a thickness, e.g., between 1 and 20 micrometers, and preferably between 2 and 15 micrometers or between 5 and 10 micrometers, and multiple openings 136*a* in the polymer layer 136 expose multiple contact points of the metal interconnects or traces 300. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as the system-in package or multichip module 555*r*.

Next, a plurality of the system-in package or multichip module 555*r* can be joined with the carrier 176 shown in FIG. 83 by, e.g., forming a glue layer 182 with a thickness between 20 and 150 micrometers on the top side of the carrier 176, and then attaching the plurality of the system-in package or multichip module 555*r* to the top side of the carrier 11 using the glue layer 182. The glue layer 182 can be a polymer layer, such as a layer of polyimide, benzocyclobutene (BCB), epoxy, polybenzoxazole (PBO), poly-phenylene oxide (PPO), silosane, or SU-8, with a thickness, e.g., between 20 and 150 micrometers. Next, multiple wires 184, such as gold wires, copper wires, or aluminum wires, can be wirebonded onto the top side of the carrier 176 and onto the contact points, exposed by the openings 136*a* in the polymer layer 136, of the conduction layer 150 of the metal interconnects or traces 300 by a wirebonding process. Accordingly, the metal interconnects or traces 300 of the plurality of the system-in package or multichip module 555*r* can be physically and electrically connected to the carrier 176 through the wirebonded wires 184. Next, a molding compound 186 can be formed on the plurality of the system-in package or multichip module 555*r*, on the top side of the carrier 176 and on the wirebonded wires 184, encapsulating the wirebonded wires 184 and the plurality of the system-in package or multichip module 555*r*, by a molding process. The molding compound 186 may include epoxy, carbon filler or glass filler, and the glass filler or carbon filler can be distributed in the epoxy. Next, the solder balls 178 illustrated in FIG. 83 can be formed on the bottom side of the carrier 176. Thereafter, a singulation process can be performed to cut the carrier 176 and the molding compound 186 and to singularize a plurality of the multichip package 566*c*.

The multichip package 566*c* can be connected to a carrier, such as mother board, ball-grid-array (BGA) substrate, printed circuit board, metal substrate, glass substrate, or ceramic substrate, through the solder balls 178.

Figure 141A:
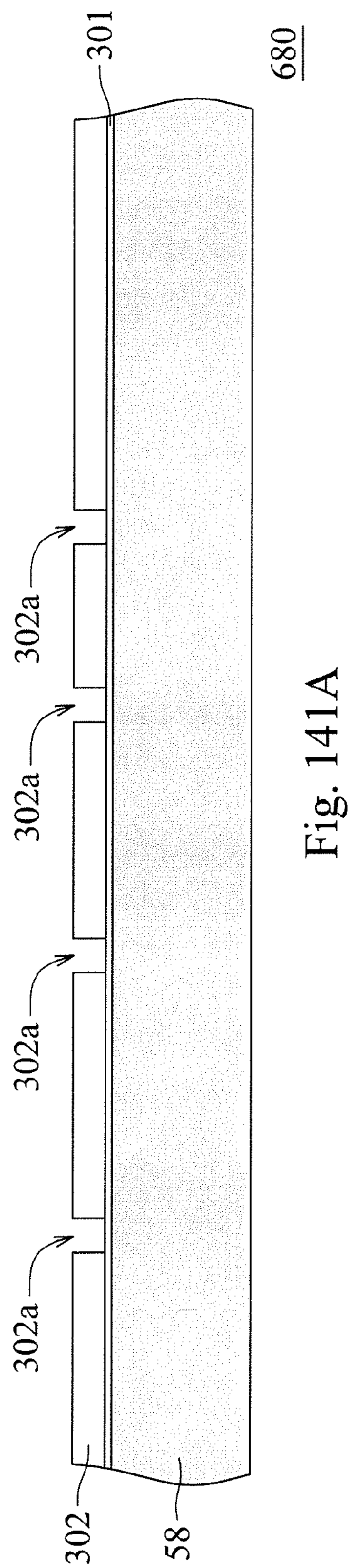
FIGS. 141A-141J show a process for forming chips according to an embodiment of the present disclosure.
Figure 141B:
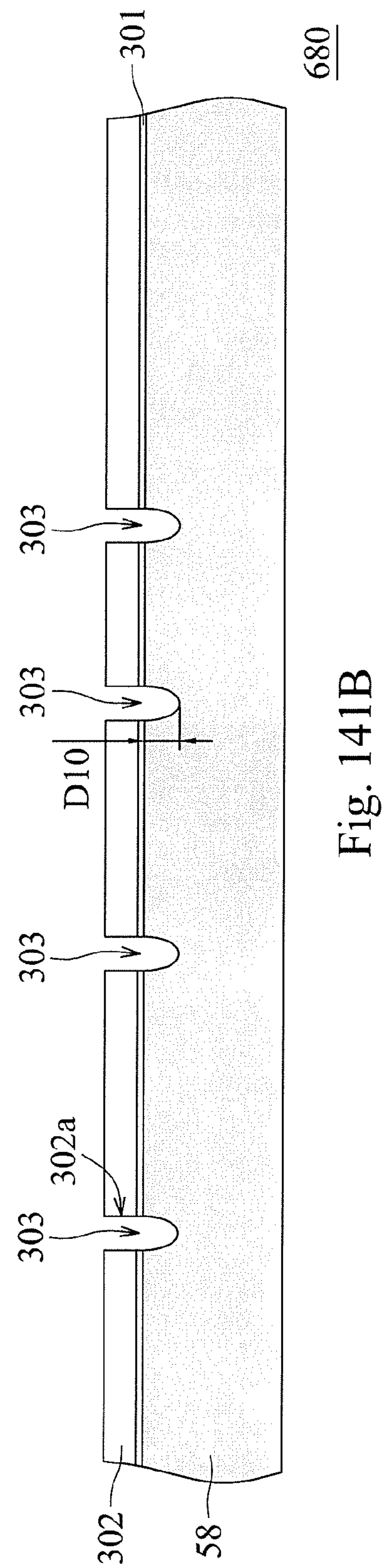
Figure 141C:
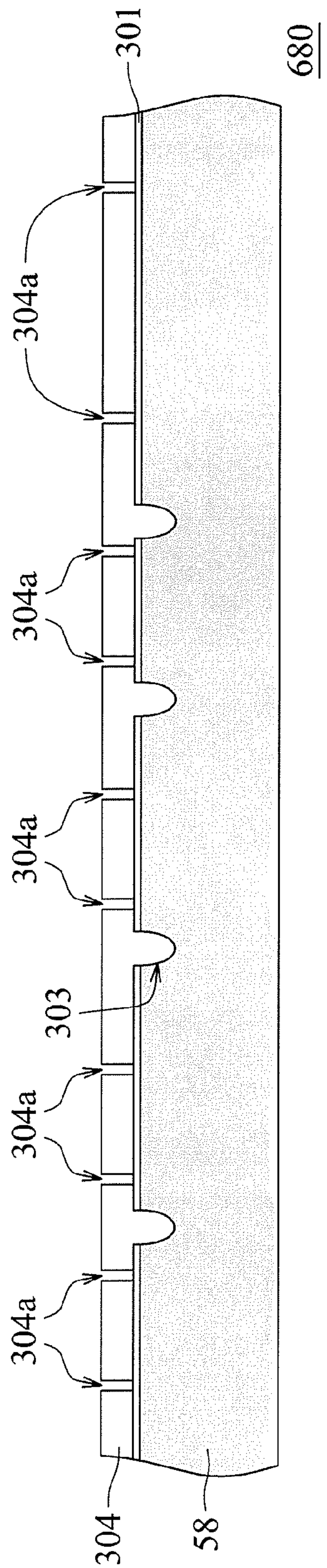
Figure 141D:
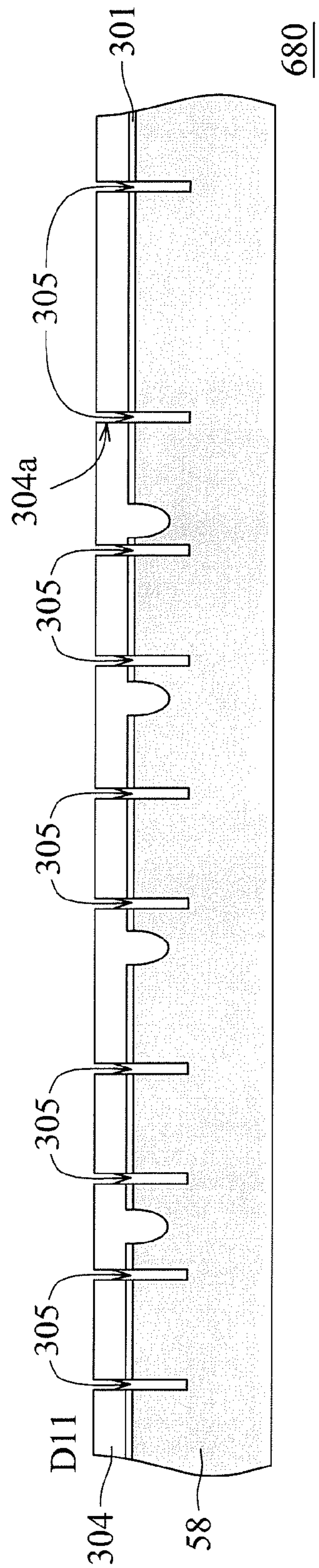
Figure 141E:
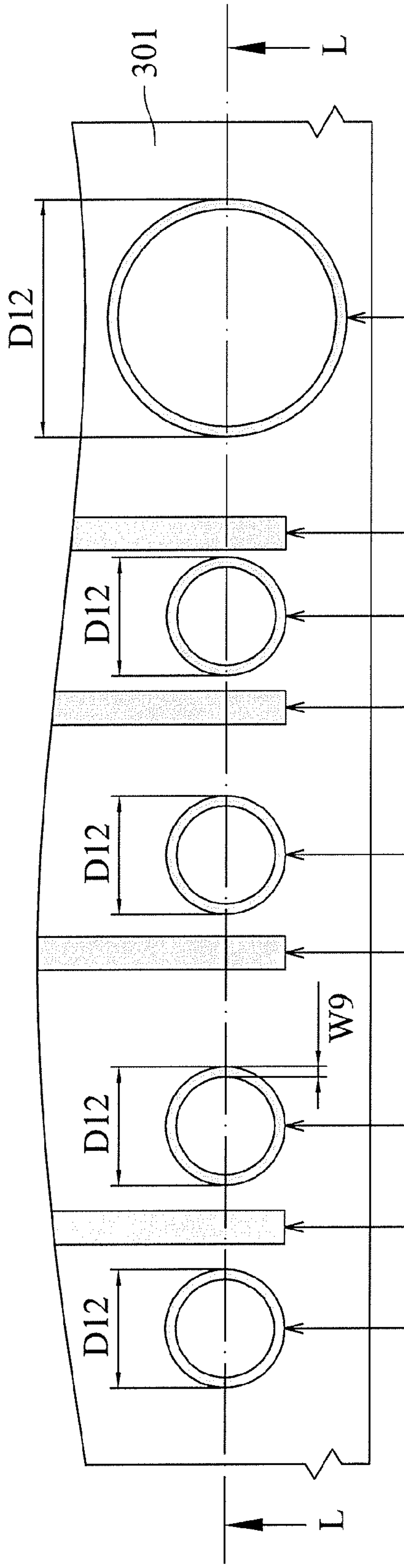
Figure 141F:
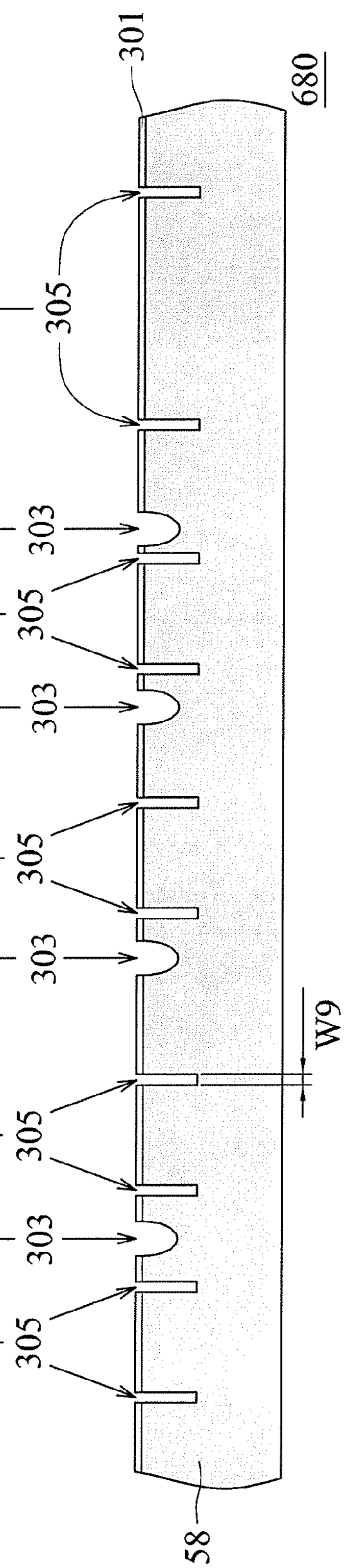
Figure 141G:
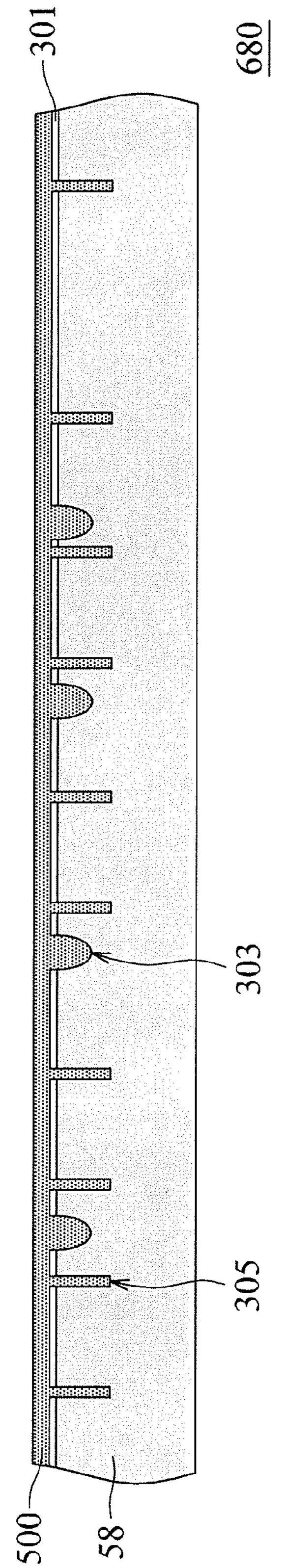
Figure 141H:
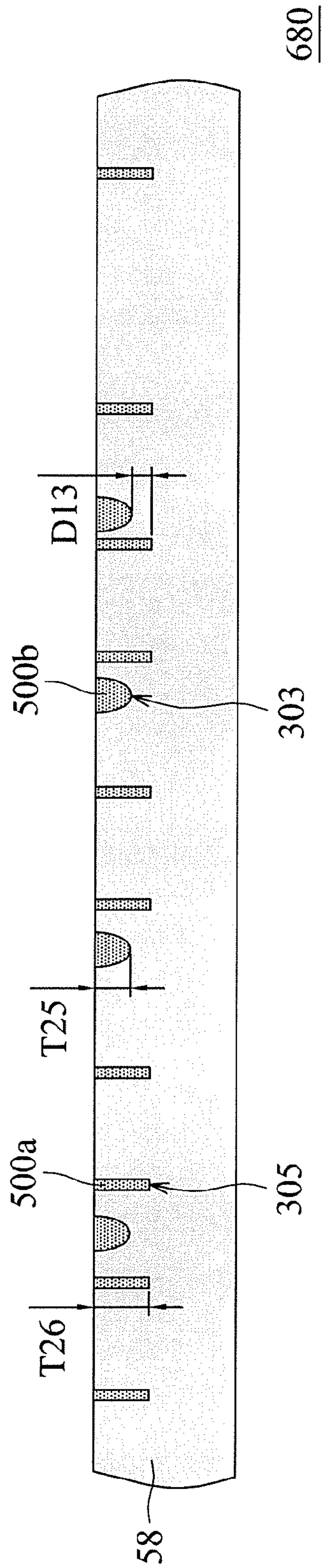
Figure 141I:
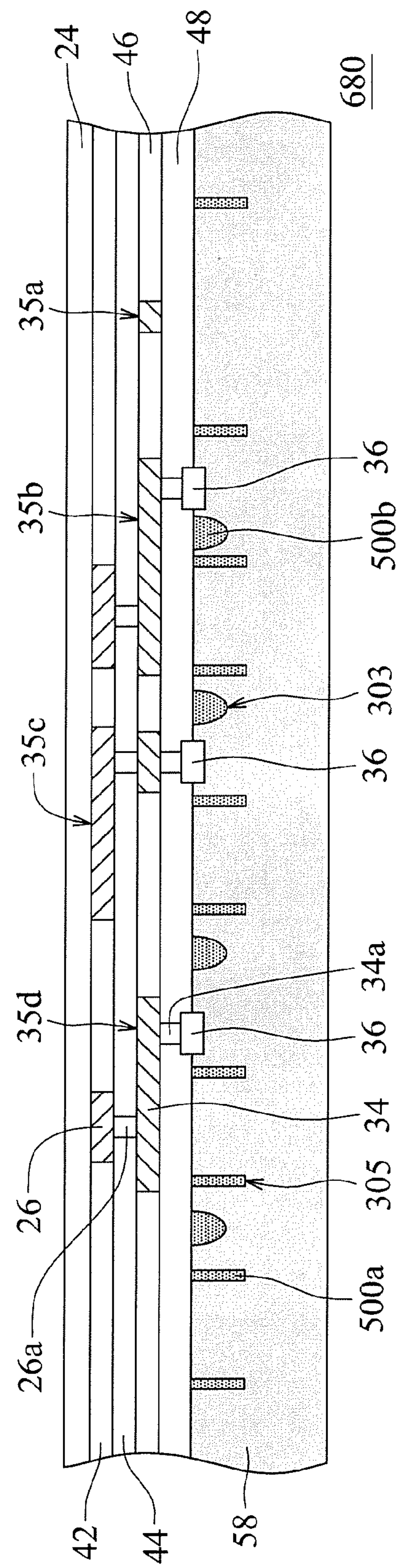
Figure 141J:
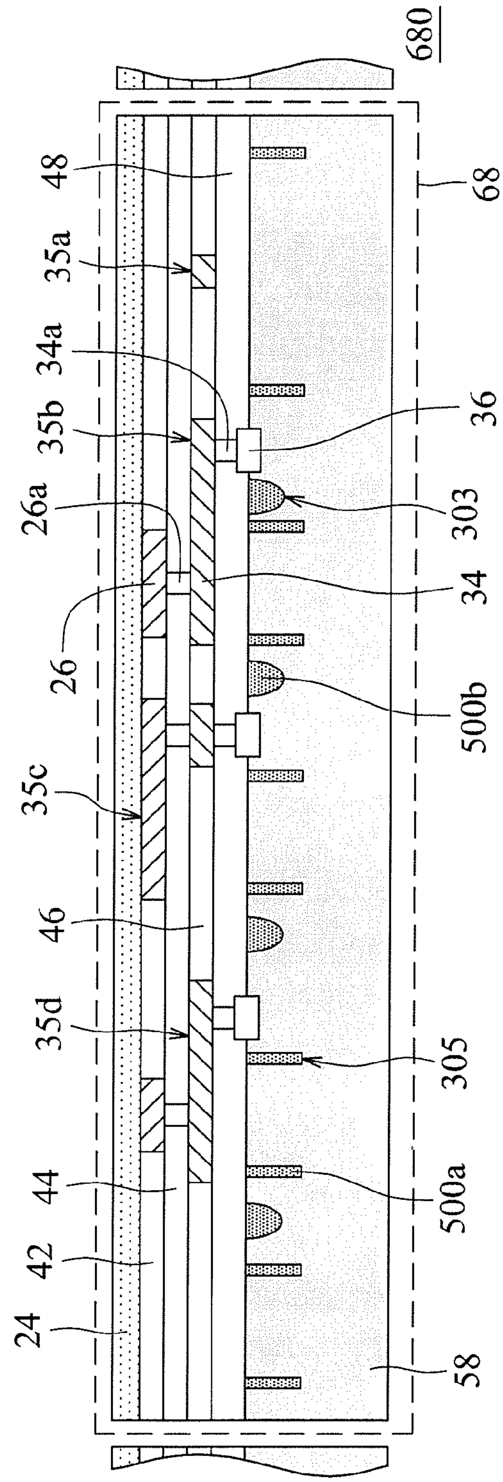

Alternatively, the chips 68 illustrated in FIGS. 7-109 can be replaced with another type of chips 68 shown in FIG. 141J that further include insulating rings 500*a* thicker than shallow trench isolation (STI) 500*b*. FIGS. 141A-141J show a process for forming the another type of chips 68 according to an embodiment of the present disclosure. Referring to FIG. 141A, an insulating layer 301 having a thickness, e.g., between 10 and 250 nanometers can be formed on a semiconductor substrate 58 of a wafer 680. The semiconductor substrate 58 can be a silicon-germanium (SiGe) substrate, a gallium-arsenide (GaAs) substrate, or a silicon substrate with a thickness, e.g., greater than 100 micrometers, such as between 100 and 500 micrometers, and preferably between 150 and 250 micrometers or between 100 and 300 micrometers. The insulating layer 301, for example, can be composed of a pad oxide having a thickness between 1 and 20 nanometers on a top surface of the semiconductor substrate 58, and a silicon-nitride layer having a thickness between 10 and 200 nanometers on the pad oxide. After forming the insulating layer 301 on the top surface of the semiconductor substrate 58, a patterned photoresist layer 302 can be formed on the silicon-nitride layer of the insulating layer 301. Multiple openings 302*a* in the patterned photoresist layer 302 expose multiple regions of the silicon-nitride layer of the insulating layer 301.

Next, referring to FIG. 141B, multiple shallow trenches 303 can be formed in the semiconductor substrate 58 by removing the insulating layer 301 under the openings 302*a* and etching the semiconductor substrate 58 under the openings 302*a*, leading the shallow trenches 303 with a depth D10 in the semiconductor substrate 58, e.g., between 0.1 and 0.5 micrometers, and preferably between 0.15 and 0.4 micrometers.

Next, referring to FIG. 141C, the patterned photoresist layer 302 is removed using a chemical solution, and then a patterned photoresist layer 304 can be formed on the silicon-nitride layer of the insulating layer 301. Multiple ring-shaped openings 304*a* in the patterned photoresist layer 304 expose multiple ring-shaped regions of the silicon-nitride layer of the insulating layer 301.

Next, referring to FIG. 141D, multiple ring-shaped trenches 305 are formed in the semiconductor substrate 58 by removing the insulating layer 301 under the ring-shaped openings 304*a* and etching the semiconductor substrate 58 under the ring-shaped openings 304*a*, leading the ring-shaped trenches 305 with a depth D11 in the semiconductor substrate 58, e.g., between 1 and 100 micrometers, between 1 and 50 micrometers, between 1 and 30 micrometers, between 1 and 10 micrometers, or between 1 and 5 micrometers, and preferably between 2 and 20 micrometers. The ring-shaped trenches 305 can be like circular rings, oval rings, square rings, rectangle-shaped rings, or polygon-shaped rings.

Next, referring to FIGS. 141E and 141F, the patterned photoresist layer 304 is removed using a chemical solution. FIG. 141E shows a schematic top view of the trenches 303 and 305 as shown in FIG. 141F, and FIG. 141F can be a cross-sectional view cut along the line L-L shown in FIG. 141E. The shallow trenches 303 formed in the semiconductor substrate 58 are used to accommodate a shallow trench isolation (STI). The ring-shaped trenches 305 formed in the semiconductor substrate 58 are used to accommodate insulating rings. Each of the ring-shaped trenches 305 may have a transverse width W9 between an outer point on the outer periphery and an inner point, closest to the outer point, on the inner periphery, and the transverse width W9 can be between 0.1 and 20 micrometers, between 0.1 and 10 micrometers, between 0.1 and 5 micrometers, between 0.1 and 2 micrometers, or between 0.1 and 1 micrometers. A horizontal distance D12 between two opposite points on the outer periphery of each of the ring-shaped trenches 305 can be between 2 and 100 micrometers, between 2 and 50 micrometers, between 2 and 20 micrometers, between 2 and 10 micrometers, or between 2 and 5 micrometers. If the outer periphery is circle-shaped, the horizontal distance D12 is the diameter (width) of the circle-shaped outer periphery. Alternatively, if the outer periphery is oval-shaped, the horizontal distance D12 is the longest diameter (width) of the oval-shaped outer periphery.

Next, referring to FIG. 141G, an inorganic material 500, insulating material, can be formed on the silicon-nitride layer of the insulating layer 301 and in the trenches 303 and 305 by using a suitable process, such as chemical vapor deposition (CVD) process. The inorganic material 500 may include or can be silicon oxide or silicon nitride.

Next, referring to FIG. 141H, the inorganic material 500 outside the trenches 303 and 305 can be removed by a suitable process, such as chemical mechanical polishing (CMP) process, and all of the insulating layer 301 can be further etched away by using a chemical solution. Accordingly, the inorganic material 500 remains in the ring-shaped trenches 305, so called as insulating rings 500*a*, enclosing walls, and remains in the shallow trenches 303, so called as shallow trench isolation (STI) 500*b*. Each of the insulating rings 500*a* may include or can be silicon oxide or silicon nitride and may have a thickness T26, e.g., between 1 and 100 micrometers, between 1 and 50 micrometers, between 1 and 30 micrometers, between 1 and 10 micrometers, or between 1 and 5 micrometers, and preferably between 2 and 20 micrometers. The shallow trench isolation (STI) 500*b* may include or can be silicon oxide or silicon nitride and may have a thickness T25, e.g., between 0.1 and 0.5 micrometers, and preferably between 0.15 and 0.4 micrometers. A vertical distance D13 between a bottom of one of the insulating rings 500*a* and a bottom of the shallow trench isolation 500*b* can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Next, referring to FIG. 141I, multiple semiconductor devices 36 can be formed in and/or on the semiconductor substrate 58, and then multiple dielectric layers 42, 44, 46 and 48, multiple via plugs 26*a* and 34*a*, an interconnection layer 34, a patterned metal layer 26 and a passivation layer 24 can be formed over the top surface of the semiconductor substrate 58.

Next, referring to FIG. 141J, a singulation process can be performed to cut the semiconductor substrate 58 and the layers 24, 42, 44, 46 and 48 of the wafer 680 and to singularize multiple chips 68 (one of them is shown). Each of the chips 68 includes the previously described interconnects or metal traces 35*a*, 35*b*, 35*c* and 35*d*. The element of the chips 68 in FIG. 141J indicated by a same reference number as indicates the element of the chips 68 in FIG. 7 has a same material and spec as the element of the chips 68 illustrated in FIG. 7. The chips 68 shown in FIG. 141J are reverse arrangement of the chips 68 shown in FIG. 7.

Figure 141K:
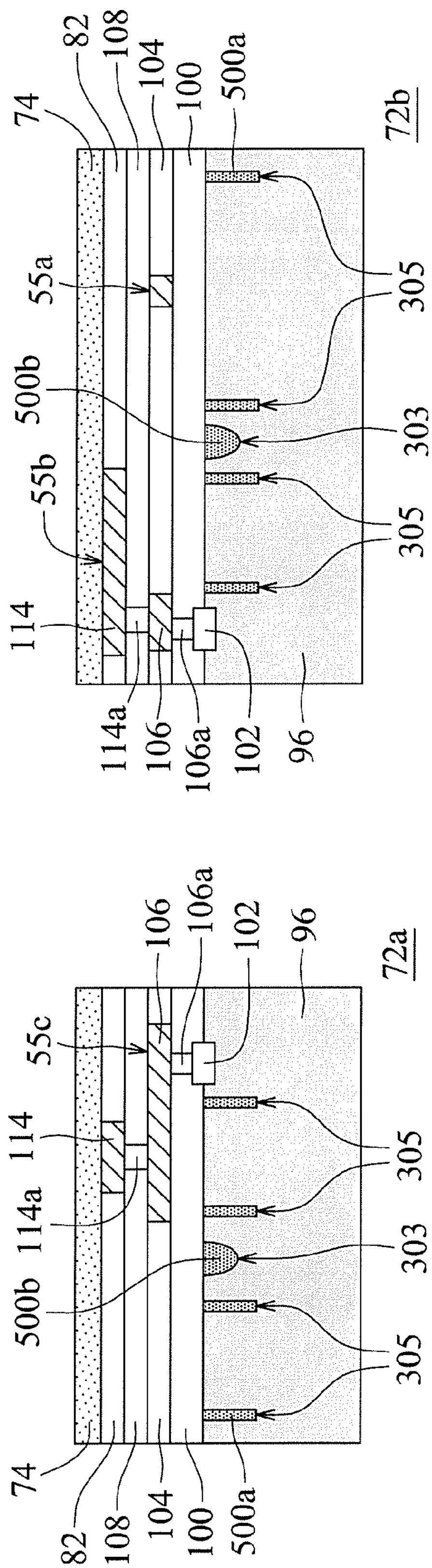
FIG. 141K shows cross-sectional views of chips according to an embodiment of the present disclosure.

Alternatively, each of the chips 72 illustrated in FIGS. 33-109 can be replaced with another type of chip 72*a* or 72*b* shown in FIG. 141K that further includes insulating rings 500*a* thicker than shallow trench isolation (STI) 500*b*. FIG. 141K shows cross-sectional views of chips 72*a* and 72*b* according to an embodiment of the present disclosure. The element of the chips 72*a* and 72*b* in FIG. 141K indicated by a same reference number as indicates the element of the chips 72 in FIG. 33 has a same material and spec as the element of the chips 72 illustrated in FIG. 33. The chips 72*a* and 72*b* shown in FIG. 141K are reverse arrangement of the chips 72 shown in FIG. 33. Referring to FIG. 141K, each of the chips 72*a* and 72*b* is provided with the semiconductor substrate 96, the insulating rings 500*a*, the shallow trench isolation (STI) 500*b*, the semiconductor devices 102, the passivation layer 74, the dielectric layers 82, 108, 104 and 100, the patterned metal layer 114, the interconnection layer 106, and the via plugs 106*a* and 114*a*. The steps of forming the insulating rings 500*a* in the ring-shaped trenches 305 in the semiconductor substrate 96 and forming the shallow trench isolation (STI) 500*b* in the shallow trenches 303 in the semiconductor substrate 96 can be referred to as the steps of forming the insulating rings 500*a* in the ring-shaped trenches 305 in the semiconductor substrate 58 and forming the shallow trench isolation (STI) 500*b* in the shallow trenches 303 in the semiconductor substrate 58 as illustrated in FIGS. 141A-141H. The specifications of the shallow trenches 303, the ring-shaped trenches 305, the insulating rings 500*a*, and the shallow trench isolation (STI) 500*b* can be referred to as the specifications of the shallow trenches 303, the ring-shaped trenches 305, the insulating rings 500*a*, and the shallow trench isolation (STI) 500*b*, respectively, illustrated in FIGS. 141A-141H.

In one case, the chip 72*a* may have different circuit designs from those of the chip 72*b*. Also, in another case, the chip 72*a* may have same circuit designs as those of the chip 72*b*. Alternatively, the chip 72*a* may have a different area (top surface) or size from that of the chip 72*b*. Also, in another case, the chip 72*a* may have a same area (top surface) or size as that of the chip 72*b*.

Figure 141L:
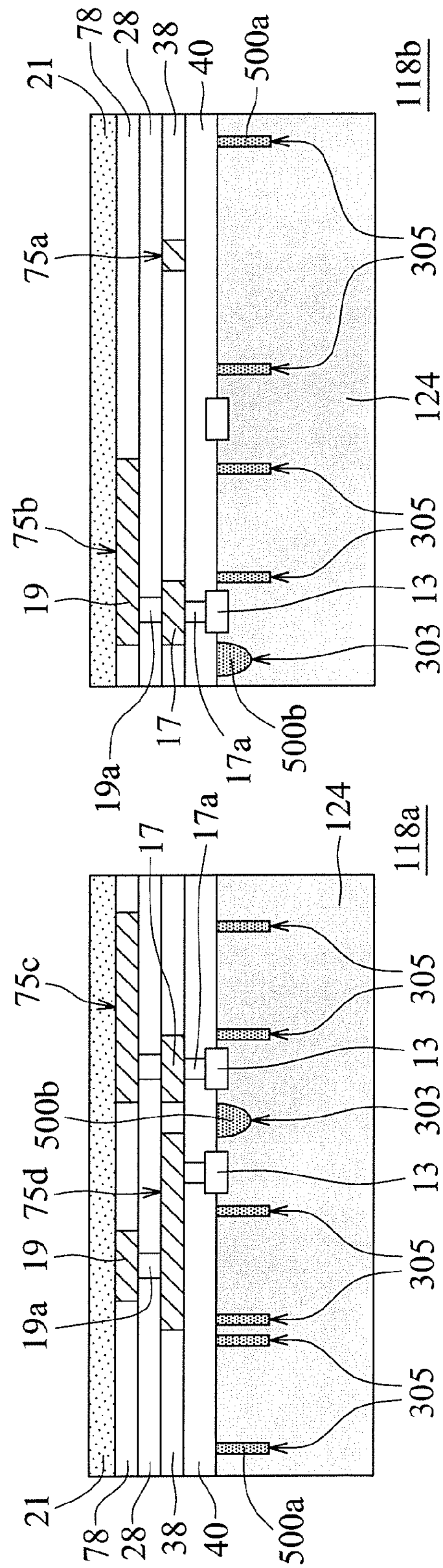
FIG. 141L shows cross-sectional views of chips according to an embodiment of the present disclosure.

Alternatively, each of the chips 118 illustrated in FIGS. 57-109 can be replaced with another type of chip 118*a* or 118*b* shown in FIG. 141L that further includes insulating rings 500*a* thicker than shallow trench isolation (STI) 500*b*. FIG. 141L shows cross-sectional views of chips 118*a* and 118*b* according to an embodiment of the present disclosure. The element of the chips 118*a* and 118*b* in FIG. 141L indicated by a same reference number as indicates the element of the chips 118 in FIG. 57 has a same material and spec as the element of the chips 118 illustrated in FIG. 57. The chips 118*a* and 118*b* shown in FIG. 141L are reverse arrangement of the chips 118 shown in FIG. 57. Referring to FIG. 141L, each of the chips 118*a* and 118*b* is provided with the semiconductor substrate 124, the insulating rings 500*a*, the shallow trench isolation (STI) 500*b*, the semiconductor devices 13, the passivation layer 21, the dielectric layers 78, 28, 38 and 40, the patterned metal layer 19, the interconnection layer 17, and the via plugs 17*a* and 19*a*. The steps of forming the insulating rings 500*a* in the ring-shaped trenches 305 in the semiconductor substrate 124 and forming the shallow trench isolation (STI) 500*b* in the shallow trenches 303 in the semiconductor substrate 124 can be referred to as the steps of forming the insulating rings 500*a* in the ring-shaped trenches 305 in the semiconductor substrate 58 and forming the shallow trench isolation (STI) 500*b* in the shallow trenches 303 in the semiconductor substrate 58 as illustrated in FIGS. 141A-141H. The specifications of the shallow trenches 303, the ring-shaped trenches 305, the insulating rings 500*a*, and the shallow trench isolation (STI) 500*b* can be referred to as the specifications of the shallow trenches 303, the ring-shaped trenches 305, the insulating rings 500*a*, and the shallow trench isolation (STI) 500*b*, respectively, illustrated in FIGS. 141A-141H.

In one case, the chip 118*a* may have different circuit designs from those of the chip 118*b*. Also, in another case, the chip 118*a* may have same circuit designs as those of the chip 118*b*. Alternatively, the chip 118*a* may have a different area (top surface) or size from that of the chip 118*b*. Also, in another case, the chip 118*a* may have a same area (top surface) or size as that of the chip 118*b*.

Figure 142:
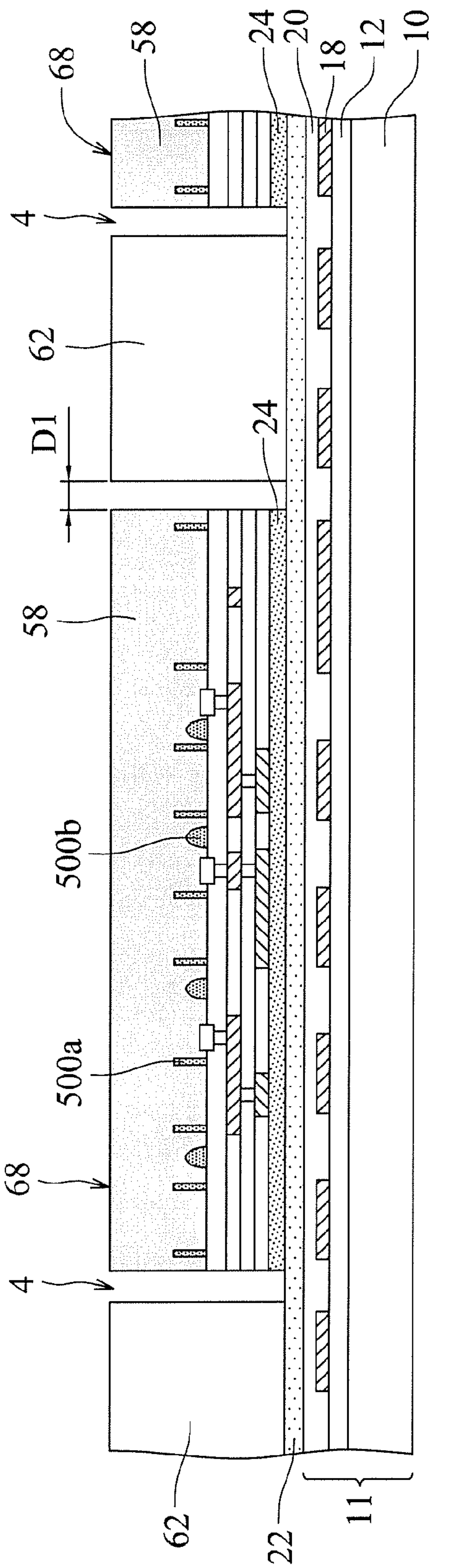
FIGS. 142-181 show a process for forming a system-in package or multichip module according to an embodiment of the present disclosure.

FIGS. 142-181 show a process for forming another system-in package or multichip module according to another embodiment of the present disclosure. Referring to FIG. 142, multiple of the chips 68 illustrated in FIG. 141J and the previously described dummy substrate(s) 62 are joined with the carrier 11 using the layer 22, which can be referred to as the steps illustrated in FIGS. 1-9.

Figure 143:
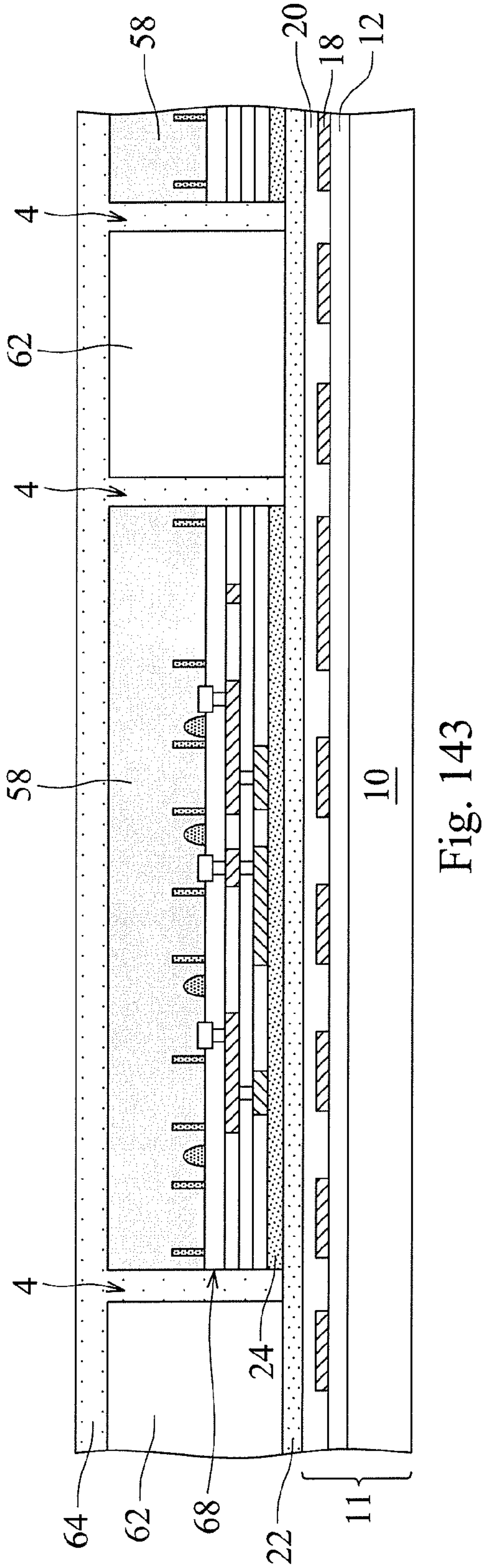

Next, referring to FIG. 143, an encapsulation/gap filling material 64, such as polysilicon, silicon oxide, or a polymer, can be formed on a backside of the semiconductor substrate 58 of each chip 68, on the dummy substrate(s) 62, and in the gaps 4 and 8, which can be referred to as the step illustrated in FIG. 10.

Figure 144:
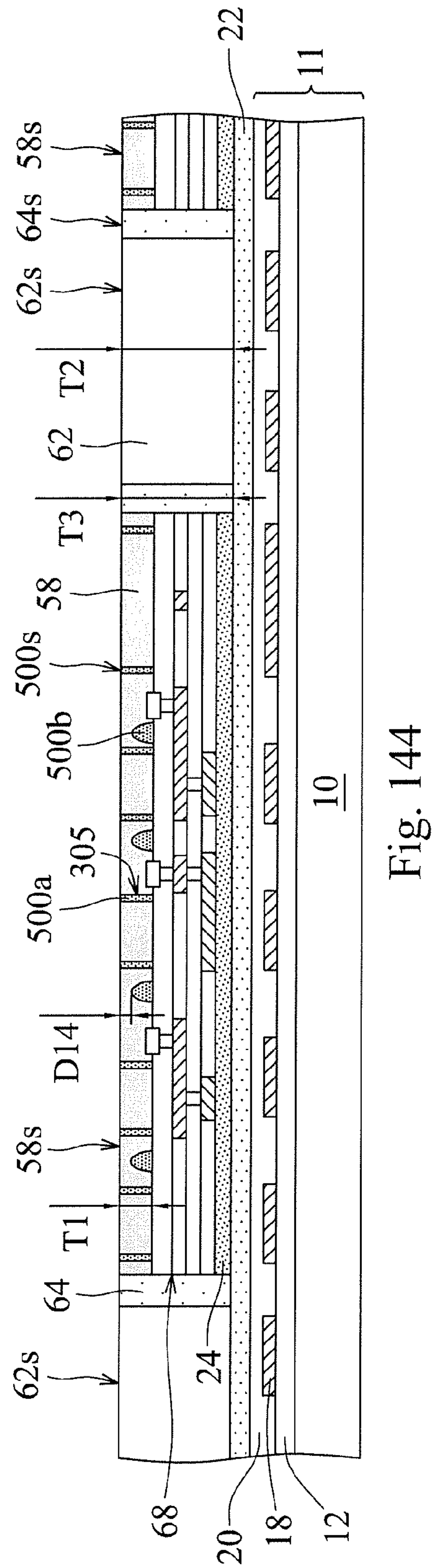

Next, referring to FIG. 144, the encapsulation/gap filling material 64, the backside of the semiconductor substrate 58 of each chip 68, and the dummy substrate(s) 62 are ground or polished by a suitable process, such as chemical-mechanical-polishing (CMP) process, mechanical polishing process, mechanical grinding process, or a process including mechanical polishing and chemical etching, until all of the insulating rings 500*a* in the chips 68 have exposed bottom surfaces 500*s*, over which there are no portions of the semiconductor substrates 58.

Accordingly, the semiconductor substrate 58 of each of the chips 68 can be thinned to a thickness T1, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 68, after the grinding or polishing process, the insulating rings 500*a* and the semiconductor substrate 58 may have the same thickness T1. Preferably, each of the chips 68, after the grinding or polishing process, may have a thickness, e.g., between 3 and 105 micrometers, and preferably between 3 and 30 micrometers or between 5 and 25 micrometers. After the grinding or polishing process, the dummy substrate(s) 62 can be thinned to a thickness T2, e.g., between 3 and 100 micrometers, and preferably between 3 and 30 micrometers or between 5 and 25 micrometers, and the encapsulation/gap filling material 64 remaining in the gaps 4 and 8 may have a vertical thickness T3, e.g., between 3 and 100 micrometers, and preferably between 3 and 30 micrometers or between 5 and 25 micrometers. The ground or polished surface 58*s* of the semiconductor substrate 58, at the backside of each chip 68, and the ground or polished surface(s) 62*s* of the dummy substrate(s) 62 can be substantially flat and not covered by the encapsulation/gap filling material 64. The ground or polished surface(s) 62*s* may be substantially coplanar with the ground or polished surface 58*s* of each chip 68, with the ground or polished surface 64*s* of the encapsulation/gap filling material 64 in the gaps 4 and 8, and with the exposed bottom surfaces 500*s* of the insulating rings 500*a*. In each chip 68, a vertical distance D14 between the ground or polished surface 58*s* of the semiconductor substrate 58 and the bottom of the shallow trench isolation 500*b* can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Figure 145:
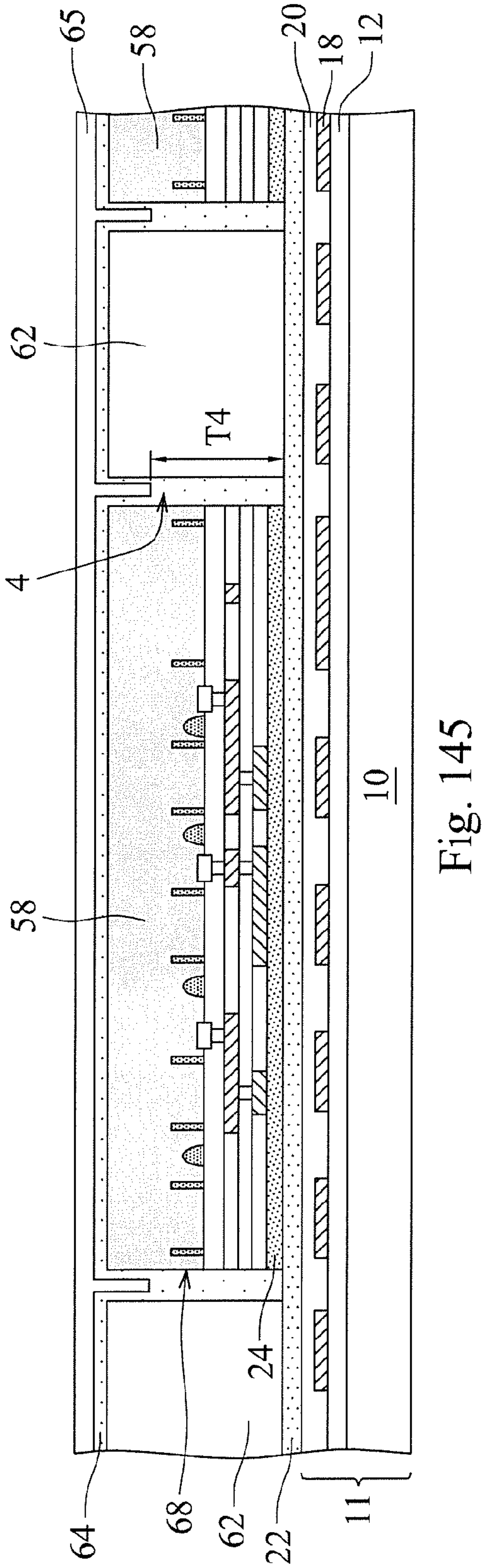
Figure 146:
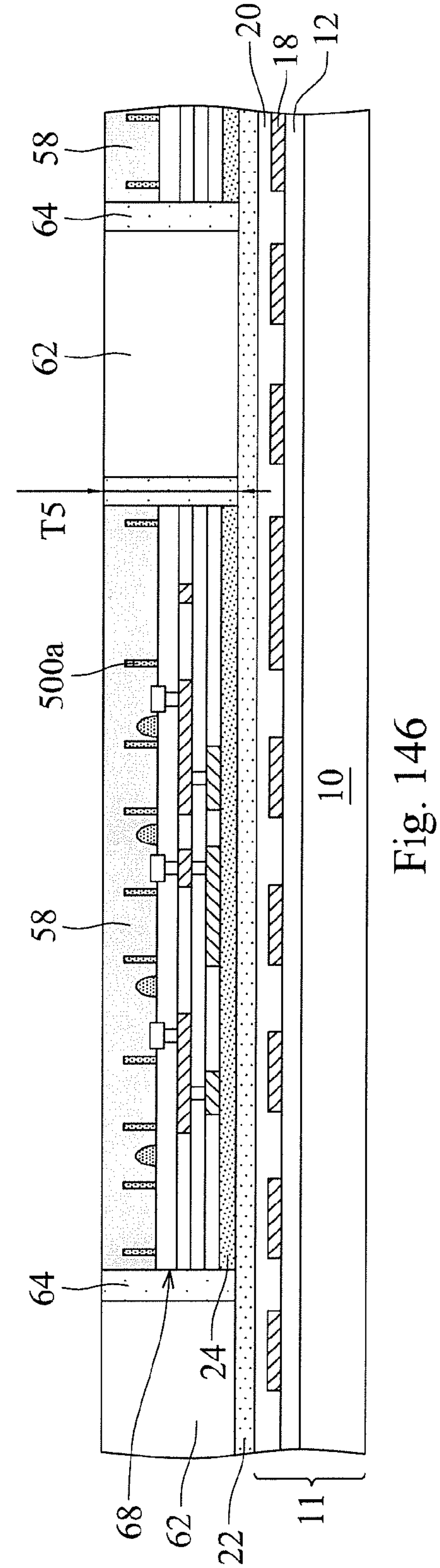

Alternatively, FIGS. 145 and 146 show another technique to form the structure illustrated in FIG. 144. Referring to FIG. 145, after forming the structure illustrated in FIG. 142, an encapsulation/gap filling material 64, such as polysilicon or silicon oxide, can be formed on the backside of the semiconductor substrate 58 of each chip 68, on the dummy substrate(s) 62, and in the gaps 4 and 8, and then a polymer 65, such as polyimide, epoxy, benzocyclobutane (BCB), polybenzoxazole (PBO), poly-phenylene oxide (PPO), or molding compound, can be formed on the encapsulation/gap filling material 64 and in the gaps 4 and 8. The encapsulation/gap filling material 64 in the gaps 4 and 8 may have a vertical thickness T4, e.g., between 10 and 100 micrometers, and preferably between 10 and 50 micrometers or between 20 and 50 micrometers.

Next, referring to FIG. 146, a mechanical grinding process can be performed, e.g., by using an abrasive or grinding pad with water to grind the polymer 65, the encapsulation/gap filling material 64, the backside of the semiconductor substrate 58 of each chip 68, and the dummy substrate(s) 62 until all of the polymer 65 is removed and until a predetermined vertical thickness T5 of the encapsulation/gap filling material 64 in the gaps 4 and 8 is reached. The predetermined vertical thickness T5 can be, e.g., between 10 and 100 micrometers, and preferably between 10 and 50 micrometers or between 20 and 50 micrometers. The abrasive or grinding pad can be provided with rough grit having an average grain size, e.g., between 0.5 and 15 micrometers for performing the mechanical grinding process. In the step, the semiconductor substrate 58 of each chip 68 has portions vertically over the insulating rings 500*a*. Thereafter, a chemical-mechanical-polishing (CMP) process can be performed, e.g., by using a polish pad with a slurry containing chemicals and a fine abrasive like silica with an average grain size, e.g., between 0.02 and 0.05 micrometers to polish the backside of the semiconductor substrate 58 of each chip 68, the dummy substrate(s) 62, and the encapsulation/gap filling material 64 in the gaps 4 and 8 until all of the insulating rings 500*a* in the chips 68 have the exposed bottom surfaces 500*s*, over which there are no portions of the semiconductor substrates 58, as shown in FIG. 144. Accordingly, after the grinding or polishing process, the semiconductor substrate 58 of each of the chips 68 can be thinned to the thickness T1 between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 68, after the grinding or polishing process, the insulating rings 500*a* and the semiconductor substrate 58 may have the same thickness T1.

After the chemical-mechanical-polishing (CMP) process, the polished surface 58*s* of the semiconductor substrate 58, at the backside of each chip 68, and the polished surface(s) 62*s* of the dummy substrate(s) 62 can be substantially flat and not covered by the encapsulation/gap filling material 64. The polished surface(s) 62*s* may be substantially coplanar with the polished surface 58*s* of each chip 68, with the polished surface 64*s* of the encapsulation/gap filling material 64 in the gaps 4 and 8, and with the exposed bottom surfaces 500*s* of the insulating rings 500*a*. The polished surfaces 58*s*, 62*s* and 64*s* may have a micro-roughness, e.g., less than 20 nanometers. The chemical-mechanical-polishing (CMP) process, using a very fine abrasive like silica and a relatively weak chemical attack, will create the surfaces 58*s*, 62*s* and 64*s* almost without deformation and scratches, and this means that the chemical-mechanical-polishing (CMP) process is very well suited for the final polishing step, creating the clean surfaces 58*s*, 62*s* and 64*s*. Using the mechanical grinding process and the chemical-mechanical-polishing (CMP) process can be performed to create a very thin semiconductor substrate 10 of each chip 68. Accordingly, after the chemical-mechanical-polishing (CMP) process, each of the chips 68 can be thinned to a thickness, e.g., between 3 and 35 micrometers, and preferably between 5 and 10 micrometers or between 5 and 25 micrometers, the dummy substrate(s) 62 can be thinned to the thickness T2, e.g., between 3 and 35 micrometers, and preferably between 5 and 10 micrometers or between 5 and 25 micrometers, and the encapsulation/gap filling material 64 in the gaps 4 and 8 can be thinned to the thickness T3, e.g., between 3 and 35 micrometers, and preferably between 5 and 10 micrometers or between 5 and 25 micrometers.

Figure 147:
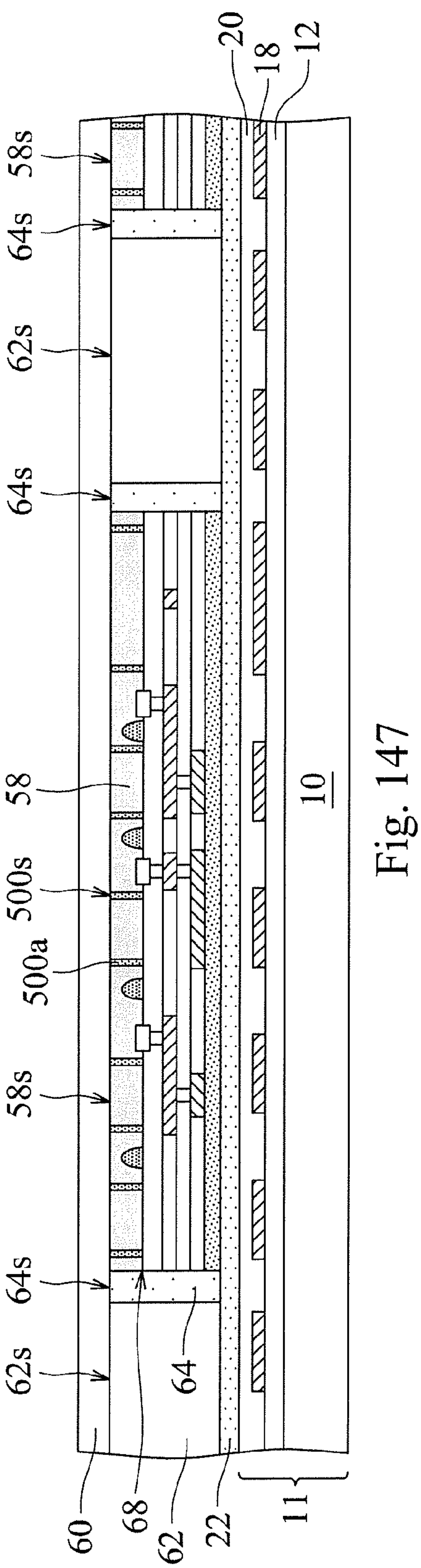

Referring to FIG. 147, after forming the structure illustrated in FIG. 144, the dielectric layer 60 illustrated in FIG. 14 is formed on the surface 58*s* of the semiconductor substrate 58 of each chip 68, on the surface(s) 62*s* of the dummy substrate(s) 62, on the exposed bottom surfaces 500*s* of the insulating rings 500*a* in the chips 68, and on the surface 64*s* of the encapsulation/gap filling material 64.

Figure 148:
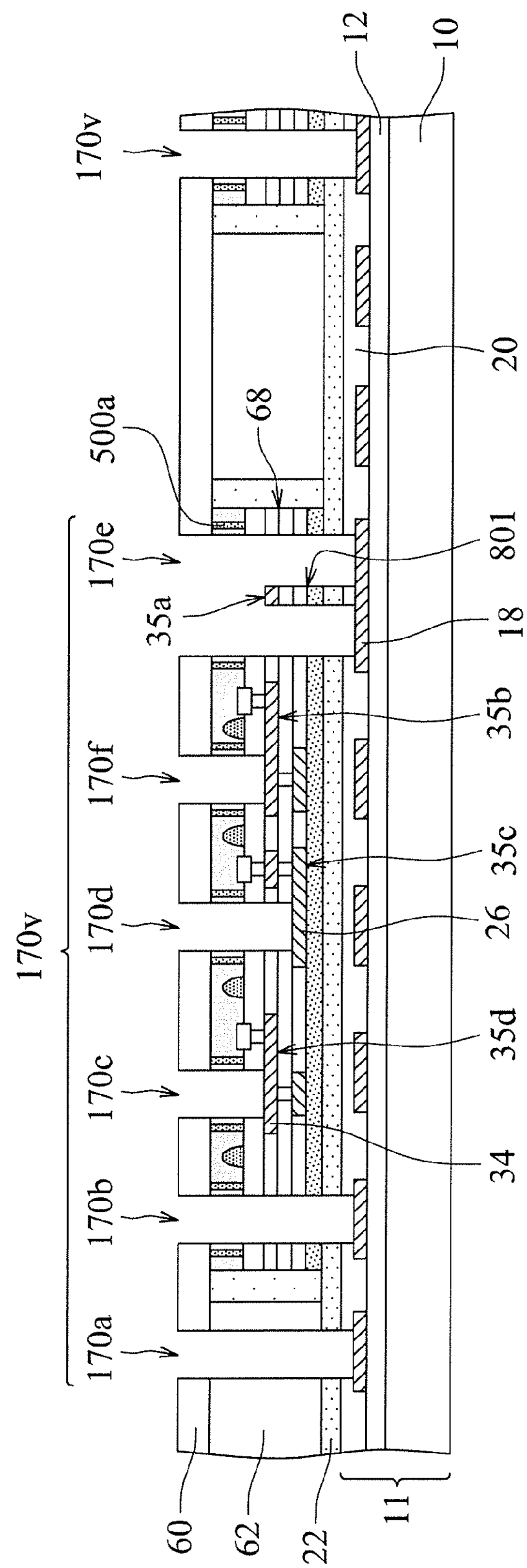

Next, referring to FIG. 148, multiple through vias 170*v*, including through vias 170*a*, 170*b*, 170*c*, 170*d*, 170*e* and 170*f*, can be formed in the chips 68 and in the dummy substrate(s) 62, exposing the conductive layer 18 of the carrier 11 and exposing the layers 26 and 34 of the chips 68, which can be referred to as the steps illustrated in FIG. 15, but, in the embodiment, forming the through vias 170*v* (such as the vias 170*b*-170*f*) in the chips 68 includes etching through the semiconductor substrates 58 enclosed by the insulating rings 500*a* in the chips 68. Each of the through vias 170*v* in the chips 68 passes through one of the insulating rings 500*a* in the chips 68.

For example, the through vias 170*b*, 170*c*, 170*d*, 170*e* and 170*f* in one of the chips 68 pass through the insulating rings 500*a* in the one of the chips 68. Forming the through vias 170*b*, 170*c*, 170*d*, 170*e* and 170*f* includes a process of etching through the semiconductor substrate 58 enclosed by the insulating rings 500*a* in the one of the chips 68. Accordingly, each of the through vias 170*b*, 170*c*, 170*d*, 170*e* and 170*f* passes through the semiconductor substrate 58 of the one of the chips 68 and is enclosed by one of the insulating rings 500*a* in the one of the chips 68. The semiconductor substrate 58 of the one of the chips 68 has portions on inner surfaces of the insulating rings 500*a* enclosing the through vias 170*b*, 170*c*, 170*d*, 170*e* and 170*f*.

Each of the through vias 170*v*, such as the through via 170*a*, 170*b*, 170*c*, 170*d*, 170*e*, or 170*f*, may have a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers. For more detailed description about the through vias 170*v*, such as the through vias 170*a*-170*f*, please refer to the illustration in FIG. 15.

As shown in FIG. 148, a supporter 801 provided by the dielectric or insulating layer 20, the glue or silicon-oxide layer 22, and the layers 24, 42 and 44 of one of the chips 68 is between the conductive layer 18 of the carrier 11 and the interconnect or metal trace 35*a* in the interconnection layer 34 exposed by the through via 170*e* for the purpose of supporting the exposed interconnect or metal trace 35*a*. The supporter 801 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers.

Figure 149:
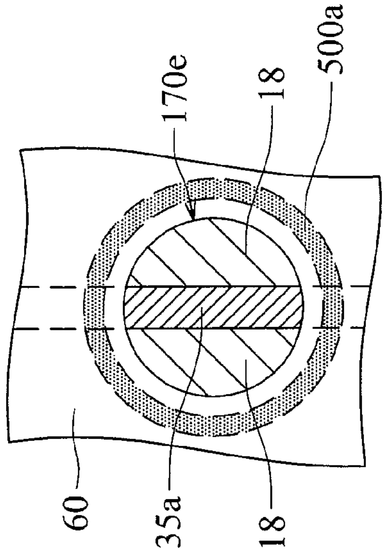

FIG. 149 is a first example of a schematic top perspective view showing the through via 170*e*, the insulating ring 500*a* enclosing the through via 170*e*, and the interconnect or metal trace 35*a* as illustrated in FIG. 148. The schematic top perspective view shown in FIG. 149 is similar to the schematic top perspective view shown in FIG. 16 except that the through via 170*e* shown in FIG. 149 is formed within one of the insulating rings 500*a* in one of the chips 68. For more detailed description about the through via 170*e* and the interconnect or metal trace 35*a* as shown in FIGS. 148 and 149, please refer to the illustration in FIGS. 15 and 16.

Figure 150:
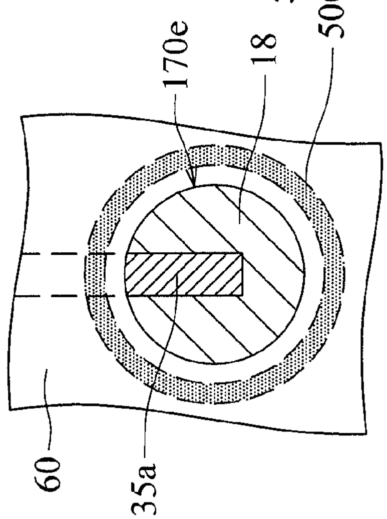

FIG. 150 is a second example of a schematic top perspective view showing the through via 170*e*, the insulating ring 500*a* enclosing the through via 170*e*, and the interconnect or metal trace 35*a* as illustrated in FIG. 148. The schematic top perspective view shown in FIG. 150 is similar to the schematic top perspective view shown in FIG. 17 except that the through via 170*e* shown in FIG. 150 is formed within one of the insulating rings 500*a* in one of the chips 68. For more detailed description about the through via 170*e* and the interconnect or metal trace 35*a* as shown in FIGS. 148 and 150, please refer to the illustration in FIGS. 15 and 17.

Figure 151:
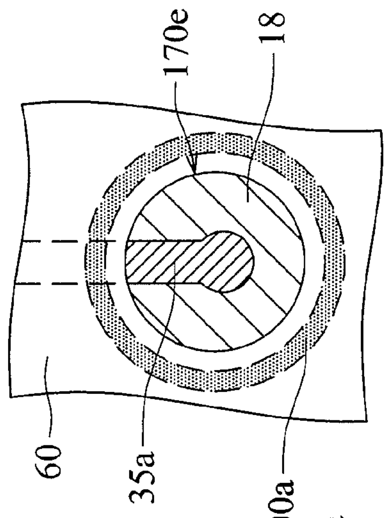

FIG. 151 is a third example of a schematic top perspective view showing the through via 170*e*, the insulating ring 500*a* enclosing the through via 170*e*, and the interconnect or metal trace 35*a* as illustrated in FIG. 148. The schematic top perspective view shown in FIG. 151 is similar to the schematic top perspective view shown in FIG. 18 except that the through via 170*e* shown in FIG. 151 is formed within one of the insulating rings 500*a* in one of the chips 68. For more detailed description about the through via 170*e* and the interconnect or metal trace 35*a* as shown in FIGS. 148 and 151, please refer to the illustration in FIGS. 15 and 18.

Figure 152:
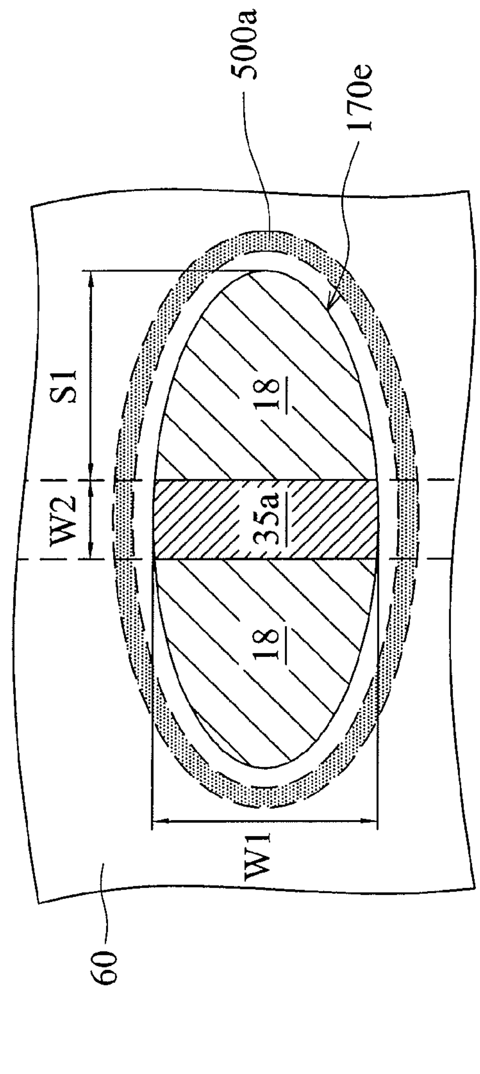

FIG. 152 is a fourth example of a schematic top perspective view showing the through via 170*e*, the insulating ring 500*a* enclosing the through via 170*e*, and the interconnect or metal trace 35*a* as illustrated in FIG. 148. The schematic top perspective view shown in FIG. 152 is similar to the schematic top perspective view shown in FIG. 16A except that the through via 170*e* shown in FIG. 152 is formed within one of the insulating rings 500*a* in one of the chips 68. For more detailed description about the through via 170*e* and the interconnect or metal trace 35*a* as shown in FIG. 152, please refer to the illustration in FIG. 16A.

Figure 153:
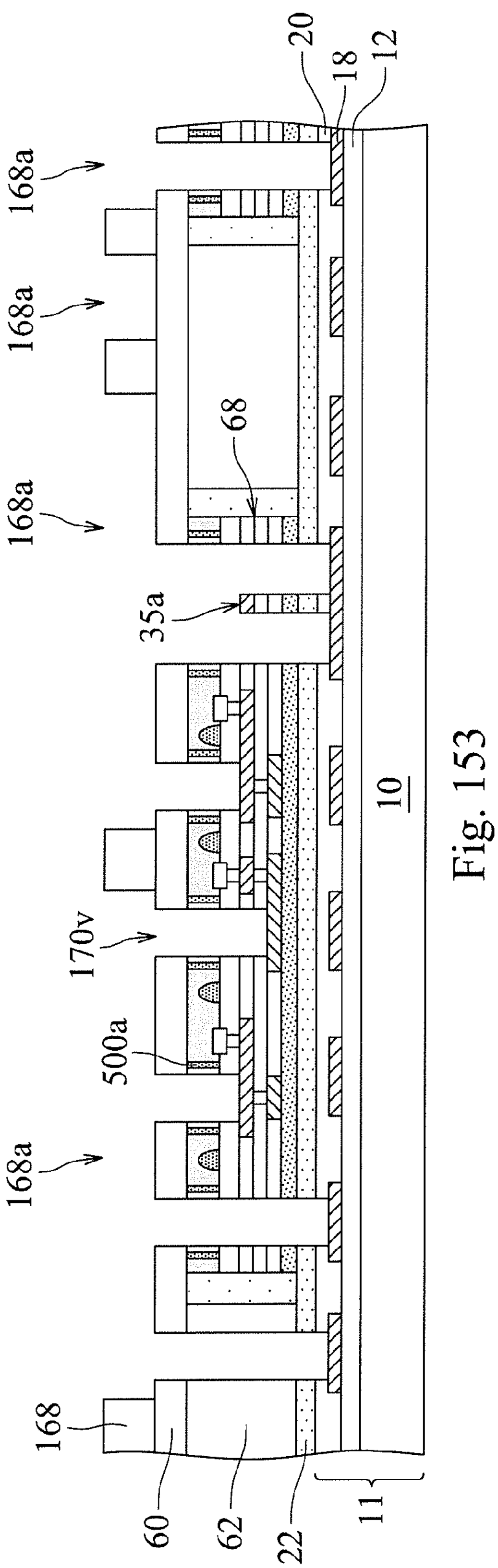

Referring to FIG. 153, after forming the structure illustrated in FIG. 148, a photoresist layer 168 is formed on the dielectric layer 60, and multiple openings 168*a* in the photoresist layer 168 expose the dielectric layer 60 and the through vias 170*v*. The photoresist layer 168 may have a thickness, e.g., between 0.5 and 30 micrometers.

Figure 154:
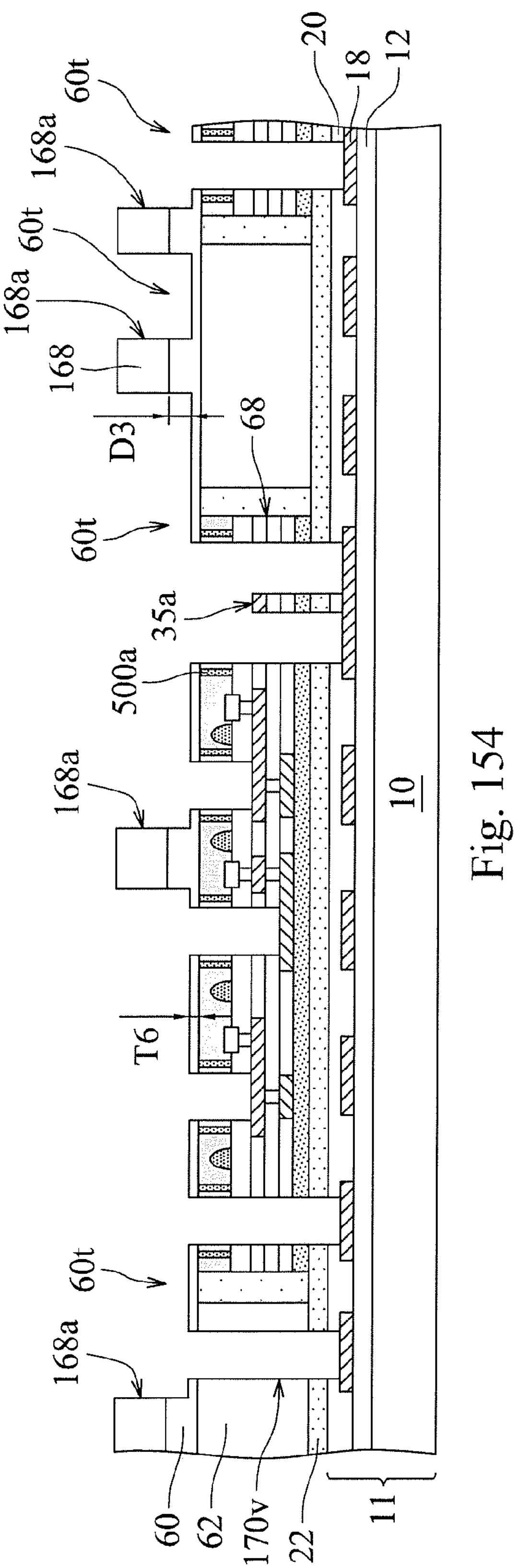

Next, referring to FIG. 154, multiple trenches 60*t* are formed in the dielectric layer 60 by etching the dielectric layer 60 under the openings 168*a* to a depth D3, e.g., between 0.1 and 5 micrometers, and preferably between 0.5 and 3 micrometers, using, e.g., an anisotropic plasma etching process. After the etching process, the dielectric layer 60 under the trenches 60*t* has a remaining thickness T6, e.g., between 0.1 and 5 micrometers, and preferably between 0.3 and 5 micrometers, between 0.5 and 2 micrometers, between 0.1 and 3 micrometers, or between 0.2 and 1.5 micrometers.

Alternatively, an etching-stop technique may be applied to the process of forming the trenches 60*t* in the dielectric layer 60. In this case, the dielectric layer 60 may include a first silicon-oxide layer on the surfaces 58*s*, 62*s*, 64*s* and 500*s* shown in FIG. 144, a silicon-oxynitride layer, used as an etch stop layer, on the first silicon-oxide layer, and a second silicon-oxide layer having a thickness, e.g., between 0.1 and 5 micrometers or between 0.3 and 1.5 micrometers on the silicon-oxynitride layer. The trenches 60*t* can be formed in the dielectric layer 60 by etching the second silicon-oxide layer of the dielectric layer 60 under the openings 168*a* in the photoresist layer 168 until the silicon-oxynitride layer of the dielectric layer 60 is exposed by the openings 168*a*. Accordingly, the trenches 60*t* are formed in the second silicon-oxide layer of the dielectric layer 60, and the remaining dielectric layer 60, composed of the silicon-oxynitride layer and the first silicon-oxide layer, under the trenches 60*t* has a thickness T6, e.g., between 0.1 and 5 micrometers, and preferably between 0.3 and 5 micrometers, between 0.5 and 2 micrometers, between 0.1 and 3 micrometers, or between 0.2 and 1.5 micrometers.

Figure 155:
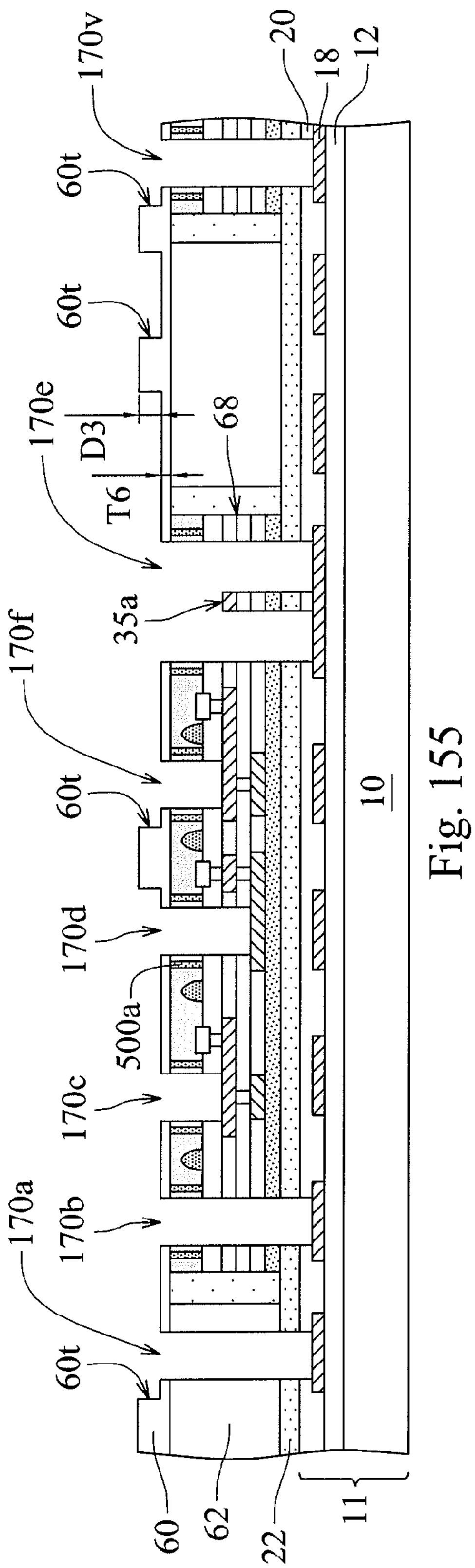
Figure 156:
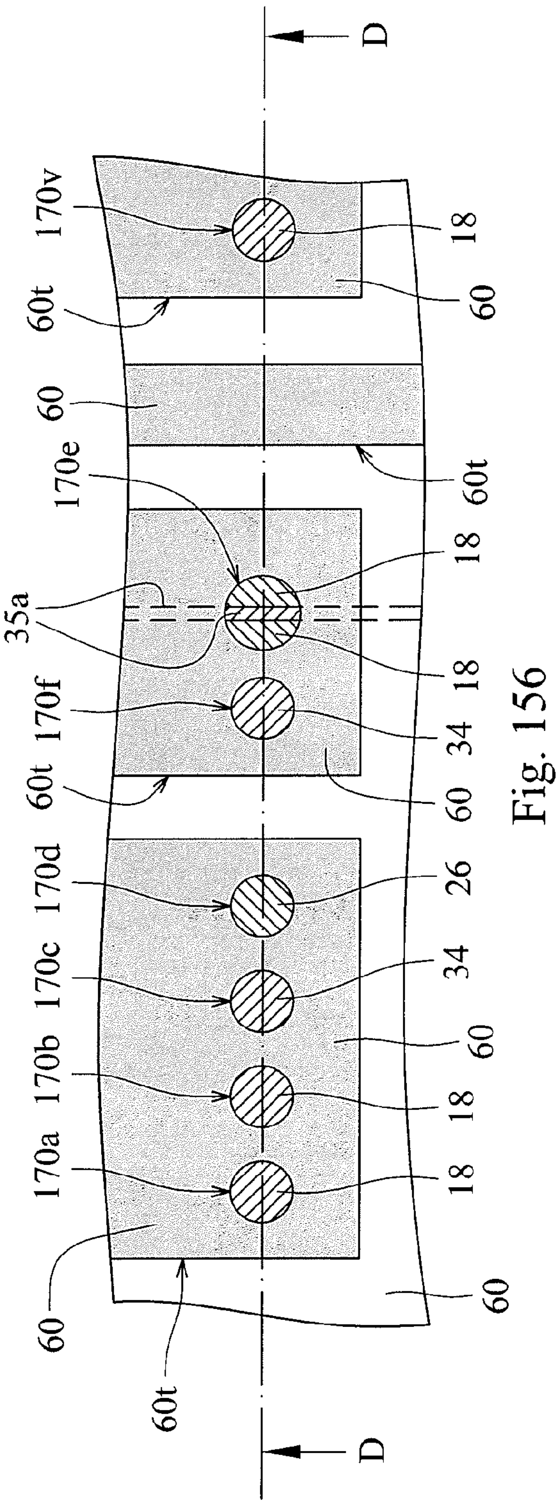

Next, referring to FIG. 155, the photoresist layer 168 is removed by using, e.g., an organic chemical. The trenches 60*t* formed in the dielectric layer 60 are used to provide spaces having inter-chip interconnects and intra-chip interconnects formed therein. FIG. 156 is an example of a schematic top perspective view showing the trenches 60*t* and the through vias 170*v* shown in FIG. 155, and FIG. 155 is a cross-sectional view cut along the line D-D shown in FIG. 156.

Alternatively, the trenches 60*t* illustrated in FIG. 155 can be formed in the dielectric layer 60 before the through vias 170*v* illustrated in FIG. 148 are formed in the chips 68 and in the dummy substrate(s) 62. Specifically, after the dielectric layer 60 is formed on the surfaces 58*s*, 62*s*, 64*s* and 500*s* as shown in FIG. 147, the trenches 60*t* illustrated in FIG. 155 are formed in the dielectric layer 60, and then the through vias 170*v* illustrated in FIG. 148 are formed in the chips 68 and in the dummy substrate(s) 62, exposing the conductive layer 18 of the carrier 11 and exposing the layers 26 and 34 of the chips 68.

Figure 155A:
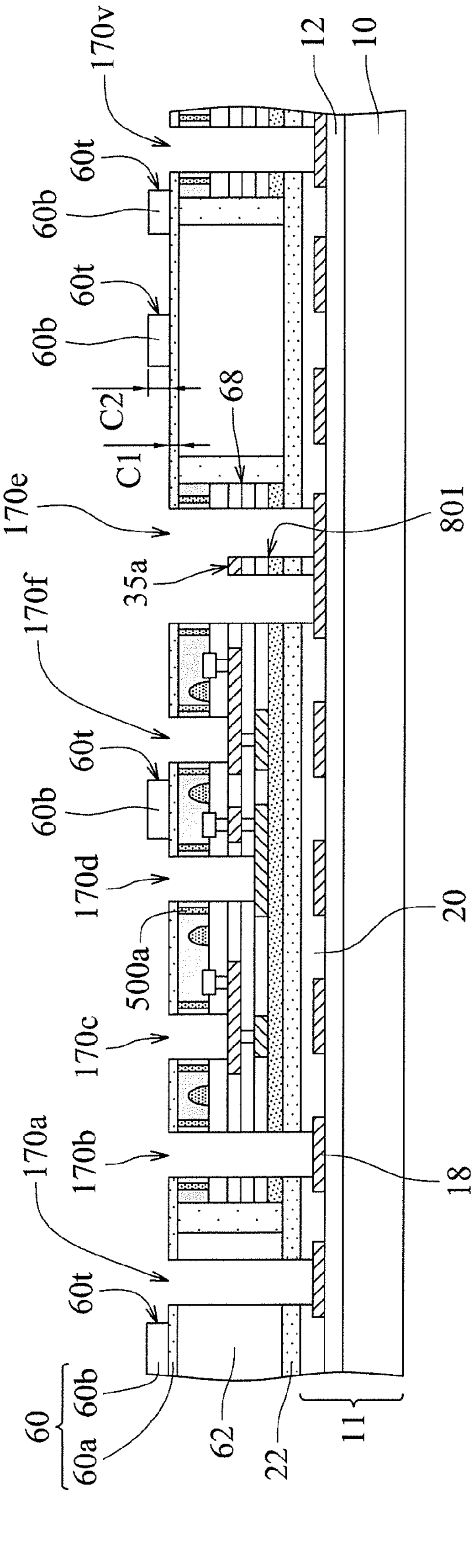

Alternatively, referring to FIG. 155A, the dielectric layer 60, the trenches 60*t*, and the through vias 170*v* as shown in FIG. 155 can be formed by the following steps. After forming the structure illustrated in FIG. 144, an insulating layer 60*a*, such as a layer of silicon oxide, silicon nitride, silicon oxynitride, silicon carbon nitride, or silicon oxycarbide, having a thickness C1, e.g., between 0.1 and 5 micrometers, and preferably between 0.2 and 1.5 micrometers or between 0.15 and 2 micrometers, is formed on the surface 58*s* of the semiconductor substrate 58 of each chip 68, on the surface(s) 62*s* of the dummy substrate(s) 62, on the exposed bottom surfaces 500*s* of the insulating rings 500*a* in the chips 68, and on the surface 64*s* of the encapsulation/gap filling material 64 as shown in FIG. 144.

Next, a polymer layer 60*b*, such as a layer of polyimide, benzocyclobutene (BCB), epoxy, polybenzoxazole (PBO), or poly-phenylene oxide (PPO), is formed on the insulating layer 60*a* using a suitable process, such as spin coating process, screen printing process, or lamination process. Next, an exposure process and a development process can be employed to form the trenches 60*t*, exposing the insulating layer 60*a*, in the polymer layer 60*b*. A 1X stepper or 1X contact aligner can be used to expose the polymer layer 60*b* during the exposure process. Next, the polymer layer 60*b* is cured or heated at a temperature between 150 degrees centigrade and 400 degrees centigrade, and preferably between 180 degrees centigrade and 250 degrees centigrade. The polymer layer 60*b* after being cured or heated has a thickness C2, e.g., between 1 and 50 micrometers, and preferably between 2 and 30 micrometers or between 5 and 25 micrometers.

Next, a photoresist layer is formed on the insulating layer 60*a* exposed by the trenches 60*t* and on the polymer layer 60*b*, and multiple openings in the photoresist layer expose the insulating layer 60*a* at bottoms of the trenches 60*t*. Next, the insulating layer 60*a* under the openings in the photoresist layer is removed using a suitable process, such as anisotropic plasma etching process. Next, the dummy substrate(s) 62 under the openings in the photoresist layer and the chips 68 under the openings in the photoresist layer are etched away until predetermined regions of the layers 26 and 34 in the chips 68 and predetermined regions of the conductive layer 18 in the carrier 11 are exposed by the openings in the photoresist layer. Next, the photoresist layer is removed by using, e.g., an organic chemical. Accordingly, the through vias 170*v*, including the through vias 170*a*, 170*b*, 170*c*, 170*d*, 170*e* and 170*f*, are formed in the chips 68 and in the dummy substrate(s) 62, exposing the conductive layer 18 of the carrier 11 and exposing the layers 26 and 34 of the chips 68. The specifications of the through vias 170*v* and the supporter 801 shown in FIG. 155A can be referred to as the specifications of the through vias 170*v* and the supporter 801, respectively, illustrated in FIGS. 148-152.

Accordingly, using the above-mentioned steps, the above-mentioned dielectric layer 60 also can be provided with the insulating layer 60*a* and the polymer layer 60*b* on the insulating layer 60*a*. The trenches 60*t* in the polymer layer 60*b* expose the insulating layer 60*a* and are used to provide spaces having inter-chip interconnects and intra-chip interconnects formed therein. The through vias 170*v* are formed under the trenches 60*t*. Also, FIG. 156 can be an example of a schematic top perspective view showing the trenches 60*t* and the through vias 170*v* shown in FIG. 155A, and FIG. 155A also can be a cross-sectional view cut along the line D-D shown in FIG. 156.

Figure 157:
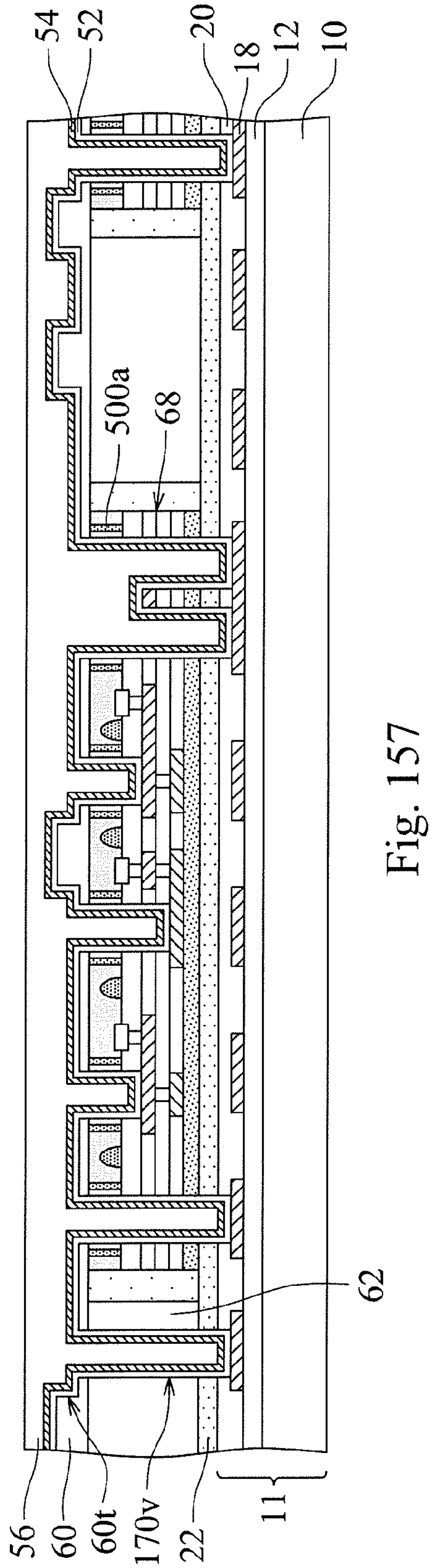

Referring to FIG. 157, after forming the structure illustrated in FIG. 155 or in FIG. 155A, an adhesion/barrier layer 52 having a thickness smaller than 1 micrometer, such as between 1 nanometer and 0.5 micrometers, and preferably between 0.1 and 0.2 micrometers, is formed on the layers 18, 26 and 34 exposed by the through vias 170*v*, on sidewalls of the through vias 170*v*, on sidewalls and bottoms of the trenches 60*t* (or on sidewalls of the trenches 60*t* in the polymer layer 60*b* and on a top surface of the insulating layer 60*a* at the bottoms of the trenches 60*t*), and on the interconnect or metal trace 35*a* that is on the supporter 801. The adhesion/barrier layer 52 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 54 having a thickness smaller than 1 micrometer, such as between 10 nanometers and 0.8 micrometers, and preferably between 80 nanometers and 0.15 micrometers, is formed on the adhesion/barrier layer 52 by a physical vapor deposition (PVD) process, such as sputtering process or evaporation process, by a chemical-vapor deposition (CVD) process, or by other thin-film deposition processes, such as atomic layer deposition (ALD). Next, a conduction layer 56 is formed on the seed layer 54 using a suitable process, such as electroplating process. The specifications of the adhesion/barrier layer 52, the seed layer 54, and the conduction layer 56 shown in FIG. 157 can be referred to as the specifications of the adhesion/barrier layer 52, the seed layer 54, and the conduction layer 56 as illustrated in FIG. 25, respectively.

Figure 158:
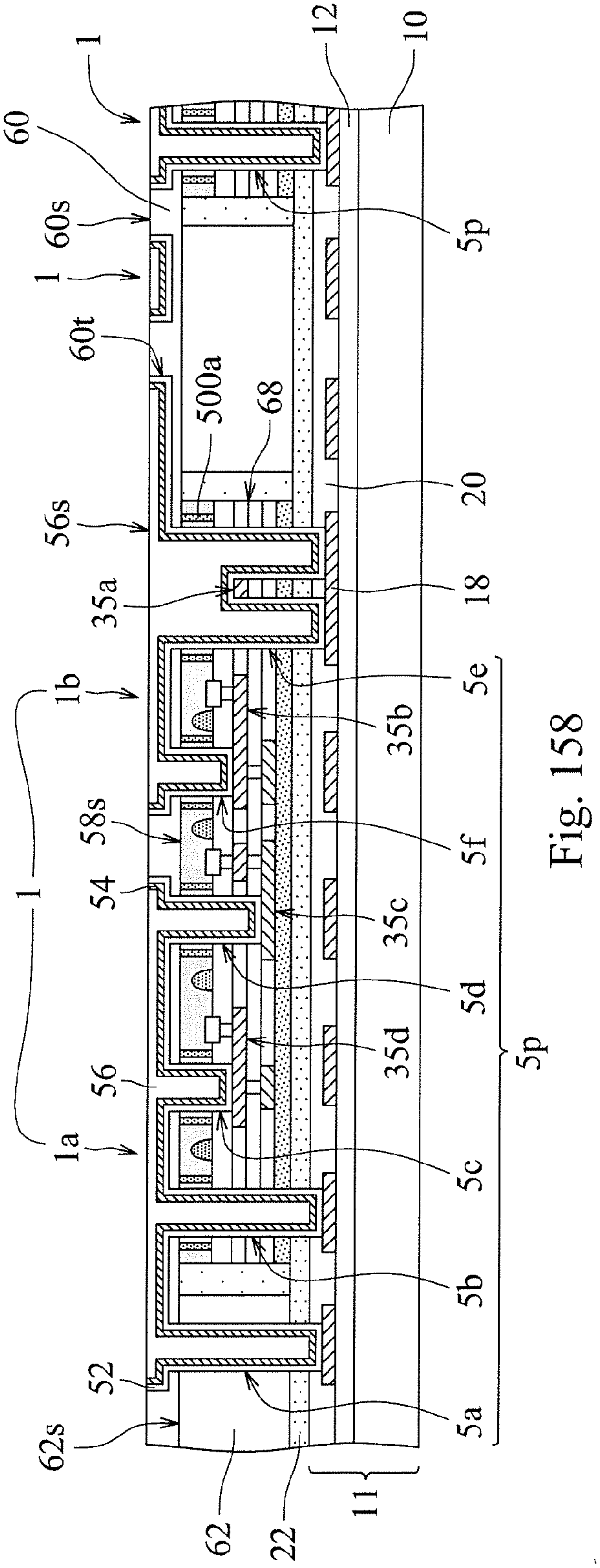

Next, referring to FIG. 158, the layers 52, 54 and 56 are ground or polished by using a suitable process, such as chemical-mechanical-polishing (CMP) process, mechanical polishing process, mechanical grinding process, or a process including mechanical polishing and chemical etching, until the dielectric layer 60 has an exposed top surface 60*s*, over which there are no portions of the layers 52, 54 and 56, and the layers 52, 54 and 56 outside the trenches 60*t* are removed.

Accordingly, the exposed top surface 60*s* of the dielectric layer 60 can be substantially coplanar with the ground or polished surface 56*s* of the conduction layer 56 in the trenches 60*t*, and the surfaces 56*s* and 60*s* can be substantially flat. The adhesion/barrier layer 52 and the seed layer 54 are at sidewalls and a bottom of the conduction layer 56 in the trenches 60*t*, and the sidewalls and the bottom of the conduction layer 56 in the trenches 60*t* are covered by the adhesion/barrier layer 52 and the seed layer 54.

After the layers 52, 54 and 56 are ground or polished, the dielectric layer 60 has a thickness, between the exposed top surface 60*s* and the surface 58*s* or 62*s*, e.g., between 1 and 10 micrometers, and preferably between 1 and 3 micrometers, in case the dielectric layer 60, the trenches 60*t*, and the through vias 170*v* are formed as illustrated in FIGS. 147-155. Alternatively, after the layers 52, 54 and 56 are ground or polished, the polymer layer 60*b* of the dielectric layer 60 has a thickness, between the exposed top surface 60*s* of the polymer layer 60*b* and the top surface of the insulating layer 60*a*, e.g., between 1 and 50 micrometers, and preferably between 2 and 30 micrometers or between 5 and 25 micrometers, in case the dielectric layer 60 composed of the layer 60*a* and 60*b*, the trenches 60*t*, and the through vias 170*v* are formed as illustrated in FIG. 155A.

In a first alternative, after the layers 52, 54 and 56 are ground or polished, the adhesion/barrier layer 52 can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 60*t* (or on the sidewalls of the trenches 60*t* in the polymer layer 60*b* and on the top surface of the insulating layer 60*a* at the bottoms of the trenches 60*t*), on the sidewalls of the through vias 170*v*, on the layers 18, 26 and 34 at the bottoms of the through vias 170*v*, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer, in the trenches 60*t*, and in the through vias 170*v*. The conduction layer 56 can be an electroplated copper layer on the single layer of copper or a titanium-copper alloy, in the trenches 60*t*, and in the through vias 170*v*. The electroplated copper layer in the trenches 60*t* has a thickness, e.g., between 0.1 and 5 micrometers, and preferably between 0.3 and 1.5 micrometers or between 0.5 and 3 micrometers, in case the dielectric layer 60, the trenches 60*t*, and the through vias 170*v* are formed as illustrated in FIGS. 147-155. Alternatively, the electroplated copper layer in the trenches 60*t* has a thickness, e.g., between 1 and 50 micrometers, and preferably between 2 and 30 micrometers or between 5 and 25 micrometers, in case the dielectric layer 60 composed of the layers 60*a* and 60*b*, the trenches 60*t*, and the through vias 170*v* are formed as illustrated in FIG. 155A.

In a second alternative, after the layers 52, 54 and 56 are ground or polished, the adhesion/barrier layer 52 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 60$t$ (or on the sidewalls of the trenches 60$t$ in the polymer layer 60$b$ and on the top surface of the insulating layer 60$a$ at the bottoms of the trenches 60$t$), on the sidewalls of the through vias 170$v$, on the layers 18, 26 and 34 at the bottoms of the through vias 170$v$, and on the interconnect or metal trace 35$a$ that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer, in the trenches 60$t$, and in the through vias 170$v$. The conduction layer 56 can be an electroplated copper layer on the single layer of copper or a titanium-copper alloy, in the trenches 60$t$, and in the through vias 170$v$. The electroplated copper layer in the trenches 60$t$ has a thickness, e.g., between 0.1 and 5 micrometers, and preferably between 0.3 and 1.5 micrometers or between 0.5 and 3 micrometers, in case the dielectric layer 60, the trenches 60$t$, and the through vias 170$v$ are formed as illustrated in FIGS. 147-155. Alternatively, the electroplated copper layer in the trenches 60$t$ has a thickness, e.g., between 1 and 50 micrometers, and preferably between 2 and 30 micrometers or between 5 and 25 micrometers, in case the dielectric layer 60 composed of the layers 60$a$ and 60$b$, the trenches 60$t$, and the through vias 170$v$ are formed as illustrated in FIG. 155A.

In a third alternative, after the layers 52, 54 and 56 are ground or polished, the adhesion/barrier layer 52 can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 60$t$ (or on the sidewalls of the trenches 60$t$ in the polymer layer 60$b$ and on the top surface of the insulating layer 60$a$ at the bottoms of the trenches 60$t$), on the sidewalls of the through vias 170$v$, on the layers 18, 26 and 34 at the bottoms of the through vias 170$v$, and on the interconnect or metal trace 35$a$ that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer, in the trenches 60$t$, and in the through vias 170$v$. The conduction layer 56 can be an electroplated copper layer on the single layer of copper or a titanium-copper alloy, in the trenches 60$t$, and in the through vias 170$v$. The electroplated copper layer in the trenches 60$t$ has a thickness, e.g., between 0.1 and 5 micrometers, and preferably between 0.3 and 1.5 micrometers or between 0.5 and 3 micrometers, in case the dielectric layer 60, the trenches 60$t$, and the through vias 170$v$ are formed as illustrated in FIGS. 147-155. Alternatively, the electroplated copper layer in the trenches 60$t$ has a thickness, e.g., between 1 and 50 micrometers, and preferably between 2 and 30 micrometers or between 5 and 25 micrometers, in case the dielectric layer 60 composed of the layers 60$a$ and 60$b$, the trenches 60$t$, and the through vias 170$v$ are formed as illustrated in FIG. 155A.

After the layers 52, 54 and 56 are ground or polished, the layers 52, 54 and 56 in the trenches 60$t$ compose multiple metal interconnects (or damascene metal traces) 1, including metal interconnects (or damascene metal traces) 1$a$ and 1$b$, in the trenches 60$t$. The layers 52, 54 and 56 in the through vias 170$v$ compose multiple metal plugs (or metal vias) 5$p$ in the through vias 170$v$, including metal plugs (or metal vias) 5$a$, 5$b$, 5$c$, 5$d$, 5$e$ and 5$f$ in the through vias 170$a$, 170$b$, 170$c$, 170$d$, 170$e$ and 170$f$ as shown in FIG. 148, respectively. The metal plug 5$a$ is formed in the dummy substrate 62, and the metal plugs 5$b$, 5$c$, 5$d$, 5$e$ and 5$f$ are formed in the same chip 68. These metal plugs 5$p$ formed in the chips 68 and in the dummy substrate(s) 62 can connect the metal interconnects 1 and the semiconductor devices 36 in the chips 68 and connect the metal interconnects 1 and multiple contact points of the conductive layer 18 in the carrier 11. The metal interconnects 1, such as 1$a$ and 1$b$, in the trenches 60$t$ may have a thickness, e.g., between 0.1 and 5 micrometers, and preferably between 1 and 3 micrometers. The supporter 801 and the interconnect or metal trace 35$a$, in the interconnection layer 34, on the supporter 801 can be between two portions, lower than a horizontal level, at which a top surface of the interconnection layer 34 is positioned, of the metal plug 5$e$.

Each of the metal plugs 5$p$ in the chips 68 passes through one of the insulating rings 500$a$ in the chips 68. For example, the metal plugs 5$b$, 5$c$, 5$d$, 5$e$ and 5$f$ in one of the chips 68 pass through the insulating rings 500$a$ in the one of the chips 68. Specifically, each of the metal plugs 5$b$, 5$c$, 5$d$, 5$e$ and 5$f$ passes through the semiconductor substrate 58 of the one of the chips 68 and is enclosed by one of the insulating rings 500$a$ in the one of the chips 68. The semiconductor substrate 58 of the one of the chips 68 has portions on inner surfaces of the insulating rings 500$a$ enclosing the metal plugs 5$b$, 5$c$, 5$d$, 5$e$ and 5$f$. For more detailed description about the metal plugs 5$p$ (including the metal plugs 5$a$-5$f$) and the metal interconnects 1 (including the metal interconnects 1$a$ and 1$b$) shown in FIG. 158, please refer to the illustration in FIG. 26.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

Figure 159:
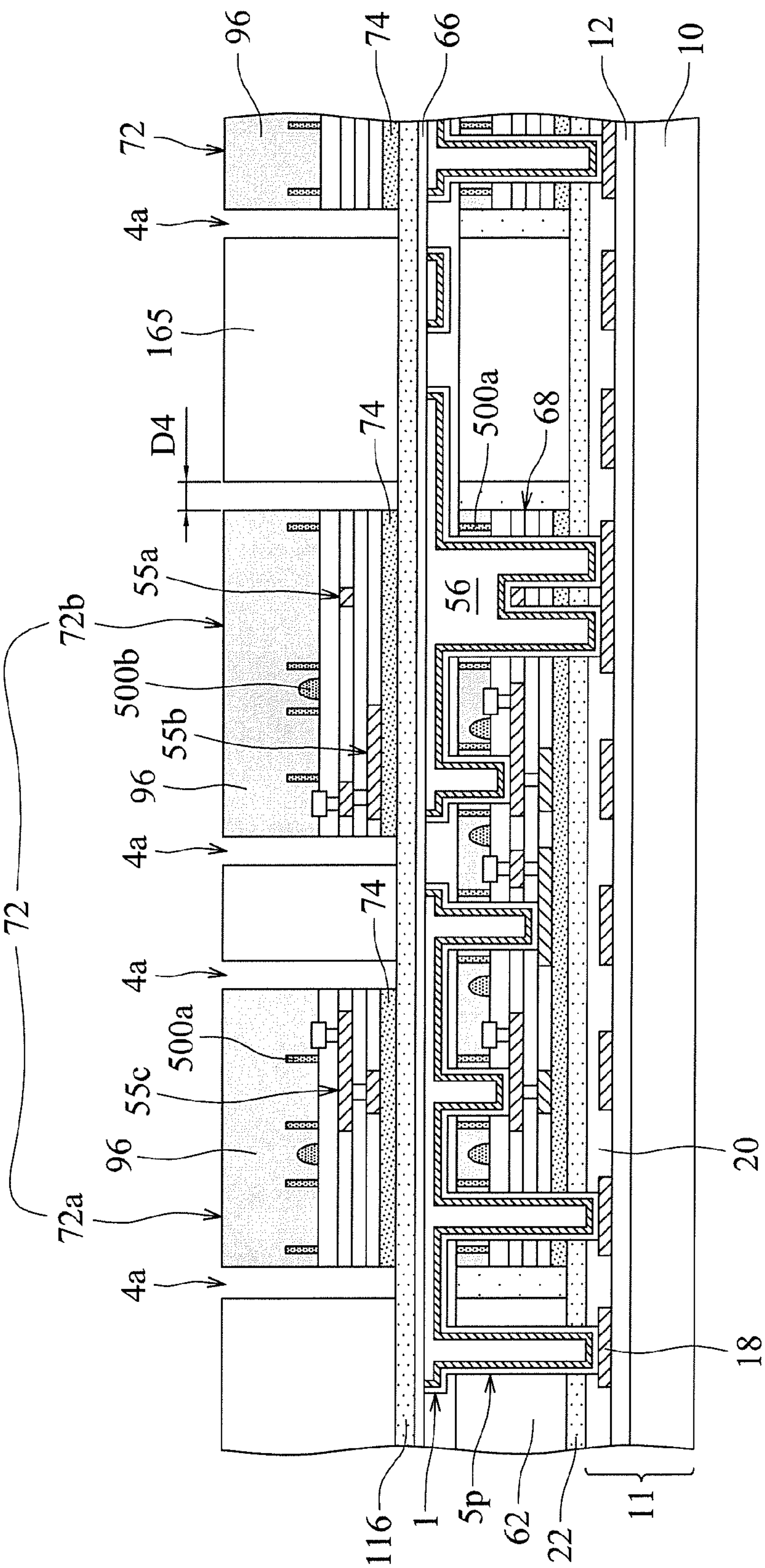

Referring to FIG. 159, after forming the structure illustrated in FIG. 158, the insulating or dielectric layer 66 illustrated in FIG. 27 is formed on the ground or polished surface 56$s$ of the conduction layer 56 and on the exposed top surface 60$s$ of the dielectric layer 60. Next, multiple chips 72, each of which is like the chip 72$a$ or 72$b$ illustrated in FIG. 141K, and the previously described dummy substrate(s) 165 are placed over the layer 116, which can be referred to as the steps illustrated in FIGS. 28-35. The arrangement of placing the chips 72 and the dummy substrate(s) 165 over the insulating or dielectric layer 66, in the embodiment, can be referred to as that of placing the chips 72 and the dummy substrate(s) 165 over the insulating or dielectric layer 66 as illustrated in FIG. 34 or 35.

Figure 160:
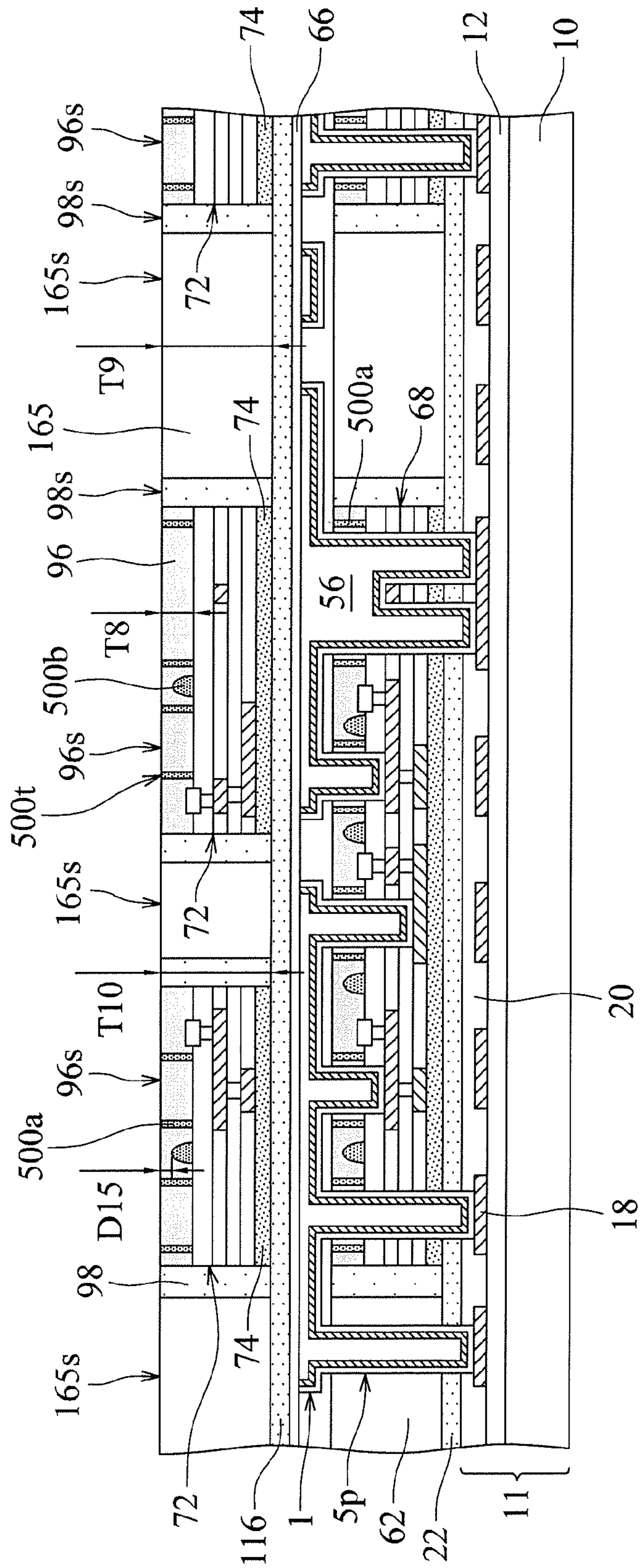

Next, referring to FIG. 160, an encapsulation/gap filling material 98 is formed on a backside of the semiconductor substrate 96 of each chip 72, on the dummy substrate(s) 165, and in the gaps 4$a$ and 8$a$. Next, the encapsulation/gap filling material 98, the backside of the semiconductor substrate 96 of each chip 72, and the dummy substrate(s) 165 are ground or polished by a suitable process, such as mechanical grinding process, mechanical polishing process, chemical-mechanical-polishing (CMP) process, or a process including mechanical polishing and chemical etching, until all of the insulating rings 500$a$ in the chips 72 have exposed bottom surfaces 500$t$, over which there are no portions of the semiconductor substrates 96. The steps of forming the encapsulation/gap filling material 98 and grinding or polishing the encapsulation/gap filling material 98, the backside of the semiconductor substrate 96 of each chip 72, and the dummy substrate(s) 165 illustrated in FIG. 160 can be referred to as the steps of forming the encapsulation/gap filling material 64 and grinding or polishing the encapsulation/gap filling material 64, the backside of the semiconductor substrate 58 of each chip 68, and the dummy substrate(s) 62 as illustrated in FIGS.

143-146. The encapsulation/gap filling material 98 can be polysilicon, silicon oxide, or a polymer.

Accordingly, the semiconductor substrate 96 of each of the chips 72 can be thinned to a thickness T8, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 72, after the grinding or polishing process, the insulating rings 500*a* and the semiconductor substrate 96 may have the same thickness T8. Preferably, each of the chips 72, after the grinding or polishing process, may have a thickness, e.g., between 3 and 105 micrometers, and preferably between 3 and 30 micrometers or between 5 and 25 micrometers.

After the grinding or polishing process, the dummy substrate(s) 165 can be thinned to a thickness T9, e.g., between 3 and 100 micrometers, and preferably between 3 and 30 micrometers or between 5 and 25 micrometers, and the encapsulation/gap filling material 98 remaining in the gaps 4*a* and 8*a* may have a vertical thickness T10, e.g., between 3 and 100 micrometers, and preferably between 3 and 30 micrometers or between 5 and 25 micrometers. The ground or polished surface 96*s* of the semiconductor substrate 96, at the backside of each chip 72, and the ground or polished surface(s) 165*s* of the dummy substrate(s) 165 can be substantially flat and not covered by the encapsulation/gap filling material 98. The ground or polished surface(s) 165*s* may be substantially coplanar with the ground or polished surface 96*s* of each chip 72, with the ground or polished surface 98*s* of the encapsulation/gap filling material 98 in the gaps 4*a* and 8*a*, and with the exposed bottom surfaces 500*t* of the insulating rings 500*a* in the chips 72. In each chip 72, a vertical distance D15 between the ground or polished surface 96*s* of the semiconductor substrate 96 and the bottom of the shallow trench isolation 500*b* can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Figure 161:
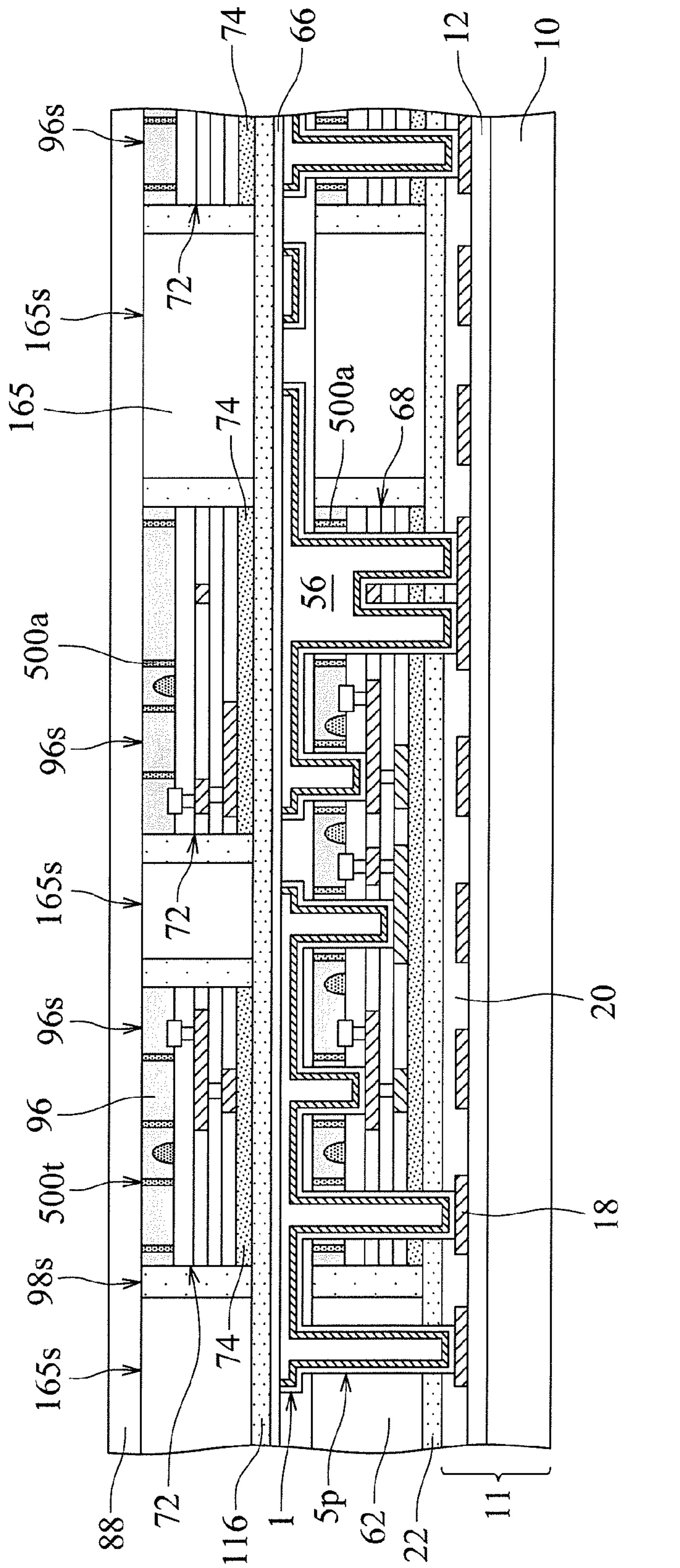

Referring to FIG. 161, after forming the structure illustrated in FIG. 160, the dielectric layer 88 illustrated in FIG. 40 is formed on the surface 96*s* of the semiconductor substrate 96 of each chip 72, on the surface(s) 165*s* of the dummy substrate(s) 165, on the exposed bottom surfaces 500*t* of the insulating rings 500*a* in the chips 72, and on the surface 98*s* of the encapsulation/gap filling material 98.

Figure 162:
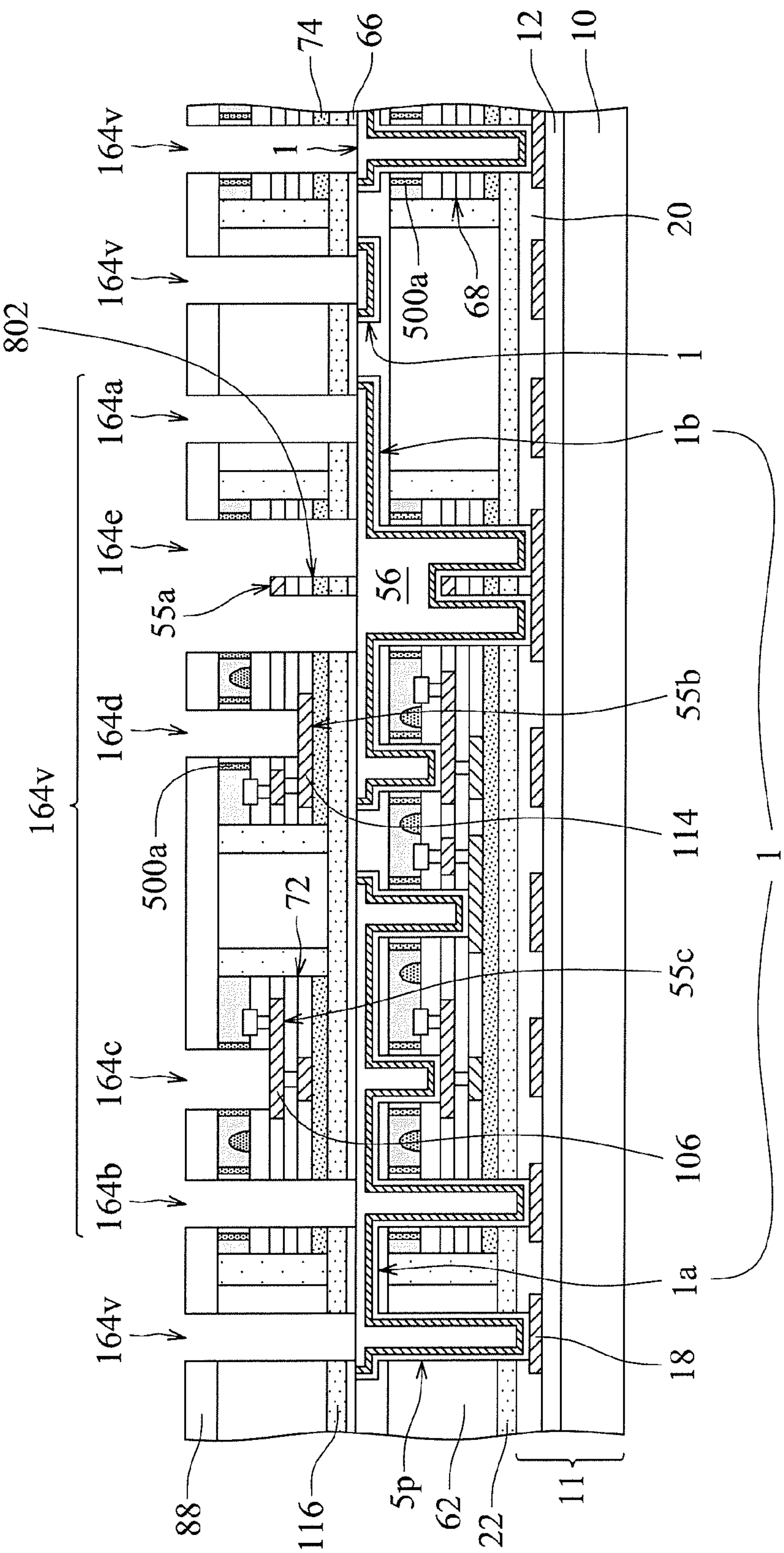

Next, referring to FIG. 162, multiple through vias 164*v*, including through vias 164*a*, 164*b*, 164*c*, 164*d* and 164*e*, are formed in the chips 72 and in the dummy substrate(s) 165, exposing the conduction layer 56 of the metal interconnects 1 and exposing the layers 114 and 106 of the chips 72, which can be referred to as the steps illustrated in FIG. 41, but, in the embodiment, forming the through vias 164*v* (such as the vias 164*b*-164*e*) in the chips 72 includes etching through the semiconductor substrates 96 enclosed by the insulating rings 500*a* in the chips 72. Each of the through vias 164*v* in the chips 72 passes through one of the insulating rings 500*a* in the chips 72. For example, the through vias 164*b* and 164*c* in the left one of the chips 72 pass through the insulating rings 500*a* in the left one of the chips 72, and the through vias 164*d* and 164*e* in the middle one of the chips 72 pass through the insulating rings 500*a* in the middle one of the chips 72.

Forming the through vias 164*b*, 164*c*, 164*d* and 164*e* includes a process of etching through the semiconductor substrates 96 enclosed by the insulating rings 500*a*. Particularly, forming the through via 164*c* or 164*e* includes a process of etching away the whole portion, enclosed by one of the insulating rings 500*a*, of the semiconductor substrate 96. Accordingly, the through vias 164*b* and 164*c* pass through the semiconductor substrate 96 in the left one of the chips 72 and are enclosed by the insulating rings 500*a* in the left one of the chips 72, and the through vias 164*d* and 164*e* pass through the semiconductor substrate 96 in the middle one of the chips 72 and are enclosed by the insulating rings 500*a* in the middle one of the chips 72. The semiconductor substrate 96 of the left one of the chips 72 has a portion on an inner surface of the insulating ring 500*a* enclosing the through via 164*b* in the left one of the chips 72, and the semiconductor substrate 96 of the middle one of the chips 72 has a portion on an inner surface of the insulating ring 500*a* enclosing the through via 164*d* in the middle one of the chips 72. The insulating ring 500*a* enclosing the through via 164*c* is at the sidewall of the through via 164*c* and exposed by the through via 164*c*, and the insulating ring 500*a* enclosing the through via 164*e* is at the sidewall of the through via 164*e* and exposed by the through via 164*e*.

Each of the through vias 164*v*, such as the through via 164*a*, 164*b*, 164*c*, 164*d*, or 164*e*, may have a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers. For more detailed description about the through vias 164*v*, such as the through vias 164*a*-164*e*, please refer to the illustration in FIG. 41.

As shown in FIG. 162, a supporter 802 provided by the insulating or dielectric layer 66, the layer 116 and the layers 74, 82 and 108 of the middle one of the chips 72 is between the conduction layer 56 of the metal interconnect 1*b* and the interconnect or metal trace 55*a* in the interconnection layer 106 exposed by the through via 164*e* for the purpose of supporting the exposed interconnect or metal trace 55*a*. The supporter 802 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers.

Figure 163:
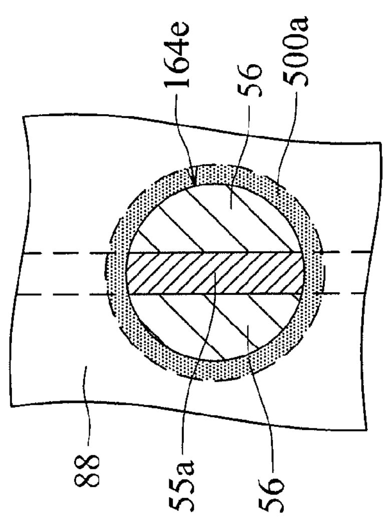

FIG. 163 is a first example of a schematic top perspective view showing the through via 164*e*, the insulating ring 500*a* enclosing the through via 164*e*, and the interconnect or metal trace 55*a* as illustrated in FIG. 162. The schematic top perspective view shown in FIG. 163 is similar to the schematic top perspective view shown in FIG. 42 except that the through via 164*e* shown in FIG. 163 is formed within one of the insulating rings 500*a* in the middle one of the chips 72. For more detailed description about the through via 164*e* and the interconnect or metal trace 55*a* as shown in FIGS. 162 and 163, please refer to the illustration in FIGS. 41 and 42.

Figure 164:
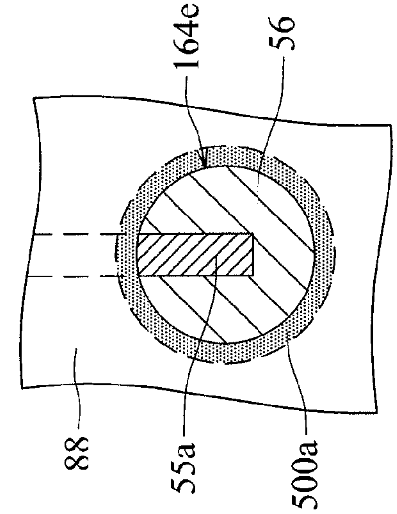

FIG. 164 is a second example of a schematic top perspective view showing the through via 164*e*, the insulating ring 500*a* enclosing the through via 164*e*, and the interconnect or metal trace 55*a* as illustrated in FIG. 162. The schematic top perspective view shown in FIG. 164 is similar to the schematic top perspective view shown in FIG. 43 except that the through via 164*e* shown in FIG. 164 is formed within one of the insulating rings 500*a* in the middle one of the chips 72. For more detailed description about the through via 164*e* and the interconnect or metal trace 55*a* as shown in FIGS. 162 and 164, please refer to the illustration in FIGS. 41 and 43.

Figure 165:
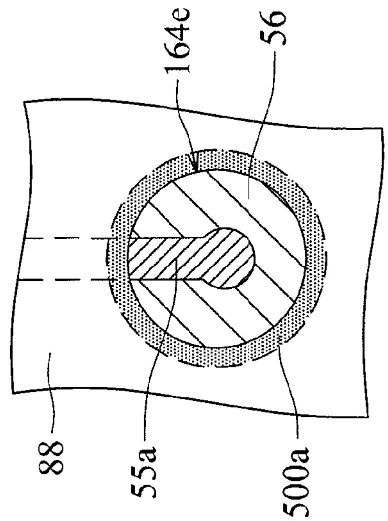

FIG. 165 is a third example of a schematic top perspective view showing the through via 164*e*, the insulating ring 500*a* enclosing the through via 164*e*, and the interconnect or metal trace 55*a* as illustrated in FIG. 162. The schematic top perspective view shown in FIG. 165 is similar to the schematic top perspective view shown in FIG. 44 except that the through via 164*e* shown in FIG. 165 is formed within one of the insulating rings 500*a* in the middle one of the chips 72. For more detailed description about the through via 164*e* and the interconnect or metal trace 55*a* as shown in FIGS. 162 and 165, please refer to the illustration in FIGS. 41 and 44.

Figure 166:
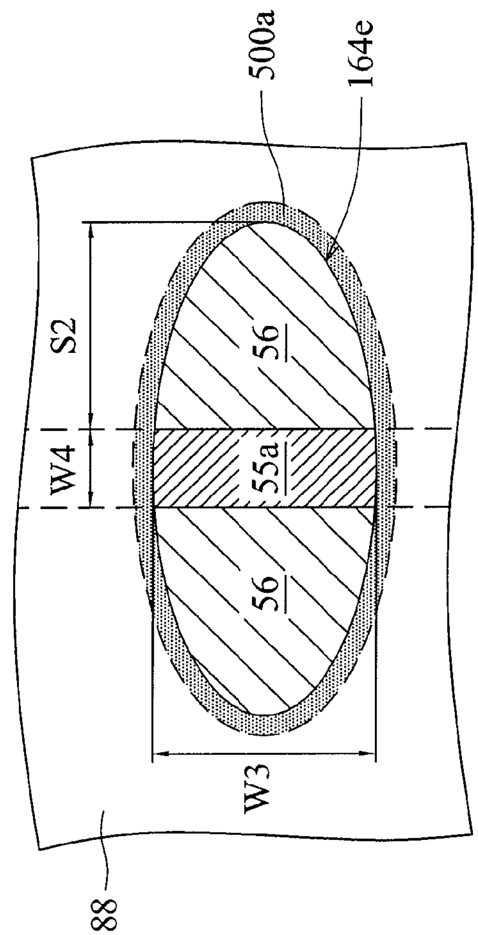

FIG. 166 is a fourth example of a schematic top perspective view showing the through via 164*e*, the insulating ring 500*a* enclosing the through via 164*e*, and the interconnect or metal trace 55*a* as illustrated in FIG. 162. The schematic top perspective view shown in FIG. 166 is similar to the schematic top perspective view shown in FIG. 42A except that the through via 164*e* shown in FIG. 166 is formed within one of the insulating rings 500*a* in the middle one of the chips 72. For more detailed description about the through via 164*e* and the interconnect or metal trace 55*a* as shown in FIG. 166, please refer to the illustration in FIG. 42A.

Figure 167:
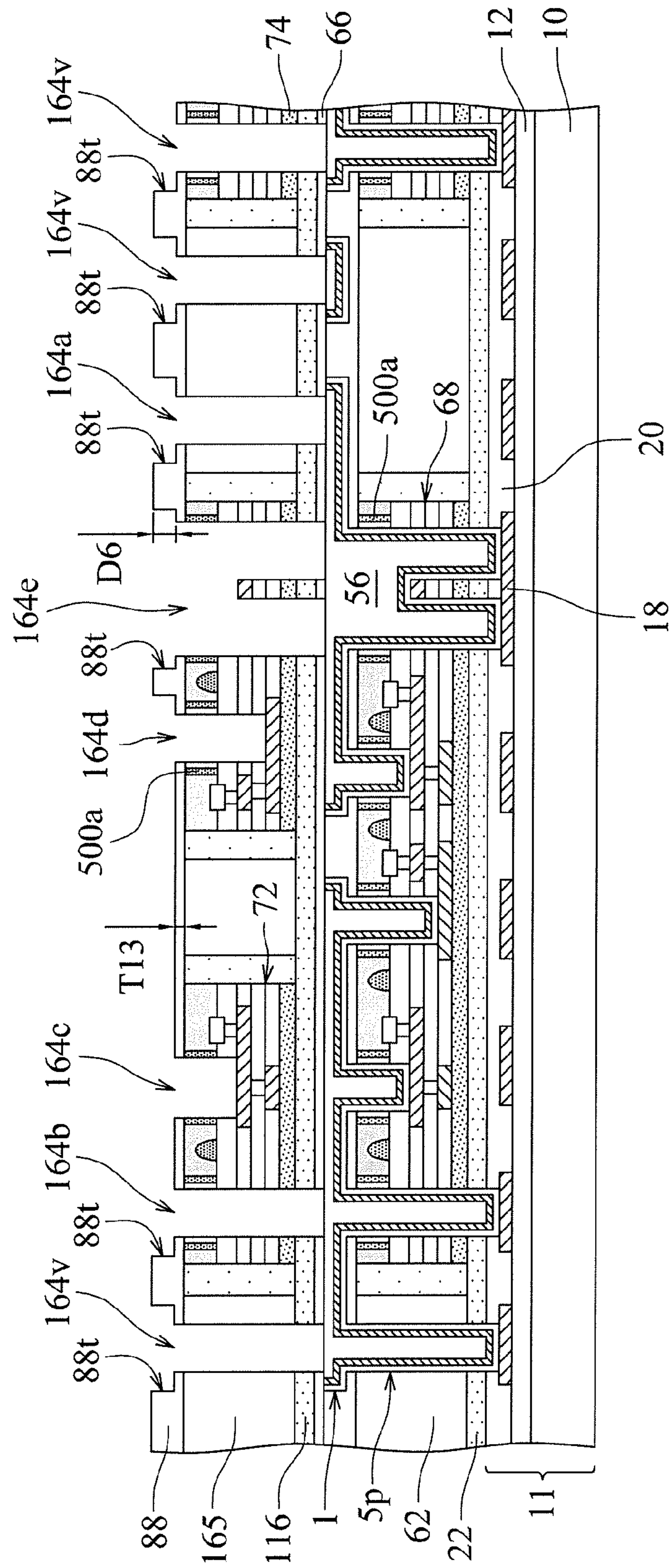
Figure 168:
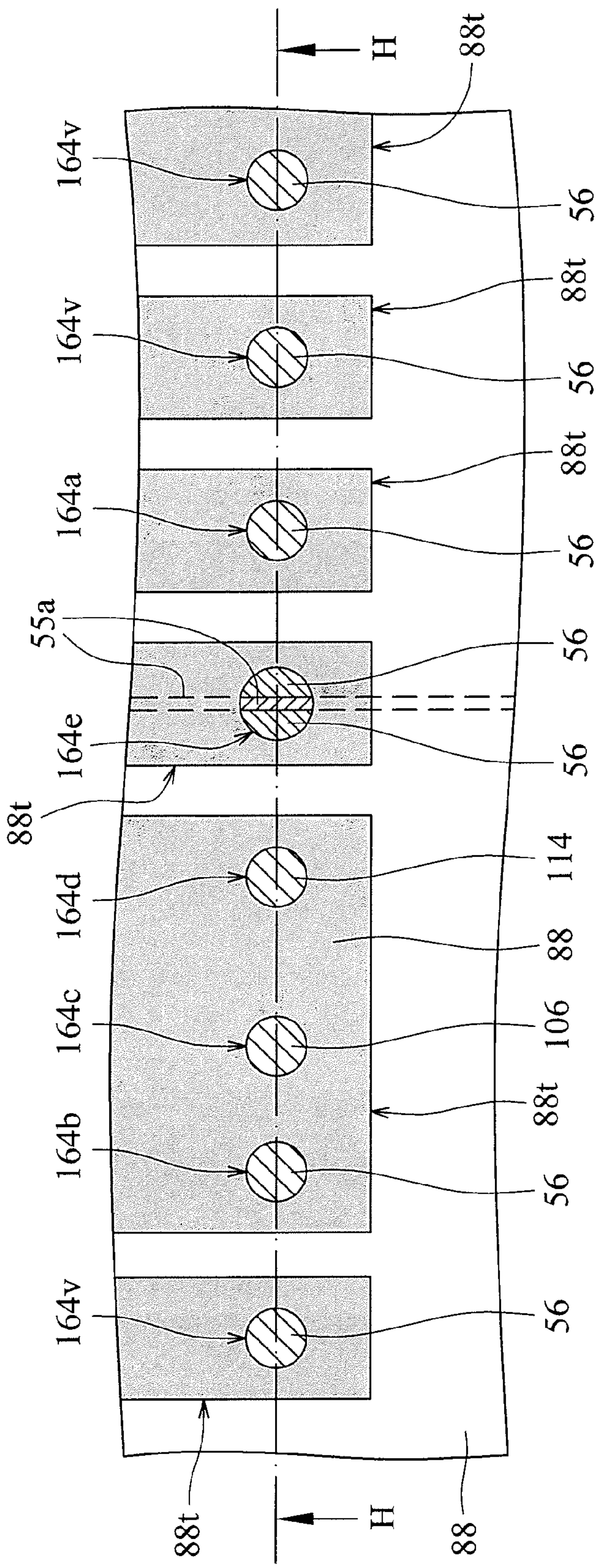

Referring to FIG. 167, after forming the structure illustrated in FIG. 162, multiple trenches 88*t* are formed in the dielectric layer 88. The trenches 88*t* in the dielectric layer 88 have a depth D6, e.g., between 0.1 and 5 micrometers, and preferably between 0.5 and 3 micrometers. The dielectric layer 88 under the trenches 88*t* has a remaining thickness T13, e.g., between 0.1 and 5 micrometers, and preferably between 0.3 and 5 micrometers, between 0.5 and 2 micrometers, between 0.1 and 3 micrometers, or between 0.2 and 1.5 micrometers. The steps of forming the trenches 88*t* in the dielectric layer 88 can be referred to as the steps of forming the trenches 60*t* in the dielectric layer 60 as illustrated in FIGS. 153-155. The trenches 88*t* formed in the dielectric layer 88 are used to provide spaces having inter-chip interconnects and intra-chip interconnects formed therein. FIG. 168 is an example of a schematic top perspective view showing the trenches 88*t* and the through vias 164*v* shown in FIG. 162, and FIG. 162 is a cross-sectional view cut along the line H-H shown in FIG. 168.

Alternatively, the trenches 88*t* illustrated in FIG. 167 can be formed in the dielectric layer 88 before the through vias 164*v* illustrated in FIG. 162 are formed in the chips 72 and in the dummy substrate(s) 165. Specifically, after the dielectric layer 88 is formed on the surfaces 96*s*, 98*s*, 165*s* and 500*t* as shown in FIG. 161, the trenches 88*t* illustrated in FIG. 167 are formed in the dielectric layer 88, and then the through vias 164*v* illustrated in FIG. 162 are formed in the chips 72 and in the dummy substrate(s) 165, exposing the conduction layer 56 of the metal interconnects 1 and exposing the layers 114 and 106 of the chips 72.

Figure 167A:
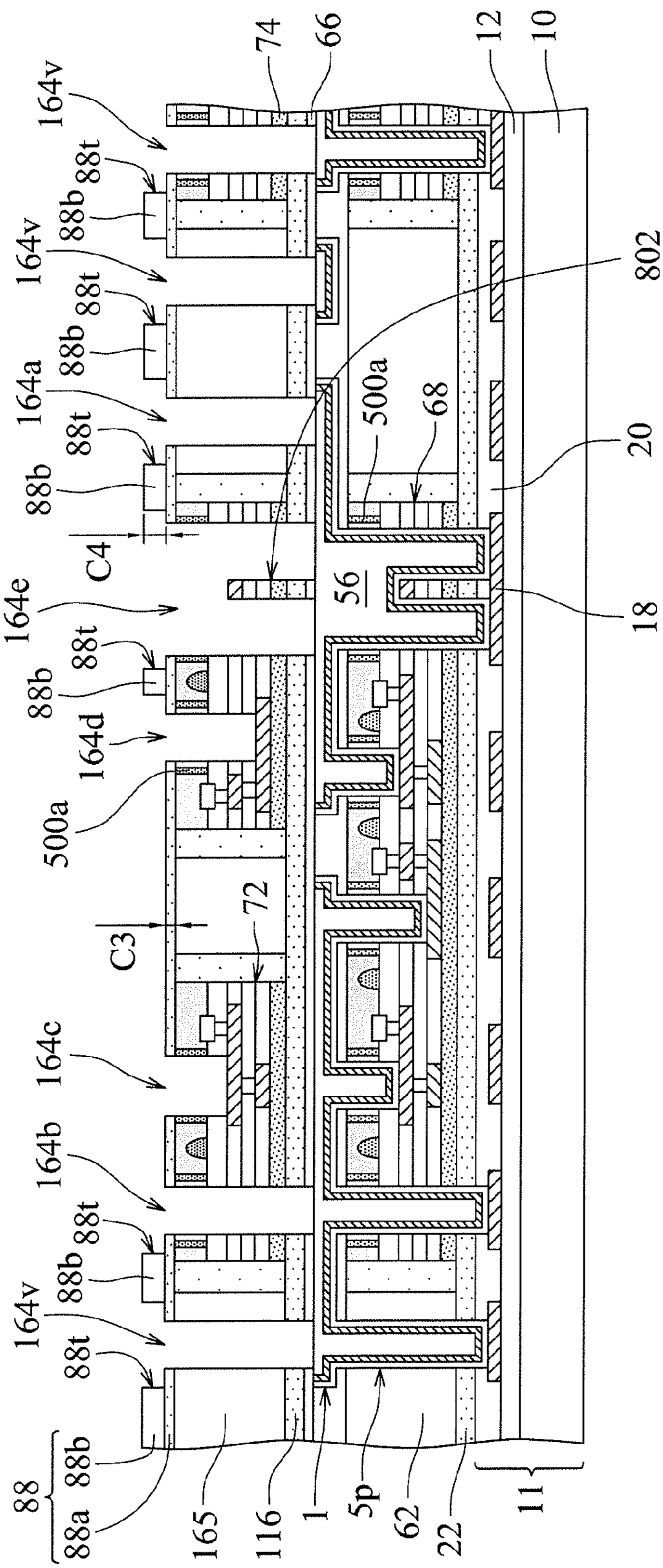

Alternatively, referring to FIG. 167A, the dielectric layer 88, the trenches 88*t*, and the through vias 164*v* as shown in FIG. 167 can be formed by the following steps. After forming the structure illustrated in FIG. 160, an insulating layer 88*a*, such as a layer of silicon oxide, silicon nitride, silicon oxynitride, silicon carbon nitride, or silicon oxycarbide, having a thickness C3, e.g., between 0.1 and 5 micrometers, and preferably between 0.2 and 1.5 micrometers or between 0.15 and 2 micrometers, is formed on the surface 96*s* of the semiconductor substrate 96 of each chip 72, on the surface(s) 165*s* of the dummy substrate(s) 165, on the exposed bottom surfaces 500*t* of the insulating rings 500*a* in the chips 72, and on the surface 98*s* of the encapsulation/gap filling material 98 as shown in FIG. 160.

Next, a polymer layer 88*b*, such as a layer of polyimide, benzocyclobutene (BCB), epoxy, polybenzoxazole (PBO), or poly-phenylene oxide (PPO), is formed on the insulating layer 88*a* using a suitable process, such as spin coating process, screen printing process, or lamination process. Next, an exposure process and a development process can be employed to form the trenches 88*t*, exposing the insulating layer 88*a*, in the polymer layer 88*b*. A 1X stepper or 1X contact aligner can be used to expose the polymer layer 88*b* during the exposure process. Next, the polymer layer 88*b* is cured or heated at a temperature between 150 degrees centigrade and 400 degrees centigrade, and preferably between 180 degrees centigrade and 250 degrees centigrade. The polymer layer 88*b* after being cured or heated has a thickness C4, e.g., between 1 and 50 micrometers, and preferably between 2 and 30 micrometers or between 5 and 25 micrometers.

Next, a photoresist layer is formed on the insulating layer 88*a* exposed by the trenches 88*t* and on the polymer layer 88*b*, and multiple openings in the photoresist layer expose the insulating layer 88*a* at bottoms of the trenches 88*t*. Next, the insulating layer 88*a* under the openings in the photoresist layer is removed using a suitable process, such as anisotropic plasma etching process. Next, the dummy substrate(s) 165 under the openings in the photoresist layer and the chips 72 under the openings in the photoresist layer are etched away until predetermined regions of the layers 106 and 114 in the chips 72 and predetermined regions of the conduction layer 56 of the metal interconnects 1 are exposed by the openings in the photoresist layer. Next, the photoresist layer is removed by using, e.g., an organic chemical. Accordingly, the through vias 164*v*, including the through vias 164*a*, 164*b*, 164*c*, 164*d* and 164*e*, are formed in the chips 72 and in the dummy substrate(s) 165, exposing the conduction layer 56 of the metal interconnects 1 and exposing the layers 106 and 114 of the chips 72. The specifications of the through vias 164*v* and the supporter 802 shown in FIG. 167A can be referred to as the specifications of the through vias 164*v* and the supporter 802, respectively, illustrated in FIGS. 162-166.

Accordingly, using the above-mentioned steps, the above-mentioned dielectric layer 88 also can be provided with the insulating layer 88*a* and the polymer layer 88*b* on the insulating layer 88*a*. The trenches 88*t* in the polymer layer 88*b* expose the insulating layer 88*a* and are used to provide spaces having inter-chip interconnects and intra-chip interconnects formed therein. The through vias 164*v* are formed under the trenches 88*t*. Also, FIG. 168 can be an example of a schematic top perspective view showing the trenches 88*t* and the through vias 164*v* shown in FIG. 167A, and FIG. 167A also can be a cross-sectional view cut along the line H-H shown in FIG. 168.

Figure 169:
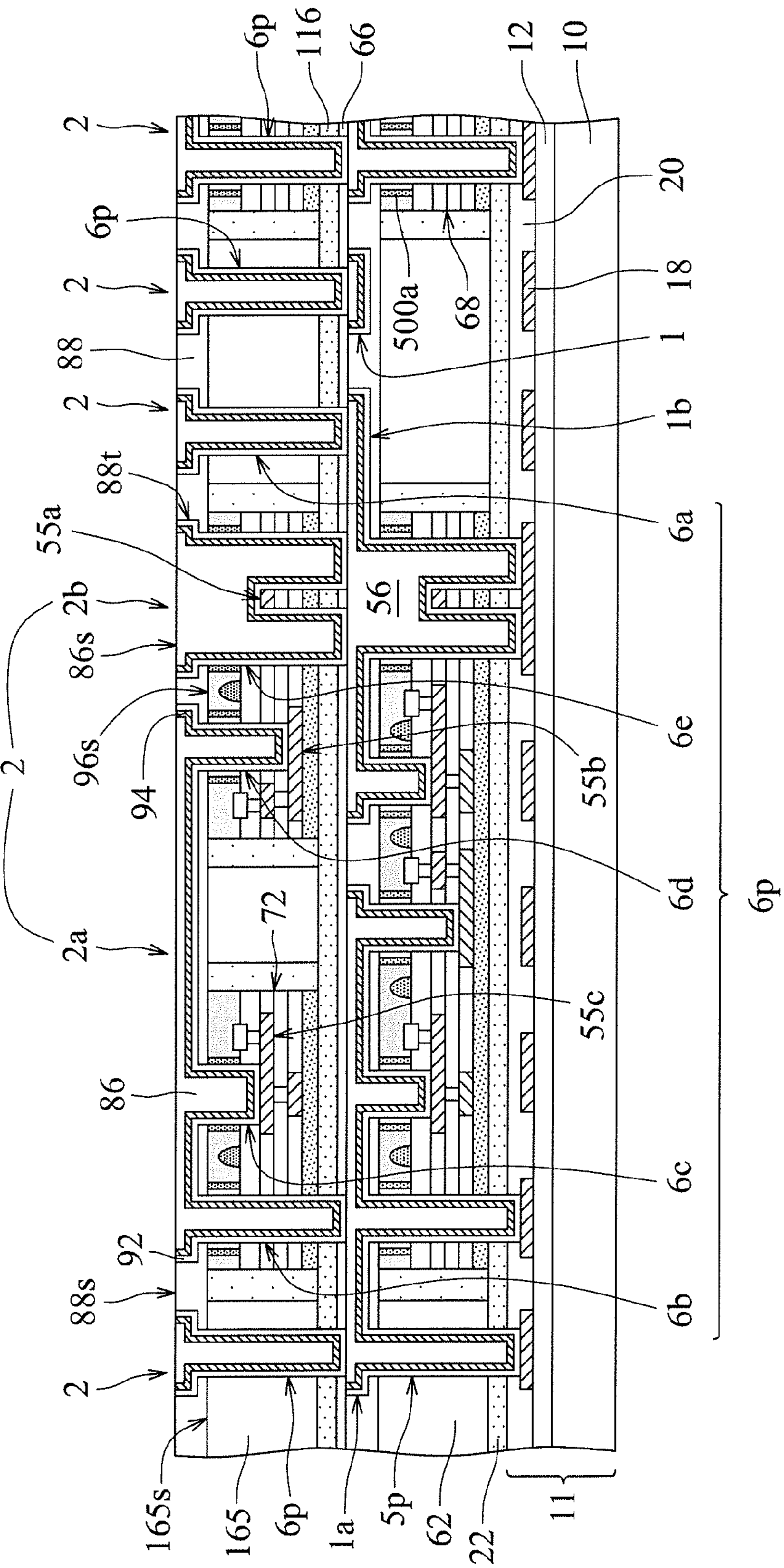

Referring to FIG. 169, after forming the structure illustrated in FIG. 167 or in FIG. 167A, multiple metal interconnects (or damascene metal traces) 2, including metal interconnects (or damascene metal traces) 2*a* and 2*b*, are formed in the trenches 88*t*, and multiple metal plugs (or metal vias) 6*p* are formed in the through vias 164*v*. The metal plugs 6*p* include metal plugs (or metal vias) 6*a*, 6*b*, 6*c*, 6*d* and 6*e* in the through vias 164*a*, 164*b*, 164*c*, 164*d* and 164*e*, respectively. The metal plug 6*a* is formed in the dummy substrate 165, the metal plugs 6*b* and 6*c* are formed in the left one of the chips 72, and the metal plugs 6*d* and 6*e* are formed in the middle one of the chips 72. The supporter 802 and the interconnect or metal trace 55*a*, in the interconnection layer 106, on the supporter 802 can be between two portions, lower than a horizontal level, at which a top surface of the interconnection layer 106 is positioned, of the metal plug 6*e*.

The metal interconnects 2 in the trenches 88*t* and the metal plugs 6*p* in the through vias 164*v* can be formed by the following steps. First, the adhesion/barrier layer 92 illustrated in FIG. 51 is formed on the layers 56, 106 and 114 exposed by the through vias 164*v*, on sidewalls of the through vias 164*v*, on sidewalls and bottoms of the trenches 88*t* (or on sidewalls of the trenches 88*t* in the polymer layer 88*b* and on a top surface of the insulating layer 88*a* at the bottoms of the trenches 88*t*), and on the interconnect or metal trace 55*a* that is on the supporter 802 by a physical vapor deposition (PVD) process, such as sputtering process or evaporation process, by a chemical-vapor deposition (CVD) process, or by other thin-film deposition processes, such as atomic layer deposition (ALD). Next, the seed layer 94 illustrated in FIG. 51 is formed on the adhesion/barrier layer 92, in the through vias 164*v*, and in the trenches 88*t* by a physical vapor deposition (PVD) process, such as sputtering process or evaporation process, by a chemical-vapor deposition (CVD) process, or by other thin-film deposition processes, such as atomic layer deposition (ALD). Next, the conduction layer 86 illustrated in FIG. 51 is formed on the seed layer 94, in the through vias 164*v*, and in the trenches 88*t* using a suitable process, such as electroplating process. Next, the layers 92, 94 and 86 are ground or polished by using a suitable process, such as chemical-mechanical-polishing (CMP) process, mechanical polishing process, mechanical grinding process, or a process including mechanical polishing and chemical etching, until the dielectric layer 88 has an exposed top surface 88*s*, over which there are no portions of the layers 92, 94 and 86, and the layers 92, 94 and 86 outside the trenches 88*t* are removed. Accordingly, the layers 92, 94 and 86 in the trenches 88*t* compose the metal interconnects 2, including the metal interconnects 2*a* and 2*b*, in the trenches 88*t*. The layers 92, 94 and 86 in the through vias 164*v* compose the metal plugs 6*p* in the through vias 164*v*, including the metal plugs 6*a*, 6*b*, 6*c*, 6*d* and 6*e* in the through vias 164*a*, 164*b*, 164*c*, 164*d* and 164*e*, respectively. The adhesion/barrier layer 92 and the seed layer 94 are at sidewalls and a bottom of the conduction layer 86 in the trenches 88*t*, and the sidewalls and the bottom of the conduction layer 86 in the trenches 88*t* are covered by the adhesion/barrier layer 92 and the seed layer 94.

In a first alternative, after the layers 92, 94 and 86 are ground or polished, the adhesion/barrier layer 92 can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 88*t* (or on the sidewalls of the trenches 88*t* in the polymer layer 88*b* and on the top surface of the insulating layer 88*a* at the bottoms of the trenches 88*t*), on the layers 56, 106 and 114 at the bottoms of the through vias 164*v*, on the sidewalls of the through vias 164*v*, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer, in the trenches 88*t*, and in the through vias 164*v*. The conduction layer 86 can be an electroplated copper layer on the single layer of copper or a titanium-copper alloy, in the trenches 88*t*, and in the through vias 164*v*. The electroplated copper layer in the trenches 88*t* has a thickness, e.g., between 0.1 and 5 micrometers, and preferably between 0.3 and 1.5 micrometers or between 0.5 and 3 micrometers, in case the dielectric layer 88, the trenches 88*t*, and the through vias 164*v* are formed as illustrated in FIGS. 161-167. Alternatively, the electroplated copper layer in the trenches 88*t* has a thickness, e.g., between 1 and 50 micrometers, and preferably between 2 and 30 micrometers or between 5 and 25 micrometers, in case the dielectric layer 88 composed of the layers 88*a* and 88*b*, the trenches 88*t*, and the through vias 164*v* are formed as illustrated in FIG. 167A.

In a second alternative, after the layers 92, 94 and 86 are ground or polished, the adhesion/barrier layer 92 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 88*t* (or on the sidewalls of the trenches 88*t* in the polymer layer 88*b* and on the top surface of the insulating layer 88*a* at the bottoms of the trenches 88*t*), on the layers 56, 106 and 114 at the bottoms of the through vias 164*v*, on the sidewalls of the through vias 164*v*, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer, in the trenches 88*t*, and in the through vias 164*v*. The conduction layer 86 can be an electroplated copper layer on the single layer of copper or a titanium-copper alloy, in the trenches 88*t*, and in the through vias 164*v*. The electroplated copper layer in the trenches 88*t* has a thickness, e.g., between 0.1 and 5 micrometers, and preferably between 0.3 and 1.5 micrometers or between 0.5 and 3 micrometers, in case the dielectric layer 88, the trenches 88*t*, and the through vias 164*v* are formed as illustrated in FIGS. 161-167. Alternatively, the electroplated copper layer in the trenches 88*t* has a thickness, e.g., between 1 and 50 micrometers, and preferably between 2 and 30 micrometers or between 5 and 25 micrometers, in case the dielectric layer 88 composed of the layers 88*a* and 88*b*, the trenches 88*t*, and the through vias 164*v* are formed as illustrated in FIG. 167A.

In a third alternative, after the layers 92, 94 and 86 are ground or polished, the adhesion/barrier layer 92 can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 88*t* (or on the sidewalls of the trenches 88*t* in the polymer layer 88*b* and on the top surface of the insulating layer 88*a* at the bottoms of the trenches 88*t*), on the layers 56, 106 and 114 at the bottoms of the through vias 164*v*, on the sidewalls of the through vias 164*v*, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer, in the trenches 88*t*, and in the through vias 164*v*. The conduction layer 86 can be an electroplated copper layer on the single layer of copper or a titanium-copper alloy, in the trenches 88*t*, and in the through vias 164*v*. The electroplated copper layer in the trenches 88*t* has a thickness, e.g., between 0.1 and 5 micrometers, and preferably between 0.3 and 1.5 micrometers or between 0.5 and 3 micrometers, in case the dielectric layer 88, the trenches 88*t*, and the through vias 164*v* are formed as illustrated in FIGS. 161-167. Alternatively, the electroplated copper layer in the trenches 88*t* has a thickness, e.g., between 1 and 50 micrometers, and preferably between 2 and 30 micrometers or between 5 and 25 micrometers, in case the dielectric layer 88 composed of the layers 88*a* and 88*b*, the trenches 88*t*, and the through vias 164*v* are formed as illustrated in FIG. 167A.

The exposed top surface 88*s* of the dielectric layer 88 can be substantially coplanar with the ground or polished surface 86*s* of the conduction layer 86 in the trenches 88*t*, and the surfaces 86*s* and 88*s* can be substantially flat. After the layers 92, 94 and 86 are ground or polished, the dielectric layer 88 may have a thickness, between the exposed top surface 88s and the surface 96s or 165s, e.g., between 1 and 10 micrometers, and preferably between 1 and 3 micrometers, in case the dielectric layer 88, the trenches 88t, and the through vias 164v are formed as illustrated in FIGS. 161-167. Alternatively, after the layers 92, 94 and 86 are ground or polished, the polymer layer 88b of the dielectric layer 88 may have a thickness, between the exposed top surface 88s of the polymer layer 88b and the top surface of the insulating layer 88a, e.g., between 1 and 50 micrometers, and preferably between 2 and 30 micrometers or between 5 and 25 micrometers, in case the dielectric layer 88 composed of the layers 88a and 88b, the trenches 88t, and the through vias 164v are formed as illustrated in FIG. 167A.

Each of the metal plugs 6p in the chips 72 passes through one of the insulating rings 500a in the chips 72. For example, the metal plugs 6b and 6c in the left one of the chips 72 pass through the insulating rings 500a in the left one of the chips 72, and the metal plugs 6d and 6e in the middle one of the chips 72 pass through the insulating rings 500a in the middle one of the chips 72. Specifically, each of the metal plugs 6b and 6c passes through the semiconductor substrate 96 of the left one of the chips 72 and is enclosed by one of the insulating rings 500a in the left one of the chips 72, and each of the metal plugs 6d and 6e passes through the semiconductor substrate 96 of the middle one of the chips 72 and is enclosed by one of the insulating rings 500a in the middle one of the chips 72. The semiconductor substrate 96 of the left one of the chips 72 has a portion on an inner surface of the insulating ring 500a enclosing the metal plug 6b, and the semiconductor substrate 96 of the middle one of the chips 72 has a portion on an inner surface of the insulating ring 500a enclosing the metal plug 6d. The insulating ring 500a enclosing the metal plug 6c is at the sidewall of the metal plug 6c and contacts the metal plug 6c, and the insulating ring 500a enclosing the metal plug 6e is at the sidewall of the metal plug 6e and contacts the metal plug 6e. For more detailed description about the metal plugs 6p (including the metal plugs 6a-6e) and the metal interconnects 2 (including the metal interconnects 2a and 2b) shown in FIG. 169, please refer to the illustration in FIG. 52.

Alternatively, the element 72 not only can indicate a chip, but also can indicate a wafer. When the element 72 is a wafer, the element 68 can be another wafer. Thereby, the process illustrated in the invention can be employed to the wafer-to-wafer bonding.

Figure 170:
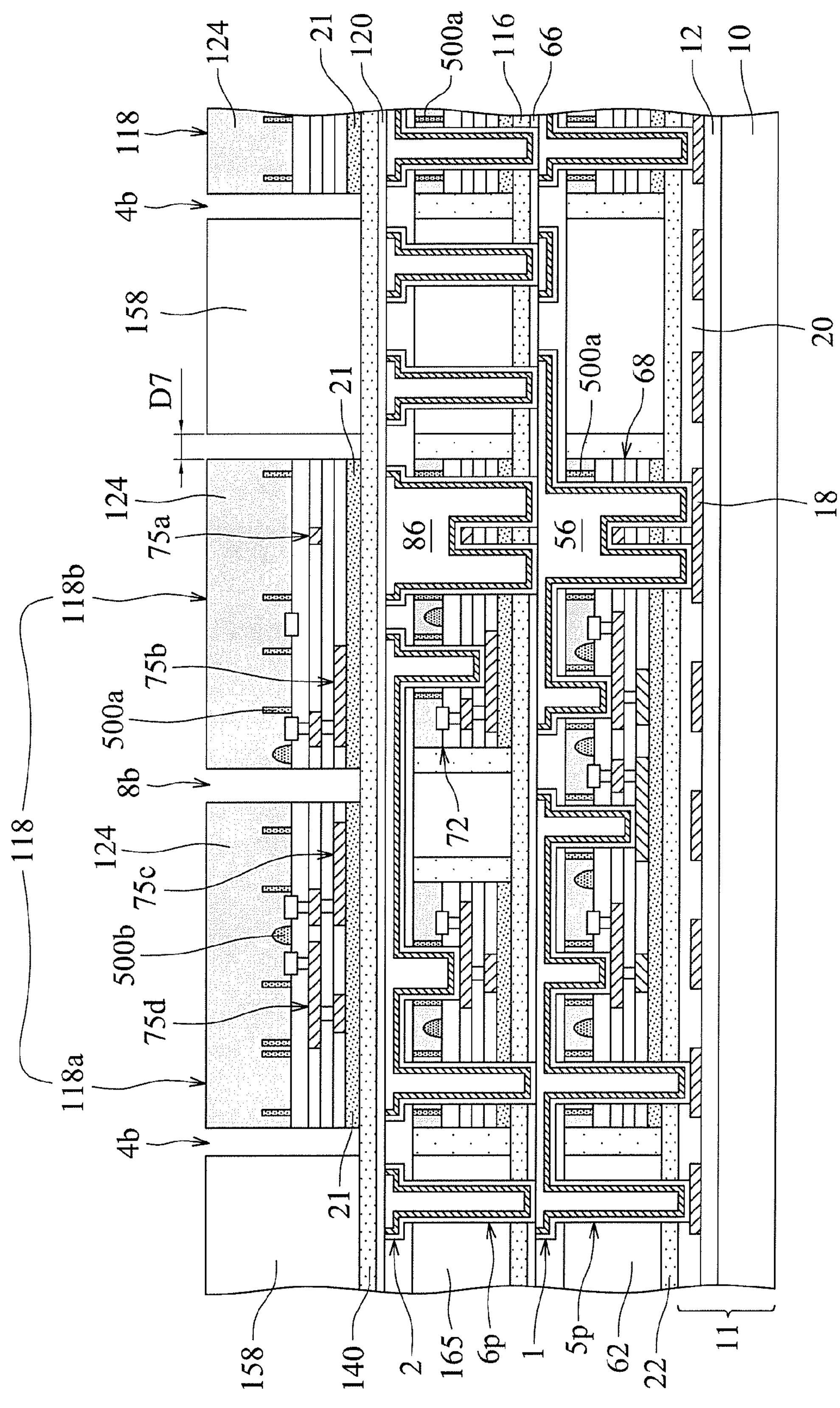

Referring to FIG. 170, after forming the structure illustrated in FIG. 169, the insulating or dielectric layer 120 illustrated in FIG. 53 is formed on the ground or polished surface 86s of the conduction layer 86 and on the exposed top surface 88s of the dielectric layer 88. Next, multiple chips 118, each of which is like the chip 118a or 118b illustrated in FIG. 141L, and the previously described dummy substrate(s) 158 are placed over the layer 140, which can be referred to as the steps illustrated in FIGS. 54-59. The arrangement of placing the chips 118 and the dummy substrate(s) 158 over the insulating or dielectric layer 120, in the embodiment, can be referred to as that of placing the chips 118 and the dummy substrate(s) 158 over the insulating or dielectric layer 120 as illustrated in FIG. 58 or 59.

Figure 171:
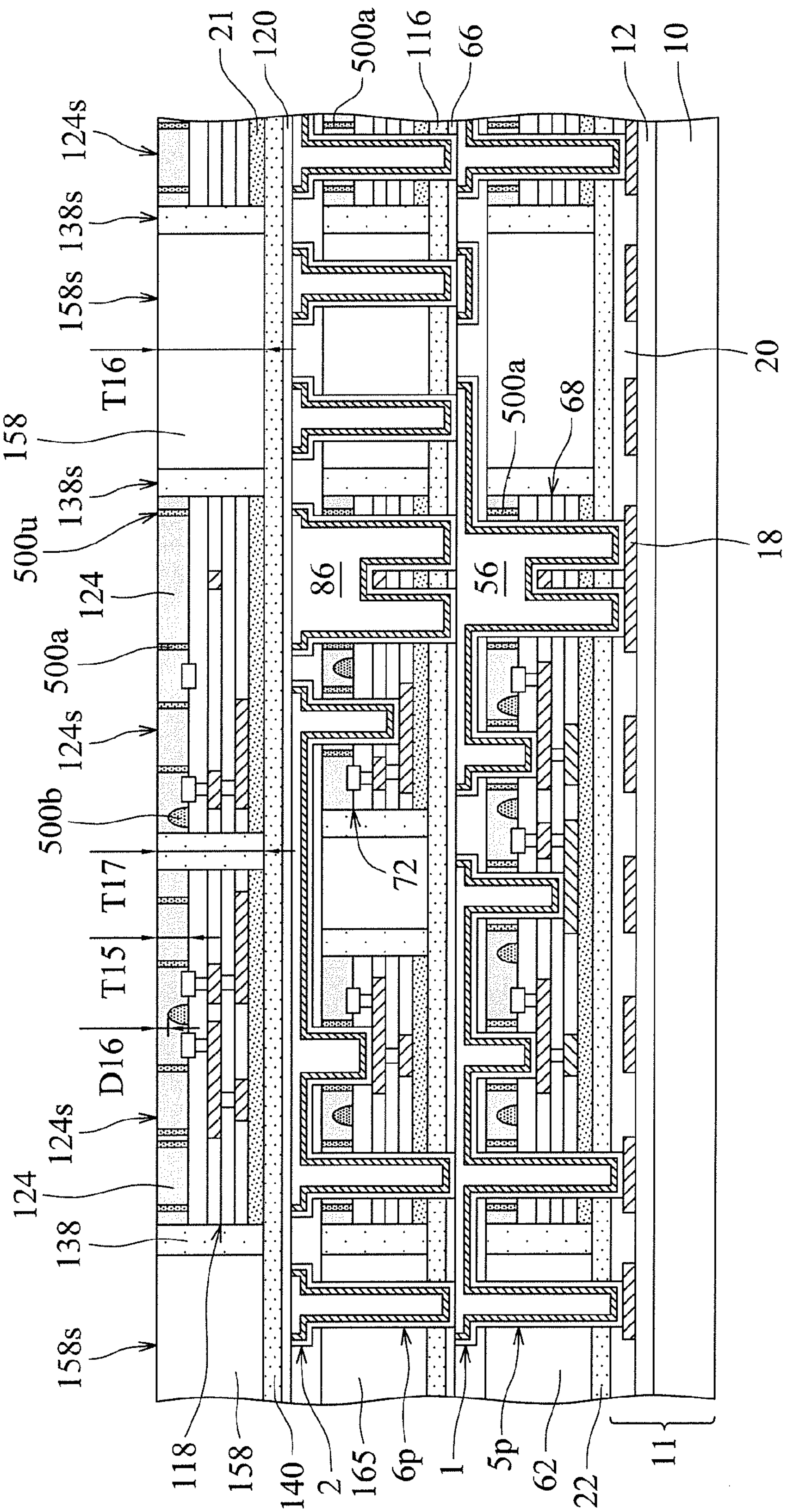

Next, referring to FIG. 171, an encapsulation/gap filling material 138 is formed on a backside of the semiconductor substrate 124 of each chip 118, on the dummy substrate(s) 158, and in the gaps 4b and 8b. Next, the encapsulation/gap filling material 138, the backside of the semiconductor substrate 124 of each chip 118, and the dummy substrate(s) 158 are ground or polished by a suitable process, such as mechanical grinding process, mechanical polishing process, chemical-mechanical-polishing (CMP) process, or a process including mechanical polishing and chemical etching, until all of the insulating rings 500a in the chips 118 have exposed bottom surfaces 500u, over which there are no portions of the semiconductor substrates 124. The steps of forming the encapsulation/gap filling material 138 and grinding or polishing the encapsulation/gap filling material 138, the backside of the semiconductor substrate 124 of each chip 118, and the dummy substrate(s) 158 illustrated in FIG. 171 can be referred to as the steps of forming the encapsulation/gap filling material 64 and grinding or polishing the encapsulation/gap filling material 64, the backside of the semiconductor substrate 58 of each chip 68, and the dummy substrate(s) 62 as illustrated in FIGS. 143-146. The encapsulation/gap filling material 138 can be polysilicon, silicon oxide, or a polymer.

Accordingly, the semiconductor substrate 124 of each of the chips 118 can be thinned to a thickness T15, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 118, after the grinding or polishing process, the insulating rings 500a and the semiconductor substrate 124 may have the same thickness T15. Preferably, each of the chips 118, after the grinding or polishing process, may have a thickness, e.g., between 3 and 105 micrometers, and preferably between 3 and 30 micrometers or between 5 and 25 micrometers.

After the grinding or polishing process, the dummy substrate(s) 158 can be thinned to a thickness T16, e.g., between 3 and 100 micrometers, and preferably between 3 and 30 micrometers or between 5 and 25 micrometers, and the encapsulation/gap filling material 138 remaining in the gaps 4b and 8b may have a vertical thickness T17, e.g., between 3 and 100 micrometers, and preferably between 3 and 30 micrometers or between 5 and 25 micrometers. The ground or polished surface 124s of the semiconductor substrate 124, at the backside of each chip 118, and the ground or polished surface(s) 158s of the dummy substrate(s) 158 can be substantially flat and not covered by the encapsulation/gap filling material 138. The ground or polished surface(s) 158s may be substantially coplanar with the ground or polished surface 124s of each chip 118, with the ground or polished surface 138s of the encapsulation/gap filling material 138 in the gaps 4b and 8b, and with the exposed bottom surfaces 500u of the insulating rings 500a in the chips 118. In each chip 118, a vertical distance D16 between the ground or polished surface 124s of the semiconductor substrate 124 and the bottom of the shallow trench isolation 500b can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Figure 172:
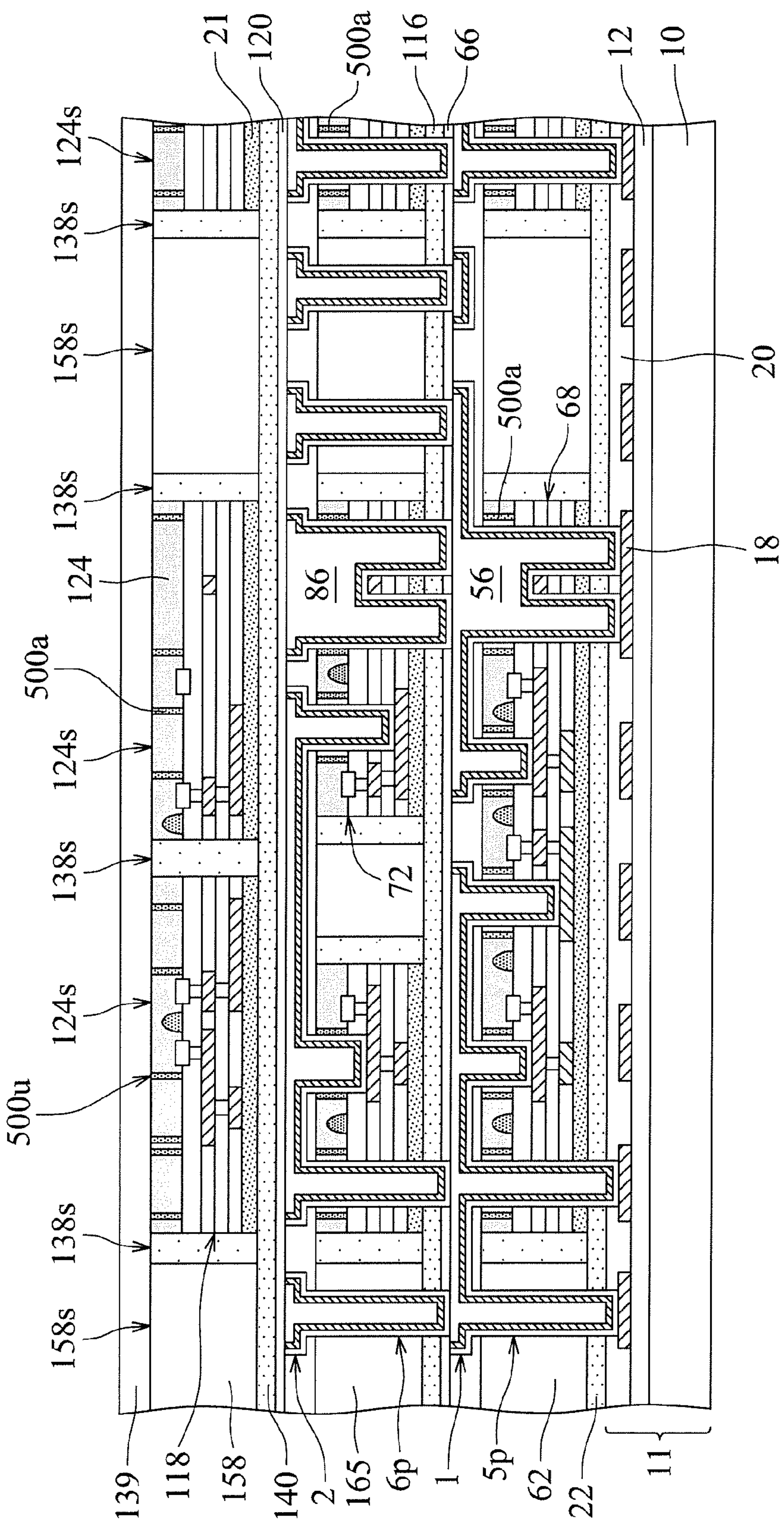

Referring to FIG. 172, after forming the structure illustrated in FIG. 171, the dielectric layer 139 illustrated in FIG. 64 is formed on the surface 124s of the semiconductor substrate 124 of each chip 118, on the surface(s) 158s of the dummy substrate(s) 158, on the exposed bottom surfaces 500u of the insulating rings 500a in the chips 118, and on the surface 138s of the encapsulation/gap filling material 138.

Figure 173:
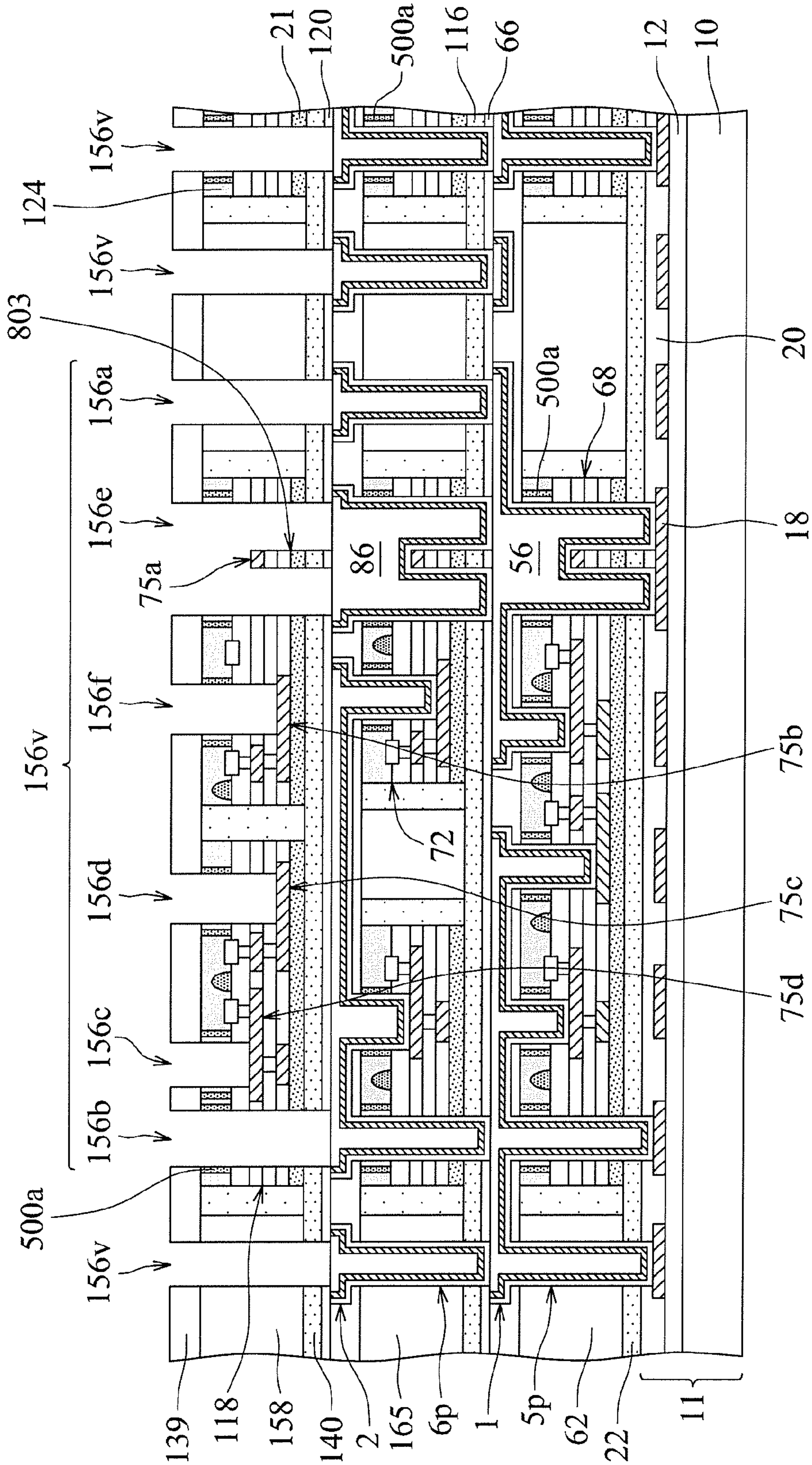

Next, referring to FIG. 173, multiple through vias 156v, including through vias 156a, 156b, 156c, 156d, 156e and 156f, are formed in the chips 118 and in the dummy substrate(s) 158, exposing the conduction layer 86 of the metal interconnects 2 and exposing the layers 17 and 19 of the chips 118, which can be referred to as the steps illustrated in FIG. 65, but, in the embodiment, forming the through vias 156*v* (such as the vias 156*b*-156*f*) in the chips 118 includes etching through the semiconductor substrates 124 enclosed by the insulating rings 500*a* in the chips 118. Each of the through vias 156*v* in the chips 118 passes through one of the insulating rings 500*a* in the chips 118. For example, the through vias 156*b*, 156*c* and 156*d* in the left one of the chips 118 pass through the insulating rings 500*a* in the left one of the chips 118 and the through vias 156*e* and 156*f* in the middle one of the chips 118 pass through the insulating rings 500*a* in the middle one of the chips 118.

Forming the through vias 156*b*, 156*c*, 156*d*, 156*e* and 156*f* includes a process of etching through the semiconductor substrates 124 enclosed by the insulating rings 500*a*. Particularly, forming the through via 156*b* includes a process of etching away the whole portion, enclosed by one of the insulating rings 500*a*, of the semiconductor substrate 124. Accordingly, the through vias 156*b*, 156*c* and 156*d* pass through the semiconductor substrate 124 in the left one of the chips 118 and are enclosed by the insulating rings 500*a* in the left one of the chips 118, and the through vias 156*e* and 156*f* pass through the semiconductor substrate 124 in the middle one of the chips 118 and are enclosed by the insulating rings 500*a* in the middle one of the chips 118. The semiconductor substrate 124 of the left one of the chips 118 has portions on inner surfaces of the insulating rings 500*a* enclosing the through vias 156*c* and 156*d* in the left one of the chips 118, and the semiconductor substrate 124 of the middle one of the chips 118 has portions on inner surfaces of the insulating rings 500*a* enclosing the through vias 156*e* and 156*f* in the middle one of the chips 118. The insulating ring 500*a* enclosing the through via 156*b* is at the sidewall of the through via 156*b* and exposed by the through via 156*b*. The insulating ring 500*a* enclosing the through via 156*d* has a portion at the sidewall of the through via 156*d* and exposed by the through via 156*d*. The insulating ring 500*a* enclosing the through via 156*f* has a portion at the sidewall of the through via 156*f* and exposed by the through via 156*f*.

Each of the through vias 156*v*, such as the through via 156*a*, 156*b*, 156*c*, 156*d*, 156*e*, or 156*f*, may have a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers. For more detailed description about the through vias 156*v*, such as the through vias 156*a*-156*f*, please refer to the illustration in FIG. 65.

As shown in FIG. 173, a supporter 803 provided by the insulating or dielectric layer 120, the layer 140, and the layers 21, 78 and 28 of the middle one of the chips 118 is between the conduction layer 86 of the metal interconnect 2*b* and the interconnect or metal trace 75*a* in the interconnection layer 17 exposed by the through via 156*e* for the purpose of supporting the exposed interconnect or metal trace 75*a*. The supporter 803 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers.

Figure 174:
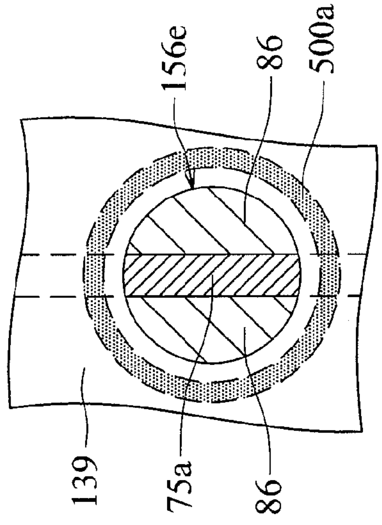

FIG. 174 is a first example of a schematic top perspective view showing the through via 156*e*, one of the insulating rings 500*a* in the middle one of the chips 118, and the interconnect or metal trace 75*a* in the middle one of the chips 118 as illustrated in FIG. 173. The schematic top perspective view shown in FIG. 174 is similar to the schematic top perspective view shown in FIG. 66 except that the through via 156*e* shown in FIG. 174 is formed within one of the insulating rings 500*a*. For more detailed description about the through via 156*e* and the interconnect or metal trace 75*a* as shown in FIGS. 173 and 174, please refer to the illustration in FIGS. 65 and 66.

Figure 175:
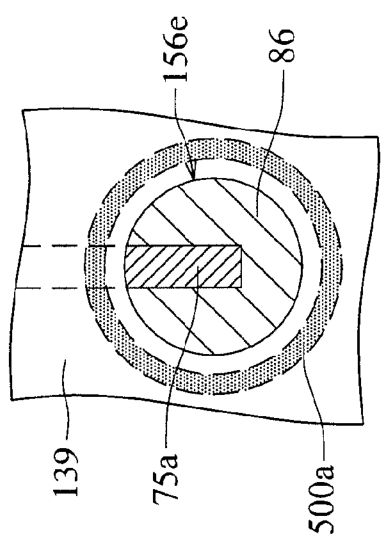

FIG. 175 is a second example of a schematic top perspective view showing the through via 156*e*, one of the insulating rings 500*a* in the middle one of the chips 118, and the interconnect or metal trace 75*a* as illustrated in FIG. 173. The schematic top perspective view shown in FIG. 175 is similar to the schematic top perspective view shown in FIG. 67 except that the through via 156*e* shown in FIG. 175 is formed within one of the insulating rings 500*a*. For more detailed description about the through via 156*e* and the interconnect or metal trace 75*a* as shown in FIGS. 173 and 175, please refer to the illustration in FIGS. 65 and 67.

Figure 176:
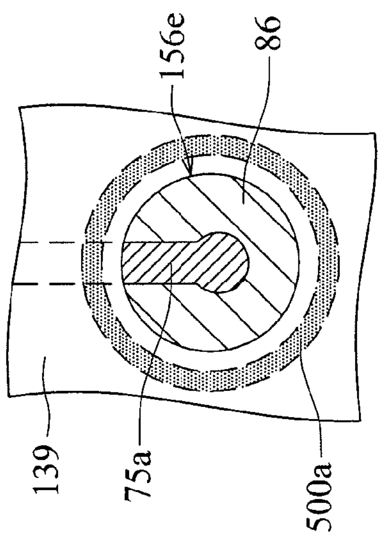

FIG. 176 is a third example of a schematic top perspective view showing the through via 156*e*, one of the insulating rings 500*a* in the middle one of the chips 118, and the interconnect or metal trace 75*a* as illustrated in FIG. 173. The schematic top perspective view shown in FIG. 176 is similar to the schematic top perspective view shown in FIG. 68 except that the through via 156*e* shown in FIG. 176 is formed within one of the insulating rings 500*a*. For more detailed description about the through via 156*e* and the interconnect or metal trace 75*a* as shown in FIGS. 173 and 176, please refer to the illustration in FIGS. 65 and 68.

Figure 177:
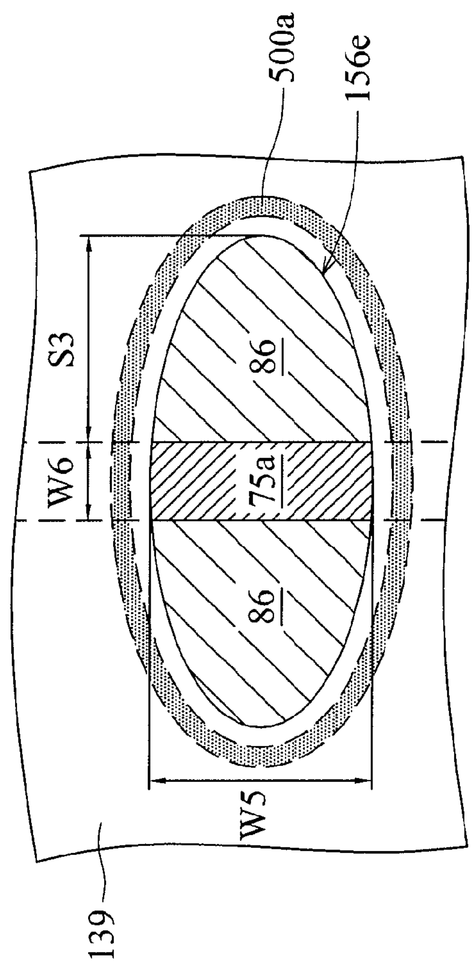

FIG. 177 is a fourth example of a schematic top perspective view showing the through via 156*e*, one of the insulating rings 500*a* in the middle one of the chips 118, and the interconnect or metal trace 75*a* as illustrated in FIG. 173. The schematic top perspective view shown in FIG. 177 is similar to the schematic top perspective view shown in FIG. 66A except that the through via 156*e* shown in FIG. 177 is formed within one of the insulating rings 500*a*. For more detailed description about the through via 156*e* and the interconnect or metal trace 75*a* as shown in FIG. 177, please refer to the illustration in FIG. 66A.

Figure 178:
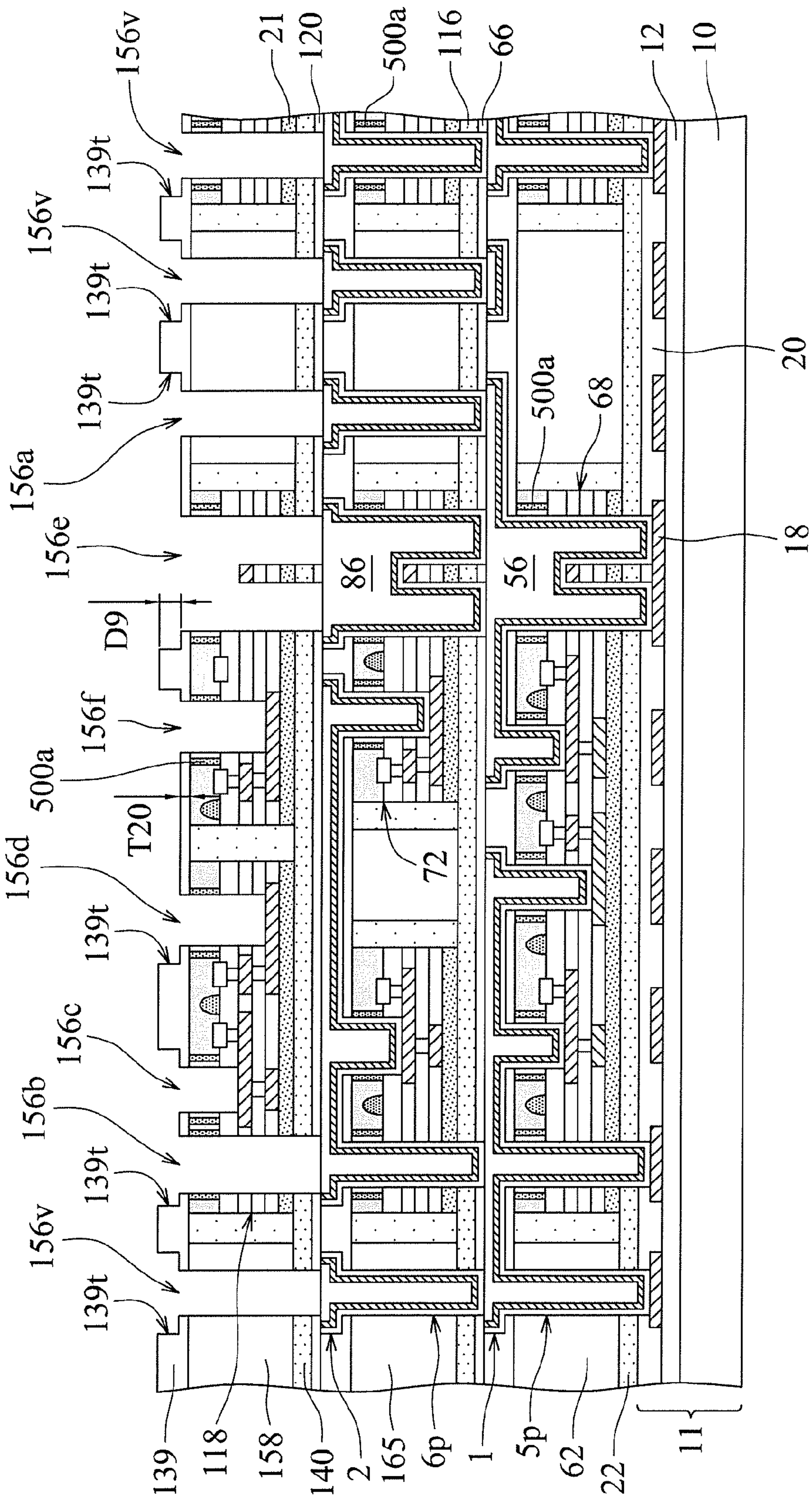
Figure 179:
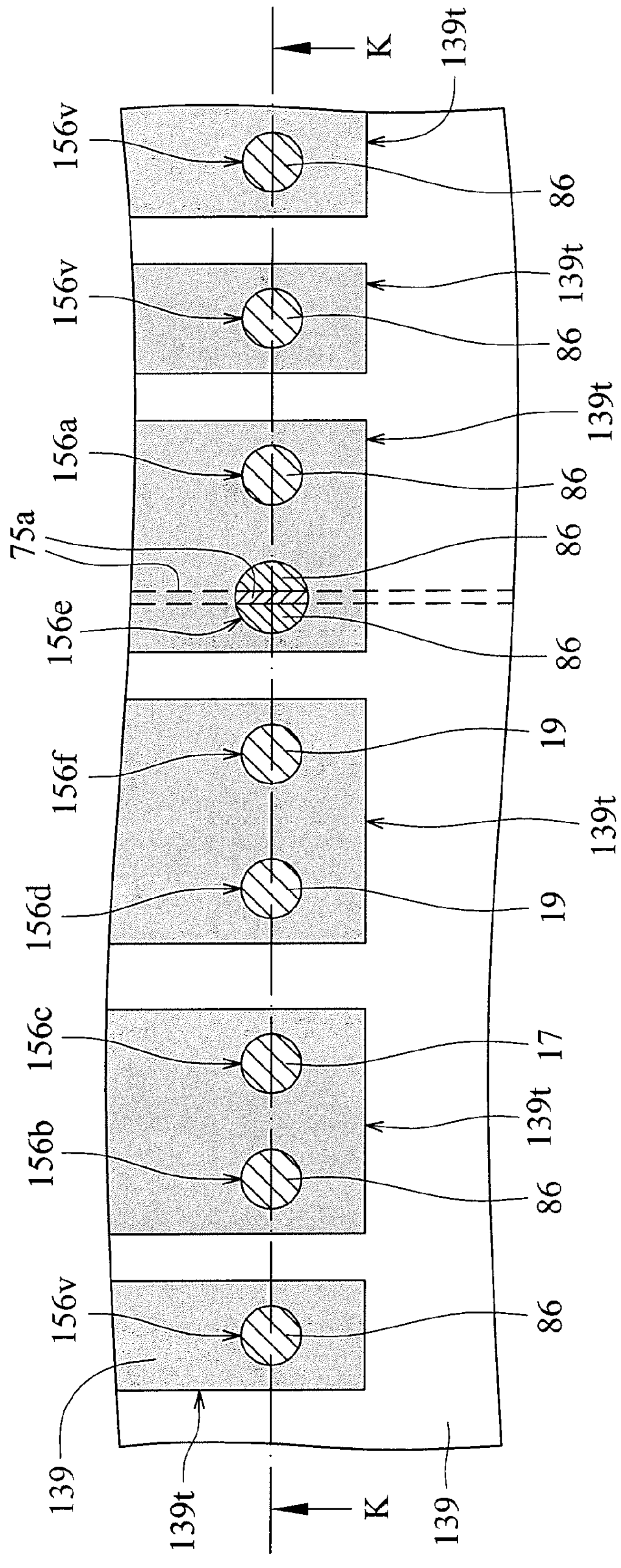

Referring to FIG. 178, after forming the structure illustrated in FIG. 173, multiple trenches 139*t* are formed in the dielectric layer 139. The trenches 139*t* in the dielectric layer 139 have a depth D9, e.g., between 0.1 and 5 micrometers, and preferably between 0.5 and 3 micrometers. The dielectric layer 139 under the trenches 139*t* has a remaining thickness T20, e.g., between 0.1 and 5 micrometers, and preferably between 0.3 and 5 micrometers, between 0.5 and 2 micrometers, between 0.1 and 3 micrometers, or between 0.2 and 1.5 micrometers. The steps of forming the trenches 139*t* in the dielectric layer 139 can be referred to as the steps of forming the trenches 60*t* in the dielectric layer 60 as illustrated in FIGS. 153-155. The trenches 139*t* formed in the dielectric layer 139 are used to provide spaces having inter-chip interconnects and intra-chip interconnects formed therein. FIG. 179 is an example of a schematic top perspective view showing the trenches 139*t* and the through vias 156*v* shown in FIG. 178, and FIG. 178 is a cross-sectional view cut along the line K-K shown in FIG. 179.

Alternatively, the trenches 139*t* illustrated in FIG. 178 can be formed in the dielectric layer 139 before the through vias 156*v* illustrated in FIG. 173 are formed in the chips 118 and in the dummy substrate(s) 158. Specifically, after the dielectric layer 139 is formed on the surfaces 124*s*, 138*s*, 158*s*, and 500*u* as shown in FIG. 172, the trenches 139*t* illustrated in FIG. 178 are formed in the dielectric layer 139, and then the through vias 156*v* illustrated in FIG. 173 are formed in the chips 118 and in the dummy substrate(s) 158, exposing the conduction layer 86 of the metal interconnects 2 and exposing the layers 17 and 19 of the chips 118.

Figure 178A:
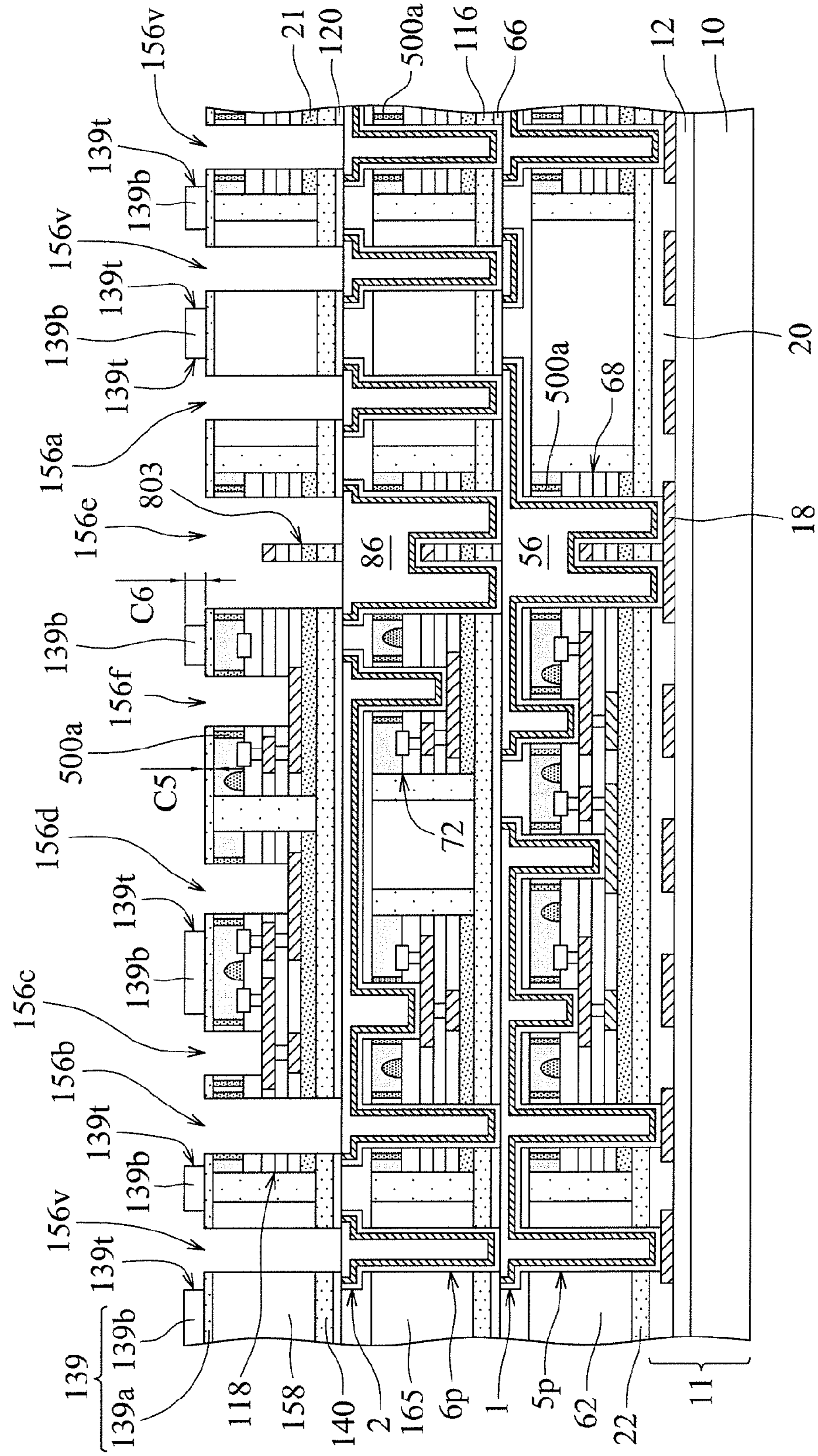

Alternatively, referring to FIG. 178A, the dielectric layer 139, the trenches 139*t*, and the through vias 156*v* as shown in FIG. 178 can be formed by the following steps. After forming the structure illustrated in FIG. 171, an insulating layer 139*a*, such as a layer of silicon oxide, silicon nitride, silicon oxynitride, silicon carbon nitride, or silicon oxycarbide, having a thickness C5, e.g., between 0.1 and 5 micrometers, and preferably between 0.2 and 1.5 micrometers or between 0.15 and 2 micrometers, is formed on the surface 124*s* of the semiconductor substrate 124 of each chip 118, on the surface(s) 158*s* of the dummy substrate(s) 158, on the exposed bottom surfaces 500*u* of the insulating rings 500*a* in the chips 118, and on the surface 138*s* of the encapsulation/gap filling material 138 as shown in FIG. 171.

Next, a polymer layer 139*b*, such as a layer of polyimide, benzocyclobutene (BCB), epoxy, polybenzoxazole (PBO), or poly-phenylene oxide (PPO), is formed on the insulating layer 139*a* using a suitable process, such as spin coating process, screen printing process, or lamination process. Next, an exposure process and a development process can be employed to form the trenches 139*t*, exposing the insulating layer 139*a*, in the polymer layer 139*b*. A 1X stepper or 1X contact aligner can be used to expose the polymer layer 139*b* during the exposure process. Next, the polymer layer 139*b* is cured or heated at a temperature between 150 degrees centigrade and 400 degrees centigrade, and preferably between 180 degrees centigrade and 250 degrees centigrade. The polymer layer 139*b* after being cured or heated has a thickness C6, e.g., between 1 and 50 micrometers, and preferably between 2 and 30 micrometers or between 5 and 25 micrometers.

Next, a photoresist layer is formed on the insulating layer 139*a* exposed by the trenches 139*t* and on the polymer layer 139*b*, and multiple openings in the photoresist layer expose the insulating layer 139*a* at bottoms of the trenches 139*t*. Next, the insulating layer 139*a* under the openings in the photoresist layer is removed using a suitable process, such as anisotropic plasma etching process. Next, the dummy substrate(s) 158 under the openings in the photoresist layer and the chips 118 under the openings in the photoresist layer are etched away until predetermined regions of the layers 17 and 19 in the chips 118 and predetermined regions of the conduction layer 86 of the metal interconnects 2 are exposed by the openings in the photoresist layer. Next, the photoresist layer is removed by using, e.g., an organic chemical. Accordingly, the through vias 156*v*, including the through vias 156*a*, 156*b*, 156*c*, 156*d*, 156*e* and 156*f*, are formed in the chips 118 and in the dummy substrate(s) 158, exposing the conduction layer 86 of the metal interconnects 2 and exposing the layers 17 and 19 of the chips 118. The specifications of the through vias 156*v* and the supporter 803 shown in FIG. 178A can be referred to as the specifications of the through vias 156*v* and the supporter 803, respectively, illustrated in FIGS. 173-177.

Accordingly, using the above-mentioned steps, the above-mentioned dielectric layer 139 also can be provided with the insulating layer 139*a* and the polymer layer 139*b* on the insulating layer 139*a*. The trenches 139*t* in the polymer layer 139*b* expose the insulating layer 139*a* and are used to provide spaces having inter-chip interconnects and intra-chip interconnects formed therein. The through vias 156*v* are formed under the trenches 139*t*. Also, FIG. 179 can be an example of a schematic top perspective view showing the trenches 139*t* and the through vias 156*v* shown in FIG. 178A, and FIG. 178A also can be a cross-sectional view cut along the line K-K shown in FIG. 179.

Figure 180:
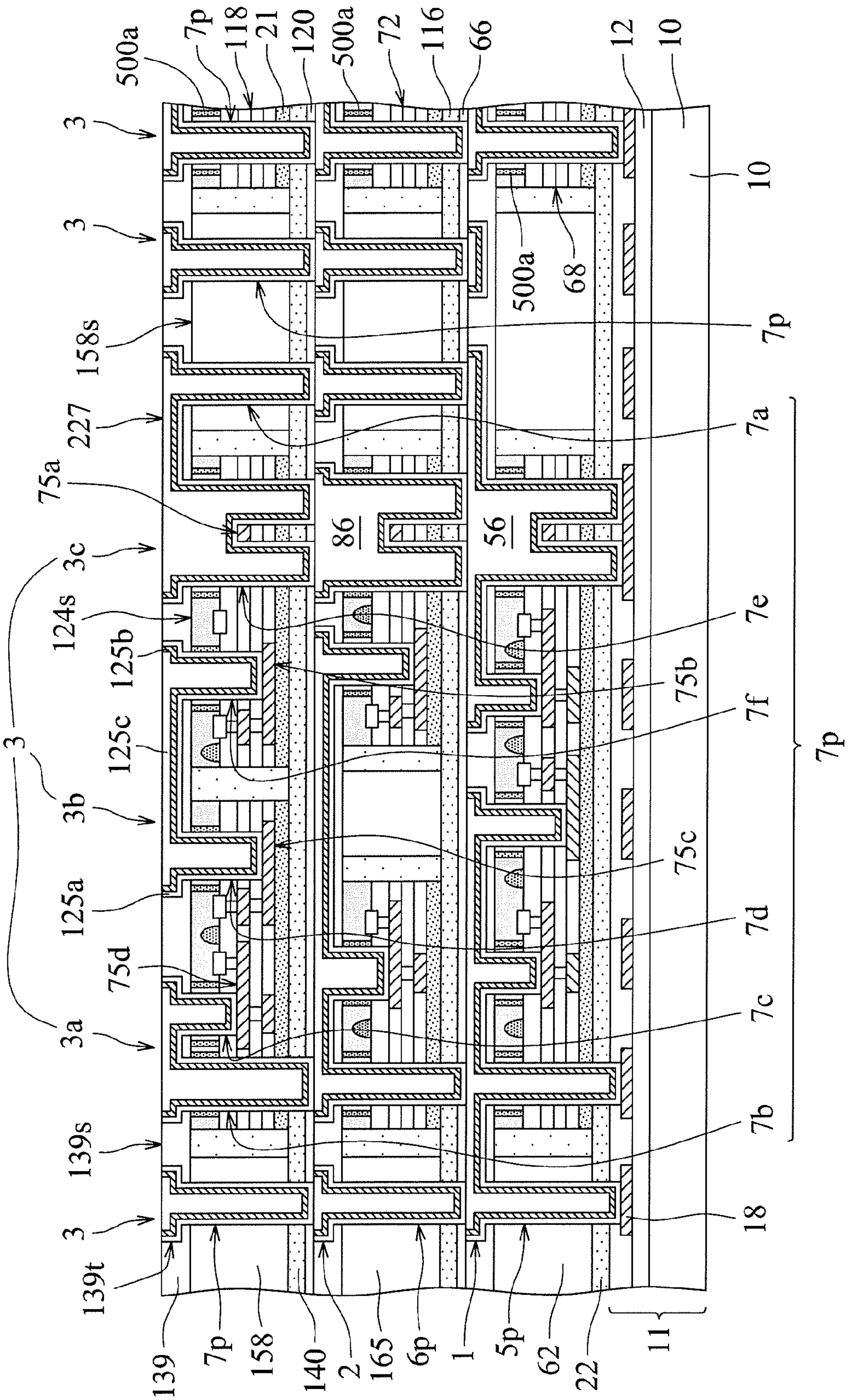

Referring to FIG. 180, after forming the structure illustrated in FIG. 178 or in FIG. 178A, multiple metal interconnects (or damascene metal traces) 3, including metal interconnects (or damascene metal traces) 3*a*, 3*b* and 3*c*, are formed in the trenches 139*t*, and multiple metal plugs (or metal vias) 7*p* are formed in the through vias 156*v*. The metal plugs 7*p* include metal plugs (or metal vias) 7*a*, 7*b*, 7*c*, 7*d*, 7*e* and 7*f* in the through vias 156*a*, 156*b*, 156*c*, 156*d*, 156*e* and 156*f*, respectively. The metal plug 7*a* is formed in the dummy substrate 158, the metal plugs 7*b*, 7*c* and 7*d* are formed in the left one of the chips 118, and the metal plugs 7*e* and 7*f* are formed in the middle one of the chips 118. The supporter 803 and the interconnect or metal trace 75*a*, in the interconnection layer 17, on the supporter 803 can be between two portions, lower than a horizontal level, at which a top surface of the interconnection layer 17 is positioned, of the metal plug 7*e*.

The metal interconnects 3 in the trenches 139*t* and the metal plugs 7*p* in the through vias 156*v* can be formed by the following steps. First, the adhesion/barrier layer 125*a* illustrated in FIG. 75 is formed on the layers 17, 19 and 86 exposed by the through vias 156*v*, on sidewalls of the through vias 156*v*, on sidewalls and bottoms of the trenches 139*t* (or on sidewalls of the trenches 139*t* in the polymer layer 139*b* and on a top surface of the insulating layer 139*a* at the bottoms of the trenches 139*t*), and on the interconnect or metal trace 75*a* that is on the supporter 803 by a physical vapor deposition (PVD) process, such as sputtering process or evaporation process, by a chemical-vapor deposition (CVD) process, or by other thin-film deposition processes, such as atomic layer deposition (ALD). Next, the seed layer 125*b* illustrated in FIG. 75 is formed on the adhesion/barrier layer 125*a*, in the through vias 156*v*, and in the trenches 139*t* by a physical vapor deposition (PVD) process, such as sputtering process or evaporation process, by a chemical-vapor deposition (CVD) process, or by other thin-film deposition processes, such as atomic layer deposition (ALD). Next, the conduction layer 125*c* illustrated in FIG. 75 is formed on the seed layer 125*b*, in the through vias 156*v*, and in the trenches 139*t* using a suitable process, such as electroplating process. Next, the layers 125*a*, 125*b* and 125*c* are ground or polished by using a suitable process, such as chemical-mechanical-polishing (CMP) process, mechanical polishing process, mechanical grinding process, or a process including mechanical polishing and chemical etching, until the dielectric layer 139 has an exposed top surface 139*s*, over which there are no portions of the layers 125*a*, 125*b* and 125*c*, and the layers 125*a*, 125*b* and 125*c* outside the trenches 139*t* are removed. Accordingly, the layers 125*a*, 125*b* and 125*c* in the trenches 139*t* compose the metal interconnects 3, including the metal interconnects 3*a*, 3*b* and 3*c*, in the trenches 139*t*. The layers 125*a*, 125*b* and 125*c* in the through vias 156*v* compose the metal plugs 7*p* in the through vias 156*v*, including the metal plugs 7*a*, 7*b*, 7*c*, 7*d*, 7*e* and 7*f* in the through vias 156*a*, 156*b*, 156*c*, 156*d*, 156*e* and 156*f*, respectively. The adhesion/barrier layer 125*a* and the seed layer 125*b* are at sidewalls and a bottom of the conduction layer 125*c* in the trenches 139*t*, and the sidewalls and the bottom of the conduction layer 125*c* in the trenches 139*t* are covered by the adhesion/barrier layer 125*a* and the seed layer 125*b*.

In a first alternative, after the layers 125*a*, 125*b* and 125*c* are ground or polished, the adhesion/barrier layer 125*a* can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 139*t* (or on the sidewalls of the trenches 139*t* in the polymer layer 139*b* and on the top surface of the insulating layer 139*a* at the bottoms of the trenches 139*t*), on the layers 17, 19 and 86 at the bottoms of the through vias 156*v*, on the sidewalls of the through vias 156*v*, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer, in the trenches 139*t*, and in the through vias 156*v*. The conduction layer 125*c* can be an electroplated copper layer on the single layer of copper or a titanium-copper alloy, in the trenches 139*t*, and in the through vias 156*v*. The electroplated copper layer in the trenches 139*t* has a thickness, e.g., between 0.1 and 5 micrometers, and preferably between 0.3 and 1.5 micrometers or between 0.5 and 3 micrometers, in case the dielectric layer 139, the trenches 139*t*, and the through vias 156*v* are formed as illustrated in FIGS. 172-178. Alternatively, the electroplated copper layer in the trenches 139*t* has a thickness, e.g., between 1 and 50 micrometers, and preferably between 2 and 30 micrometers or between 5 and 25 micrometers, in case the dielectric layer 139 composed of the layers 139*a* and 139*b*, the trenches 139*t*, and the through vias 156*v* are formed as illustrated in FIG. 178A.

In a second alternative, after the layers 125*a*, 125*b* and 125*c* are ground or polished, the adhesion/barrier layer 125*a* can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 139*t* (or on the sidewalls of the trenches 139*t* in the polymer layer 139*b* and on the top surface of the insulating layer 139*a* at the bottoms of the trenches 139*t*), on the layers 17, 19 and 86 at the bottoms of the through vias 156*v*, on the sidewalls of the through vias 156*v*, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer, in the trenches 139*t*, and in the through vias 156*v*. The conduction layer 125*c* can be an electroplated copper layer on the single layer of copper or a titanium-copper alloy, in the trenches 139*t*, and in the through vias 156*v*. The electroplated copper layer in the trenches 139*t* may have a thickness, e.g., between 0.1 and 5 micrometers, and preferably between 0.3 and 1.5 micrometers or between 0.5 and 3 micrometers. The electroplated copper layer in the trenches 139*t* has a thickness, e.g., between 0.1 and 5 micrometers, and preferably between 0.3 and 1.5 micrometers or between 0.5 and 3 micrometers, in case the dielectric layer 139, the trenches 139*t*, and the through vias 156*v* are formed as illustrated in FIGS. 172-178. Alternatively, the electroplated copper layer in the trenches 139*t* has a thickness, e.g., between 1 and 50 micrometers, and preferably between 2 and 30 micrometers or between 5 and 25 micrometers, in case the dielectric layer 139 composed of the layers 139*a* and 139*b*, the trenches 139*t*, and the through vias 156*v* are formed as illustrated in FIG. 178A.

In a third alternative, after the layers 125*a*, 125*b* and 125*c* are ground or polished, the adhesion/barrier layer 125*a* can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 139*t* (or on the sidewalls of the trenches 139*t* in the polymer layer 139*b* and on the top surface of the insulating layer 139*a* at the bottoms of the trenches 139*t*), on the layers 17, 19 and 86 at the bottoms of the through vias 156*v*, on the sidewalls of the through vias 156*v*, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer, in the trenches 139*t*, and in the through vias 156*v*. The conduction layer 125*c* can be an electroplated copper layer on the single layer of copper or a titanium-copper alloy, in the trenches 139*t*, and in the through vias 156*v*. The electroplated copper layer in the trenches 139*t* may have a thickness, e.g., between 0.1 and 5 micrometers, and preferably between 0.3 and 1.5 micrometers or between 0.5 and 3 micrometers. The electroplated copper layer in the trenches 139*t* has a thickness, e.g., between 0.1 and 5 micrometers, and preferably between 0.3 and 1.5 micrometers or between 0.5 and 3 micrometers, in case the dielectric layer 139, the trenches 139*t*, and the through vias 156*v* are formed as illustrated in FIGS. 172-178. Alternatively, the electroplated copper layer in the trenches 139*t* has a thickness, e.g., between 1 and 50 micrometers, and preferably between 2 and 30 micrometers or between 5 and 25 micrometers, in case the dielectric layer 139 composed of the layers 139*a* and 139*b*, the trenches 139*t*, and the through vias 156*v* are formed as illustrated in FIG. 178A.

The exposed top surface 139*s* of the dielectric layer 139 can be substantially coplanar with the ground or polished surface 227 of the conduction layer 125*c* in the trenches 139*t*, and the surfaces 139*s* and 227 can be substantially flat. After the layers 125*a*, 125*b* and 125*c* are ground or polished, the dielectric layer 139 may have a thickness, between the exposed top surface 139*s* and the surface 124*s* or 158*s*, e.g., between 1 and 10 micrometers, and preferably between 1 and 3 micrometers, in case the dielectric layer 139, the trenches 139*t*, and the through vias 156*v* are formed as illustrated in FIGS. 172-178. Alternatively, after the layers 125*a*, 125*b* and 125*c* are ground or polished, the polymer layer 139*b* of the dielectric layer 139 may have a thickness, between the exposed top surface 139*s* of the polymer layer 139*b* and the top surface of the insulating layer 139*a*, e.g., between 1 and 50 micrometers, and preferably between 2 and 30 micrometers or between 5 and 25 micrometers, in case the dielectric layer 139 composed of the layers 139*a* and 139*b*, the trenches 139*t*, and the through vias 156*v* are formed as illustrated in FIG. 178A.

Each of the metal plugs 7*p* in the chips 118 passes through one of the insulating rings 500*a* in the chips 118. For example, the metal plugs 7*b*, 7*c* and 7*d* in the left one of the chips 118 pass through the insulating rings 500*a* in the left one of the chips 118, and the metal plugs 7*e* and 7*f* in the middle one of the chips 118 pass through the insulating rings 500*a* in the middle one of the chips 118. Specifically, each of the metal plugs 7*b*, 7*c* and 7*d* passes through the semiconductor substrate 124 of the left one of the chips 118 and is enclosed by one of the insulating rings 500*a* in the left one of the chips 118, and each of the metal plugs 7*e* and 7*f* passes through the semiconductor substrate 124 of the middle one of the chips 118 and is enclosed by one of the insulating rings 500*a* in the middle one of the chips 118. The semiconductor substrate 124 of the left one of the chips 118 has portions on inner surfaces of the insulating rings 500*a* enclosing the metal plugs 7*c* and 7*d*, and the semiconductor substrate 124 of the middle one of the chips 118 has portions on inner surfaces of the insulating rings 500*a* enclosing the metal plugs 7*e* and 7*f*. The insulating ring 500*a* enclosing the metal plug 7*b* is at the sidewall of the metal plug 7*b* and contacts the metal plug 7*b*. The insulating ring 500*a* enclosing the metal plug 7*d* has a portion at and in contact with the sidewall of the metal plug 7*d*. The insulating ring 500*a* enclosing the metal plug 7*f* has a portion at and in contact with the sidewall of the metal plug 7*f*. For more detailed description about the metal plugs 7*p* (including the metal plugs 7*a*-7*f*) and the metal interconnects 3 (including the metal interconnects 3*a*, 3*b* and 3*c*) shown in FIG. 180, please refer to the illustration in FIG. 76.

Alternatively, the element 118 not only can indicate a chip, but also can indicate a wafer. When the element 118 is a wafer, the element 72 can be another wafer. Thereby, the process illustrated in the invention can be employed to the wafer-to-wafer bonding.

Figure 181:
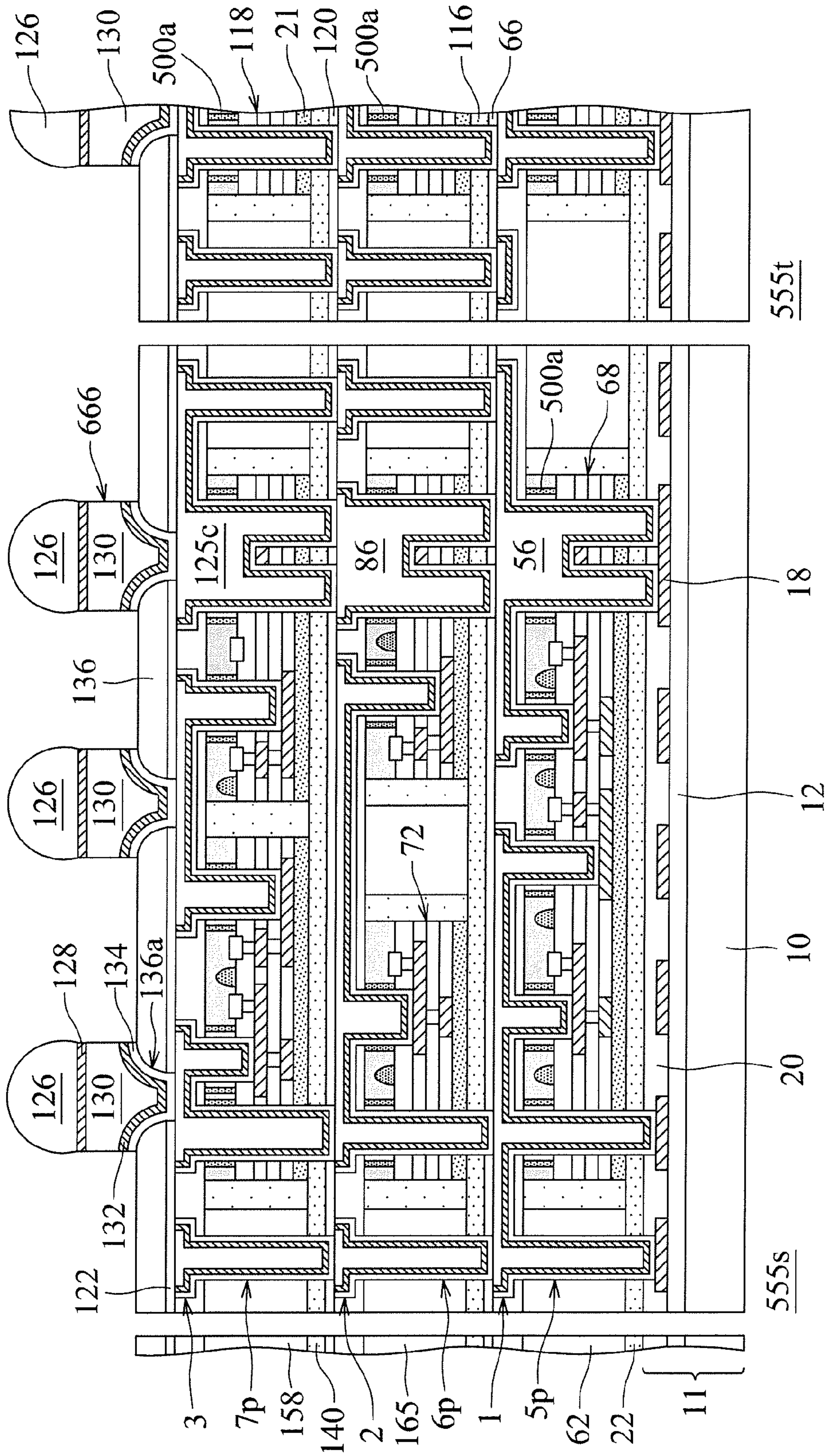

Referring to FIG. 181, after forming the structure illustrated in FIG. 180, the following steps can be subsequently performed as illustrated in FIGS. 77-81, and then a singulation process is performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in packages or multichip modules 555*s* and 555*t*.

Figure 182:
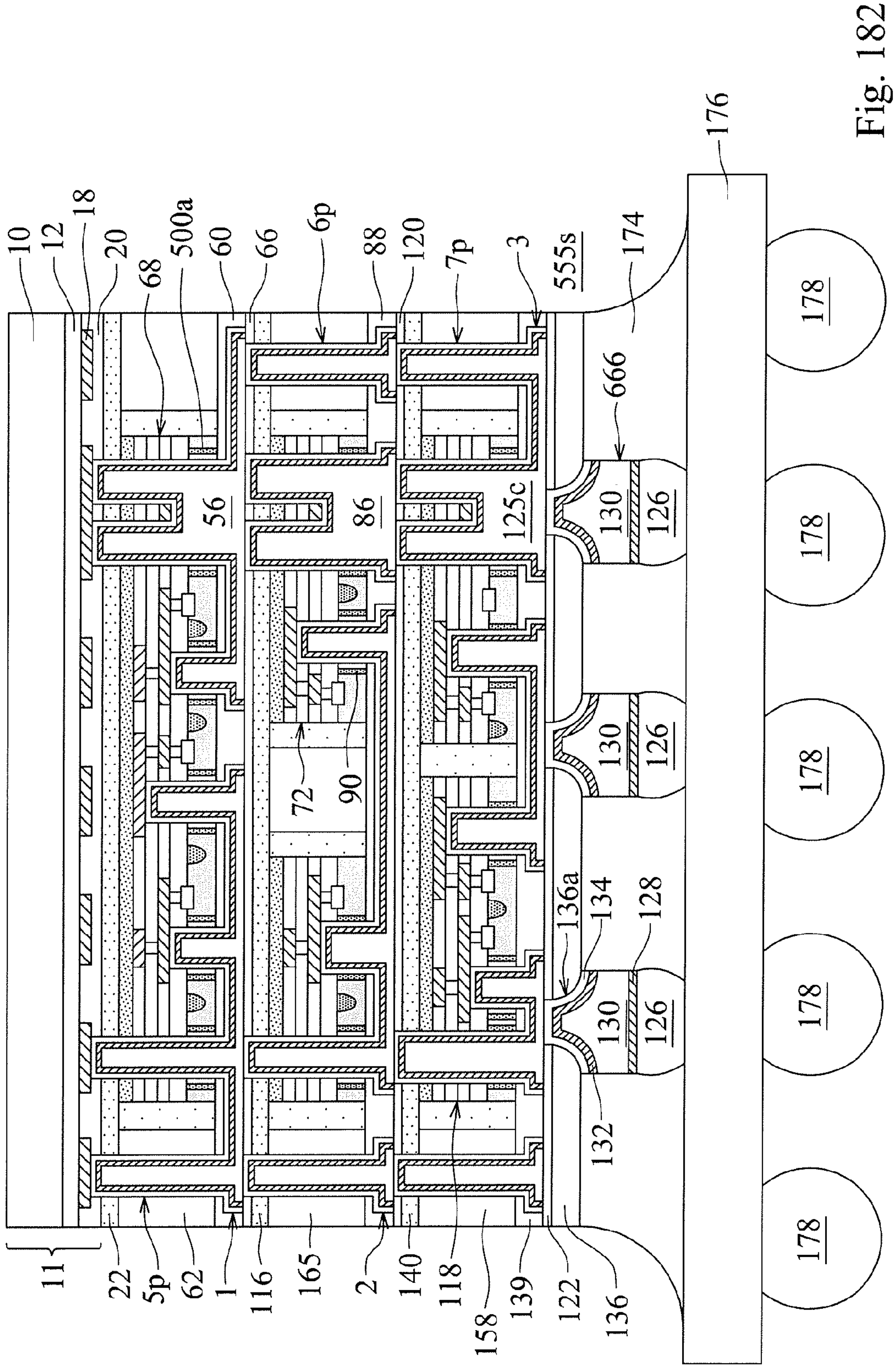
FIG. 182 shows a cross-sectional view of a multichip package according to an embodiment of the present disclosure.

The system-in package or multichip module 555*s* can be connected to and bonded with a carrier, such as mother board, printed circuit board (PCB), ball-grid-array (BGA) substrate, metal substrate, glass substrate, or ceramic substrate, using the solder bumps or balls 126. For example, referring to FIG. 182, the system-in package or multichip module 555*s* is bonded with a top side of a carrier 176 using, e.g., a flip chip technology of joining the solder bumps or balls 126 with a solder or gold layer preformed on the top side of the carrier 176. Next, an under fill 174 is formed between the polymer layer 136 of the system-in package or multichip module 555*s* and the top side of the carrier 176 and encloses the solder bumps or balls 126. Next, multiple solder balls 178 are formed on a bottom side of the carrier 176. The specifications of the carrier 176, the under fill 174, and the solder balls 178 shown in FIG. 182 can be referred to as the specifications of the carrier 176, the under fill 174, and the solder balls 178 as illustrated in FIG. 83, respectively.

Figure 183:
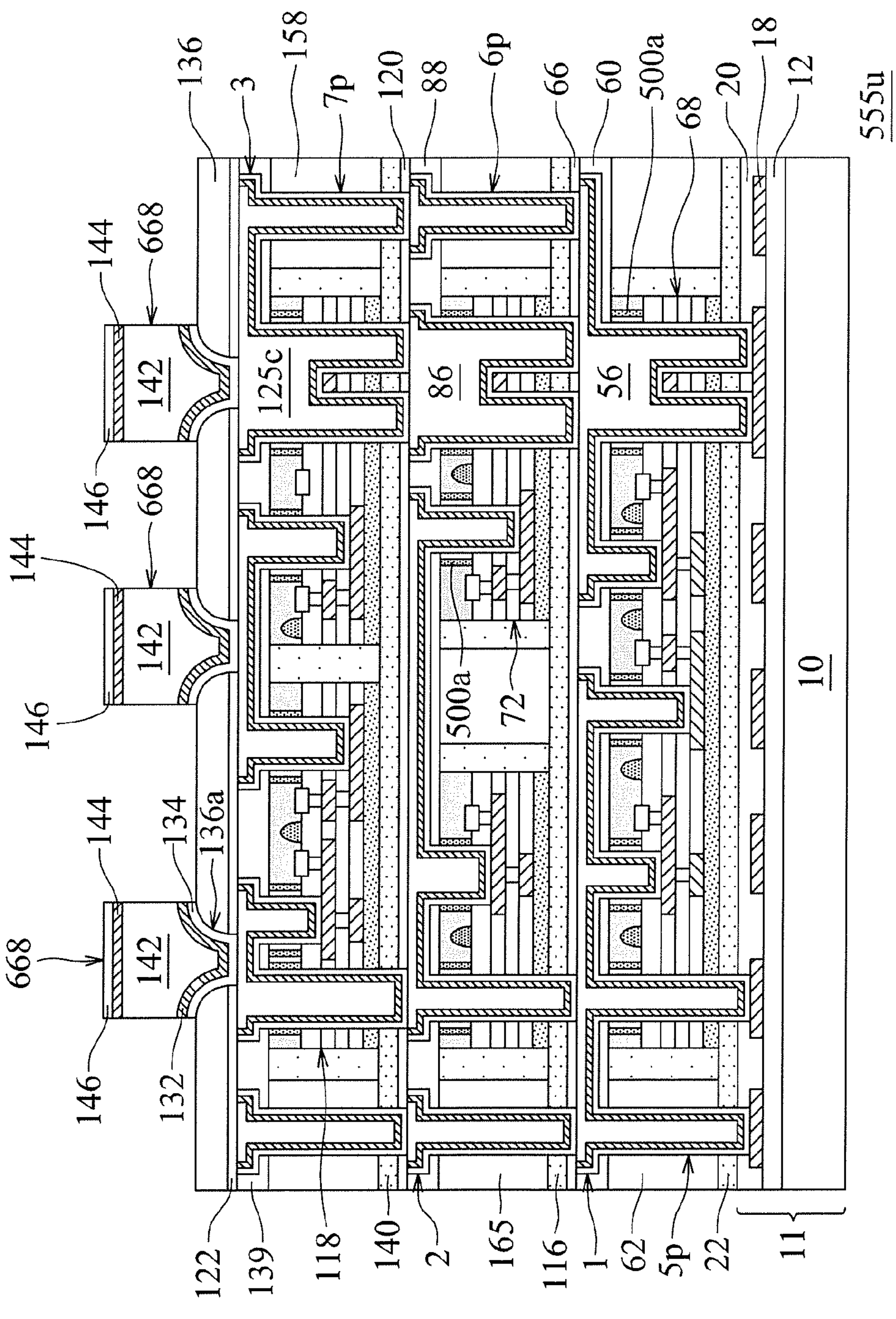
FIG. 183 shows a cross-sectional view of a system-in package or multichip module according to an embodiment of the present disclosure.

FIG. 183 shows another system-in package or multichip module according to another embodiment of the present disclosure, which can be formed by the following steps. After forming the structure illustrated in FIG. 180, the steps as illustrated in FIGS. 77-79 can be subsequently performed. Next, forming metal bumps 668 on the polymer layer 136 and on the contact points, at the bottoms of the openings in the insulating or dielectric layer 122 and under the openings 136*a* in the polymer layer 136, of the conduction layer 125*c* of the metal interconnects 3 can be referred to as the steps illustrated in FIG. 84. Next, a singulation process is performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in package or multichip module 555*u*. In the system-in package or multichip module 555*u*, each of the interconnects 3 can be connected to one or more of the metal bumps 668.

Figure 184:
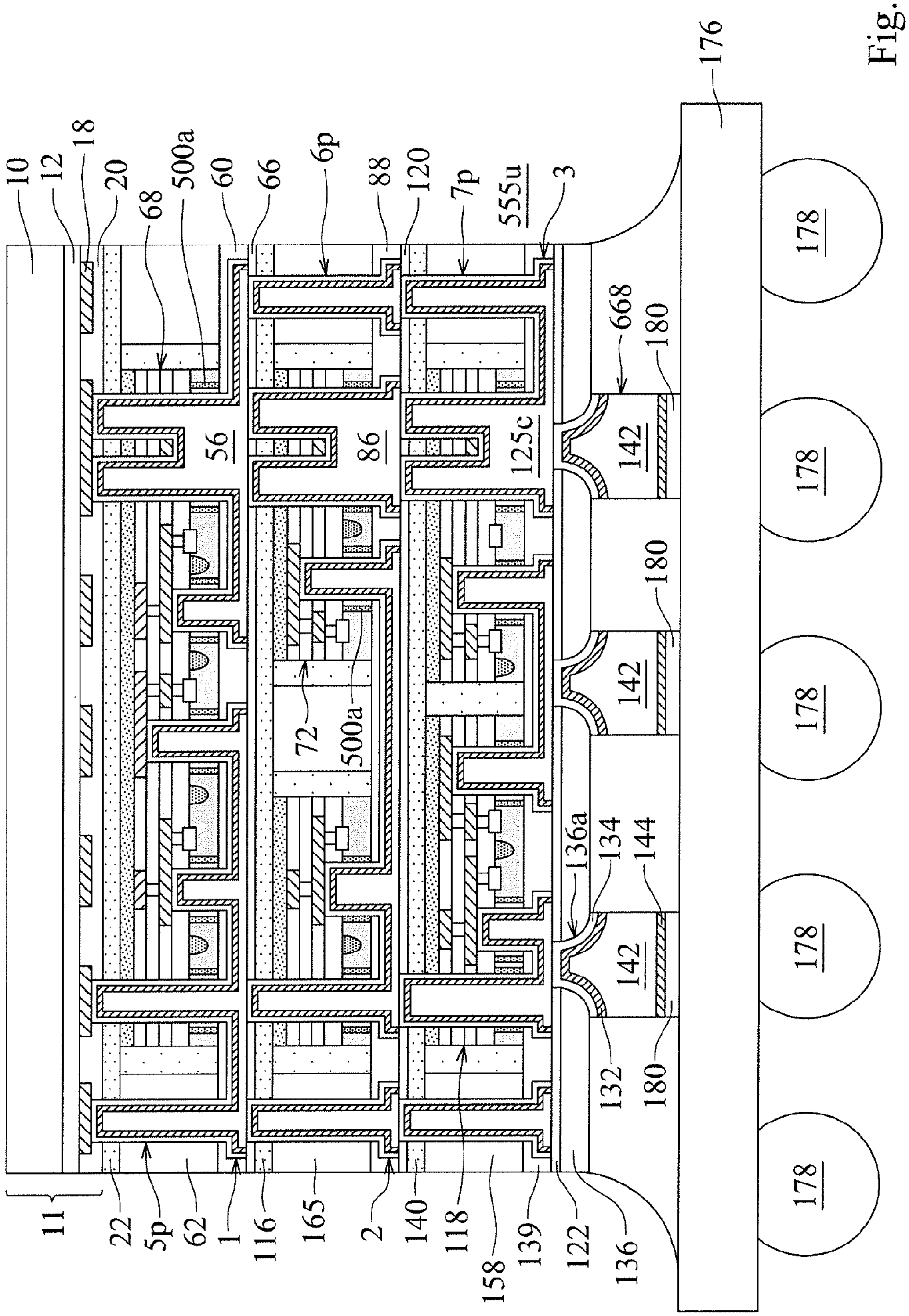
FIG. 184 shows a cross-sectional view of a multichip package according to an embodiment of the present disclosure.

The system-in package or multichip module 555*u* can be connected to and bonded with a carrier, such as mother board, printed circuit board (PCB), ball-grid-array (BGA) substrate, metal substrate, glass substrate, or ceramic substrate, using the metal bumps 668. For example, referring to FIG. 184, the system-in package or multichip module 555*u* is bonded with the top side of the carrier 176 illustrated in FIG. 83 using, e.g., a flip chip technology of joining the solder wetting layer 146 of the metal bumps 668 with a solder or gold layer preformed on the top side of the carrier 176. After joining the solder wetting layer 146 with the solder or gold layer preformed on the top side of the carrier 176, multiple metal joints 180 are formed between the barrier layer 144 of the metal bumps 668 and the top side of the carrier 176. The metal joints 180 can be a layer of a Sn—Ag alloy, a Sn—Ag—Cu alloy, a Sn—Au alloy, or a Sn—Pb alloy having a thickness between 5 and 50 micrometers. Alternatively, the metal joints 180 can be a gold layer having a thickness between 0.1 and 10 micrometers. Next, the under fill 174 illustrated in FIG. 83 is formed between the polymer layer 136 of the system-in package or multichip module 555*u* and the top side of the carrier 176 and encloses the metal bumps 668 and the metal joints 180. Next, the solder balls 178 illustrated in FIG. 83 are formed on the bottom side of the carrier 176.

Alternatively, the insulating or dielectric layer 122 as shown FIGS. 181-184 can be omitted. In this case, the polymer layer 136 is formed on the surfaces 223, 225, 227 and 139*s*, and the contact points of the conduction layer 125*c* of the metal interconnects 3 are exposed by and at ends of the openings 136*a* in the polymer layer 136. Further, the adhesion/barrier layer 134 is formed on the contact points, exposed by and at the ends of the openings 136*a* in the polymer layer 136, of the conduction layer 125*c* of the metal interconnects 3.

Figure 185:
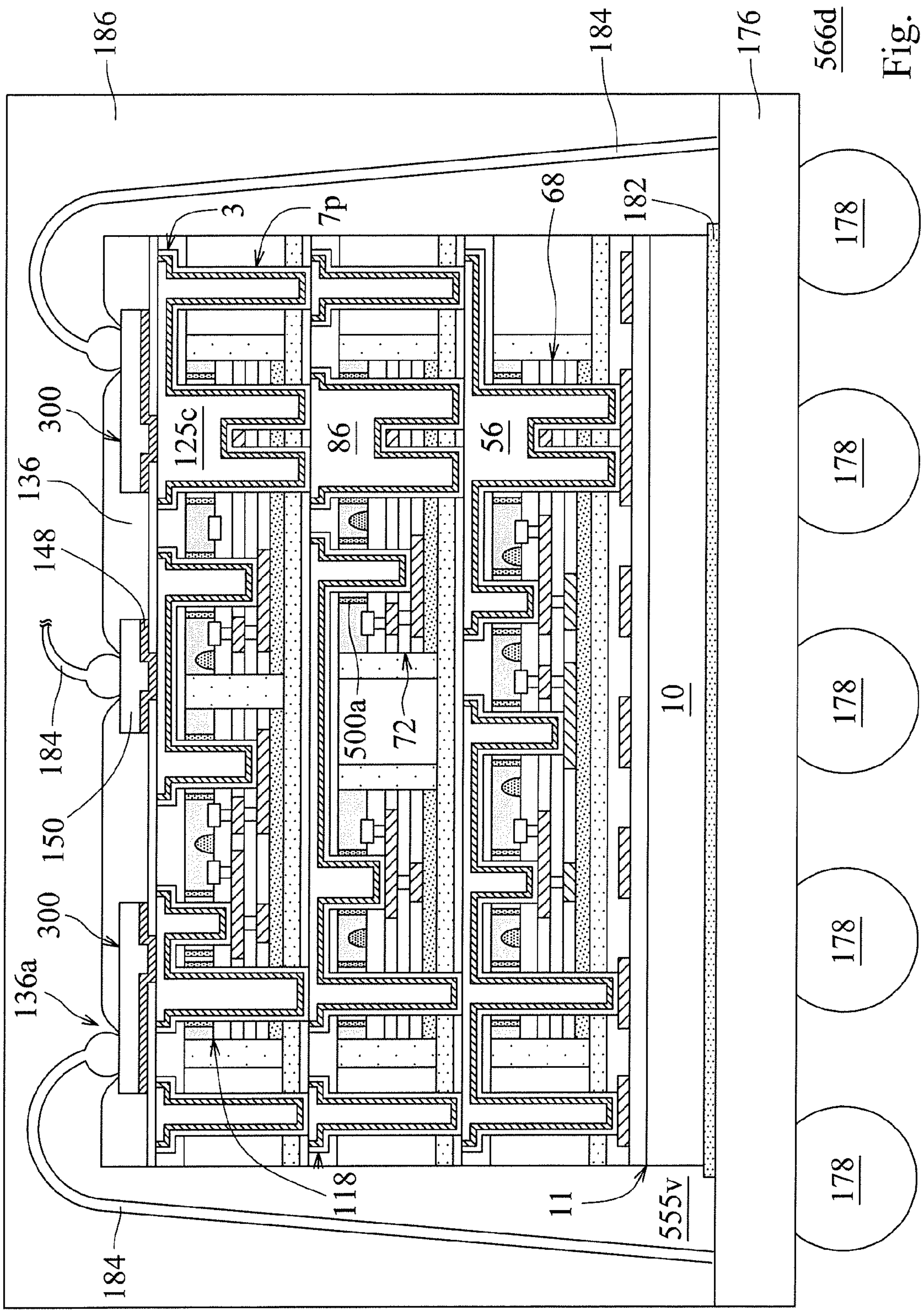
FIG. 185 shows a cross-sectional view of a multichip package according to an embodiment of the present disclosure.

FIG. 185 shows a multichip package 566*d* including a system-in package or multichip module 555*v* connected to the carrier 176 illustrated in FIG. 83 through wirebonded wires 184, which can be formed by, e.g., the following steps.

After forming the structure illustrated in FIG. 180, the steps illustrated in FIG. 86 are performed to form an insulating or dielectric layer 122 on the ground or polished surface 227 of the conduction layer 125*c* and on the exposed top surface 139*s* of the dielectric layer 139, to form multiple metal interconnects or traces 300 on the insulating or dielectric layer 122 and on multiple regions, exposed by multiple openings 122*a* in the layer 122, of the conduction layer 125*c* of the metal interconnects 3, and to form a polymer layer 136 on the insulating or dielectric layer 122 and on the metal interconnects or traces 300. The polymer layer 136 after being cured may have a thickness, e.g., between 1 and 20 micrometers, and preferably between 2 and 15 micrometers or between 5 and 10 micrometers, and multiple openings 136*a* in the polymer layer 136 expose multiple contact points of the metal interconnects or traces 300. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize a plurality of the system-in package or multichip module 555*v*.

Next, the plurality of the system-in package or multichip module 555*v* are joined with a carrier 176 by, e.g., forming a glue layer 182 with a thickness between 20 and 150 micrometers on the top side of the carrier 176, and then attaching the plurality of the system-in package or multichip module 555*v* to a top side of the carrier 11 using the glue layer 182. The glue layer 182 can be a polymer layer, such as a layer of polyimide, benzocyclobutene (BCB), epoxy, polybenzoxazole (PBO), poly-phenylene oxide (PPO), silosane, or SU-8, with a thickness, e.g., between 20 and 150 micrometers. Next, multiple wires 184, such as gold wires, copper wires, or aluminum wires, are wirebonded onto the top side of the carrier 176 and onto the contact points, exposed by the openings 136*a* in the polymer layer 136, of the conduction layer 150 of the metal interconnects or traces 300 by a wirebonding process. Accordingly, the metal interconnects or traces 300 of the plurality of the system-in package or multichip module 555*v* can be physically and electrically connected to the carrier 176 through the wirebonded wires 184. Next, a molding compound 186 is formed on the plurality of the system-in package or multichip module 555*v*, on the top side of the carrier 176 and on the wirebonded wires 184, encapsulating the wirebonded wires 184 and the plurality of the system-in package or multichip module 555*v*, by a molding process. The molding compound 186 may include epoxy, carbon filler or glass filler, and the glass filler or carbon filler can be distributed in the epoxy. Next, the solder balls 178 illustrated in FIG. 83 are formed on the bottom side of the carrier 176. Thereafter, a singulation process is performed to cut the carrier 176 and the molding compound 186 and to singularize a plurality of the multichip package 566*d*. The multichip package 566*d* can be connected to a carrier, such as mother board, ball-grid-array (BGA) substrate, printed circuit board, metal substrate, glass substrate, or ceramic substrate, through the solder balls 178. The specifications of the carrier 176 shown in FIG. 185 can be referred to as the specifications of the carrier 176 as illustrated in FIG. 83.

Figure 186:
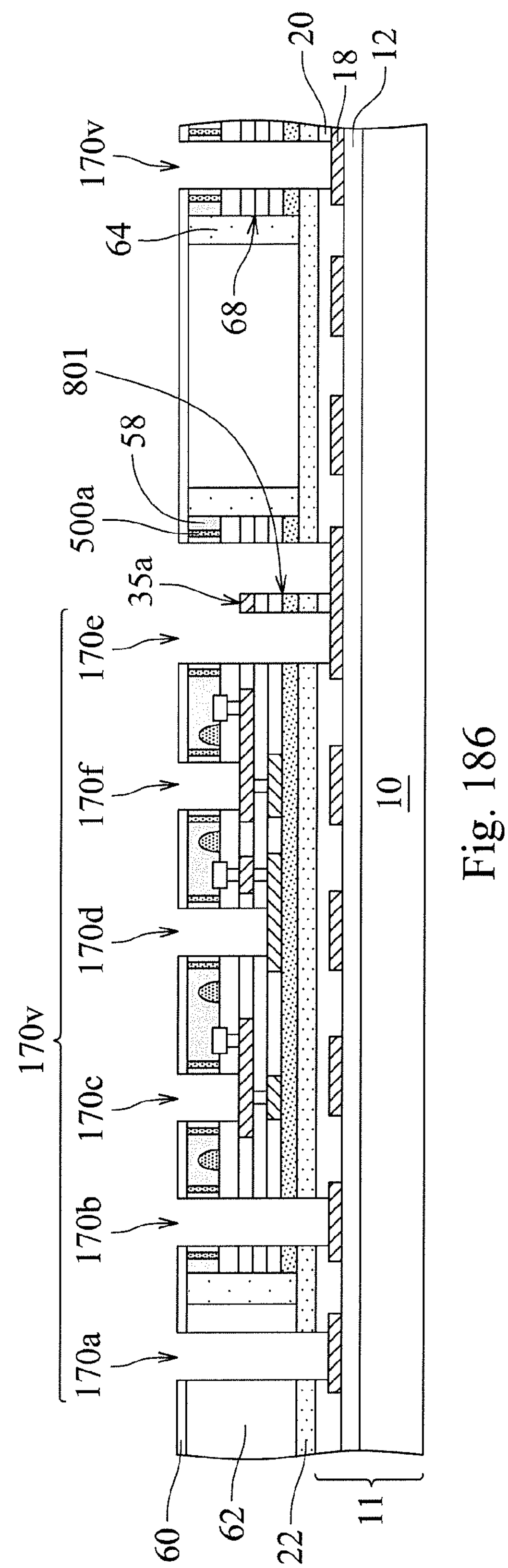
FIGS. 186-207 show a process for forming a system-in package or multichip module according to an embodiment of the present disclosure.

FIGS. 186-207 show a process for forming another system-in package or multichip module according to another embodiment of the present disclosure. Referring to FIG. 186, after forming the structure illustrated in FIG. 144, a dielectric layer 60 having a thickness, e.g., between 0.1 and 100 micrometers, and preferably between 0.2 and 1.5 micrometers, between 1 and 5 micrometers, between 5 and 10 micrometers, or between 1 and 20 micrometers, is formed on the surface 58*s* of the semiconductor substrate 58 of each chip 68, on the surface(s) 62*s* of the dummy substrate(s) 62, on the exposed bottom surfaces 500*s* of the insulating rings 500*a* in the chips 68, and on the surface 64*s* of the encapsulation/gap filling material 64 as shown in FIG. 144. Next, multiple through vias 170*v*, including through vias 170*a*, 170*b*, 170*c*, 170*d*, 170*e* and 170*f*, can be formed in the chips 68 and in the dummy substrate(s) 62, exposing the conductive layer 18 of the carrier 11 and exposing the layers 26 and 34 of the chips 68. The steps of forming the through vias 170*v* in the chips 68 and in the dummy substrate(s) 62 illustrated in FIG. 186 can be referred to as the steps of forming the through vias 170*v* in the chips 68 and in the dummy substrate(s) 62 as illustrated in FIG. 15, but, in the embodiment, forming the through vias 170*v* in the chips 68 includes etching through the semiconductor substrates 58 enclosed by the insulating rings 500*a* in the chips 68. The specifications of the through vias 170*v* (including the vias 170*a*-170*f*), the insulating rings 500*a* enclosing the through vias 170*v*, and the supporter 801 shown in FIG. 186 can be referred to as the specifications of the through vias 170*v* (including the vias 170*a*-170*f*), the insulating rings 500*a* enclosing the through vias 170*v*, and the supporter 801, respectively, illustrated in FIGS. 148-152.

The dielectric layer 60 shown in FIG. 186, for example, can be an inorganic layer formed by a suitable process, such as chemical vapor deposition (CVD) process or plasma-enhanced chemical vapor deposition (PECVD) process. The inorganic layer may include or can be a layer of silicon oxide, silicon nitride, silicon carbon nitride, silicon oxynitride, or silicon oxycarbide on the surfaces 58*s*, 62*s*, 500*s* and 64*s* shown in FIG. 144. The inorganic layer may have a thickness, e.g., between 0.1 and 5 micrometers, and preferably between 0.2 and 1.5 micrometers or between 0.5 and 2 micrometers.

Alternatively, the dielectric layer 60 shown in FIG. 186 can be a polymer layer, such as a layer of polyimide, benzocyclobutane (BCB), polybenzoxazole (PBO), poly-phenylene oxide (PPO), or epoxy, having a thickness between 3 and 100 micrometers, and preferably between 5 and 30 micrometers or between 10 and 50 micrometers, on the surfaces 58*s*, 62*s*, 500*s* and 64*s* shown in FIG. 144.

Alternatively, the dielectric layer 60 shown in FIG. 186 can be composed of an inorganic layer and a polymer layer on the inorganic layer. The inorganic layer can be formed on the surfaces 58*s*, 62*s*, 500*s* and 64*s* shown in FIG. 144 using a suitable process, such as chemical vapor deposition (CVD) process. The inorganic layer may include or can be a layer of silicon oxide, silicon nitride, silicon carbon nitride, silicon oxynitride, or silicon oxycarbide on the surfaces 58*s*, 62*s*, 500*s* and 64*s* shown in FIG. 144. The inorganic layer may have a thickness, e.g., between 0.1 and 5 micrometers, and preferably between 0.2 and 1.5 micrometers or between 0.5 and 2 micrometers. The polymer layer can be a layer of polyimide, epoxy, benzocyclobutane (BCB), polybenzoxazole (PBO), or poly-phenylene oxide (PPO) having a thickness between 3 and 100 micrometers, and preferably between 5 and 30 micrometers or between 10 and 50 micrometers, on the inorganic layer.

Figure 187:
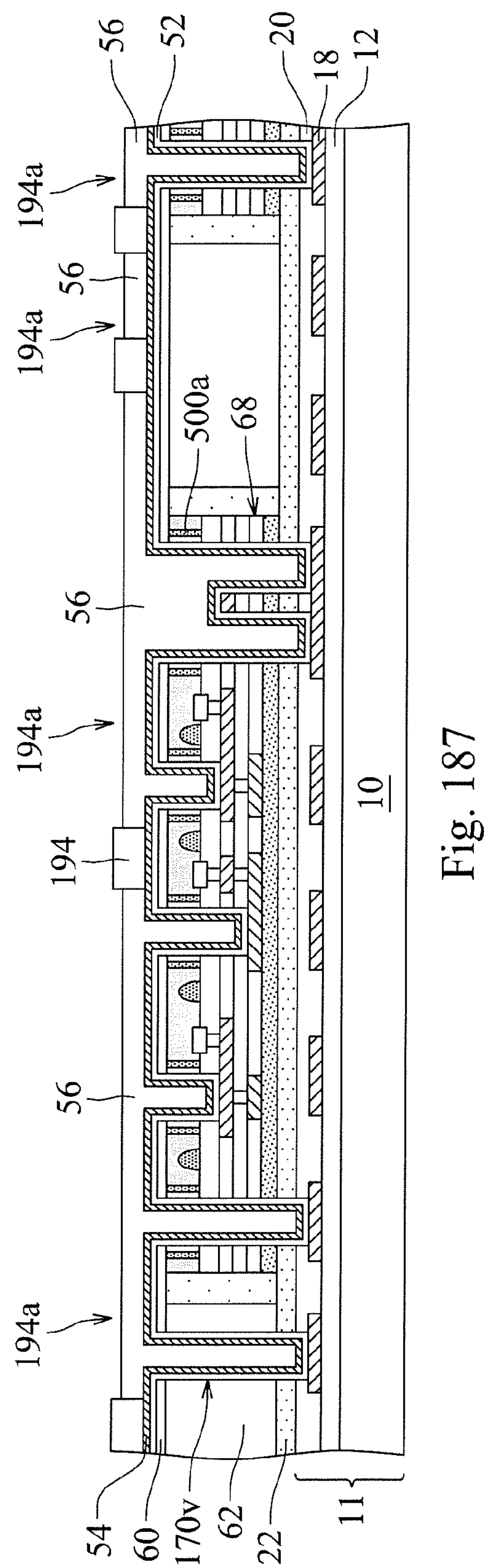

Next, referring to FIG. 187, an adhesion/barrier layer 52 having a thickness smaller than 1 micrometer, such as between 1 nanometer and 0.5 micrometers, and preferably between 0.1 and 0.2 micrometers, can be formed on the layers 18, 26 and 34 exposed by the through vias 170*v*, on sidewalls of the through vias 170*v*, on the dielectric layer 60, and on the interconnect or metal trace 35*a* that is on the supporter 801. The adhesion/barrier layer 52 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 54 having a thickness smaller than 1 micrometer, such as between 10 nanometers and 0.8 micrometers, and preferably between 80 nanometers and 0.15 micrometers, can be formed on the adhesion/barrier layer 52 and in the through vias 170*v* by a physical vapor deposition (PVD) process, such as sputtering process or evaporation process, by a chemical-vapor deposition (CVD) process, or by other thin-film deposition processes, such as atomic layer deposition (ALD). Next, a photoresist layer 194 can be formed on the seed layer 54 by using, e.g., a spin coating process, a screen printing process, or a lamination process. Next, a photo exposure process and a development process can be employed to form multiple openings 194*a*, exposing multiple regions of the seed layer 54, in the photoresist layer 194. The patterned photoresist layer 194 may have a thickness, e.g., between 1 and 30 micrometers, and preferably between 1 and 20 micrometers or between 1 and 10 micrometers. Next, a conduction layer 56 having a thickness greater than 1 micrometer, such as between 1 and 20 micrometers, and preferably between 1 and 10 micrometers, between 1 and 5 micrometers, or between 2 and 20 micrometers, can be formed on the regions, exposed by the openings 194*a* in the layer 194, of the seed layer 54 by using, e.g., an electroplating process. The specifications of the adhesion/barrier layer 52, the seed layer 54, and the conduction layer 56 shown in FIG. 187 can be referred to as the specifications of the adhesion/barrier layer 52, the seed layer 54, and the conduction layer 56 as illustrated in FIG. 90, respectively.

Figure 188:
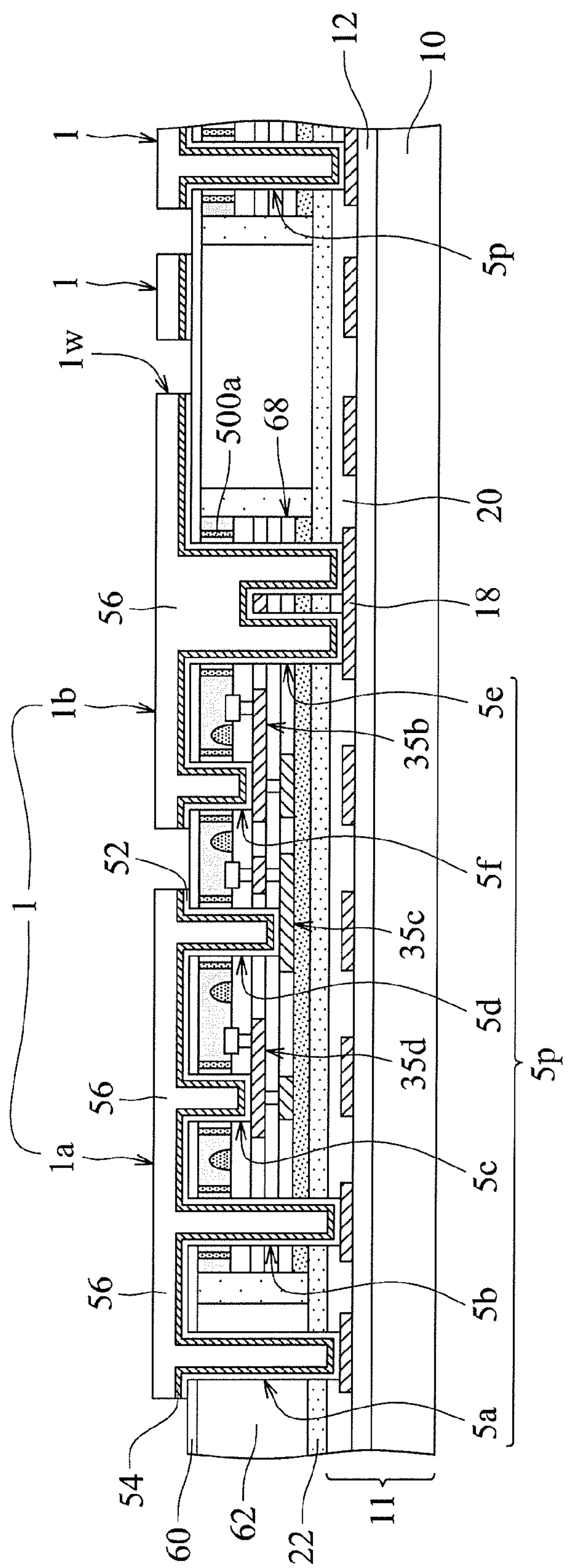

Next, referring to FIG. 188, the photoresist layer 194 is removed using, e.g., an organic chemical solution. Next, the seed layer 54 not under the conduction layer 56 is removed by using a wet etching process or a dry etching process. Next, the adhesion/barrier layer 52 not under the conduction layer 56 is removed by using a wet etching process or a dry etching process. Accordingly, the layers 52, 54 and 56 over the dielectric layer 60 and over the through vias 170*v* compose multiple metal interconnects 1, including metal interconnects 1*a* and 1*b*, over the dielectric layer 60 and over the through vias 170*v*. The adhesion/barrier layer 52 and the seed layer 54 of the metal interconnects 1 over the dielectric layer 60 are not at any sidewall 1*w* of the conduction layer 56 of the metal interconnects 1 over the dielectric layer 60, but under a bottom of the conduction layer 56 of the metal interconnects 1 over the dielectric layer 60. The sidewalls 1*w* of the conduction layer 56 of the metal interconnects 1 over the dielectric layer 60 are not covered by the layers 52 and 54. The layers 52, 54 and 56 in the through vias 170*v* compose multiple metal plugs (or metal vias) 5*p* in the through vias 170*v*, including metal plugs (or metal vias) 5*a*, 5*b*, 5*c*, 5*d*, 5*e* and 5*f* in the through vias 170*a*, 170*b*, 170*c*, 170*d*, 170*e* and 170*f* as shown in FIG. 186, respectively. The metal plug 5*a* is formed in the dummy substrate 62, and the metal plugs 5*b*, 5*c*, 5*d*, 5*e* and 5*f* are formed in the same chip 68. These metal plugs 5*p* formed in the chips 68 and in the dummy substrate(s) 62 can connect the metal interconnects 1 and the semiconductor devices 36 in the chips 68 and connect the metal interconnects 1 and multiple contact points of the conductive layer 18 in the carrier 11. The supporter 801 and the interconnect or metal trace 35*a*, in the interconnection layer 34, on the supporter 801 can be between two portions, lower than a horizontal level, at which a top surface of the interconnection layer 34 is positioned, of the metal plug 5*e*.

Each of the metal plugs 5*p* in the chips 68 passes through one of the insulating rings 500*a* in the chips 68. For example, the metal plugs 5*b*, 5*c*, 5*d*, 5*e* and 5*f* in one of the chips 68 pass through the insulating rings 500*a* in the one of the chips 68. Specifically, each of the metal plugs 5*b*, 5*c*, 5*d*, 5*e* and 5*f* passes through the semiconductor substrate 58 of the one of the chips 68 and is enclosed by one of the insulating rings 500*a* in the one of the chips 68. The semiconductor substrate 58 of the one of the chips 68 has portions on inner surfaces of the insulating rings 500*a* enclosing the metal plugs 5*b*, 5*c*, 5*d*, 5*e* and 5*f*. For more detailed description about the metal plugs 5*p* (including the metal plugs 5*a*-5*f*) and the metal interconnects 1 (including the metal interconnects 1*a* and 1*b*) shown in FIG. 188, please refer to the illustration in FIG. 91.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

Figure 189:
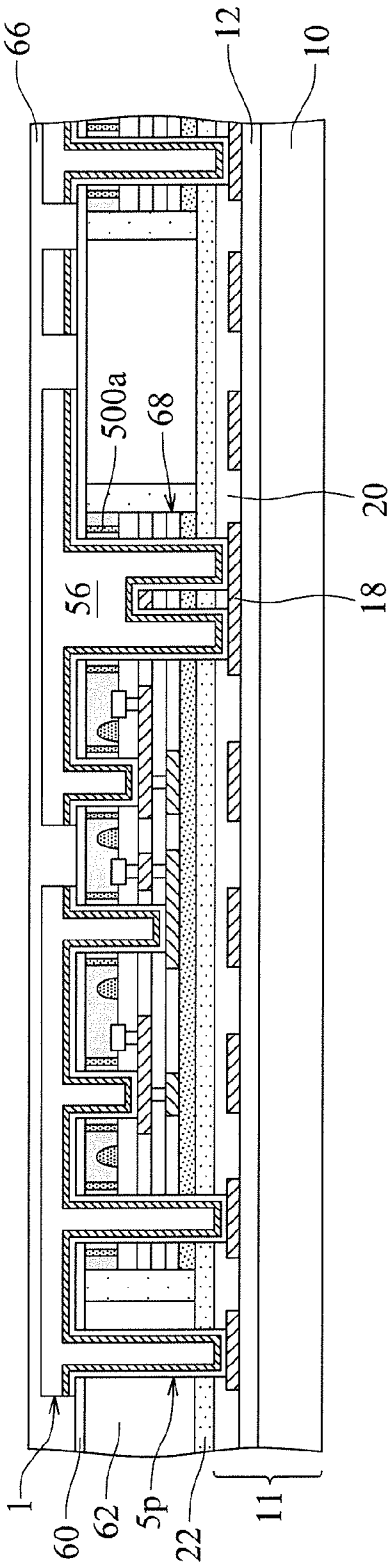

Next, referring to FIG. 189, an insulating or dielectric layer 66 is formed on the conduction layer 56 of the metal interconnects 1, on the dielectric layer 60, and in gaps between the metal interconnects 1. The insulating or dielectric layer 66, for example, may include or can be a polymer layer, such as a layer of polyimide, benzocyclobutene (BCB), epoxy, poly-phenylene oxide (PPO), or polybenzoxazole (PBO), on the conduction layer 56 of the metal interconnects 1, on the dielectric layer 60, and in the gaps between the metal interconnects 1. The polymer layer on the conduction layer 56 may have a thickness, e.g., between 0.1 and 50 micrometers, and preferably between 1 and 30 micrometers, between 2 and 20 micrometers, or between 5 and 10 micrometers.

Alternatively, the insulating or dielectric layer 66 may include or can be an inorganic layer, such as a layer of silicon oxide, silicon nitride, silicon oxynitride, silicon carbon nitride, or silicon oxycarbide, on the conduction layer 56 of the metal interconnects 1, on the dielectric layer 60, and in the gaps between the metal interconnects 1. The inorganic layer on the conduction layer 56 may have a thickness, e.g., between 0.1 and 10 micrometers, and preferably between 0.1 and 1 micrometers, between 0.2 and 2 micrometers, between 0.3 and 3 micrometers, or between 0.5 and 5 micrometers.

Figure 190:
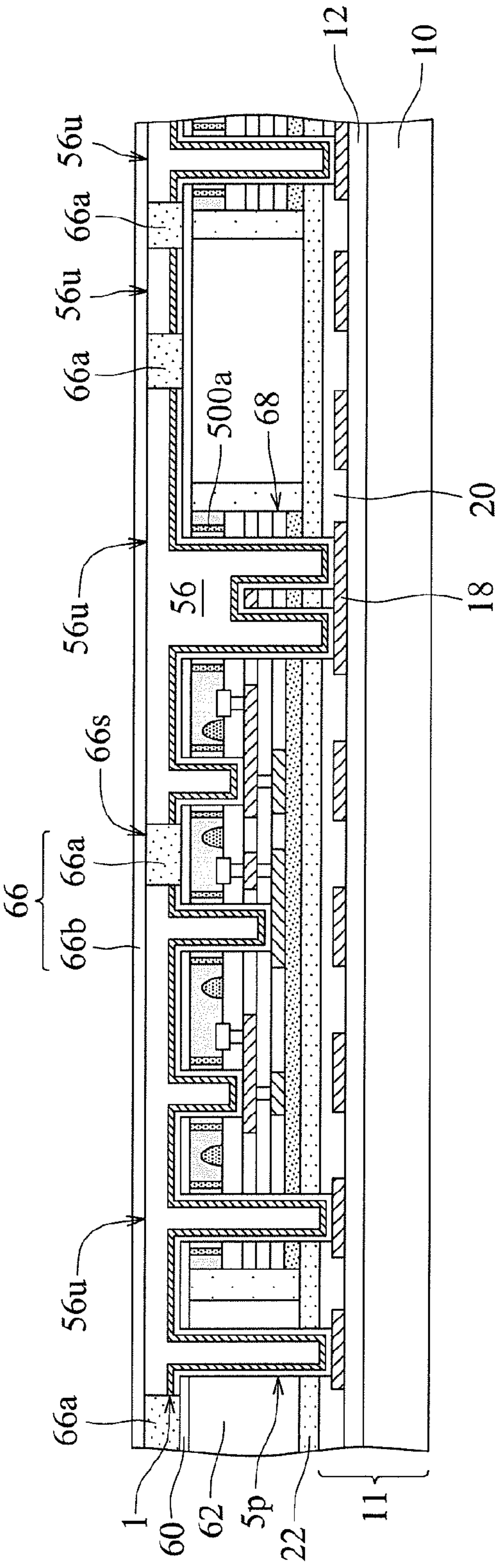

Alternatively, referring to FIG. 190, the insulating or dielectric layer 66 as shown in FIG. 189 can be formed by the following steps. First, a polymer layer 66*a*, such as a layer of polyimide, benzocyclobutene (BCB), epoxy, poly-phenylene oxide (PPO), or polybenzoxazole (PBO), is formed on the conduction layer 56 of the metal interconnects 1, on the dielectric layer 60, and in the gaps between the metal interconnects 1. Next, the polymer layer 66*a* is ground or polished by, e.g., a mechanical polishing process, a chemical-mechanical-polishing (CMP) process, a mechanical grinding process, or a process including mechanical polishing and chemical etching until the conduction layer 56 of the metal interconnects 1 has a top surface 56*u* not covered by the polymer layer 66*a*. Accordingly, the polymer layer 66*a* remains on the dielectric layer 60 and in the gaps between the metal interconnects 1 and has a thickness, e.g., greater than 1 micrometer, such as between 1 and 20 micrometers, and preferably between 1 and 10 micrometers, between 1 and 5 micrometers, or between 2 and 20 micrometers. The ground or polished surface 66*s* of the polymer layer 66*a* can be substantially flat and substantially coplanar with the top surface 56*u* of the conduction layer 56. Next, an inorganic layer 66*b*, such as a layer of silicon oxide, silicon nitride, silicon oxynitride, silicon carbon nitride, or silicon oxycarbide, having a thickness, e.g., between 0.1 and 3 micrometers, and preferably between 0.2 and 1.5 micrometers, is formed on the top surface 56*u* of the conduction layer 56 and on the ground or polished surface 66*s* of the polymer layer 66*a*. Accordingly, the insulating or dielectric layer 66 as shown in FIG. 189 also can be provided with the polymer layer 66*a* and the inorganic layer 66*b* as shown in FIG. 190.

Figure 191:
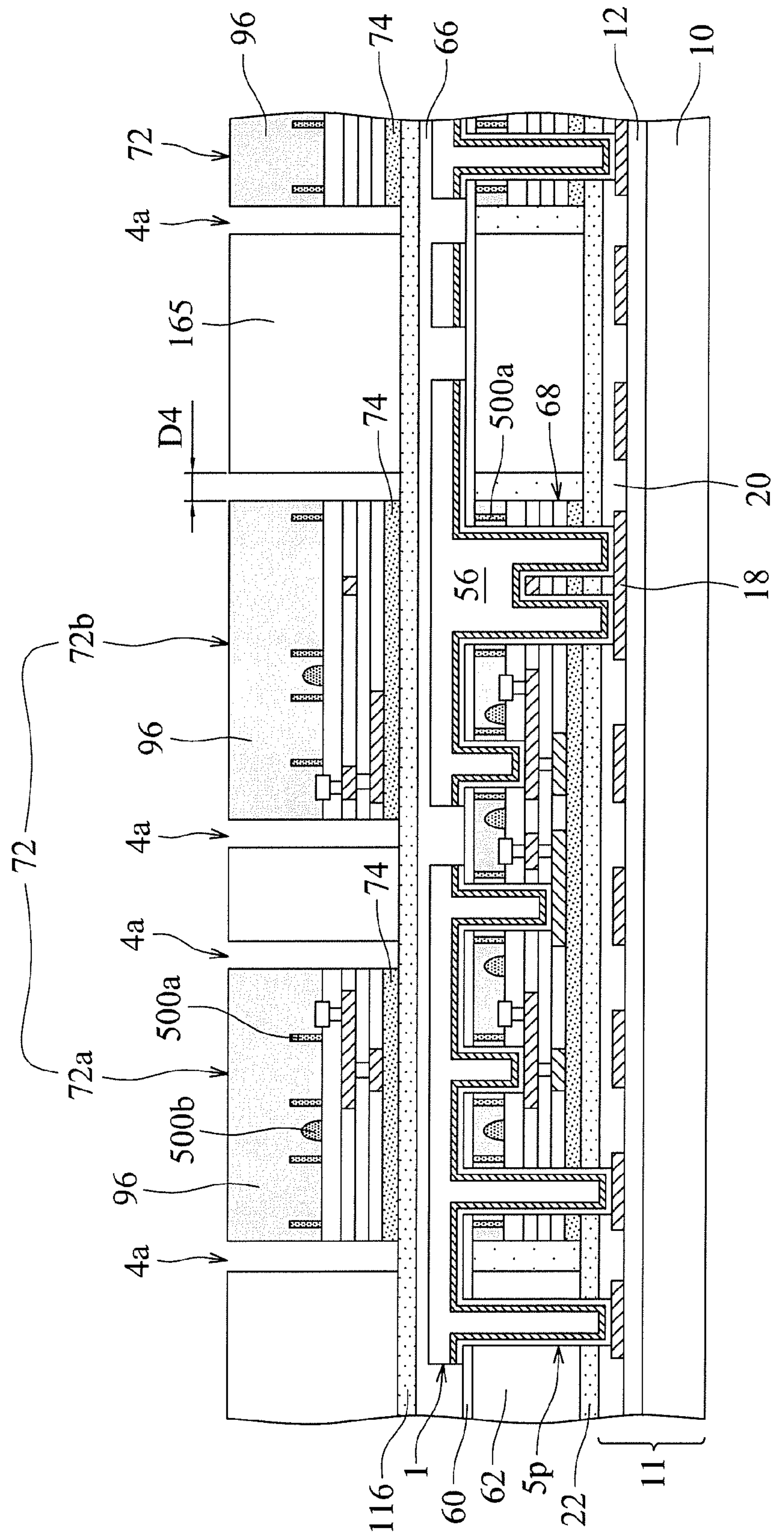
Figure 192:
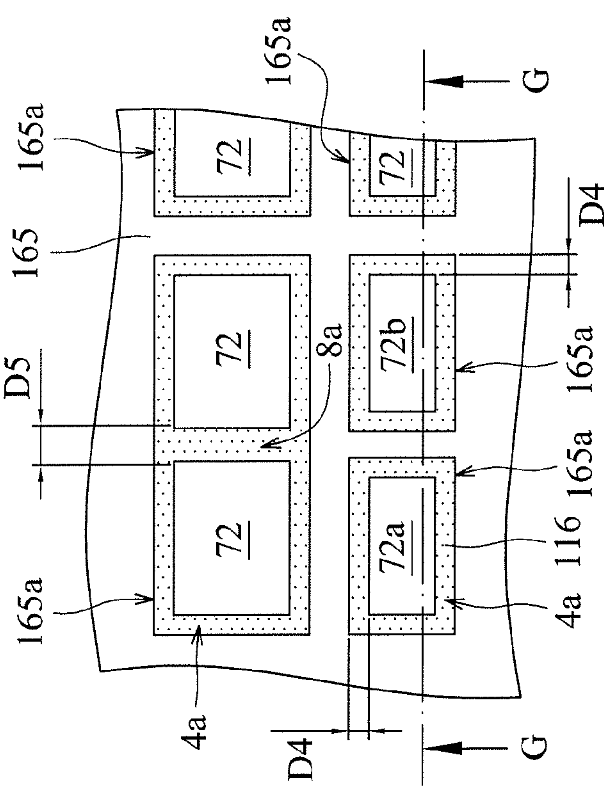

Referring to FIG. 191, after forming the insulating or dielectric layer 66, the dummy substrate 165 illustrated in FIG. 28 is joined with the insulating or dielectric layer 66 using the layer 116 illustrated in FIG. 28, which can be referred to as the steps illustrated in FIG. 28. Next, multiple openings 165*a* are formed in the dummy substrate 165 and expose the layer 116, which can be referred to as the steps illustrated in FIGS. 29-32. Alternatively, the openings 165*a* can be formed in and pass through the dummy substrate 165 before the dummy substrate 165 is joined with the insulating or dielectric layer 66 using the layer 116. Next, multiple chips 72, each of which is like the chip 72*a* or 72*b* illustrated in FIG. 141K, are joined with the layer 116 and mounted in the openings 165*a* and over the layer 66, which can be referred to as the steps illustrated in FIG. 33. After mounting the chips 72 in the openings 165*a*, the chips 72 have active sides at bottoms of the chips 72 and backsides at tops of the chips 72. FIG. 192 is an example of a schematical top view showing the chips 72 mounted in the openings 165*a* in the dummy substrate 165, and FIG. 191 is a cross-sectional view cut along the line G-G shown in the schematical top view of FIG. 192.

As shown in FIGS. 191 and 192, there are multiple gaps 4*a* each between the dummy substrate 165 and one of the chips 72, and there are multiple gaps 8*a* (one of them is shown) each between neighboring two chips 72. Each of the gaps 4*a* may have a transverse distance or spacing D4, e.g., between 1 and 200 micrometers, between 1 and 50 micrometers, or between 1 and 10 micrometers, and preferably between 1 and 5 micrometers. Each of the gaps 8*a* may have a transverse distance or spacing D5, e.g., between 1 and 200 micrometers, between 1 and 50 micrometers, or between 1 and 10 micrometers, and preferably between 1 and 5 micrometers.

Figure 193:
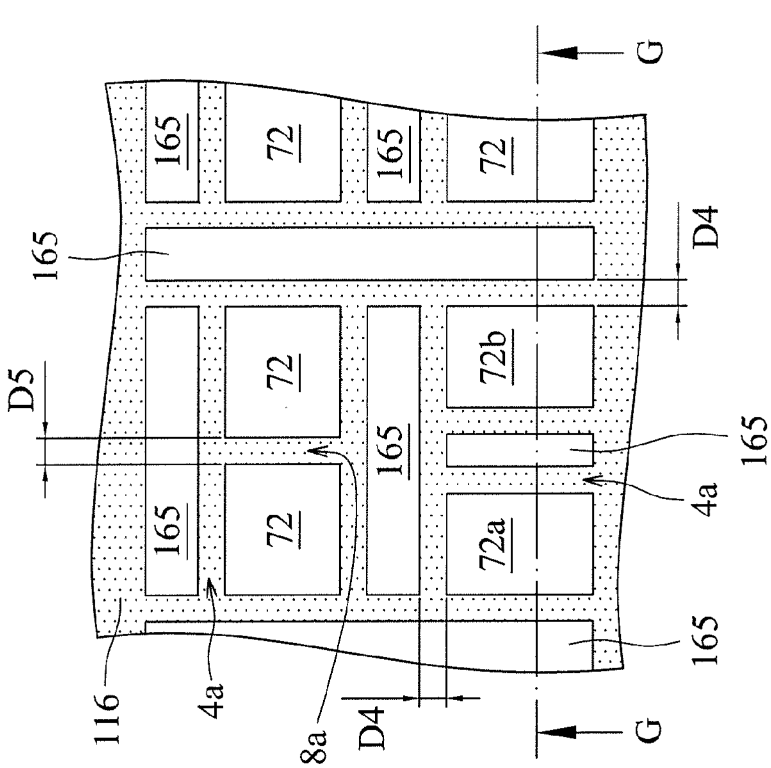

FIG. 193 shows another technique to form the structure with the same cross-sectional view as shown in FIG. 191. FIG. 191 is a cross-sectional view cut along the line G-G shown in a schematical top view of FIG. 193. The structure shown in FIGS. 191 and 193 can be formed, e.g., by the following steps. After forming the structure illustrated in FIG.

189 or 190, a glue layer 116 having a thickness, e.g., between 3 and 100 micrometers, and preferably between 5 and 10 micrometers or between 10 and 30 micrometers, is formed on the insulating or dielectric layer 66 shown in FIG. 189 or 190 by using a suitable process, such as spin coating process, laminating process, spraying process, dispensing process, or screen printing process. The glue layer 116 can be a polymer layer, such as a layer of epoxy, polyimide, benzocyclobutene (BCB), polybenzoxazole (PBO), poly-phenylene oxide (PPO), or silosane, with a thickness, e.g., between 3 and 100 micrometers, and preferably between 5 and 10 micrometers or between 10 and 30 micrometers. Next, the glue layer 116 can be optionally pre-cured or baked. Next, multiple chips 72, each of which is like the chip 72*a* or 72*b* illustrated in FIG. 141K, and multiple separate dummy substrates 165 are placed on the glue layer 116. When a gap between neighboring two chips 72 is too great, such as greater than 500 or 1,000 micrometers, one or more of the separate dummy substrates 165 can be placed in the gap. Alternatively, when a gap between neighboring two chips 72 is small enough, such as smaller than 500 or 1,000 micrometers, there can be no separate dummy substrates 165 placed in the gap. Next, the glue layer 116 can be cured again in a temperature between 180 degrees centigrade and 350 degrees centigrade with a mechanical or thermal pressure on the glue layer 116. Accordingly, the chips 72 and the separate dummy substrates 165 are joined with the insulating or dielectric layer 66 using the glue layer 116. The separate dummy substrates 165, for example, can be separate silicon bars, separate dummy chips, separate dummy silicon dies, or separate substrates of polysilicon, glass, silicon, or ceramic.

Alternatively, referring to FIGS. 191 and 193, the glue layer 116 can be replaced with a silicon-oxide layer that is formed on the insulating or dielectric layer 66 shown in FIG. 189 or 190. In this case, joining the chips 72 with the layer 66 and joining the separate dummy substrates 165 with the layer 66 can be performed, e.g., by bonding another silicon-oxide layer of the passivation layer 74, at the active side of each chip 72, with the silicon-oxide layer 116 and by bonding another silicon-oxide layer of each of the separate dummy substrates 165 with the silicon-oxide layer 116. The silicon-oxide layer of the passivation layer 74 of each chip 72 contacts the silicon-oxide layer 116, and the silicon-oxide layer of each of the separate dummy substrates 165 contacts the silicon-oxide layer 116. Accordingly, the chips 72 and the separate dummy substrates 165 can be joined with the insulating or dielectric layer 66 using these silicon-oxide layers.

As shown in FIGS. 191 and 193, there are multiple gaps 4*a* each between one of the chips 72 and one of the separate dummy substrates 165, and there are multiple gaps 8*a* (one of them is shown) each between neighboring two chips 72. Each of the gaps 4*a* may have a transverse distance or spacing D4, e.g., between 1 and 200 micrometers, between 1 and 50 micrometers, or between 1 and 10 micrometers, and preferably between 1 and 5 micrometers. Each of the gaps 8*a* may have a transverse distance or spacing D5, e.g., smaller than 500 micrometers, such as between 1 and 200 micrometers, between 1 and 50 micrometers, or between 1 and 10 micrometers, and preferably between 1 and 5 micrometers. In one embodiment, there are no circuits preformed in each separate dummy substrate 165 or on a top or bottom surface of each separate dummy substrate 165 before the separate dummy substrates 165 are joined with the insulating or dielectric layer 66.

Figure 194:
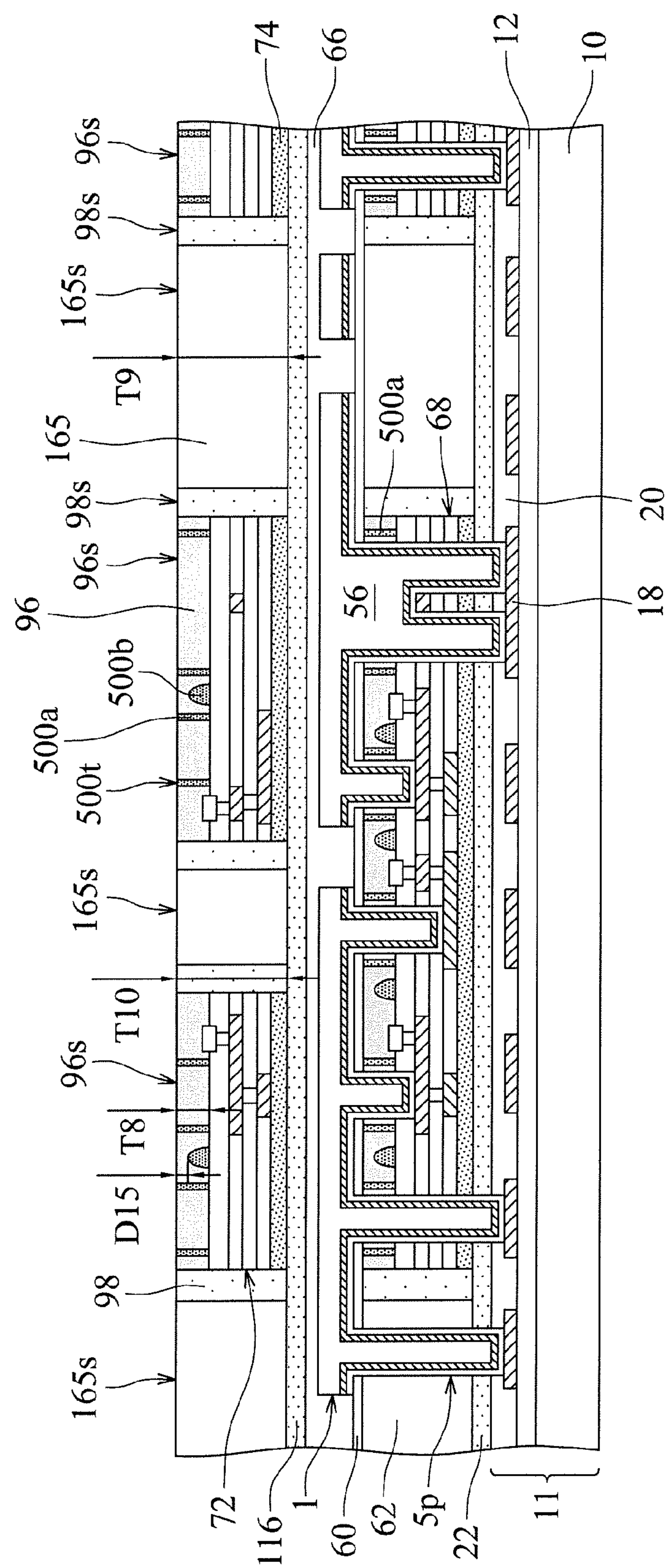

Referring to FIG. 194, after the steps illustrated in FIGS. 191 and 192 or in FIGS. 191 and 193, an encapsulation/gap filling material 98 is formed on a backside of the semiconductor substrate 96 of each chip 72, on the dummy substrate(s) 165, and in the gaps 4*a* and 8*a*. Next, the encapsulation/gap filling material 98, the backside of the semiconductor substrate 96 of each chip 72, and the dummy substrate(s) 165 are ground or polished by a suitable process, such as mechanical grinding process, mechanical polishing process, chemical-mechanical-polishing (CMP) process, or a process including mechanical polishing and chemical etching, until all of the insulating rings 500*a* in the chips 72 have exposed bottom surfaces 500*t*, over which there are no portions of the semiconductor substrates 96. The steps of forming the encapsulation/gap filling material 98 and grinding or polishing the encapsulation/gap filling material 98, the backside of the semiconductor substrate 96 of each chip 72, and the dummy substrate(s) 165 illustrated in FIG. 194 can be referred to as the steps of forming the encapsulation/gap filling material 64 and grinding or polishing the encapsulation/gap filling material 64, the backside of the semiconductor substrate 58 of each chip 68, and the dummy substrate(s) 62 as illustrated in FIGS. 143-146. The encapsulation/gap filling material 98 can be polysilicon, silicon oxide, or a polymer.

Accordingly, the semiconductor substrate 96 of each of the chips 72 can be thinned to a thickness T8, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 72, after the grinding or polishing process, the insulating rings 500*a* and the semiconductor substrate 96 may have the same thickness T8. Preferably, each of the chips 72, after the grinding or polishing process, may have a thickness, e.g., between 3 and 105 micrometers, and preferably between 3 and 30 micrometers or between 5 and 25 micrometers.

After the grinding or polishing process, the dummy substrate(s) 165 can be thinned to a thickness T9, e.g., between 3 and 100 micrometers, and preferably between 3 and 30 micrometers or between 5 and 25 micrometers, and the encapsulation/gap filling material 98 remaining in the gaps 4*a* and 8*a* may have a vertical thickness T10, e.g., between 3 and 100 micrometers, and preferably between 3 and 30 micrometers or between 5 and 25 micrometers. The ground or polished surface 96*s* of the semiconductor substrate 96, at the backside of each chip 72, and the ground or polished surface(s) 165*s* of the dummy substrate(s) 165 can be substantially flat and not covered by the encapsulation/gap filling material 98. The ground or polished surface(s) 165*s* may be substantially coplanar with the ground or polished surface 96*s* of each chip 72, with the ground or polished surface 98*s* of the encapsulation/gap filling material 98 in the gaps 4*a* and 8*a*, and with the exposed bottom surfaces 500*t* of the insulating rings 500*a* in the chips 72. In each chip 72, a vertical distance D15 between the ground or polished surface 96*s* of the semiconductor substrate 96 and the bottom of the shallow trench isolation 500*b* can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Figure 195:
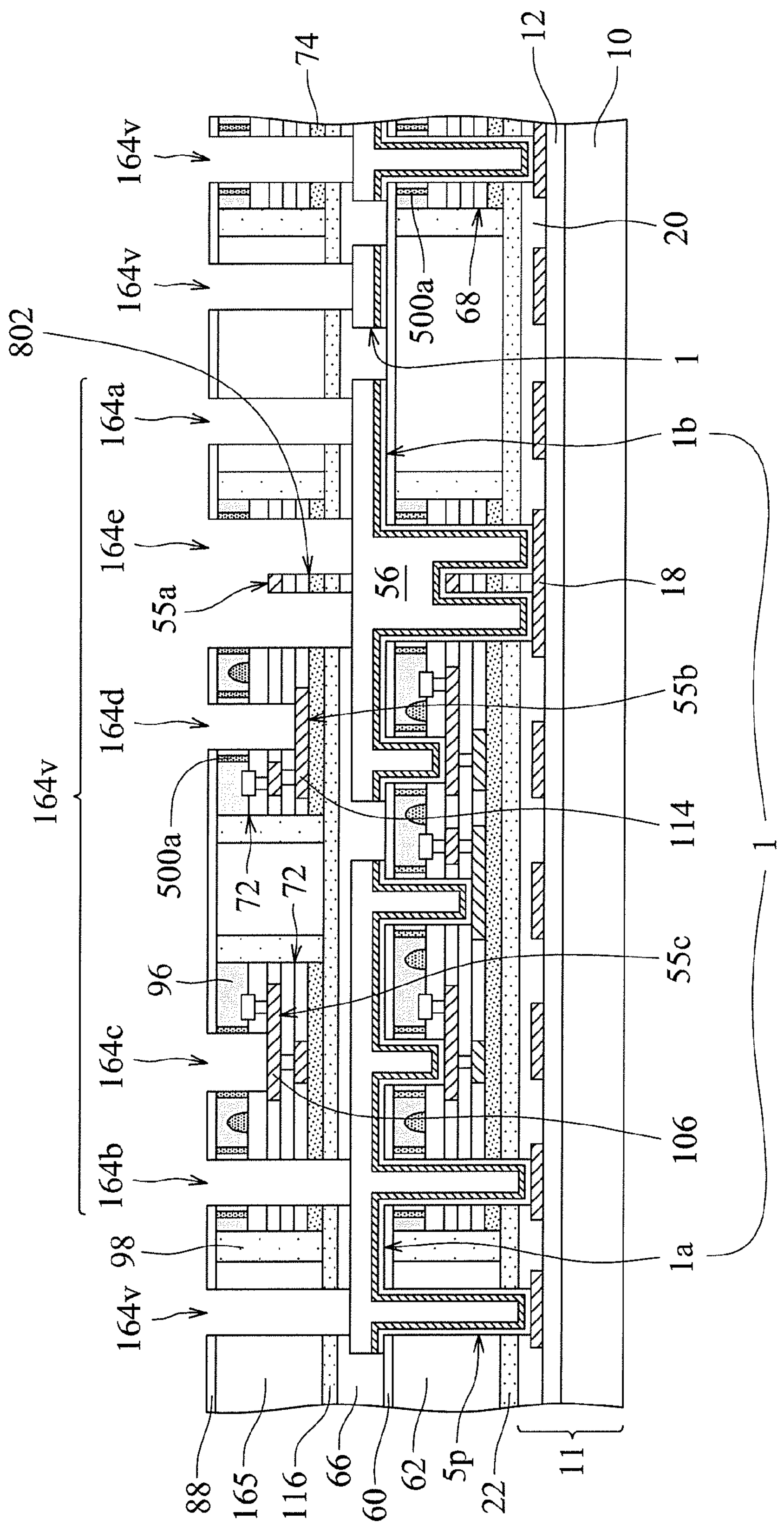

Next, referring to FIG. 195, a dielectric layer 88 having a thickness, e.g., between 0.1 and 100 micrometers, and preferably between 0.2 and 1.5 micrometers, between 1 and 5 micrometers, between 5 and 10 micrometers, or between 1 and 20 micrometers, is formed on the surface 96*s* of the semiconductor substrate 96 of each chip 72, on the surface(s) 165*s* of the dummy substrate(s) 165, on the exposed bottom surfaces 500*t* of the insulating rings 500*a* in the chips 72, and on the surface 98*s* of the encapsulation/gap filling material 98. Next, multiple through vias 164*v*, including through vias 164*a*, 164*b*, 164*c*, 164*d* and 164*e*, can be formed in the chips 72 and in the dummy substrate(s) 165, exposing the conduction layer 56 of the metal interconnects 1 and exposing the layers 114 and 106 of the chips 72. The steps of forming the through vias 164*v* in the chips 72 and in the dummy substrate(s) 165 illustrated in FIG. 195 can be referred to as the steps of forming the through vias 164*v* in the chips 72 and in the dummy substrate(s) 165 as illustrated in FIG. 41, but, in the embodiment, forming the through vias 164*v* in the chips 72 includes etching through the semiconductor substrates 96 enclosed by the insulating rings 500*a* in the chips 72. The specifications of the through vias 164*v* (including the vias 164*a*-164*e*), the insulating rings 500*a* enclosing the through vias 164*v*, and the supporter 802 shown in FIG. 195 can be referred to as the specifications of the through vias 164*v* (including the vias 164*a*-164*e*), the insulating rings 500*a* enclosing the through vias 164*v*, and the supporter 802, respectively, illustrated in FIGS. 162-166.

The dielectric layer 88 shown in FIG. 195, for example, can be an inorganic layer formed by a suitable process, such as chemical vapor deposition (CVD) process or plasma-enhanced chemical vapor deposition (PECVD) process. The inorganic layer may include or can be a layer of silicon oxide, silicon nitride, silicon carbon nitride, silicon oxynitride, or silicon oxycarbide on the surfaces 96*s*, 165*s*, 500*t* and 98*s*. The inorganic layer may have a thickness, e.g., between 0.1 and 5 micrometers, and preferably between 0.2 and 1.5 micrometers or between 0.5 and 2 micrometers.

Alternatively, the dielectric layer 88 shown in FIG. 195 can be a polymer layer, such as a layer of polyimide, epoxy, benzocyclobutane (BCB), polybenzoxazole (PBO), or polyphenylene oxide (PPO), having a thickness between 3 and 100 micrometers, and preferably between 5 and 30 micrometers or between 10 and 50 micrometers, on the surfaces 96*s*, 165*s*, 500*t* and 98*s*.

Alternatively, the dielectric layer 88 shown in FIG. 195 can be composed of an inorganic layer and a polymer layer on the inorganic layer. The inorganic layer can be formed on the surfaces 96*s*, 165*s*, 500*t* and 98*s* using a suitable process, such as chemical vapor deposition (CVD) process. The inorganic layer may include or can be a layer of silicon oxide, silicon nitride, silicon carbon nitride, silicon oxynitride, or silicon oxycarbide on the surfaces 96*s*, 165*s*, 500*t* and 98*s*. The inorganic layer may have a thickness, e.g., between 0.1 and 5 micrometers, and preferably between 0.2 and 1.5 micrometers or between 0.5 and 2 micrometers. The polymer layer can be a layer of polyimide, benzocyclobutane (BCB), epoxy, polybenzoxazole (PBO), or poly-phenylene oxide (PPO) having a thickness between 3 and 100 micrometers, and preferably between 5 and 30 micrometers or between 10 and 50 micrometers, on the inorganic layer.

Figure 196:
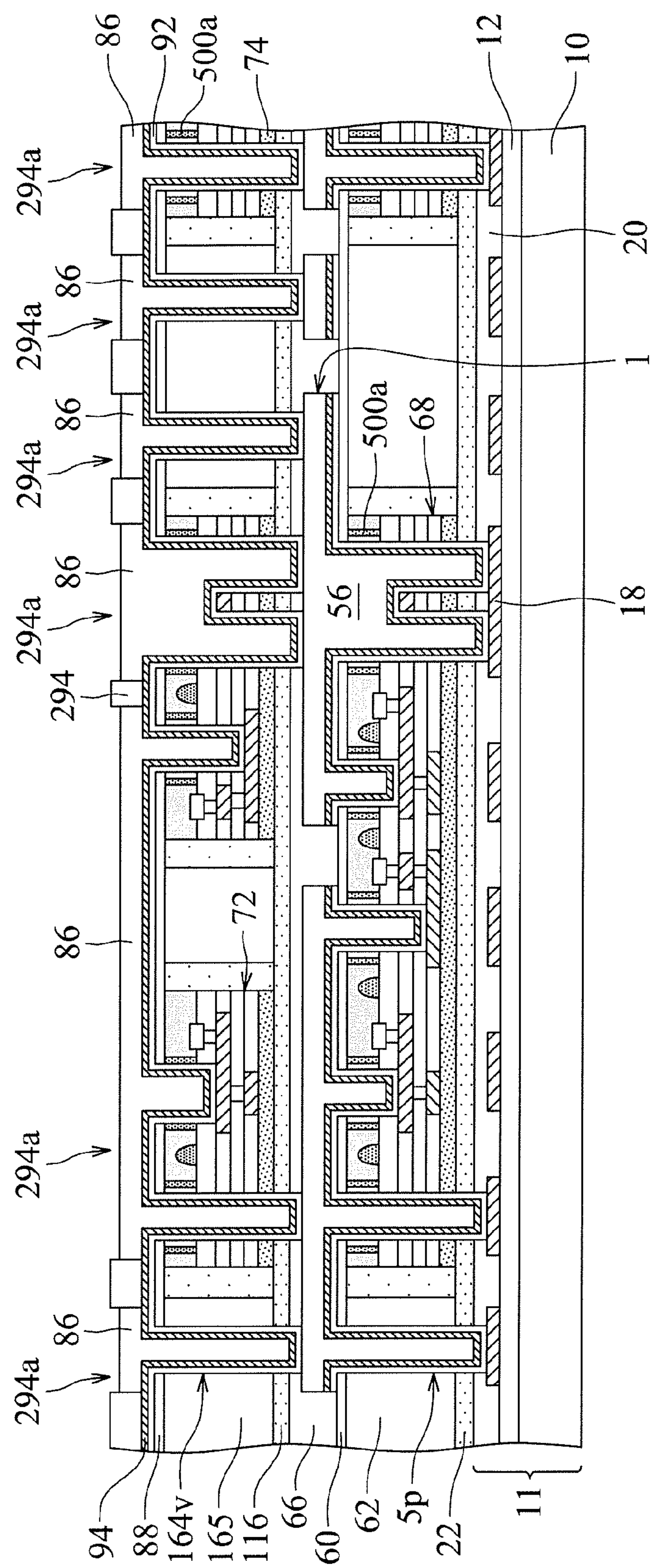

Next, referring to FIG. 196, an adhesion/barrier layer 92 having a thickness smaller than 1 micrometer, such as between 1 nanometer and 0.5 micrometers, and preferably between 0.1 and 0.2 micrometers, is formed on the layers 56, 106 and 114 exposed by the through vias 164*v*, on sidewalls of the through vias 164*v*, on the dielectric layer 88, and on the interconnect or metal trace 55*a* that is on the supporter 802. The adhesion/barrier layer 92 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 94 having a thickness smaller than 1 micrometer, such as between 10 nanometers and 0.8 micrometers, and preferably between 80 nanometers and 0.15 micrometers, is formed on the adhesion/barrier layer 92 and in the through vias 164*v* by a physical vapor deposition (PVD) process, such as sputtering process or evaporation process, by a chemical-vapor deposition (CVD) process, or by other thin-film deposition processes, such as atomic layer deposition (ALD). Next, a photoresist layer 294 is formed on the seed layer 94 by using, e.g., a spin coating process, a screen printing process, or a lamination process. Next, a photo exposure process and a development process can be employed to form multiple openings 294*a*, exposing multiple regions of the seed layer 94, in the photoresist layer 294. The patterned photoresist layer 294 may have a thickness, e.g., between 1 and 30 micrometers, and preferably between 1 and 20 micrometers or between 1 and 10 micrometers. Next, a conduction layer 86 having a thickness greater than 1 micrometer, such as between 1 and 20 micrometers, and preferably between 1 and 10 micrometers, between 1 and 5 micrometers, or between 2 and 20 micrometers, is formed on the regions, exposed by the openings 294*a* in the layer 294, of the seed layer 94 by using a suitable process, such as electroplating process. The specifications of the adhesion/barrier layer 92, the seed layer 94, and the conduction layer 86 shown in FIG. 196 can be referred to as the specifications of the adhesion/barrier layer 92, the seed layer 94, and the conduction layer 86 as illustrated in FIG. 95, respectively.

Figure 197:
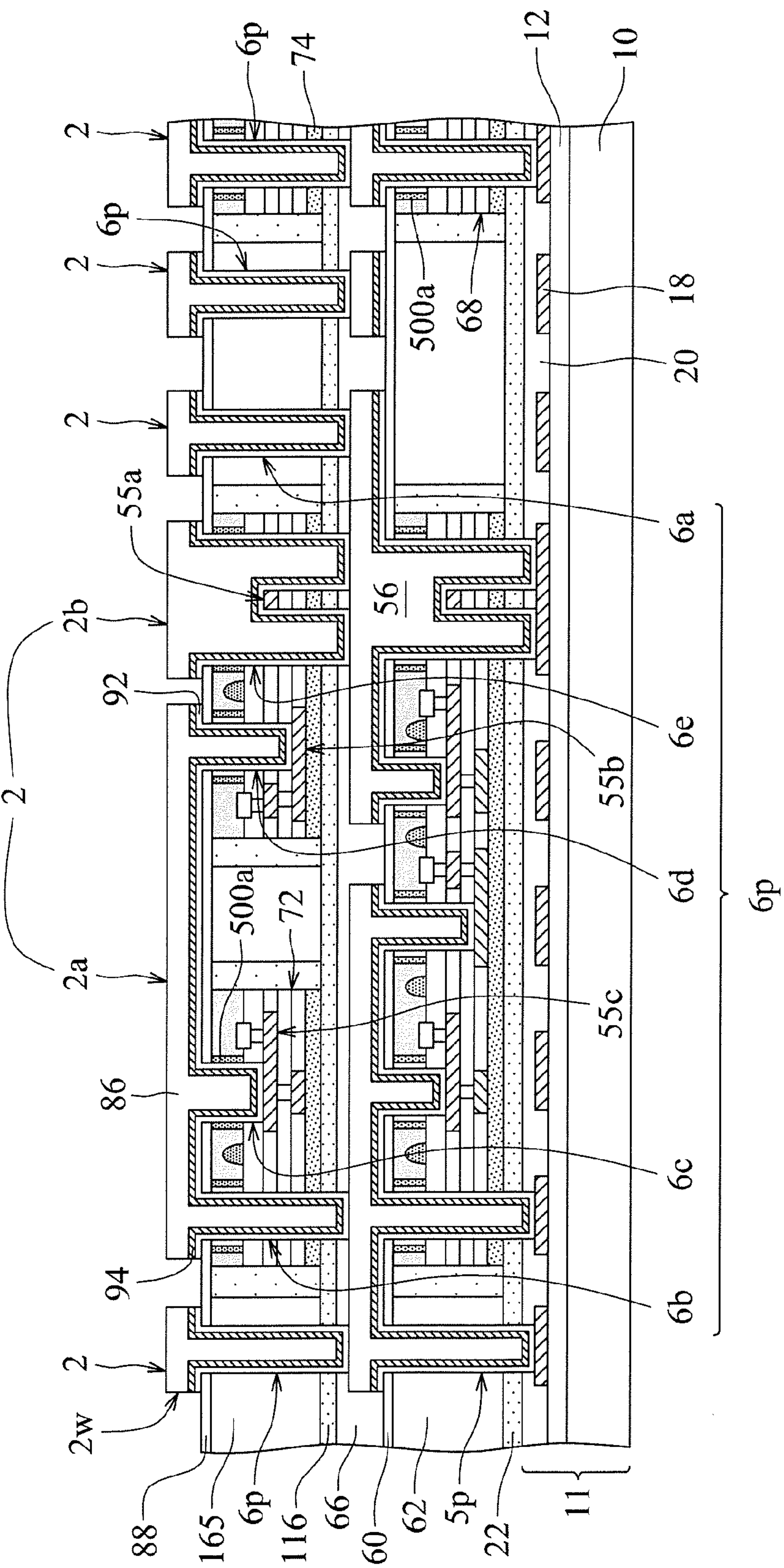

Next, referring to FIG. 197, the photoresist layer 294 is removed using, e.g., an organic chemical solution. Next, the seed layer 94 not under the conduction layer 86 is removed by using a wet etching process or a dry etching process. Next, the adhesion/barrier layer 92 not under the conduction layer 86 is removed by using a wet etching process or a dry etching process. Accordingly, the layers 92, 94 and 86 over the dielectric layer 88 and over the through vias 164*v* compose multiple metal interconnects 2, including metal interconnects 2*a* and 2*b*, over the dielectric layer 88 and over the through vias 164*v*. The adhesion/barrier layer 92 and the seed layer 94 of the metal interconnects 2 over the dielectric layer 88 are not at any sidewall 2*w* of the conduction layer 86 of the metal interconnects 2 over the dielectric layer 88, but under a bottom of the conduction layer 86 of the metal interconnects 2 over the dielectric layer 88. The sidewalls 2*w* of the conduction layer 86 of the metal interconnects 2 over the dielectric layer 88 are not covered by the layers 92 and 94. The layers 92, 94 and 86 in the through vias 164*v* compose multiple metal plugs (or metal vias) 6*p* in the through vias 164*v*, including metal plugs (or metal vias) 6*a*, 6*b*, 6*c*, 6*d* and 6*e* in the through vias 164*a*, 164*b*, 164*c*, 164*d* and 164*e* as shown in FIG. 195, respectively. The metal plug 6*a* is formed in the dummy substrate 165, the metal plugs 6*b* and 6*c* are formed in the left one of the chips 72, and the metal plugs 6*d* and 6*e* are formed in the middle one of the chips 72. These metal plugs 6*p* formed in the chips 72 and in the dummy substrate(s) 165 can connect the metal interconnects 2 and the semiconductor devices 102 in the chips 72 and connect the metal interconnects 1 and 2.

Each of the metal plugs 6*p* in the chips 72 passes through one of the insulating rings 500*a* in the chips 72. For example, the metal plugs 6*b* and 6*c* in the left one of the chips 72 pass through the insulating rings 500*a* in the left one of the chips 72, and the metal plugs 6*d* and 6*e* in the middle one of the chips 72 pass through the insulating rings 500*a* in the middle one of the chips 72. Specifically, each of the metal plugs 6*b* and 6*c* passes through the semiconductor substrate 96 of the left one of the chips 72 and is enclosed by one of the insulating rings 500*a* in the left one of the chips 72, and each of the metal plugs 6*d* and 6*e* passes through the semiconductor substrate 96 of the middle one of the chips 72 and is enclosed by one of the insulating rings 500*a* in the middle one of the chips 72. The semiconductor substrate 96 of the left one of the chips 72 has a portion on an inner surface of the insulating ring 500*a* enclosing the metal plug 6*b*, and the semiconductor substrate 96 of the middle one of the chips 72 has a portion on an inner surface of the insulating ring 500*a* enclosing the metal plug 6*d*. The insulating ring 500*a* enclosing the metal plug 6*c* is at the sidewall of the metal plug 6*c* and contacts the metal plug 6*c*, and the insulating ring 500*a* enclosing the metal plug 6*e* is at the sidewall of the metal plug 6*e* and contacts the metal plug 6*e*. For more detailed description about the metal plugs 6*p* (including the metal plugs 6*a*-6*e*) and the metal interconnects 2 (including the metal interconnects 2*a* and 2*b*) shown in FIG. 197, please refer to the illustration in FIG. 96.

Alternatively, the element 72 not only can indicate a chip, but also can indicate a wafer. When the element 72 is a wafer, the element 68 can be another wafer. Thereby, the process illustrated in the invention can be employed to the wafer-to-wafer bonding.

Figure 198:
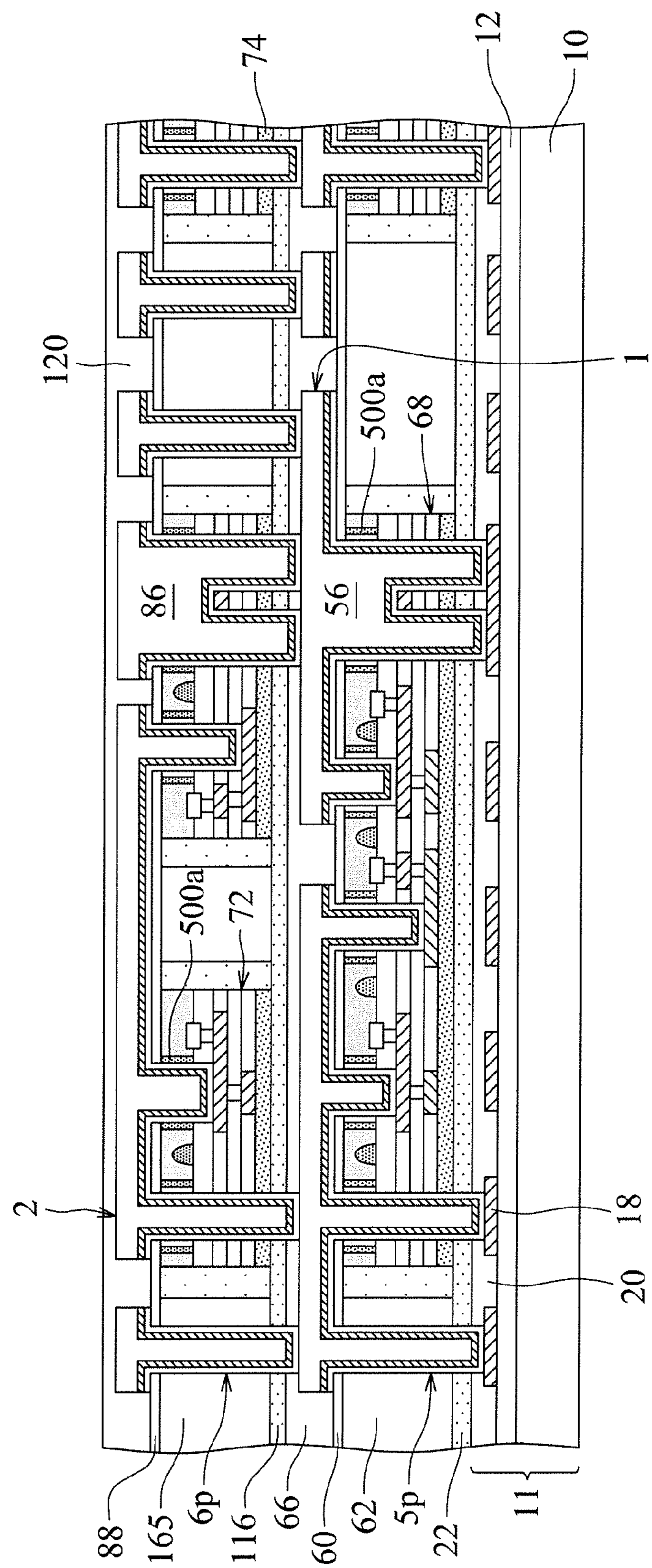

Next, referring to FIG. 198, an insulating or dielectric layer 120 is formed on the conduction layer 86 of the metal interconnects 2, on the dielectric layer 88, and in gaps between the metal interconnects 2. The insulating or dielectric layer 120, for example, may include or can be a polymer layer, such as a layer of polyimide, benzocyclobutene (BCB), epoxy, polyphenylene oxide (PPO), or polybenzoxazole (PBO), on the conduction layer 86 of the metal interconnects 2, on the dielectric layer 88, and in the gaps between the metal interconnects 2. The polymer layer on the conduction layer 86 may have a thickness, e.g., between 0.1 and 50 micrometers, and preferably between 1 and 30 micrometers, between 2 and 20 micrometers, or between 5 and 10 micrometers.

Alternatively, the insulating or dielectric layer 120 may include or can be an inorganic layer, such as a layer of silicon oxide, silicon nitride, silicon carbon nitride, silicon oxynitride, or silicon oxycarbide, on the conduction layer 86 of the metal interconnects 2, on the dielectric layer 88, and in the gaps between the metal interconnects 2. The inorganic layer on the conduction layer 86 may have a thickness, e.g., between 0.1 and 10 micrometers, and preferably between 0.1 and 1 micrometers, between 0.2 and 2 micrometers, between 0.3 and 3 micrometers, or between 0.5 and 5 micrometers.

Figure 199:
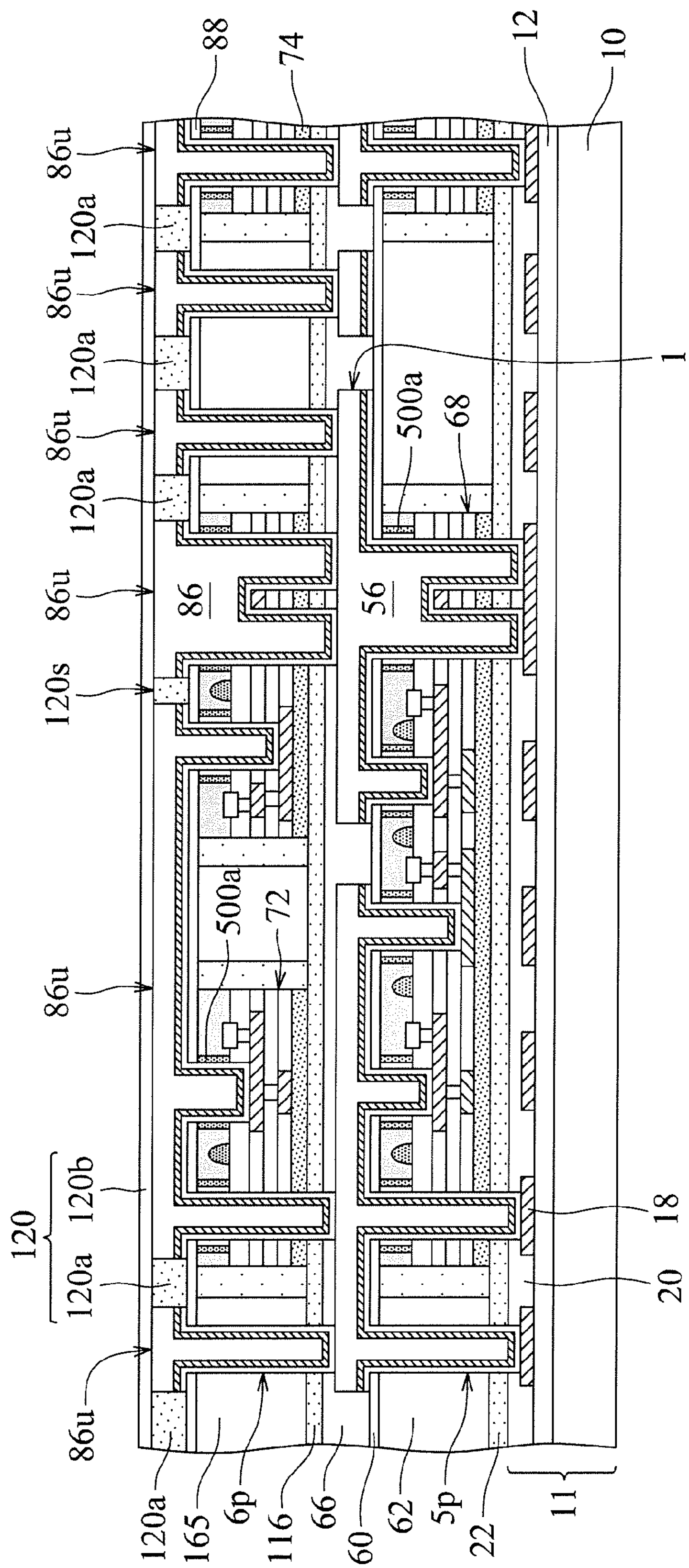

Alternatively, referring to FIG. 199, the insulating or dielectric layer 120 as shown in FIG. 198 can be formed by the following steps. First, a polymer layer 120*a*, such as a layer of polyimide, benzocyclobutene (BCB), epoxy, polyphenylene oxide (PPO), or polybenzoxazole (PBO), is formed on the conduction layer 86 of the metal interconnects 2, on the dielectric layer 88, and in the gaps between the metal interconnects 2. Next, the polymer layer 120*a* is ground or polished by, e.g., a mechanical grinding process, a mechanical polishing process, a chemical-mechanical-polishing (CMP) process, or a process including mechanical polishing and chemical etching until the conduction layer 86 of the metal interconnects 2 has a top surface 86*u* not covered by the polymer layer 120*a*. Accordingly, the polymer layer 120*a* remains on the dielectric layer 88 and in the gaps between the metal interconnects 2 and has a thickness, e.g., greater than 1 micrometer, such as between 1 and 20 micrometers, and preferably between 1 and 10 micrometers, between 1 and 5 micrometers, or between 2 and 20 micrometers. The ground or polished surface 120*s* of the polymer layer 120*a* can be substantially flat and substantially coplanar with the top surface 86*u* of the conduction layer 86. Next, an inorganic layer 120*b*, such as a layer of silicon oxide, silicon nitride, silicon carbon nitride, silicon oxynitride, or silicon oxycarbide, having a thickness, e.g., between 0.1 and 3 micrometers, and preferably between 0.2 and 1.5 micrometers, is formed on the top surface 86*u* of the conduction layer 86 and on the ground or polished surface 120*s* of the polymer layer 120*a*. Accordingly, the insulating or dielectric layer 120 as shown in FIG. 198 can be composed of the polymer layer 120*a* and the inorganic layer 120*b* as shown in FIG. 199.

Figure 200:
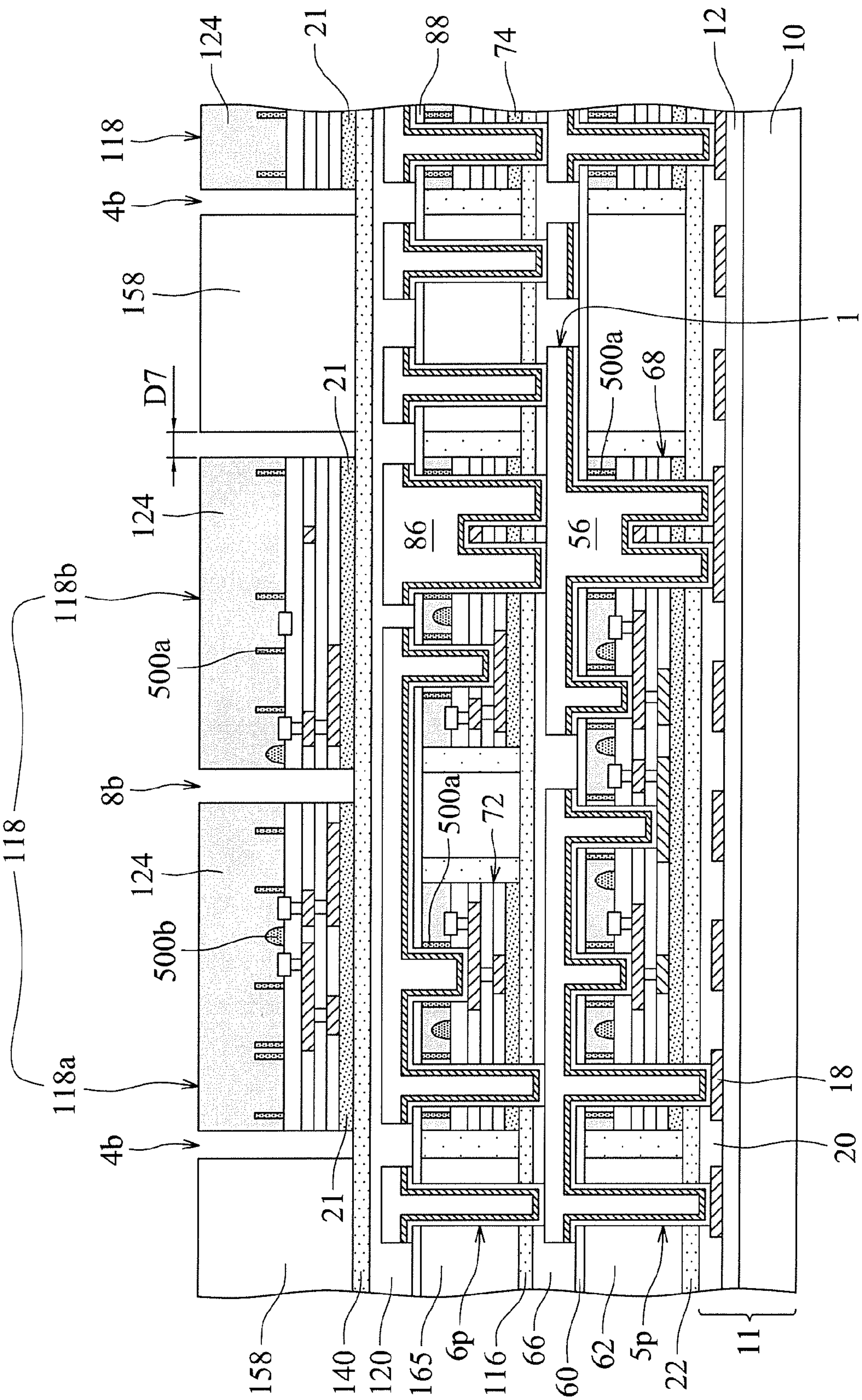
Figure 201:
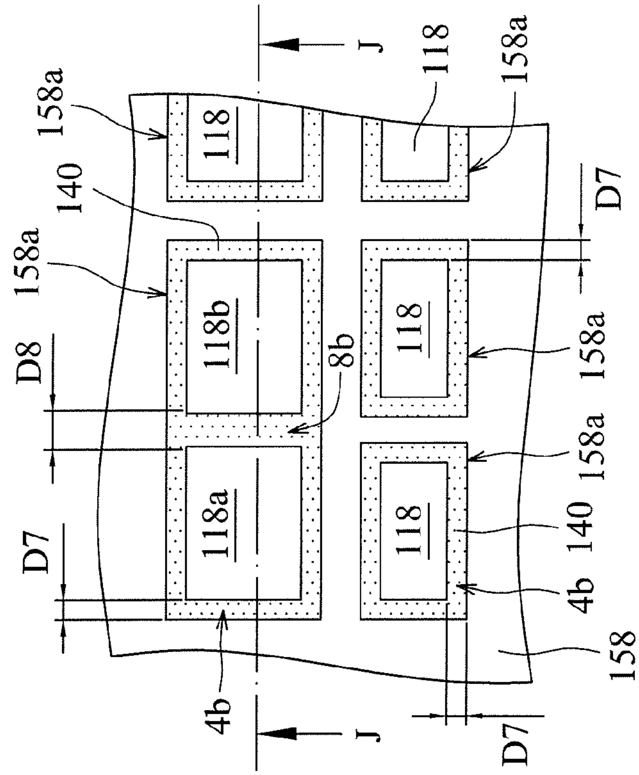

Referring to FIG. 200, after forming the insulating or dielectric layer 120, the dummy substrate 158 illustrated in FIG. 54 is joined with the insulating or dielectric layer 120 using the layer 140 illustrated in FIG. 54, which can be referred to as the steps illustrated in FIG. 54. Next, multiple openings 158*a* are formed in the dummy substrate 158 and expose the layer 140, which can be referred to as the steps illustrated in FIGS. 55 and 56. Alternatively, the openings 158*a* can be formed in and pass through the dummy substrate 158 before the dummy substrate 158 is joined with the insulating or dielectric layer 120 using the layer 140. Next, multiple chips 118, each of which is like the chip 118*a* or 118*b* illustrated in FIG. 141L, are joined with the layer 140 and mounted in the openings 158*a* and over the layer 120, which can be referred to as the steps illustrated in FIG. 57. After mounting the chips 118 in the openings 158*a*, the chips 118 have active sides at bottoms of the chips 118 and backsides at tops of the chips 118. FIG. 201 is an example of a schematical top view showing the chips 118 mounted in the openings 158*a* in the dummy substrate 158, and FIG. 200 is a cross-sectional view cut along the line J-J shown in the schematical top view of FIG. 201.

As shown in FIGS. 200 and 201, there are multiple gaps 4*b* each between the dummy substrate 158 and one of the chips 118, and there are multiple gaps 8*b* (one of them is shown) each between neighboring two chips 118. Each of the gaps 4*b* may have a transverse distance or spacing D7, e.g., between 1 and 200 micrometers, between 1 and 50 micrometers, or between 1 and 10 micrometers, and preferably between 1 and 5 micrometers. Each of the gaps 8*b* may have a transverse distance or spacing D8, e.g., between 1 and 200 micrometers, between 1 and 50 micrometers, or between 1 and 10 micrometers, and preferably between 1 and 5 micrometers.

Figure 202:
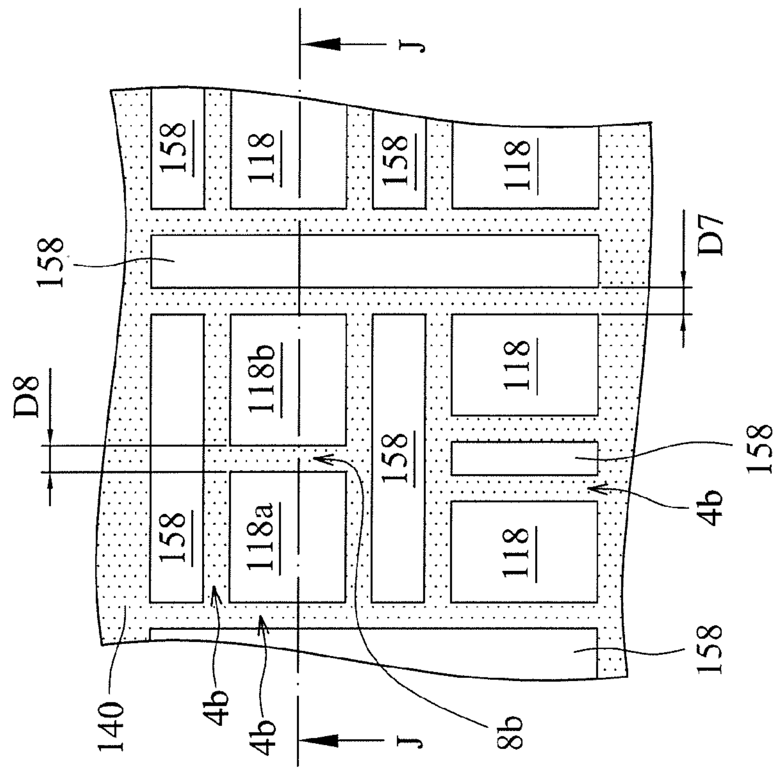

FIG. 202 shows another technique to form the structure with the same cross-sectional view as shown in FIG. 200. FIG. 200 is a cross-sectional view cut along the line J-J shown in a schematical top view of FIG. 202. The structure shown in FIGS. 200 and 202 can be formed, e.g., by the following steps. After forming the structure illustrated in FIG. 198 or 199, a glue layer 140 having a thickness, e.g., between 3 and 100 micrometers, and preferably between 5 and 10 micrometers or between 10 and 30 micrometers, is formed on the insulating or dielectric layer 120 shown in FIG. 198 or 199 by using a suitable process, such as spin coating process, laminating process, spraying process, dispensing process, or screen printing process. The glue layer 140 can be a polymer layer, such as a layer of epoxy, polyimide, benzocyclobutene (BCB), polybenzoxazole (PBO), poly-phenylene oxide (PPO), or silosane, with a thickness, e.g., between 3 and 100 micrometers, and preferably between 5 and 10 micrometers or between 10 and 30 micrometers. Next, the glue layer 140 can be optionally pre-cured or baked. Next, multiple chips 118, each of which is like the chip 118*a* or 118*b* illustrated in FIG. 141L, and multiple separate dummy substrates 158 are placed on the glue layer 140. When a gap between neighboring two chips 118 is too great, such as greater than 500 or 1,000 micrometers, one or more of the separate dummy substrates 158 can be placed in the gap. Alternatively, when a gap between neighboring two chips 118 is small enough, such as smaller than 500 or 1,000 micrometers, there can be no separate dummy substrates 158 placed in the gap. Next, the glue layer 140 can be cured again in a temperature between 180 degrees centigrade and 350 degrees centigrade with a mechanical or thermal pressure on the glue layer 140. Accordingly, the chips 118 and the separate dummy substrates 158 are joined with the insulating or dielectric layer 120 using the glue layer 140. The separate dummy substrates 158, for example, can be separate silicon bars, separate dummy chips, separate dummy silicon dies, or separate substrates of polysilicon, glass, silicon, or ceramic.

Alternatively, referring to FIGS. 200 and 202, the glue layer 140 can be replaced with a silicon-oxide layer that is formed on the insulating or dielectric layer 120 shown in FIG. 198 or 199. In this case, joining the chips 118 with the layer 120 and joining the separate dummy substrates 158 with the layer 120 can be performed, e.g., by bonding another silicon-oxide layer of the passivation layer 21, at the active side of each chip 118, with the silicon-oxide layer 140 and by bonding another silicon-oxide layer of each of the separate dummy substrates 158 with the silicon-oxide layer 140. The silicon-oxide layer of the passivation layer 21 of each chip 118 contacts the silicon-oxide layer 140, and the silicon-oxide layer of each of the separate dummy substrates 158 contacts the silicon-oxide layer 140. Accordingly, the chips 118 and the separate dummy substrates 158 can be joined with the insulating or dielectric layer 120 using these silicon-oxide layers.

As shown in FIGS. 200 and 202, there are multiple gaps **4*b* each between one of the chips 118 and one of the separate dummy substrates 158, and there are multiple gaps 8*b* (one of them is shown) each between neighboring two chips 118. Each of the gaps 4*b* may have a transverse distance or spacing D7, e.g., between 1 and 200 micrometers, between 1 and 50 micrometers, or between 1 and 10 micrometers, and preferably between 1 and 5 micrometers. Each of the gaps 8*b* may have a transverse distance or spacing D8, e.g., smaller than 500 micrometers, such as between 1 and 200 micrometers, between 1 and 50 micrometers, or between 1 and 10 micrometers, and preferably between 1 and 5 micrometers. In one embodiment, there are no circuits preformed in each separate dummy substrate 158 or on a top or bottom surface of each separate dummy substrate 158 before the separate dummy substrates 158 are joined with the insulating or dielectric layer 120**.

Figure 203:
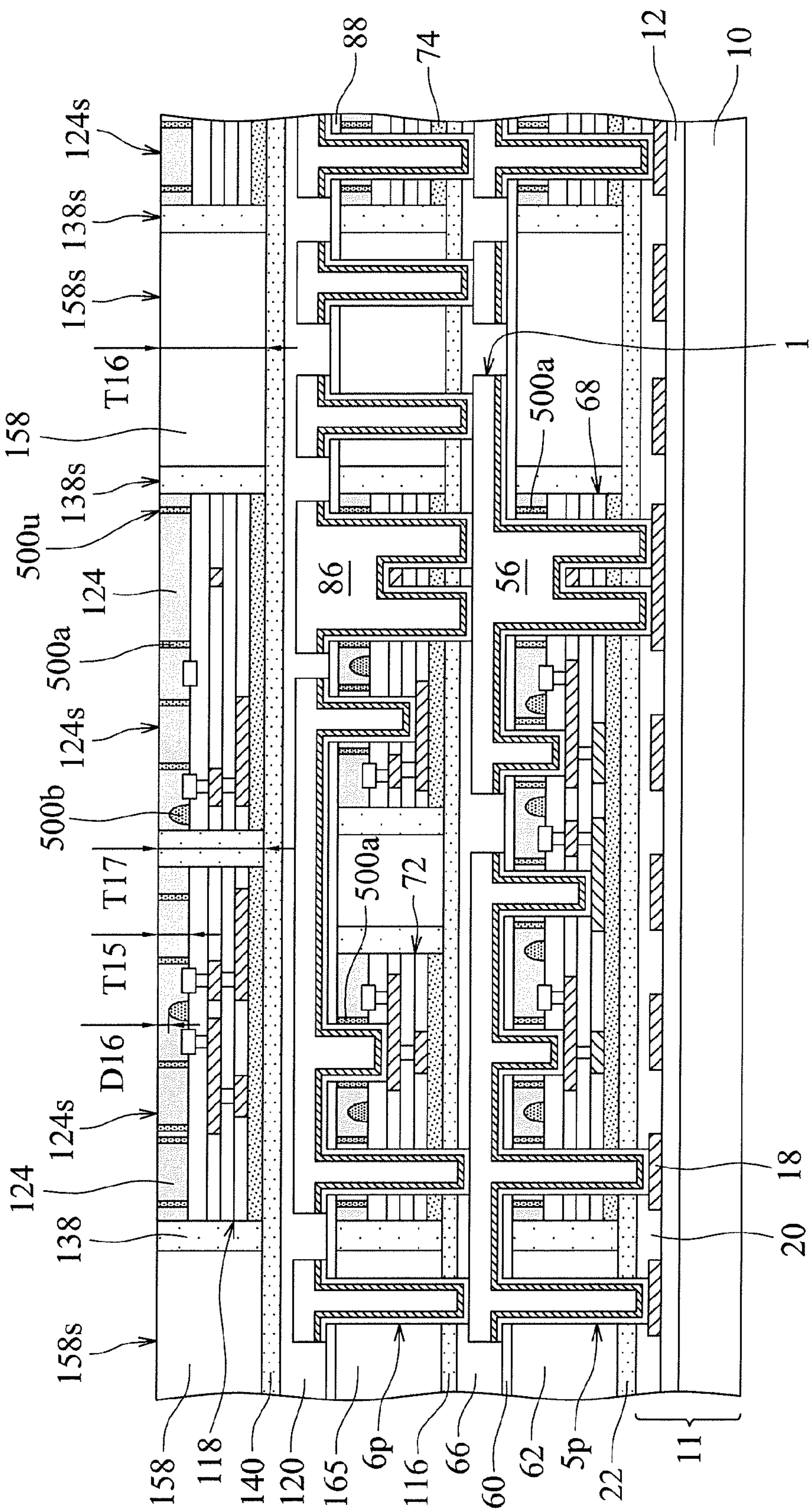

Referring to FIG. 203, after the steps illustrated in FIGS. 200 and 201 or in FIGS. 200 and 202, an encapsulation/gap filling material 138 is formed on a backside of the semiconductor substrate 124 of each chip 118, on the dummy substrate(s) 158, and in the gaps **4*b* and 8*b*. Next, the encapsulation/gap filling material 138, the backside of the semiconductor substrate 124 of each chip 118, and the dummy substrate(s) 158 are ground or polished by a suitable process, such as mechanical grinding process, mechanical polishing process, chemical-mechanical-polishing (CMP) process, or a process including mechanical grinding and chemical-mechanical polishing, until all of the insulating rings 500*a* in the chips 118 have exposed bottom surfaces 500*u*, over which there are no portions of the semiconductor substrates 124. The steps of forming the encapsulation/gap filling material 138 and grinding or polishing the encapsulation/gap filling material 138, the backside of the semiconductor substrate 124 of each chip 118, and the dummy substrate(s) 158 illustrated in FIG. 203 can be referred to as the steps of forming the encapsulation/gap filling material 64 and grinding or polishing the encapsulation/gap filling material 64, the backside of the semiconductor substrate 58 of each chip 68, and the dummy substrate(s) 62 as illustrated in FIGS. 143-146. The encapsulation/gap filling material 138** can be polysilicon, silicon oxide, or a polymer.

Accordingly, the semiconductor substrate 124 of each of the chips 118 can be thinned to a thickness T15, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 118, after the grinding or polishing process, the insulating rings **500*a* and the semiconductor substrate 124 may have the same thickness T15. Preferably, each of the chips 118**, after the grinding or polishing process, may have a thickness, e.g., between 3 and 105 micrometers, and preferably between 3 and 30 micrometers or between 5 and 25 micrometers.

After the grinding or polishing process, the dummy substrate(s) 158 can be thinned to a thickness T16, e.g., between 3 and 100 micrometers, and preferably between 3 and 30 micrometers or between 5 and 25 micrometers, and the encapsulation/gap filling material 138 remaining in the gaps **4*b* and 8*b* may have a vertical thickness T17, e.g., between 3 and 100 micrometers, and preferably between 3 and 30 micrometers or between 5 and 25 micrometers. The ground or polished surface 124*s* of the semiconductor substrate 124, at the backside of each chip 118, and the ground or polished surface(s) 158*s* of the dummy substrate(s) 158 can be substantially flat and not covered by the encapsulation/gap filling material 138. The ground or polished surface(s) 158*s* may be substantially coplanar with the ground or polished surfaces 124*s* of the chips 118, with the ground or polished surface 138*s* of the encapsulation/gap filling material 138 in the gaps 4*b* and 8*b*, and with the exposed bottom surfaces 500*u* of the insulating rings 500*a* in the chips 118. In each chip 118, a vertical distance D16 between the ground or polished surface 124*s* of the semiconductor substrate 124 and the bottom of the shallow trench isolation 500*b*** can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Figure 204:
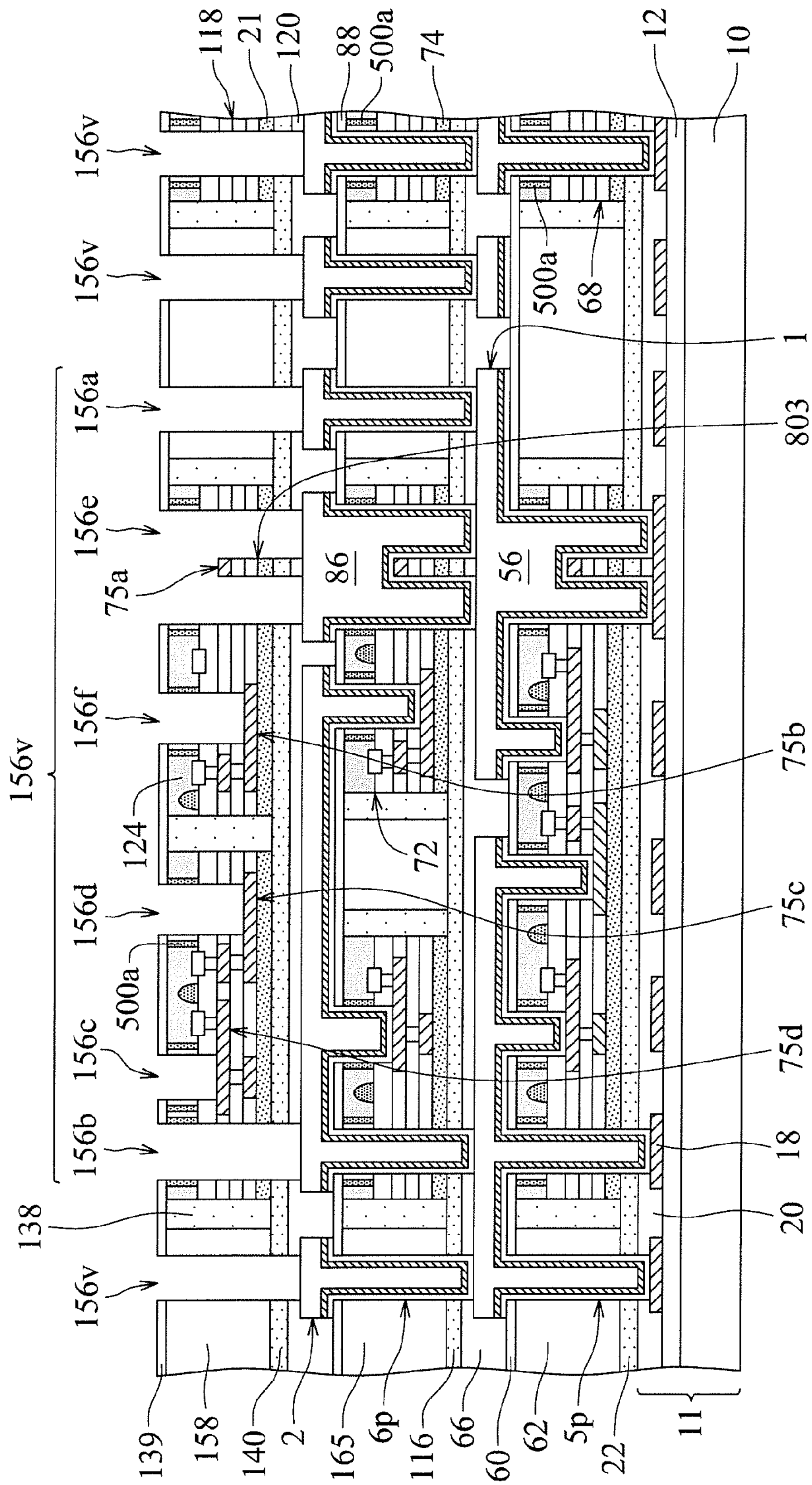

Next, referring to FIG. 204, a dielectric layer 139 having a thickness, e.g., between 0.1 and 100 micrometers, and preferably between 0.2 and 1.5 micrometers, between 1 and 5 micrometers, between 5 and 10 micrometers, or between 1 and 20 micrometers, is formed on the surface **124*s* of the semiconductor substrate 124 of each chip 118, on the surface(s) 158*s* of the dummy substrate(s) 158, on the exposed bottom surfaces 500*u* of the insulating rings 500*a* in the chips 118, and on the surface 138*s* of the encapsulation/gap filling material 138. Next, multiple through vias 156*v*, including through vias 156*a*, 156*b*, 156*c*, 156*d*, 156*e* and 156*f*, can be formed in the chips 118 and in the dummy substrate(s) 158, exposing the conduction layer 86 of the metal interconnects 2 and exposing the layers 17 and 19 of the chips 118. The steps of forming the through vias 156*v* in the chips 118 and in the dummy substrate(s) 158 illustrated in FIG. 204 can be referred to as the steps of forming the through vias 156*v* in the chips 118 and in the dummy substrate(s) 158 as illustrated in FIG. 65, but, in the embodiment, forming the through vias 156*v* in the chips 118 includes etching through the semiconductor substrates 124 enclosed by the insulating rings 500*a* in the chips 118. The specifications of the through vias 156*v* (including the vias 156*a*-156*f*), the insulating rings 500*a* enclosing the through vias 156*v*, and the supporter 803 shown in FIG. 204 can be referred to as the specifications of the through vias 156*v* (including the vias 156*a*-156*f*), the insulating rings 500***a* enclosing the through vias 156*v*, and the supporter 803, respectively, illustrated in FIGS. 173-177.

The dielectric layer 139 shown in FIG. 204, for example, can be an inorganic layer formed by a suitable process, such as chemical vapor deposition (CVD) process or plasma-enhanced chemical vapor deposition (PECVD) process. The inorganic layer may include or can be a layer of silicon oxide (such as $SiO_2$), silicon nitride (such as $Si_3N_4$), silicon carbon nitride (such as SiCN), silicon oxynitride (such as SiON), or silicon oxycarbide (such as SiOC) on the surfaces 124*s*, 158*s*, 500*u* and 138*s*. The inorganic layer may have a thickness, e.g., between 0.1 and 5 micrometers, and preferably between 0.2 and 1.5 micrometers or between 0.5 and 2 micrometers.

Alternatively, the dielectric layer 139 shown in FIG. 204 can be a polymer layer, such as a layer of polyimide, epoxy, benzocyclobutane (BCB), polybenzoxazole (PBO), or polyphenylene oxide (PPO), having a thickness between 3 and 100 micrometers, and preferably between 5 and 30 micrometers or between 10 and 50 micrometers, on the surfaces 124*s*, 158*s*, 500*u* and 138*s*.

Alternatively, the dielectric layer 139 shown in FIG. 204 can be composed of an inorganic layer and a polymer layer on the inorganic layer. The inorganic layer can be formed on the surfaces 124*s*, 158*s*, 500*u* and 138*s* using a suitable process, such as chemical vapor deposition (CVD) process. The inorganic layer may include or can be a layer of silicon oxide (such as $SiO_2$), silicon nitride (such as $Si_3N_4$), silicon carbon nitride (such as SiCN), silicon oxynitride (such as SiON), or silicon oxycarbide (such as SiOC) on the surfaces 124*s*, 158*s*, 500*u* and 138*s*. The inorganic layer may have a thickness, e.g., between 0.1 and 5 micrometers, and preferably between 0.2 and 1.5 micrometers or between 0.5 and 2 micrometers. The polymer layer can be a layer of polyimide, benzocyclobutane (BCB), epoxy, polybenzoxazole (PBO), or poly-phenylene oxide (PPO) having a thickness between 3 and 100 micrometers, and preferably between 5 and 30 micrometers or between 10 and 50 micrometers, on the inorganic layer.

Figure 205:
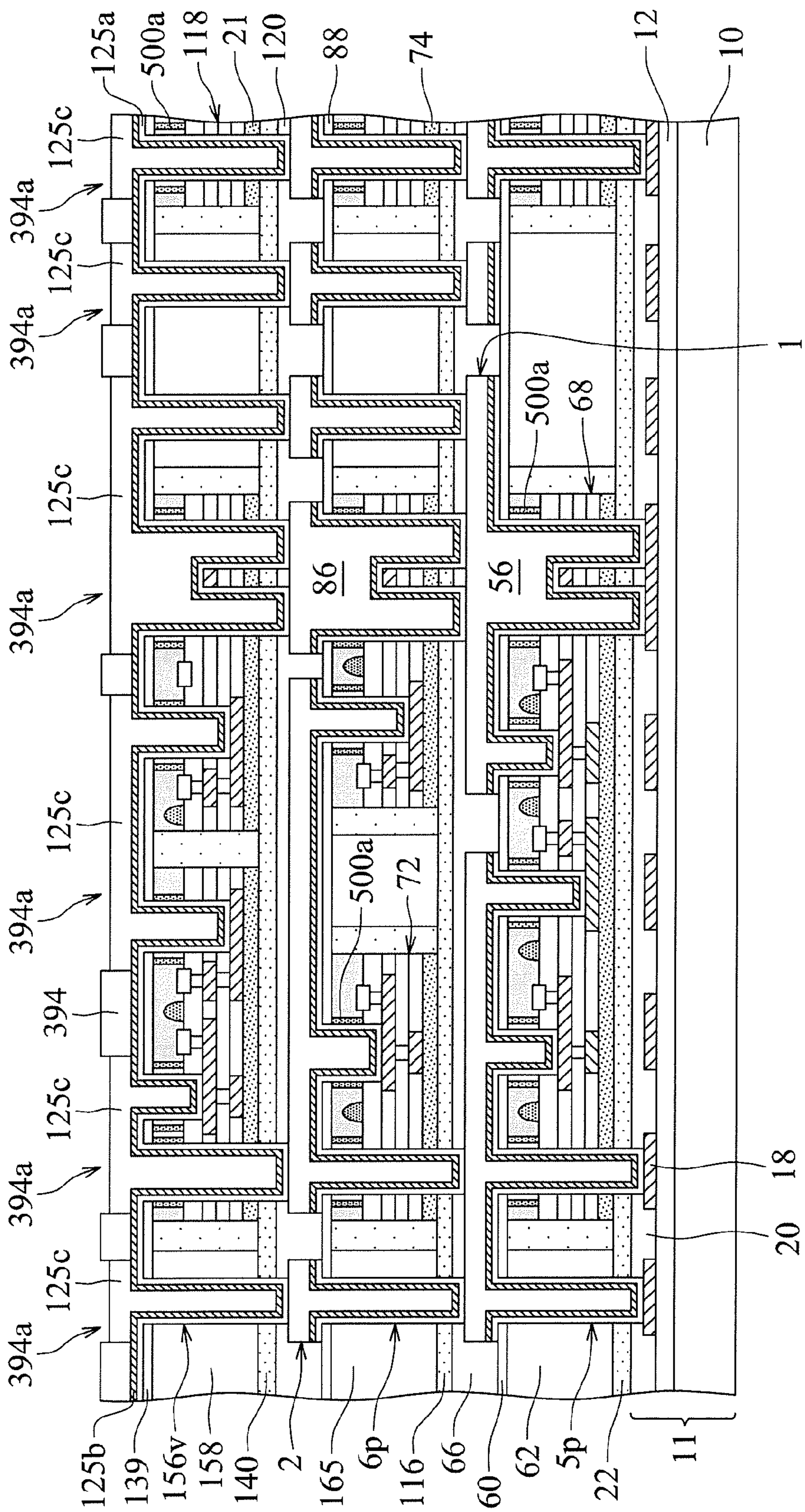

Next, referring to FIG. 205, an adhesion/barrier layer 125*a* having a thickness smaller than 1 micrometer, such as between 1 nanometer and 0.5 micrometers, and preferably between 0.1 and 0.2 micrometers, is formed on the layers 17, 19 and 86 exposed by the through vias 156*v*, on sidewalls of the through vias 156*v*, on the dielectric layer 139, and on the interconnect or metal trace 75*a* that is on the supporter 803. The adhesion/barrier layer 125*a* can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 125*b* having a thickness smaller than 1 micrometer, such as between 10 nanometers and 0.8 micrometers, and preferably between 80 nanometers and 0.15 micrometers, is formed on the adhesion/barrier layer 125*a* and in the through vias 156*v* by a physical vapor deposition (PVD) process, such as sputtering process or evaporation process, by a chemical-vapor deposition (CVD) process, or by other thin-film deposition processes, such as atomic layer deposition (ALD). Next, a photoresist layer 394 is formed on the seed layer 125*b* by using, e.g., a spin coating process, a screen printing process, or a lamination process. Next, a photo exposure process and a development process can be employed to form multiple openings 394*a*, exposing multiple regions of the seed layer 125*b*, in the photoresist layer 394. The patterned photoresist layer 394 may have a thickness, e.g., between 1 and 30 micrometers, and preferably between 1 and 20 micrometers or between 1 and 10 micrometers. Next, a conduction layer 125*c* having a thickness greater than 1 micrometer, such as between 1 and 20 micrometers, and preferably between 1 and 10 micrometers, between 1 and 5 micrometers, or between 2 and 20 micrometers, can be formed on the regions, exposed by the openings 394*a* in the layer 394, of the seed layer 125*b* by using a suitable process, such as electroplating process. The specifications of the adhesion/barrier layer 125*a*, the seed layer 125*b*, and the conduction layer 125*c* shown in FIG. 205 can be referred to as the specifications of the adhesion/barrier layer 125*a*, the seed layer 125*b*, and the conduction layer 125*c* as illustrated in FIG. 100, respectively.

Figure 206:
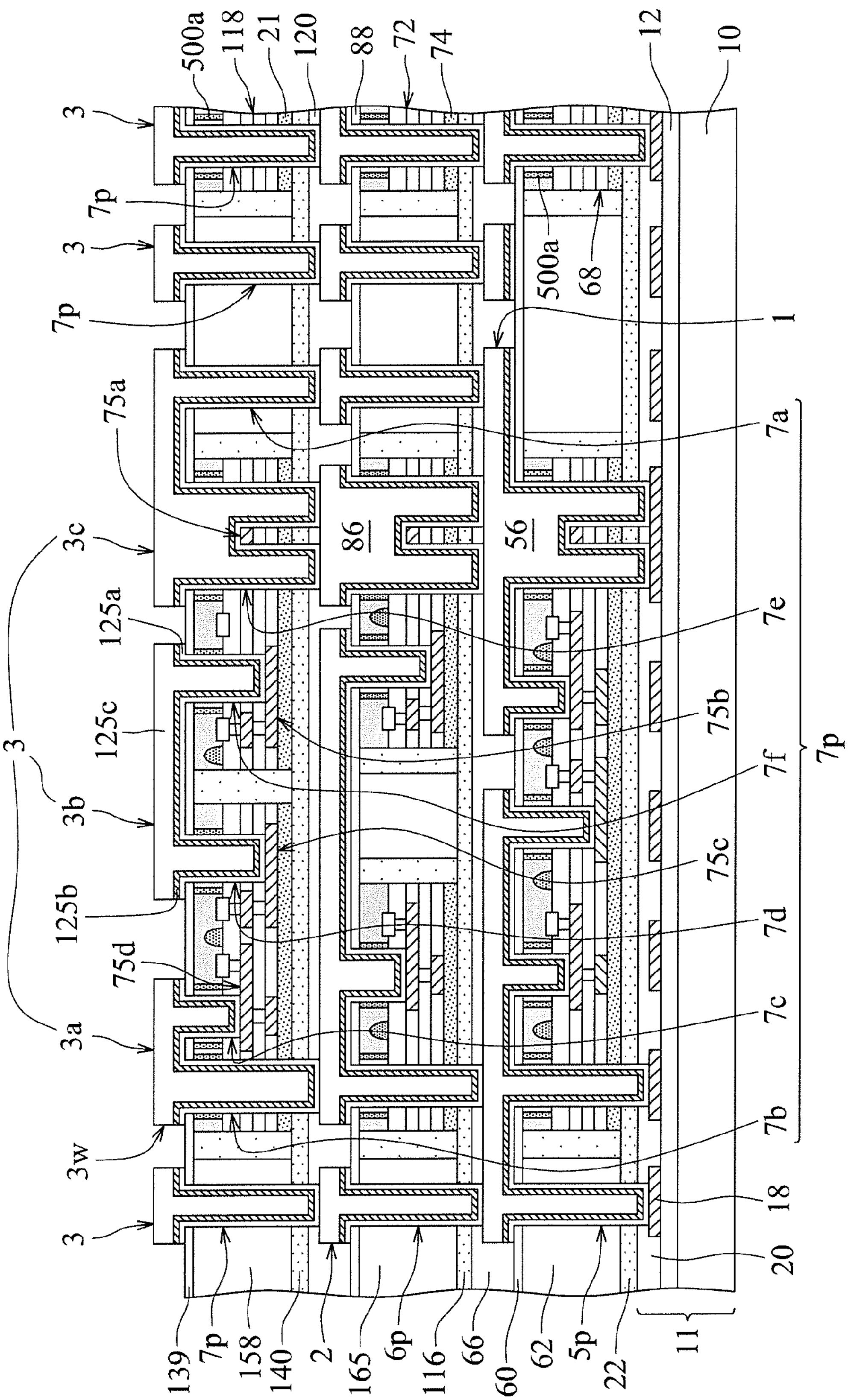

Next, referring to FIG. 206, the photoresist layer 394 is removed using, e.g., an organic chemical solution. Next, the seed layer 125*b* not under the conduction layer 125*c* is removed by using a wet etching process or a dry etching process. Next, the adhesion/barrier layer 125*a* not under the conduction layer 125*c* is removed by using a wet etching process or a dry etching process. Accordingly, the layers 125*a*, 125*b* and 125*c* over the dielectric layer 139 and over the through vias 156*v* compose multiple metal interconnects 3, including metal interconnects 3*a*, 3*b* and 3*c*, over the dielectric layer 139 and over the through vias 156*v*. The adhesion/barrier layer 125*a* and the seed layer 125*b* of the metal interconnects 3 over the dielectric layer 139 are not at any sidewall 3*w* of the conduction layer 125*c* of the metal interconnects 3 over the dielectric layer 139, but under a bottom of the conduction layer 125*c* of the metal interconnects 3 over the dielectric layer 139. The sidewalls 3*w* of the conduction layer 125*c* of the metal interconnects 3 over the dielectric layer 139 are not covered by the layers 125*a* and 125*b*. The layers 125*a*, 125*b* and 125*c* in the through vias 156*v* compose multiple metal plugs (or metal vias) 7*p* in the through vias 156*v*, including metal plugs (or metal vias) 7*a*, 7*b*, 7*c*, 7*d*, 7*e* and 7*f* in the through vias 156*a*, 156*b*, 156*c*, 156*d*, 156*e* and 156*f* as shown in FIG. 204, respectively. The metal plug 7*a* is formed in the dummy substrate 158, the metal plugs 7*b*, 7*c* and 7*d* are formed in the left one of the chips 118, and the metal plugs 7*e* and 7*f* are formed in the middle one of the chips 118. These metal plugs 7*p* formed in the chips 118 and in the dummy substrate(s) 158 can connect the metal interconnects 3 and the semiconductor devices 13 in the chips 118 and connect the metal interconnects 2 and 3. The supporter 803 and the interconnect or metal trace 75*a*, in the interconnection layer 17, on the supporter 803 can be between two portions, lower than a horizontal level, at which a top surface of the interconnection layer 17 is positioned, of the metal plug 7*e*.

Each of the metal plugs 7*p* in the chips 118 passes through one of the insulating rings 500*a* in the chips 118. For example, the metal plugs 7*b*, 7*c* and 7*d* in the left one of the chips 118 pass through the insulating rings 500*a* in the left one of the chips 118, and the metal plugs 7*e* and 7*f* in the middle one of the chips 118 pass through the insulating rings 500*a* in the middle one of the chips 118. Specifically, each of the metal plugs 7*b*, 7*c* and 7*d* passes through the semiconductor substrate 124 of the left one of the chips 118 and is enclosed by one of the insulating rings 500*a* in the left one of the chips 118, and each of the metal plugs 7*e* and 7*f* passes through the semiconductor substrate 124 of the middle one of the chips 118 and is enclosed by one of the insulating rings 500*a* in the middle one of the chips 118. The semiconductor substrate 124 of the left one of the chips 118 has portions on inner surfaces of the insulating rings 500*a* enclosing the metal plugs 7*c* and 7*d*, and the semiconductor substrate 124 of the middle one of the chips 118 has portions on inner surfaces of the insulating rings 500*a* enclosing the metal plugs 7*e* and 7*f*. The insulating ring 500*a* enclosing the metal plug 7*b* is at the sidewall of the metal plug 7*b* and contacts the metal plug 7*b*. The insulating ring 500*a* enclosing the metal plug 7*d* has a portion at and in contact with the sidewall of the metal plug 7*d*. The insulating ring 500*a* enclosing the metal plug 7*f* has a portion at and in contact with the sidewall of the metal plug 7*f*. For more detailed description about the metal plugs 7*p* (including the metal plugs 7*a*-7*f*) and the metal interconnects 3 (including the metal interconnects 3*a*, 3*b* and 3*c*) shown in FIG. 206, please refer to the illustration in FIG. 101.

Alternatively, the element 118 not only can indicate a chip, but also can indicate a wafer. When the element 118 is a wafer, the element 72 can be another wafer. Thereby, the process illustrated in the invention can be employed to the wafer-to-wafer bonding.

Figure 207:
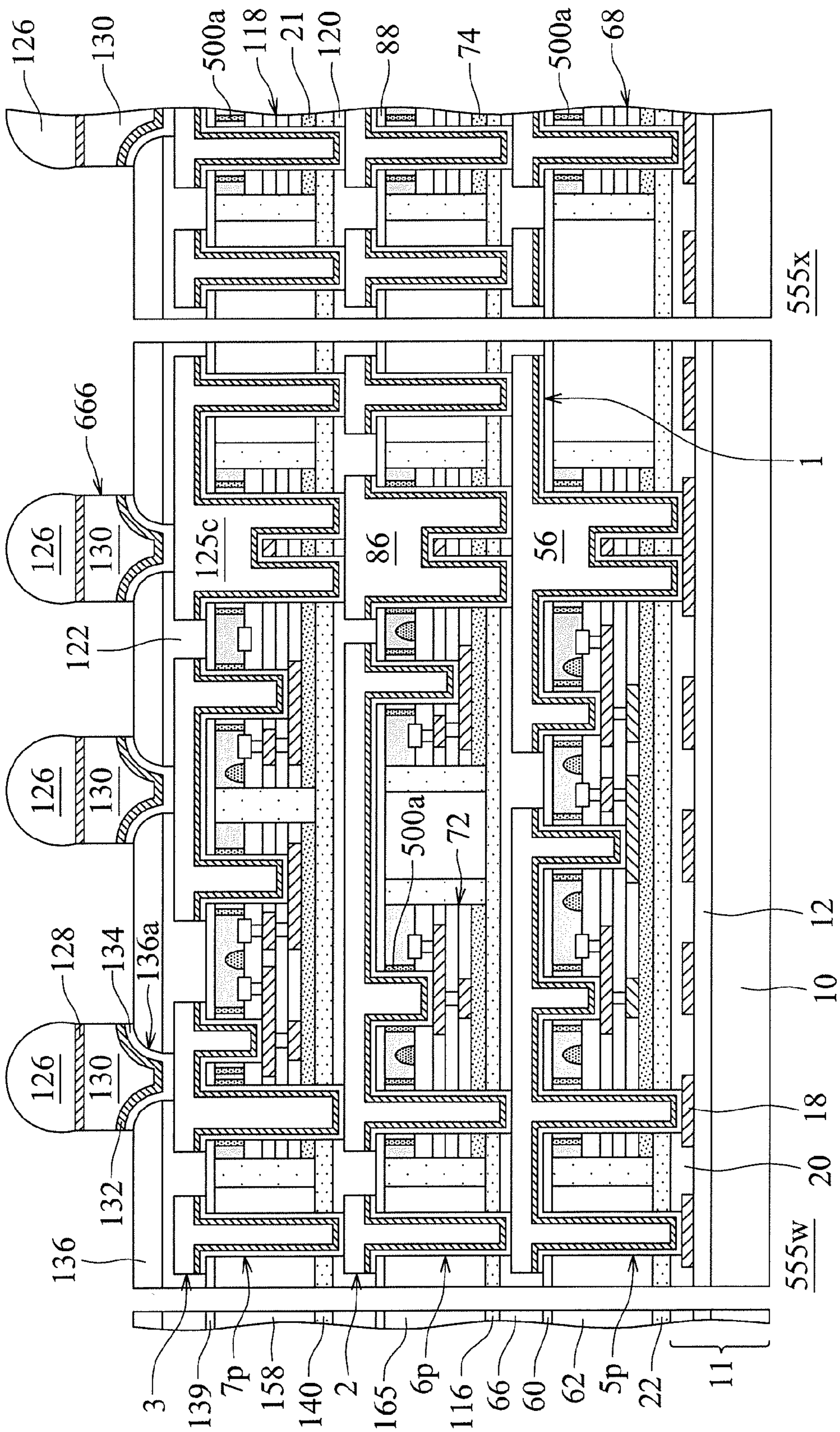

Referring to FIG. 207, after forming the structure illustrated in FIG. 206, the following steps can be subsequently performed as illustrated in FIG. 102 to form the insulating or dielectric layer 122 on the conduction layer 125*c* of the metal interconnects 3, on the dielectric layer 139, and in gaps between the metal interconnects 3, to form the polymer layer 136 on the insulating or dielectric layer 122, and to form multiple openings 136*a*, exposing multiple regions of the insulating or dielectric layer 122, in the polymer layer 136. Next, forming an under bump metallurgic (UBM) layer 666 on the polymer layer 136 and on multiple contact points, at bottoms of multiple openings in the insulating or dielectric layer 122 and under the openings 136*a* in the polymer layer 136, of the conduction layer 125*c* of the metal interconnects 3 and forming multiple solder bumps or balls 126 on the UBM layer 666 can be referred to as the steps illustrated in FIGS. 78-81. Next, a singulation process is performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in packages or multichip modules 555*w* and 555*x*.

Figure 208:
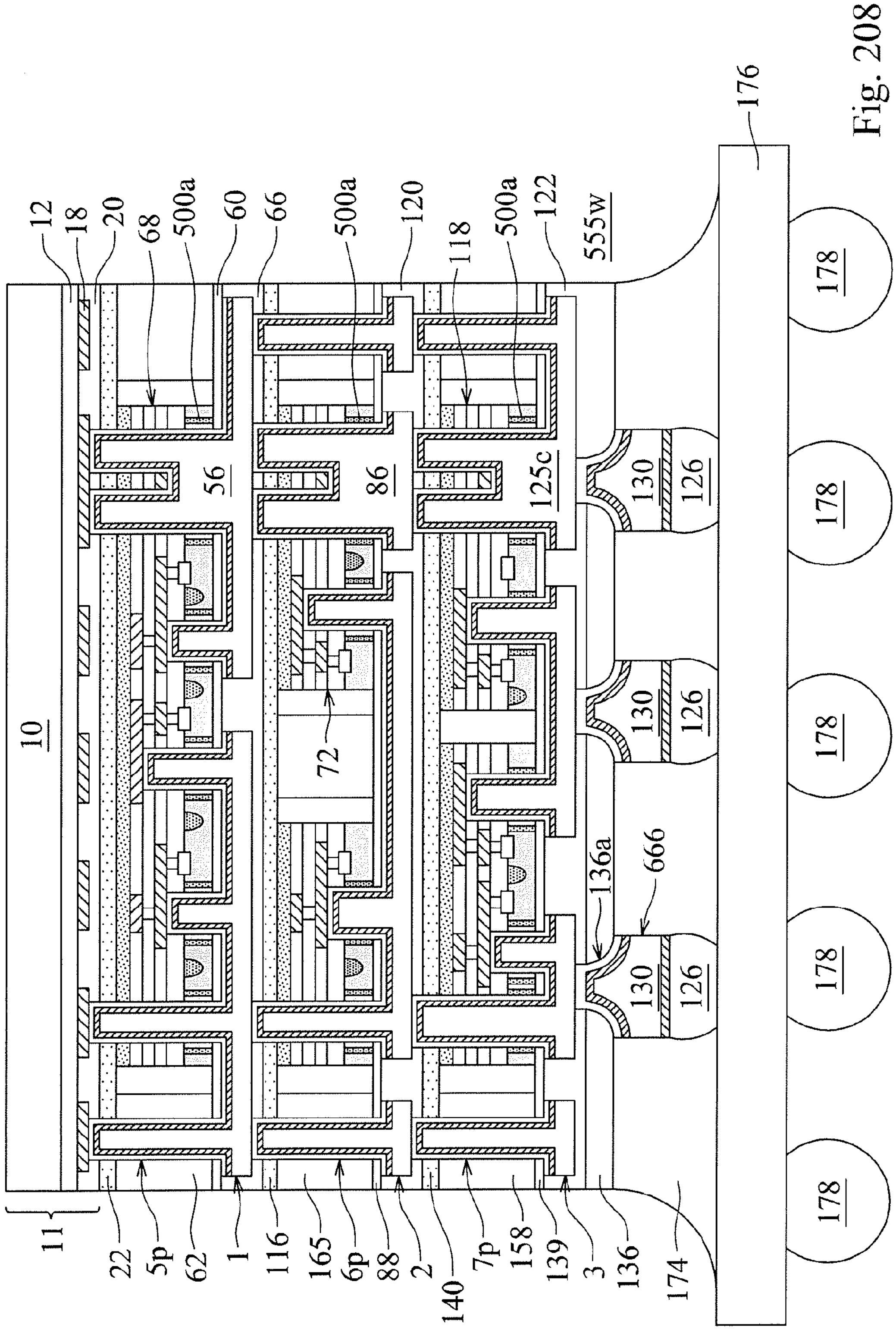
FIG. 208 shows a cross-sectional view of a multichip package according to an embodiment of the present disclosure.

The system-in package or multichip module 555*w* can be connected to and bonded with a carrier, such as mother board, printed circuit board (PCB), ball-grid-array (BGA) substrate, metal substrate, glass substrate, or ceramic substrate, using the solder bumps or balls 126. For example, referring to FIG. 208, the system-in package or multichip module 555*w* is bonded with the top side of the carrier 176 illustrated in FIG. 83 using, e.g., a flip chip technology of joining the solder bumps or balls 126 with a solder or gold layer preformed on the top side of the carrier 176. Next, the under fill 174 illustrated in FIG. 83 is formed between the polymer layer 136 of the system-in package or multichip module 555*w* and the top side of the carrier 176 and encloses the solder bumps or balls 126. Next, the solder balls 178 illustrated in FIG. 83 are formed on the bottom side of the carrier 176.

Figure 209:
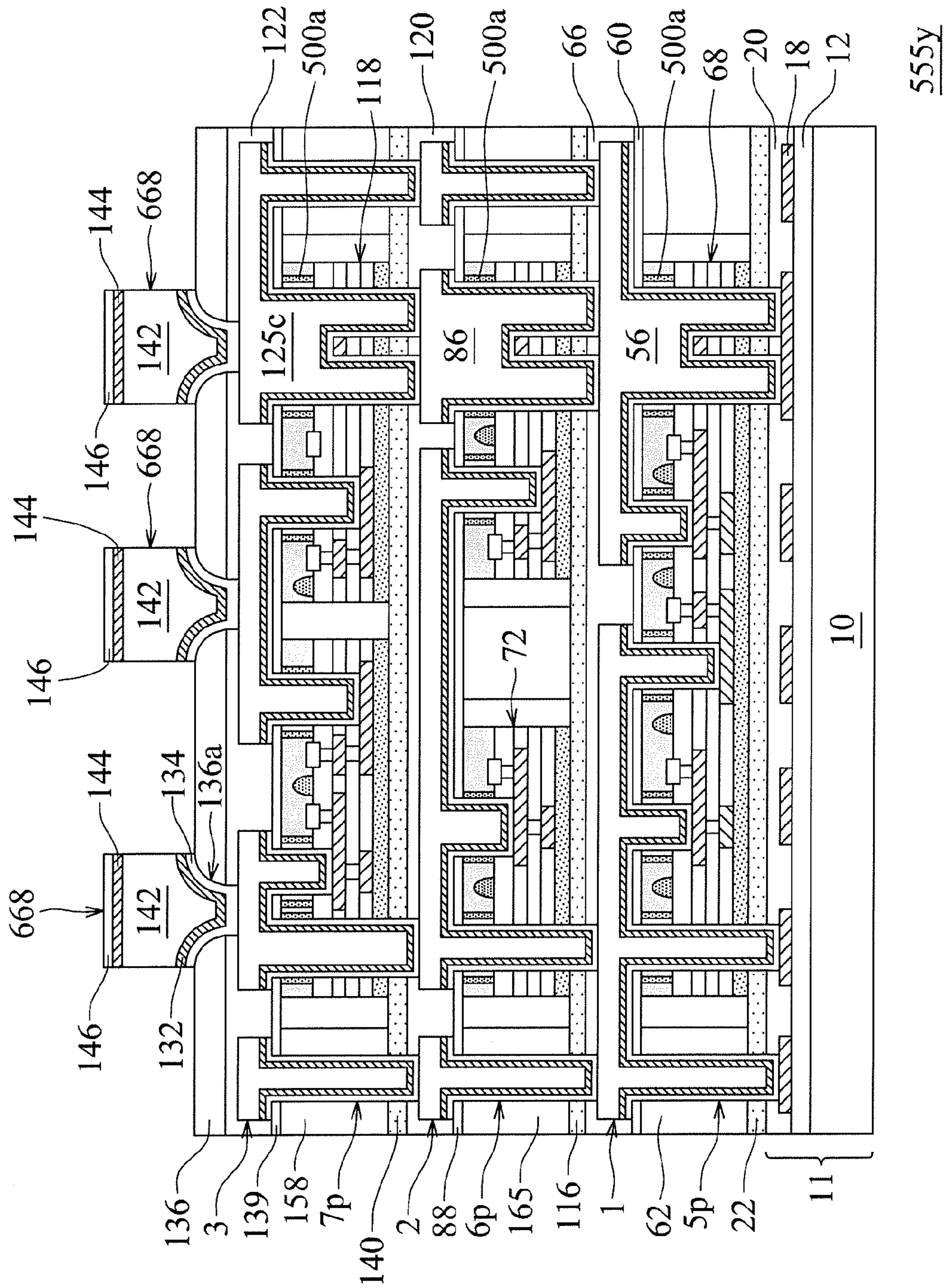
FIG. 209 shows a cross-sectional view of a system-in package or multichip module according to an embodiment of the present disclosure.

FIG. 209 shows another system-in package or multichip module according to another embodiment of the present disclosure, which can be formed by the following steps. After forming the structure illustrated in FIG. 206, the following steps can be subsequently performed as illustrated in FIG. 102 to form the insulating or dielectric layer 122 on the conduction layer 125*c* of the metal interconnects 3, on the dielectric layer 139, and in gaps between the metal interconnects 3, to form the polymer layer 136 on the insulating or dielectric layer 122, and to form multiple openings 136*a*, exposing multiple regions of the insulating or dielectric layer 122, in the polymer layer 136. Next, the steps illustrated in FIGS. 78 and 79 can be subsequently performed. Next, forming metal bumps 668 on the polymer layer 136 and on contact points, at bottoms of openings in the insulating or dielectric layer 122 and under the openings 136*a* in the polymer layer 136, of the conduction layer 125*c* of the metal interconnects 3 can be referred to as the steps illustrated in FIG. 84. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in package or multichip module 555*y*. In the system-in package or multichip module 555*y*, each of the interconnects 3 can be connected to one or more of the metal bumps 668.

Figure 210:
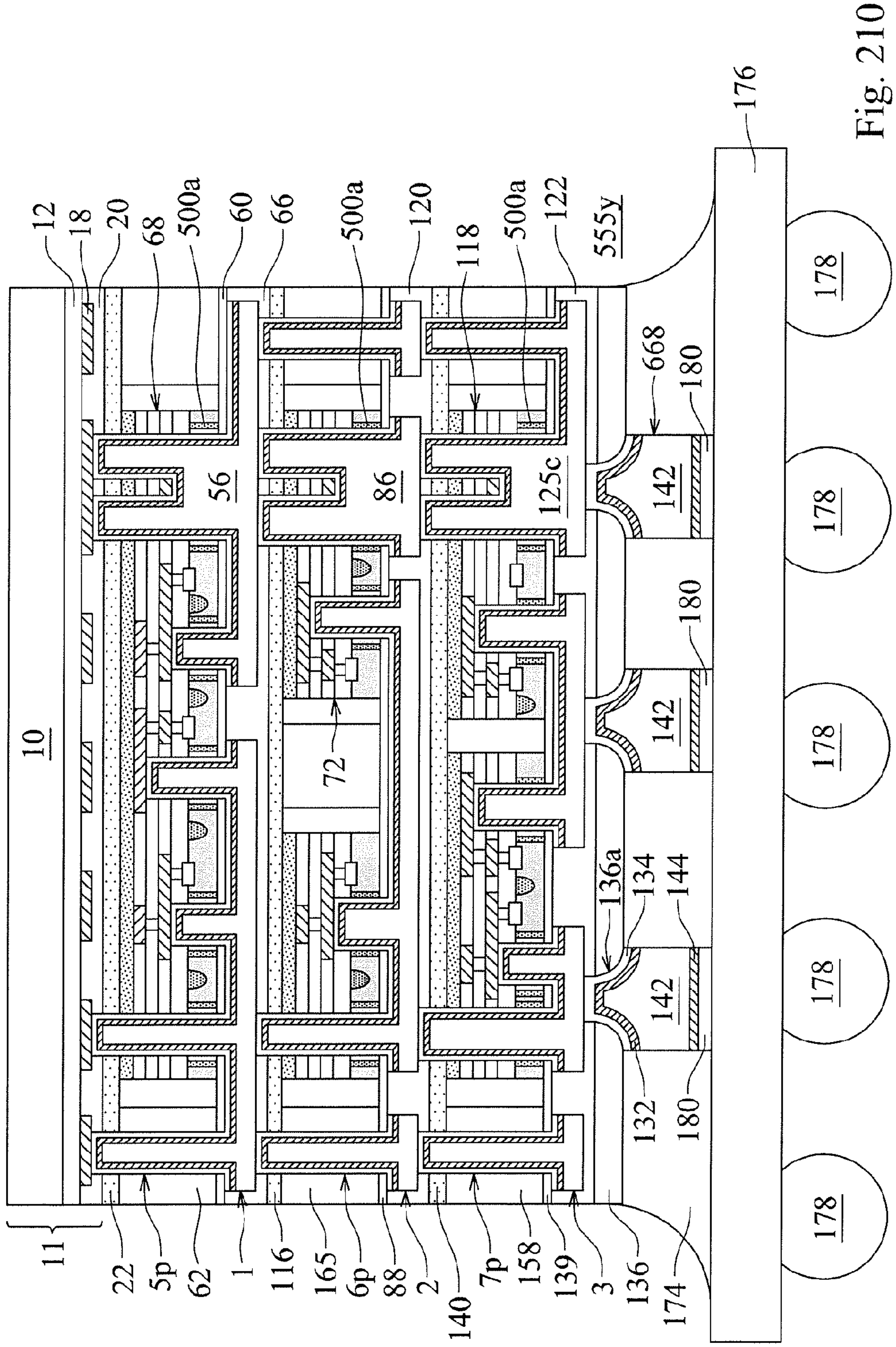
FIG. 210 shows a cross-sectional view of a multichip package according to an embodiment of the present disclosure.

The system-in package or multichip module 555*y* can be connected to and bonded with a carrier, such as mother board, printed circuit board (PCB), ball-grid-array (BGA) substrate, metal substrate, glass substrate, or ceramic substrate, using the metal bumps 668. For example, referring to FIG. 210, the system-in package or multichip module 555*y* can be bonded with the top side of the carrier 176 illustrated in FIG. 83 using, e.g., a flip chip technology of joining the solder wetting layer 146 of the metal bumps 668 with a solder or gold layer preformed on the top side of the carrier 176. After joining the solder wetting layer 146 with the solder or gold layer preformed on the top side of the carrier 176, multiple metal joints 180 are formed between the barrier layer 144 of the metal bumps 668 and the top side of the carrier 176. The metal joints 180 can be a layer of a Sn—Ag alloy, a Sn—Ag—Cu alloy, a Sn—Au alloy, or a Sn—Pb alloy having a thickness between 5 and 50 micrometers. Next, the under fill 174 illustrated in FIG. 83 can be formed between the polymer layer 136 of the system-in package or multichip module 555*y* and the top side of the carrier 176 and encloses the metal bumps 668 and the metal joints 180. Next, the solder balls 178 illustrated in FIG. 83 can be formed on the bottom side of the carrier 176.

Alternatively, the insulating or dielectric layer 122 as shown FIGS. 207-210 can be omitted. In this case, the polymer layer 136 is formed on the conduction layer 125*c* of the metal interconnects 3, on the dielectric layer 139, and in the gaps between the metal interconnects 3, and the contact points of the conduction layer 125*c* of the metal interconnects 3 are exposed by and at ends of the openings 136*a* in the polymer layer 136. Further, the adhesion/barrier layer 134 is formed on the contact points, exposed by and at the ends of the openings 136*a* in the polymer layer 136, of the conduction layer 125*c* of the metal interconnects 3.

Figure 211:
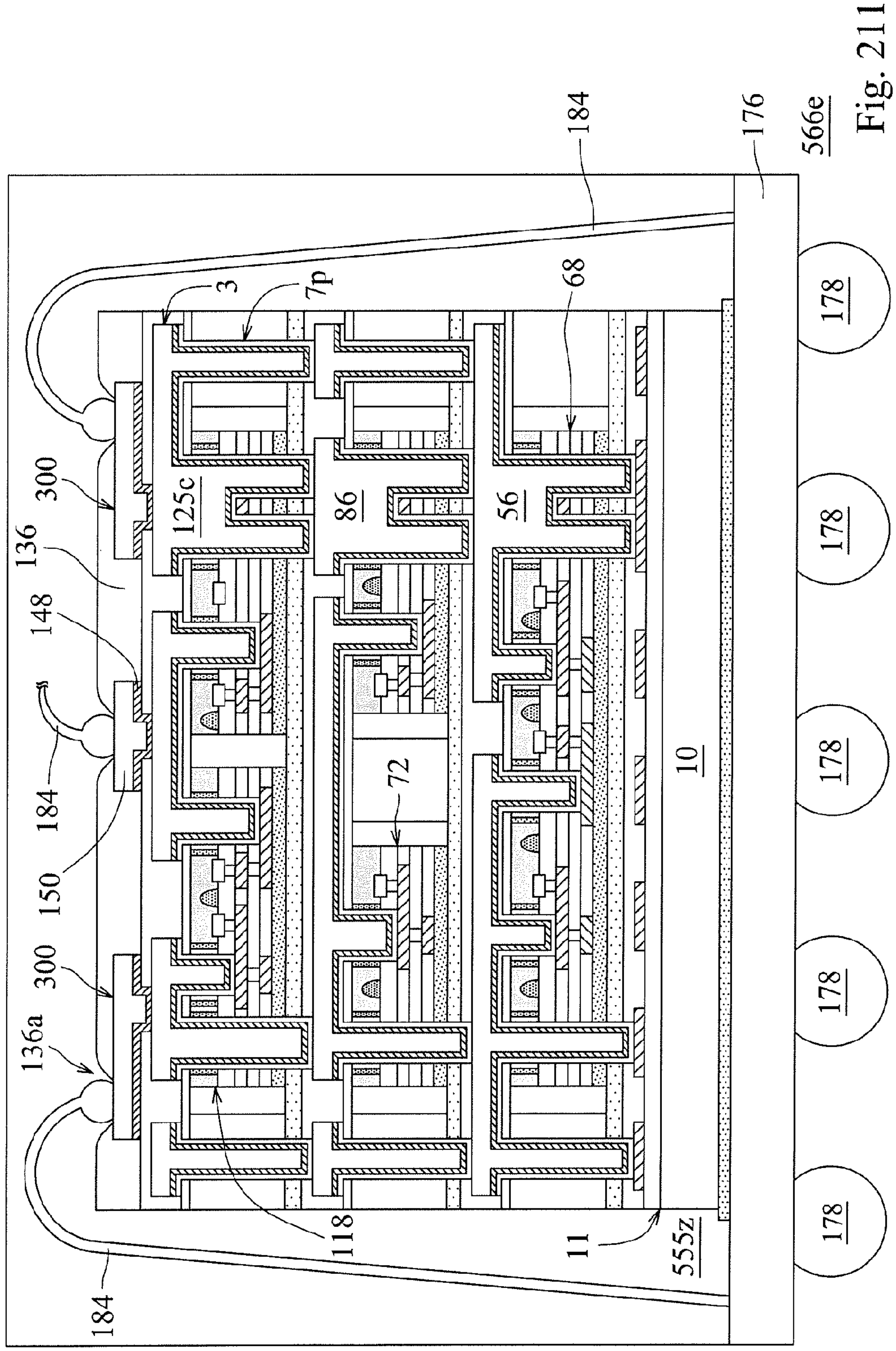
FIG. 211 shows a cross-sectional view of a multichip package according to an embodiment of the present disclosure.

FIG. 211 shows a multichip package 566*e* including a system-in package or multichip module 555*z* connected to the carrier 176 illustrated in FIG. 83 through wirebonded wires 184, which can be formed by, e.g., the following steps. After forming the structure illustrated in FIG. 206, the following steps can be subsequently performed as illustrated in FIG. 107 to form an insulating or dielectric layer 122 on the conduction layer 125*c* of the metal interconnects 3, on the dielectric layer 139, and in gaps between the metal interconnects 3, to form multiple metal interconnects or traces 300 on the insulating or dielectric layer 122 and on multiple regions, exposed by multiple openings 122*a* in the layer 122, of the conduction layer 125*c* of the metal interconnects 3, and to form a polymer layer 136 on the insulating or dielectric layer 122 and on the metal interconnects or traces 300. The polymer layer 136 after being cured may have a thickness, e.g., between 1 and 20 micrometers, and preferably between 2 and 15 micrometers or between 5 and 10 micrometers, and multiple openings 136*a* in the polymer layer 136 expose multiple contact points of the metal interconnects or traces 300. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as the system-in package or multichip module 555z.

Next, a plurality of the system-in package or multichip module 555z can be joined with the carrier 176 shown in FIG. 83 by, e.g., forming a glue layer 182 with a thickness, e.g., between 1 and 20 micrometers or between 20 and 150 micrometers on the top side of the carrier 176, and then attaching the plurality of the system-in package or multichip module 555z to the top side of the carrier 11 using the glue layer 182. The glue layer 182 can be a polymer layer, such as a layer of polyimide, benzocyclobutene (BCB), epoxy, polybenzoxazole (PBO), poly-phenylene oxide (PPO), silosane, or SU-8, with a thickness, e.g., between 1 and 20 micrometers or between 20 and 150 micrometers. Next, multiple wires 184, such as gold wires, copper wires, or aluminum wires, can be wirebonded onto the top side of the carrier 176 and onto the contact points, exposed by the openings 136*a* in the polymer layer 136, of the conduction layer 150 of the metal interconnects or traces 300 by a wirebonding process. Accordingly, the metal interconnects or traces 300 of the plurality of the system-in package or multichip module 555z can be physically and electrically connected to the carrier 176 through the wirebonded wires 184. Next, a molding compound 186 can be formed on the plurality of the system-in package or multichip module 555z, on the top side of the carrier 176 and on the wirebonded wires 184, encapsulating the wirebonded wires 184 and the plurality of the system-in package or multichip module 555z, by a molding process. The molding compound 186 may include epoxy, carbon filler or glass filler, and the glass filler or carbon filler can be distributed in the epoxy. Next, the solder balls 178 illustrated in FIG. 83 can be formed on the bottom side of the carrier 176. Thereafter, a singulation process can be performed to cut the carrier 176 and the molding compound 186 and to singularize a plurality of the multichip package 566*e*. The multichip package 566*e* can be connected to a carrier, such as mother board, ball-grid-array (BGA) substrate, printed circuit board, metal substrate, glass substrate, or ceramic substrate, through the solder balls 178.

Figure 212A:
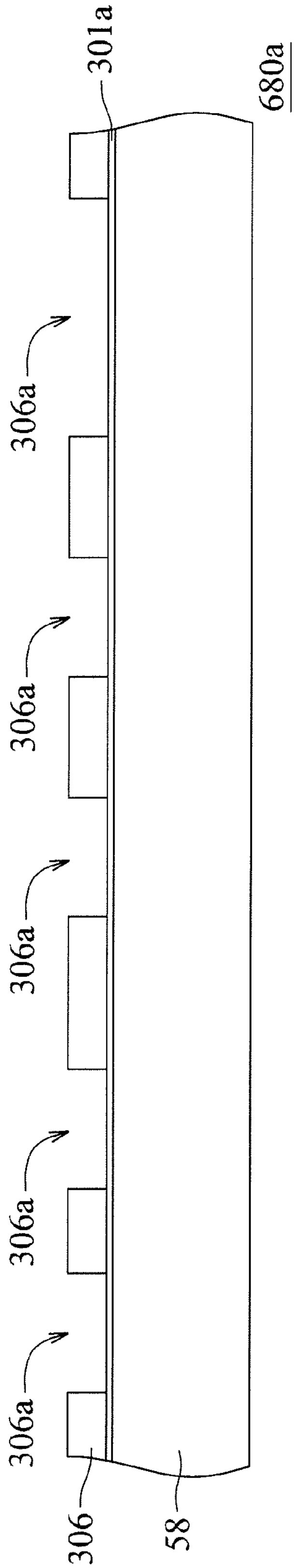
FIGS. 212A-212L show a process for forming chips according to an embodiment of the present disclosure.
Figure 212B:
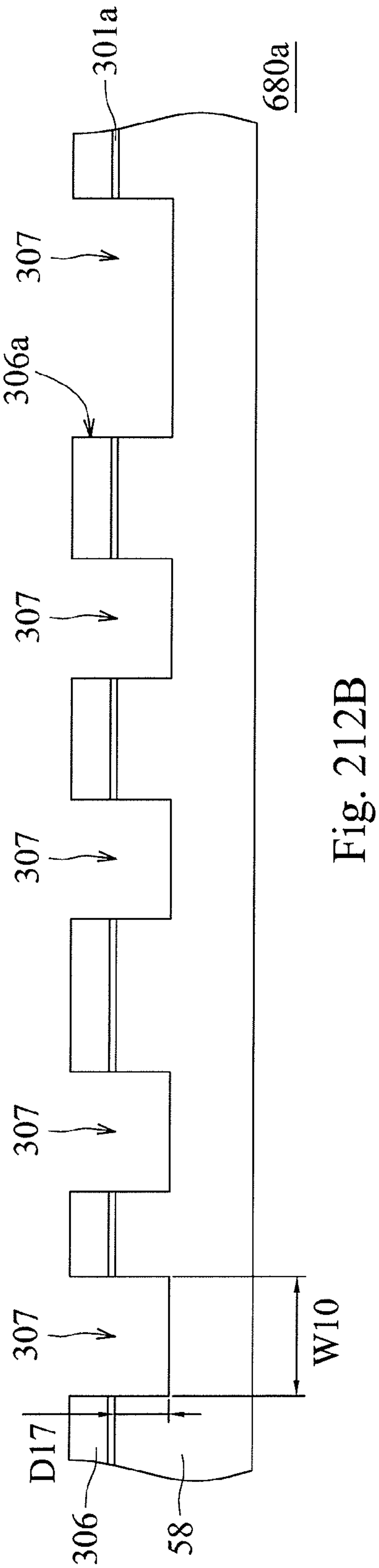
Figure 212C:
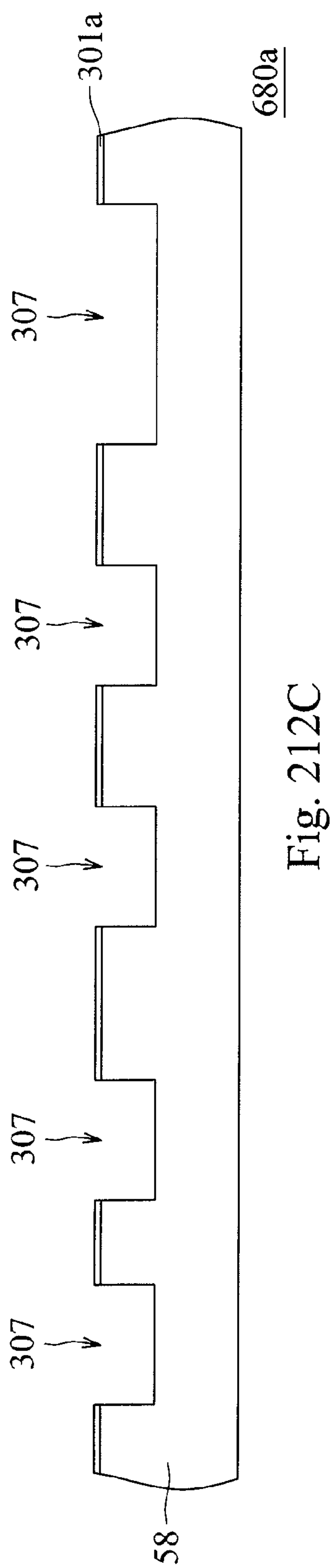
Figure 212D:
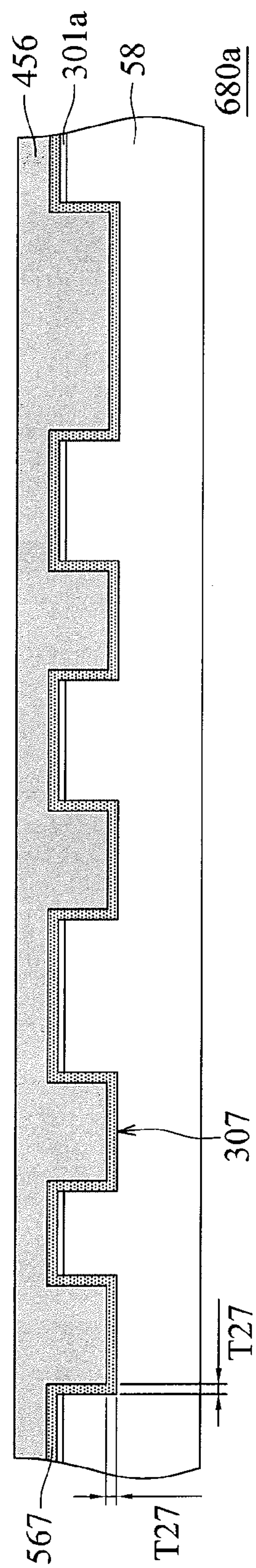
Figure 212E:
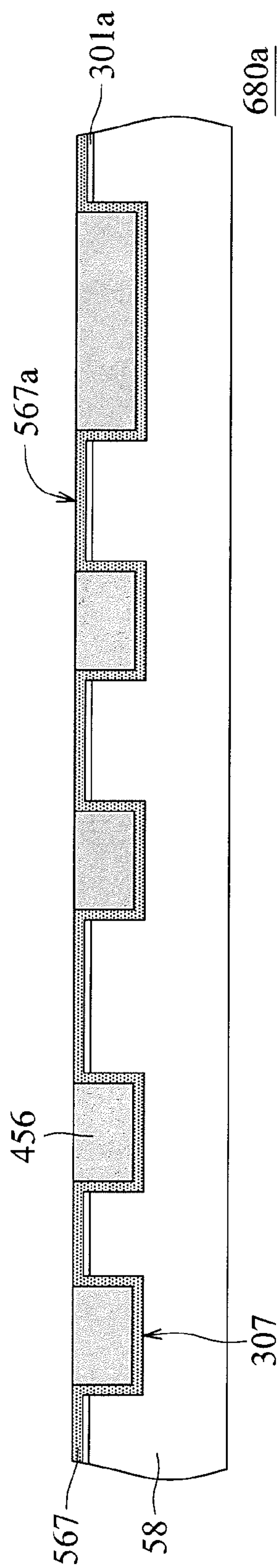
Figure 212F:
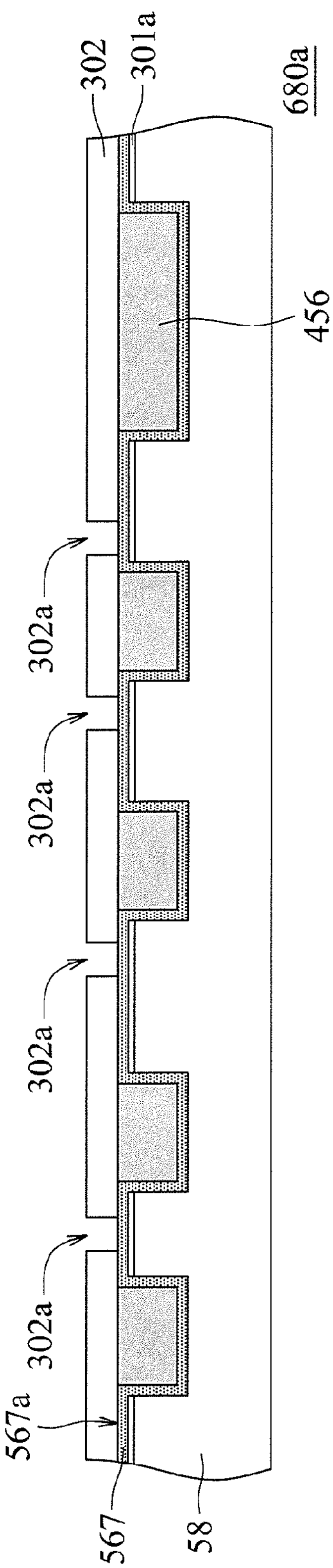
Figure 212G:
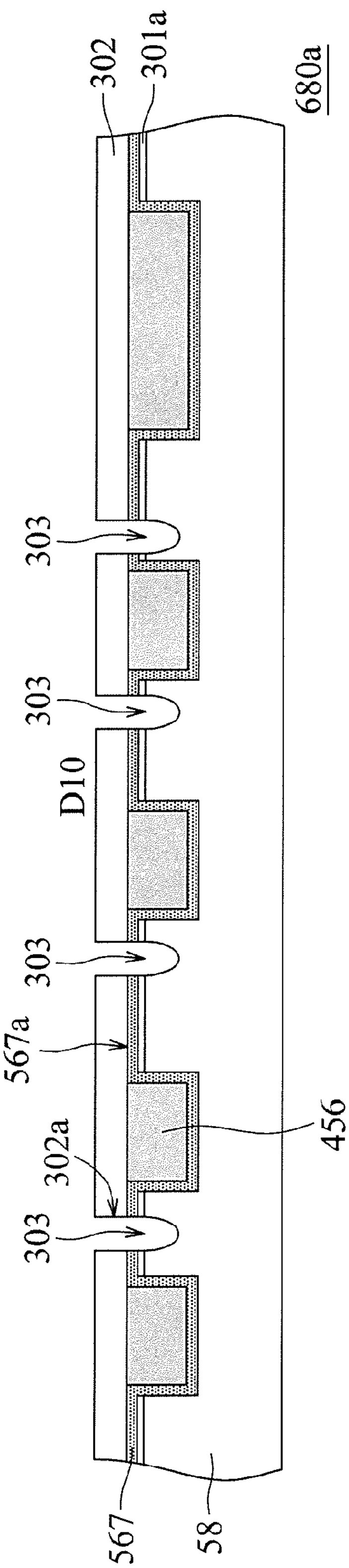
Figure 212H:
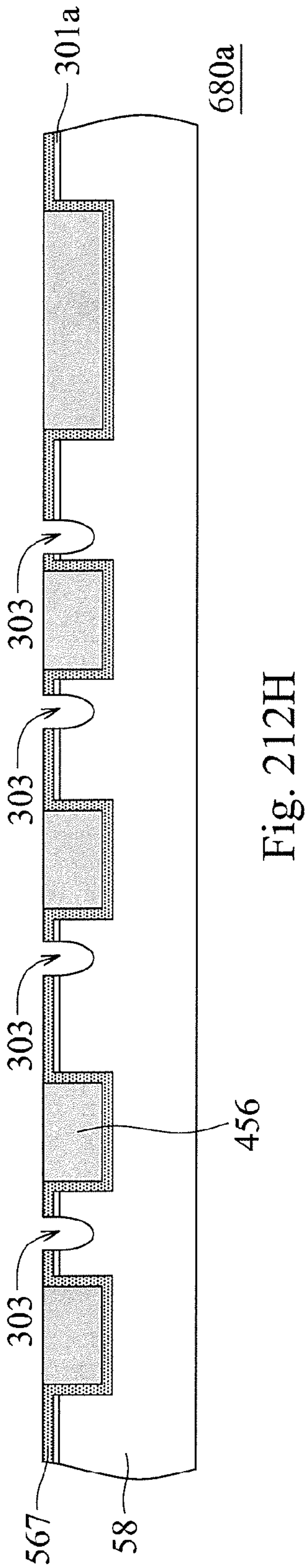
Figure 212I:
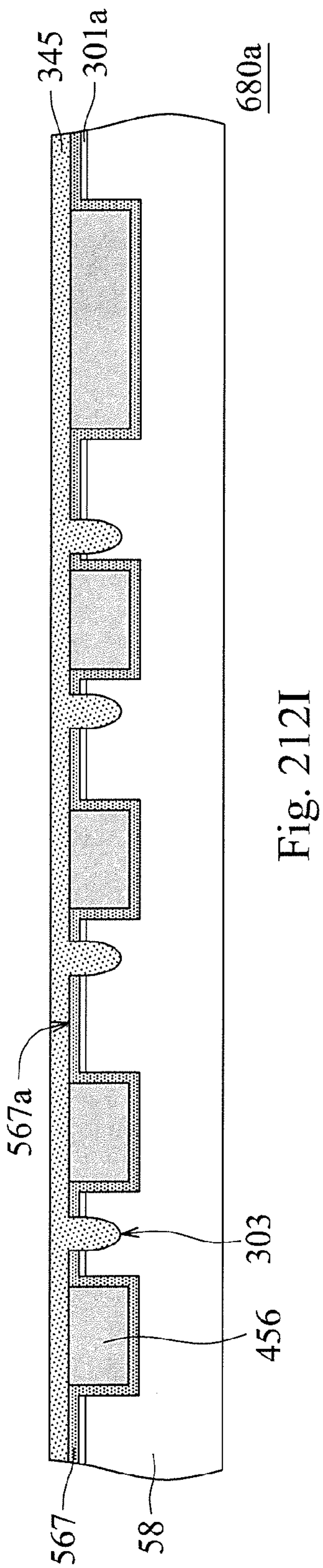
Figure 212J:
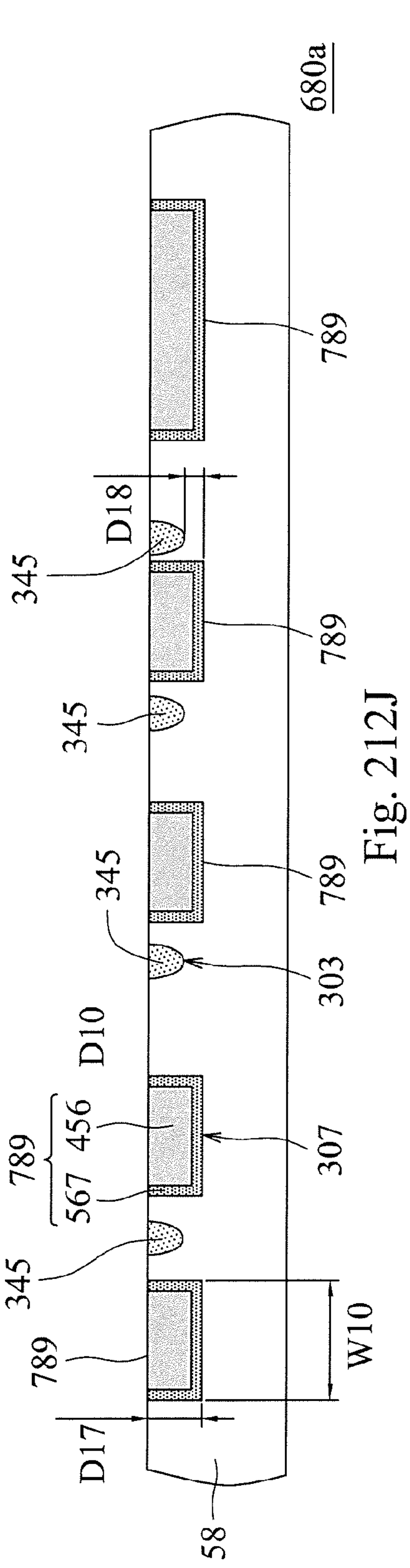
Figure 212K:
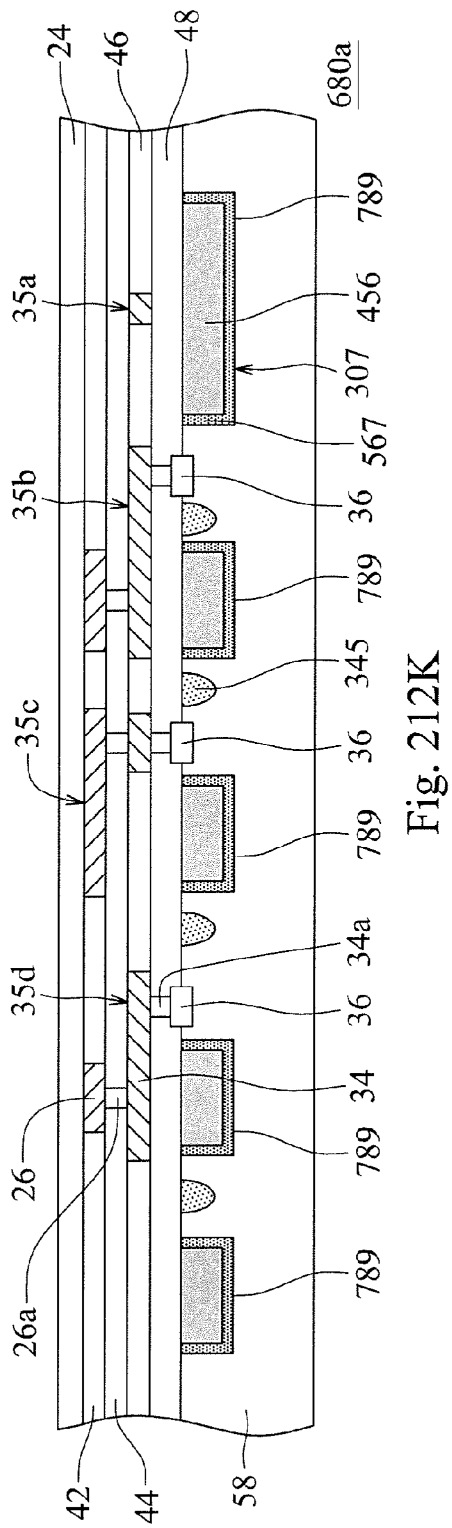
Figure 212L:
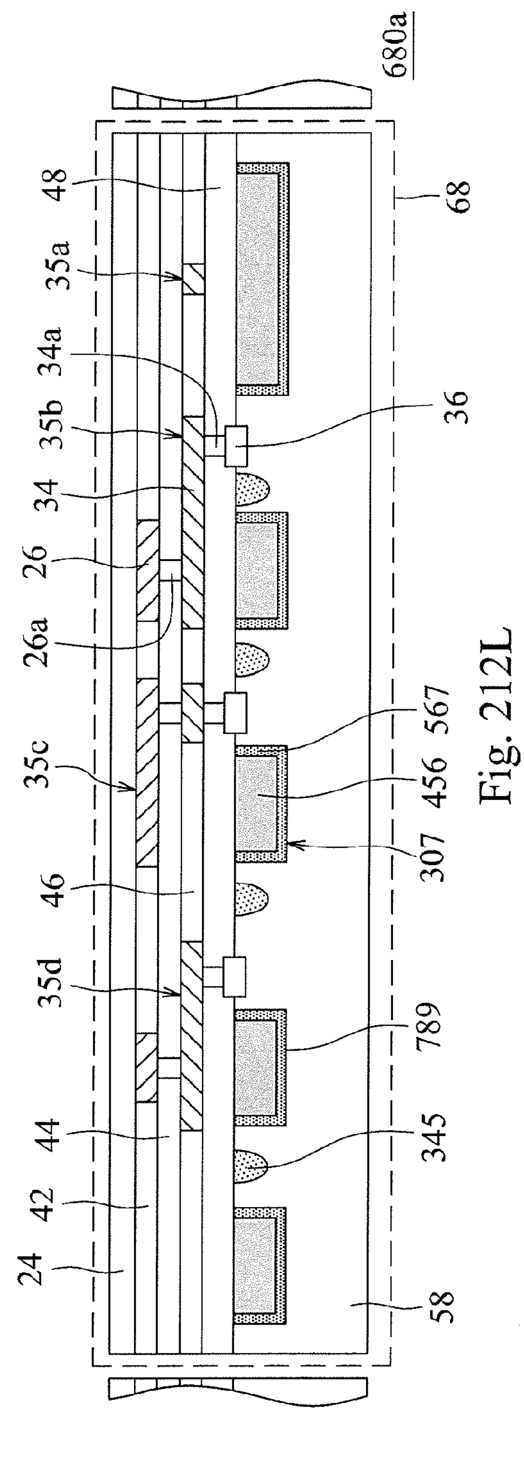

Alternatively, the chips 68 illustrated in FIGS. 7-109 can be replaced with another type of chips 68 shown in FIG. 212L that further include insulating plugs 789 thicker than shallow trench isolation (STI) 345. FIGS. 212A-212L show a process for forming the another type of chips 68 according to an embodiment of the present disclosure. Referring to FIG. 212A, an insulating layer 301*a* is formed on a semiconductor substrate 58 of a wafer 680*a* using a suitable process, such as chemical vapor deposition (CVD) process. The semiconductor substrate 58 can be a silicon-germanium (SiGe) substrate, a gallium-arsenide (GaAs) substrate, or a silicon substrate with a thickness, e.g., greater than 100 micrometers, such as between 100 and 500 micrometers, and preferably between 150 and 250 micrometers or between 100 and 300 micrometers. The insulating layer 301*a*, for example, can be a pad oxide having a thickness between 1 and 20 nanometers, and preferably between 1 and 10 nanometers, on a top surface of the semiconductor substrate 58. After forming the insulating layer 301*a* on the top surface of the semiconductor substrate 58, a patterned photoresist layer 306 is formed on the insulating layer 301*a*. Multiple openings 306*a* in the patterned photoresist layer 306 expose multiple regions of the insulating layer 301*a*.

Next, referring to FIG. 212B, multiple openings 307 are formed in the semiconductor substrate 58 by removing the insulating layer 301*a* under the openings 306*a* and etching the semiconductor substrate 58 under the openings 306*a*, leading the openings 307 with a depth D17 in the semiconductor substrate 58, e.g., between 1 and 100 micrometers, between 1 and 50 micrometers, between 1 and 30 micrometers, between 1 and 10 micrometers, or between 1 and 5 micrometers, and preferably between 2 and 20 micrometers. Each of the openings 307 may have a diameter or width W10, e.g., between 2 and 100 micrometers, between 2 and 50 micrometers, between 2 and 20 micrometers, between 2 and 10 micrometers, or between 2 and 5 micrometers.

Next, referring to FIG. 212C, the patterned photoresist layer 306 is removed using a chemical solution. Next, referring to FIG. 212D, an insulating layer 567 having a thickness T27, e.g., between 10 and 250 nanometers, and preferably between 15 and 150 nanometers, is formed on the insulating layer 301*a* and on sidewalls and bottoms of the openings 307 using a suitable process, such as chemical vapor deposition (CVD) process, and then an insulating layer 456 is formed on the insulating layer 567 and in the openings 307 using a suitable process, such as chemical vapor deposition (CVD) process.

In a first alternative, the insulating layer 567 can be formed by depositing a layer of silicon nitride or silicon oxynitride with a thickness, e.g., between 10 and 250 nanometers, and preferably between 15 and 150 nanometers, on the insulating layer 301*a* and on the sidewalls and bottoms of the openings 307 using a suitable process, such as chemical vapor deposition (CVD). The insulating layer 456 can be formed by depositing a layer of polysilicon or silicon oxide in the openings 307 and on the layer of silicon nitride or silicon oxynitride using a suitable process, such as chemical vapor deposition (CVD).

In a second alternative, the insulating layer 567 can be formed by depositing a silicon-oxide layer with a thickness, e.g., between 1 and 20 nanometers, and preferably between 1 and 10 nanometers, on the insulating layer 301*a* and on the sidewalls and bottoms of the openings 307 using a suitable process, such as chemical vapor deposition (CVD), and then depositing a layer of silicon nitride or silicon oxynitride with a thickness, e.g., between 10 and 230 nanometers, and preferably between 15 and 140 nanometers, on the silicon-oxide layer and at the sidewalls and bottoms of the openings 307 using a suitable process, such as chemical vapor deposition (CVD). The insulating layer 456 can be formed by depositing a layer of polysilicon or silicon oxide in the openings 307 and on the layer of silicon nitride or silicon oxynitride of the insulating layer 567 using a suitable process, such as chemical vapor deposition (CVD).

Next, referring to FIG. 212E, the insulating layer 456 is ground or polished by a chemical-mechanical-polishing (CMP) process, a mechanical polishing process, a mechanical grinding process, or a process including mechanical polishing and chemical etching until the insulating layer 567, such as the layer of silicon nitride or silicon oxynitride of the insulating layer 567, outside the openings 307 has a top surface 567*a* not covered by the insulating layer 456.

Next, referring to FIG. 212F, a patterned photoresist layer 302 is formed on the top surface 567*a* of the insulating layer 567 and on the insulating layer 456. Multiple openings 302*a* in the patterned photoresist layer 302 expose multiple regions of the top surface 567*a* of the insulating layer 567.

Next, referring to FIG. 212G, multiple shallow trenches 303 are formed in the semiconductor substrate 58 by removing the insulating layer 567 under the openings 302*a*, removing the insulating layer 301*a* under the openings 302*a*, and etching the semiconductor substrate 58 under the openings 302*a*, leading the shallow trenches 303 with a depth D10 in the semiconductor substrate 58, e.g., between 0.1 and 0.5 micrometers, and preferably between 0.15 and 0.4 micrometers. The shallow trenches 303 are used to accommodate a shallow trench isolation (STI).

Next, referring to FIG. 212H, the patterned photoresist layer 302 is removed using a chemical solution. Next, referring to FIG. 212I, an inorganic material 345 is formed on the top surface 567*a* of the insulating layer 567, on the insulating layer 456, and in the shallow trenches 303 by using a suitable process, such as chemical vapor deposition (CVD) process. The inorganic material 345 may include or can be silicon oxide.

Next, referring to FIG. 212J, the inorganic material 345 outside the shallow trenches 303 is removed by a suitable process, such as chemical mechanical polishing (CMP) process, then the insulating layer 567 outside the openings 307 is etched away by using a chemical solution, and then all of the insulating layer 301*a* is etched away by using a chemical solution. Accordingly, the insulating layers 456 and 567 remains in the openings 307, so called as insulating plugs 789, and the inorganic material 345 remains in the shallow trenches 303, so called as shallow trench isolation (STI). The insulating layer 567 of the insulating plugs 789 is on sidewalls and a bottom of the insulating layer 456 of the insulating plugs 789, and the sidewalls and bottom of the insulating layer 456 are covered by the insulating layer 567. The insulating layer 567 of the insulating plugs 789, for example, can be a layer of silicon nitride or silicon oxynitride with a thickness, e.g., between 10 and 250 nanometers, and preferably between 15 and 150 nanometers, on the sidewalls and bottom of the insulating layer 456 of the insulating plugs 789. Alternatively, the insulating layer 567 of the insulating plugs 789 can be composed of a silicon-oxide layer with a thickness, e.g., between 1 and 20 nanometers, and preferably between 1 and 10 nanometers, at the sidewalls and bottom of the insulating layer 456 of the insulating plugs 789, and a layer of silicon nitride or silicon oxynitride with a thickness, e.g., between 10 and 230 nanometers, and preferably between 15 and 140 nanometers, between the silicon-oxide layer and the insulating layer 456 and on the sidewalls and bottom of the insulating layer 456. The insulating plugs 789 are in the openings 307 having the depth D17, e.g., between 1 and 100 micrometers, between 1 and 50 micrometers, between 1 and 30 micrometers, between 1 and 10 micrometers, or between 1 and 5 micrometers, and preferably between 2 and 20 micrometers, and the diameter or width W10 between 2 and 100 micrometers, between 2 and 50 micrometers, between 2 and 20 micrometers, between 2 and 10 micrometers, or between 2 and 5 micrometers. The shallow trench isolation (STI) 345 may include or can be silicon oxide and is in the shallow trenches 303 having the depth D10 in the semiconductor substrate 58, e.g., between 0.1 and 0.5 micrometers, and preferably between 0.15 and 0.4 micrometers. A vertical distance D18 between a bottom of one of the insulating plugs 789 and a bottom of the shallow trench isolation 345 can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Next, referring to FIG. 212K, multiple semiconductor devices 36 can be formed in and/or on the semiconductor substrate 58, and then multiple dielectric layers 42, 44, 46 and 48, multiple via plugs 26*a* and 34*a*, an interconnection layer 34, a patterned metal layer 26, and a passivation layer 24 can be formed over the top surface of the semiconductor substrate 58.

Next, referring to FIG. 212L, a singulation process can be performed to cut the semiconductor substrate 58 and the layers 24, 42, 44, 46 and 48 of the wafer 680*a* and to singularize multiple chips 68 (one of them is shown). Each of the chips 68 includes the previously described interconnects or metal traces 35*a*, 35*b*, 35*c* and 35*d*. The element of the chips 68 in FIG. 212L indicated by a same reference number as indicates the element of the chips 68 in FIG. 7 has a same material and spec as the element of the chips 68 illustrated in FIG. 7. The chips 68 shown in FIG. 212L are reverse arrangement of the chips 68 shown in FIG. 7.

Figure 212M:
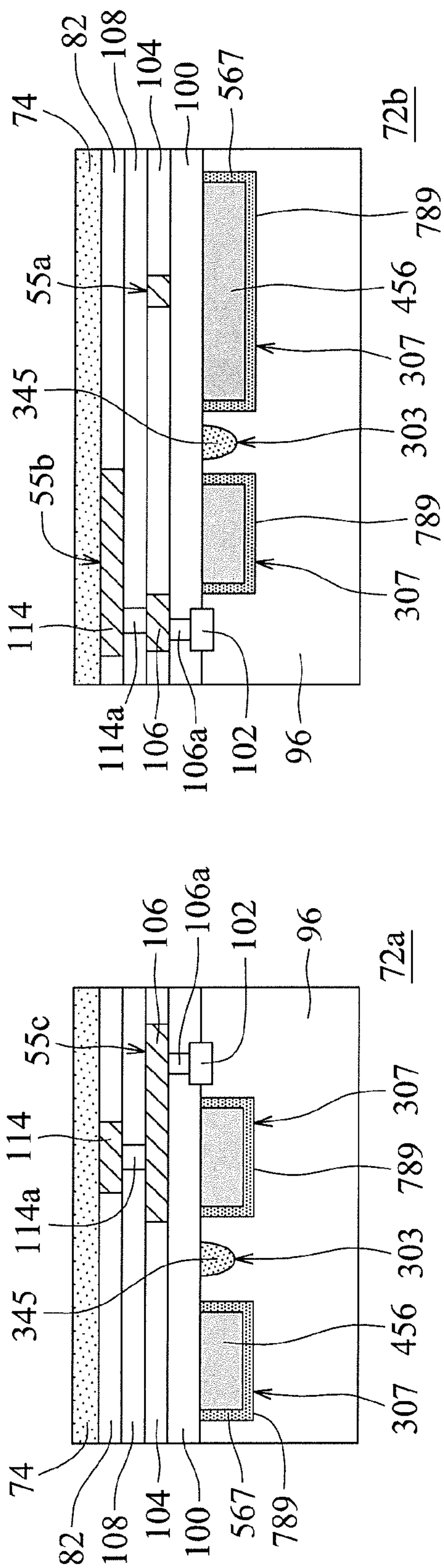
FIG. 212M shows cross-sectional views of chips according to an embodiment of the present disclosure.

Alternatively, each of the chips 72 illustrated in FIGS. 33-109 can be replaced with another type of chip 72*a* or 72*b* shown in FIG. 212M that further includes insulating plugs 789 thicker than shallow trench isolation (STI) 345. FIG. 212M shows cross-sectional views of the chips 72*a* and 72*b* according to an embodiment of the present disclosure. The element of the chips 72*a* and 72*b* in FIG. 212M indicated by a same reference number as indicates the element of the chips 72 in FIG. 33 has a same material and spec as the element of the chips 72 illustrated in FIG. 33. The chips 72*a* and 72*b* shown in FIG. 212M are reverse arrangement of the chips 72 shown in FIG. 33. Referring to FIG. 212M, each of the chips 72*a* and 72*b* is provided with the semiconductor substrate 96, the insulating plugs 789, the shallow trench isolation (STI) 345, the semiconductor devices 102, the passivation layer 74, the dielectric layers 82, 108, 104 and 100, the patterned metal layer 114, the interconnection layer 106, and the via plugs 106*a* and 114*a*. The steps of forming the insulating plugs 789 in the openings 307 in the semiconductor substrate 96 and forming the shallow trench isolation (STI) 345 in the shallow trenches 303 in the semiconductor substrate 96 can be referred to as the steps of forming the insulating plugs 789 in the openings 307 in the semiconductor substrate 58 and forming the shallow trench isolation (STI) 345 in the shallow trenches 303 in the semiconductor substrate 58 as illustrated in FIGS. 212A-212L. The specifications of the shallow trenches 303, the openings 307, the insulating plugs 789, and the shallow trench isolation (STI) 345 can be referred to as the specifications of the shallow trenches 303, the openings 307, the insulating plugs 789, and the shallow trench isolation (STI) 345, respectively, illustrated in FIGS. 212A-212L.

In one case, the chip 72*a* may have different circuit designs from those of the chip 72*b*. Also, in another case, the chip 72*a* may have same circuit designs as those of the chip 72*b*. Alternatively, the chip 72*a* may have a different area (top surface) or size from that of the chip 72*b*. Also, in another case, the chip 72*a* may have a same area (top surface) or size as that of the chip 72*b*.

Figure 212N:
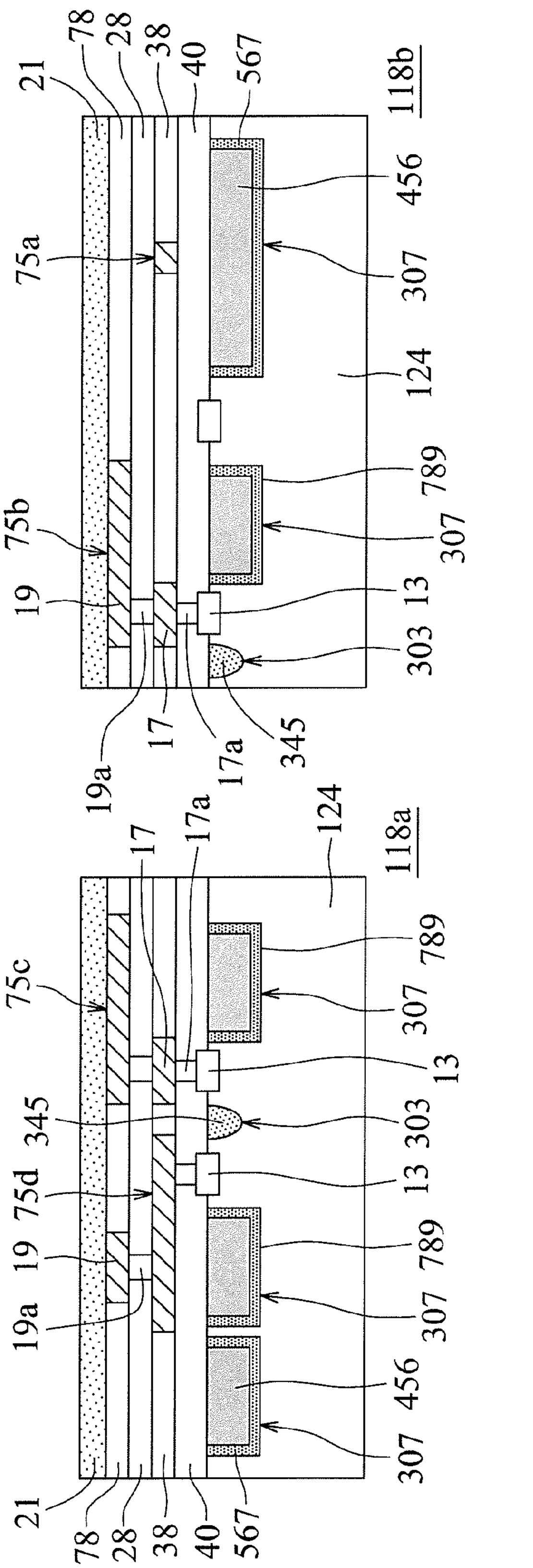
FIG. 212N shows cross-sectional views of chips according to an embodiment of the present disclosure.

Alternatively, each of the chips 118 illustrated in FIGS. 57-109 can be replaced with another type of chip 118*a* or 118*b* shown in FIG. 212N that further includes insulating plugs 789 thicker than shallow trench isolation (STI) 345. FIG. 212N shows cross-sectional views of the chips 118*a* and 118*b* according to an embodiment of the present disclosure. The element of the chips 118*a* and 118*b* in FIG. 212N indicated by a same reference number as indicates the element of the chips 118 in FIG. 57 has a same material and spec as the element of the chips 118 illustrated in FIG. 57. The chips 118*a* and 118*b* shown in FIG. 212N are reverse arrangement of the chips 118 shown in FIG. 57. Referring to FIG. 212N, each of the chips 118*a* and 118*b* is provided with the semiconductor substrate 124, the insulating plugs 789, the shallow trench isolation (STI) 345, the semiconductor devices 13, the passivation layer 21, the dielectric layers 78, 28, 38 and 40, the patterned metal layer 19, the interconnection layer 17, and the via plugs 17*a* and 19*a*. The steps of forming the insulating plugs 789 in the openings 307 in the semiconductor substrate 124 and forming the shallow trench isolation (STI) 345 in the shallow trenches 303 in the semiconductor substrate 124 can be referred to as the steps of forming the insulating plugs 789 in the openings 307 in the semiconductor substrate 58 and forming the shallow trench isolation (STI) 345 in the shallow trenches 303 in the semiconductor substrate 58 as illustrated in FIGS. 212A-212L. The specifications of the shallow trenches 303, the openings 307, the insulating plugs 789, and the shallow trench isolation (STI) 345 can be referred to as the specifications of the shallow trenches 303, the openings 307, the insulating plugs 789, and the shallow trench isolation (STI) 345, respectively, illustrated in FIGS. 212A-212L.

In one case, the chip 118*a* may have different circuit designs from those of the chip 118*b*. Also, in another case, the chip 118*a* may have same circuit designs as those of the chip 118*b*. Alternatively, the chip 118*a* may have a different area (top surface) or size from that of the chip 118*b*. Also, in another case, the chip 118*a* may have a same area (top surface) or size as that of the chip 118*b*.

Figure 213:
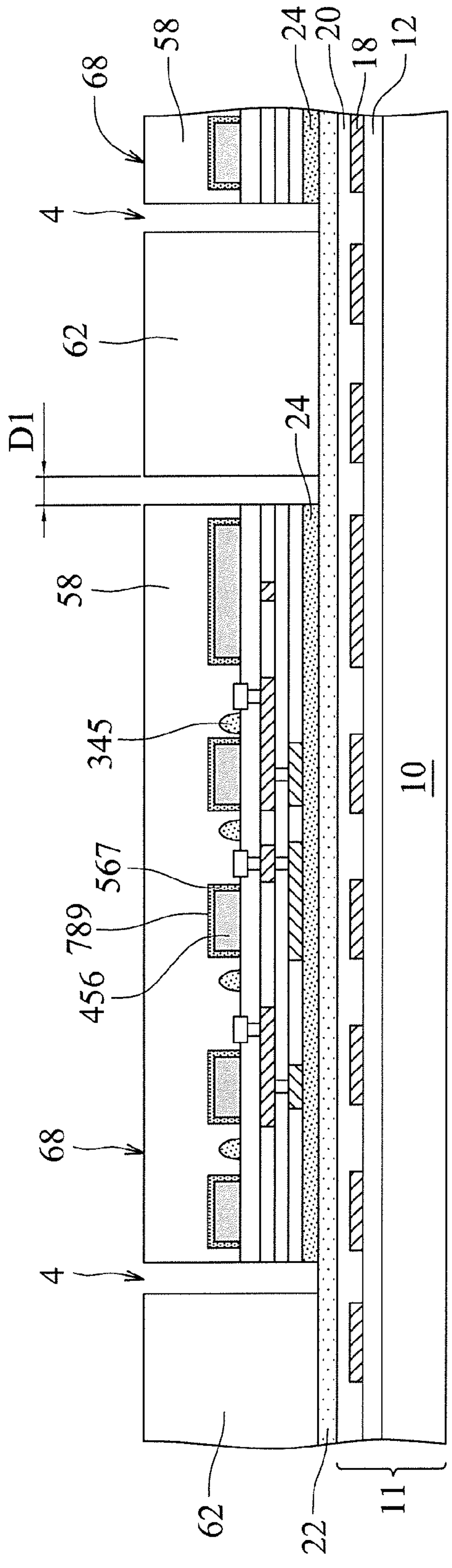
FIGS. 213-250 show a process for forming a system-in package or multichip module according to an embodiment of the present disclosure.

FIGS. 213-250 show a process for forming another system-in package or multichip module according to another embodiment of the present disclosure. Referring to FIG. 213, multiple of the chips 68 illustrated in FIG. 212L and the previously described dummy substrate(s) 62 are joined with the carrier 11 using the layer 22, which can be referred to as the steps illustrated in FIGS. 1-9.

Figure 214:
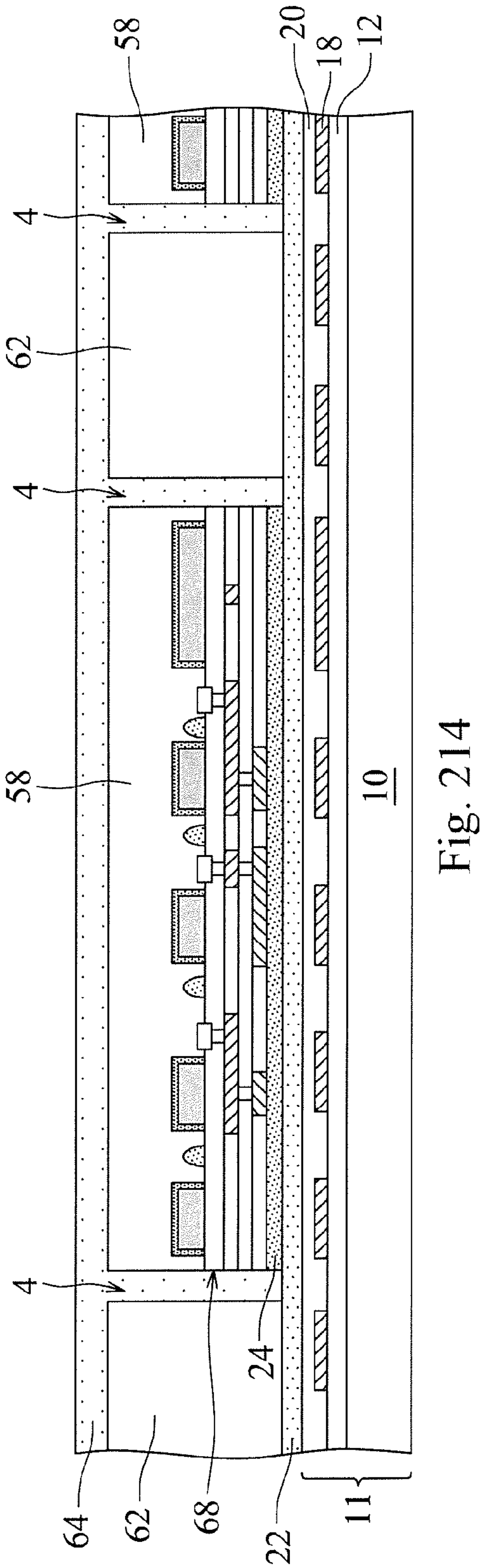

Next, referring to FIG. 214, an encapsulation/gap filling material 64, such as polysilicon, silicon oxide, or a polymer, can be formed on a backside of the semiconductor substrate 58 of each chip 68, on the dummy substrate(s) 62, and in the gaps 4 and 8, which can be referred to as the step illustrated in FIG. 10.

Figure 215:
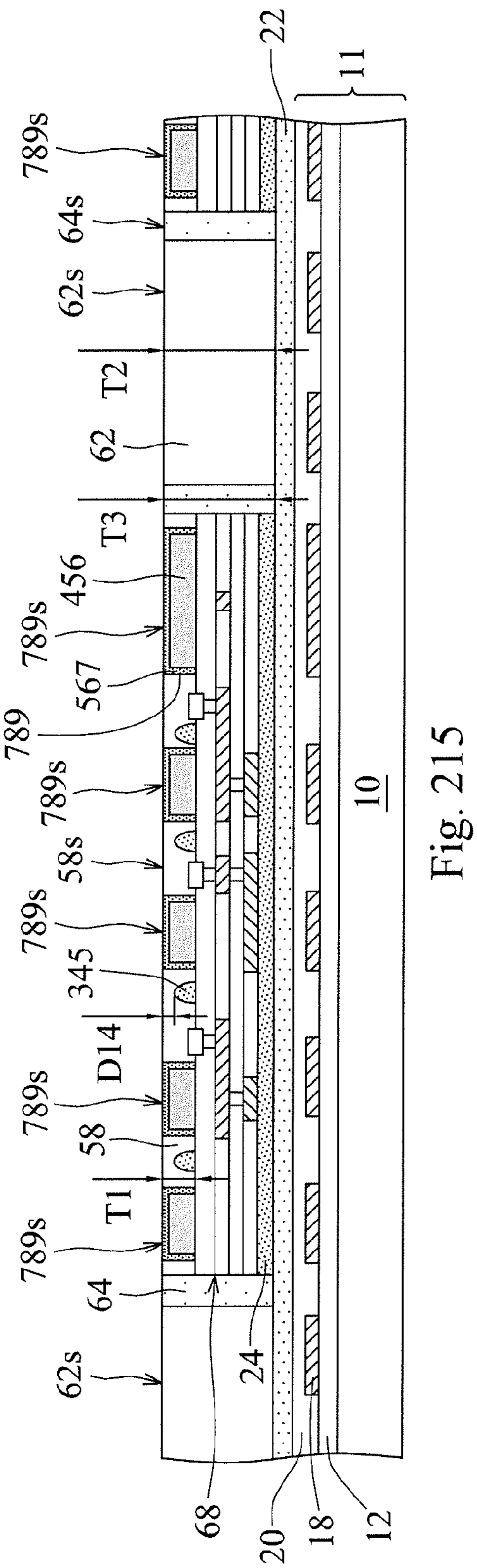

Next, referring to FIG. 215, the encapsulation/gap filling material 64, the backside of the semiconductor substrate 58 of each chip 68, and the dummy substrate(s) 62 are ground or polished by a suitable process, such as chemical-mechanical-polishing (CMP) process, mechanical polishing process, mechanical grinding process, or a process including mechanical polishing and chemical etching, until all of the insulating plugs 789 in the chips 68 have exposed bottom surfaces 789*s*, over which there are no portions of the semiconductor substrates 58. In the case that the insulating layer 567 of the insulating plugs 789 as illustrated in FIG. 212J is composed only of the layer of silicon nitride or silicon oxynitride, during the grinding or polishing process, the exposed bottom surfaces 789*s* are provided by the layer of silicon nitride or silicon oxynitride at tops of the insulating plugs 789. In the another case that the insulating layer 567 of the insulating plugs 789 as illustrated in FIG. 212J is composed of the layer of silicon oxide and the layer of silicon nitride or silicon oxynitride, during the grinding or polishing process, the layer of silicon oxide at tops of the insulating plugs 789 is removed and the exposed bottom surfaces 789*s* are provided by the layer of silicon nitride or silicon oxynitride at the tops of the insulating plugs 789.

Accordingly, the semiconductor substrate 58 of each of the chips 68 can be thinned to a thickness T1, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 68, after the grinding or polishing process, the insulating plugs 789 and the semiconductor substrate 58 may have the same thickness T1. Preferably, each of the chips 68, after the grinding or polishing process, may have a thickness, e.g., between 3 and 105 micrometers, and preferably between 3 and 30 micrometers or between 5 and 25 micrometers. After the grinding or polishing process, the dummy substrate(s) 62 can be thinned to a thickness T2, e.g., between 3 and 100 micrometers, and preferably between 3 and 30 micrometers or between 5 and 25 micrometers, and the encapsulation/gap filling material 64 remaining in the gaps 4 and 8 may have a vertical thickness T3, e.g., between 3 and 100 micrometers, and preferably between 3 and 30 micrometers or between 5 and 25 micrometers. The ground or polished surface 58*s* of the semiconductor substrate 58, at the backside of each chip 68, and the ground or polished surface(s) 62*s* of the dummy substrate(s) 62 can be substantially flat and not covered by the encapsulation/gap filling material 64. The ground or polished surface(s) 62*s* may be substantially coplanar with the ground or polished surface 58*s* of each chip 68, with the ground or polished surface 64*s* of the encapsulation/gap filling material 64 in the gaps 4 and 8, and with the exposed bottom surfaces 789*s* of the insulating plugs 789. In each chip 68, a vertical distance D14 between the ground or polished surface 58*s* of the semiconductor substrate 58 and the bottom of the shallow trench isolation 345 can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Figure 216:
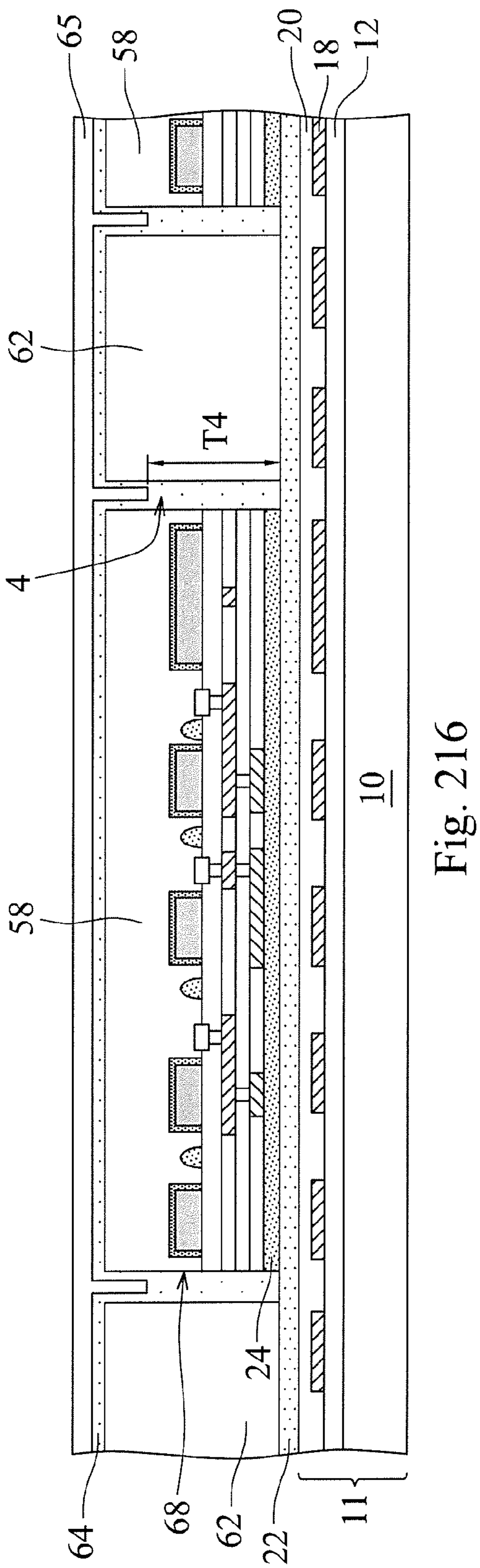
Figure 217:
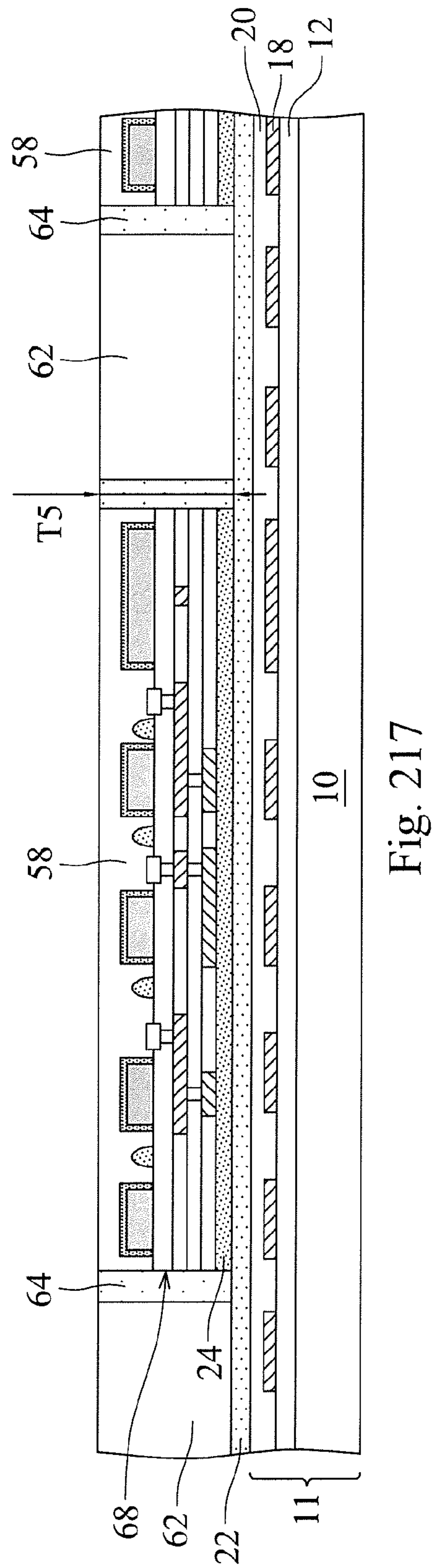

Alternatively, FIGS. 216 and 217 show another technique to form the structure illustrated in FIG. 215. Referring to FIG. 216, after forming the structure illustrated in FIG. 213, an encapsulation/gap filling material 64, such as polysilicon or silicon oxide, is formed on a backside of the semiconductor substrate 58 of each chip 68, on the dummy substrate(s) 62, and in the gaps 4 and 8, and then a polymer 65, such as polyimide, epoxy, benzocyclobutane (BCB), polybenzoxazole (PBO), poly-phenylene oxide (PPO), or molding compound, is formed on the encapsulation/gap filling material 64 and in the gaps 4 and 8. The encapsulation/gap filling material 64 in the gaps 4 and 8 may have a vertical thickness T4, e.g., between 10 and 100 micrometers, and preferably between 10 and 50 micrometers or between 20 and 50 micrometers.

Next, referring to FIG. 217, a mechanical grinding process can be performed, e.g., by using an abrasive or grinding pad with water to grind the polymer 65, the encapsulation/gap filling material 64, the backside of the semiconductor substrate 58 of each chip 68, and the dummy substrate(s) 62 until all of the polymer 65 is removed and until a predetermined vertical thickness T5 of the encapsulation/gap filling material 64 in the gaps 4 and 8 is reached. The predetermined vertical thickness T5 can be, e.g., between 10 and 100 micrometers, and preferably between 10 and 50 micrometers or between 20 and 50 micrometers. The abrasive or grinding pad can be provided with rough grit having an average grain size, e.g., between 0.5 and 15 micrometers for performing the mechanical grinding process. In the step, the semiconductor substrate 58 of each chip 68 has portions vertically over the insulating plugs 789. Thereafter, a chemical-mechanical-polishing (CMP) process can be performed, e.g., by using a polish pad with a slurry containing chemicals and a fine abrasive like silica with an average grain size, e.g., between 0.02 and 0.05 micrometers to polish the backside of the semiconductor substrate 58 of each chip 68, the dummy substrate(s) 62, and the encapsulation/gap filling material 64 in the gaps 4 and 8 until all of the insulating plugs 789 in the chips 68 have the exposed bottom surfaces 789*s*, over which there are no portions of the semiconductor substrates 58, as shown in FIG. 215. Accordingly, after the grinding or polishing process, the semiconductor substrate 58 of each of the chips 68 can be thinned to the thickness T1 between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 68, after the grinding or polishing process, the insulating plugs 789 and the semiconductor substrate 58 may have the same thickness T1.

After the chemical-mechanical-polishing (CMP) process, the polished surface 58*s* of the semiconductor substrate 58, at the backside of each chip 68, and the polished surface(s) 62*s* of the dummy substrate(s) 62 can be substantially flat and not covered by the encapsulation/gap filling material 64. The polished surface(s) 62*s* may be substantially coplanar with the polished surface 58*s* of each chip 68, with the polished surface 64*s* of the encapsulation/gap filling material 64 in the gaps 4 and 8, and with the exposed bottom surfaces 789*s* of the insulating plugs 789. The polished surfaces 58*s*, 62*s* and 64*s* may have a micro-roughness, e.g., less than 20 nanometers. The chemical-mechanical-polishing (CMP) process, using a very fine abrasive like silica and a relatively weak chemical attack, will create the surfaces 58*s*, 62*s* and 64*s* almost without deformation and scratches, and this means that the chemical-mechanical-polishing (CMP) process is very well suited for the final polishing step, creating the clean surfaces 58*s*, 62*s* and 64*s*. Using the mechanical grinding process and the chemical-mechanical-polishing (CMP) process can be performed to create a very thin semiconductor substrate 10 of each chip 68. Accordingly, after the chemical-mechanical-polishing (CMP) process, each of the chips 68 can be thinned to a thickness, e.g., between 3 and 35 micrometers, and preferably between 5 and 10 micrometers or between 5 and 25 micrometers, the dummy substrate(s) 62 can be thinned to the thickness T2, e.g., between 3 and 35 micrometers, and preferably between 5 and 10 micrometers or between 5 and 25 micrometers, and the encapsulation/gap filling material 64 in the gaps 4 and 8 can be thinned to the thickness T3, e.g., between 3 and 35 micrometers, and preferably between 5 and 10 micrometers or between 5 and 25 micrometers.

Figure 218:
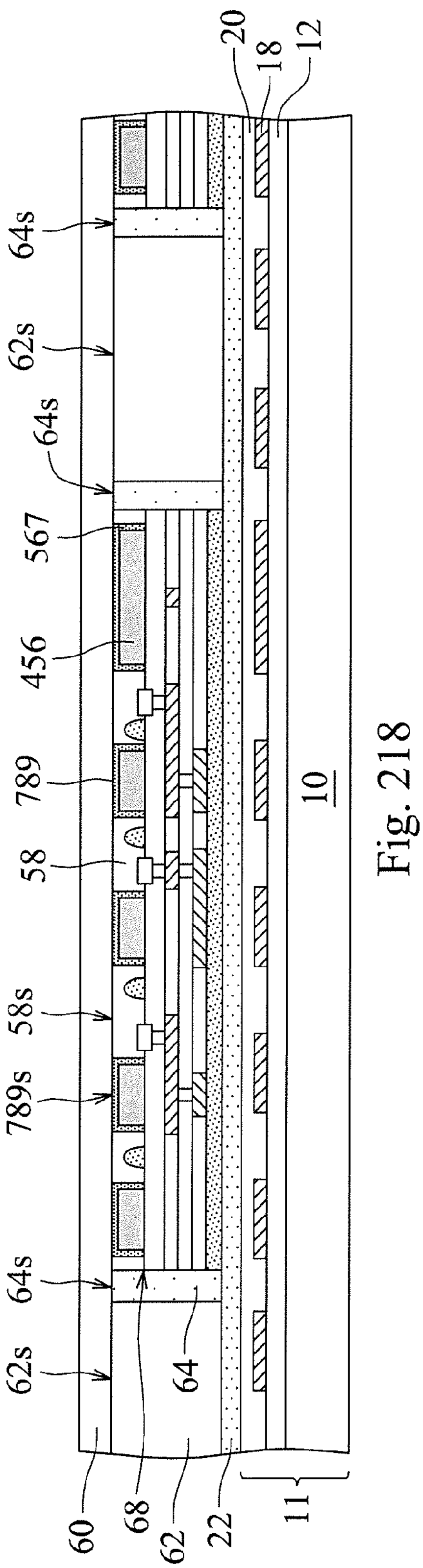

Referring to FIG. 218, after forming the structure illustrated in FIG. 215, the dielectric layer 60 illustrated in FIG. 14 is formed on the surface 58*s* of the semiconductor substrate 58 of each chip 68, on the surface(s) 62*s* of the dummy substrate(s) 62, on the exposed bottom surfaces 789*s* of the insulating plugs 789 in the chips 68, and on the surface 64*s* of the encapsulation/gap filling material 64.

Figure 219:
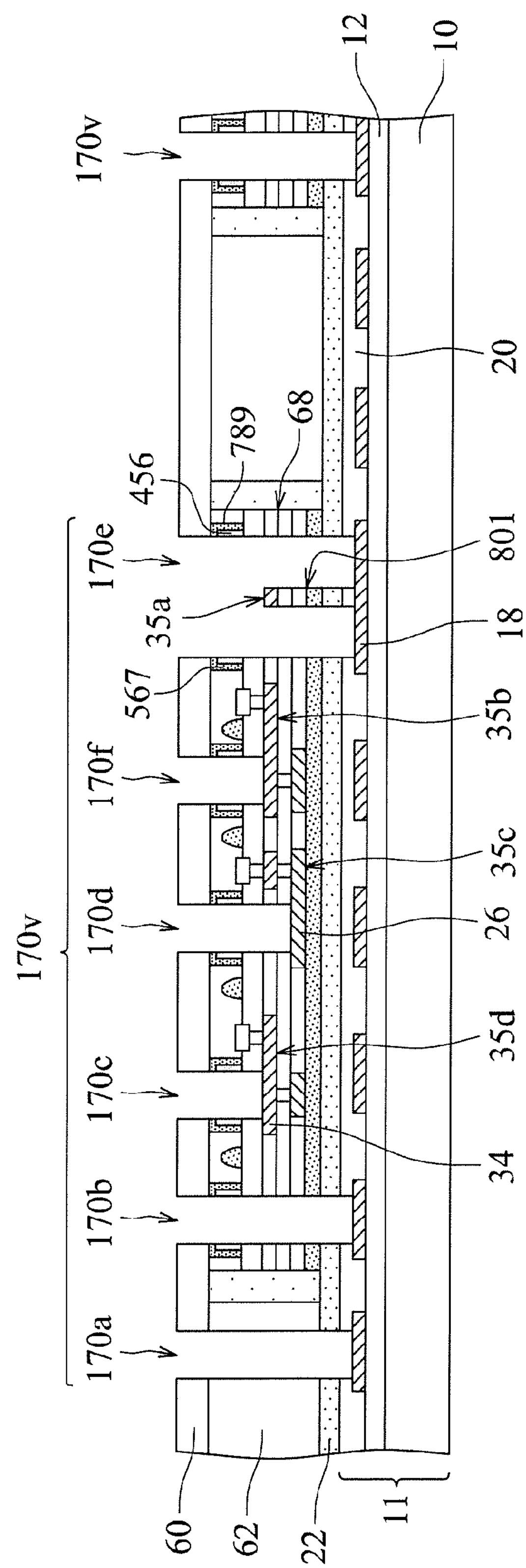

Next, referring to FIG. 219, multiple through vias 170*v*, including through vias 170*a*, 170*b*, 170*c*, 170*d*, 170*e* and 170*f*, are formed in the chips 68 and in the dummy substrate (s) 62, exposing the conductive layer 18 of the carrier 11 and exposing the layers 26 and 34 of the chips 68, which can be referred to as the steps illustrated in FIG. 15, but, in the embodiment, forming the through vias 170*v* (such as the vias 170*b*-170*f*) in the chips 68 includes etching through the insulating plugs 789 in the chips 68. The insulating plugs 789 in the chips 68 are enclosed by the semiconductor substrates 58 of the chips 68. The through vias 170*v* in the chips 68 pass through and are enclosed by the insulating plugs 789 in the chips 68 and expose inner walls of the insulating plugs 789. For example, each of the through vias 170*b*, 170*c*, 170*d*, 170*e* and 170*f* in one of the chips 68 passes through and is enclosed by the insulating layers 456 and 567 of one of the insulating plugs 789 in the one of the chips 68, exposes an inner wall of the one of the insulating plugs 789, and exposes the insulating layer 456, enclosed by the layer 567, of the one of the insulating plugs 789. Each of the through vias 170*v*, such as the through via 170*a*, 170*b*, 170*c*, 170*d*, 170*e*, or 170*f*, may have a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers. For more detailed description about the through vias 170*v*, such as the through vias 170*a*-170*f*, please refer to the illustration in FIG. 15.

As shown in FIG. 219, a supporter 801 provided by the dielectric or insulating layer 20, the glue or silicon-oxide layer 22, and the layers 24, 42 and 44 of one of the chips 68 is between the conductive layer 18 of the carrier 11 and the interconnect or metal trace 35*a* in the interconnection layer 34 exposed by the through via 170*e* for the purpose of supporting the exposed interconnect or metal trace 35*a*. The supporter 801 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers.

Figure 220:
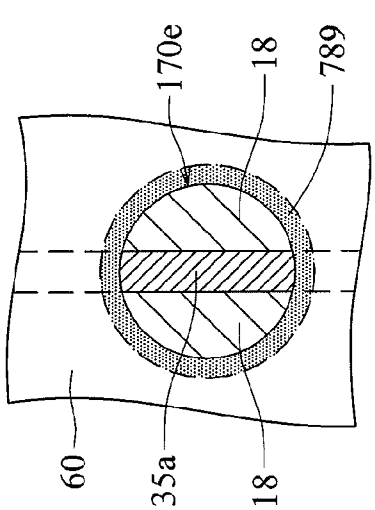

FIG. 220 is a first example of a schematic top perspective view showing the through via 170*e*, the insulating plug 789 enclosing the through via 170*e*, and the interconnect or metal trace 35*a* as illustrated in FIG. 219. The schematic top perspective view shown in FIG. 220 is similar to the schematic top perspective view shown in FIG. 16 except that the through via 170*e* shown in FIG. 220 is formed within one of the insulating plugs 789 in one of the chips 68. For more detailed description about the through via 170*e* and the interconnect or metal trace 35*a* as shown in FIGS. 219 and 220, please refer to the illustration in FIGS. 15 and 16.

Figure 221:
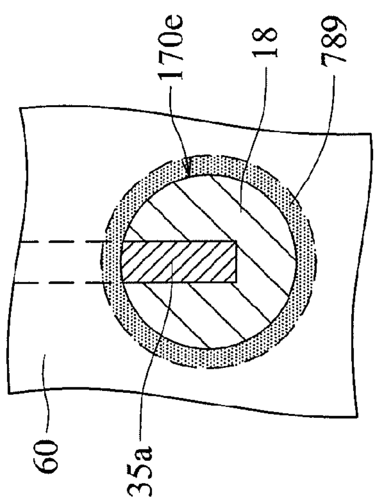

FIG. 221 is a second example of a schematic top perspective view showing the through via 170*e*, the insulating plug 789 enclosing the through via 170*e*, and the interconnect or metal trace 35*a* as illustrated in FIG. 219. The schematic top perspective view shown in FIG. 221 is similar to the schematic top perspective view shown in FIG. 17 except that the through via 170*e* shown in FIG. 221 is formed within one of the insulating plugs 789 in one of the chips 68. For more detailed description about the through via 170*e* and the interconnect or metal trace 35*a* as shown in FIGS. 219 and 221, please refer to the illustration in FIGS. 15 and 17.

Figure 222:
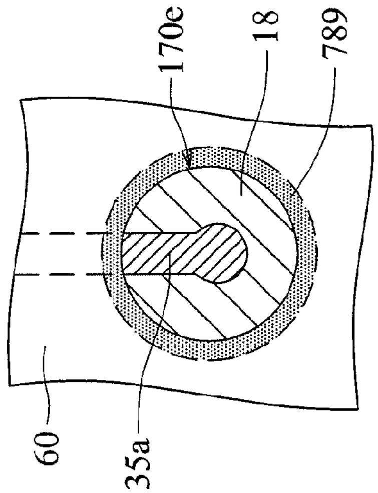

FIG. 222 is a third example of a schematic top perspective view showing the through via 170*e*, the insulating plug 789 enclosing the through via 170*e*, and the interconnect or metal trace 35*a* as illustrated in FIG. 219. The schematic top perspective view shown in FIG. 222 is similar to the schematic top perspective view shown in FIG. 18 except that the through via 170*e* shown in FIG. 222 is formed within one of the insulating plugs 789 in one of the chips 68. For more detailed description about the through via 170*e* and the interconnect or metal trace 35*a* as shown in FIGS. 219 and 222, please refer to the illustration in FIGS. 15 and 18.

Figure 223:
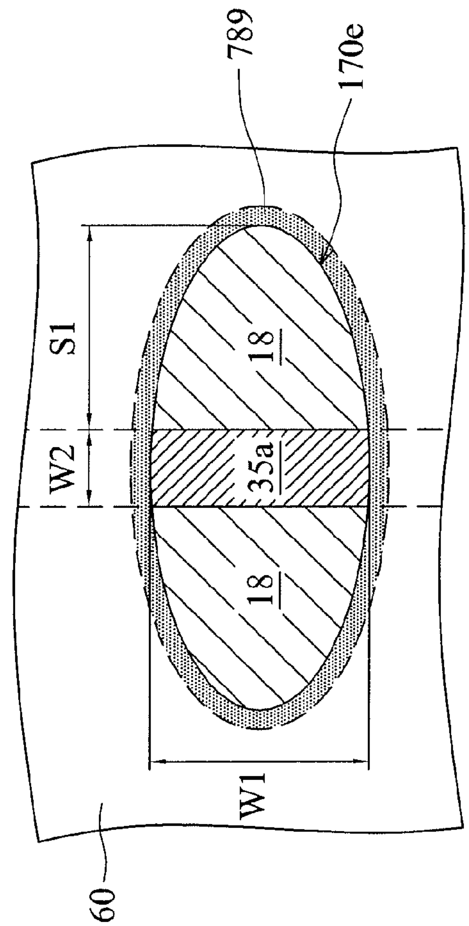

FIG. 223 is a fourth example of a schematic top perspective view showing the through via 170*e*, the insulating plug 789 enclosing the through via 170*e*, and the interconnect or metal trace 35*a* as illustrated in FIG. 219. The schematic top perspective view shown in FIG. 223 is similar to the schematic top perspective view shown in FIG. 16A except that the through via 170*e* shown in FIG. 223 is formed within one of the insulating plugs 789 in one of the chips 68. For more detailed description about the through via 170*e* and the interconnect or metal trace 35*a* as shown in FIG. 223, please refer to the illustration in FIG. 16A.

Figure 224:
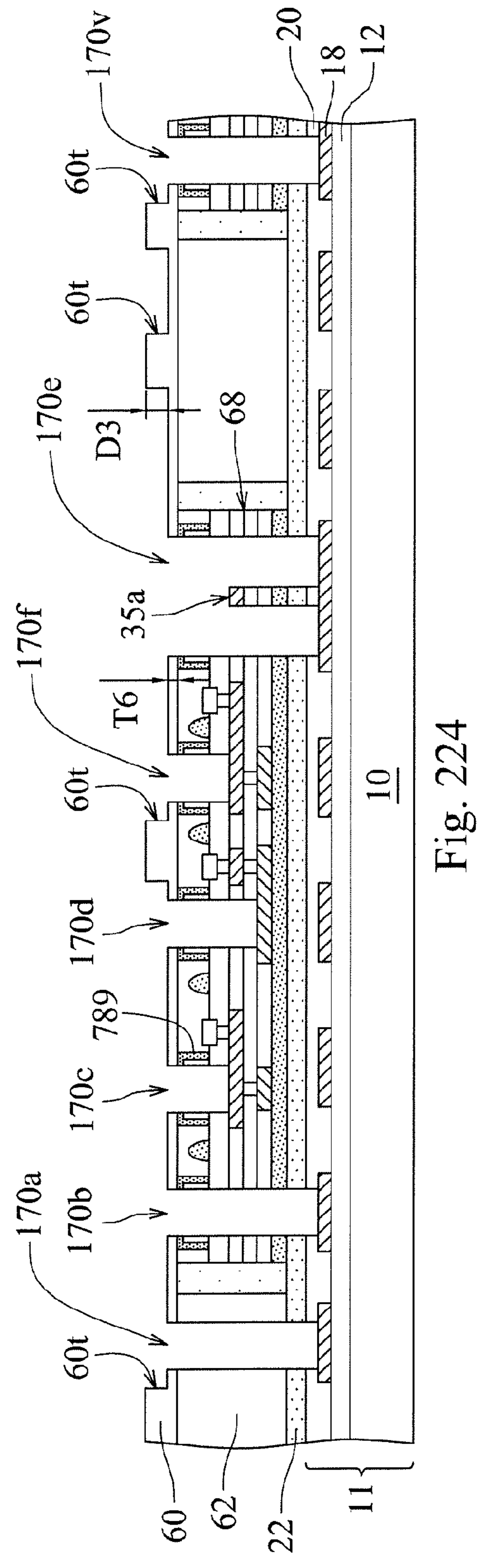

Referring to FIG. 224, after forming the structure illustrated in FIG. 219, multiple trenches 60*t* are formed in the dielectric layer 60. The trenches 60*t* in the dielectric layer 60 have a depth D3, e.g., between 0.1 and 5 micrometers, and preferably between 0.5 and 3 micrometers. The dielectric layer 60 under the trenches 60*t* has a remaining thickness T6, e.g., between 0.1 and 5 micrometers, and preferably between 0.3 and 5 micrometers, between 0.5 and 2 micrometers, between 0.1 and 3 micrometers, or between 0.2 and 1.5 micrometers. The steps of forming the trenches 60*t* in the dielectric layer 60 shown in FIG. 224 can be referred to as the steps of forming the trenches 60*t* in the dielectric layer 60 as illustrated in FIGS. 153-155. The trenches 60*t* formed in the dielectric layer 60 are used to provide spaces having inter-chip interconnects and intra-chip interconnects formed therein. Also, FIG. 156 can be an example of a schematic top perspective view showing the trenches 60*t* and the through vias 170*v* shown in FIG. 224, and FIG. 224 also can be a cross-sectional view cut along the line D-D shown in FIG. 156.

Alternatively, the trenches 60*t* illustrated in FIG. 224 can be formed in the dielectric layer 60 before the through vias 170*v* illustrated in FIG. 219 are formed in the chips 68 and in the dummy substrate(s) 62. Specifically, after the dielectric layer 60 is formed on the surfaces 58*s*, 62*s*, 64*s* and 789*s* as shown in FIG. 218, the trenches 60*t* illustrated in FIG. 224 are formed in the dielectric layer 60, and then the through vias 170*v* illustrated in FIG. 219 are formed in the chips 68 and in the dummy substrate(s) 62, exposing the conductive layer 18 of the carrier 11 and exposing the layers 26 and 34 of the chips 68.

Figure 225:
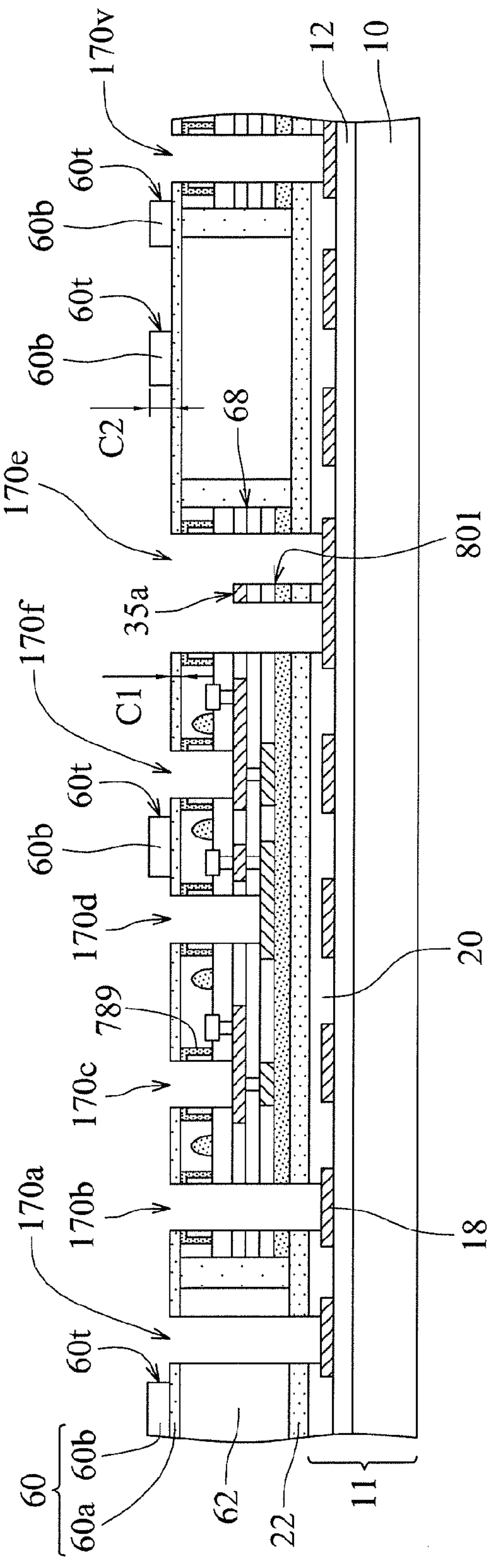

Alternatively, referring to FIG. 225, the dielectric layer 60, the trenches 60*t*, and the through vias 170*v* as shown in FIG. 224 can be formed by the following steps. After forming the structure illustrated in FIG. 215, an insulating layer 60*a*, such as a layer of silicon oxide, silicon nitride, silicon oxynitride, silicon carbon nitride, or silicon oxycarbide, having a thickness C1, e.g., between 0.1 and 5 micrometers, and preferably between 0.2 and 1.5 micrometers or between 0.15 and 2 micrometers, is formed on the surface 58*s* of the semiconductor substrate 58 of each chip 68, on the surface(s) 62*s* of the dummy substrate(s) 62, on the exposed bottom surfaces 789*s* of the insulating plugs 789 in the chips 68, and on the surface 64*s* of the encapsulation/gap filling material 64 as shown in FIG. 215.

Next, a polymer layer 60*b*, such as a layer of polyimide, benzocyclobutene (BCB), epoxy, polybenzoxazole (PBO), or poly-phenylene oxide (PPO), is formed on the insulating layer 60*a* using a suitable process, such as spin coating process, screen printing process, or lamination process. Next, an exposure process and a development process can be employed to form the trenches 60*t*, exposing the insulating layer 60*a*, in the polymer layer 60*b*. A 1X stepper or 1X contact aligner can be used to expose the polymer layer 60*b* during the exposure process. Next, the polymer layer 60*b* is cured or heated at a temperature between 150 degrees centigrade and 400 degrees centigrade, and preferably between 180 degrees centigrade and 250 degrees centigrade. The polymer layer 60*b* after being cured or heated has a thickness C2, e.g., between 1 and 50 micrometers, and preferably between 2 and 30 micrometers or between 5 and 25 micrometers.

Next, a photoresist layer is formed on the insulating layer 60*a* exposed by the trenches 60*t* and on the polymer layer 60*b*, and multiple openings in the photoresist layer expose the insulating layer 60*a* at bottoms of the trenches 60*t*. Next, the insulating layer 60*a* under the openings in the photoresist layer is removed using a suitable process, such as anisotropic plasma etching process. Next, the dummy substrate(s) 62 under the openings in the photoresist layer and the chips 68 under the openings in the photoresist layer are etched away until predetermined regions of the layers 26 and 34 in the chips 68 and predetermined regions of the conductive layer 18 in the carrier 11 are exposed by the openings in the photoresist layer. Next, the photoresist layer is removed by using, e.g., an organic chemical. Accordingly, the through vias 170*v*, including the through vias 170*a*, 170*b*, 170*c*, 170*d*, 170*e* and 170*f*, are formed in the chips 68 and in the dummy substrate (s) 62, exposing the conductive layer 18 of the carrier 11 and exposing the layers 26 and 34 of the chips 68. The specifications of the through vias 170*v* and the supporter 801 shown in FIG. 225 can be referred to as the specifications of the through vias 170*v* and the supporter 801, respectively, illustrated in FIGS. 219-223.

Accordingly, using the above-mentioned steps, the above-mentioned dielectric layer 60 also can be provided with the insulating layer 60*a* and the polymer layer 60*b* on the insulating layer 60*a*. The trenches 60*t* in the polymer layer 60*b* expose the insulating layer 60*a* and are used to provide spaces having inter-chip interconnects and intra-chip interconnects formed therein. The through vias 170*v* are formed under the trenches 60*t*. Also, FIG. 156 can be an example of a schematic top perspective view showing the trenches 60*t* and the through vias 170*v* shown in FIG. 225, and FIG. 225 also can be a cross-sectional view cut along the line D-D shown in FIG. 156.

Figure 226:
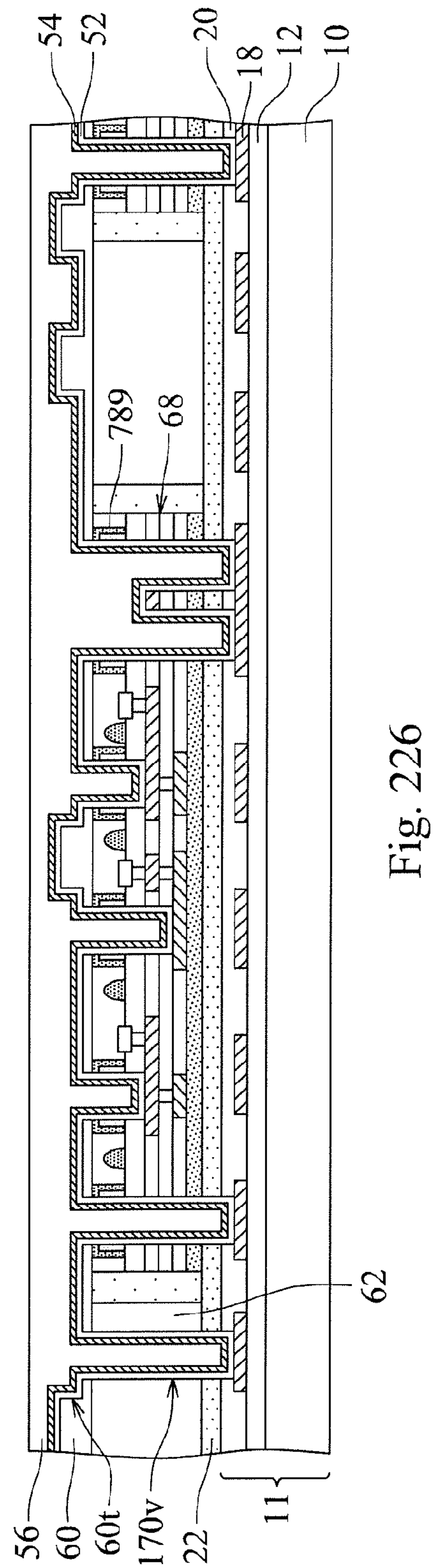

Referring to FIG. 226, after forming the structure illustrated in FIG. 224 or in FIG. 225, an adhesion/barrier layer 52 having a thickness smaller than 1 micrometer, such as between 1 nanometer and 0.5 micrometers, and preferably between 0.1 and 0.2 micrometers, is formed on the layers 18, 26 and 34 exposed by the through vias 170*v*, on sidewalls of the through vias 170*v*, on sidewalls and bottoms of the trenches 60*t* (or on sidewalls of the trenches 60*t* in the polymer layer 60*b* and on a top surface of the insulating layer 60*a* at the bottoms of the trenches 60*t*), on the inner walls, exposed by the through vias 170*v*, of the insulating plugs 789, and on the interconnect or metal trace 35*a* that is on the supporter 801. The adhesion/barrier layer 52 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 54 having a thickness smaller than 1 micrometer, such as between 10 nanometers and 0.8 micrometers, and preferably between 80 nanometers and 0.15 micrometers, is formed on the adhesion/barrier layer 52 by a physical vapor deposition (PVD) process, such as sputtering process or evaporation process, by a chemical-vapor deposition (CVD) process, or by other thin-film deposition processes, such as atomic layer deposition (ALD). Next, a conduction layer 56 is formed on the seed layer 54 using a suitable process, such as electroplating process. The specifications of the adhesion/barrier layer 52, the seed layer 54, and the conduction layer 56 shown in FIG. 226 can be referred to as the specifications of the adhesion/barrier layer 52, the seed layer 54, and the conduction layer 56 as illustrated in FIG. 25, respectively.

Figure 227:
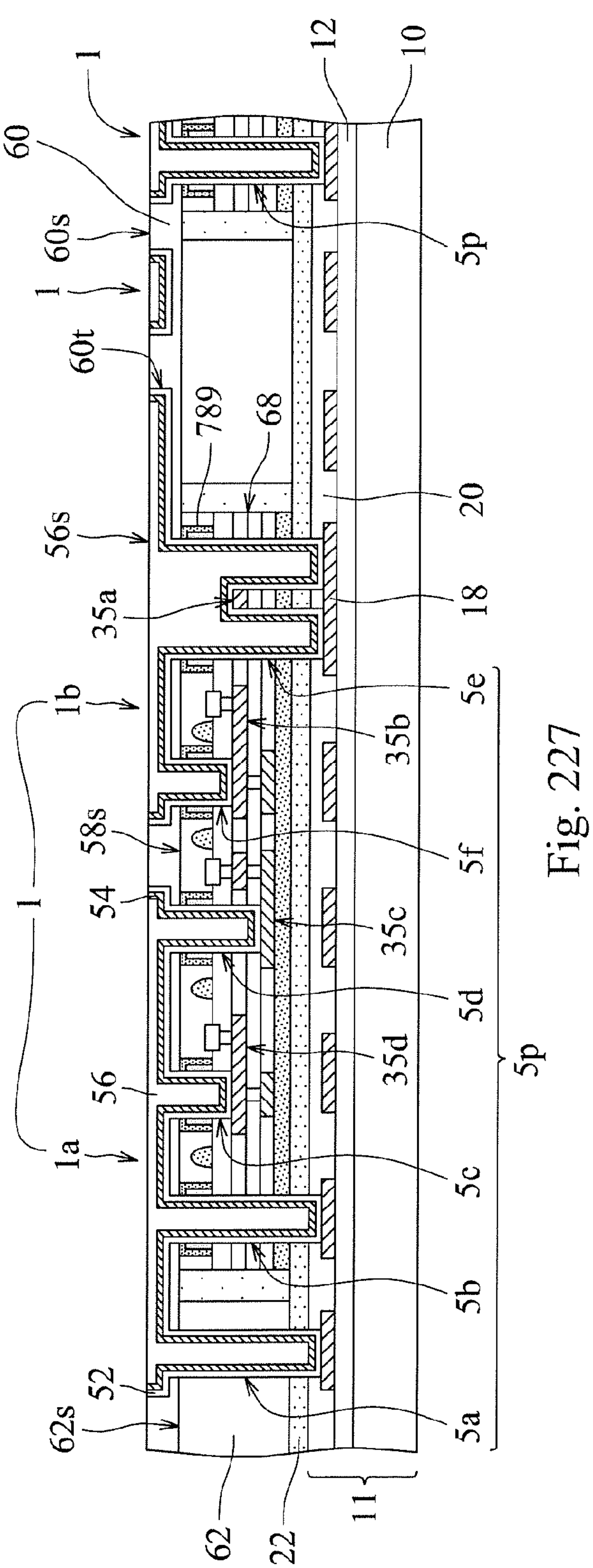

Next, referring to FIG. 227, the layers 52, 54 and 56 are ground or polished by using, e.g., a chemical-mechanical-polishing (CMP) process, a mechanical polishing process, a mechanical grinding process, or a process including mechanical polishing and chemical etching until the dielectric layer 60 has an exposed top surface 60*s*, over which there are no portions of the layers 52, 54 and 56, and the layers 52, 54 and 56 outside the trenches 60*t* are removed.

Accordingly, the exposed top surface 60*s* of the dielectric layer 60 can be substantially coplanar with the ground or polished surface 56*s* of the conduction layer 56 in the trenches 60*t*, and the surfaces 56*s* and 60*s* can be substantially flat. The adhesion/barrier layer 52 and the seed layer 54 are at sidewalls and a bottom of the conduction layer 56 in the trenches 60*t*, and the sidewalls and the bottom of the conduction layer 56 in the trenches 60t are covered by the adhesion/barrier layer 52 and the seed layer 54.

After the layers 52, 54 and 56 are ground or polished, the dielectric layer 60 has a thickness, between the exposed top surface 60s and the surface 58s or 62s, e.g., between 1 and 10 micrometers, and preferably between 1 and 3 micrometers, in case the dielectric layer 60, the trenches 60t, and the through vias 170v are formed as illustrated in FIGS. 218-224. Alternatively, after the layers 52, 54 and 56 are ground or polished, the polymer layer 60b of the dielectric layer 60 has a thickness, between the exposed top surface 60s of the polymer layer 60b and the top surface of the insulating layer 60a, e.g., between 1 and 50 micrometers, and preferably between 2 and 30 micrometers or between 5 and 25 micrometers, in case the dielectric layer 60 composed of the layer 60a and 60b, the trenches 60t, and the through vias 170v are formed as illustrated in FIG. 225.

In a first alternative, after the layers 52, 54 and 56 are ground or polished, the adhesion/barrier layer 52 can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 60t (or on the sidewalls of the trenches 60t in the polymer layer 60b and on the top surface of the insulating layer 60a at the bottoms of the trenches 60t), on the sidewalls of the through vias 170v, on the inner walls of the insulating plugs 789 in the chips 68, on the layers 18, 26 and 34 at the bottoms of the through vias 170v, and on the interconnect or metal trace 35a that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer, in the trenches 60t, and in the through vias 170v. The conduction layer 56 can be an electroplated copper layer on the single layer of copper or a titanium-copper alloy, in the trenches 60t, and in the through vias 170v. The electroplated copper layer in the trenches 60t has a thickness, e.g., between 0.1 and 5 micrometers, and preferably between 0.3 and 1.5 micrometers or between 0.5 and 3 micrometers, in case the dielectric layer 60, the trenches 60t, and the through vias 170v are formed as illustrated in FIGS. 218-224. Alternatively, the electroplated copper layer in the trenches 60t has a thickness, e.g., between 1 and 50 micrometers, and preferably between 2 and 30 micrometers or between 5 and 25 micrometers, in case the dielectric layer 60 composed of the layers 60a and 60b, the trenches 60t, and the through vias 170v are formed as illustrated in FIG. 225.

In a second alternative, after the layers 52, 54 and 56 are ground or polished, the adhesion/barrier layer 52 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 60t (or on the sidewalls of the trenches 60t in the polymer layer 60b and on the top surface of the insulating layer 60a at the bottoms of the trenches 60t), on the sidewalls of the through vias 170v, on the inner walls of the insulating plugs 789 in the chips 68, on the layers 18, 26 and 34 at the bottoms of the through vias 170v, and on the interconnect or metal trace 35a that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer, in the trenches 60t, and in the through vias 170v. The conduction layer 56 can be an electroplated copper layer on the single layer of copper or a titanium-copper alloy, in the trenches 60t, and in the through vias 170v. The electroplated copper layer in the trenches 60t has a thickness, e.g., between 0.1 and 5 micrometers, and preferably between 0.3 and 1.5 micrometers or between 0.5 and 3 micrometers, in case the dielectric layer 60, the trenches 60t, and the through vias 170v are formed as illustrated in FIGS. 218-224. Alternatively, the electroplated copper layer in the trenches 60t has a thickness, e.g., between 1 and 50 micrometers, and preferably between 2 and 30 micrometers or between 5 and 25 micrometers, in case the dielectric layer 60 composed of the layers 60a and 60b, the trenches 60t, and the through vias 170v are formed as illustrated in FIG. 225.

In a third alternative, after the layers 52, 54 and 56 are ground or polished, the adhesion/barrier layer 52 can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 60t (or on the sidewalls of the trenches 60t in the polymer layer 60b and on the top surface of the insulating layer 60a at the bottoms of the trenches 60t), on the sidewalls of the through vias 170v, on the inner walls of the insulating plugs 789 in the chips 68, on the layers 18, 26 and 34 at the bottoms of the through vias 170v, and on the interconnect or metal trace 35a that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer, in the trenches 60t, and in the through vias 170v. The conduction layer 56 can be an electroplated copper layer on the single layer of copper or a titanium-copper alloy, in the trenches 60t, and in the through vias 170v. The electroplated copper layer in the trenches 60t has a thickness, e.g., between 0.1 and 5 micrometers, and preferably between 0.3 and 1.5 micrometers or between 0.5 and 3 micrometers, in case the dielectric layer 60, the trenches 60t, and the through vias 170v are formed as illustrated in FIGS. 218-224. Alternatively, the electroplated copper layer in the trenches 60t has a thickness, e.g., between 1 and 50 micrometers, and preferably between 2 and 30 micrometers or between 5 and 25 micrometers, in case the dielectric layer 60 composed of the layers 60a and 60b, the trenches 60t, and the through vias 170v are formed as illustrated in FIG. 225.

After the layers 52, 54 and 56 are ground or polished, the layers 52, 54 and 56 in the trenches 60t compose multiple metal interconnects (or damascene metal traces) 1, including metal interconnects (or damascene metal traces) 1a and 1b, in the trenches 60t. The layers 52, 54 and 56 in the through vias 170v compose multiple metal plugs (or metal vias) 5p in the through vias 170v, including metal plugs (or metal vias) 5a, 5b, 5c, 5d, 5e and 5f in the through vias 170a, 170b, 170c, 170d, 170e and 170f, respectively. The metal plug 5a is formed in the dummy substrate 62, and the metal plugs 5b, 5c, 5d, 5e and 5f are formed in the same chip 68. These metal plugs 5p formed in the chips 68 and in the dummy substrate(s) 62 can connect the metal interconnects 1 and the semiconductor devices 36 in the chips 68 and connect the metal interconnects 1 and multiple contact points of the conductive layer 18 in the carrier 11. The metal interconnects 1, such as 1a and 1b, in the trenches 60t may have a thickness, e.g., between 0.1 and 5 micrometers, and preferably between 1 and 3 micrometers. The supporter 801 and the interconnect or metal trace 35a, in the interconnection layer 34, on the supporter 801 can be between two portions, lower than a horizontal level, at which a top surface of the interconnection layer 34 is positioned, of the metal plug 5*e*.

Each of the metal plugs 5*p* in the chips 68 passes through one of the insulating plugs 789 in the chips 68, contacts the inner wall of the one of the insulating plugs 789, and is enclosed by the insulating layer 456, enclosed by the insulating layer 567, of the one of the insulating plugs 789. For example, each of the metal plugs 5*b*, 5*c*, 5*d*, 5*e* and 5*f* in one of the chips 68 passes through one of the insulating plugs 789 in the one of the chips 68, contacts the inner wall of the one of the insulating plugs 789, and is enclosed by the insulating layer 456, enclosed by the insulating layer 567, of the one of the insulating plugs 789. For more detailed description about the metal plugs 5*p* (including the metal plugs 5*a*-5*f*) and the metal interconnects 1 (including the metal interconnects 1*a* and 1*b*) shown in FIG. 227, please refer to the illustration in FIG. 26.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

Figure 228:
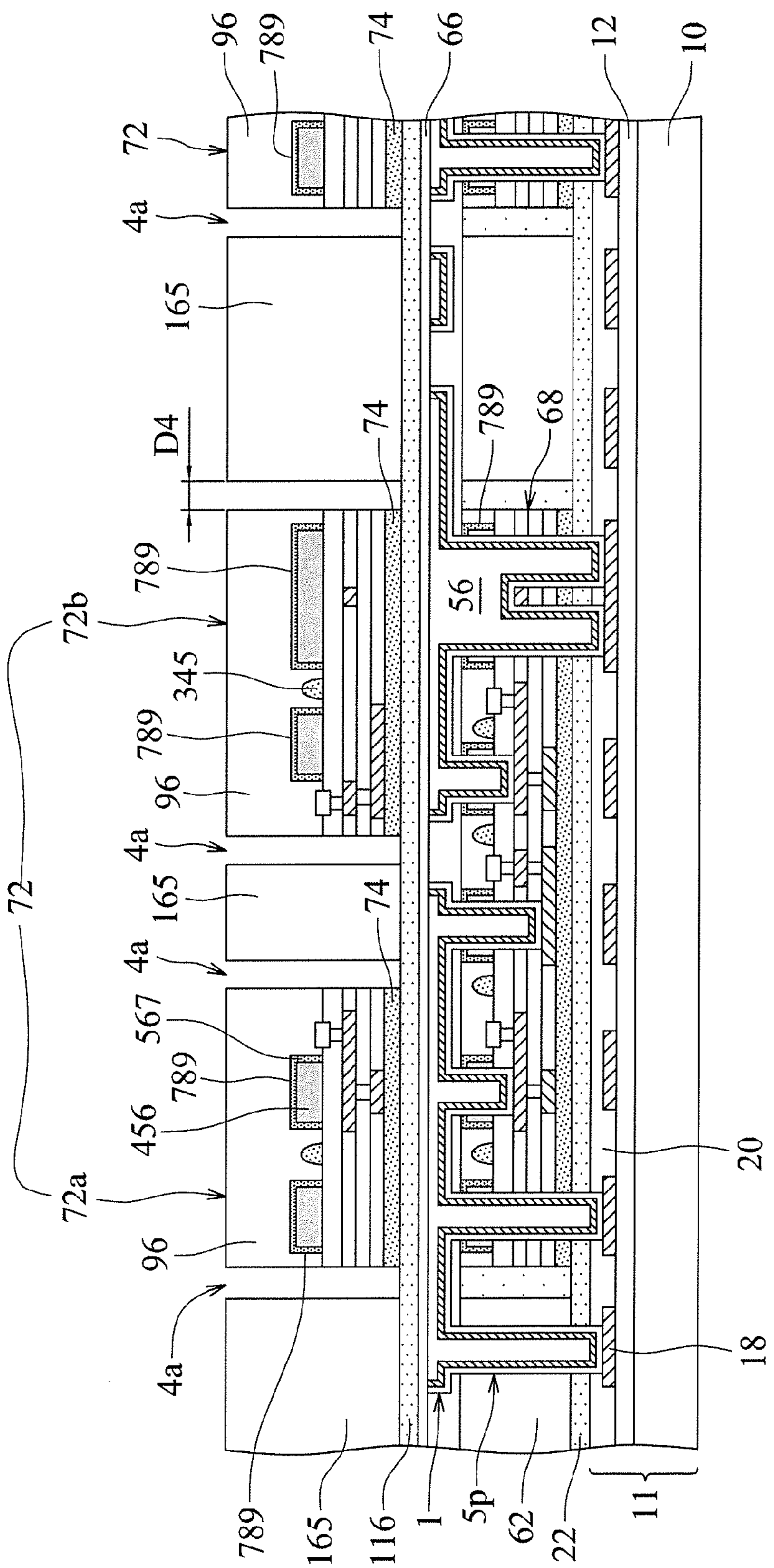

Referring to FIG. 228, after forming the structure illustrated in FIG. 227, the insulating or dielectric layer 66 illustrated in FIG. 27 is formed on the ground or polished surface 56*s* of the conduction layer 56 and on the exposed top surface 60*s* of the dielectric layer 60. Next, multiple chips 72, each of which is like the chip 72*a* or 72*b* illustrated in FIG. 212M, and the previously described dummy substrate(s) 165 are placed over the layer 116, which can be referred to as the steps illustrated in FIGS. 28-35. The arrangement of placing the chips 72 and the dummy substrate(s) 165 over the insulating or dielectric layer 66, in the embodiment, can be referred to as that of placing the chips 72 and the dummy substrate(s) 165 over the insulating or dielectric layer 66 as illustrated in FIG. 34 or 35.

Figure 229:
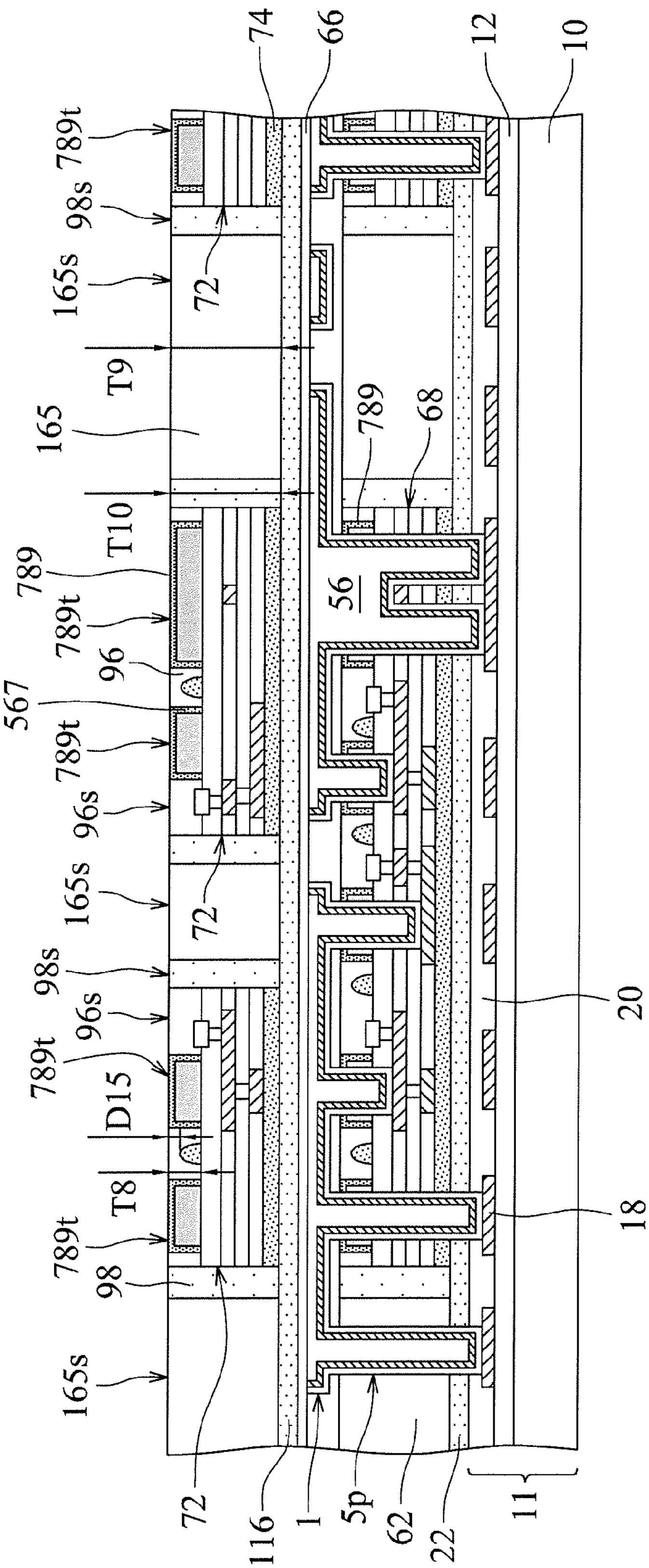

Next, referring to FIG. 229, an encapsulation/gap filling material 98 is formed on a backside of the semiconductor substrate 96 of each chip 72, on the dummy substrate(s) 165, and in the gaps 4*a* and 8*a*. Next, the encapsulation/gap filling material 98, the backside of the semiconductor substrate 96 of each chip 72, and the dummy substrate(s) 165 are ground or polished by a suitable process, such as mechanical grinding process, mechanical polishing process, chemical-mechanical-polishing (CMP) process, or a process including mechanical grinding and chemical-mechanical polishing, until all of the insulating plugs 789 in the chips 72 have exposed bottom surfaces 789*t*, over which there are no portions of the semiconductor substrates 96. The steps of forming the encapsulation/gap filling material 98 and grinding or polishing the encapsulation/gap filling material 98, the backside of the semiconductor substrate 96 of each chip 72, and the dummy substrate(s) 165 illustrated in FIG. 229 can be referred to as the steps of forming the encapsulation/gap filling material 64 and grinding or polishing the encapsulation/gap filling material 64, the backside of the semiconductor substrate 58 of each chip 68, and the dummy substrate(s) 62 as illustrated in FIGS. 214-217. The encapsulation/gap filling material 98 can be polysilicon, silicon oxide, or a polymer. In the case that the insulating layer 567 of the insulating plugs 789 is composed only of the layer of silicon nitride or silicon oxynitride, during the grinding or polishing process, the exposed bottom surfaces 789*t* are provided by the layer of silicon nitride or silicon oxynitride at tops of the insulating plugs 789. In the another case that the insulating layer 567 of the insulating plugs 789 is composed of the layer of silicon oxide and the layer of silicon nitride or silicon oxynitride, during the grinding or polishing process, the layer of silicon oxide at tops of the insulating plugs 789 is removed and the exposed bottom surfaces 789*t* are provided by the layer of silicon nitride or silicon oxynitride at the tops of the insulating plugs 789.

Accordingly, the semiconductor substrate 96 of each of the chips 72 can be thinned to a thickness T8, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 72, after the grinding or polishing process, the insulating plugs 789 and the semiconductor substrate 96 may have the same thickness T8. Preferably, each of the chips 72, after the grinding or polishing process, may have a thickness, e.g., between 3 and 105 micrometers, and preferably between 3 and 30 micrometers or between 5 and 25 micrometers.

After the grinding or polishing process, the dummy substrate(s) 165 can be thinned to a thickness T9, e.g., between 3 and 100 micrometers, and preferably between 3 and 30 micrometers or between 5 and 25 micrometers, and the encapsulation/gap filling material 98 remaining in the gaps 4*a* and 8*a* may have a vertical thickness T10, e.g., between 3 and 100 micrometers, and preferably between 3 and 30 micrometers or between 5 and 25 micrometers. The ground or polished surface 96*s* of the semiconductor substrate 96, at the backside of each chip 72, and the ground or polished surface(s) 165*s* of the dummy substrate(s) 165 can be substantially flat and not covered by the encapsulation/gap filling material 98. The ground or polished surface(s) 165*s* may be substantially coplanar with the ground or polished surface 96*s* of each chip 72, with the ground or polished surface 98*s* of the encapsulation/gap filling material 98 in the gaps 4*a* and 8*a*, and with the exposed bottom surfaces 789*t* of the insulating plugs 789 in the chips 72. In each chip 72, a vertical distance D15 between the surface 96*s* of the semiconductor substrate 96 and the bottom of the shallow trench isolation 345 can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Figure 230:
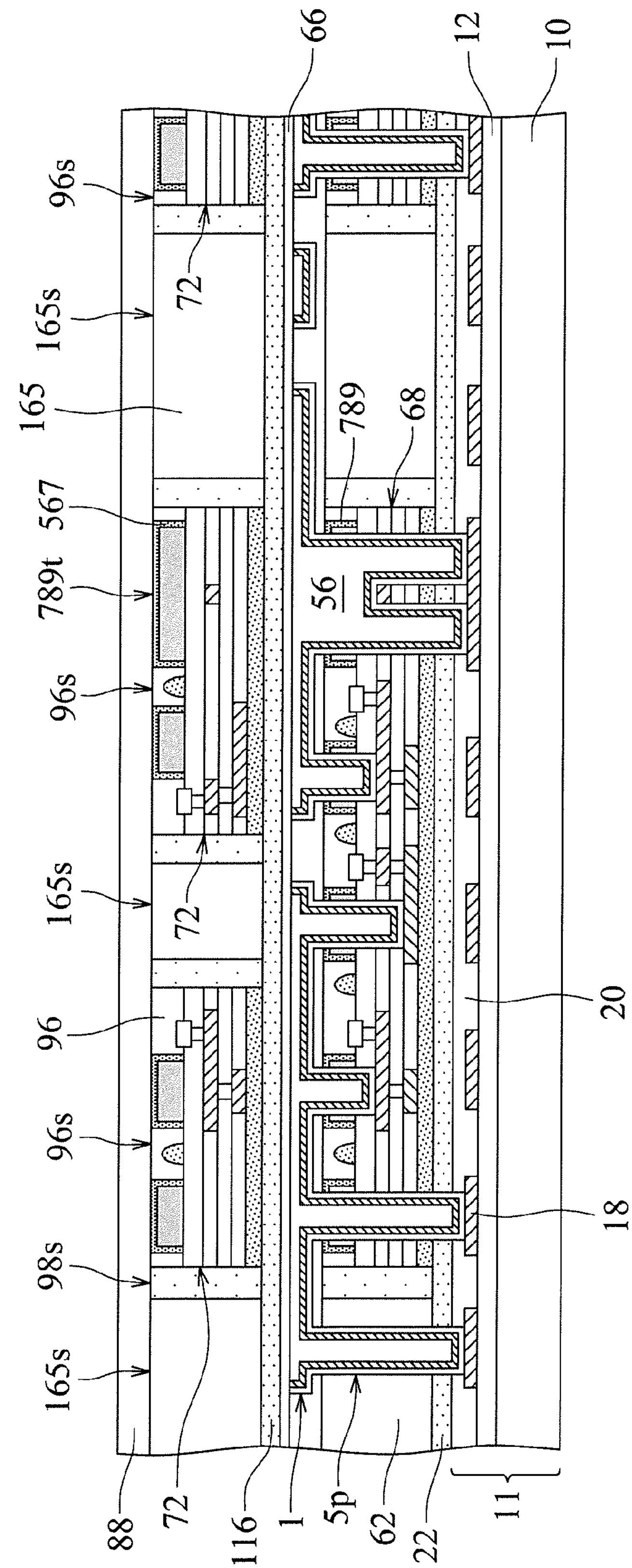

Referring to FIG. 230, after forming the structure illustrated in FIG. 229, the dielectric layer 88 illustrated in FIG. 40 is formed on the surface 96*s* of the semiconductor substrate 96 of each chip 72, on the surface(s) 165*s* of the dummy substrate(s) 165, on the exposed bottom surfaces 789*t* of the insulating plugs 789 in the chips 72, and on the surface 98*s* of the encapsulation/gap filling material 98.

Figure 231:
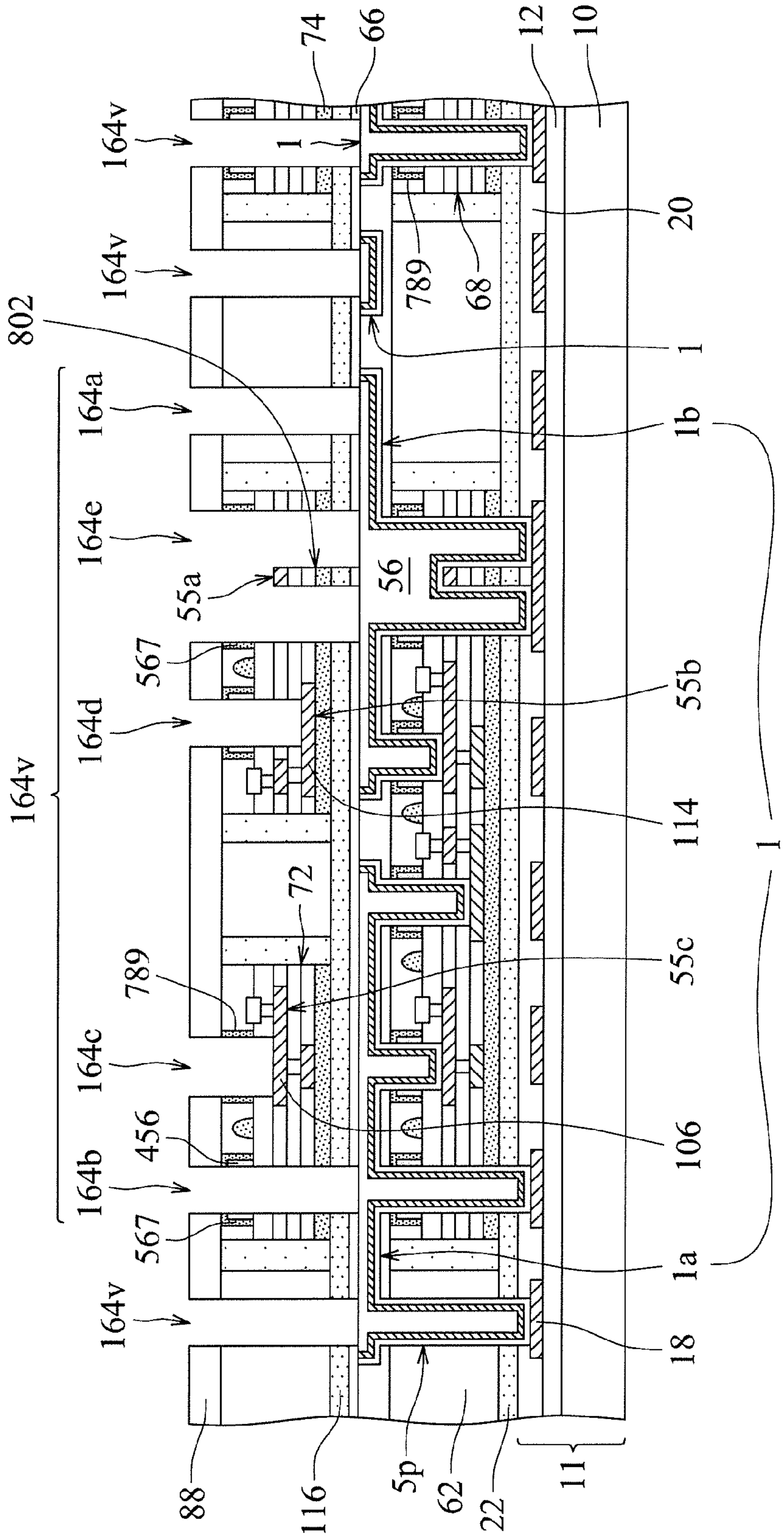

Next, referring to FIG. 231, multiple through vias 164*v*, including through vias 164*a*, 164*b*, 164*c*, 164*d* and 164*e*, are formed in the chips 72 and in the dummy substrate(s) 165, exposing the conduction layer 56 of the metal interconnects 1 and exposing the layers 114 and 106 of the chips 72, which can be referred to as the steps illustrated in FIG. 41, but, in the embodiment, forming the through vias 164*v* (such as the vias 164*b*-164*e*) in the chips 72 includes etching through the insulating plugs 789 in the chips 72. The insulating plugs 789 in the chips 72 are enclosed by the semiconductor substrates 96 of the chips 72. The through vias 164*v* in the chips 72 pass through and are enclosed by the insulating plugs 789 in the chips 72 and expose inner walls of the insulating plugs 789. For example, the through via 164*b* in the left one of the chips 72 passes through and is enclosed by one of the insulating plugs 789 in the left one of the chips 72, exposes an inner wall of the one of the insulating plugs 789, and exposes the insulating layer 456, enclosed by the insulating layer 567, of the one of the insulating plugs 789. The through via 164*c* in the left one of the chips 72 passes through and is enclosed by another one of the insulating plugs 789 in the left one of the chips 72, exposes an inner wall of the another one of the insulating plugs 789, and exposes the insulating layer 567 of the another one of the insulating plugs 789. The through via 164*d* in the middle one of the chips 72 passes through and is enclosed by one of the insulating plugs 789 in the middle one of the chips 72, exposes an inner wall of the one of the insulating plugs 789, and exposes the insulating layer 456, enclosed by the insulating layer 567, of the one of the insulating plugs 789. The through via 164*e* in the middle one of the chips 72 passes through and is enclosed by another one of the insulating plugs 789 in the middle one of the chips 72, exposes an inner wall of the another one of the insulating plugs 789, and exposes the insulating layer 567 of the another one of the insulating plugs 789.

Each of the through vias 164*v*, such as the through via 164*a*, 164*b*, 164*c*, 164*d*, or 164*e*, has a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers. For more detailed description about the through vias 164*v*, such as the through vias 164*a*-164*e*, please refer to the illustration in FIG. 41.

As shown in FIG. 231, a supporter 802 provided by the insulating or dielectric layer 66, the layer 116, and the layers 74, 82 and 108 of the middle one of the chips 72 is between the conduction layer 56 of the metal interconnect 1*b* and the interconnect or metal trace 55*a* in the interconnection layer 106 exposed by the through via 164*e* for the purpose of supporting the exposed interconnect or metal trace 55*a*. The supporter 802 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers.

Figure 232:
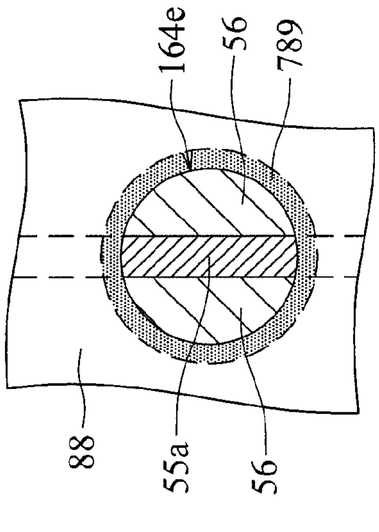

FIG. 232 is a first example of a schematic top perspective view showing the through via 164*e*, the insulating plug 789 enclosing the through via 164*e*, and the interconnect or metal trace 55*a* as illustrated in FIG. 231. The schematic top perspective view shown in FIG. 232 is similar to the schematic top perspective view shown in FIG. 42 except that the through via 164*e* shown in FIG. 232 is formed within one of the insulating plugs 789 in the middle one of the chips 72. For more detailed description about the through via 164*e* and the interconnect or metal trace 55*a* as shown in FIGS. 231 and 232, please refer to the illustration in FIGS. 41 and 42.

Figure 233:
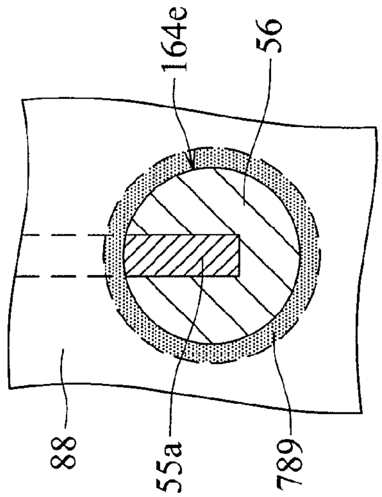

FIG. 233 is a second example of a schematic top perspective view showing the through via 164*e*, the insulating plug 789 enclosing the through via 164*e*, and the interconnect or metal trace 55*a* as illustrated in FIG. 231. The schematic top perspective view shown in FIG. 233 is similar to the schematic top perspective view shown in FIG. 43 except that the through via 164*e* shown in FIG. 233 is formed within one of the insulating plugs 789 in the middle one of the chips 72. For more detailed description about the through via 164*e* and the interconnect or metal trace 55*a* as shown in FIGS. 231 and 233, please refer to the illustration in FIGS. 41 and 43.

Figure 234:
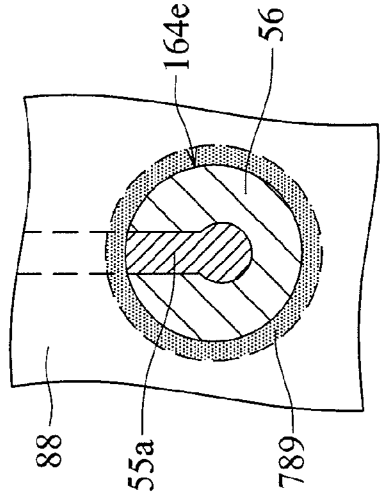

FIG. 234 is a third example of a schematic top perspective view showing the through via 164*e*, the insulating plug 789 enclosing the through via 164*e*, and the interconnect or metal trace 55*a* as illustrated in FIG. 231. The schematic top perspective view shown in FIG. 234 is similar to the schematic top perspective view shown in FIG. 44 except that the through via 164*e* shown in FIG. 234 is formed within one of the insulating plugs 789 in the middle one of the chips 72. For more detailed description about the through via 164*e* and the interconnect or metal trace 55*a* as shown in FIGS. 231 and 234, please refer to the illustration in FIGS. 41 and 44.

Figure 235:
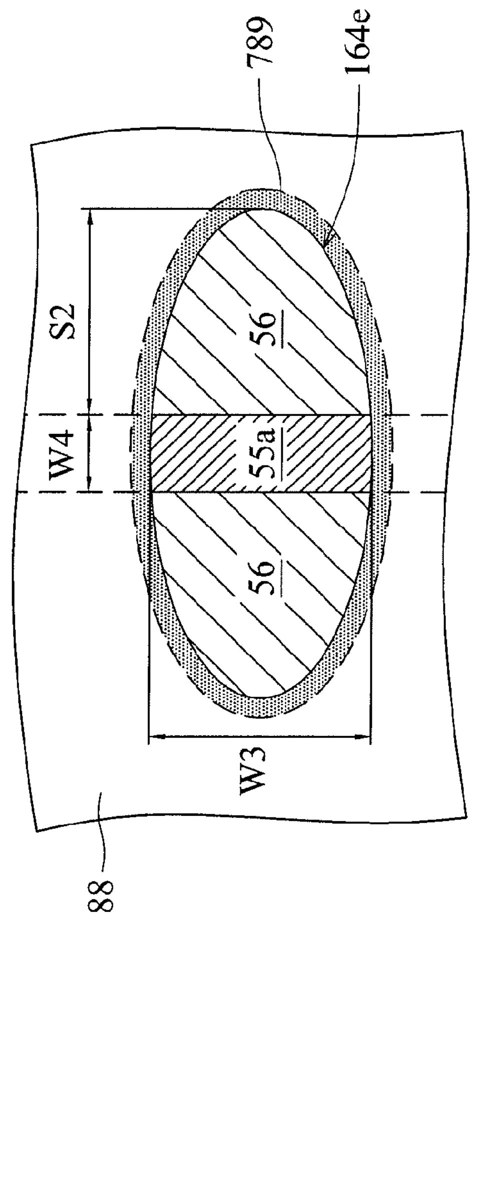

FIG. 235 is a fourth example of a schematic top perspective view showing the through via 164*e*, the insulating plug 789 enclosing the through via 164*e*, and the interconnect or metal trace 55*a* as illustrated in FIG. 231. The schematic top perspective view shown in FIG. 235 is similar to the schematic top perspective view shown in FIG. 42A except that the through via 164*e* shown in FIG. 235 is formed within one of the insulating plugs 789 in the middle one of the chips 72. For more detailed description about the through via 164*e* and the interconnect or metal trace 55*a* as shown in FIG. 235, please refer to the illustration in FIG. 42A.

Figure 236:
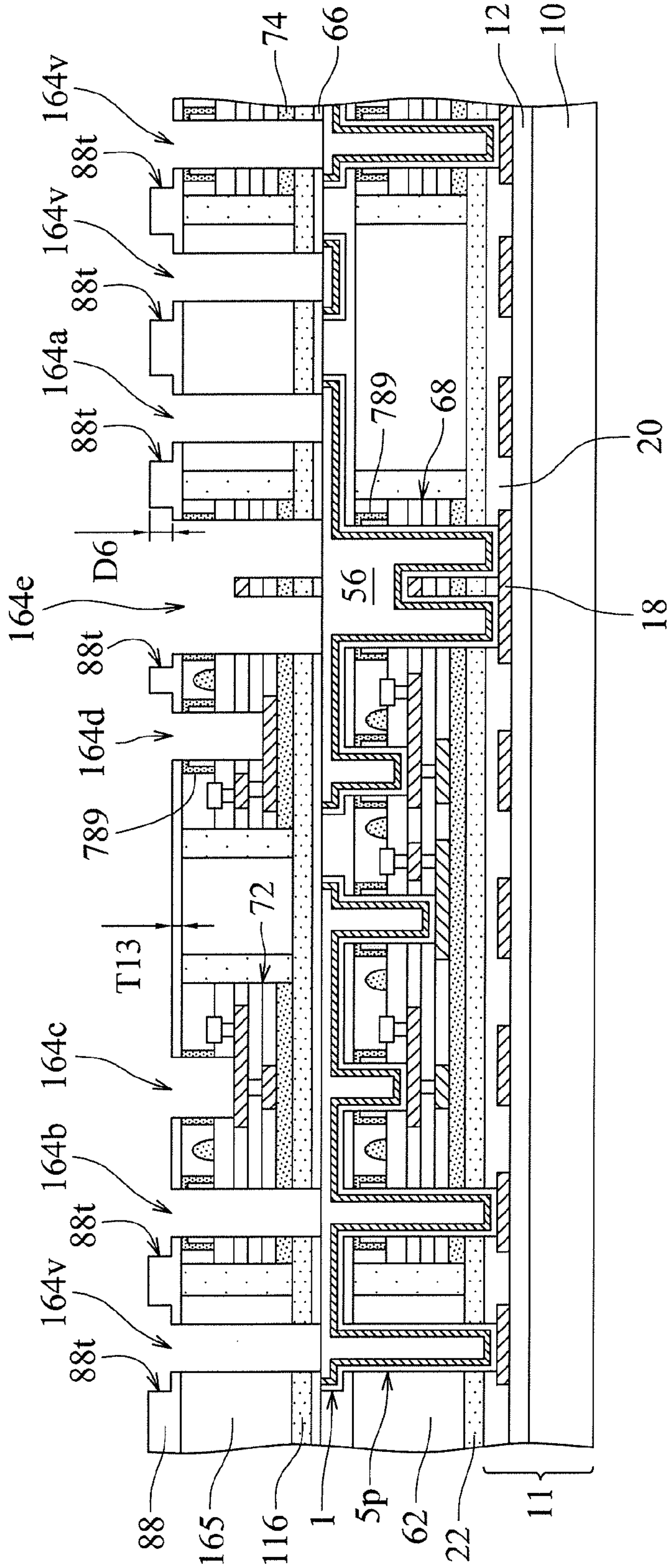

Referring to FIG. 236, after forming the structure illustrated in FIG. 231, multiple trenches 88*t* are formed in the dielectric layer 88. The trenches 88*t* in the dielectric layer 88 have a depth D6, e.g., between 0.1 and 5 micrometers, and preferably between 0.5 and 3 micrometers. The dielectric layer 88 under the trenches 88*t* has a remaining thickness T13, e.g., between 0.1 and 5 micrometers, and preferably between 0.3 and 5 micrometers, between 0.5 and 2 micrometers, between 0.1 and 3 micrometers, or between 0.2 and 1.5 micrometers. The steps of forming the trenches 88*t* in the dielectric layer 88 shown in FIG. 236 can be referred to as the steps of forming the trenches 60*t* in the dielectric layer 60 as illustrated in FIGS. 153-155. The trenches 88*t* formed in the dielectric layer 88 are used to provide spaces having inter-chip interconnects and intra-chip interconnects formed therein. Also, FIG. 168 can be an example of a schematic top perspective view showing the trenches 88*t* and the through vias 164*v* shown in FIG. 236, and FIG. 236 also can be a cross-sectional view cut along the line H-H shown in FIG. 168.

Alternatively, the trenches 88*t* illustrated in FIG. 236 can be formed in the dielectric layer 88 before the through vias 164*v* illustrated in FIG. 231 are formed in the chips 72 and in the dummy substrate(s) 165. Specifically, after the dielectric layer 88 is formed on the surfaces 96*s*, 98*s*, 165*s* and 789*t* as shown in FIG. 230, the trenches 88*t* illustrated in FIG. 236 are first formed in the dielectric layer 88, and then the through vias 164*v* illustrated in FIG. 231 are formed in the chips 72 and in the dummy substrate(s) 165, exposing the conduction layer 56 of the metal interconnects 1 and exposing the layers 114 and 106 of the chips 72.

Figure 237:
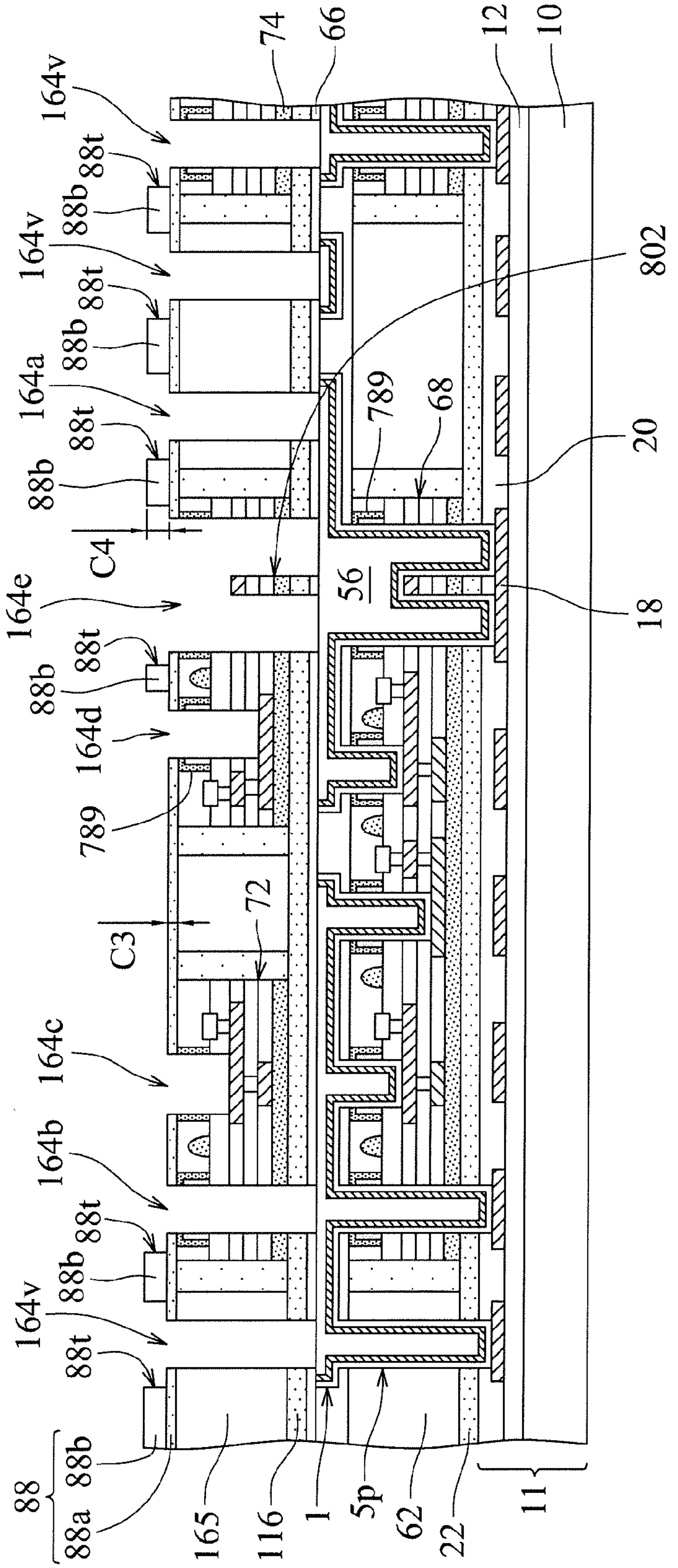

Alternatively, referring to FIG. 237, the dielectric layer 88, the trenches 88*t*, and the through vias 164*v* as shown in FIG. 236 can be formed by the following steps. After forming the structure illustrated in FIG. 229, an insulating layer 88*a*, such as a layer of silicon oxide, silicon nitride, silicon oxynitride, silicon carbon nitride, or silicon oxycarbide, having a thickness C3, e.g., between 0.1 and 5 micrometers, and preferably between 0.2 and 1.5 micrometers or between 0.15 and 2 micrometers, is formed on the surface 96*s* of the semiconductor substrate 96 of each chip 72, on the surface(s) 165*s* of the dummy substrate(s) 165, on the exposed bottom surfaces 789*t* of the insulating plugs 789 in the chips 72, and on the surface 98*s* of the encapsulation/gap filling material 98 as shown in FIG. 229.

Next, a polymer layer 88*b*, such as a layer of polyimide, benzocyclobutene (BCB), epoxy, polybenzoxazole (PBO), or poly-phenylene oxide (PPO), is formed on the insulating layer 88*a* using a suitable process, such as spin coating process, screen printing process, or lamination process. Next, an exposure process and a development process can be employed to form the trenches 88*t*, exposing the insulating layer 88*a*, in the polymer layer 88*b*. A 1X stepper or 1X contact aligner can be used to expose the polymer layer 88*b* during the exposure process. Next, the polymer layer 88*b* is cured or heated at a temperature between 150 degrees centigrade and 400 degrees centigrade, and preferably between 180 degrees centigrade and 250 degrees centigrade. The polymer layer 88*b* after being cured or heated has a thickness C4, e.g., between 1 and 50 micrometers, and preferably between 2 and 30 micrometers or between 5 and 25 micrometers.

Next, a photoresist layer is formed on the insulating layer 88*a* exposed by the trenches 88*t* and on the polymer layer 88*b*, and multiple openings in the photoresist layer expose the insulating layer 88*a* at bottoms of the trenches 88*t*. Next, the insulating layer 88*a* under the openings in the photoresist layer is removed using a suitable process, such as anisotropic plasma etching process. Next, the dummy substrate(s) 165 under the openings in the photoresist layer and the chips 72 under the openings in the photoresist layer are etched away until predetermined regions of the layers 106 and 114 in the chips 72 and predetermined regions of the conduction layer 56 of the metal interconnects 1 are exposed by the openings in the photoresist layer. Next, the photoresist layer is removed by using, e.g., an organic chemical. Accordingly, the through vias 164*v*, including the through vias 164*a*, 164*b*, 164*c*, 164*d* and 164*e*, are formed in the chips 72 and in the dummy substrate(s) 165, exposing the conduction layer 56 of the metal interconnects 1 and exposing the layers 106 and 114 of the chips 72. The specifications of the through vias 164*v* and the supporter 802 shown in FIG. 237 can be referred to as the specifications of the through vias 164*v* and the supporter 802, respectively, illustrated in FIGS. 231-235.

Accordingly, using the above-mentioned steps, the above-mentioned dielectric layer 88 also can be provided with the insulating layer 88*a* and the polymer layer 88*b* on the insulating layer 88*a*. The trenches 88*t* in the polymer layer 88*b* expose the insulating layer 88*a* and are used to provide spaces having inter-chip interconnects and intra-chip interconnects formed therein. The through vias 164*v* are formed under the trenches 88*t*. Also, FIG. 168 can be an example of a schematic top perspective view showing the trenches 88*t* and the through vias 164*v* shown in FIG. 237, and FIG. 237 also can be a cross-sectional view cut along the line H-H shown in FIG. 168.

Figure 238:
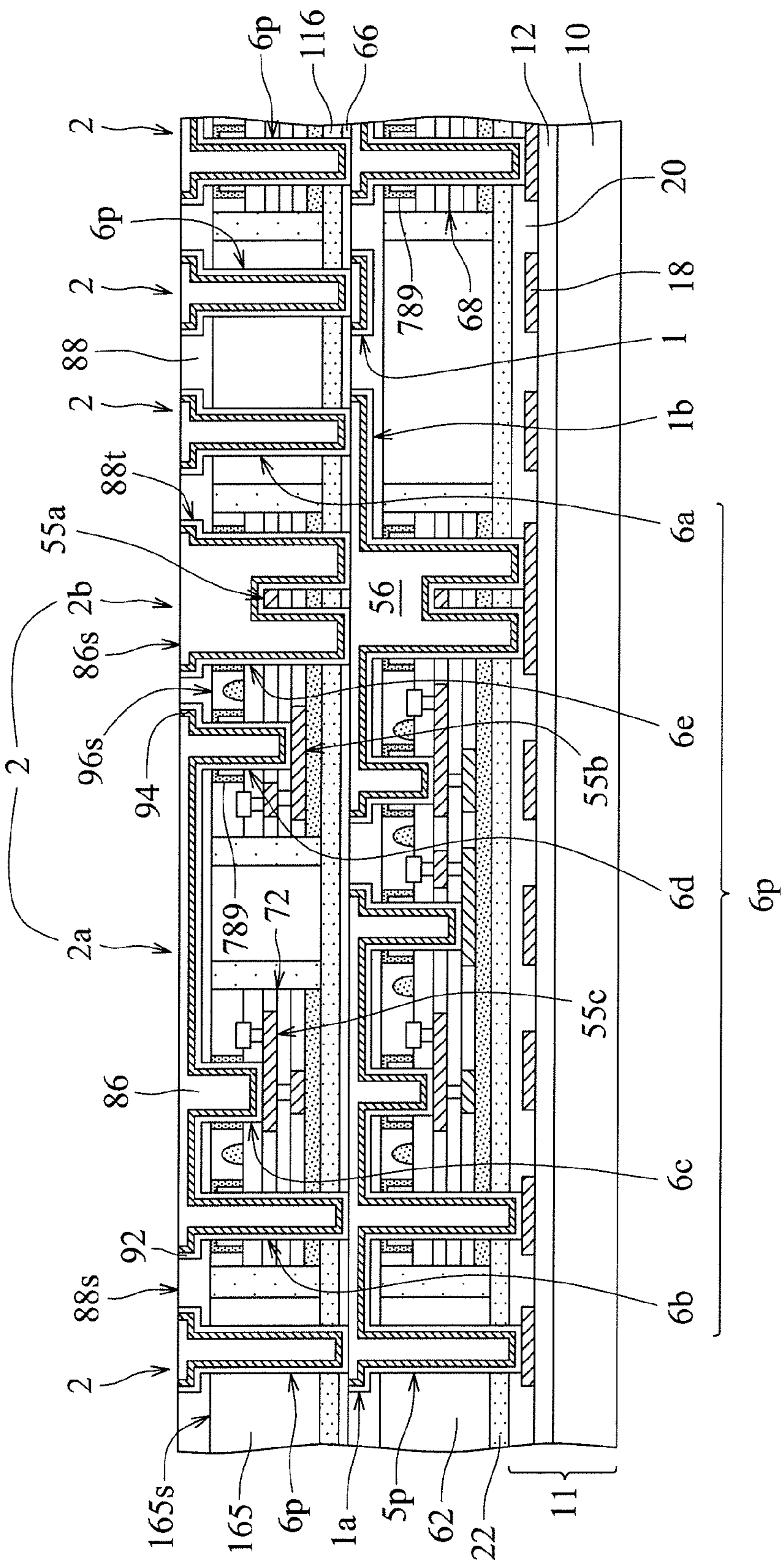

Referring to FIG. 238, after forming the structure illustrated in FIG. 236 or in FIG. 237, multiple metal interconnects (or damascene metal traces) 2, including metal interconnects (or damascene metal traces) 2*a* and 2*b*, are formed in the trenches 88*t*, and multiple metal plugs (or metal vias) 6*p* are formed in the through vias 164*v*. The metal plugs 6*p* include metal plugs (or metal vias) 6*a*, 6*b*, 6*c*, 6*d* and 6*e* in the through vias 164*a*, 164*b*, 164*c*, 164*d* and 164*e*, respectively. The metal plug 6*a* is formed in the dummy substrate 165. The metal plugs 6*b* and 6*c* are formed in the left one of the chips 72, and the metal plugs 6*d* and 6*e* are formed in the middle one of the chips 72. The supporter 802 and the interconnect or metal trace 55*a*, in the interconnection layer 106, on the supporter 802 can be between two portions, lower than a horizontal level, at which a top surface of the interconnection layer 106 is positioned, of the metal plug 6*e*.

The metal interconnects 2 in the trenches 88*t* and the metal plugs 6*p* in the through vias 164*v* can be formed by the following steps. First, the adhesion/barrier layer 92 illustrated in FIG. 51 is formed on the layers 56, 106 and 114 exposed by the through vias 164*v*, on sidewalls of the through vias 164*v*, on sidewalls and bottoms of the trenches 88*t* (or on sidewalls of the trenches 88*t* in the polymer layer 88*b* and on a top surface of the insulating layer 88*a* at the bottoms of the trenches 88*t*), on the inner walls, exposed by the through vias 164*v*, of the insulating plugs 789, and on the interconnect or metal trace 55*a* that is on the supporter 802 by a physical vapor deposition (PVD) process, such as sputtering process or evaporation process, by a chemical-vapor deposition (CVD) process, or by other thin-film deposition processes, such as atomic layer deposition (ALD). Next, the seed layer 94 illustrated in FIG. 51 is formed on the adhesion/barrier layer 92, in the through vias 164*v*, and in the trenches 88*t* by a physical vapor deposition (PVD) process, such as sputtering process or evaporation process, by a chemical-vapor deposition (CVD) process, or by other thin-film deposition processes, such as atomic layer deposition (ALD). Next, the conduction layer 86 illustrated in FIG. 51 is formed on the seed layer 94, in the through vias 164*v*, and in the trenches 88*t* by using a suitable process, such as electroplating process. Next, the layers 92, 94 and 86 are ground or polished by using, e.g., a chemical-mechanical-polishing (CMP) process, a mechanical polishing process, a mechanical grinding process, or a process including mechanical polishing and chemical etching until the dielectric layer 88 has an exposed top surface 88*s*, over which there are no portions of the layers 92, 94 and 86, and the layers 92, 94 and 86 outside the trenches 88*t* are removed. Accordingly, the layers 92, 94 and 86 in the trenches 88*t* compose the metal interconnects 2, including the metal interconnects 2*a* and 2*b*, in the trenches 88*t*. The layers 92, 94 and 86 in the through vias 164*v* compose the metal plugs 6*p* in the through vias 164*v*, including the metal plugs 6*a*, 6*b*, 6*c*, 6*d* and 6*e* in the through vias 164*a*, 164*b*, 164*c*, 164*d* and 164*e*, respectively. The adhesion/barrier layer 92 and the seed layer 94 are at sidewalls and a bottom of the conduction layer 86 in the trenches 88*t*, and the sidewalls and the bottom of the conduction layer 86 in the trenches 88*t* are covered by the adhesion/barrier layer 92 and the seed layer 94.

In a first alternative, after the layers 92, 94 and 86 are ground or polished, the adhesion/barrier layer 92 can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 88*t* (or on the sidewalls of the trenches 88*t* in the polymer layer 88*b* and on the top surface of the insulating layer 88*a* at the bottoms of the trenches 88*t*), on the layers 56, 106 and 114 at the bottoms of the through vias 164*v*, on the sidewalls of the through vias 164*v*, on the inner walls of the insulating plugs 789 in the chips 72, and on the interconnect or metal trace 55*a* that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer, in the trenches 88*t*, and in the through vias 164*v*. The conduction layer 86 can be an electroplated copper layer on the single layer of copper or a titanium-copper alloy, in the trenches 88*t*, and in the through vias 164*v*. The electroplated copper layer in the trenches 88*t* has a thickness, e.g., between 0.1 and 5 micrometers, and preferably between 0.3 and 1.5 micrometers or between 0.5 and 3 micrometers, in case the dielectric layer 88, the trenches 88*t*, and the through vias 164*v* are formed as illustrated in FIGS. 230-236. Alternatively, the electroplated copper layer in the trenches 88*t* has a thickness, e.g., between 1 and 50 micrometers, and preferably between 2 and 30 micrometers or between 5 and 25 micrometers, in case the dielectric layer 88 composed of the layers 88_a_ and 88_b_, the trenches 88_t_, and the through vias 164_v_ are formed as illustrated in FIG. 237.

In a second alternative, after the layers 92, 94 and 86 are ground or polished, the adhesion/barrier layer 92 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 88_t_ (or on the sidewalls of the trenches 88_t_ in the polymer layer 88_b_ and on the top surface of the insulating layer 88_a_ at the bottoms of the trenches 88_t_), on the layers 56, 106 and 114 at the bottoms of the through vias 164_v_, on the sidewalls of the through vias 164_v_, on the inner walls of the insulating plugs 789 in the chips 72, and on the interconnect or metal trace 55_a_ that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer, in the trenches 88_t_, and in the through vias 164_v_. The conduction layer 86 can be an electroplated copper layer on the single layer of copper or a titanium-copper alloy, in the trenches 88_t_, and in the through vias 164_v_. The electroplated copper layer in the trenches 88_t_ has a thickness, e.g., between 0.1 and 5 micrometers, and preferably between 0.3 and 1.5 micrometers or between 0.5 and 3 micrometers, in case the dielectric layer 88, the trenches 88_t_, and the through vias 164_v_ are formed as illustrated in FIGS. 230-236. Alternatively, the electroplated copper layer in the trenches 88_t_ has a thickness, e.g., between 1 and 50 micrometers, and preferably between 2 and 30 micrometers or between 5 and 25 micrometers, in case the dielectric layer 88 composed of the layers 88_a_ and 88_b_, the trenches 88_t_, and the through vias 164_v_ are formed as illustrated in FIG. 237.

In a third alternative, after the layers 92, 94 and 86 are ground or polished, the adhesion/barrier layer 92 can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 88_t_ (or on the sidewalls of the trenches 88_t_ in the polymer layer 88_b_ and on the top surface of the insulating layer 88_a_ at the bottoms of the trenches 88_t_), on the layers 56, 106 and 114 at the bottoms of the through vias 164_v_, on the sidewalls of the through vias 164_v_, on the inner walls of the insulating plugs 789 in the chips 72, and on the interconnect or metal trace 55_a_ that is on the supporter 802. The seed layer 94 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer, in the trenches 88_t_, and in the through vias 164_v_. The conduction layer 86 can be an electroplated copper layer on the single layer of copper or a titanium-copper alloy, in the trenches 88_t_, and in the through vias 164_v_. The electroplated copper layer in the trenches 88_t_ has a thickness, e.g., between 0.1 and 5 micrometers, and preferably between 0.3 and 1.5 micrometers or between 0.5 and 3 micrometers, in case the dielectric layer 88, the trenches 88_t_, and the through vias 164_v_ are formed as illustrated in FIGS. 230-236. Alternatively, the electroplated copper layer in the trenches 88_t_ has a thickness, e.g., between 1 and 50 micrometers, and preferably between 2 and 30 micrometers or between 5 and 25 micrometers, in case the dielectric layer 88 composed of the layers 88_a_ and 88_b_, the trenches 88_t_, and the through vias 164_v_ are formed as illustrated in FIG. 237.

The exposed top surface 88_s_ of the dielectric layer 88 can be substantially coplanar with the ground or polished surface 86_s_ of the conduction layer 86 in the trenches 88_t_, and the surfaces 86_s_ and 88_s_ can be substantially flat. After the layers 92, 94 and 86 are ground or polished, the dielectric layer 88 may have a thickness, between the exposed top surface 88_s_ and the surface 96_s_ or 165_s_, e.g., between 1 and 10 micrometers, and preferably between 1 and 3 micrometers, in case the dielectric layer 88, the trenches 88_t_, and the through vias 164_v_ are formed as illustrated in FIGS. 230-236. Alternatively, after the layers 92, 94 and 86 are ground or polished, the polymer layer 88_b_ of the dielectric layer 88 may have a thickness, between the exposed top surface 88_s_ of the polymer layer 88_b_ and the top surface of the insulating layer 88_a_, e.g., between 1 and 50 micrometers, and preferably between 2 and 30 micrometers or between 5 and 25 micrometers, in case the dielectric layer 88 composed of the layers 88_a_ and 88_b_, the trenches 88_t_, and the through vias 164_v_ are formed as illustrated in FIG. 237.

Each of the metal plugs 6_p_ in the chips 72 passes through and is enclosed by one of the insulating plugs 789 in the chips 72 and contacts the inner wall of the one of the insulating plugs 789. For example, the metal plug 6_b_ in the left one of the chips 72 passes through and is enclosed by one of the insulating plugs 789 in the left one of the chips 72, contacts the inner wall of the one of the insulating plugs 789, and contacts the insulating layer 456, enclosed by the insulating layer 567, of the one of the insulating plugs 789. The metal plug 6_c_ in the left one of the chips 72 passes through and is enclosed by another one of the insulating plugs 789 in the left one of the chips 72, contacts the inner wall of the another one of the insulating plugs 789, and contacts the insulating layer 567 of the another one of the insulating plugs 789. The metal plug 6_d_ in the middle one of the chips 72 passes through and is enclosed by one of the insulating plugs 789 in the middle one of the chips 72, contacts the inner wall of the one of the insulating plugs 789, and contacts the insulating layer 456, enclosed by the insulating layer 567, of the one of the insulating plugs 789. The metal plug 6_e_ in the middle one of the chips 72 passes through and is enclosed by another one of the insulating plugs 789 in the middle one of the chips 72, contacts the inner wall of the another one of the insulating plugs 789, and contacts the insulating layer 567 of the another one of the insulating plugs 789. For more detailed description about the metal plugs 6_p_ (including the metal plugs 6_a_-6_e_) and the metal interconnects 2 (including the metal interconnects 2_a_ and 2_b_) shown in FIG. 238, please refer to the illustration in FIG. 52.

Alternatively, the element 72 not only can indicate a chip, but also can indicate a wafer. When the element 72 is a wafer, the element 68 can be another wafer. Thereby, the process illustrated in the invention can be employed to the wafer-to-wafer bonding.

Figure 239:
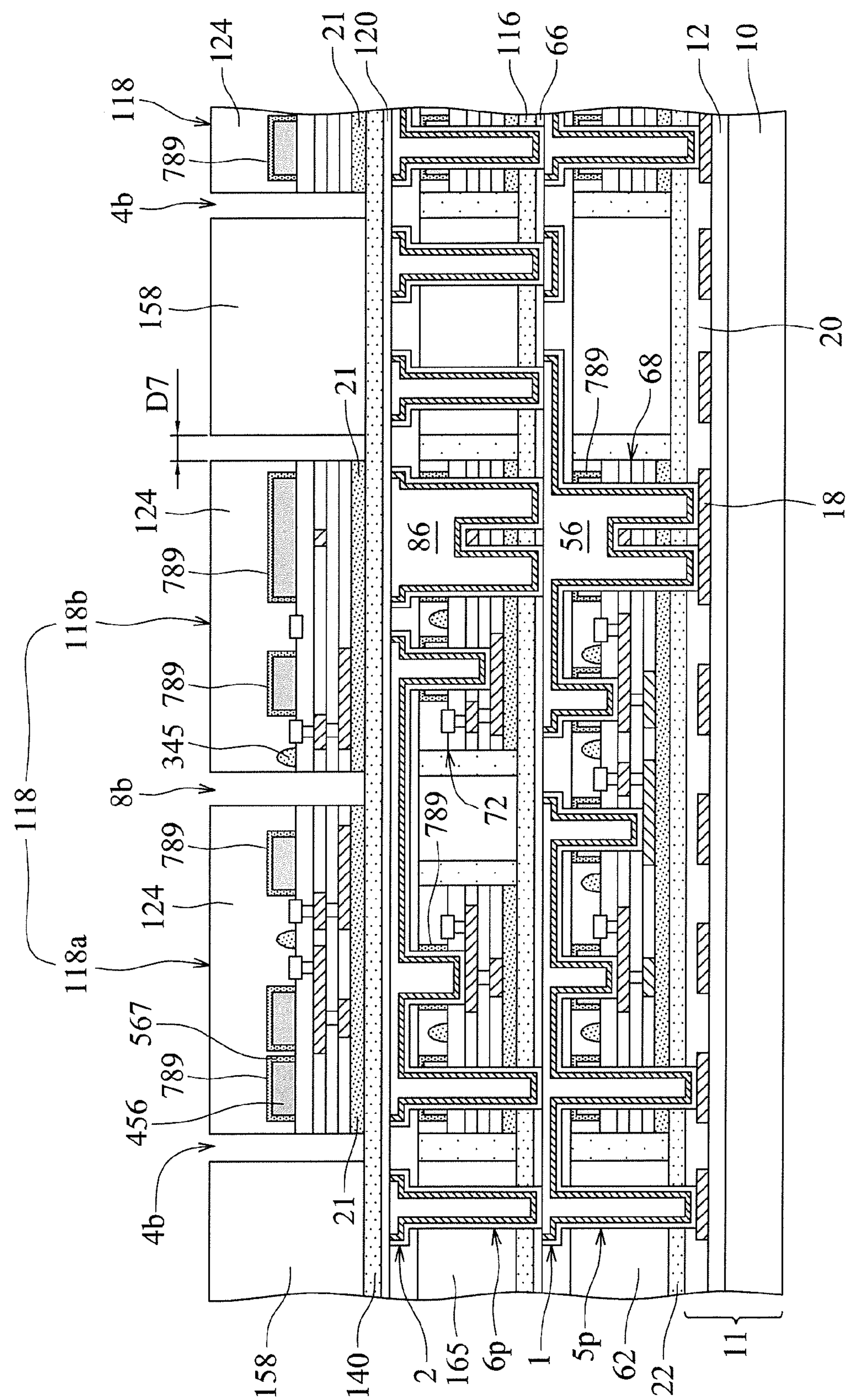

Referring to FIG. 239, after forming the structure illustrated in FIG. 238, the insulating or dielectric layer 120 illustrated in FIG. 53 is formed on the ground or polished surface 86_s_ of the conduction layer 86 and on the exposed top surface 88_s_ of the dielectric layer 88. Next, multiple chips 118, each of which is like the chip 118_a_ or 118_b_ illustrated in FIG. 212N, and the previously described dummy substrate(s) 158 are placed over the layer 140, which can be referred to as the steps illustrated in FIGS. 54-59. The arrangement of placing the chips 118 and the dummy substrate(s) 158 over the insulating or dielectric layer 120, in the embodiment, can be referred to as that of placing the chips 118 and the dummy substrate(s) 158 over the insulating or dielectric layer 120 as illustrated in FIG. 58 or 59.

Figure 240:
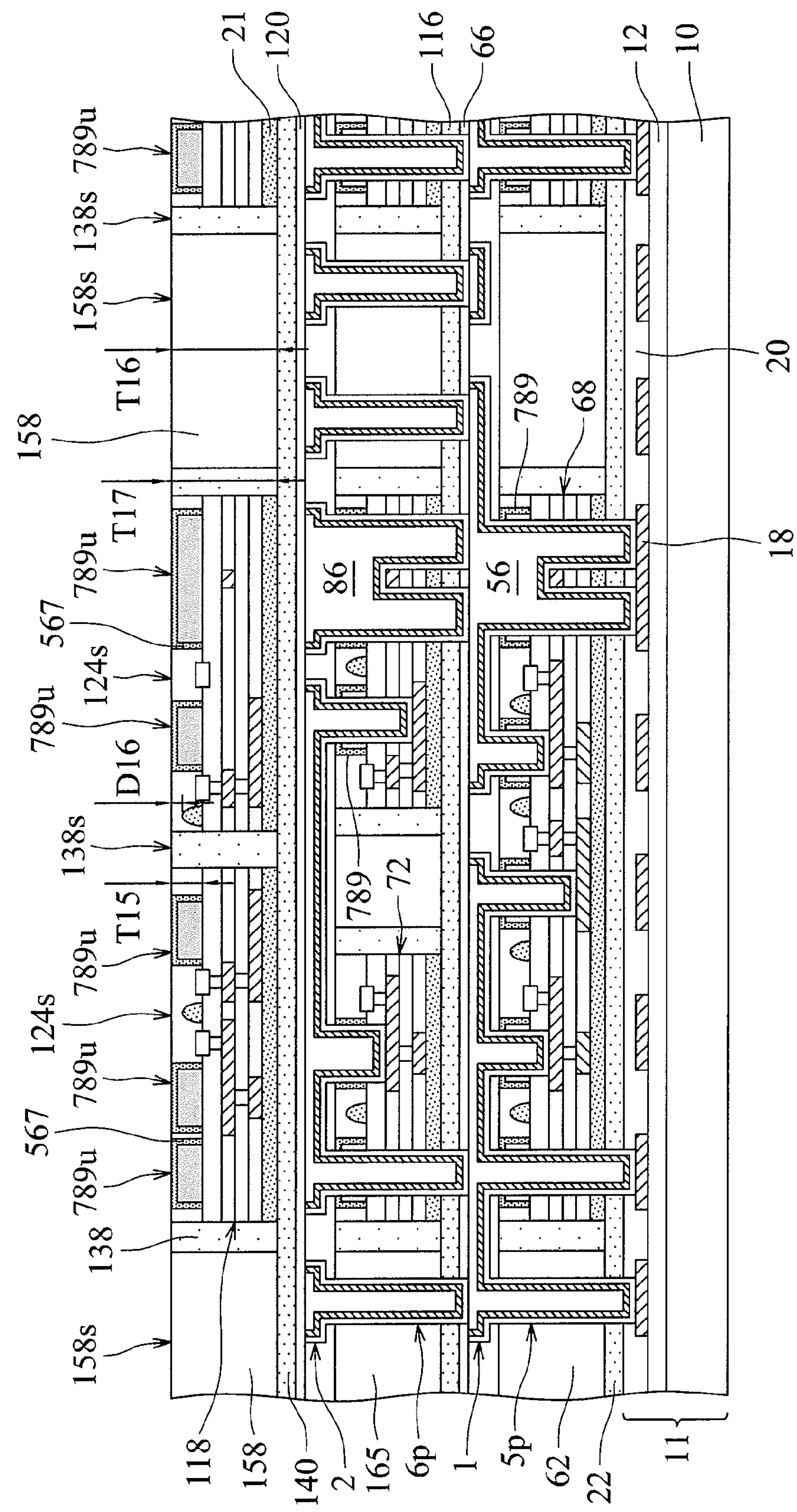

Next, referring to FIG. 240, an encapsulation/gap filling material 138 is formed on a backside of the semiconductor substrate 124 of each chip 118, on the dummy substrate(s) 158, and in the gaps 4*b* and 8*b*. Next, the encapsulation/gap filling material 138, the backside of the semiconductor substrate 124 of each chip 118, and the dummy substrate(s) 158 are ground or polished by a suitable process, such as mechanical grinding process, mechanical polishing process, chemical-mechanical-polishing (CMP) process, or a process including mechanical grinding and chemical-mechanical polishing, until all of the insulating plugs 789 in the chips 118 have exposed bottom surfaces 789*u*, over which there are no portions of the semiconductor substrates 124. The steps of forming the encapsulation/gap filling material 138 and grinding or polishing the encapsulation/gap filling material 138, the backside of the semiconductor substrate 124 of each chip 118, and the dummy substrate(s) 158 illustrated in FIG. 240 can be referred to as the steps of forming the encapsulation/gap filling material 64 and grinding or polishing the encapsulation/gap filling material 64, the backside of the semiconductor substrate 58 of each chip 68, and the dummy substrate (s) 62 as illustrated in FIGS. 214-217. The encapsulation/gap filling material 138 can be polysilicon, silicon oxide, or a polymer. In the case that the insulating layer 567 of the insulating plugs 789 is composed only of the layer of silicon nitride or silicon oxynitride, during the grinding or polishing process, the exposed bottom surfaces 789*u* are provided by the layer of silicon nitride or silicon oxynitride at tops of the insulating plugs 789. In the another case that the insulating layer 567 of the insulating plugs 789 is composed of the layer of silicon oxide and the layer of silicon nitride or silicon oxynitride, during the grinding or polishing process, the layer of silicon oxide at tops of the insulating plugs 789 is removed and the exposed bottom surfaces 789*u* are provided by the layer of silicon nitride or silicon oxynitride at the tops of the insulating plugs 789.

Accordingly, the semiconductor substrate 124 of each of the chips 118 can be thinned to a thickness T15, e.g., between 1 and 100 micrometers, between 1 and 50 micrometers, between 1 and 30 micrometers, between 1 and 10 micrometers, or between 1 and 5 micrometers, and preferably between 2 and 20 micrometers or between 3 and 30 micrometers. Regarding to each of the chips 118, after the grinding or polishing process, the insulating plugs 789 and the semiconductor substrate 124 may have the same thickness T15. Preferably, each of the chips 118, after the grinding or polishing process, may have a thickness, e.g., between 3 and 105 micrometers, and preferably between 3 and 30 micrometers or between 5 and 25 micrometers.

After the grinding or polishing process, the dummy substrate(s) 158 can be thinned to a thickness T16, e.g., between 3 and 100 micrometers, and preferably between 3 and 30 micrometers or between 5 and 25 micrometers, and the encapsulation/gap filling material 138 remaining in the gaps 4*b* and 8*b* may have a vertical thickness T17, e.g., between 3 and 100 micrometers, and preferably between 3 and 30 micrometers or between 5 and 25 micrometers. The ground or polished surface 124*s* of the semiconductor substrate 124, at the backside of each chip 118, and the ground or polished surface(s) 158*s* of the dummy substrate(s) 158 can be substantially flat and not covered by the encapsulation/gap filling material 138. The ground or polished surface(s) 158*s* may be substantially coplanar with the ground or polished surface 124*s* of each chip 118, with the ground or polished surface 138*s* of the encapsulation/gap filling material 138 in the gaps 4*b* and 8*b*, and with the exposed bottom surfaces 789*u* of the insulating plugs 789 in the chips 118. In each chip 118, a vertical distance D16 between the ground or polished surface 124*s* of the semiconductor substrate 124 and the bottom of the shallow trench isolation 345 can be, e.g., greater than 0.1 micrometers, such as between 1 and 100 micrometers, between 1 and 50 micrometers, between 1 and 25 micrometers, between 1 and 10 micrometers, between 1 and 5 micrometers, or between 0.1 and 2 micrometers.

Figure 241:
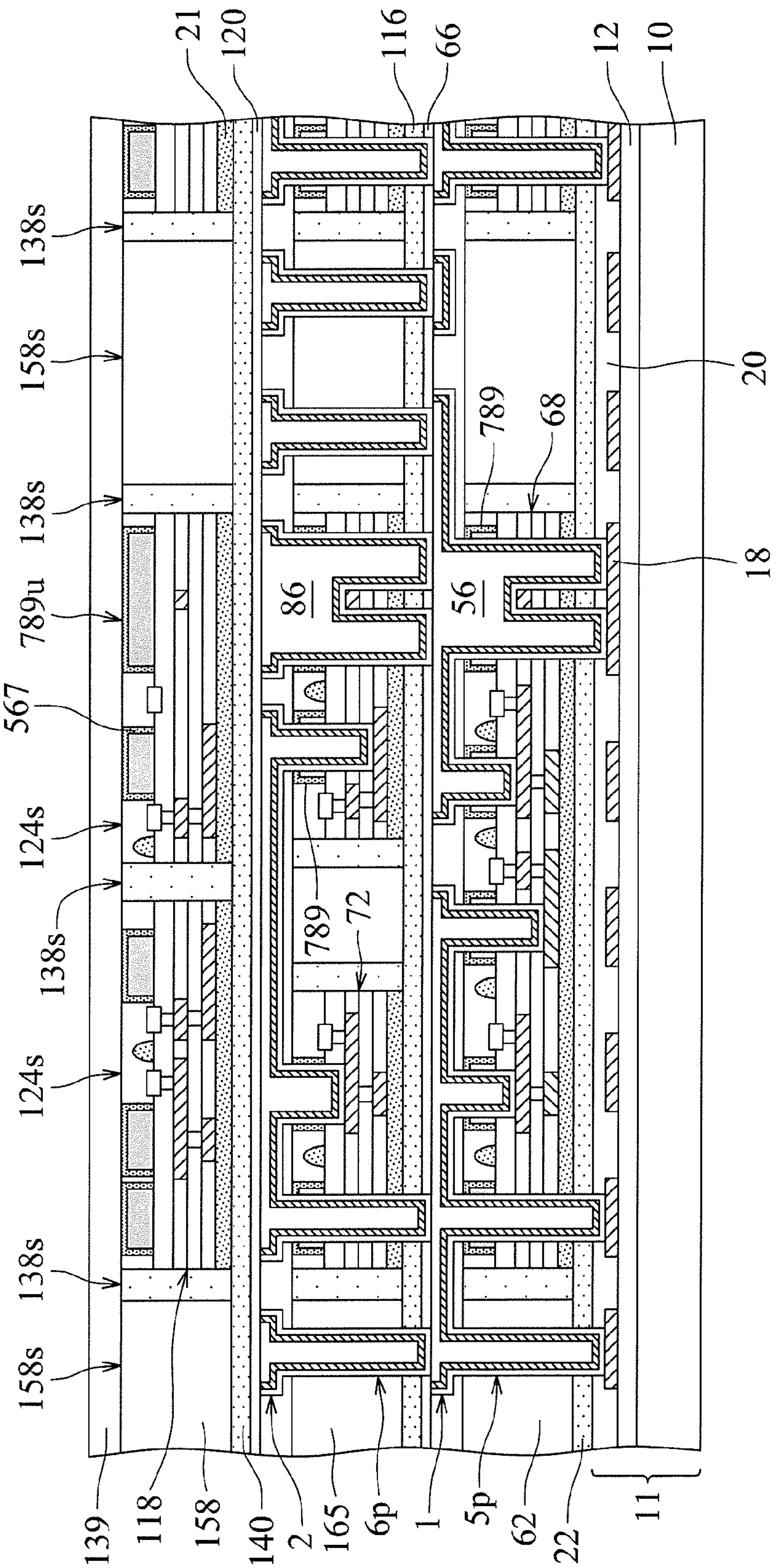

Referring to FIG. 241, after forming the structure illustrated in FIG. 240, the dielectric layer 139 illustrated in FIG. 64 is formed on the surface 124*s* of the semiconductor substrate 124 of each chip 118, on the surface(s) 158*s* of the dummy substrate(s) 158, on the exposed bottom surfaces 789*u* of the insulating plugs 789 in the chips 118, and on the surface 138*s* of the encapsulation/gap filling material 138.

Figure 242:
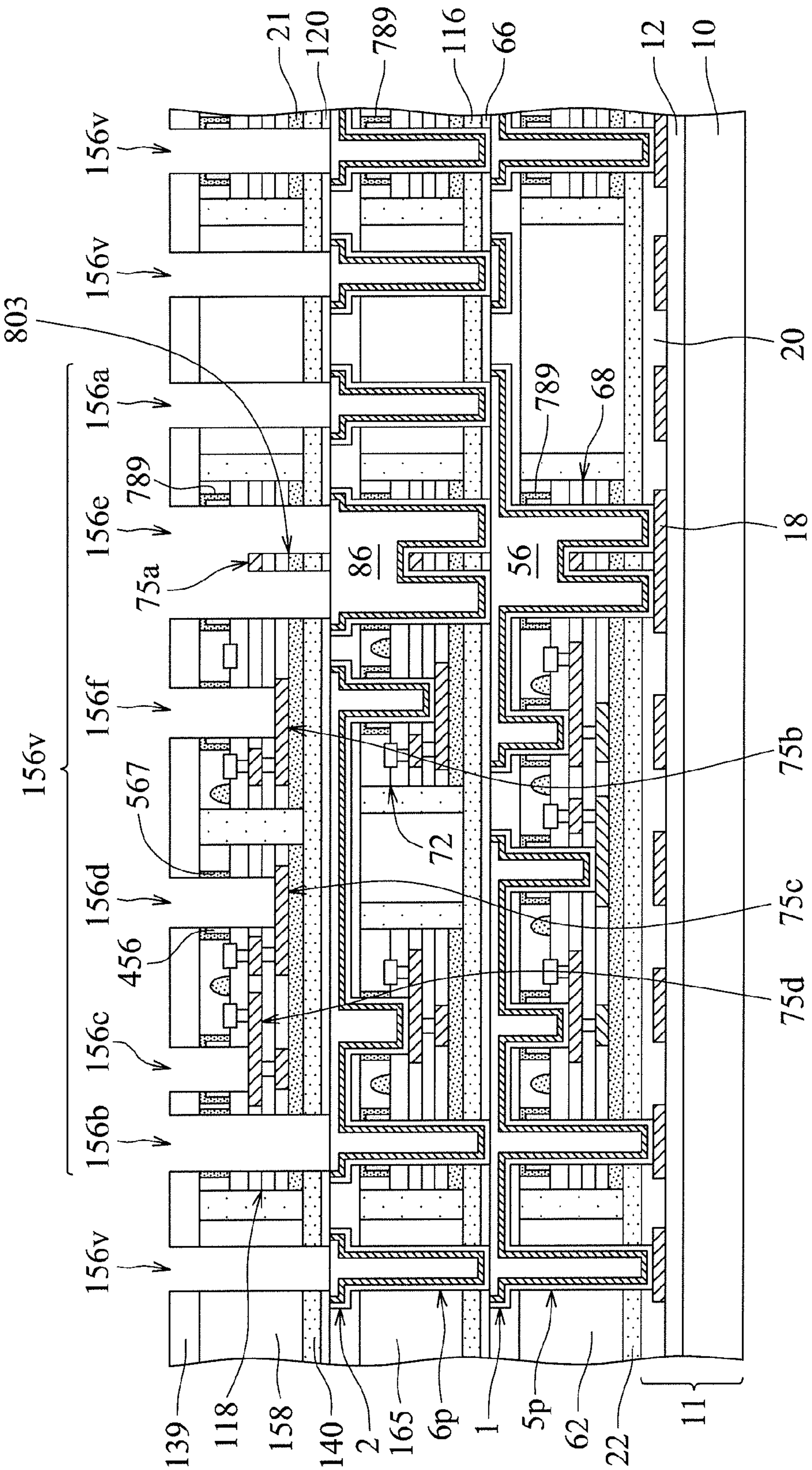

Next, referring to FIG. 242, multiple through vias 156*v*, including through vias 156*a*, 156*b*, 156*c*, 156*d*, 156*e* and 156*f*, are formed in the chips 118 and in the dummy substrate (s) 158, exposing the conduction layer 86 of the metal interconnects 2 and exposing the layers 17 and 19 of the chips 118, which can be referred to as the steps illustrated in FIG. 65, but, in the embodiment, forming the through vias 156*v* (such as the vias 156*b*-156*f*) in the chips 118 includes etching through the insulating plugs 789 in the chips 118. The insulating plugs 789 in the chips 118 are enclosed by the semiconductor substrates 124 of the chips 118. The through vias 156*v* in the chips 118 pass through and are enclosed by the insulating plugs 789 in the chips 118 and expose inner walls of the insulating plugs 789. For example, the through via 156*b* in the left one of the chips 118 passes through and is enclosed by one of the insulating plugs 789 in the left one of the chips 118, exposes an inner wall of the one of the insulating plugs 789, and exposes the insulating layer 567 of the one of the insulating plugs 789. The through via 156*c* in the left one of the chips 118 passes through and is enclosed by another one of the insulating plugs 789 in the left one of the chips 118, exposes an inner wall of the another one of the insulating plugs 789, and exposes the insulating layer 456, enclosed by the insulating layer 567, of the another one of the insulating plugs 789. The through via 156*d* in the left one of the chips 118 passes through and is enclosed by another one of the insulating plugs 789 in the left one of the chips 118, exposes an inner wall of the another one of the insulating plugs 789, and exposes the insulating layer 567 and the insulating layer 456, enclosed by the layer 567, of the another one of the insulating plugs 789. The through via 156*e* in the middle one of the chips 118 passes through and is enclosed by one of the insulating plugs 789 in the middle one of the chips 118, exposes an inner wall of the one of the insulating plugs 789, and exposes the insulating layer 456, enclosed by the insulating layer 567, of the one of the insulating plugs 789. The through via 156*f* in the middle one of the chips 118 passes through and is enclosed by another one of the insulating plugs 789 in the middle one of the chips 118, exposes an inner wall of the another one of the insulating plugs 789, and exposes the insulating layer 567 and the insulating layer 456, enclosed by the layer 567, of the another one of the insulating plugs 789.

Each of the through vias 156*v*, such as the through via 156*a*, 156*b*, 156*c*, 156*d*, 156*e*, or 156*f*, has a width or a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers. For more detailed description about the through vias 156*v*, such as the through vias 156*a*-156*f*, please refer to the illustration in FIG. 65.

As shown in FIG. 242, a supporter 803 provided by the insulating or dielectric layer 120, the layer 140, and the layers 21, 78 and 28 of the middle one of the chips 118 is between the conduction layer 86 of the metal interconnect 2*b* and the interconnect or metal trace 75*a* in the interconnection layer 17 exposed by the through via 156*e* for the purpose of supporting the exposed interconnect or metal trace 75*a*. The supporter 803 may have a height, e.g., between 0.5 and 10 micrometers, and preferably between 1 and 5 micrometers, and a width, e.g., between 0.3 and 30 micrometers, and preferably between 0.3 and 10 micrometers, 0.3 and 5 micrometers, or between 0.3 and 1 micrometers.

Figure 243:
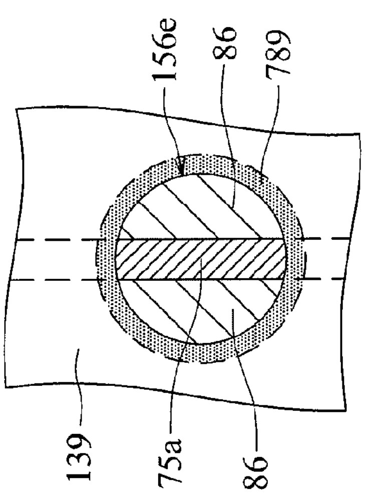

FIG. 243 is a first example of a schematic top perspective view showing the through via 156*e*, the insulating plug 789 enclosing the through via 156*e*, and the interconnect or metal trace 75*a* in the middle one of the chips 118 as illustrated in FIG. 242. The schematic top perspective view shown in FIG. 243 is similar to the schematic top perspective view shown in FIG. 66 except that the through via 156*e* shown in FIG. 243 is formed within one of the insulating plugs 789 in the middle one of the chips 118. For more detailed description about the through via 156*e* and the interconnect or metal trace 75*a* as shown in FIGS. 242 and 243, please refer to the illustration in FIGS. 65 and 66.

Figure 244:
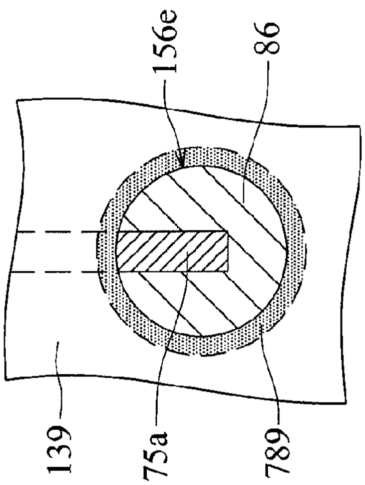

FIG. 244 is a second example of a schematic top perspective view showing the through via 156*e*, the insulating plug 789 enclosing the through via 156*e*, and the interconnect or metal trace 75*a* as illustrated in FIG. 242. The schematic top perspective view shown in FIG. 244 is similar to the schematic top perspective view shown in FIG. 67 except that the through via 156*e* shown in FIG. 244 is formed within one of the insulating plugs 789 in the middle one of the chips 118. For more detailed description about the through via 156*e* and the interconnect or metal trace 75*a* as shown in FIGS. 242 and 244, please refer to the illustration in FIGS. 65 and 67.

Figure 245:
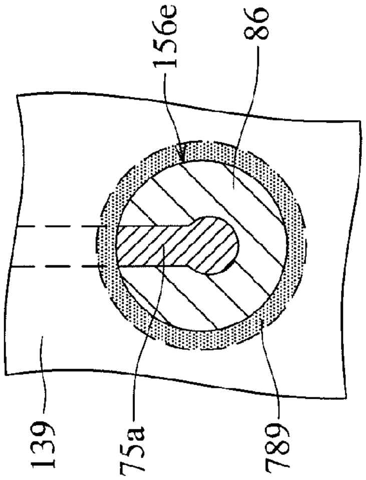

FIG. 245 is a third example of a schematic top perspective view showing the through via 156*e*, the insulating plug 789 enclosing the through via 156*e*, and the interconnect or metal trace 75*a* as illustrated in FIG. 242. The schematic top perspective view shown in FIG. 245 is similar to the schematic top perspective view shown in FIG. 68 except that the through via 156*e* shown in FIG. 245 is formed within one of the insulating plugs 789 in the middle one of the chips 118. For more detailed description about the through via 156*e* and the interconnect or metal trace 75*a* as shown in FIGS. 242 and 245, please refer to the illustration in FIGS. 65 and 68.

Figure 246:
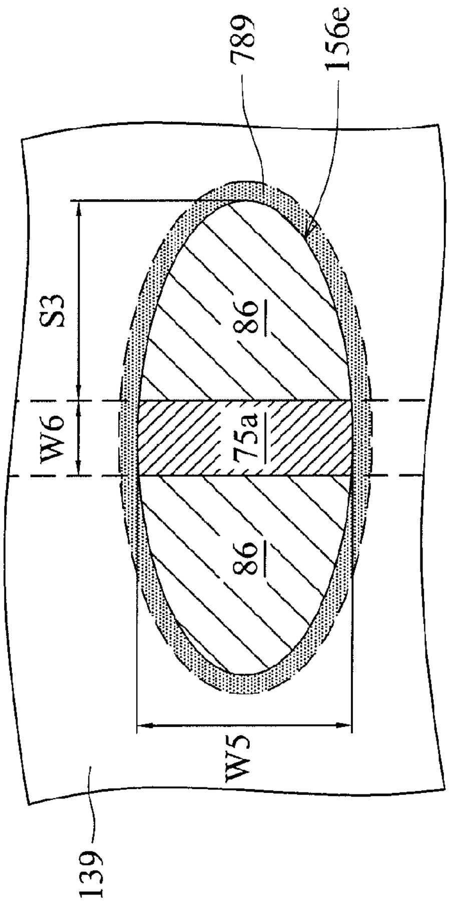

FIG. 246 is a fourth example of a schematic top perspective view showing the through via 156*e*, the insulating plug 789 enclosing the through via 156*e*, and the interconnect or metal trace 75*a* as illustrated in FIG. 242. The schematic top perspective view shown in FIG. 246 is similar to the schematic top perspective view shown in FIG. 66A except that the through via 156*e* shown in FIG. 246 is formed within one of the insulating plugs 789 in the middle one of the chips 118. For more detailed description about the through via 156*e* and the interconnect or metal trace 75*a* as shown in FIG. 246, please refer to the illustration in FIG. 66A.

Figure 247:
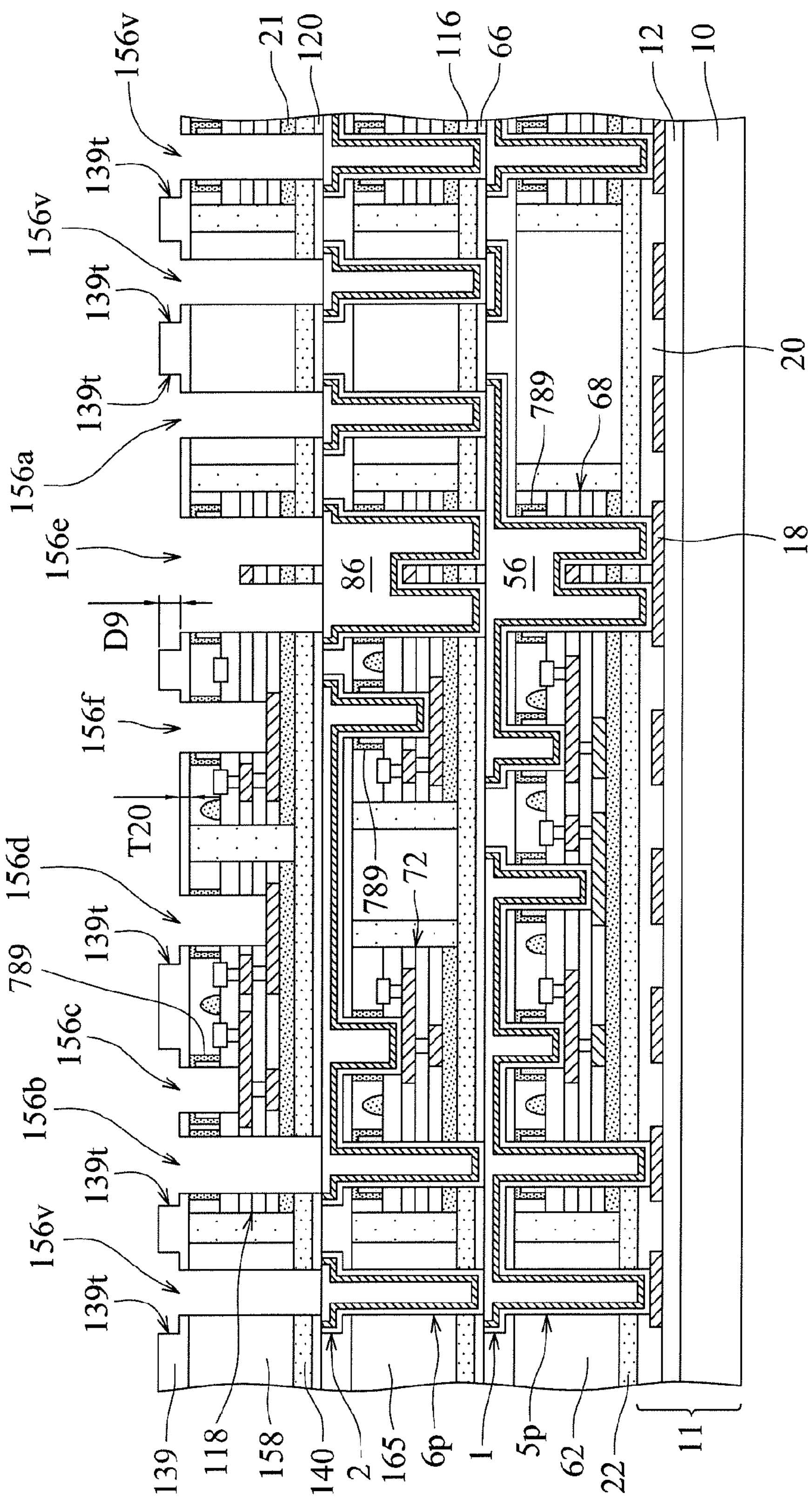

Referring to FIG. 247, after forming the structure illustrated in FIG. 242, multiple trenches 139*t* are formed in the dielectric layer 139. The trenches 139*t* in the dielectric layer 139 have a depth D9, e.g., between 0.1 and 5 micrometers, and preferably between 0.5 and 3 micrometers. The dielectric layer 139 under the trenches 139*t* has a remaining thickness T20, e.g., between 0.1 and 5 micrometers, and preferably between 0.3 and 5 micrometers, between 0.5 and 2 micrometers, between 0.1 and 3 micrometers, or between 0.2 and 1.5 micrometers. The steps of forming the trenches 139*t* in the dielectric layer 139 can be referred to as the steps of forming the trenches 60*t* in the dielectric layer 60 as illustrated in FIGS. 153-155. The trenches 139*t* formed in the dielectric layer 139 are used to provide spaces having inter-chip interconnects and intra-chip interconnects formed therein. Also, FIG. 179 can be an example of a schematic top perspective view showing the trenches 139*t* and the through vias 156*v* shown in FIG. 247, and FIG. 247 also can be a cross-sectional view cut along the line K-K shown in FIG. 179.

Alternatively, the trenches 139*t* illustrated in FIG. 247 can be formed in the dielectric layer 139 before the through vias 156*v* illustrated in FIG. 242 are formed in the chips 118 and the dummy substrate(s) 158. Specifically, after the dielectric layer 139 is formed on the surfaces 124*s*, 138*s*, 158*s* and 789*u* as shown in FIG. 241, the trenches 139*t* illustrated in FIG. 247 are formed in the dielectric layer 139, and then the through vias 156*v* illustrated in FIG. 242 are formed in the chips 118 and in the dummy substrate(s) 158, exposing the conduction layer 86 of the metal interconnects 2 and exposing the layers 17 and 19 of the chips 118.

Figure 248:
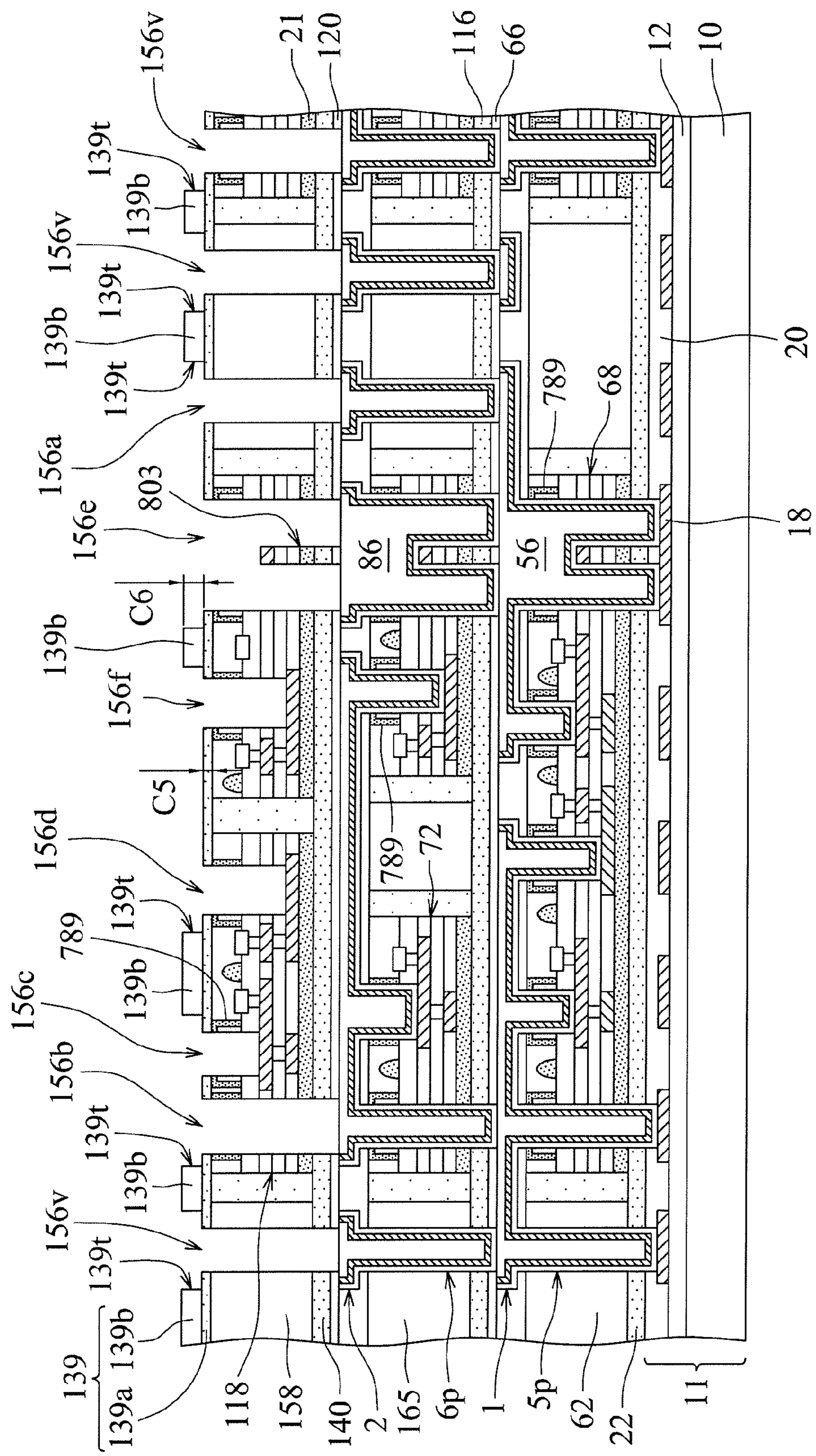

Alternatively, referring to FIG. 248, the dielectric layer 139, the trenches 139*t*, and the through vias 156*v* as shown in FIG. 247 can be formed by the following steps. After forming the structure illustrated in FIG. 240, an insulating layer 139*a*, such as a layer of silicon oxide, silicon nitride, silicon oxynitride, silicon carbon nitride, or silicon oxycarbide, having a thickness C5, e.g., between 0.1 and 5 micrometers, and preferably between 0.2 and 1.5 micrometers or between 0.15 and 2 micrometers, is formed on the surface 124*s* of the semiconductor substrate 124 of each chip 118, on the surface(s) 158*s* of the dummy substrate(s) 158, on the exposed bottom surfaces 789*u* of the insulating plugs 789 in the chips 118, and on the surface 138*s* of the encapsulation/gap filling material 138 as shown in FIG. 240.

Next, a polymer layer 139*b*, such as a layer of polyimide, benzocyclobutene (BCB), epoxy, polybenzoxazole (PBO), or poly-phenylene oxide (PPO), is formed on the insulating layer 139*a* using a suitable process, such as spin coating process, screen printing process, or lamination process. Next, an exposure process and a development process can be employed to form the trenches 139*t*, exposing the insulating layer 139*a*, in the polymer layer 139*b*. A 1X stepper or 1X contact aligner can be used to expose the polymer layer 139*b* during the exposure process. Next, the polymer layer 139*b* is cured or heated at a temperature between 150 degrees centigrade and 400 degrees centigrade, and preferably between 180 degrees centigrade and 250 degrees centigrade. The polymer layer 139*b* after being cured or heated has a thickness C6, e.g., between 1 and 50 micrometers, and preferably between 2 and 30 micrometers or between 5 and 25 micrometers.

Next, a photoresist layer is formed on the insulating layer 139*a* exposed by the trenches 139*t* and on the polymer layer 139*b*, and multiple openings in the photoresist layer expose the insulating layer 139*a* at bottoms of the trenches 139*t*. Next, the insulating layer 139*a* under the openings in the photoresist layer is removed using a suitable process, such as anisotropic plasma etching process. Next, the dummy substrate(s) 158 under the openings in the photoresist layer and the chips 118 under the openings in the photoresist layer are etched away until predetermined regions of the layers 17 and 19 in the chips 118 and predetermined regions of the conduction layer 86 of the metal interconnects 2 are exposed by the openings in the photoresist layer. Next, the photoresist layer is removed by using, e.g., an organic chemical. Accordingly, the through vias 156*v*, including the through vias 156*a*, 156*b*, 156c, 156d, 156e and 156f, are formed in the chips 118 and in the dummy substrate(s) 158, exposing the conduction layer 86 of the metal interconnects 2 and exposing the layers 17 and 19 of the chips 118. The specifications of the through vias 156v and the supporter 803 shown in FIG. 248 can be referred to as the specifications of the through vias 156v and the supporter 803, respectively, illustrated in FIGS. 242-246.

Accordingly, using the above-mentioned steps, the above-mentioned dielectric layer 139 also can be provided with the insulating layer 139a and the polymer layer 139b on the insulating layer 139a. The trenches 139t in the polymer layer 139b expose the insulating layer 139a and are used to provide spaces having inter-chip interconnects and intra-chip interconnects formed therein. The through vias 156v are formed under the trenches 139t. Also, FIG. 179 can be an example of a schematic top perspective view showing the trenches 139t and the through vias 156v shown in FIG. 248, and FIG. 248 also can be a cross-sectional view cut along the line K-K shown in FIG. 179.

Figure 249:
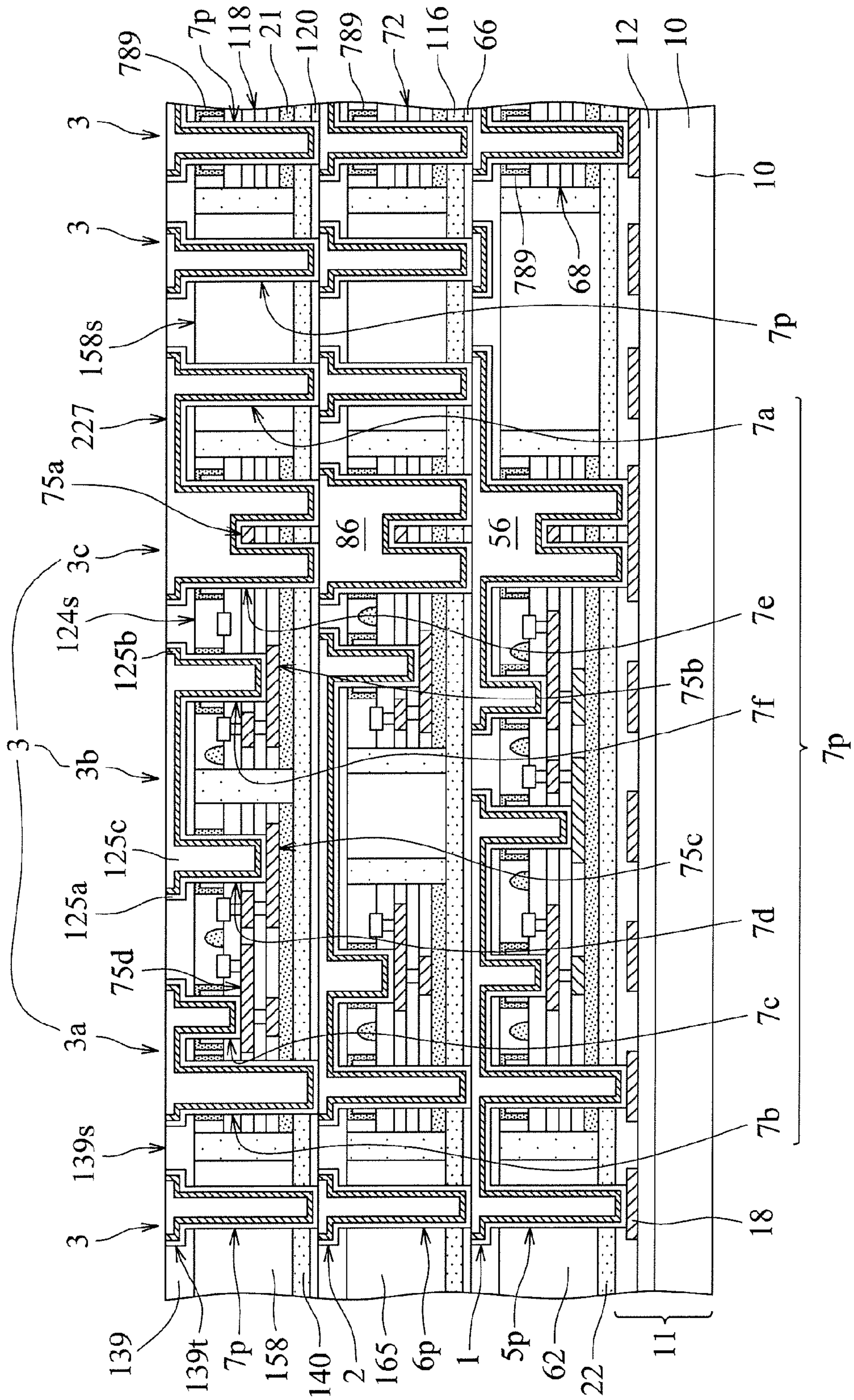

Referring to FIG. 249, after forming the structure illustrated in FIG. 247 or in FIG. 248, multiple metal interconnects (or damascene metal traces) 3, including metal interconnects (or damascene metal traces) 3a, 3b and 3c, are formed in the trenches 139t, and multiple metal plugs (or metal vias) 7p are formed in the through vias 156v. The metal plugs 7p include metal plugs (or metal vias) 7a, 7b, 7c, 7d, 7e and 7f in the through vias 156a, 156b, 156c, 156d, 156e and 156f, respectively. The metal plug 7a is formed in the dummy substrate 158. The metal plugs 7b, 7c and 7d are formed in the left one of the chips 118, and the metal plugs 7e and 7f are formed in the middle one of the chips 118. The supporter 803 and the interconnect or metal trace 75a, in the interconnection layer 17, on the supporter 803 can be between two portions, lower than a horizontal level, at which a top surface of the interconnection layer 17 is positioned, of the metal plug 7e.

The metal interconnects 3 in the trenches 139t and the metal plugs 7p in the through vias 156v can be formed by the following steps. First, the adhesion/barrier layer 125a illustrated in FIG. 75 is formed on the layers 17, 19 and 86 exposed by the through vias 156v, on sidewalls of the through vias 156v, on sidewalls and bottoms of the trenches 139t (or on sidewalls of the trenches 139t in the polymer layer 139b and on a top surface of the insulating layer 139a at the bottoms of the trenches 139t), on the inner walls, exposed by the through vias 156v, of the insulating plugs 789, and on the interconnect or metal trace 75a that is on the supporter 803 by a physical vapor deposition (PVD) process, such as sputtering process or evaporation process, by a chemical-vapor deposition (CVD) process, or by other thin-film deposition processes, such as atomic layer deposition (ALD). Next, the seed layer 125b illustrated in FIG. 75 is formed on the adhesion/barrier layer 125a, in the through vias 156v, and in the trenches 139t by a physical vapor deposition (PVD) process, such as sputtering process or evaporation process, by a chemical-vapor deposition (CVD) process, or by other thin-film deposition processes, such as atomic layer deposition (ALD). Next, the conduction layer 125c illustrated in FIG. 75 is formed on the seed layer 125b, in the through vias 156v, and in the trenches 139t by using a suitable process, such as electroplating process. Next, the layers 125a, 125b and 125c are ground or polished using, e.g., a chemical-mechanical-polishing (CMP) process, a mechanical polishing process, a mechanical grinding process, or a process including mechanical polishing and chemical etching until the dielectric layer 139 has an exposed top surface 139s, over which there are no portions of the layers 125a, 125b and 125c, and the layers 125a, 125b and 125c outside the trenches 139t are removed. Accordingly, the layers 125a, 125b and 125c in the trenches 139t compose the metal interconnects 3, including the metal interconnects 3a, 3b and 3c, in the trenches 139t. The layers 125a, 125b and 125c in the through vias 156v compose the metal plugs 7p in the through vias 156v, including the metal plugs 7a, 7b, 7c, 7d, 7e and 7f in the through vias 156a, 156b, 156c, 156d, 156e and 156f, respectively. The adhesion/barrier layer 125a and the seed layer 125b are at sidewalls and a bottom of the conduction layer 125c in the trenches 139t, and the sidewalls and the bottom of the conduction layer 125c in the trenches 139t are covered by the adhesion/barrier layer 125a and the seed layer 125b.

In a first alternative, after the layers 125a, 125b and 125c are ground or polished, the adhesion/barrier layer 125a can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls and bottoms of the trenches 139t (or on the sidewalls of the trenches 139t in the polymer layer 139b and on the top surface of the insulating layer 139a at the bottoms of the trenches 139t), on the layers 17, 19 and 86 at the bottoms of the through vias 156v, on the sidewalls of the through vias 156v, on the inner walls of the insulating plugs 789 in the chips 118, and on the interconnect or metal trace 75a that is on the supporter 803. The seed layer 125b can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer, in the trenches 139t, and in the through vias 156v. The conduction layer 125c can be an electroplated copper layer on the single layer of copper or a titanium-copper alloy, in the trenches 139t, and in the through vias 156v. The electroplated copper layer in the trenches 139t has a thickness, e.g., between 0.1 and 5 micrometers, and preferably between 0.3 and 1.5 micrometers or between 0.5 and 3 micrometers, in case the dielectric layer 139, the trenches 139t, and the through vias 156v are formed as illustrated in FIGS. 241-247. Alternatively, the electroplated copper layer in the trenches 139t has a thickness, e.g., between 1 and 50 micrometers, and preferably between 2 and 30 micrometers or between 5 and 25 micrometers, in case the dielectric layer 139 composed of the layers 139a and 139b, the trenches 139t, and the through vias 156v are formed as illustrated in FIG. 248.

In a second alternative, after the layers 125a, 125b and 125c are ground or polished, the adhesion/barrier layer 125a can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls and bottoms of the trenches 139t (or on the sidewalls of the trenches 139t in the polymer layer 139b and on the top surface of the insulating layer 139a at the bottoms of the trenches 139t), on the layers 17, 19 and 86 at the bottoms of the through vias 156v, on the sidewalls of the through vias 156v, on the inner walls of the insulating plugs 789 in the chips 118, and on the interconnect or metal trace 75a that is on the supporter 803. The seed layer 125b can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer, in the trenches 139t, and in the through vias 156v. The conduction layer 125c can be an electroplated copper layer on the single layer of copper or a titanium-copper alloy, in the trenches 139t, and in the through vias 156v. The electroplated copper layer in the trenches 139*t* has a thickness, e.g., between 0.1 and 5 micrometers, and preferably between 0.3 and 1.5 micrometers or between 0.5 and 3 micrometers, in case the dielectric layer 139, the trenches 139*t*, and the through vias 156*v* are formed as illustrated in FIGS. 241-247. Alternatively, the electroplated copper layer in the trenches 139*t* has a thickness, e.g., between 1 and 50 micrometers, and preferably between 2 and 30 micrometers or between 5 and 25 micrometers, in case the dielectric layer 139 composed of the layers 139*a* and 139*b*, the trenches 139*t*, and the through vias 156*v* are formed as illustrated in FIG. 248.

In a third alternative, after the layers 125*a*, 125*b* and 125*c* are ground or polished, the adhesion/barrier layer 125*a* can be a chromium-containing layer, such as a single layer of chromium, with a thickness smaller than 1 micrometer, such as between 1 nanometer and 0.5 micrometers, and preferably between 0.1 and 0.2 micrometers, on the sidewalls and bottoms of the trenches 139*t* (or on the sidewalls of the trenches 139*t* in the polymer layer 139*b* and on the top surface of the insulating layer 139*a* at the bottoms of the trenches 139*t*), on the layers 17, 19 and 86 at the bottoms of the through vias 156*v*, on the sidewalls of the through vias 156*v*, on the inner walls of the insulating plugs 789 in the chips 118, and on the interconnect or metal trace 75*a* that is on the supporter 803. The seed layer 125*b* can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer, in the trenches 139*t*, and in the through vias 156*v*. The conduction layer 125*c* can be an electroplated copper layer on the single layer of copper or a titanium-copper alloy, in the trenches 139*t*, and in the through vias 156*v*. The electroplated copper layer in the trenches 139*t* has a thickness, e.g., between 0.1 and 5 micrometers, and preferably between 0.3 and 1.5 micrometers or between 0.5 and 3 micrometers, in case the dielectric layer 139, the trenches 139*t*, and the through vias 156*v* are formed as illustrated in FIGS. 241-247. Alternatively, the electroplated copper layer in the trenches 139*t* has a thickness, e.g., between 1 and 50 micrometers, and preferably between 2 and 30 micrometers or between 5 and 25 micrometers, in case the dielectric layer 139 composed of the layers 139*a* and 139*b*, the trenches 139*t*, and the through vias 156*v* are formed as illustrated in FIG. 248.

The exposed top surface 139*s* of the dielectric layer 139 can be substantially coplanar with the ground or polished surface 227 of the conduction layer 125*c* in the trenches 139*t*, and the surfaces 139*s* and 227 can be substantially flat. After the layers 125*a*, 125*b* and 125*c* are ground or polished, the dielectric layer 139 may have a thickness, between the exposed top surface 139*s* and the surface 124*s* or 158*s*, e.g., between 1 and 10 micrometers, and preferably between 1 and 3 micrometers, in case the dielectric layer 139, the trenches 139*t*, and the through vias 156*v* are formed as illustrated in FIGS. 241-247. Alternatively, after the layers 125*a*, 125*b* and 125*c* are ground or polished, the polymer layer 139*b* of the dielectric layer 139 may have a thickness, between the exposed top surface 139*s* of the polymer layer 139*b* and the top surface of the insulating layer 139*a*, e.g., between 1 and 50 micrometers, and preferably between 2 and 30 micrometers or between 5 and 25 micrometers, in case the dielectric layer 139 composed of the layers 139*a* and 139*b*, the trenches 139*t*, and the through vias 156*v* are formed as illustrated in FIG. 248.

Each of the metal plugs 7*p* in the chips 118 passes through and is enclosed by one of the insulating plugs 789 in the chips 118 and contacts the inner wall of the one of the insulating plugs 789. For example, the metal plug 7*b* in the left one of the chips 118 passes through and is enclosed by one of the insulating plugs 789 in the left one of the chips 118, contacts the inner wall of the one of the insulating plugs 789, and contacts the insulating layer 567 of the one of the insulating plugs 789. The metal plug 7*c* in the left one of the chips 118 passes through and is enclosed by another one of the insulating plugs 789 in the left one of the chips 118, contacts the inner wall of the another one of the insulating plugs 789, and contacts the insulating layer 456, enclosed by the layer 567, of the another one of the insulating plugs 789. The metal plug 7*d* in the left one of the chips 118 passes through and is enclosed by another one of the insulating plugs 789 in the left one of the chips 118, contacts the inner wall of the another one of the insulating plugs 789, and contacts the insulating layer 567 and the insulating layer 456, enclosed by the layer 567, of the another one of the insulating plugs 789. The metal plug 7*e* in the middle one of the chips 118 passes through and is enclosed by one of the insulating plugs 789 in the middle one of the chips 118, contacts the inner wall of the one of the insulating plugs 789, and contacts the insulating layer 456, enclosed by the insulating layer 567, of the one of the insulating plugs 789. The metal plug 7*f* in the middle one of the chips 118 passes through and is enclosed by another one of the insulating plugs 789 in the middle one of the chips 118, contacts the inner wall of the another one of the insulating plugs 789, and contacts the insulating layer 567 and the insulating layer 456, enclosed by the layer 567, of the another one of the insulating plugs 789. For more detailed description about the metal plugs 7*p* (including the metal plugs 7*a*-7*f*) and the metal interconnects 3 (including the metal interconnects 3*a*, 3*b* and 3*c*) shown in FIG. 249, please refer to the illustration in FIG. 76.

Alternatively, the element 118 not only can indicate a chip, but also can indicate a wafer. When the element 118 is a wafer, the element 72 can be another wafer. Thereby, the process illustrated in the invention can be employed to the wafer-to-wafer bonding.

Figure 250:
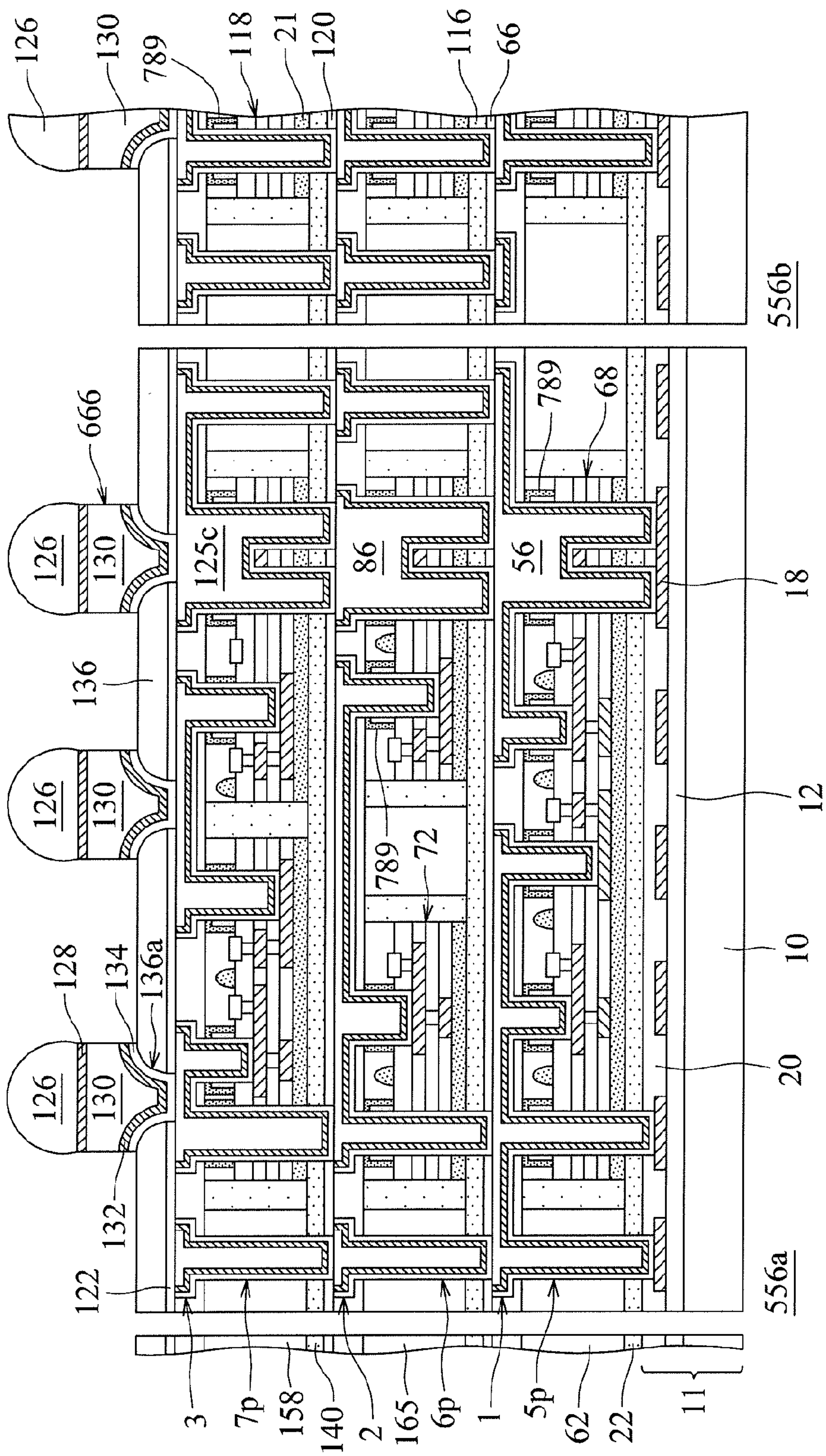

Referring to FIG. 250, after forming the structure illustrated in FIG. 249, the following steps can be subsequently performed as illustrated in FIGS. 77-81, and then a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in packages or multichip modules 556*a* and 556*b*.

Figure 251:
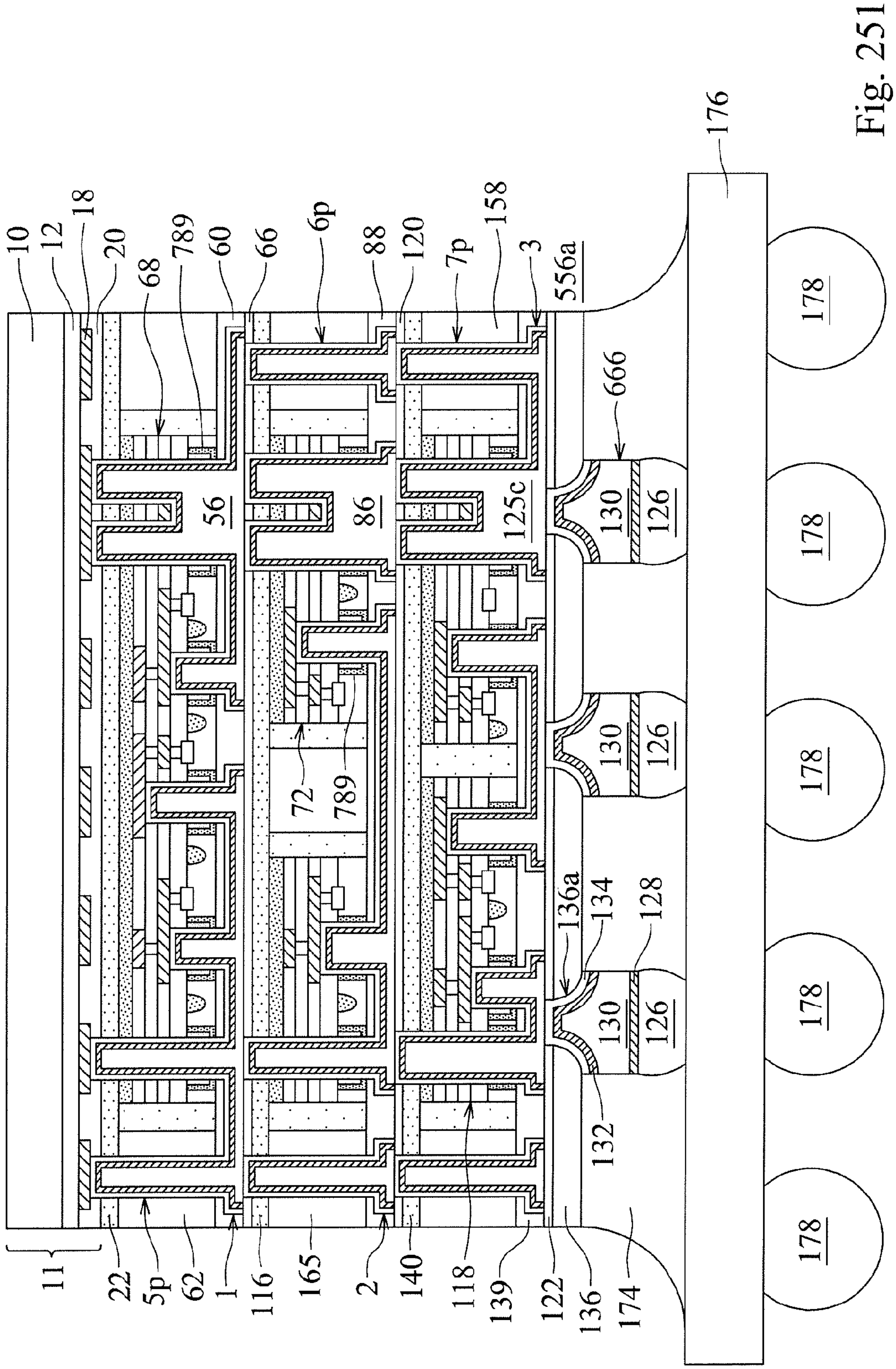
FIG. 251 shows a cross-sectional view of a multichip package according to an embodiment of the present disclosure.

The system-in package or multichip module 556*a* can be connected to and bonded with a carrier, such as mother board, printed circuit board (PCB), ball-grid-array (BGA) substrate, metal substrate, glass substrate, or ceramic substrate, using the solder bumps or balls 126. For example, referring to FIG. 251, the system-in package or multichip module 556*a* can be bonded with a top side of a carrier 176 using, e.g., a flip chip technology of joining the solder bumps or balls 126 with a solder or gold layer preformed on the top side of the carrier 176. Next, an under fill 174 can be formed between the polymer layer 136 of the system-in package or multichip module 556*a* and the top side of the carrier 176 and encloses the solder bumps or balls 126. Next, multiple solder balls 178 can be formed on a bottom side of the carrier 176. The specifications of the carrier 176, the under fill 174, and the solder balls 178 shown in FIG. 251 can be referred to as the specifications of the carrier 176, the under fill 174, and the solder balls 178 as illustrated in FIG. 83, respectively.

Figure 252:
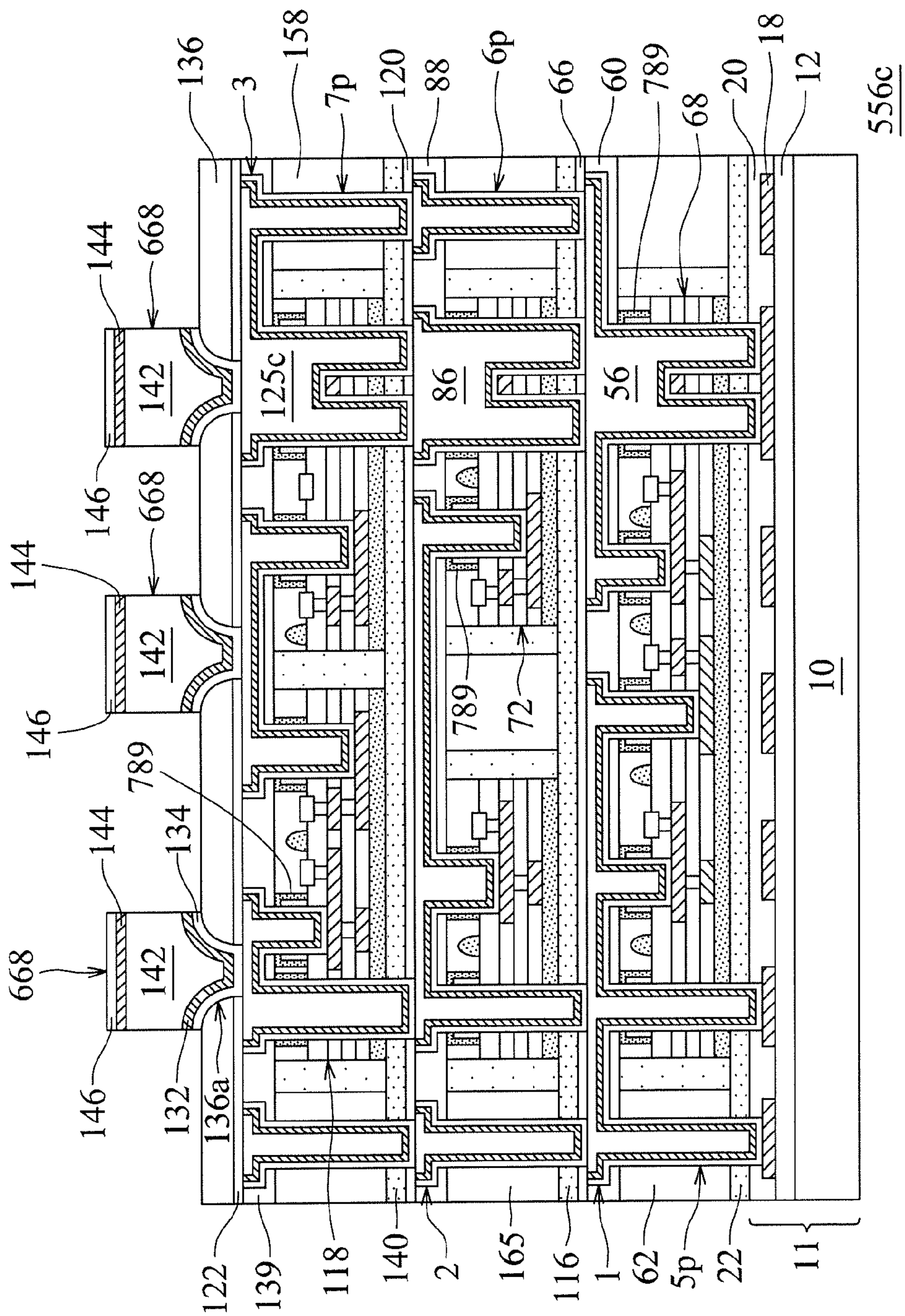
FIG. 252 shows a cross-sectional view of a system-in package or multichip module according to an embodiment of the present disclosure.

FIG. 252 shows another system-in package or multichip module according to another embodiment of the present disclosure, which can be formed by the following steps. After forming the structure illustrated in FIG. 249, the steps as illustrated in FIGS. 77-79 can be subsequently performed. Next, forming metal bumps 668 on the polymer layer 136 and on the contact points, at the bottoms of the openings in the insulating or dielectric layer 122 and under the openings 136*a* in the polymer layer 136, of the conduction layer 125*c* of the metal interconnects 3 can be referred to as the steps illustrated in FIG. 84. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in package or multichip module 556*c*. In the system-in package or multichip module 556*c*, each of the interconnects 3 can be connected to one or more of the metal bumps 668.

Figure 253:
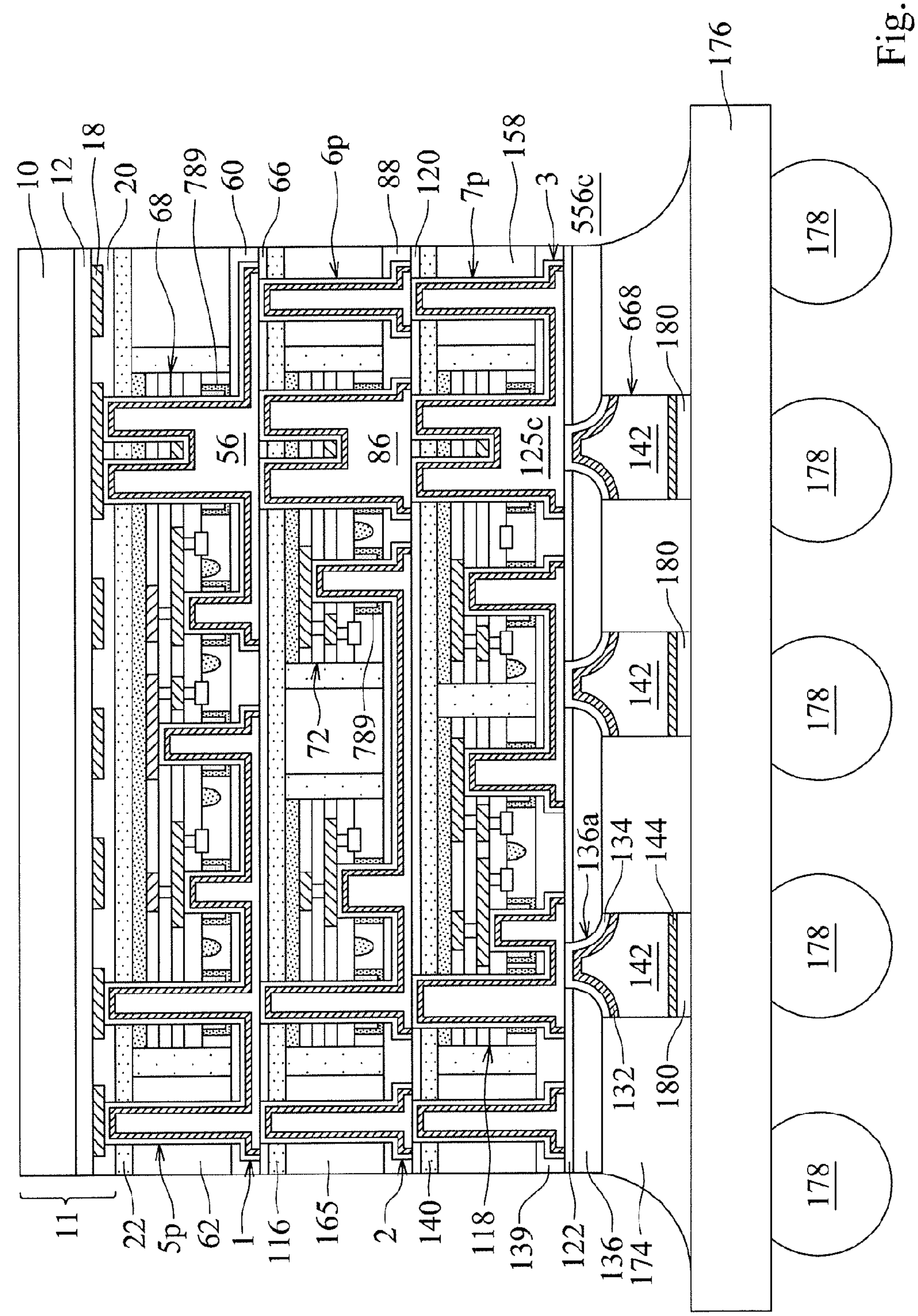
FIG. 253 shows a cross-sectional view of a multichip package according to an embodiment of the present disclosure.

The system-in package or multichip module 556*c* can be connected to and bonded with a carrier, such as mother board, printed circuit board (PCB), ball-grid-array (BGA) substrate, metal substrate, glass substrate, or ceramic substrate, using the metal bumps 668. For example, referring to FIG. 253, the system-in package or multichip module 556*c* can be bonded with the top side of the carrier 176 illustrated in FIG. 83 using, e.g., a flip chip technology of joining the solder wetting layer 146 of the metal bumps 668 with a solder or gold layer preformed on the top side of the carrier 176. After joining the solder wetting layer 146 with the solder or gold layer preformed on the top side of the carrier 176, multiple metal joints 180 are formed between the barrier layer 144 of the metal bumps 668 and the top side of the carrier 176. The metal joints 180 can be a layer of a Sn—Ag alloy, a Sn—Ag—Cu alloy, a Sn—Au alloy, or a Sn—Pb alloy having a thickness between 5 and 50 micrometers. Alternatively, the metal joints 180 can be a gold layer having a thickness between 0.1 and 10 micrometers. Next, the under fill 174 illustrated in FIG. 83 can be formed between the polymer layer 136 of the system-in package or multichip module 556*c* and the top side of the carrier 176 and encloses the metal bumps 668 and the metal joints 180. Next, the solder balls 178 illustrated in FIG. 83 can be formed on the bottom side of the carrier 176.

Alternatively, the insulating or dielectric layer 122 as shown FIGS. 250-253 can be omitted. In this case, the polymer layer 136 is formed on the surfaces 227 and 139*s*, and the contact points of the conduction layer 125*c* of the metal interconnects 3 are exposed by and at ends of the openings 136*a* in the polymer layer 136. Further, the adhesion/barrier layer 134 is formed on the contact points, exposed by and at the ends of the openings 136*a* in the polymer layer 136, of the conduction layer 125*c* of the metal interconnects 3.

Figure 254:
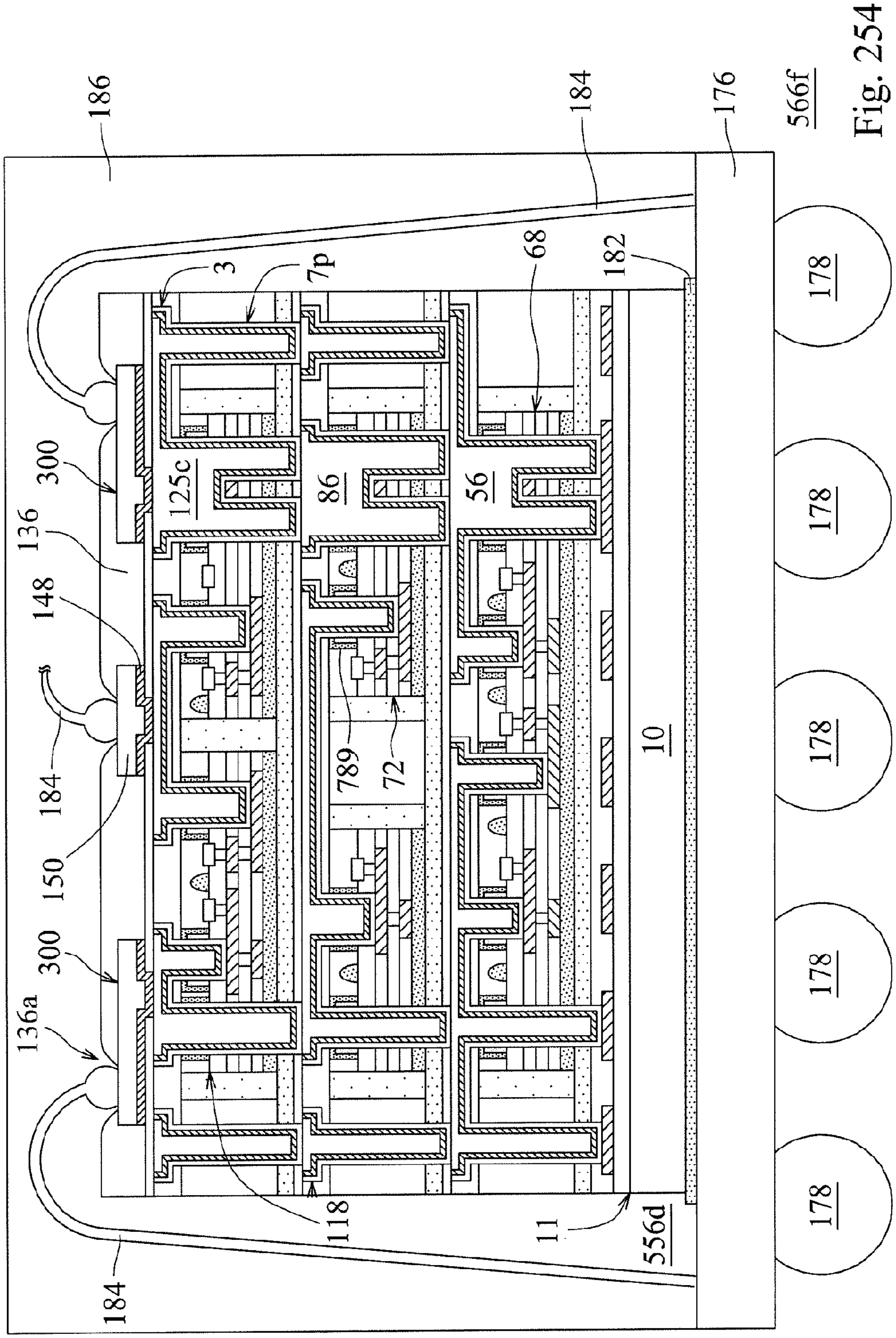
FIG. 254 shows a cross-sectional view of a multichip package according to an embodiment of the present disclosure.

FIG. 254 shows a multichip package 566*f* including a system-in package or multichip module 556*d* connected to the carrier 176 illustrated in FIG. 83 through wirebonded wires 184, which can be formed by, e.g., the following steps.

After forming the structure illustrated in FIG. 249, the steps illustrated in FIG. 86 are performed to form an insulating or dielectric layer 122 on the ground or polished surface 227 of the conduction layer 125*c* and on the exposed top surface 139*s* of the dielectric layer 139, to form multiple metal interconnects or traces 300 on the insulating or dielectric layer 122 and on multiple regions, exposed by multiple openings 122*a* in the layer 122, of the conduction layer 125*c* of the metal interconnects 3, and to form a polymer layer 136 on the insulating or dielectric layer 122 and on the metal interconnects or traces 300. The polymer layer 136 after being cured may have a thickness, e.g., between 1 and 20 micrometers, and preferably between 2 and 15 micrometers or between 5 and 10 micrometers, and multiple openings 136*a* in the polymer layer 136 expose multiple contact points of the metal interconnects or traces 300. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize a plurality of the system-in package or multichip module 556*d*.

Next, the plurality of the system-in package or multichip module 556*d* can be joined with a carrier 176 by, e.g., forming a glue layer 182 with a thickness between 20 and 150 micrometers on a top side of the carrier 176, and then attaching the plurality of the system-in package or multichip module 556*d* to the top side of the carrier 11 using the glue layer 182. The glue layer 182 can be a polymer layer, such as a layer of polyimide, benzocyclobutene (BCB), epoxy, polybenzoxazole (PBO), poly-phenylene oxide (PPO), silosane, or SU-8, with a thickness, e.g., between 20 and 150 micrometers. Next, multiple wires 184, such as gold wires, copper wires, or aluminum wires, can be wirebonded onto the top side of the carrier 176 and onto the contact points, exposed by the openings 136*a* in the polymer layer 136, of the conduction layer 150 of the metal interconnects or traces 300 by a wirebonding process. Accordingly, the metal interconnects or traces 300 of the plurality of the system-in package or multichip module 556*d* can be physically and electrically connected to the carrier 176 through the wirebonded wires 184. Next, a molding compound 186 can be formed on the plurality of the system-in package or multichip module 556*d*, on the top side of the carrier 176, and on the wirebonded wires 184, encapsulating the wirebonded wires 184 and the plurality of the system-in package or multichip module 556*d*, by a molding process. The molding compound 186 may include epoxy, carbon filler or glass filler, and the glass filler or carbon filler can be distributed in the epoxy. Next, the solder balls 178 illustrated in FIG. 83 can be formed on a bottom side of the carrier 176. Thereafter, a singulation process can be performed to cut the carrier 176 and the molding compound 186 and to singularize a plurality of the multichip package 566*f*. The multichip package 566*f* can be connected to a carrier, such as mother board, ball-grid-array (BGA) substrate, printed circuit board, metal substrate, glass substrate, or ceramic substrate, through the solder balls 178. The specifications of the carrier 176 shown in FIG. 254 can be referred to as the specifications of the carrier 176 as illustrated in FIG. 83.

Figure 255:
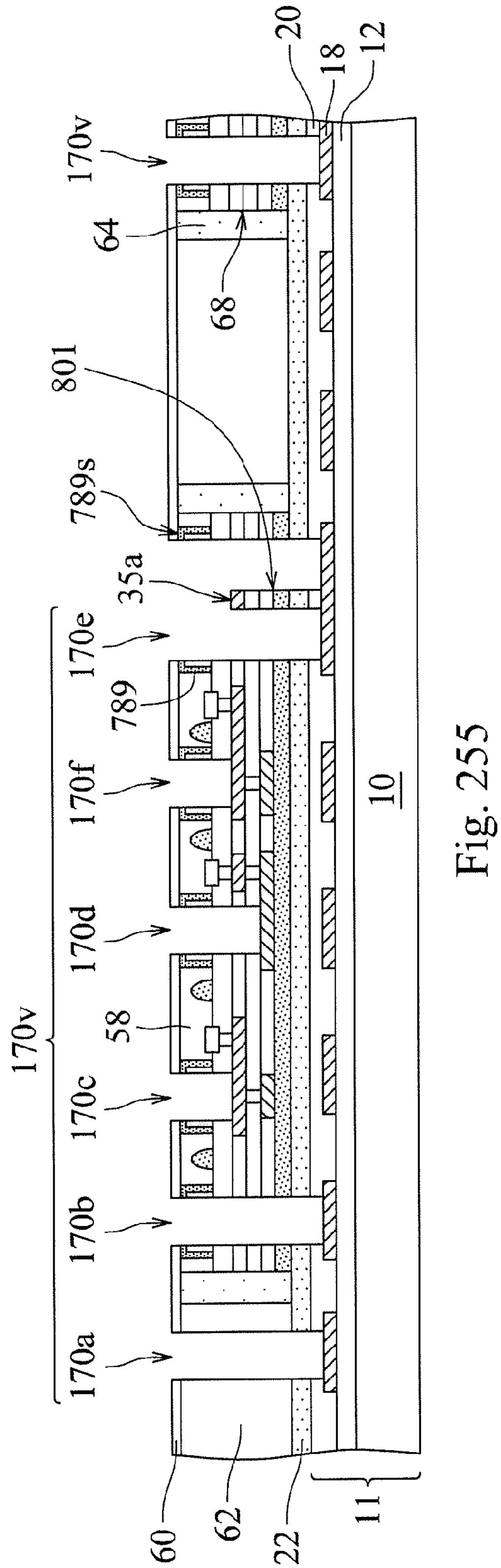
FIGS. 255-270 show a process for forming a system-in package or multichip module according to an embodiment of the present disclosure.

FIGS. 255-270 show a process for forming another system-in package or multichip module according to another embodiment of the present disclosure. Referring to FIG. 255, after forming the structure illustrated in FIG. 215, the dielectric layer 60 illustrated in FIG. 186 is formed on the surface 58*s* of the semiconductor substrate 58 of each chip 68, on the surface (s) 62*s* of the dummy substrate(s) 62, on the exposed bottom surfaces 789*s* of the insulating plugs 789 in the chips 68, and on the surface 64*s* of the encapsulation/gap filling material 64. Next, multiple through vias 170*v*, including through vias 170*a*, 170*b*, 170*c*, 170*d*, 170*e* and 170*f*, are formed in the chips 68 and in the dummy substrate(s) 62, exposing the conductive layer 18 of the carrier 11 and exposing the layers 26 and 34 of the chips 68. The steps of forming the through vias 170*v* in the chips 68 and in the dummy substrate(s) 62 illustrated in FIG. 255 can be referred to as the steps of forming the through vias 170*v* in the chips 68 and in the dummy substrate(s) 62 as illustrated in FIG. 15, but, in the embodiment, forming the through vias 170*v* (such as the vias 170*b*-170*f*) in the chips 68 includes etching through the insulating plugs 789 in the chips 68. The specifications of the through vias 170*v* (including the vias 170*a*-170*f*), the insulating plugs 789 enclosing the through vias 170*v*, and the supporter 801 shown in FIG. 255 can be referred to as the specifications of the through vias 170*v* (including the vias 170*a*-170*f*), the insulating plugs 789 enclosing the through vias 170*v*, and the supporter 801, respectively, illustrated in FIGS. 219-223.

Figure 256:
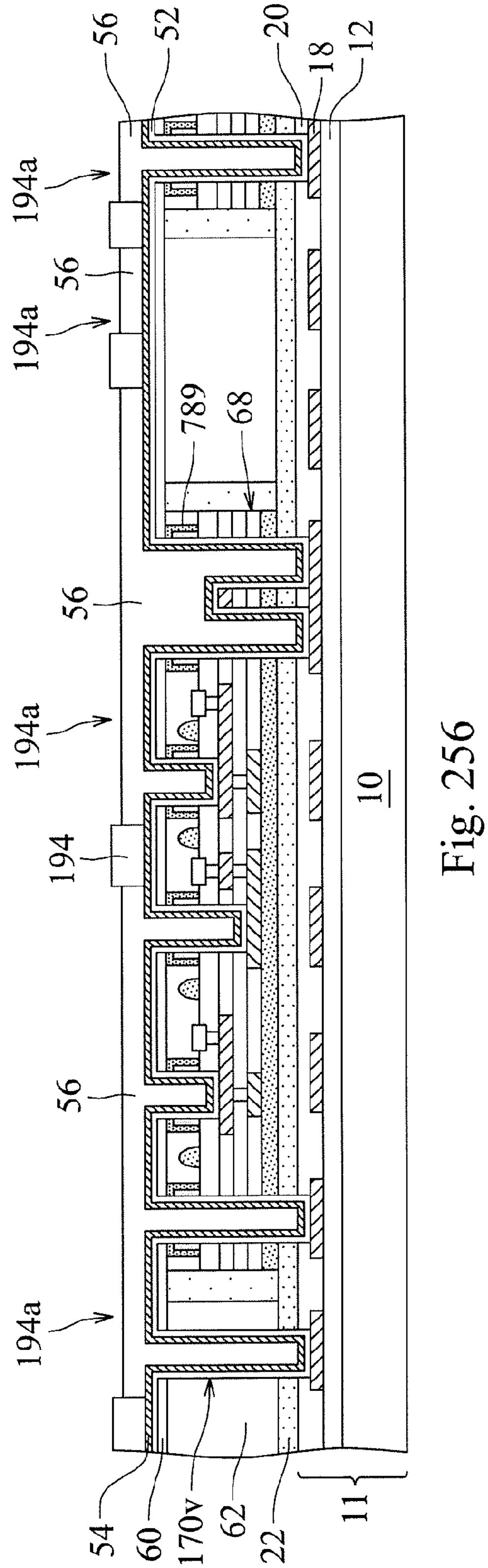

Next, referring to FIG. 256, the adhesion/barrier layer 52 illustrated in FIG. 90 is formed on the layers 18, 26 and 34 exposed by the through vias 170*v*, on sidewalls of the through vias 170*v*, on the dielectric layer 60, on the inner walls, exposed by the through vias 170*v*, of the insulating plugs 789, and on the interconnect or metal trace 35*a* that is on the supporter 801. Next, the seed layer 54 illustrated in FIG. 90 is formed on the adhesion/barrier layer 52 and in the through vias 170*v*. Next, a photoresist layer 194 is formed on the seed layer 54 by using a suitable process, such as spin coating process, screen printing process, or lamination process. Next, a photo exposure process and a development process can be employed to form multiple openings 194*a*, exposing multiple regions of the seed layer 54, in the photoresist layer 194. The patterned photoresist layer 194 may have a thickness, e.g., between 1 and 30 micrometers, and preferably between 1 and 20 micrometers or between 1 and 10 micrometers. Next, the conduction layer 56 illustrated in FIG. 90 is formed on the regions, exposed by the openings 194*a* in the layer 194, of the seed layer 54.

Figure 257:
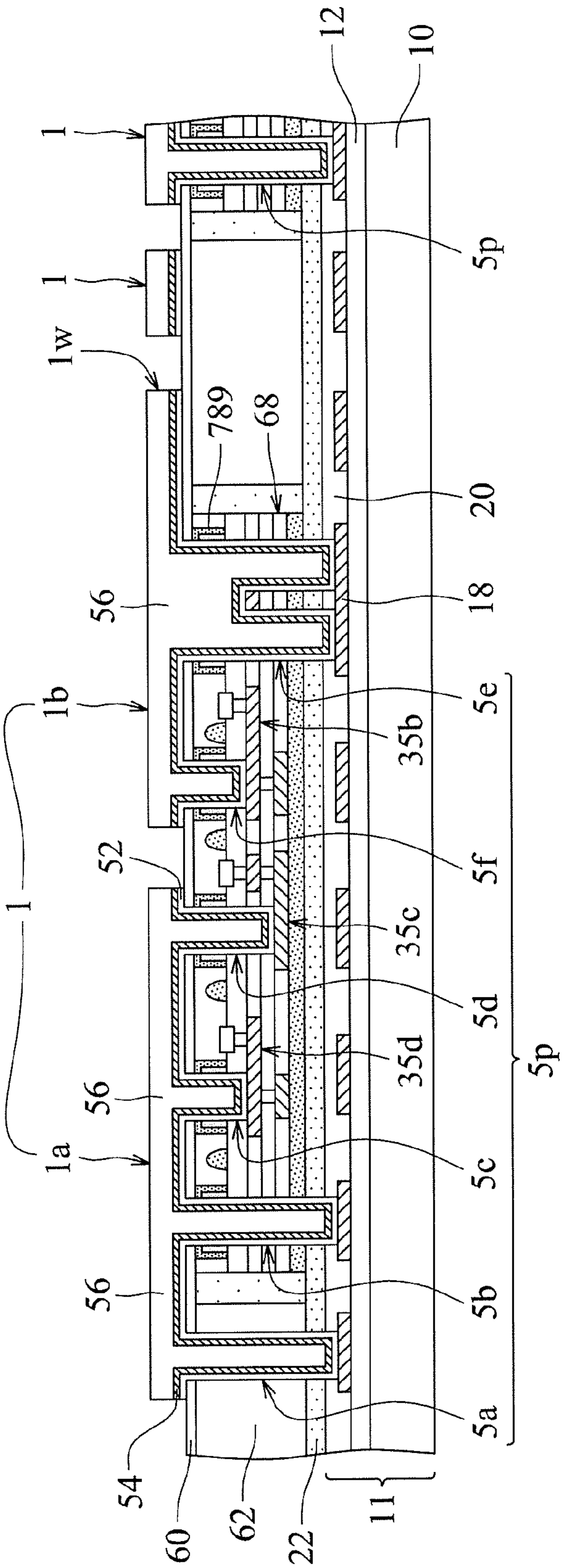

Next, referring to FIG. 257, the photoresist layer 194 is removed using, e.g., an organic chemical solution. Next, the seed layer 54 not under the conduction layer 56 is removed by using a wet etching process or a dry etching process. Next, the adhesion/barrier layer 52 not under the conduction layer 56 is removed by using a wet etching process or a dry etching process. Accordingly, the layers 52, 54 and 56 over the dielectric layer 60 and over the through vias 170*v* compose multiple metal interconnects 1, including metal interconnects 1*a* and 1*b*, over the dielectric layer 60 and over the through vias 170*v*. The adhesion/barrier layer 52 and the seed layer 54 of the metal interconnects 1 over the dielectric layer 60 are not at any sidewall 1*w* of the conduction layer 56 of the metal interconnects 1 over the dielectric layer 60, but under a bottom of the conduction layer 56 of the metal interconnects 1 over the dielectric layer 60. The sidewalls 1*w* of the conduction layer 56 of the metal interconnects 1 over the dielectric layer 60 are not covered by the layers 52 and 54. The layers 52, 54 and 56 in the through vias 170*v* compose multiple metal plugs (or metal vias) 5*p* in the through vias 170*v*, including metal plugs (or metal vias) 5*a*, 5*b*, 5*c*, 5*d*, 5*e* and 5*f* in the through vias 170*a*, 170*b*, 170*c*, 170*d*, 170*e* and 170*f* as shown in FIG. 255, respectively. The metal plug 5*a* is formed in the dummy substrate 62, and the metal plugs 5*b*, 5*c*, 5*d*, 5*e* and 5*f* are formed in the same chip 68. These metal plugs 5*p* formed in the chips 68 and in the dummy substrate(s) 62 can connect the metal interconnects 1 and the semiconductor devices 36 in the chips 68 and connect the metal interconnects 1 and multiple contact points of the conductive layer 18 in the carrier 11. The supporter 801 and the interconnect or metal trace 35*a*, in the interconnection layer 34, on the supporter 801 can be between two portions, lower than a horizontal level, at which a top surface of the interconnection layer 34 is positioned, of the metal plug 5*e*.

Each of the metal plugs 5*p* in the chips 68 passes through one of the insulating plugs 789 in the chips 68, contacts the inner wall of the one of the insulating plugs 789, and is enclosed by the insulating layer 456, enclosed by the insulating layer 567, of the one of the insulating plugs 789. For example, each of the metal plugs 5*b*, 5*c*, 5*d*, 5*e* and 5*f* in one of the chips 68 passes through one of the insulating plugs 789 in the one of the chips 68, contacts the inner wall of the one of the insulating plugs 789, and is enclosed by the insulating layer 456, enclosed by the insulating layer 567, of the one of the insulating plugs 789. For more detailed description about the metal plugs 5*p* (including the metal plugs 5*a*-5*f*) and the metal interconnects 1 (including the metal interconnects 1*a* and 1*b*) shown in FIG. 257, please refer to the illustration in FIG. 91.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

Figure 258:
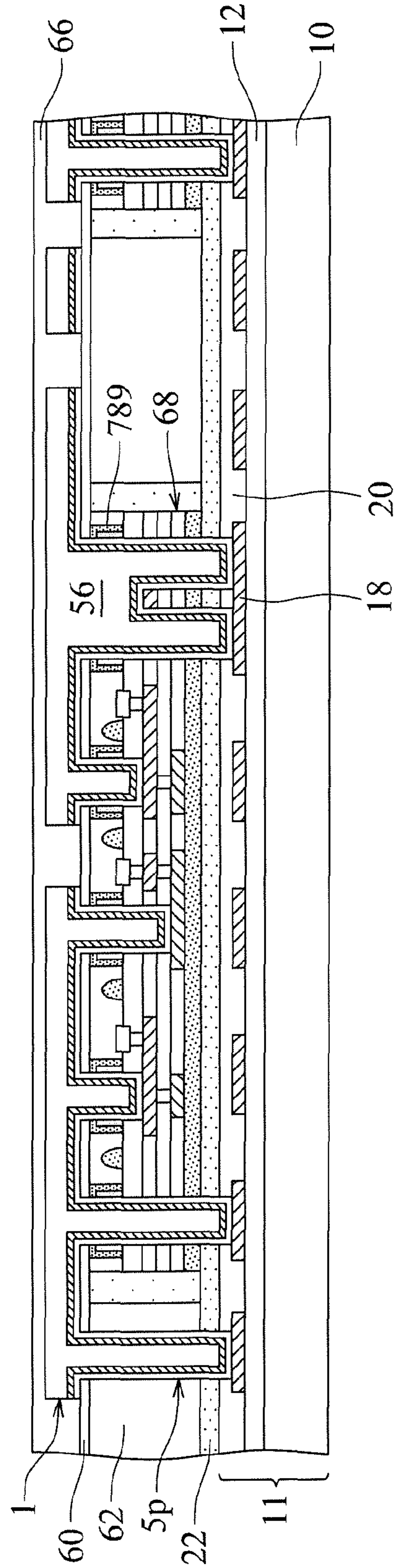

Referring to FIG. 258, after forming the structure illustrated in FIG. 257, an insulating or dielectric layer 66 is formed on the conduction layer 56 of the metal interconnects 1, on the dielectric layer 60, and in gaps between the metal interconnects 1. The insulating or dielectric layer 66, for example, may include or can be a polymer layer, such as a layer of polyimide, benzocyclobutene (BCB), epoxy, polyphenylene oxide (PPO), or polybenzoxazole (PBO), on the conduction layer 56 of the metal interconnects 1, on the dielectric layer 60, and in the gaps between the metal interconnects 1. The polymer layer on the conduction layer 56 may have a thickness, e.g., between 0.1 and 50 micrometers, and preferably between 1 and 30 micrometers, between 2 and 20 micrometers, or between 5 and 10 micrometers.

Alternatively, the insulating or dielectric layer 66 may include or can be an inorganic layer, such as a layer of silicon oxide, silicon nitride, silicon oxynitride, silicon carbon nitride, or silicon oxycarbide, on the conduction layer 56 of the metal interconnects 1, on the dielectric layer 60, and in the gaps between the metal interconnects 1. The inorganic layer on the conduction layer 56 may have a thickness, e.g., between 0.1 and 10 micrometers, and preferably between 0.1 and 1 micrometers, between 0.2 and 2 micrometers, between 0.3 and 3 micrometers, or between 0.5 and 5 micrometers.

Figure 259:
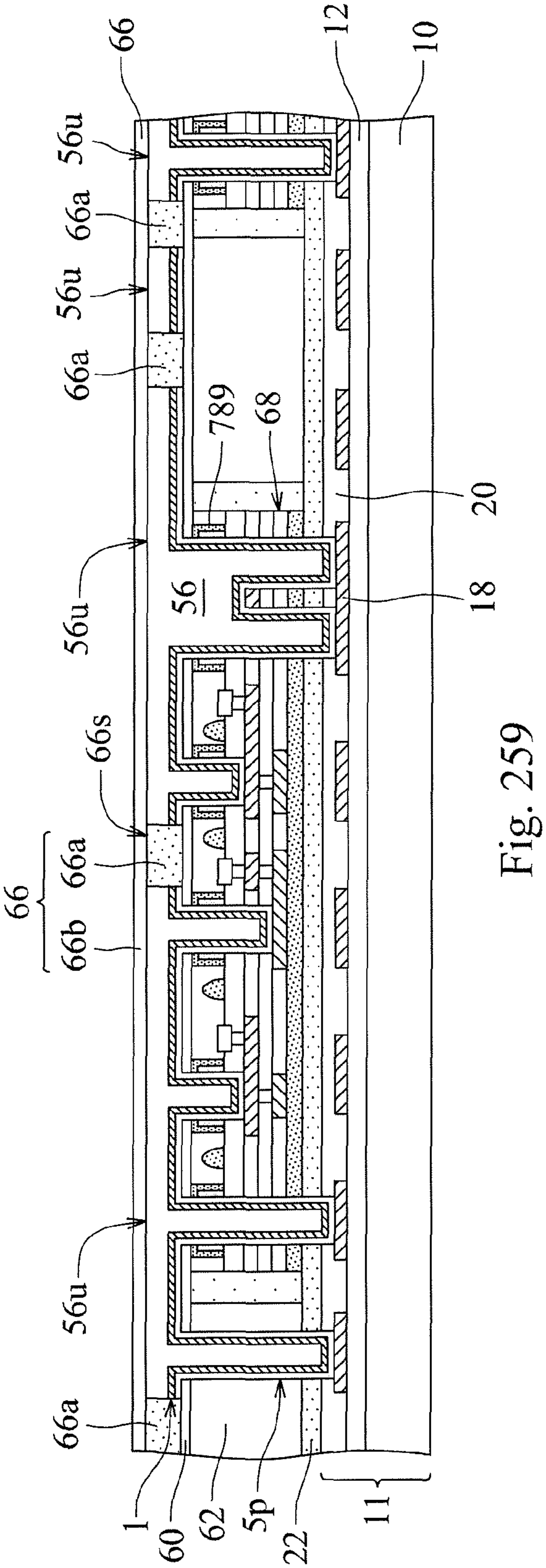

Alternatively, referring to FIG. 259, the insulating or dielectric layer 66 as shown in FIG. 258 can be formed by the following steps. First, a polymer layer 66*a*, such as a layer of polyimide, benzocyclobutene (BCB), epoxy, poly-phenylene oxide (PPO), or polybenzoxazole (PBO), is formed on the conduction layer 56 of the metal interconnects 1, on the dielectric layer 60, and in the gaps between the metal interconnects 1. Next, the polymer layer 66*a* is ground or polished by a suitable process, such as mechanical grinding process, mechanical polishing process, chemical-mechanical-polishing (CMP) process, or a process including mechanical polishing and chemical etching, until the conduction layer 56 of the metal interconnects 1 has a top surface 56*u* not covered by the polymer layer 66*a*. Accordingly, the polymer layer 66*a* remains on the dielectric layer 60 and in the gaps between the metal interconnects 1 and has a thickness, e.g., greater than 1 micrometer, such as between 1 and 20 micrometers, and preferably between 1 and 10 micrometers, between 1 and 5 micrometers, or between 2 and 20 micrometers. The ground or polished surface 66*s* of the polymer layer 66*a* can be substantially flat and substantially coplanar with the top surface 56*u* of the conduction layer 56. Next, an inorganic layer 66*b*, such as a layer of silicon oxide, silicon nitride, silicon oxynitride, silicon carbon nitride, or silicon oxycarbide, having a thickness, e.g., between 0.1 and 3 micrometers, and preferably between 0.2 and 1.5 micrometers, is formed on the top surface 56*u* of the conduction layer 56 and on the ground or polished surface 66*s* of the polymer layer 66*a*. Accordingly, the insulating or dielectric layer 66 as shown in FIG.

258 also can be provided with the polymer layer 66*a* and the inorganic layer 66*b* as shown in FIG. 259.

Figure 260:
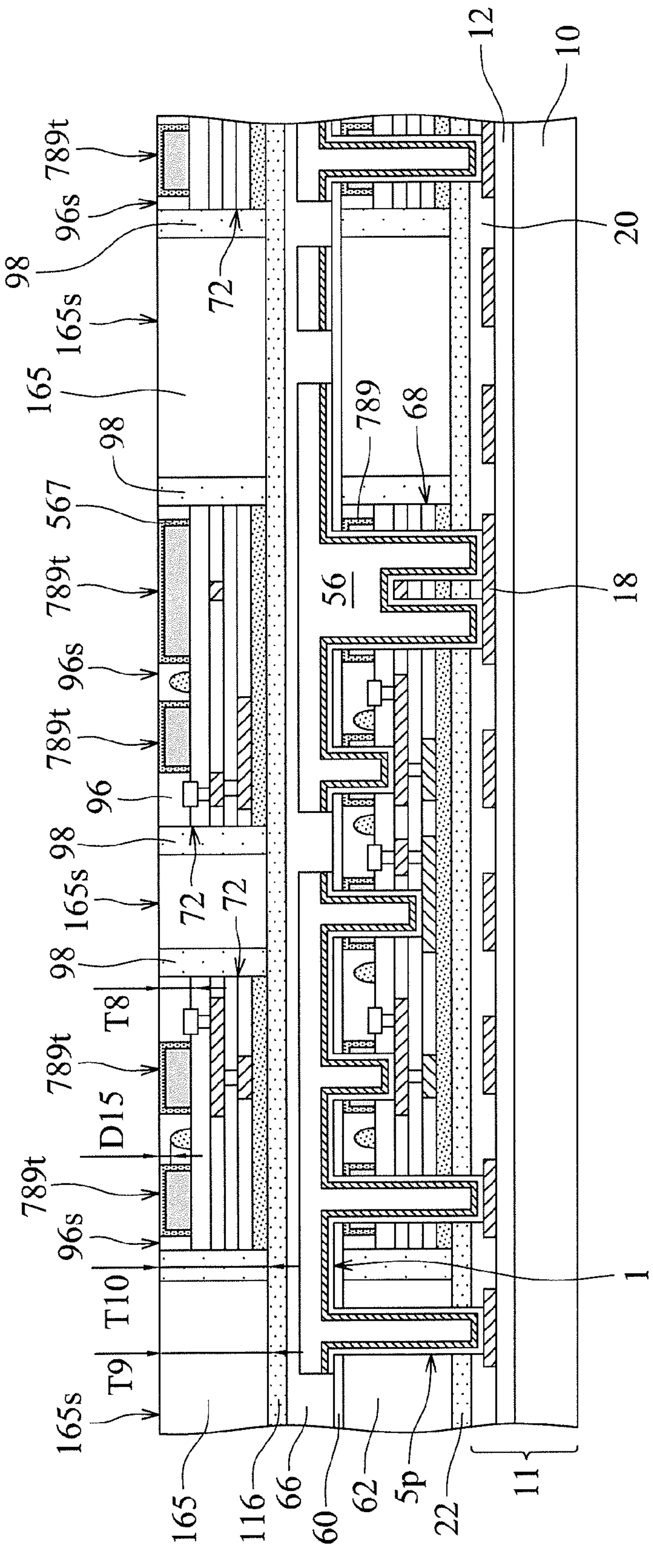

Referring to FIG. 260, after forming the insulating or dielectric layer 66, the following steps can be subsequently performed as illustrated in FIGS. 228 and 229 to place the chips 72, each of which is like the chip 72*a* or 72*b* illustrated in FIG. 212M, and the previously described dummy substrate (s) 165 over the layer 116 formed on the layer 66, to form the encapsulation/gap filling material 98 on the backside of the semiconductor substrate 96 of each chip 72, on the dummy substrate(s) 165, and in the gaps 4*a* and 8*a*, and to grind or polish the encapsulation/gap filling material 98, the backside of the semiconductor substrate 96 of each chip 72, and the dummy substrate(s) 165 until all of the insulating plugs 789 in the chips 72 have the exposed bottom surfaces 789*t*, over which there are no portions of the semiconductor substrates 96.

Figure 261:
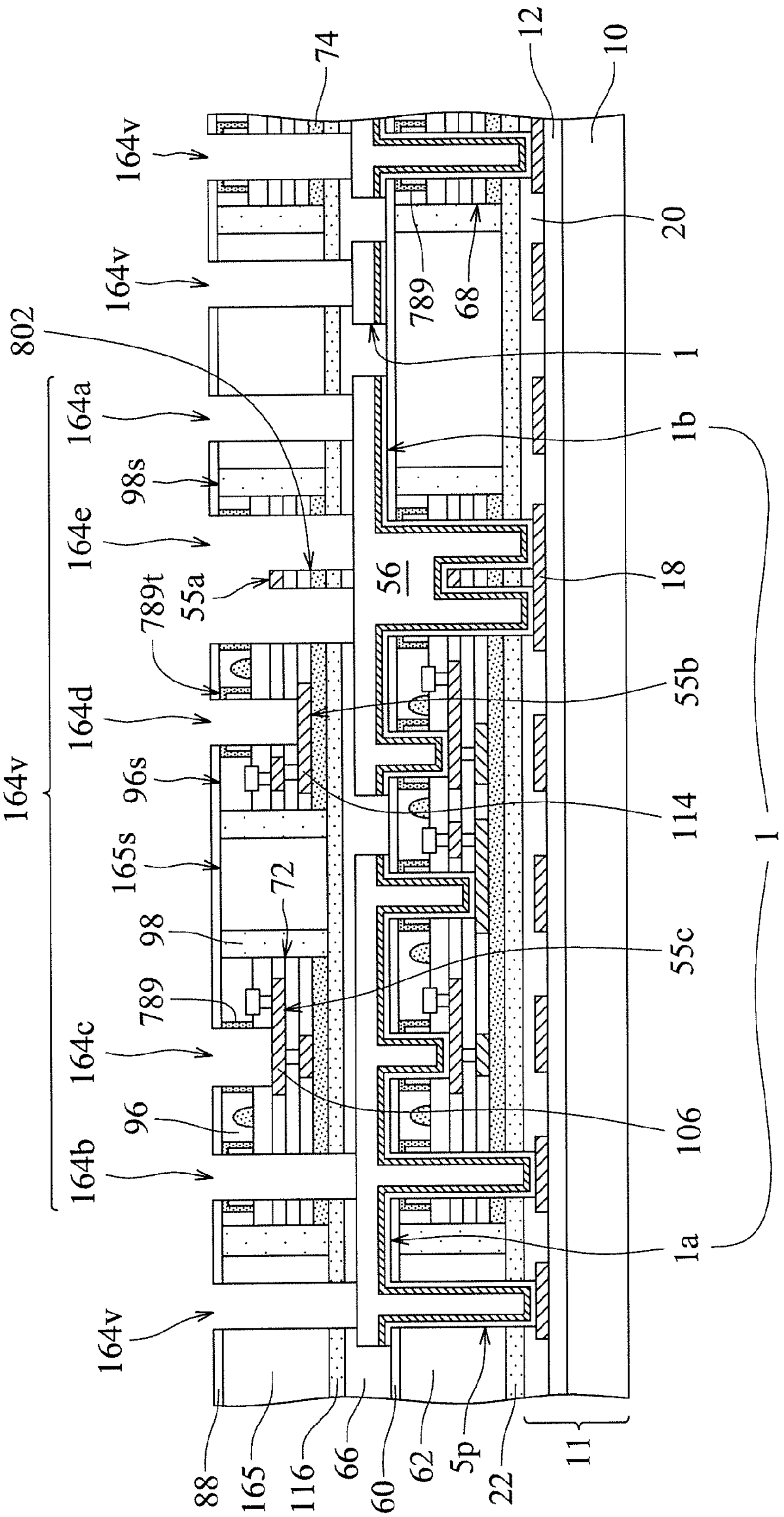

Next, referring to FIG. 261, the dielectric layer 88 illustrated in FIG. 195 is formed on the surface 96*s* of the semiconductor substrate 96 of each chip 72, on the surface(s) 165*s* of the dummy substrate(s) 165, on the exposed bottom surfaces 789*t* of the insulating plugs 789 in the chips 72, and on the surface 98*s* of the encapsulation/gap filling material 98. Next, multiple through vias 164*v*, including through vias 164*a*, 164*b*, 164*c*, 164*d* and 164*e*, are formed in the chips 72 and in the dummy substrate(s) 165, exposing the conduction layer 56 of the metal interconnects 1 and exposing the layers 114 and 106 of the chips 72. The steps of forming the through vias 164*v* in the chips 72 and in the dummy substrate(s) 165 illustrated in FIG. 261 can be referred to as the steps of forming the through vias 164*v* in the chips 72 and in the dummy substrate(s) 165 as illustrated in FIG. 41, but, in the embodiment, forming the through vias 164*v* (such as the vias 164*b*-164*e*) in the chips 72 includes etching through the insulating plugs 789 in the chips 72. The specifications of the through vias 164*v* (including the vias 164*a*-164*e*), the insulating plugs 789 enclosing the through vias 164*v*, and the supporter 802 shown in FIG. 261 can be referred to as the specifications of the through vias 164*v* (including the vias 164*a*-164*e*), the insulating plugs 789 enclosing the through vias 164*v*, and the supporter 802, respectively, illustrated in FIGS. 231-235.

Figure 262:
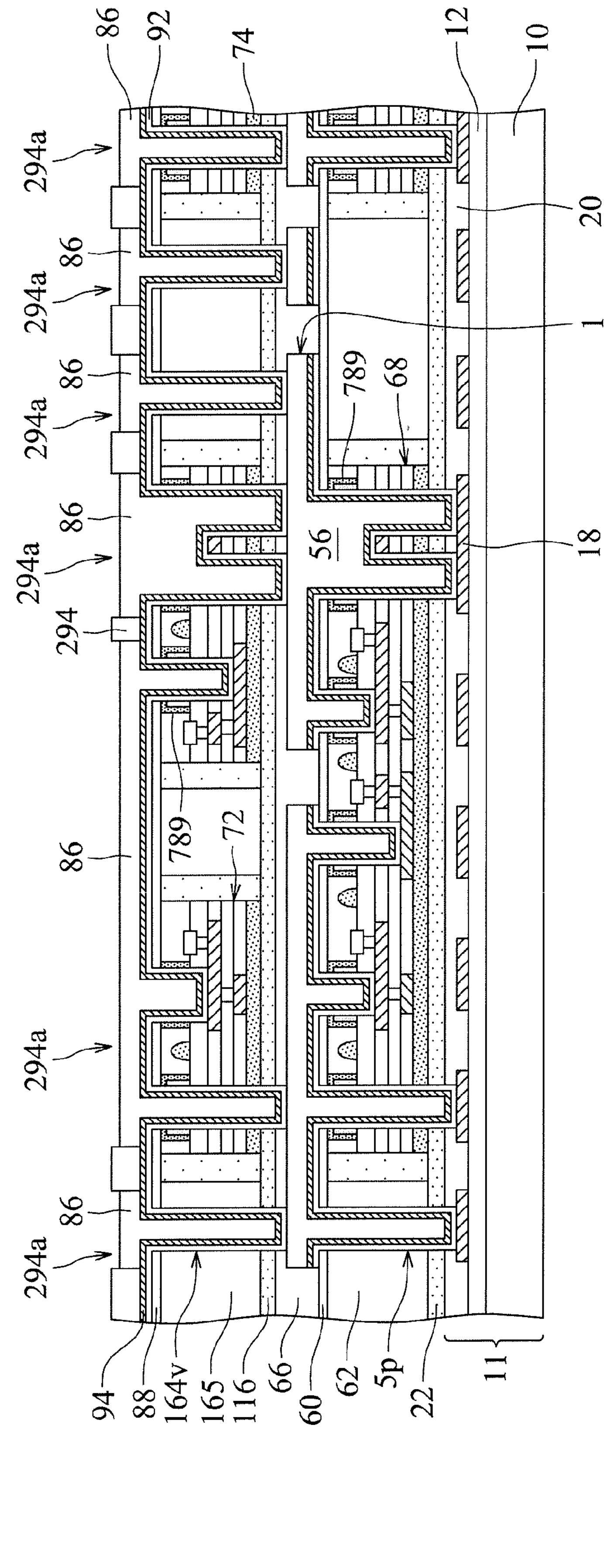

Next, referring to FIG. 262, the adhesion/barrier layer 92 illustrated in FIG. 95 is formed on the layers 56, 106 and 114 exposed by the through vias 164*v*, on sidewalls of the through vias 164*v*, on the dielectric layer 88, on the inner walls, exposed by the through vias 164*v*, of the insulating plugs 789 in the chips 72, and on the interconnect or metal trace 55*a* that is on the supporter 802. Next, the seed layer 94 illustrated in FIG. 95 is formed on the adhesion/barrier layer 92 and in the through vias 164*v*. Next, a photoresist layer 294 is formed on the seed layer 94 by using, e.g., a spin coating process, a screen printing process, or a lamination process. Next, a photo exposure process and a development process can be employed to form multiple openings 294*a*, exposing multiple regions of the seed layer 94, in the photoresist layer 294. The patterned photoresist layer 294 may have a thickness, e.g., between 1 and 30 micrometers, and preferably between 1 and 20 micrometers or between 1 and 10 micrometers. Next, the conduction layer 86 illustrated in FIG. 95 is formed on the regions, exposed by the openings 294*a* in the layer 294, of the seed layer 94.

Figure 263:
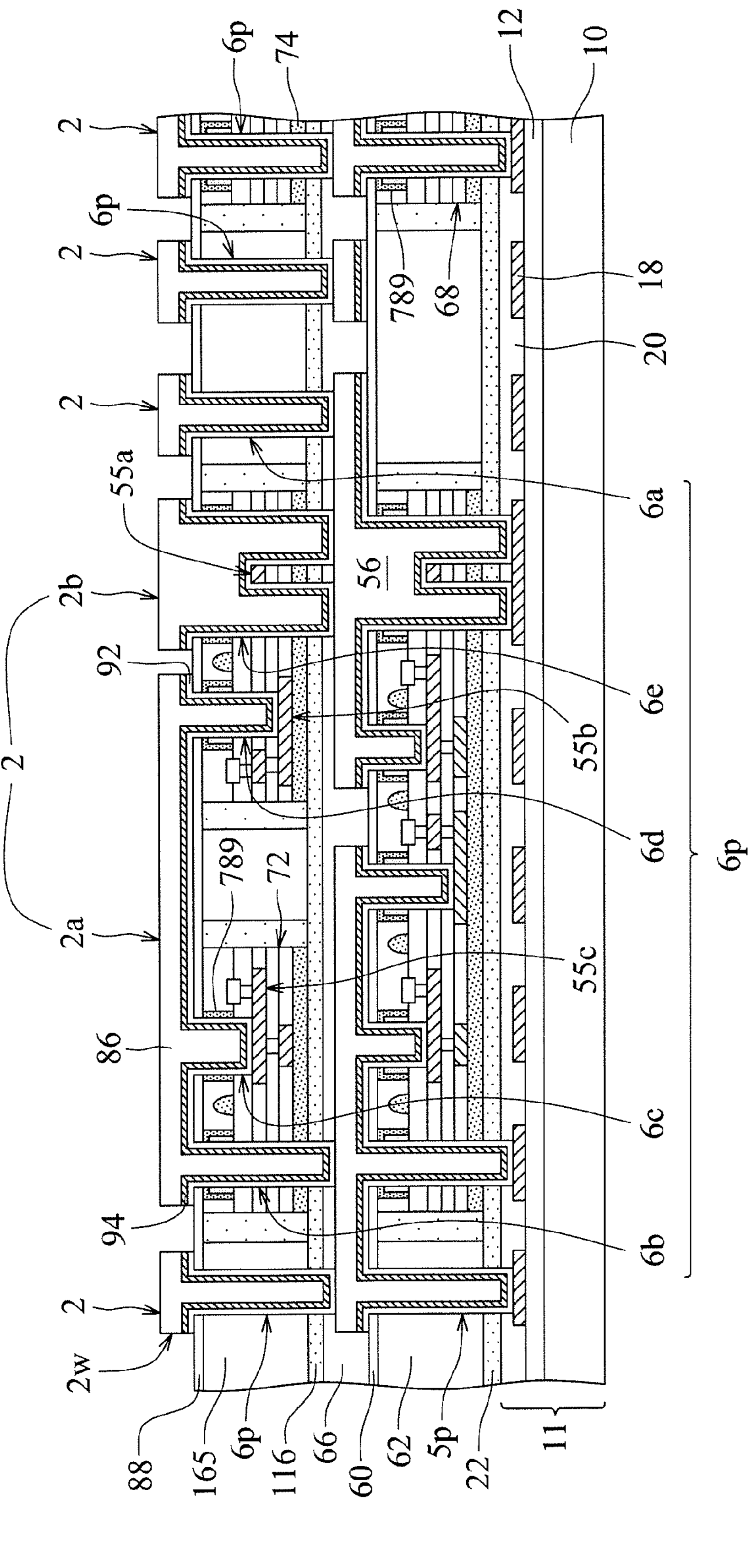

Next, referring to FIG. 263, the photoresist layer 294 is removed using, e.g., an organic chemical solution. Next, the seed layer 94 not under the conduction layer 86 is removed by using a wet etching process or a dry etching process. Next, the adhesion/barrier layer 92 not under the conduction layer 86 is removed by using a wet etching process or a dry etching process. Accordingly, the layers 92, 94 and 86 over the dielectric layer 88 and over the through vias 164*v* compose multiple metal interconnects 2, including metal interconnects 2*a* and 2*b*, over the dielectric layer 88 and over the through vias 164*v*. The adhesion/barrier layer 92 and the seed layer 94 of the metal interconnects 2 over the dielectric layer 88 are not at any sidewall 2*w* of the conduction layer 86 of the metal interconnects 2 over the dielectric layer 88, but under a bottom of the conduction layer 86 of the metal interconnects 2 over the dielectric layer 88. The sidewalls 2*w* of the conduction layer 86 of the metal interconnects 2 over the dielectric layer 88 are not covered by the layers 92 and 94. The layers 92, 94 and 86 in the through vias 164*v* compose multiple metal plugs (or metal vias) 6*p* in the through vias 164*v*, including metal plugs (or metal vias) 6*a*, 6*b*, 6*c*, 6*d* and 6*e* in the through vias 164*a*, 164*b*, 164*c*, 164*d* and 164*e* as shown in FIG. 261, respectively. The metal plug 6*a* is formed in the dummy substrate 165, the metal plugs 6*b* and 6*c* are formed in the left one of the chips 72, and the metal plugs 6*d* and 6*e* are formed in the middle one of the chips 72. The supporter 802 and the interconnect or metal trace 55*a*, in the interconnection layer 106, on the supporter 802 can be between two portions, lower than a horizontal level, at which a top surface of the interconnection layer 106 is positioned, of the metal plug 6*e*. These metal plugs 6*p* formed in the chips 72 and in the dummy substrate(s) 165 can connect the metal interconnects 2 and the semiconductor devices 102 in the chips 72 and connect the metal interconnects 1 and 2.

Each of the metal plugs 6*p* in the chips 72 passes through and is enclosed by one of the insulating plugs 789 in the chips 72 and contacts the inner wall of the one of the insulating plugs 789. For example, the metal plug 6*b* in the left one of the chips 72 passes through and is enclosed by one of the insulating plugs 789 in the left one of the chips 72, contacts the inner wall of the one of the insulating plugs 789, and contacts the insulating layer 456, enclosed by the insulating layer 567, of the one of the insulating plugs 789. The metal plug 6*c* in the left one of the chips 72 passes through and is enclosed by another one of the insulating plugs 789 in the left one of the chips 72, contacts the inner wall of the another one of the insulating plugs 789, and contacts the insulating layer 567 of the another one of the insulating plugs 789. The metal plug 6*d* in the middle one of the chips 72 passes through and is enclosed by one of the insulating plugs 789 in the middle one of the chips 72, contacts the inner wall of the one of the insulating plugs 789, and contacts the insulating layer 456, enclosed by the insulating layer 567, of the one of the insulating plugs 789. The metal plug 6*e* in the middle one of the chips 72 passes through and is enclosed by another one of the insulating plugs 789 in the middle one of the chips 72, contacts the inner wall of the another one of the insulating plugs 789, and contacts the insulating layer 567 of the another one of the insulating plugs 789. For more detailed description about the metal plugs 6*p* (including the metal plugs 6*a*-6*e*) and the metal interconnects 2 (including the metal interconnects 2*a* and 2*b*) shown in FIG. 263, please refer to the illustration in FIG. 96.

Alternatively, the element 72 not only can indicate a chip, but also can indicate a wafer. When the element 72 is a wafer, the element 68 can be another wafer. Thereby, the process illustrated in the invention can be employed to the wafer-to-wafer bonding.

Figure 264:
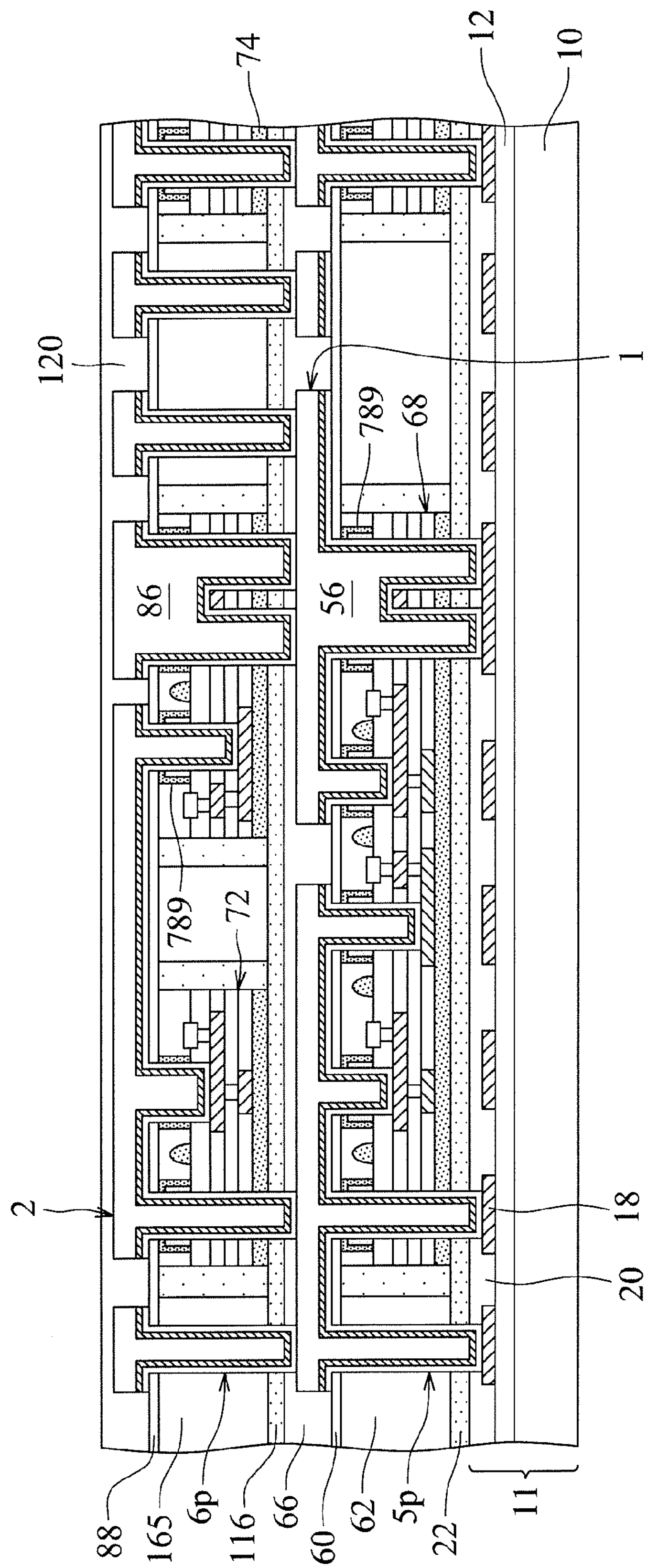

Next, referring to FIG. 264, an insulating or dielectric layer 120 is formed on the conduction layer 86 of the metal interconnects 2, on the dielectric layer 88, and in gaps between the metal interconnects 2. The insulating or dielectric layer 120, for example, may include or can be a polymer layer, such as a layer of polyimide, benzocyclobutene (BCB), epoxy, polyphenylene oxide (PPO), or polybenzoxazole (PBO), on the conduction layer 86 of the metal interconnects 2, on the dielectric layer 88, and in the gaps between the metal interconnects 2. The polymer layer on the conduction layer 86 may have a thickness, e.g., between 0.1 and 50 micrometers, and preferably between 1 and 30 micrometers, between 2 and 20 micrometers, or between 5 and 10 micrometers.

Alternatively, the insulating or dielectric layer 120 may include or can be an inorganic layer, such as a layer of silicon oxide, silicon nitride, silicon oxynitride, silicon carbon nitride, or silicon oxycarbide, on the conduction layer 86 of the metal interconnects 2, on the dielectric layer 88, and in the gaps between the metal interconnects 2. The inorganic layer on the conduction layer 86 may have a thickness, e.g., between 0.1 and 10 micrometers, and preferably between 0.1 and 1 micrometers, between 0.2 and 2 micrometers, between 0.3 and 3 micrometers, or between 0.5 and 5 micrometers.

Figure 265:
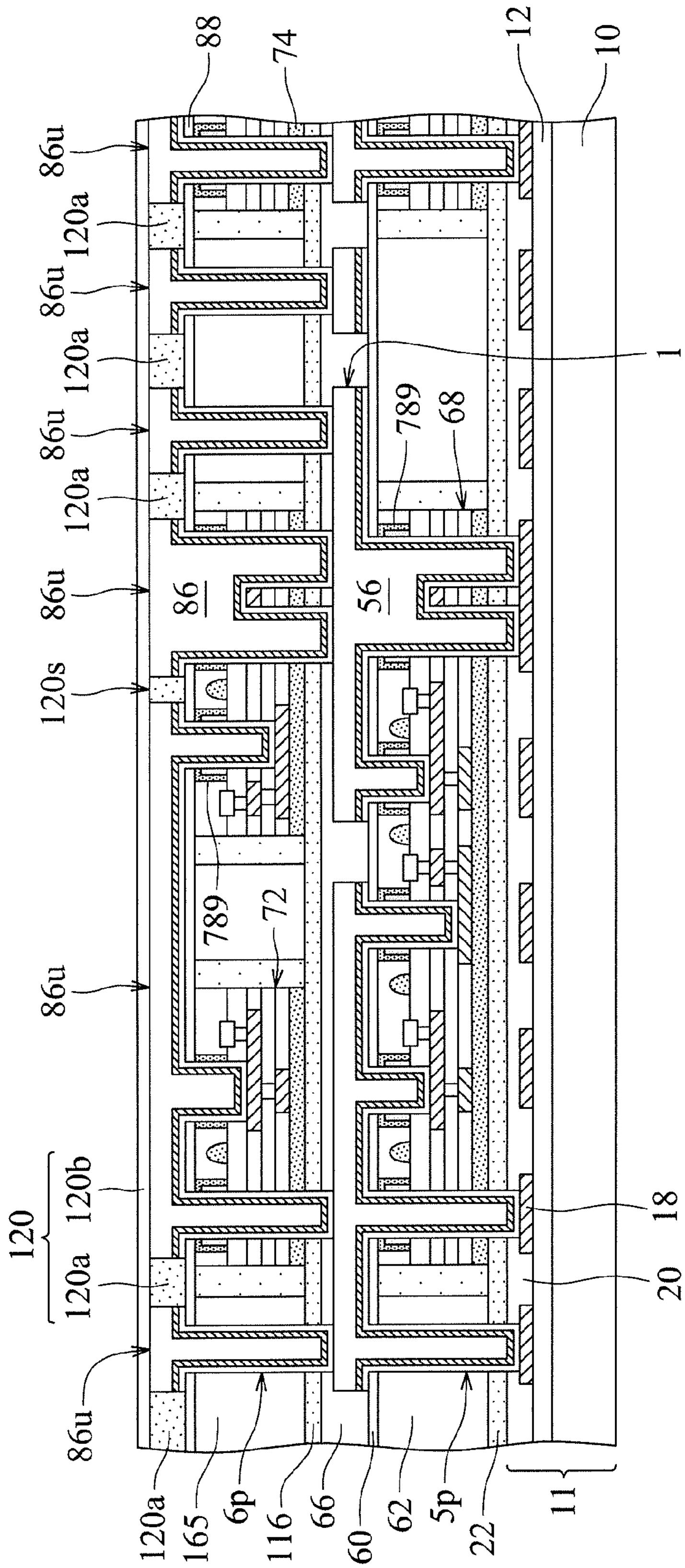

Alternatively, referring to FIG. 265, the insulating or dielectric layer 120 as shown in FIG. 264 can be formed by the following steps. First, a polymer layer 120*a*, such as a layer of polyimide, benzocyclobutene (BCB), epoxy, polyphenylene oxide (PPO), or polybenzoxazole (PBO), is formed on the conduction layer 86 of the metal interconnects 2, on the dielectric layer 88, and in the gaps between the metal interconnects 2. Next, the polymer layer 120*a* is ground or polished by a suitable process, such as mechanical grinding process, mechanical polishing process, chemical-mechanical-polishing (CMP) process, or a process including mechanical polishing and chemical etching, until the conduction layer 86 of the metal interconnects 2 has a top surface 86*u* not covered by the polymer layer 120*a*. Accordingly, the polymer layer 120*a* remains on the dielectric layer 88 and in the gaps between the metal interconnects 2 and has a thickness, e.g., greater than 1 micrometer, such as between 1 and 20 micrometers, and preferably between 1 and 10 micrometers, between 1 and 5 micrometers, or between 2 and 20 micrometers. The ground or polished surface 120*s* of the polymer layer 120*a* can be substantially flat and substantially coplanar with the top surface 86*u* of the conduction layer 86. Next, an inorganic layer 120*b*, such as a layer of silicon oxide, silicon nitride, silicon carbon nitride, silicon oxynitride, or silicon oxycarbide, having a thickness, e.g., between 0.1 and 3 micrometers, and preferably between 0.2 and 1.5 micrometers, is formed on the top surface 86*u* of the conduction layer 86 and on the ground or polished surface 120*s* of the polymer layer 120*a*. Accordingly, the insulating or dielectric layer 120 as shown in FIG. 264 also can be provided with the polymer layer 120*a* and the inorganic layer 120*b* as shown in FIG. 265.

Figure 266:
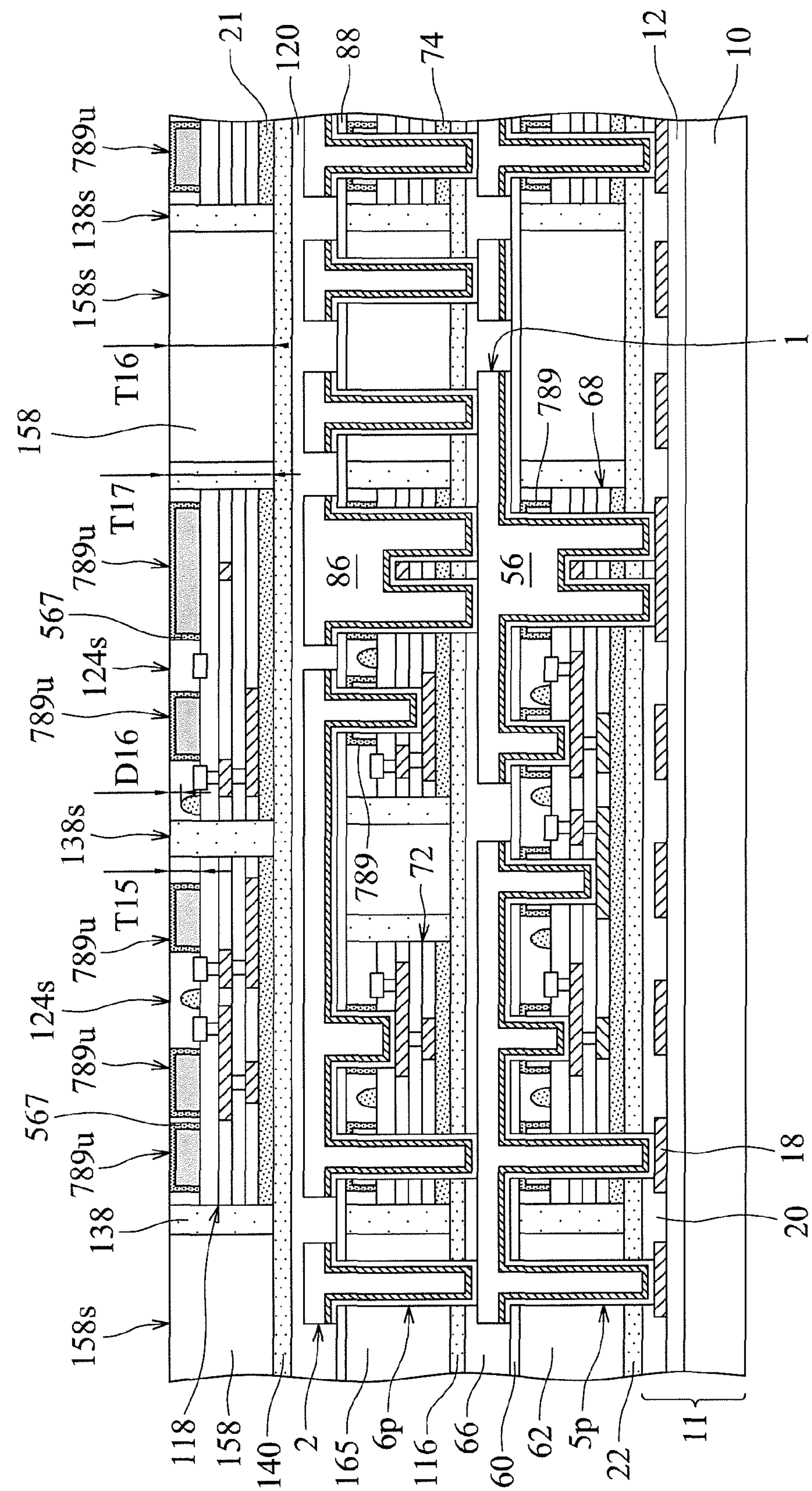

Referring to FIG. 266, after forming the insulating or dielectric layer 120, the following steps can be subsequently performed as illustrated in FIGS. 239 and 240 to place the chips 118, each of which is like the chip 118*a* or 118*b* illustrated in FIG. 212N, and the previously described dummy substrate(s) 158 over the layer 140 formed on the layer 120, to form the encapsulation/gap filling material 138 on the backside of the semiconductor substrate 124 of each chip 118, on the dummy substrate(s) 158, and in the gaps 4*b* and 8*b*, and to grind or polish the encapsulation/gap filling material 138, the backside of the semiconductor substrate 124 of each chip 118, and the dummy substrate(s) 158 until all of the insulating plugs 789 in the chips 118 have the exposed bottom surfaces 789*u*, over which there are no portions of the semiconductor substrates 124.

Figure 267:
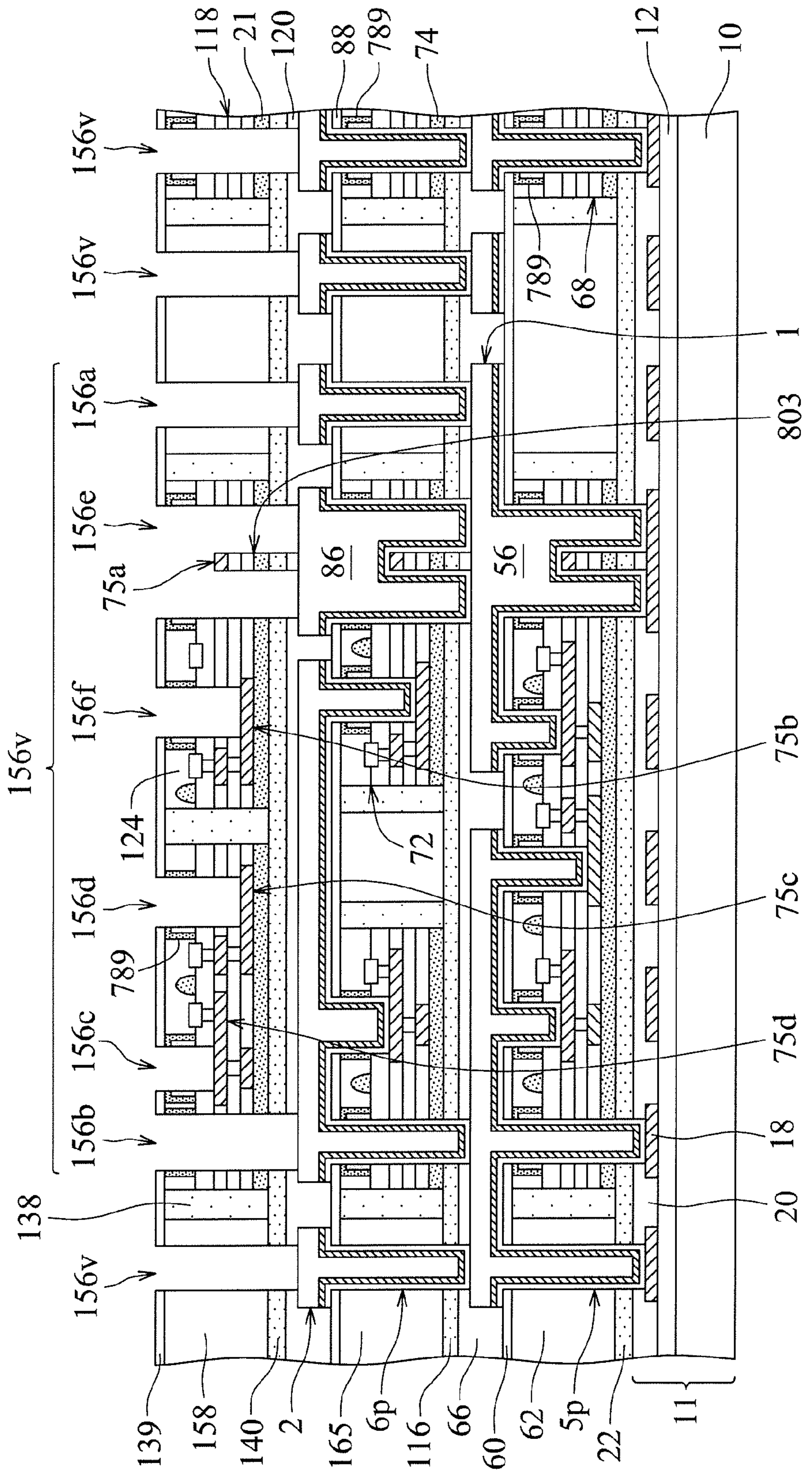

Next, referring to FIG. 267, the dielectric layer 139 illustrated in FIG. 204 is formed on the surface 124*s* of the semiconductor substrate 124 of each chip 118, on the surface(s) 158*s* of the dummy substrate(s) 158, on the exposed bottom surfaces 789*u* of the insulating plugs 789 in the chips 118, and on the surface 138*s* of the encapsulation/gap filling material 138. Next, multiple through vias 156*v*, including through vias 156*a*, 156*b*, 156*c*, 156*d*, 156*e*, and 156*f*, are formed in the chips 118 and in the dummy substrate(s) 158, exposing the conduction layer 86 of the metal interconnects 2 and exposing the layers 17 and 19 of the chips 118. The steps of forming the through vias 156*v* in the chips 118 and in the dummy substrate(s) 158 illustrated in FIG. 267 can be referred to as the steps of forming the through vias 156*v* in the chips 118 and in the dummy substrate(s) 158 as illustrated in FIG. 65, but, in the embodiment, forming the through vias 156*v* (such as the vias 156*b*-156*f*) in the chips 118 includes etching through the insulating plugs 789 in the chips 118. The specifications of the through vias 156*v* (including the vias 156*a*-156*f*), the insulating plugs 789 enclosing the through vias 156*v*, and the supporter 803 shown in FIG. 267 can be referred to as the specifications of the through vias 156*v* (including the vias 156*a*-156*f*), the insulating plugs 789 enclosing the through vias 156*v*, and the supporter 803, respectively, illustrated in FIGS. 242-246.

Figure 268:
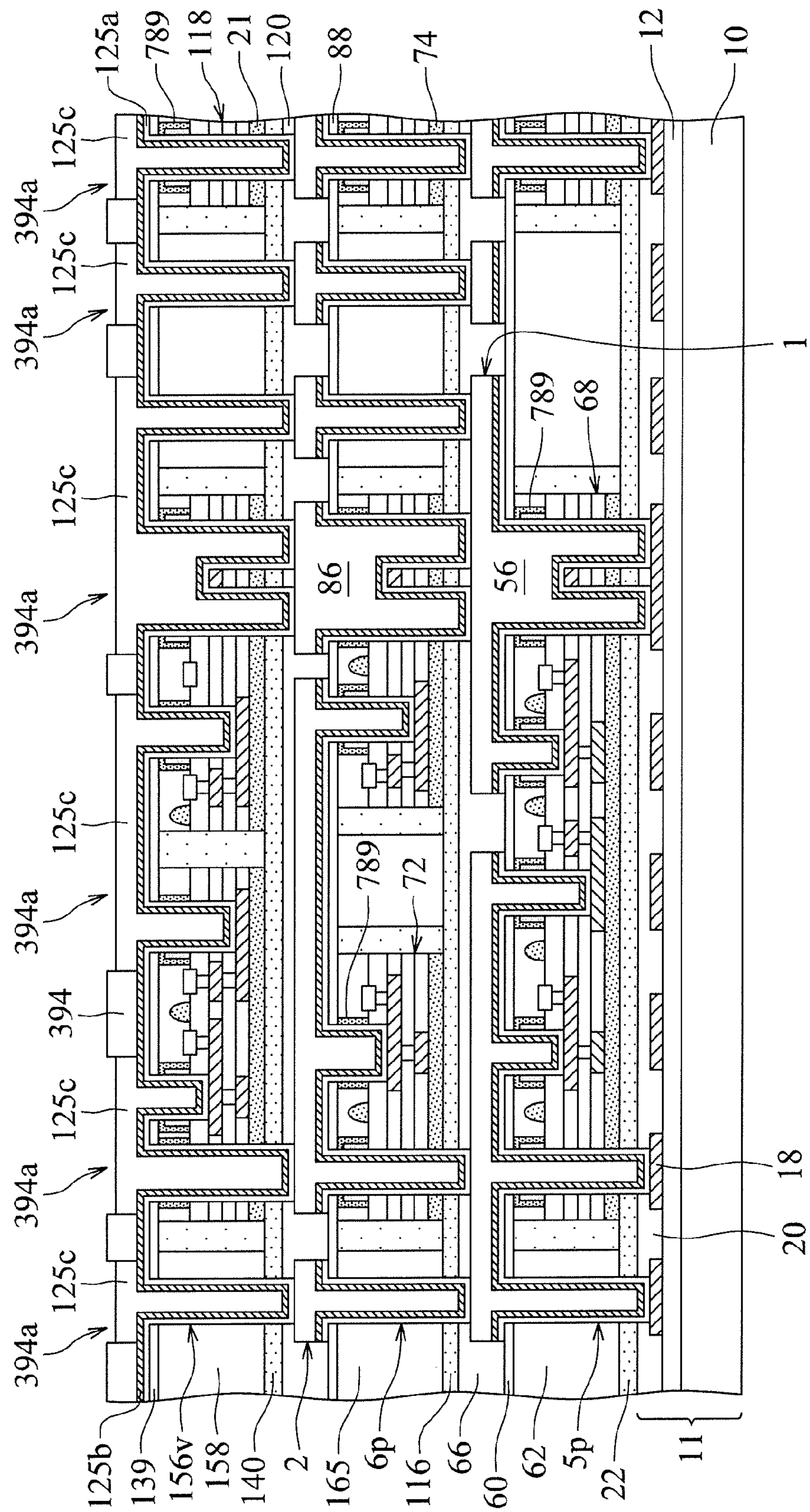

Next, referring to FIG. 268, the adhesion/barrier layer 125*a* illustrated in FIG. 100 is formed on the layers 17, 19 and 86 exposed by the through vias 156*v*, on sidewalls of the through vias 156*v*, on the dielectric layer 139, on the inner walls, exposed by the through vias 156*v*, of the insulating plugs 789 in the chips 118, and on the interconnect or metal trace 75*a* that is on the supporter 803. Next, the seed layer 125*b* illustrated in FIG. 100 is formed on the adhesion/barrier layer 125*a* and in the through vias 156*v*. Next, a photoresist layer 394 is formed on the seed layer 125*b* by using, e.g., a spin coating process, a screen printing process, or a lamination process. Next, a photo exposure process and a development process can be employed to form multiple openings 394*a*, exposing multiple regions of the seed layer 125*b*, in the photoresist layer 394. The patterned photoresist layer 394 may have a thickness, e.g., between 1 and 30 micrometers, and preferably between 1 and 20 micrometers or between 1 and 10 micrometers. Next, the conduction layer 125*c* illustrated in FIG. 100 is formed on the regions, exposed by the openings 394*a* in the layer 394, of the seed layer 125*b*.

Figure 269:
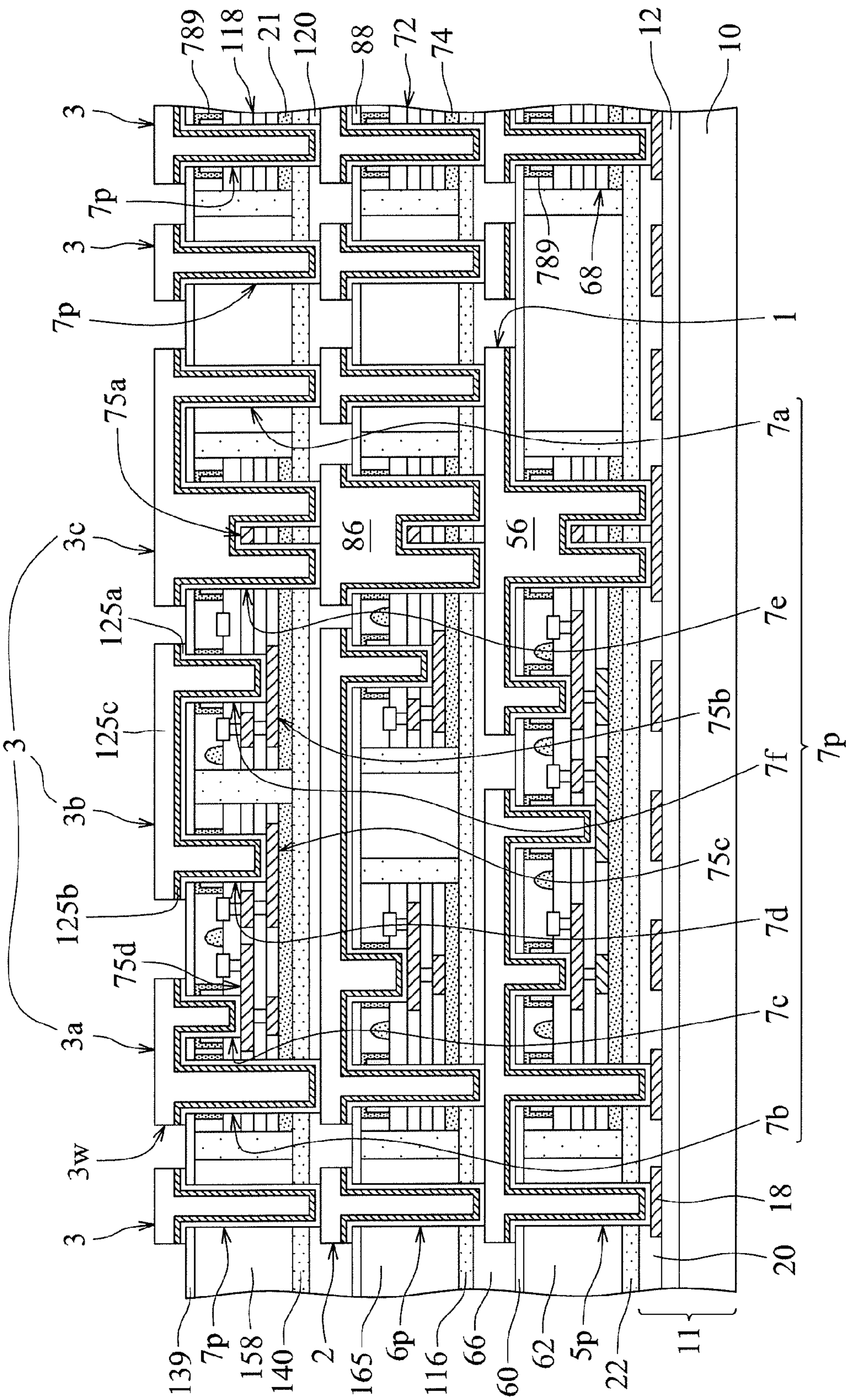

Next, referring to FIG. 269, the photoresist layer 394 is removed using, e.g., an organic chemical solution. Next, the seed layer 125*b* not under the conduction layer 125*c* is removed by using a wet etching process or a dry etching process. Next, the adhesion/barrier layer 125*a* not under the conduction layer 125*c* is removed by using a wet etching process or a dry etching process. Accordingly, the layers 125*a*, 125*b* and 125*c* over the dielectric layer 139 and over the through vias 156*v* compose multiple metal interconnects 3, including metal interconnects 3*a*, 3*b* and 3*c*, over the dielectric layer 139 and over the through vias 156*v*. The adhesion/barrier layer 125*a* and the seed layer 125*b* of the metal interconnects 3 over the dielectric layer 139 are not at any sidewall 3*w* of the conduction layer 125*c* of the metal interconnects 3 over the dielectric layer 139, but under a bottom of the conduction layer 125*c* of the metal interconnects 3 over the dielectric layer 139. The sidewalls 3*w* of the conduction layer 125*c* of the metal interconnects 3 over the dielectric layer 139 are not covered by the layers 125*a* and 125*b*. The layers 125*a*, 125*b* and 125*c* in the through vias 156*v* compose multiple metal plugs (or metal vias) 7*p* in the through vias 156*v*, including metal plugs (or metal vias) 7*a*, 7*b*, 7*c*, 7*d*, 7*e* and 7*f* in the through vias 156*a*, 156*b*, 156*c*, 156*d*, 156*e* and 156*f* as shown in FIG. 267, respectively. The metal plug 7*a* is formed in the dummy substrate 158. The metal plugs 7*b*, 7*c* and 7*d* are formed in the left one of the chips 118, and the metal plugs 7*e* and 7*f* are formed in the middle one of the chips 118. These metal plugs 7*p* formed in the chips 118 and in the dummy substrate(s) 158 can connect the metal interconnects 3 and the semiconductor devices 13 in the chips 118 and connect the metal interconnects 2 and 3. The supporter 803 and the interconnect or metal trace 75*a*, in the interconnection layer 17, on the supporter 803 can be between two portions, lower than a horizontal level, at which a top surface of the interconnection layer 17 is positioned, of the metal plug 7*e*.

Each of the metal plugs 7*p* in the chips 118 passes through and is enclosed by one of the insulating plugs 789 in the chips 118 and contacts the inner wall of the one of the insulating plugs 789. For example, the metal plug 7*b* in the left one of the chips 118 passes through and is enclosed by one of the insulating plugs 789 in the left one of the chips 118, contacts the inner wall of the one of the insulating plugs 789, and contacts the insulating layer 567 of the one of the insulating plugs 789. The metal plug 7*c* in the left one of the chips 118 passes through and is enclosed by another one of the insulating plugs 789 in the left one of the chips 118, contacts the inner wall of the another one of the insulating plugs 789, and contacts the insulating layer 456, enclosed by the layer 567, of the another one of the insulating plugs 789. The metal plug 7*d* in the left one of the chips 118 passes through and is enclosed by another one of the insulating plugs 789 in the left one of the chips 118, contacts the inner wall of the another one of the insulating plugs 789, and contacts the insulating layer 567 and the insulating layer 456, enclosed by the layer 567, of the another one of the insulating plugs 789. The metal plug 7*e* in the middle one of the chips 118 passes through and is enclosed by one of the insulating plugs 789 in the middle one of the chips 118, contacts the inner wall of the one of the insulating plugs 789, and contacts the insulating layer 456, enclosed by the insulating layer 567, of the one of the insulating plugs 789. The metal plug 7*f* in the middle one of the chips 118 passes through and is enclosed by another one of the insulating plugs 789 in the middle one of the chips 118, contacts the inner wall of the another one of the insulating plugs 789, and contacts the insulating layer 567 and the insulating layer 456, enclosed by the layer 567, of the another one of the insulating plugs 789. For more detailed description about the metal plugs 7*p* (including the metal plugs 7*a*-7*f*) and the metal interconnects 3 (including the metal interconnects 3*a*, 3*b* and 3*c*) shown in FIG. 269, please refer to the illustration in FIG. 101.

Alternatively, the element 118 not only can indicate a chip, but also can indicate a wafer. When the element 118 is a wafer, the element 72 can be another wafer. Thereby, the process illustrated in the invention can be employed to the wafer-to-wafer bonding.

Figure 270:
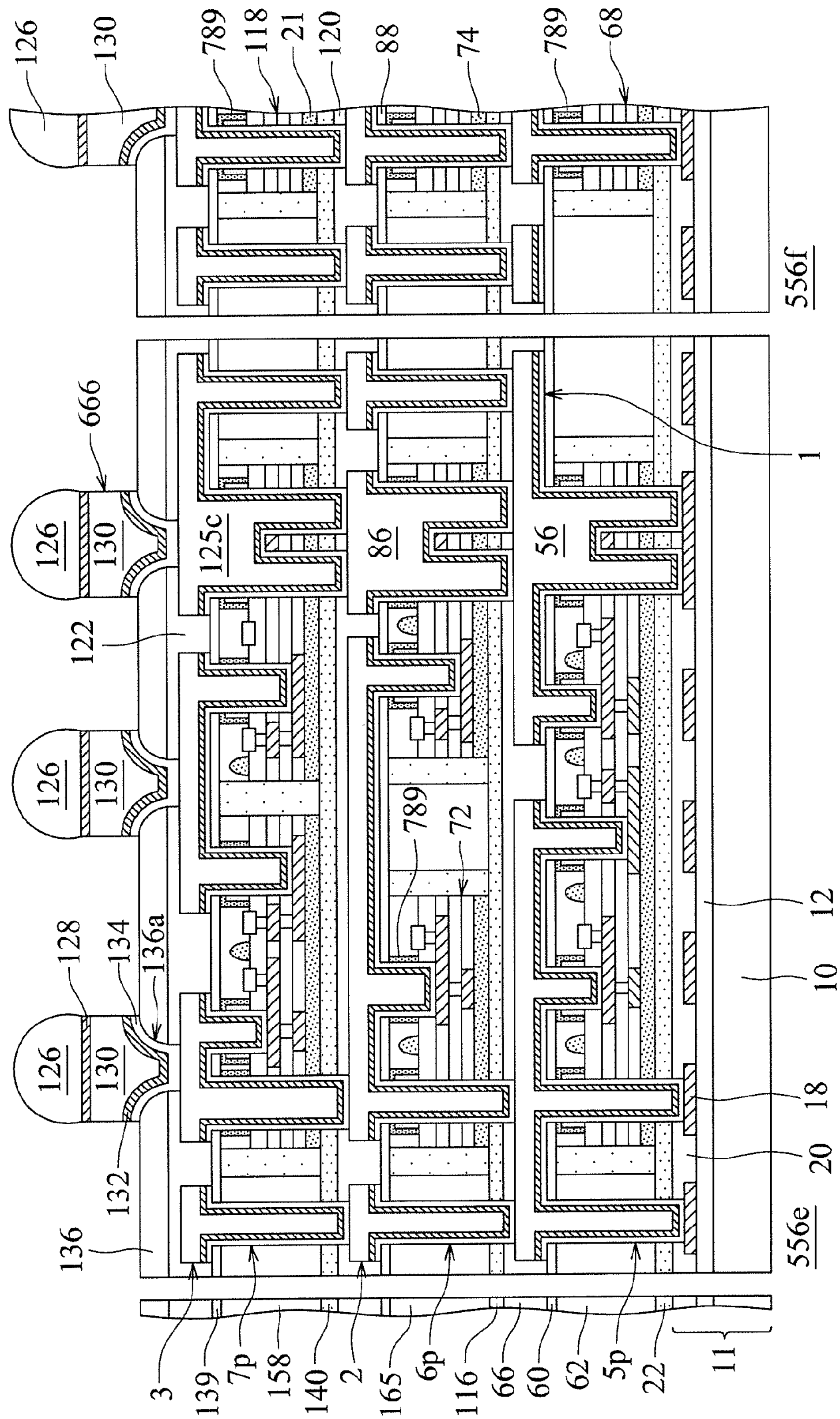

Referring to FIG. 270, after forming the structure illustrated in FIG. 269, the following steps can be subsequently performed as illustrated in FIG. 102 to form the insulating or dielectric layer 122 on the conduction layer 125*c* of the metal interconnects 3, on the dielectric layer 139, and in the gaps between the metal interconnects 3, to form the polymer layer 136 on the insulating or dielectric layer 122, and to form multiple openings 136*a*, exposing multiple regions of the insulating or dielectric layer 122, in the polymer layer 136. Next, forming an under bump metallurgic (UBM) layer 666 on the polymer layer 136 and on multiple contact points, at bottoms of multiple openings in the insulating or dielectric layer 122 and under the openings 136*a* in the polymer layer 136, of the conduction layer 125*c* of the metal interconnects 3 and forming multiple solder bumps or balls 126 on the UBM layer 666 can be referred to as the steps illustrated in FIGS. 78-81. Next, a singulation process is performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in packages or multichip modules 556*e* and 556*f*.

Figure 271:
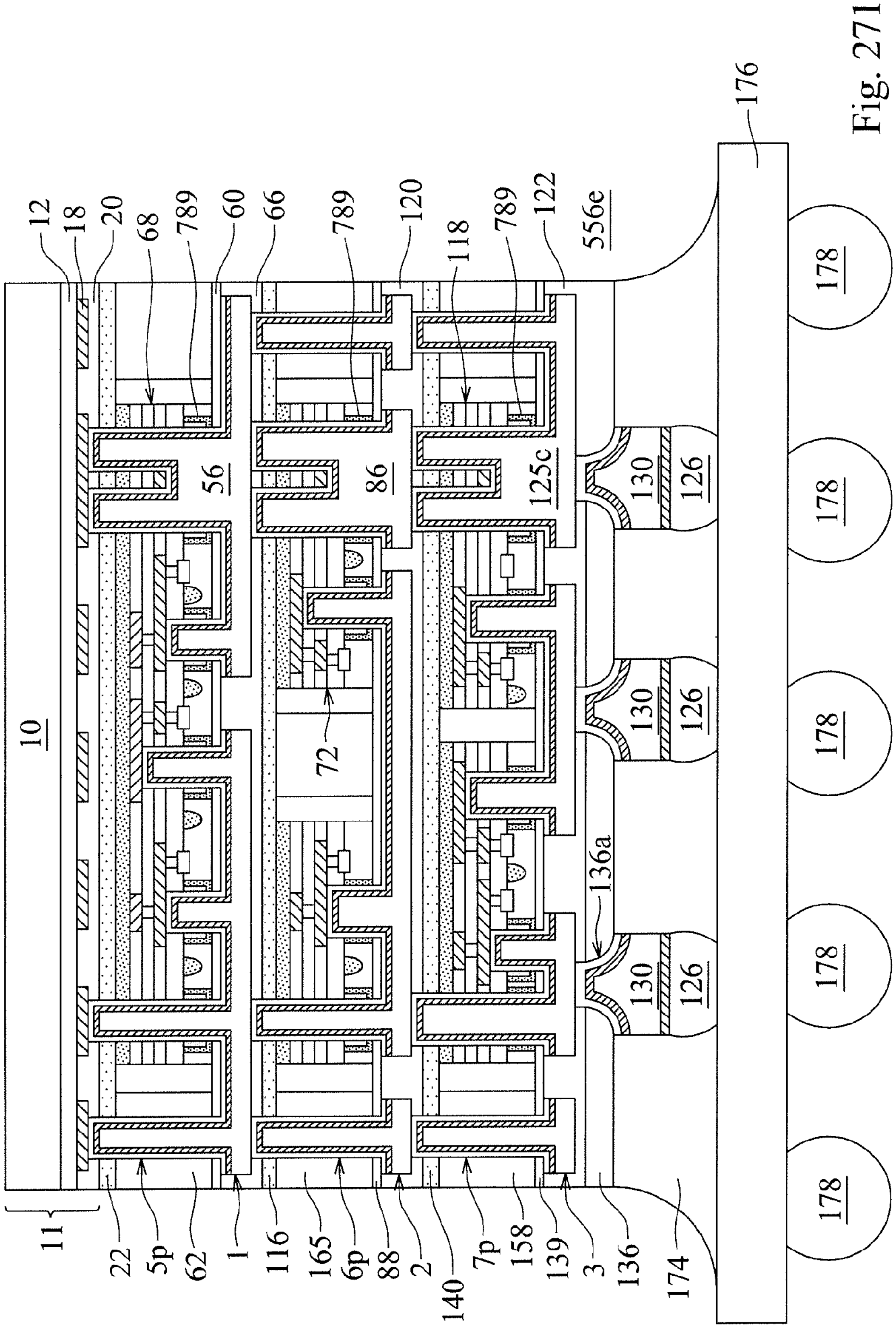
FIG. 271 shows a cross-sectional view of a multichip package according to an embodiment of the present disclosure.

The system-in package or multichip module 556*e* can be connected to and bonded with a carrier, such as mother board, printed circuit board (PCB), ball-grid-array (BGA) substrate, metal substrate, glass substrate, or ceramic substrate, using the solder bumps or balls 126. For example, referring to FIG. 271, the system-in package or multichip module 556*e* is bonded with the top side of the carrier 176 illustrated in FIG. 83 using, e.g., a flip chip technology of joining the solder bumps or balls 126 with a solder or gold layer preformed on the top side of the carrier 176. Next, the under fill 174 illustrated in FIG. 83 is formed between the polymer layer 136 of the system-in package or multichip module 556*e* and the top side of the carrier 176 and encloses the solder bumps or balls 126. Next, the solder balls 178 illustrated in FIG. 83 are formed on the bottom side of the carrier 176.

Figure 272:
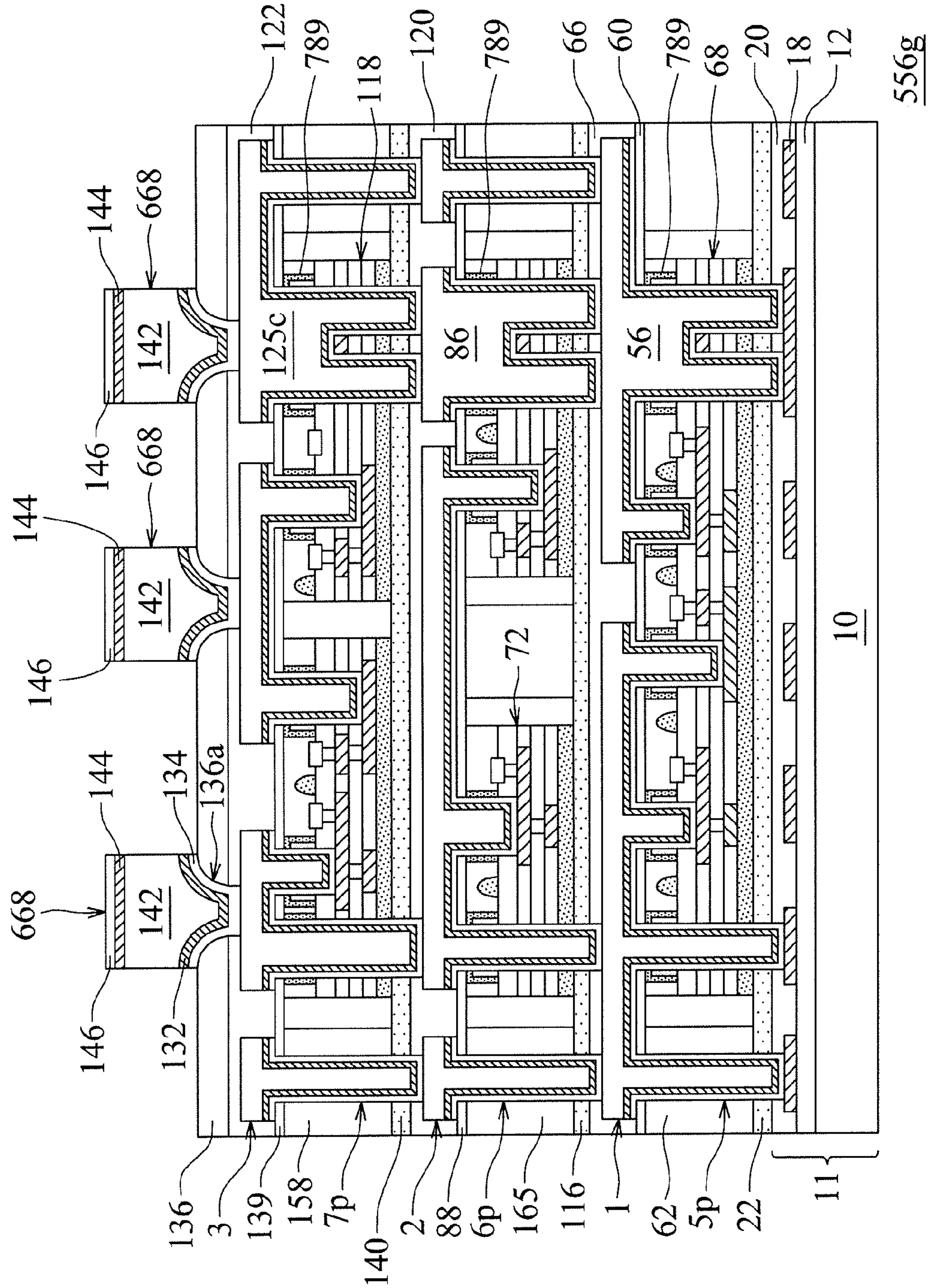
FIG. 272 shows a cross-sectional view of a system-in package or multichip module according to an embodiment of the present disclosure.

FIG. 272 shows another system-in package or multichip module according to another embodiment of the present disclosure, which can be formed by the following steps. After forming the structure illustrated in FIG. 269, the following steps can be subsequently performed as illustrated in FIG. 102 to form the insulating or dielectric layer 122 on the conduction layer 125*c* of the metal interconnects 3, on the dielectric layer 139, and in the gaps between the metal interconnects 3, to form the polymer layer 136 on the insulating or dielectric layer 122, and to form multiple openings 136*a*, exposing multiple regions of the insulating or dielectric layer 122, in the polymer layer 136. Next, the steps illustrated in FIGS. 78 and 79 can be subsequently performed. Next, forming metal bumps 668 on the polymer layer 136 and on contact points, at bottoms of openings in the insulating or dielectric layer 122 and under the openings 136*a* in the polymer layer 136, of the conduction layer 125*c* of the metal interconnects 3 can be referred to as the steps illustrated in FIG. 84. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as system-in package or multichip module 556*g*. In the system-in package or multichip module 556*g*, each of the interconnects 3 can be connected to one or more of the metal bumps 668.

Figure 273:
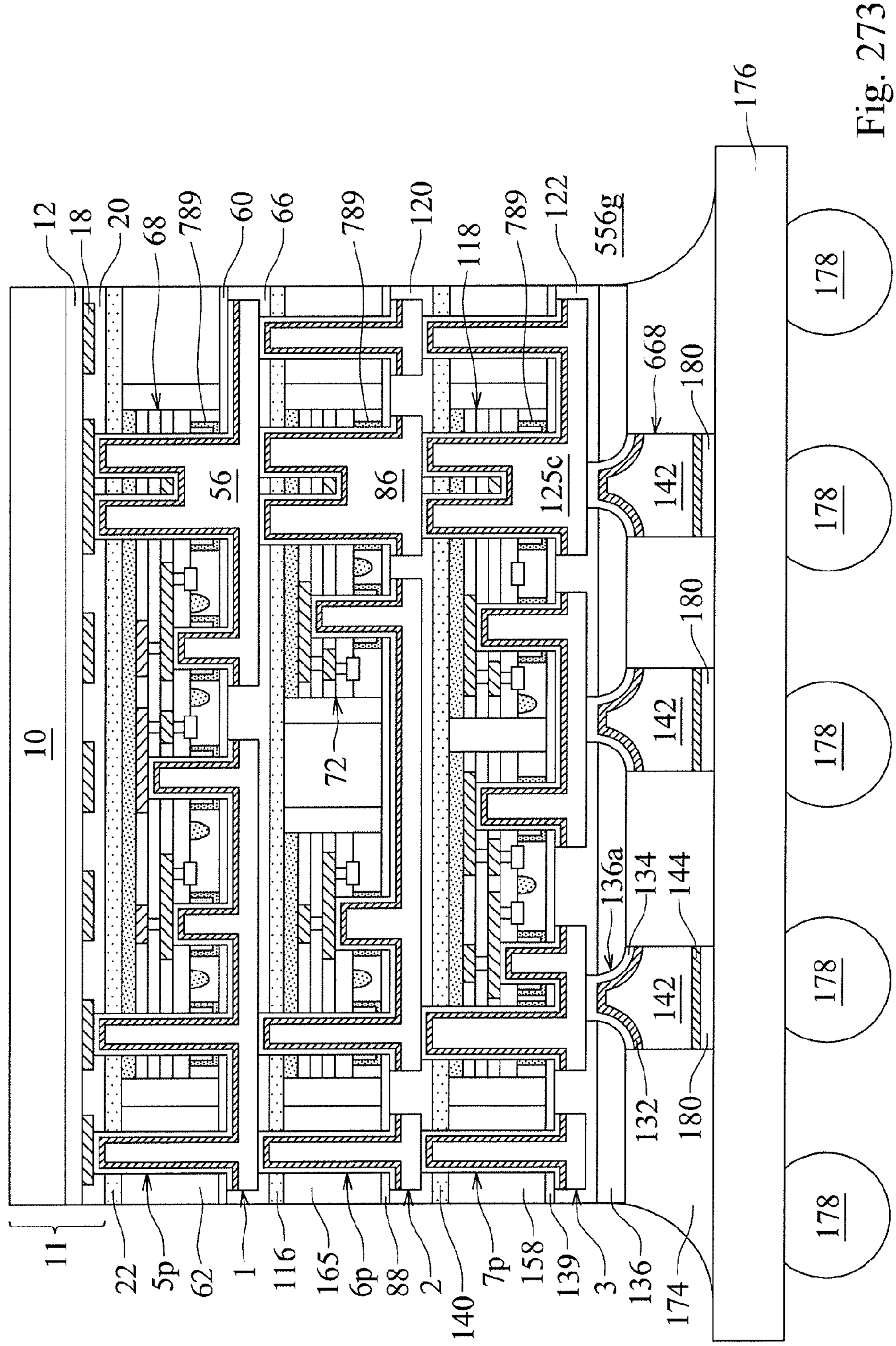
FIG. 273 shows a cross-sectional view of a multichip package according to an embodiment of the present disclosure.

The system-in package or multichip module 556*g* can be connected to and bonded with a carrier, such as mother board, printed circuit board (PCB), ball-grid-array (BGA) substrate, metal substrate, glass substrate, or ceramic substrate, using the metal bumps 668. For example, referring to FIG. 273, the system-in package or multichip module 556*g* is bonded with the top side of the carrier 176 illustrated in FIG. 83 using, e.g., a flip chip technology of joining the solder wetting layer 146 of the metal bumps 668 with a solder or gold layer preformed on the top side of the carrier 176. After joining the solder wetting layer 146 with the solder or gold layer preformed on the top side of the carrier 176, multiple metal joints 180 are formed between the barrier layer 144 of the metal bumps 668 and the top side of the carrier 176. The metal joints 180 can be a layer of a Sn—Ag alloy, a Sn—Ag—Cu alloy, a Sn—Au alloy, or a Sn—Pb alloy having a thickness between 5 and 50 micrometers. Next, the under fill 174 illustrated in FIG. 83 is formed between the polymer layer 136 of the system-in package or multichip module 556g and the top side of the carrier 176 and encloses the metal bumps 668 and the metal joints 180. Next, the solder balls 178 illustrated in FIG. 83 are formed on the bottom side of the carrier 176.

Alternatively, the insulating or dielectric layer 122 as shown FIGS. 270-273 can be omitted. In this case, the polymer layer 136 is formed on the conduction layer 125c of the metal interconnects 3, on the dielectric layer 139, and in the gaps between the metal interconnects 3, and the contact points of the conduction layer 125c of the metal interconnects 3 are exposed by and at ends of the openings 136a in the polymer layer 136. Further, the adhesion/barrier layer 134 is formed on the contact points, exposed by and at the ends of the openings 136a in the polymer layer 136, of the conduction layer 125c of the metal interconnects 3.

Figure 274:
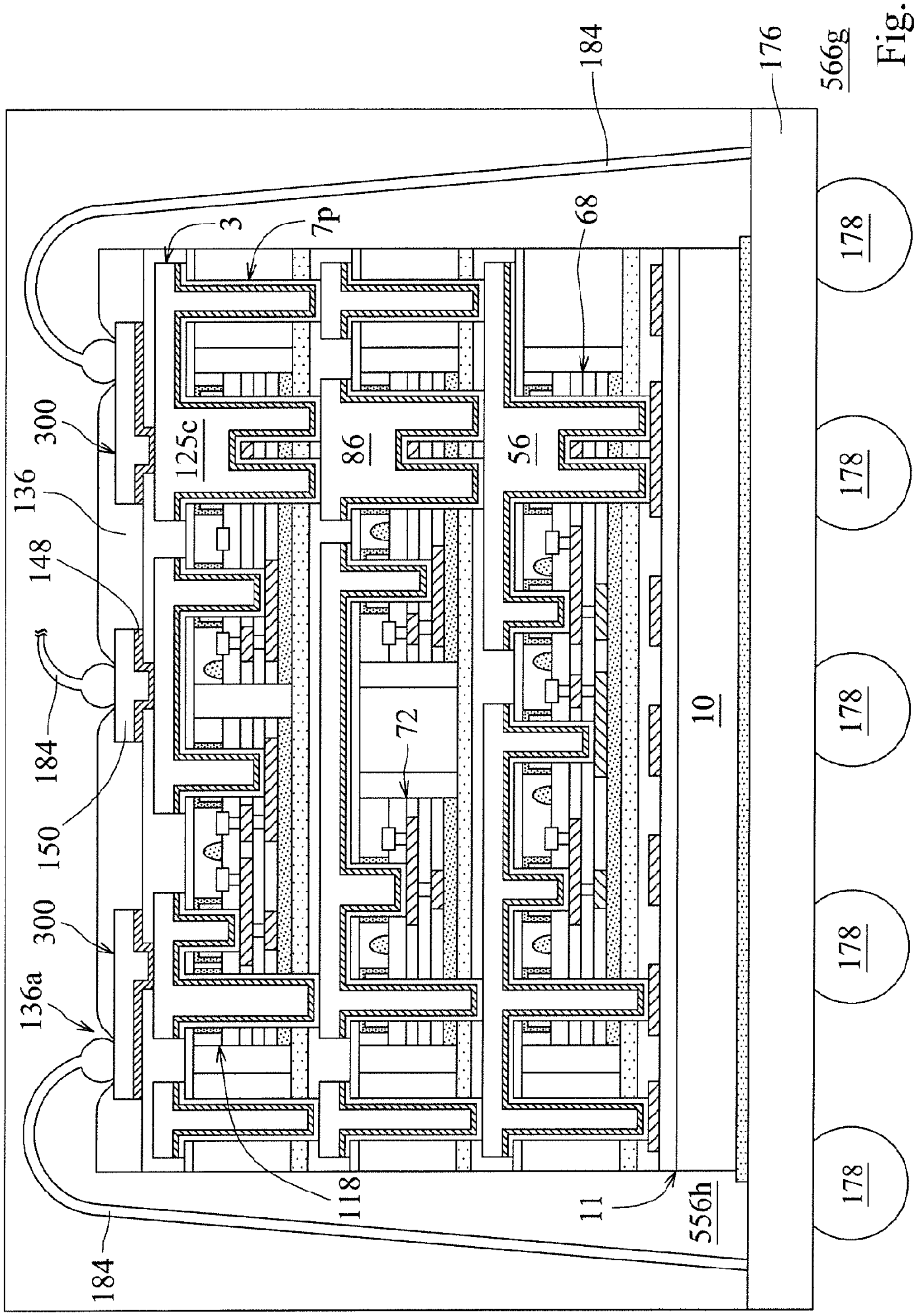
FIG. 274 shows a cross-sectional view of a multichip package according to an embodiment of the present disclosure.

FIG. 274 shows a multichip package 566g including a system-in package or multichip module 556h connected to the carrier 176 illustrated in FIG. 83 through wirebonded wires 184, which can be formed by, e.g., the following steps. After forming the structure illustrated in FIG. 269, the following steps can be subsequently performed as illustrated in FIG. 107 to form an insulating or dielectric layer 122 on the conduction layer 125c of the metal interconnects 3, on the dielectric layer 139, and in gaps between the metal interconnects 3, to form multiple metal interconnects or traces 300 on the insulating or dielectric layer 122 and on multiple regions, exposed by multiple openings 122a in the layer 122, of the conduction layer 125c of the metal interconnects 3, and to form a polymer layer 136 on the insulating or dielectric layer 122 and on the metal interconnects or traces 300. The polymer layer 136 after being cured may have a thickness, e.g., between 1 and 20 micrometers, and preferably between 2 and 15 micrometers or between 5 and 10 micrometers, and multiple openings 136a in the polymer layer 136 expose multiple contact points of the metal interconnects or traces 300. Next, a singulation process can be performed to cut the carrier 11, the dummy substrates 62, 165 and 158, and the layers 22, 60, 66, 88, 116, 120, 122, 136, 139 and 140 by using, e.g., mechanical sawing or laser cutting and to singularize multiple system-in packages or multichip modules, such as the system-in package or multichip module 556h.

Next, a plurality of the system-in package or multichip module 556h are joined with a carrier 176 by, e.g., forming a glue layer 182 with a thickness, e.g., between 1 and 20 micrometers or between 20 and 150 micrometers on a top side of the carrier 176, and then attaching the plurality of the system-in package or multichip module 556h to the top side of the carrier 11 using the glue layer 182. The glue layer 182 can be a polymer layer, such as a layer of polyimide, epoxy, benzocyclobutene (BCB), polybenzoxazole (PBO), polyphenylene oxide (PPO), silosane, or SU-8, with a thickness, e.g., between 1 and 20 micrometers or between 20 and 150 micrometers. Next, multiple wires 184, such as gold wires, copper wires, or aluminum wires, are wirebonded onto the top side of the carrier 176 and onto the contact points, exposed by the openings 136a in the polymer layer 136, of the conduction layer 150 of the metal interconnects or traces 300 by a wirebonding process. Accordingly, the metal interconnects or traces 300 of the plurality of the system-in package or multichip module 556h can be physically and electrically connected to the carrier 176 through the wirebonded wires 184. Next, a molding compound 186 is formed on the plurality of the system-in package or multichip module 556h, on the top side of the carrier 176 and on the wirebonded wires 184, encapsulating the wirebonded wires 184 and the plurality of the system-in package or multichip module 556h, by a molding process. The molding compound 186 may include epoxy, carbon filler or glass filler, and the glass filler or carbon filler can be distributed in the epoxy. Next, the solder balls 178 illustrated in FIG. 83 are formed on the bottom side of the carrier 176. Thereafter, a singulation process is performed to cut the carrier 176 and the molding compound 186 and to singularize a plurality of the multichip package 566g. The multichip package 566g can be connected to a carrier, such as mother board, ball-grid-array (BGA) substrate, printed circuit board, metal substrate, glass substrate, or ceramic substrate, through the solder balls 178. The specifications of the carrier 176 shown in FIG. 274 can be referred to as the specifications of the carrier 176 as illustrated in FIG. 83.

Figure 275A:
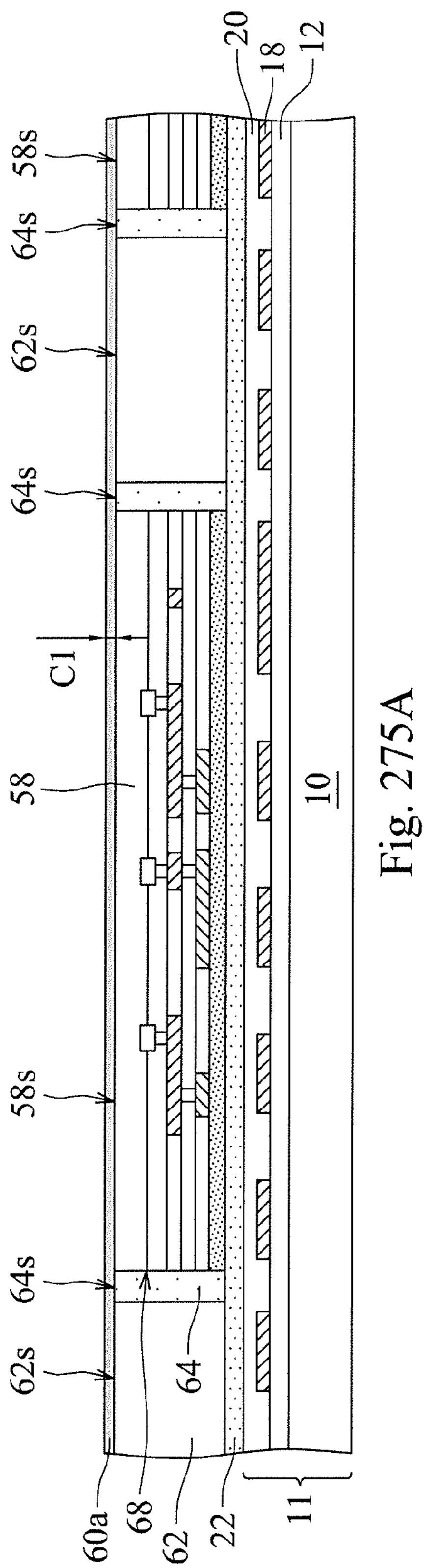
FIGS. 275A-275L show another process for forming the structure shown in FIG. 26.

FIGS. 275A-275L show another process for forming the dielectric layer 60, the trenches 60t, the sidewall dielectric layers 50, and the through vias 170v as shown in FIG. 26. Referring to FIG. 275A, after forming the structure illustrated in FIG. 11, an insulating layer 60a, such as a layer of silicon oxide, silicon nitride, silicon oxynitride, silicon carbon nitride, or silicon oxycarbide, having a thickness C1, e.g., between 0.1 and 5 micrometers, and preferably between 0.2 and 1.5 micrometers or between 0.15 and 2 micrometers, is formed on the surface 58s of the semiconductor substrate 58 of each chip 68, on the surface(s) 62s of the dummy substrate(s) 62, and on the surface 64s of the encapsulation/gap filling material 64.

Figure 275B:
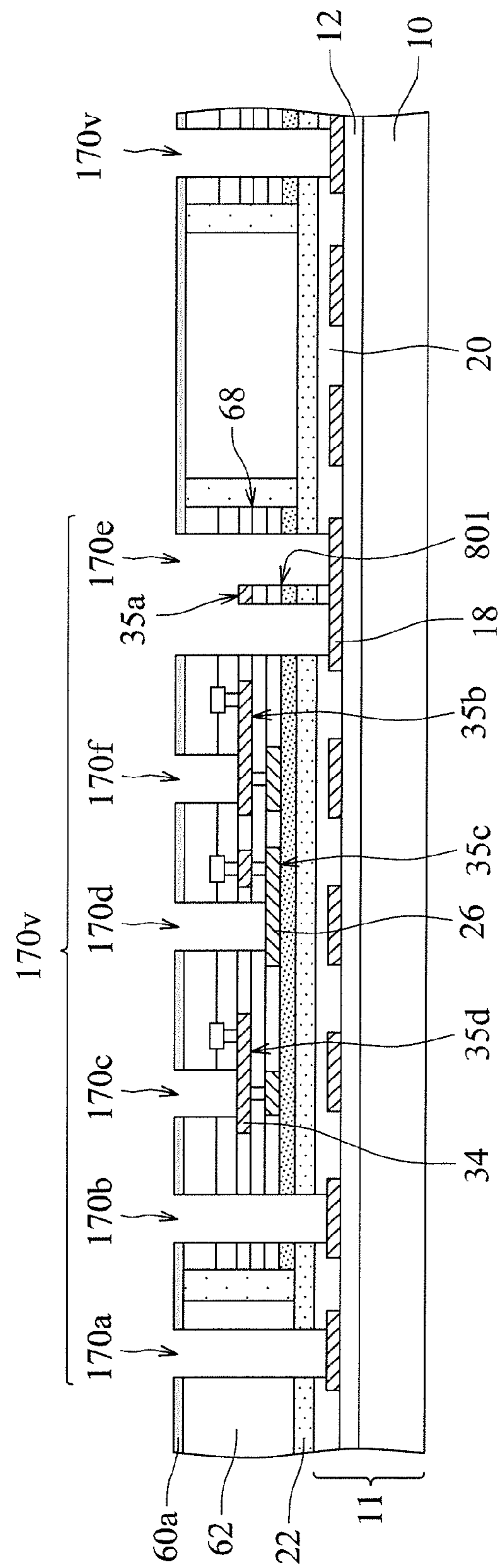
Figure 275C:
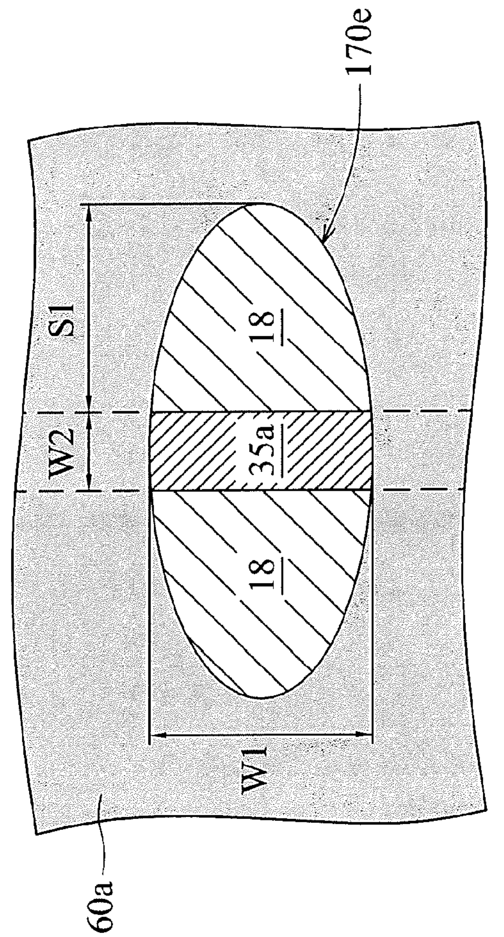
Figure 275D:
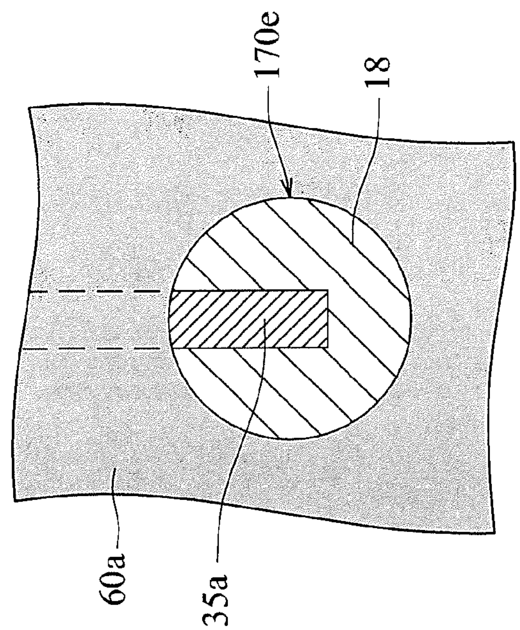

Next, referring to FIG. 275B, multiple through vias 170v, including through vias 170a, 170b, 170c, 170d, 170e and 170f, are formed in the chips 68 and in the dummy substrate(s) 62, exposing the conductive layer 18 of the carrier 11 and exposing the layers 26 and 34 of the chips 68, by, e.g., the following steps. First, a photoresist layer is formed on the insulating layer 60a by using a suitable process, such as spin coating process or lamination process. Next, a photo exposure process and a development process can be employed to form multiple openings, exposing multiple regions of the insulating layer 60a, in the photoresist layer. Next, the insulating layer 60a under the openings in the photoresist layer is removed by using a suitable process, such as anisotropic plasma etching process. Next, the dummy substrate(s) 62 under the openings in the photoresist layer and the chips 68 under the openings in the photoresist layer are etched away until predetermined regions of the layers 26 and 34 in the chips 68 and predetermined regions of the conductive layer 18 in the carrier 11 are exposed by the openings in the photoresist layer. Next, the photoresist layer is removed by using, e.g., an organic chemical. Accordingly, the through vias 170v, including the vias 170a-170f, are formed in the chips 68 and in the dummy substrate(s) 62, exposing the predetermined regions of the conductive layer 18 of the carrier 11 and exposing the predetermined regions of the layers 26 and 34 of the chips 68. The specifications of the through vias 170v and the supporter 801 shown in FIG. 275B can be referred to as the specifications of the through vias 170v and the supporter 801 as illustrated in FIG. 15. FIGS. 275C and 275D are two examples of schematic top perspective views showing the through via 170e and the interconnect or metal trace 35a shown in FIG. 275B.

As shown in FIGS. 275B and 275C, the through via 170e can be, but is not limited to, oval-shaped and has a width W1, e.g., between 1 and 30 micrometers, and preferably between 1 and 20 micrometers, between 1 and 10 micrometers, between 1 and 5 micrometers, or between 3 and 10 micrometers. The oval-shaped through via 170e in one of the chips 68 exposes the interconnect or metal trace 35a in the one of the chips 68 and exposes two regions of the conductive layer 18 in the carrier 11 under the one of the chips 68. The interconnect or metal trace 35a has a line-shaped region, exposed by the oval-shaped through via 170*e*, extending in a horizontal direction from a side of the oval-shaped through via 170*e* to the opposite side of the oval-shaped through via 170*e* through a center of the oval-shaped through via 170*e*. The supporter 801, between the conductive layer 18 of the carrier 11 and the exposed line-shaped region of the interconnect or metal trace 35*a* in the interconnection layer 34, can be line-shaped, like the exposed line-shaped region of the interconnect or metal trace 35*a*. The interconnect or metal trace 35*a* exposed by the oval-shaped through via 170*e* has a width W2, e.g., between 0.3 and 30 micrometers, and preferably between 0.3 and 20 micrometers, between 0.3 and 10 micrometers, between 0.3 and 5 micrometers, or between 0.3 and 1 micrometers. A horizontal distance S1 between an endpoint of the long axis of the oval-shaped through via 170*e* and an edge, which is closer to the endpoint than the other opposite edge, of the interconnect or metal trace 35*a* exposed by the oval-shaped through via 170*e* can be, e.g., between 1 and 30 micrometers, and preferably between 1 and 20 micrometers, between 1 and 10 micrometers, between 1 and 5 micrometers, or between 3 and 10 micrometers.

As shown in FIGS. 275B and 275D, the through via 170*e* can be, but is not limited to, a circular shape and has a diameter, e.g., between 0.5 and 100 micrometers, between 0.5 and 50 micrometers, between 0.5 and 30 micrometers, between 0.5 and 20 micrometers, between 0.5 and 10 micrometers, or between 0.5 and 5 micrometers, and preferably between 1 and 3 micrometers. The through via 170*e* in one of the chips 68 exposes the interconnect or metal trace 35*a* in the one of the chips 68 and exposes a region of the conductive layer 18 in the carrier 11 under the one of the chips 68. The interconnect or metal trace 35*a* has a peninsula region, exposed by the through via 170*e*, extending in a horizontal direction from one side of the through via 170*e* at least to a center of the through via 170*e*, but does not reach to the opposite side of the through via 170*e*; the interconnect or metal trace 35*a* has an end exposed by the through via 170*e*. The supporter 801, between the conductive layer 18 of the carrier 11 and the exposed peninsula region of the interconnect or metal trace 35*a* in the interconnection layer 34, can be peninsula-shaped, like the exposed peninsula region of the interconnect or metal trace 35*a*.

Figure 275E:
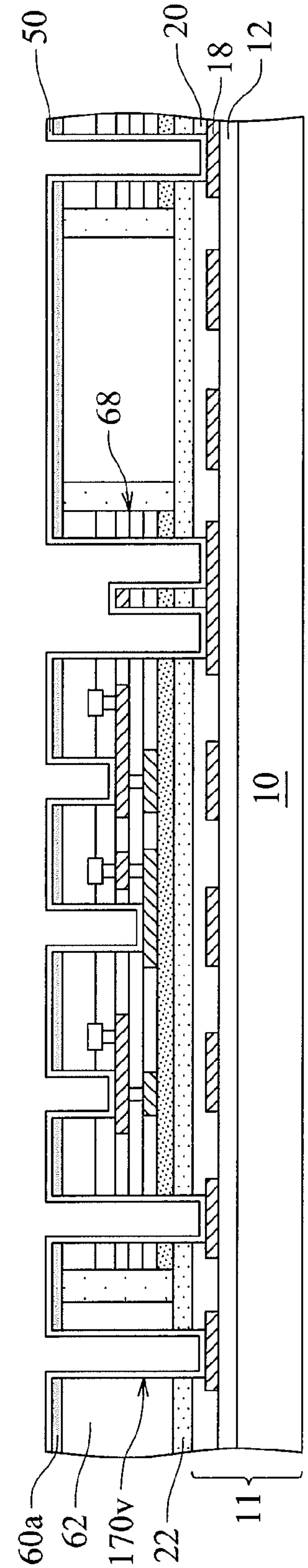

Next, referring to FIG. 275E, the dielectric layer 50 illustrated in FIG. 19 is formed on a top surface of the insulating layer 60*a*, on the conductive layer 18, exposed by the through vias 170*v* (such as the vias 170*a*, 170*b* and 170*e*), of the carrier 11, on the layers 26 and 34, exposed by the through vias 170*v* (such as the vias 170*c*, 170*d*, 170*e* and 170*f*), of the chips 68, and on sidewalls of the through vias 170*v*.

Figure 275F:
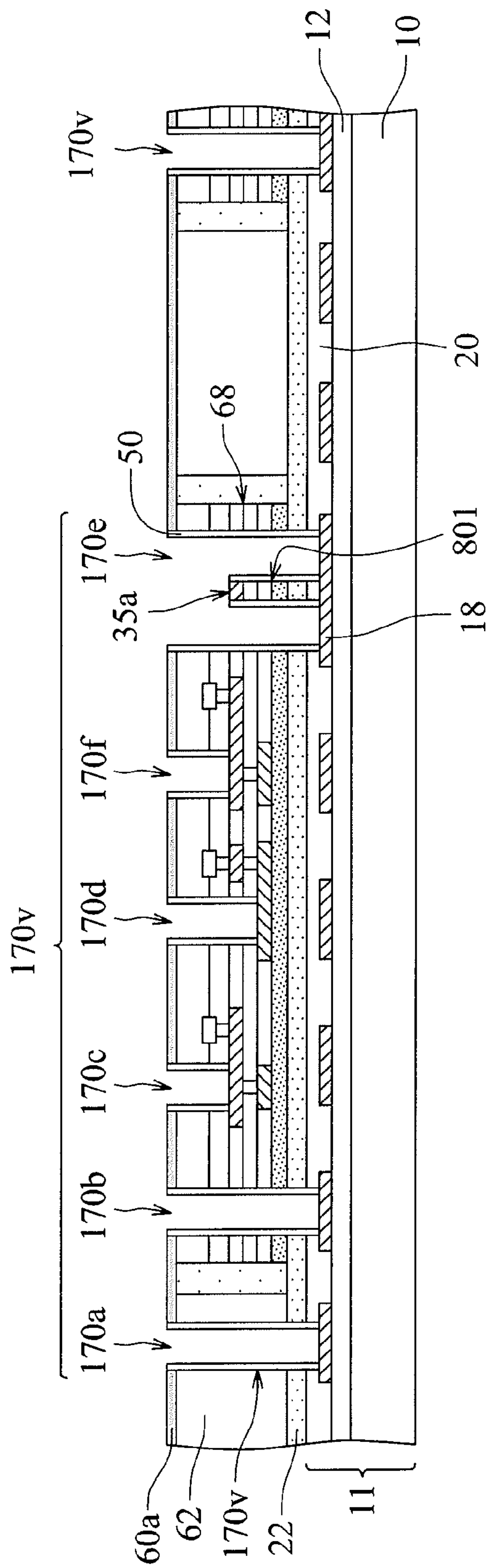
Figure 275H:
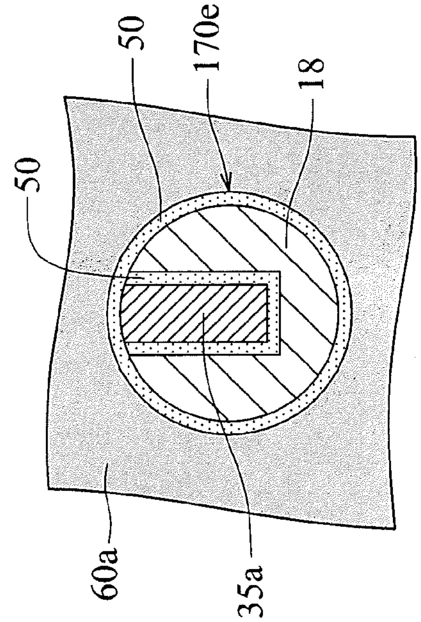
Figure 275G:
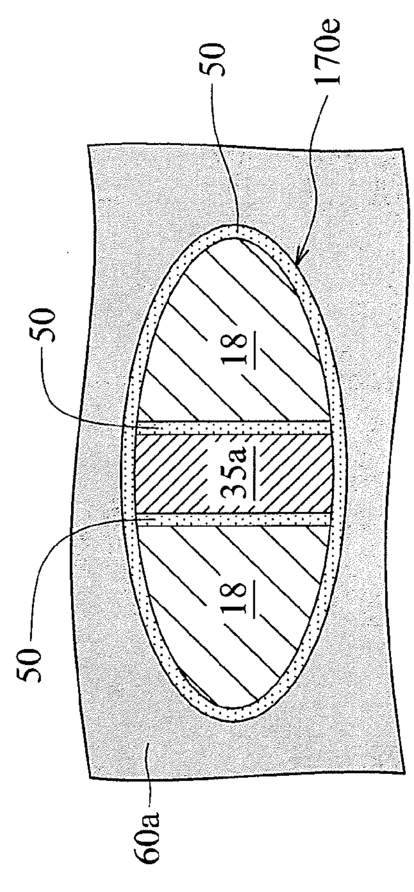

Next, referring to FIG. 275F, the dielectric layer 50 formed on the top surface of the insulating layer 60*a* and on the layers 18, 26 and 34 is removed by using a suitable process, such as anisotropic plasma etching process. Accordingly, the dielectric layer 50 at bottoms of the through vias 170*v*, on the top surface of the insulating layer 60*a*, and on a top surface of the interconnect or metal trace 35*a* on the supporter 801 is etched away, and the dielectric layer 50 remains on the sidewalls of the through vias 170*v*, so called as sidewall dielectric layers in the through vias 170*v*. The sidewall dielectric layers 50 are formed on the sidewalls of the through vias 170*v* in the chips 68 or in the dummy substrate(s) 62 and are enclosed by the semiconductor substrates 58 of the chips 68 or by the dummy substrate(s) 62. FIGS. 275G and 275H are two examples of schematic top views showing the through via 170*e*, the sidewall dielectric layer 50 on the sidewall of the through via 170*e* and on sidewalls of the supporter 801, and the interconnect or metal trace 35*a* shown in FIG. 275F.

Figure 275I:
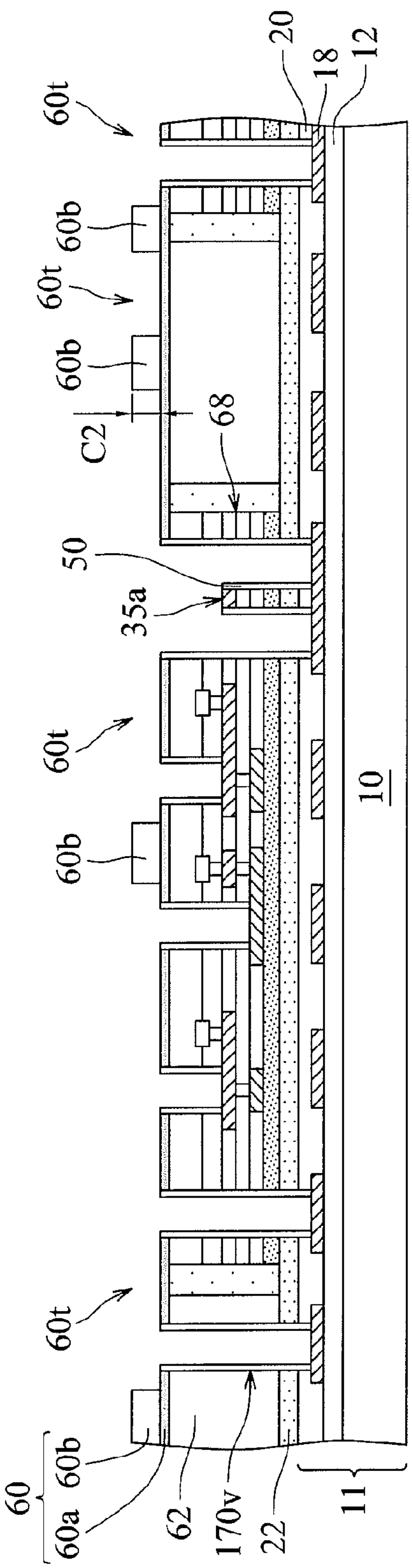
Figure 275J:
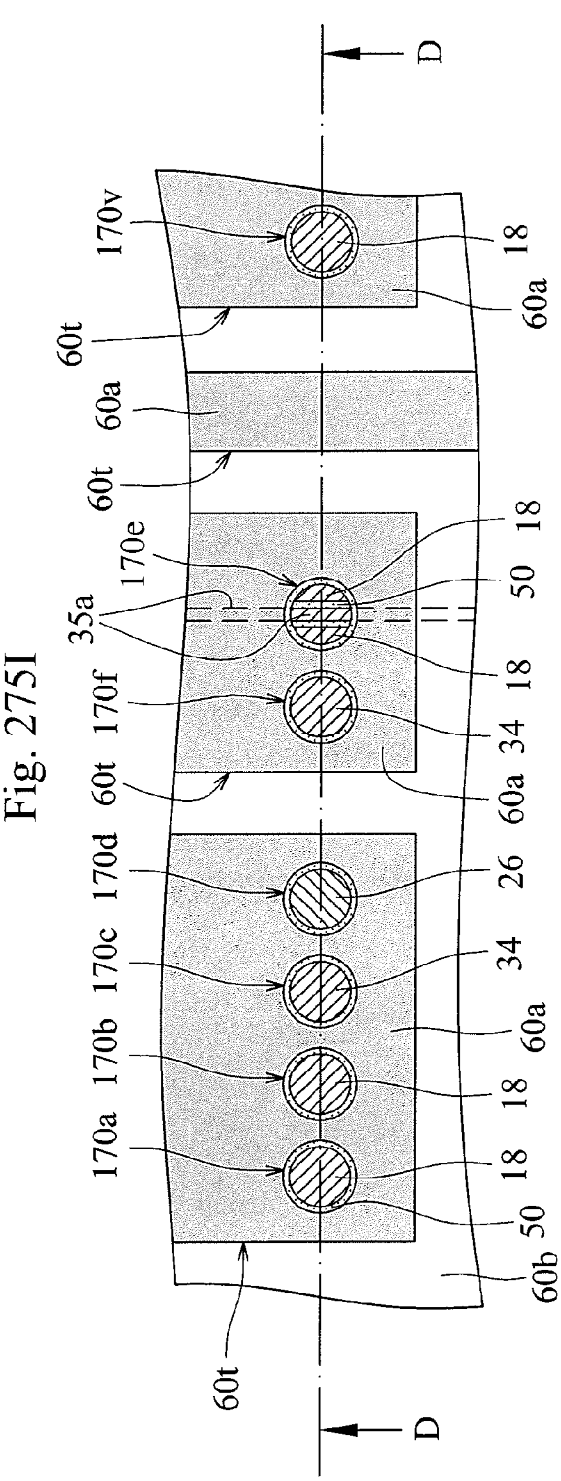

Next, referring to FIG. 275I, a polymer layer 60*b*, such as a layer of polyimide, benzocyclobutene (BCB), epoxy, polybenzoxazole (PBO), or poly-phenylene oxide (PPO), is formed on the insulating layer 60*a* using a suitable process, such as spin coating process, screen printing process, or lamination process. Next, an exposure process and a development process can be employed to form multiple trenches 60*t*, exposing the insulating layer 60*a*, the through vias 170*v* and the layers 18, 26 and 34 exposed by the through vias 170*v*, in the polymer layer 60*b*. A 1X stepper or 1X contact aligner can be used to expose the polymer layer 60*b* during the exposure process. Next, the polymer layer 60*b* is cured or heated at a temperature between 150 degrees centigrade and 400 degrees centigrade, and preferably between 180 degrees centigrade and 250 degrees centigrade. The polymer layer 60*b* after being cured or heated has a thickness C2, e.g., between 1 and 50 micrometers, and preferably between 2 and 30 micrometers or between 5 and 25 micrometers. FIG. 275J is a schematic top perspective view showing the trenches 60*t*, the sidewall dielectric layers 50 and the through vias 170*v* (including the vias 170*a*-170*f*) shown in FIG. 275I according an embodiment of the present invention, and FIG. 275I is a cross-sectional view cut along the line D-D shown in FIG. 275J.

Accordingly, using the above-mentioned steps, the above-mentioned dielectric layer 60 also can be provided with the insulating layer 60*a* and the polymer layer 60*b* on the insulating layer 60*a*. The trenches 60*t* in the polymer layer 60*b* are used to provide spaces having inter-chip interconnects and intra-chip interconnects formed therein. The through vias 170*v* are formed under the trenches 60*t*.

Figure 275K:
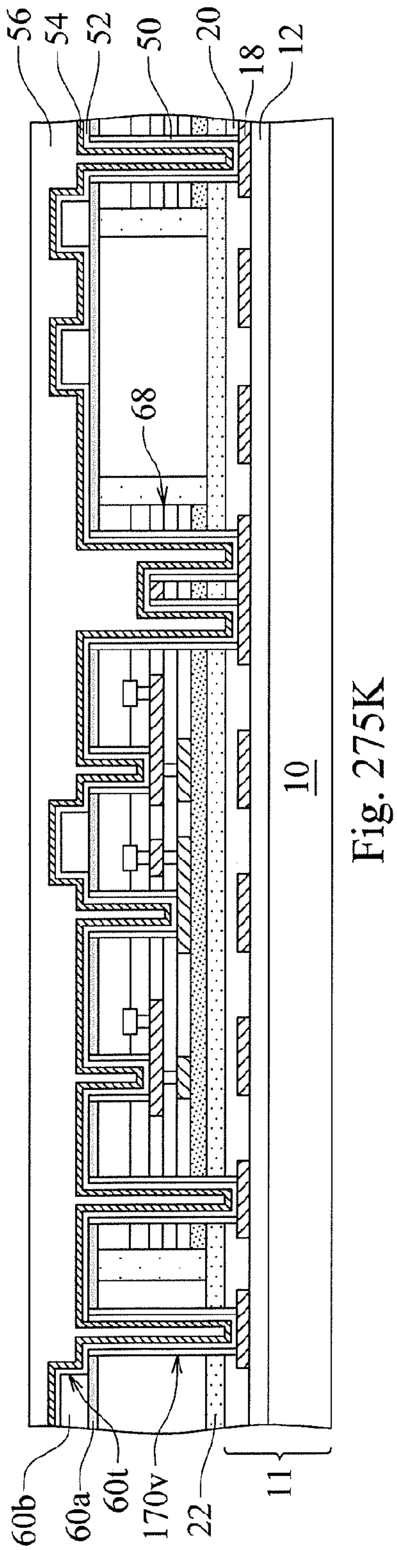

Next, referring to FIG. 275K, an adhesion/barrier layer 52 having a thickness smaller than 1 micrometer, such as between 1 nanometer and 0.5 micrometers, and preferably between 0.1 and 0.2 micrometers, is formed on the layers 18, 26 and 34 exposed by the through vias 170*v*, on the sidewalls of the through vias 170*v*, on a top surface of the polymer layer 60*b*, on sidewalls of the trenches 60*t* in the polymer layer 60*b*, on the top surface of the insulating layer 60*a* at the bottoms of the trenches 60*t*, and on the interconnect or metal trace 35*a* that is on the supporter 801. The adhesion/barrier layer 52 can be formed by a physical vapor deposition (PVD) process, such as sputtering process or evaporation process, by a chemical-vapor deposition (CVD) process, or by other thin-film deposition processes, such as atomic layer deposition (ALD). Next, a seed layer 54 having a thickness smaller than 1 micrometer, such as between 10 nanometers and 0.8 micrometers, and preferably between 80 nanometers and 0.15 micrometers, is formed on the adhesion/barrier layer 52 by a physical vapor deposition (PVD) process, such as sputtering process or evaporation process, by a chemical-vapor deposition (CVD) process, or by other thin-film deposition processes, such as atomic layer deposition (ALD). Next, a conduction layer 56 is formed on the seed layer 54 using a suitable process, such as electroplating process.

The adhesion/barrier layer 52 may include or can be a layer of titanium, a titanium-tungsten alloy, titanium nitride, chromium, tantalum, tantalum nitride, nickel, or nickel vanadium having a thickness, e.g., smaller than 1 micrometer, such as between 1 nanometer and 0.5 micrometers, and preferably between 0.1 and 0.2 micrometers. The seed layer 54 may include or can be a layer of copper, a titanium-copper alloy, nickel, gold, or silver having a thickness, e.g., smaller than 1 micrometer, such as between 10 nanometers and 0.8 micrometers, and preferably between 80 nanometers and 0.15 micrometers, on the adhesion/barrier layer 52. The conduction layer 56 may include or can be an electroplated metal layer of copper, gold, or silver on the seed layer 54.

Figure 275L:
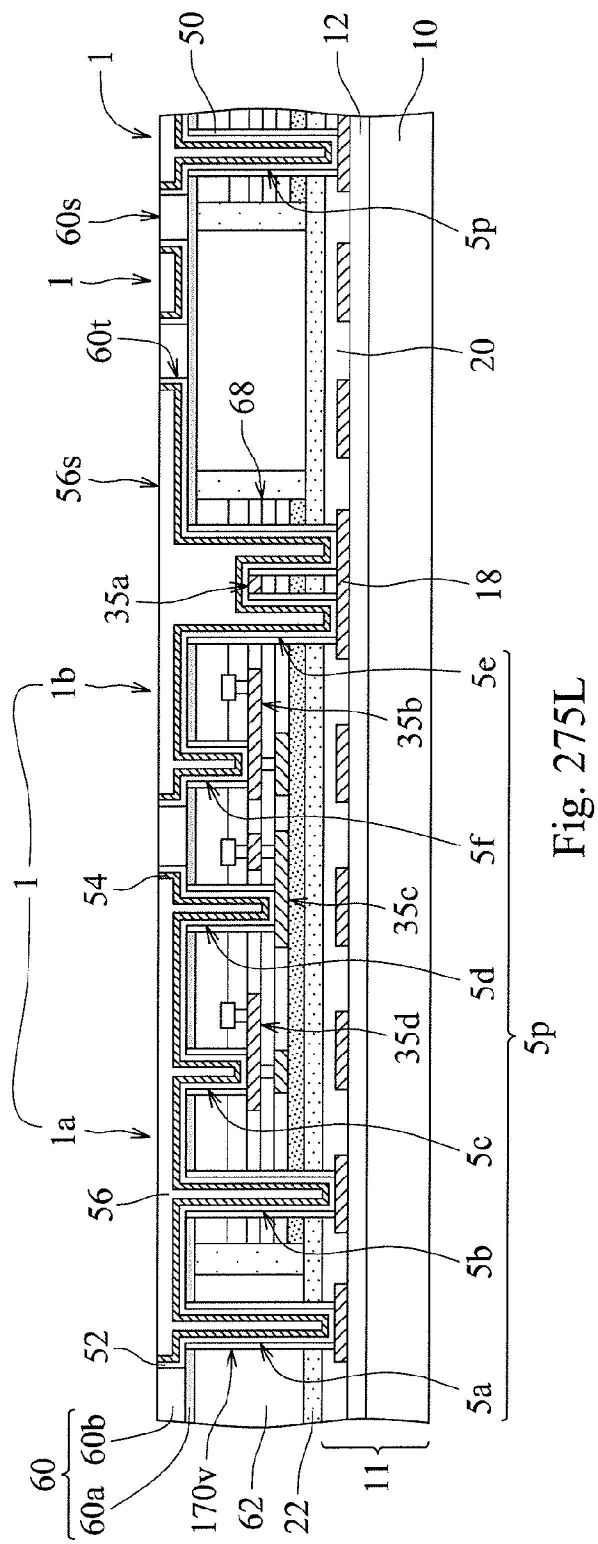

Next, referring to FIG. 275L, the layers 52, 54 and 56 are ground or polished by using a suitable process, such as chemical-mechanical-polishing (CMP) process, mechanical polishing process, mechanical grinding process, or a process including mechanical polishing and chemical etching, until the polymer layer 60*b* of the dielectric layer 60 has an exposed top surface 60*s*, over which there are no portions of the layers 52, 54 and 56, and the layers 52, 54 and 56 outside the trenches 60*t* are removed.

Accordingly, the exposed top surface 60*s* of the polymer layer 60*b* can be substantially coplanar with the ground or polished surface 56*s* of the conduction layer 56 in the trenches 60*t*, and the surfaces 56*s* and 60*s* can be substantially flat. The adhesion/barrier layer 52 and the seed layer 54 are at sidewalls and a bottom of the conduction layer 56 in the trenches 60*t*, and the sidewalls and the bottom of the conduction layer 56 in the trenches 60*t* are covered by the adhesion/barrier layer 52 and the seed layer 54. After the layers 52, 54 and 56 are ground or polished, the polymer layer 60*b* of the dielectric layer 60 has a thickness, between the exposed top surface 60*s* of the polymer layer 60*b* and the top surface of the insulating layer 60*a*, e.g., between 1 and 50 micrometers, and preferably between 2 and 30 micrometers or between 5 and 25 micrometers.

In a first alternative, after the layers 52, 54 and 56 are ground or polished, the adhesion/barrier layer 52 can be a titanium-containing layer, such as a single layer of titanium, titanium-tungsten alloy, or titanium nitride, with a thickness smaller than 1 micrometer, such as between 1 nanometer and 0.5 micrometers, and preferably between 0.1 and 0.2 micrometers, on the sidewalls of the trenches 60*t* in the polymer layer 60*b*, on the top surface of the insulating layer 60*a* at the bottoms of the trenches 60*t*, on the sidewalls of the through vias 170*v*, on the layers 18, 26 and 34 at the bottoms of the through vias 170*v*, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the titanium-containing layer, in the trenches 60*t*, and in the through vias 170*v*. The conduction layer 56 can be an electroplated copper layer on the single layer of copper or a titanium-copper alloy, in the trenches 60*t*, and in the through vias 170*v*. The electroplated copper layer in the trenches 60*t* has a thickness, e.g., between 1 and 50 micrometers, and preferably between 2 and 30 micrometers or between 5 and 25 micrometers.

In a second alternative, after the layers 52, 54 and 56 are ground or polished, the adhesion/barrier layer 52 can be a tantalum-containing layer, such as a single layer of tantalum or tantalum nitride, with a thickness smaller than 1 micrometer, such as between 1 nanometer and 0.5 micrometers, and preferably between 0.1 and 0.2 micrometers, on the sidewalls of the trenches 60*t* in the polymer layer 60*b*, on the top surface of the insulating layer 60*a* at the bottoms of the trenches 60*t*, on the sidewalls of the through vias 170*v*, on the layers 18, 26 and 34 at the bottoms of the through vias 170*v*, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the tantalum-containing layer, in the trenches 60*t*, and in the through vias 170*v*. The conduction layer 56 can be an electroplated copper layer on the single layer of copper or a titanium-copper alloy, in the trenches 60*t*, and in the through vias 170*v*. The electroplated copper layer in the trenches 60*t* has a thickness, e.g., between 1 and 50 micrometers, and preferably between 2 and 30 micrometers or between 5 and 25 micrometers.

In a third alternative, after the layers 52, 54 and 56 are ground or polished, the adhesion/barrier layer 52 can be a chromium-containing layer, such as a single layer of chromium, with a thickness smaller than 1 micrometer, such as between 1 nanometer and 0.5 micrometers, and preferably between 0.1 and 0.2 micrometers, on the sidewalls of the trenches 60*t* in the polymer layer 60*b*, on the top surface of the insulating layer 60*a* at the bottoms of the trenches 60*t*, on the sidewalls of the through vias 170*v*, on the layers 18, 26 and 34 at the bottoms of the through vias 170*v*, and on the interconnect or metal trace 35*a* that is on the supporter 801. The seed layer 54 can be a single layer of copper or a titanium-copper alloy with a thickness smaller than 1 micrometer, such as between 10 nanometers and 0.8 micrometers, and preferably between 80 nanometers and 0.15 micrometers, on the chromium-containing layer, in the trenches 60*t*, and in the through vias 170*v*. The conduction layer 56 can be an electroplated copper layer on the single layer of copper or a titanium-copper alloy, in the trenches 60*t*, and in the through vias 170*v*. The electroplated copper layer in the trenches 60*t* has a thickness, e.g., between 1 and 50 micrometers, and preferably between 2 and 30 micrometers or between 5 and 25 micrometers.

After the layers 52, 54 and 56 are ground or polished, the layers 52, 54 and 56 in the trenches 60*t* compose multiple metal interconnects (or damascene metal traces) 1, including metal interconnects (or damascene metal traces) 1*a* and 1*b*, in the trenches 60*t*. The layers 52, 54 and 56 in the through vias 170*v* compose multiple metal plugs (or metal vias) 5*p* in the through vias 170*v*, including metal plugs (or metal vias) 5*a*, 5*b*, 5*c*, 5*d*, 5*e* and 5*f* in the through vias 170*a*, 170*b*, 170*c*, 170*d*, 170*e* and 170*f*, respectively. Each of the metal plugs 5*p* in the chips 68 and in the dummy substrate(s) 62 is enclosed by one of the sidewall dielectric layers 50 in the through vias 170*v*. The metal plug 5*a* is formed in the dummy substrate 62, and the metal plugs 5*b*, 5*c*, 5*d*, 5*e* and 5*f* are formed in the same chip 68. The supporter 801 and the interconnect or metal trace 35*a*, in the interconnection layer 34, on the supporter 801 can be between two portions, lower than a horizontal level, at which a top surface of the interconnection layer 34 is positioned, of the metal plug 5*e*. These metal plugs 5*p* formed in the chips 68 and in the dummy substrate(s) 62 can connect the metal interconnects 1 and the semiconductor devices 36 in the chips 68 and connect the metal interconnects 1 and multiple contact points of the conductive layer 18 in the carrier 11. The metal interconnects 1, such as 1*a* and 1*b*, in the trenches 60*t* may have a thickness, e.g., between 0.1 and 5 micrometers, and preferably between 1 and 3 micrometers. For more detailed description about the metal plugs 5*p* (including the metal plugs 5*a*-5*f*) and the metal interconnects 1 (including the metal interconnects 1*a* and 1*b*) shown in FIG. 275L, please refer to the illustration in FIG. 26.

Alternatively, the element 68 not only can indicate a chip, but also can indicate a wafer. When the element 68 is a wafer, the carrier 11 can be another wafer. Thereby, the process illustrated in the invention can be employed to the wafer-to-wafer bonding.

After forming the structure illustrated in FIG. 275L, the steps illustrated in FIGS. 27-88 can be performed to form the system-in package or multichip module 555, 555*b*, or 555*c*.

In FIG. 82, 83, 84, 85, 87, 88, 103, 104, 105, 106, 108, 109, 128, 129, 130, 131, 132, 136, 137, 138, 139, 181, 140, 182,

183, 184, 185, 207, 208, 209, 250, 210, 211, 251, 252, 253, 254, 270, 271, 272, 273, or 274, any one of the chips 68 may have a different circuit design from that of any one of the chips 72 and 118 and may have a different area (top surface) or size from that of any one of the chips 72 and 118, and any one of the chips 72 may have a different circuit design from that of any one of the chips 118 and may have a different area (top surface) or size from that of any one of the chips 118. Alternatively, the chip 72 including the metal plug 6*d* may have a different circuit design or a different area (top surface) or size from that of the chip 118 including the metal plug 7*e* and may have a same circuit design or a same area (top surface) or size as that of the chip 118 including the metal plug 7*d*, and the chip 72 including the metal plug 6*c* may have a same circuit design or a same area (top surface) or size as that of the chip 72 including the metal plug 6*d* or may have a different circuit design or a different area (top surface) or size from that of the chip 72 including the metal plug 6*d*.

Regarding to the previously described system-in package or multichip module 555, 555*b*, 555*c*, 555*e*, 555*g*, 555*h*, 555*j*, 555*m*, 555*n*, 555*o*, 555*q*, 555*r*, 555*s*, 555*u*, 555*v*, 555*w*, 555*y*, 555*z*, 556*a*, 556*c*, 556*d*, 556*e*, 556*g*, or 556*h*, no matter where the chips 68, 72 and 118 are provided, each of the chips 68, 72 and 118 can be a central-processing-unit (CPU) chip designed by x86 architecture, a central-processing-unit (CPU) chip designed by non x86 architectures, such as ARM, Strong ARM or MIPs, a graphics-processing-unit (GPU) chip, a digital-signal-processing (DSP) chip, a baseband chip, a wireless local area network (WLAN) chip, a memory chip, such as flash memory chip, dynamic-random-access-memory (DRAM) chip or static-random-access-memory (SRAM) chip, a logic chip, an analog chip, a power device, a regulator, a power management device, a global-positioning-system (GPS) chip, a "Bluetooth" chip, a system-on chip (SOC) including a graphics-processing-unit (GPU) circuit block, a wireless local area network (WLAN) circuit block and a central-processing-unit (CPU) circuit block designed by x86 architecture or by non x86 architectures, a system-on chip (SOC) including a baseband circuit block, a wireless local area network (WLAN) circuit block and a central-processing-unit (CPU) circuit block designed by x86 architecture or by non x86 architectures, a system-on chip (SOC) including a baseband circuit block, a graphics-processing-unit (GPU) circuit block and a central-processing-unit (CPU) circuit block designed by x86 architecture or by non x86 architectures, or a system-on chip (SOC) including a central-processing-unit (CPU) circuit block, a graphics-processing-unit (GPU) circuit block, and a memory circuit block (such as flash memory circuit block, dynamic-random-access-memory (DRAM) circuit block, or static-random-access-memory (SRAM) circuit block). Alternatively, each of the chips 68, 72 and 118 can be a chip including one or more of a central-processing-unit (CPU) circuit block, a graphics-processing-unit (GPU) circuit block, a digital-signal-processing (DSP) circuit block, a memory circuit block (such as dynamic-random-access-memory (DRAM) circuit block, static-random-access-memory (SRAM) circuit block, or flash memory circuit block), a baseband circuit block, a Bluetooth circuit block, a global-positioning-system (GPS) circuit block, a wireless local area network (WLAN) circuit block, and a modem circuit block.

Regarding to the previously described system-in package or multichip module 555, 555*b*, 555*c*, 555*e*, 555*g*, 555*h*, 555*j*, 555*m*, 555*n*, 555*o*, 555*q*, 555*r*, 555*s*, 555*u*, 555*v*, 555*w*, 555*y*, 555*z*, 556*a*, 556*c*, 556*d*, 556*e*, 556*g*, or 556*h*, each of the chips 68, 72 and 118 may include loading input/output (I/O) circuits serving for chip probing testing (CP testing), for built-in-self testing, or for external signal transmission through the solder bumps or balls 126, through the metal bumps 668, or through the wirebonded wires 184. Each of the loading input/output (I/O) circuits may have a total loading (total capacitance) greater than 10 pF (pico farad), such as between 15 pF and 50 pF. Each of the chips 68, 72 and 118 may further include small loading input/output (I/O) circuits each having a total loading (total capacitance) between 0.1 pF and 10 pF, and preferably between 0.1 pF and 2 pF.

For example, each of the chips 68 may include some of the small loading input/output (I/O) circuits serving for intra-chip signal connection, having a data bit width between 32 and 2,048, between 128 and 2,048, between 256 and 1,024, between 512 and 1,024, or equal to or more than 128, to be connected to another one of the chips 68 through the metal plugs 5*p* and through the metal interconnects 1, may include some of the small loading input/output (I/O) circuits serving for inter-chip signal connection, having a data bit width between 32 and 2,048, between 128 and 2,048, between 256 and 1,024, between 512 and 1,024, or equal to or more than 128, to be connected to one or more of the chips 72 through the metal plugs 5*p* and 6*p* and through the metal interconnects 1 and 2, and may include some of the small loading input/output (I/O) circuits serving for inter-chip signal connection, having a data bit width between 32 and 2,048, between 128 and 2,048, between 256 and 1,024, between 512 and 1,024, or equal to or more than 128, to be connected to one of the chips 118 through the metal plugs 5*p*, 6*p* and 7*p* and through the metal interconnects 1, 2 and 3. Each of the chips 72 may include some of the small loading input/output (I/O) circuits serving for intra-chip signal connection, having a data bit width between 32 and 2,048, between 128 and 2,048, between 256 and 1,024, between 512 and 1,024, or equal to or more than 128, to be connected to another one of the chips 72 through the metal plugs 6*p* and through the metal interconnects 2, and may include some of the small loading input/output (I/O) circuits serving for inter-chip signal connection, having a data bit width between 32 and 2,048, between 128 and 2,048, between 256 and 1,024, between 512 and 1,024, or equal to or more than 128, to be connected to one of the chips 118 through the metal plugs 6*p* and 7*p* and through the metal interconnects 2 and 3. Each of the chips 118 may include some of the small loading input/output (I/O) circuits serving for intra-chip signal connection, having a data bit width between 32 and 2,048, between 128 and 2,048, between 256 and 1,024, between 512 and 1,024, or equal to or more than 128, to be connected to another one of the chips 118 through the metal plugs 7*p* and through the metal interconnects 3.

Regarding to the previously described system-in package or multichip module 555, 555*b*, 555*c*, 555*e*, 555*g*, 555*h*, 555*j*, 555*m*, 555*n*, 555*o*, 555*q*, 555*r*, 555*s*, 555*u*, 555*v*, 555*w*, 555*y*, 555*z*, 556*a*, 556*c*, 556*d*, 556*e*, 556*g*, or 556*h*, the chips 68 can be connected to multiple metal interconnects of the conductive layer 18 of the carrier 11 through the metal interconnects 1 (such as the metal interconnects 1*a* and 1*b*) and through the metal plugs 5*p*, can be connected to the chips 72 through the metal plugs 5*p* and 6*p*, through the metal interconnects 1 (such as the metal interconnects 1*a* and 1*b*), and through the metal interconnects 2 (such as the metal interconnects 2*a* and 2*b*), and can be connected to the chips 118 through the metal plugs 5*p*, 6*p* and 7*p*, through the metal interconnects 1 (such as the metal interconnects 1*a* and 1*b*), through the metal interconnects 2 (such as the metal interconnects 2*a* and 2*b*), and through the metal interconnects 3 (such as the metal interconnects 3*a* and 3*c*). The chips 72 can be connected to the metal interconnects of the conductive layer 18 of the carrier 11 through the metal interconnects 2 (such as the metal interconnects 2*a* and 2*b*), through the metal interconnects 1 (such as the metal interconnects 1*a* and 1*b*), and through the metal plugs 5*p* and 6*p*, and can be connected to the chips 118 through the metal plugs 6*p* and 7*p*, through the metal interconnects 2 (such as the metal interconnects 2*a* and 2*b*), and through the metal interconnects 3 (such as the metal interconnects 3*a* and 3*c*). The chips 118 can be connected to the metal interconnects of the conductive layer 18 of the carrier 11 through the metal interconnects 3 (such as the metal interconnects 3*a* and 3*c*), through the metal interconnects 2 (such as the metal interconnects 2*a* and 2*b*), through the metal interconnects 1 (such as the metal interconnects 1*a* and 1*b*), and through the metal plugs 5*p*, 6*p* and 7*p*.

Figure 276:
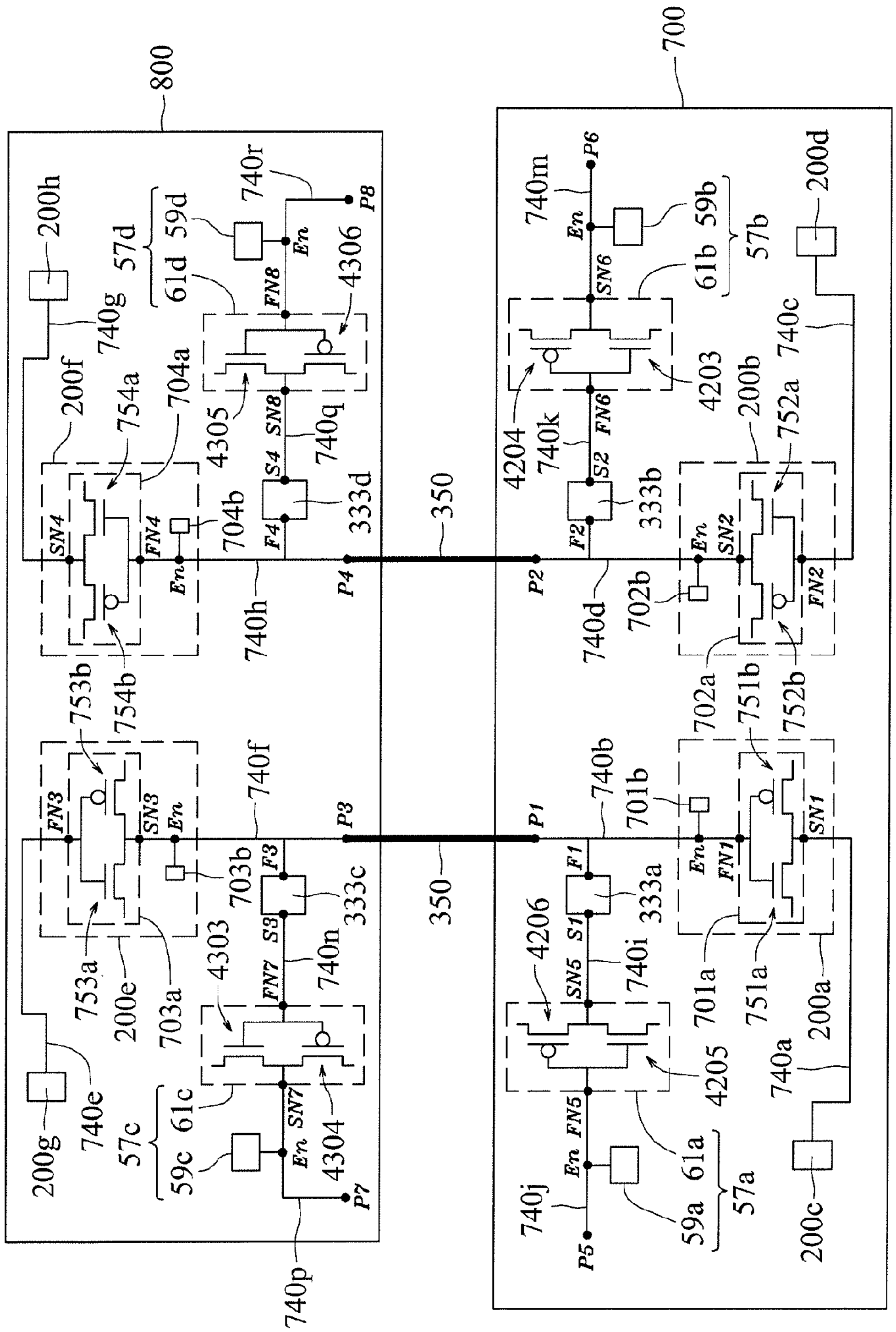
FIGS. 276 and 285 are circuit diagrams each showing interface circuits between two chips according to an embodiment of the present disclosure.

FIG. 276 is an example of a circuit diagram showing interface circuits between two chips. The circuits 700 and 800 can be provided in any two of the previously described chips 68, 72 and 118 of the previously described system-in package or multichip module illustrated in FIG. 82, 83, 84, 85, 87, 88, 103, 104, 105, 106, 108, 109, 128, 129, 130, 131, 132, 136, 137, 138, 139, 181, 140, 182, 183, 184, 185, 207, 208, 209, 250, 210, 211, 251, 252, 253, 254, 270, 271, 272, 273, or 274. The circuits 700 include contact points P1 and P2 connected to contact points P3 and P4 of the circuits 800 through metal interconnects 350 that are not connected to any external circuit of the system-in package or multichip module, such as the previously described carrier 176. The circuits 700 further include contact points P5 and P6 serving for chip probing testing (CP testing), for built-in-self testing, or for external signal connection. The circuits 800 further include contact points P7 and P8 serving for chip probing testing (CP testing), for built-in-self testing, or for external signal connection. Alternatively, the contact points P5 and P6 of the circuits 700 and the contact points P7 and P8 of the circuits 800 can be connected to an external circuit of the system-in package or multichip module, such as mother board, metal substrate, glass substrate, ceramic substrate or the previously described carrier 176, through the previously described solder bumps or balls 126, through the previously described metal bumps 672, or through the previously described wirebonded wires 184.

In a first alternative, the circuits 700 can be provided in one of the chips 68, and the circuits 800 can be provided in another one of the chips 68. In this case, the two contact points P1 and P2 of the circuits 700 are two contact points, at bottoms of two of the through vias 170*v* in the one of the chips 68, of the layers 26 and/or 34 of the one of the chips 68, in which the two contact points are not connected to any external circuit of the system-in package or multichip module, and the two contact points P3 and P4 of the circuits 800 are two contact points, at bottoms of two of the through vias 170*v* in the another one of the chips 68, of the layers 26 and/or 34 of the another one of the chips 68, in which the two contact points are not connected to any external circuit of the system-in package or multichip module. The contact point P5 of the circuits 700, for example, can be a contact point, at the bottom of the previously described through via 170*c* or 170*d*, of the interconnect or metal trace 35*d* or 35*c*, connecting to the previously described metal plug 5*c* or 5*d*, and the contact point P6 of the circuits 700 can be a contact point, at the bottom of the previously described through via 170*f*, of the interconnect or metal trace 35*b*, connecting to the previously described metal plug 5*f*. Alternatively, the contact point P5 of the circuits 700 can be a contact point, at the bottom of the previously described through via 170*c* or 170*d*, of the interconnect or metal trace 35*d* or 35*c*, connecting to the previously described metal plug 5*c* or 5*d*, and the contact point P6 of the circuits 700 can be a contact point of the interconnect or metal trace 35*a* on the previously described supporter 801, connecting to the previously described metal plug 5*e*. Alternatively, the contact point P5 of the circuits 700 can be a contact point of the interconnect or metal trace 35*a* on the previously described supporter 801, connecting to the previously described metal plug 5*e*, and the contact point P6 of the circuits 700 can be a contact point, at the bottom of the previously described through via 170*c* or 170*d*, of the interconnect or metal trace 35*d* or 35*c*, connecting to the previously described metal plug 5*c* or 5*d*. The metal interconnect 350 connecting the contact point P1 of the circuits 700 and the contact point P3 of the circuits 800 includes one of the metal plugs 5*p* in the one of the chips 68, one of the metal plugs 5*p* in the another one of the chips 68, and one of the metal interconnects 1. The metal interconnect 350 connecting the contact point P2 of the circuits 700 and the contact point P4 of the circuits 800 includes another one of the metal plugs 5*p* in the one of the chips 68, another one of the metal plugs 5*p* in the another one of the chips 68, and another one of the metal interconnects 1.

In a second alternative, the circuits 700 can be provided in one of the chips 68, and the circuits 800 can be provided in one of the chips 72. In this case, the two contact points P1 and P2 of the circuits 700 can be supposed to be two contact points, at bottoms of two of the through vias 170*v* in the one of the chips 68, of the layers 26 and/or 34 of the one of the chips 68, in which the two contact points are not connected to any external circuit of the system-in package or multichip module, and the two contact points P3 and P4 of the circuits 800 can be supposed to be two contact points, at bottoms of two of the through vias 164*v* in the one of the chips 72, of the layers 106 and/or 114 of the one of the chips 72, in which the two contact points are not connected to any external circuit of the system-in package or multichip module. In this case, the metal interconnect 350 connecting the contact point P1 or P2 of the circuits 700 and the contact point P3 or P4 of the circuits 800 may be a direct path, as indicated by circles with cross lines shown in the following FIG. 297, connecting the contact point P3 or P4 directly downward to the contact point P1 or P2 not through any one of the metal interconnects 2, or an indirect path, connecting the contact point P3 or P4 to the contact point P1 or P2 through one of the metal interconnects 2. The direct path may include an interconnect like the metal plug 6*e* passing completely through the chip 72 having the circuits 800, connecting the contact point P3 or P4 over the supporter 802 to one of the metal interconnects 1 connected to the contact point P1 or P2 through one of the metal plugs 5*p*, like the metal plug 5*c*, 5*d* or 5*f*, passing blindly through the chip 68 having the circuits 700. The indirect path may include one of the interconnects 2 connected to the contact point P3 or P4 through one of the metal plugs 6*p*, like the metal plug 6*c* or 6*d*, passing blindly through the chip 72 having the circuits 800, and one of the interconnects 1 connected to the one of the interconnects 2 through one of the metal plugs 6*p*, like the metal plug 6*a* passing completely through the dummy substrate 165 or like the metal plug 6*b* passing completely through the chip 72 either having the circuits 800 or not having the circuits 800, and connected to the contact point P1 or P2 through one of the metal plugs 5*p*, like the metal plug 5*c*, 5*d* or 5*f*, passing blindly through the chip 68 having the circuits 700.

Besides, in this case, the contact point P5 or P6 of the circuits 700 provided in the one of the chips 68 can be supposed to be a contact point, at the bottom of the previously described through via 170*c*, 170*d* or 170*f*, of the interconnect or metal trace 35*d*, 35*c* or 35*b*, connected to an external circuit of the system-in package or multichip module through one of the metal plugs 5*p*, like the metal plug 5*c*, 5*d* or 5*f*, passing blindly through the chip 68 having the circuits 700, through one of the metal interconnects 1, through one of the metal plugs 6*p*, like the metal plug 6*a* passing completely through the dummy substrate 165 or like the metal plug 6*b* passing completely through one of the chips 72, through one of the metal interconnects 2, through one of the metal plugs 7*p*, like the metal plug 7*a* passing completely through the dummy substrate 158 or like the metal plug 7*b* passing completely through one of the chips 118, through one of the interconnects 3 and through one of the solder bumps or balls 126, the metal bumps 668 or the wirebonded wires 184. The contact point P7 or P8 of the circuits 800 provided in the one of the chips 72 can be supposed to be a contact point, at the bottom of the previously described through via 164*c* or 164*d*, of the interconnect or metal trace 55*c* or 55*b*, connected to an external circuit of the system-in package or multichip module through one of the metal plugs 6*p*, like the metal plug 6*c* or 6*d*, passing blindly through the chip 72 having the circuits 800, through one of the metal interconnects 2, through one of the metal plugs 7*p*, like the metal plug 7*a* passing completely through the dummy substrate 158 or like the metal plug 7*b* passing completely through one of the chips 118, through one of the interconnects 3 and through one of the solder bumps or balls 126, the metal bumps 668 or the wirebonded wires 184.

In a third alternative, the circuits 700 can be provided in one of the chips 68, and the circuits 800 can be provided in one of the chips 118. In this case, the two contact points P1 and P2 of the circuits 700 are two contact points, at bottoms of two of the through vias 170*v* in the one of the chips 68, of the layers 26 and/or 34 of the one of the chips 68, in which the two contact points are not connected to any external circuit of the system-in package or multichip module, and the two contact points P3 and P4 of the circuits 800 are two contact points, at bottoms of two of the through vias 156*v* in the one of the chips 118, of the layers 17 and/or 19 of the one of the chips 118, in which the two contact points are not connected to any external circuit of the system-in package or multichip module. The contact point P5 of the circuits 700 can be a contact point, at the bottom of the previously described through via 170*c* or 170*d*, of the interconnect or metal trace 35*d* or 35*c*, connecting to the previously described metal plug 5*c* or 5*d*, and the contact point P7 of the circuits 800 can be a contact point of the interconnect or metal trace 75*a* on the previously described supporter 803, connecting to the previously described metal plug 7*e*. Alternatively, the contact point P6 of the circuits 700 can be a contact point of the interconnect or metal trace 35*a* on the previously described supporter 801, connecting to the previously described metal plug 5*e*, and the contact point P8 of the circuits 800 can be a contact point, at the bottom of the previously described through via 156*c*, 156*d* or 156*f*, of the interconnect or metal trace 75*d*, 75*c* or 75*b*, connecting to the previously described metal plug 7*c*, 7*d* or 7*f*. The metal interconnect 350 connecting the contact point P1 of the circuits 700 and the contact point P3 of the circuits 800 includes one of the metal plugs 6*p* passing through one of the chips 72 or the dummy substrate 165 and further includes one of the metal plugs 7*p* passing through the one of the chips 118, the dummy substrate 158 or another one of the chips 118. The metal interconnect 350 connecting the contact point P2 of the circuits 700 and the contact point P4 of the circuits 800 includes another one of the metal plugs 6*p* passing through one of the chips 72 or the dummy substrate 165 and further includes another one of the metal plugs 7*p* passing through the one of the chips 118, the dummy substrate 158 or another one of the chips 118.

In a fourth alternative, the circuits 700 can be provided in one of the chips 72, and the circuits 800 can be provided in another one of the chips 72. In this case, the two contact points P1 and P2 of the circuits 700 are two contact points, at bottoms of two of the through vias 164*v* in the one of the chips 72, of the layers 106 and/or 114 of the one of the chips 72, in which the two contact points are not connected to any external circuit of the system-in package or multichip module, and the two contact points P3 and P4 of the circuits 800 are two contact points, at bottoms of two of the through vias 164*v* in the another one of the chips 72, of the layers 106 and/or 114 of the another one of the chips 72, in which the two contact points are not connected to any external circuit of the system-in package or multichip module. The contact point P5 of the circuits 700 can be a contact point of the interconnect or metal trace 55*a* on the previously described supporter 802, connecting to the previously described metal plug 6*e*, and the contact point P7 of the circuits 800 can be a contact point, at the bottom of the previously described through via 164*c*, of the interconnect or metal trace 55*c*, connecting to the previously described metal plug 6*c*. Alternatively, the contact point P6 of the circuits 700 can be a contact point of the interconnect or metal trace 55*a* on the previously described supporter 802, connecting to the previously described metal plug 6*e*, and the contact point P8 of the circuits 800 can be a contact point, at the bottom of the previously described through via 164*c*, of the interconnect or metal trace 55*c*, connecting to the previously described metal plug 6*c*. The metal interconnect 350 connecting the contact point P1 of the circuits 700 and the contact point P3 of the circuits 800 includes one of the metal plugs 6*p* in the one of the chips 72, one of the metal plugs 6*p* in the another one of the chips 72, and one of the metal interconnects 2. The metal interconnect 350 connecting the contact point P2 of the circuits 700 and the contact point P4 of the circuits 800 includes another one of the metal plugs 6*p* in the one of the chips 72, another one of the metal plugs 6*p* in the another one of the chips 72, and another one of the metal interconnects 2.

In a fifth alternative, the circuits 700 can be provided in one of the chips 72, and the circuits 800 can be provided in one of the chips 118. In this case, the two contact points P1 and P2 of the circuits 700 are two contact points, at bottoms of two of the through vias 164*v* in the one of the chips 72, of the layers 106 and/or 114 of the one of the chips 72, in which the two contact points are not connected to any external circuit of the system-in package or multichip module, and the two contact points P3 and P4 of the circuits 800 are two contact points, at bottoms of two of the through vias 156*v* in the one of the chips 118, of the layers 17 and/or 19 of the one of the chips 118, in which the two contact points are not connected to any external circuit of the system-in package or multichip module. The contact point P5 of the circuits 700 can be a contact point of the interconnect or metal trace 55*a* on the previously described supporter 802, connecting to the previously described metal plug 6*e*, and the contact point P7 of the circuits 800 can be a contact point, at the bottom of the through via 156*c*, 156*d* or 156*f*, of the interconnect or metal trace 75*d*, 75*c* or 75*b*, connecting to the previously described metal plug 7*c*, 7*d* or 7*f*. Alternatively, the contact point P6 of the circuits 700 can be a contact point, at the bottom of the through via 164*c* or 164*d*, of the interconnect or metal trace 55*c* or 55*b*, connecting to the previously described metal plug 6*c* or 6*d*, and the contact point P8 of the circuits 800 can be a contact point of the interconnect or metal trace 75*a* on the previously described supporter 803, connecting to the previously described metal plug 7*e*. The metal interconnect 350 connecting the contact point P1 of the circuits 700 and the contact point P3 of the circuits 800 includes one of the metal plugs 7*p* passing through the one of the chips 118, the dummy substrate 158, or another one of the chips 118. The metal interconnect 350 connecting the contact point P2 of the circuits 700 and the contact point P4 of the circuits 800 includes another one of the metal plugs 7*p* passing through the one of the chips 118, the dummy substrate 158, or another one of the chips 118.

In a sixth alternative, the circuits 700 can be provided in one of the chips 118, and the circuits 800 can be provided in another one of the chips 118. In this case, the two contact points P1 and P2 of the circuits 700 are two contact points, at bottoms of two of the through vias 156*v* in the one of the chips 118, of the layers 17 and/or 19 of the one of the chips 118, in which the two contact points are not connected to any external circuit of the system-in package or multichip module, and the two contact points P3 and P4 of the circuits 800 are two contact points, at bottoms of two of the through vias 156*v* in the another one of the chips 118, of the layers 17 and/or 19 of the another one of the chips 118, in which the two contact points are not connected to any external circuit of the system-in package or multichip module. The contact point P5 of the circuits 700 can be a contact point, at the bottom of the previously described through via 156*c*, of the interconnect or metal trace 75*d*, connecting to the previously described metal plug 7*c*, and the contact point P7 of the circuits 800 can be a contact point of the interconnect or metal trace 75*a* on the previously described supporter 803, connecting to the previously described metal plug 7*e*. Alternatively, the contact point P6 of the circuits 700 can be a contact point, at the bottom of the previously described through via 156*c*, of the interconnect or metal trace 75*d*, connecting to the previously described metal plug 7*c*, and the contact point P8 of the circuits 800 can be a contact point, at the bottom of the previously described through via 156*f*, of the interconnect or metal trace 75*b*, connecting to the previously described metal plug 7*f*. The metal interconnect 350 connecting the contact point P1 of the circuits 700 and the contact point P3 of the circuits 800 includes one of the metal plugs 7*p* in the one of the chips 118, one of the metal plugs 7*p* in the another one of the chips 118, and one of the metal interconnects 3. The metal interconnect 350 connecting the contact point P2 of the circuits 700 and the contact point P4 of the circuits 800 includes another one of the metal plugs 7*p* in the one of the chips 118, another one of the metal plugs 7*p* in the another one of the chips 118, and another one of the metal interconnects 3.

Referring to FIG. 276, the circuits 700 may include two inter-chip circuits 200*a* and 200*b*, two internal circuits 200*c* and 200*d*, two off-chip circuits 57*a* and 57*b*, and two testing interface circuits 333*a* and 333*b*. The circuits 800 may include two inter-chip circuits 200*e* and 200*f*, two internal circuits 200*g* and 200*h*, two off-chip circuits 57*c* and 57*d*, and two testing interface circuits 333*c* and 333*d*.

The inter-chip circuit 200*a* of the circuits 700 may include an inter-chip buffer 701*a* and an inter-chip ESD (electro static discharge) circuit 701*b*. The inter-chip buffer 701*a* has a first node FN1 and a second node SN1, and the inter-chip ESD circuit 701*b* has a node En connected to the first node FN1. The inter-chip buffer 701*a* can be an inter-chip receiver which can be an inverter composed of an NMOS transistor 751*a* and a PMOS transistor 751*b*. The gates of the NMOS transistor 751*a* and the PMOS transistor 751*b* serve as an input node that is the first node FN1 of the inter-chip buffer 701*a*. The drains of the NMOS transistor 751*a* and the PMOS transistor 751*b* serve as an output node that is the second node SN1 of the inter-chip buffer 701*a*.

Figure 277:
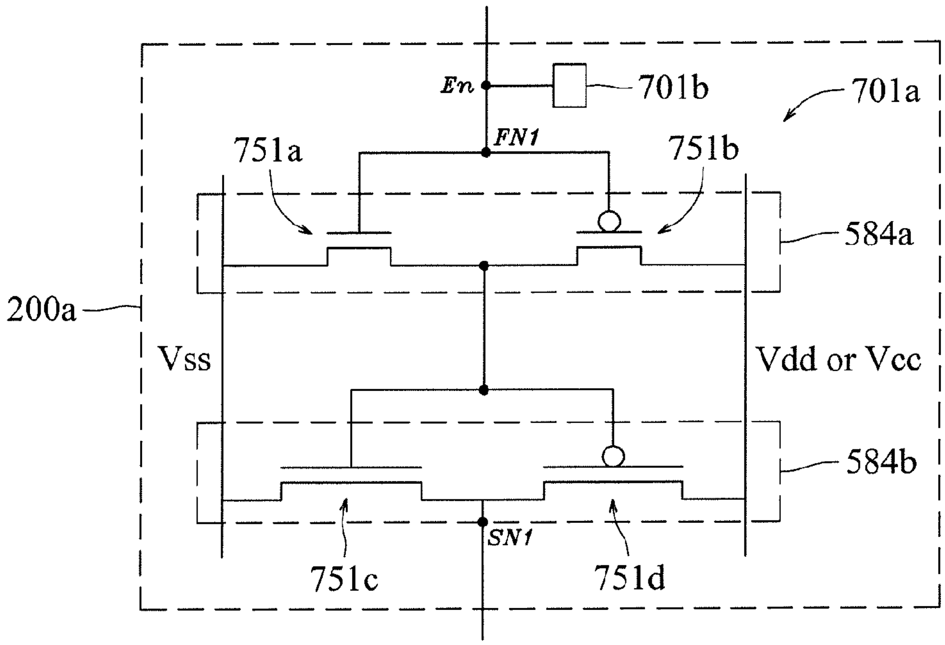
FIGS. 277 and 280 show inter-chip circuits each including a two-stage cascade inter-chip receiver and an inter-chip ESD (electro static discharge) circuit according to an embodiment of the present disclosure.

Alternatively, the inter-chip buffer 701*a* can be a multi-stage cascade inter-chip receiver including several stages of inverters. For example, referring to FIG. 277, the inter-chip buffer 701*a* can be a two-stage cascade inter-chip receiver. The first stage 584*a* of the two-stage cascade inter-chip receiver is an inverter composed of the NMOS transistor 751*a* and the PMOS transistor 751*b*, and the second stage 584*b* (the last stage) of the two-stage cascade inter-chip receiver is an inverter composed of an NMOS transistor 751*c* and a PMOS transistor 751*d*. The size of the NMOS transistor 751*c* is larger than that of the NMOS transistor 751*a*, and the size of the PMOS transistor 751*d* is larger than that of the PMOS transistor 751*b*. The gates of the NMOS transistor 751*a* and the PMOS transistor 751*b* serve as an input node that is the first node FN1 of the inter-chip buffer 701*a*. The drains of the NMOS transistor 751*c* and the PMOS transistor 751*d* serve as an output node that is the second node SN1 of the inter-chip buffer 701*a*. The drains of the NMOS transistor 751*a* and the PMOS transistor 751*b* are connected to the gates of the NMOS transistor 751*c* and the PMOS transistor 751*d*.

Referring to FIG. 276, the inter-chip circuit 200*b* of the circuits 700 may include an inter-chip buffer 702*a* and an inter-chip ESD (electro static discharge) circuit 702*b*. The inter-chip buffer 702*a* has a first node FN2 and a second node SN2, and the inter-chip ESD circuit 702*b* has a node En connected to the second node SN2. The inter-chip buffer 702*a* can be an inter-chip driver which can be an inverter composed of an NMOS transistor 752*a* and a PMOS transistor 752*b*. The gates of the NMOS transistor 752*a* and the PMOS transistor 752*b* serve as an input node that is the first node FN2 of the inter-chip buffer 702*a*. The drains of the NMOS transistor 752*a* and the PMOS transistor 752*b* serve as an output node that is the second node SN2 of the inter-chip buffer 702*a*.

Figure 278:
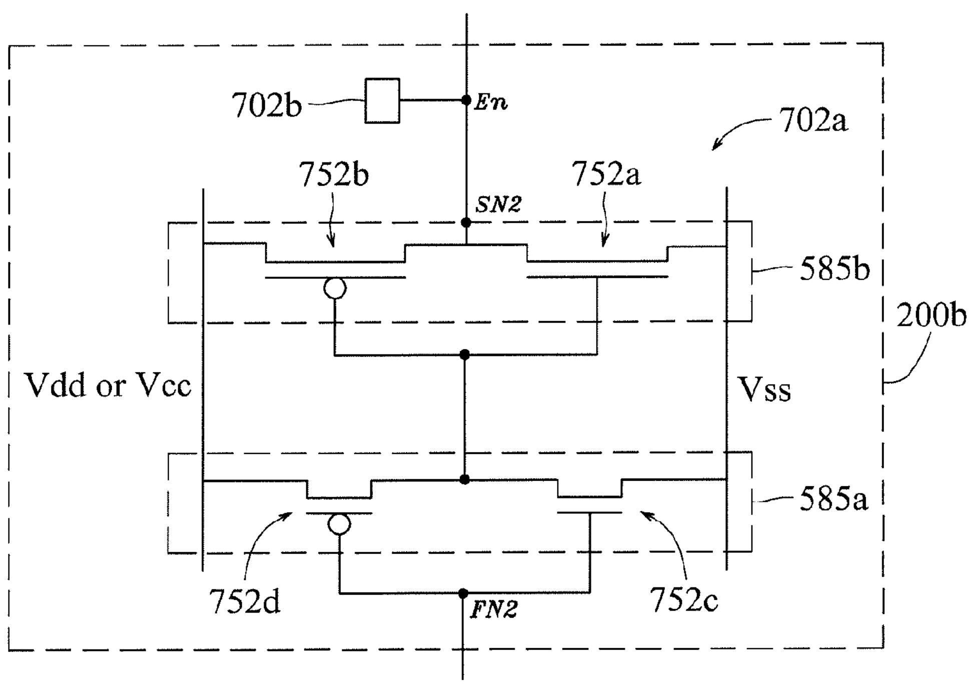
FIGS. 278 and 279 show inter-chip circuits each including a two-stage cascade inter-chip driver and an inter-chip ESD (electro static discharge) circuit according to an embodiment of the present disclosure.

Alternatively, the inter-chip buffer 702*a* can be a multi-stage cascade inter-chip driver including several stages of inverters. For example, referring to FIG. 278, the inter-chip buffer 702*a* can be a two-stage cascade inter-chip driver. The first stage 585*a* of the two-stage cascade inter-chip driver is an inverter composed of an NMOS transistor 752*c* and a PMOS transistor 752*d*, and the second stage 585*b* (the last stage) of the two-stage cascade inter-chip driver is an inverter composed of the NMOS transistor 752*a* and the PMOS transistor 752*b*. The size of the NMOS transistor 752*a* is larger than that of the NMOS transistor 752*c*, and the size of the PMOS transistor 752*b* is larger than that of the PMOS transistor 752*d*. The gates of the NMOS transistor 752*c* and the PMOS transistor 752*d* serve as an input node that is the first node FN2 of the inter-chip buffer 702*a*. The drains of the NMOS transistor 752*a* and the PMOS transistor 752*b* serve as an output node that is the second node SN2 of the inter-chip buffer 702*a*. The drains of the NMOS transistor 752*c* and the PMOS transistor 752*d* are connected to the gates of the NMOS transistor 752*a* and the PMOS transistor 752*b*.

Referring to FIG. 276, the inter-chip circuit 200*e* of the circuits 800 may include an inter-chip buffer 703*a* and an inter-chip ESD (electro static discharge) circuit 703*b*. The inter-chip buffer 703*a* has a first node FN3 and a second node SN3, and the inter-chip ESD circuit 703*b* has a node En connected to the second node SN3. The inter-chip buffer 703*a* can be an inter-chip driver which can be an inverter composed of an NMOS transistor 753*a* and a PMOS transistor 753*b*. The gates of the NMOS transistor 753*a* and the PMOS transistor 753*b* serve as an input node that is the first node FN3 of the inter-chip buffer 703*a*. The drains of the NMOS transistor 753*a* and the PMOS transistor 753*b* serve as an output node that is the second node SN3 of the inter-chip buffer 703*a*.

Figure 279:
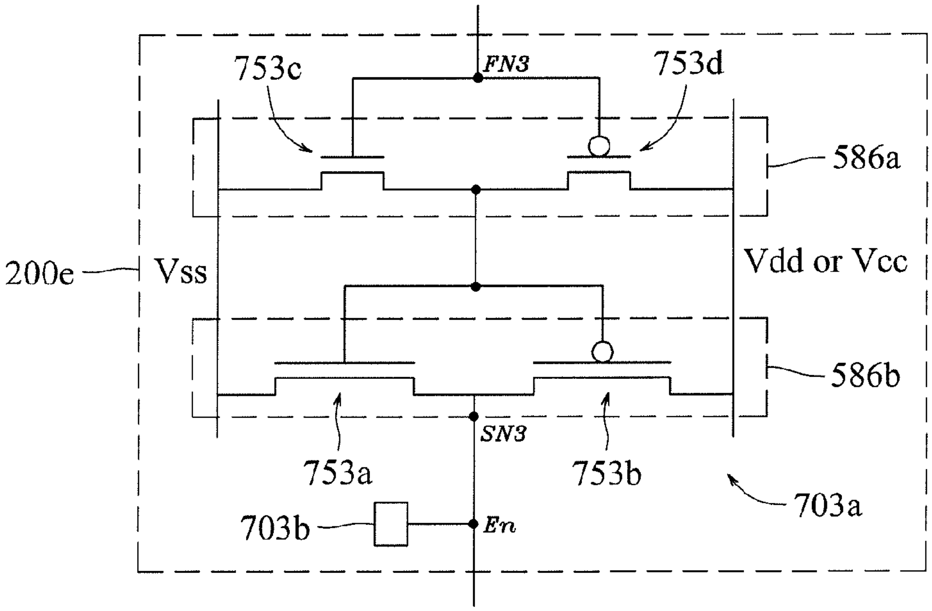

Alternatively, the inter-chip buffer 703*a* can be a multi-stage cascade inter-chip driver including several stages of inverters. For example, referring to FIG. 279, the inter-chip buffer 703*a* can be a two-stage cascade inter-chip driver. The first stage 586*a* of the two-stage cascade inter-chip driver is an inverter composed of an NMOS transistor 753*c* and a PMOS transistor 753*d*, and the second stage 586*b* (the last stage) of the two-stage cascade inter-chip driver is an inverter composed of the NMOS transistor 753*a* and the PMOS transistor 753*b*. The size of the NMOS transistor 753*a* is larger than that of the NMOS transistor 753*c*, and the size of the PMOS transistor 753*b* is larger than that of the PMOS transistor 753*d*. The gates of the NMOS transistor 753*c* and the PMOS transistor 753*d* serve as an input node that is the first node FN3 of the inter-chip buffer 703*a*. The drains of the NMOS transistor 753*a* and the PMOS transistor 753*b* serve as an output node that is the second node SN3 of the inter-chip buffer 703*a*. The drains of the NMOS transistor 753*c* and the PMOS transistor 753*d* are connected to the gates of the NMOS transistor 753*a* and the PMOS transistor 753*b*.

Referring to FIG. 276, the inter-chip circuit 200*f* of the circuits 800 may include an inter-chip buffer 704*a* and an inter-chip ESD (electro static discharge) circuit 704*b*. The inter-chip buffer 704*a* has a first node FN4 and a second node SN4, and the inter-chip ESD circuit 704*b* has a node En connected to the first node FN4. The inter-chip buffer 704*a* can be an inter-chip receiver which can be an inverter composed of an NMOS transistor 754*a* and a PMOS transistor 754*b*. The gates of the NMOS transistor 754*a* and the PMOS transistor 754*b* serve as an input node that is the first node FN4 of the inter-chip buffer 704*a*. The drains of the NMOS transistor 754*a* and the PMOS transistor 754*b* serve as an output node that is the second node SN4 of the inter-chip buffer 704*a*.

Figure 280:
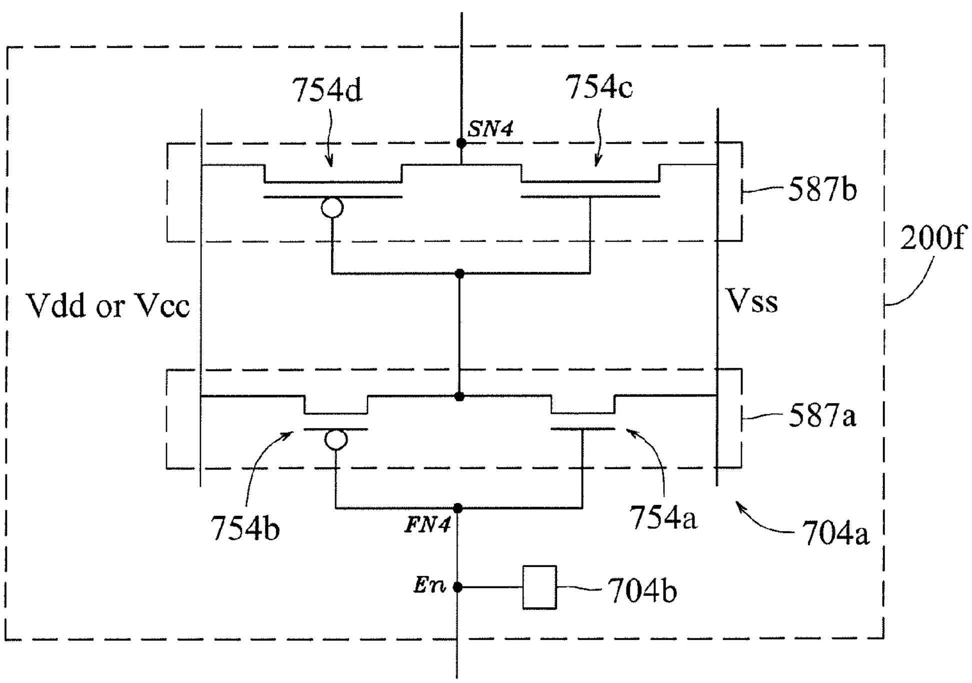

Alternatively, the inter-chip buffer 704*a* can be a multi-stage cascade inter-chip receiver including several stages of inverters. For example, referring to FIG. 280, the inter-chip buffer 704*a* can be a two-stage cascade inter-chip receiver. The first stage 587*a* of the two-stage cascade inter-chip receiver is an inverter composed of the NMOS transistor 754*a* and the PMOS transistor 754*b*, and the second stage 587*b* (the last stage) of the two-stage cascade inter-chip receiver is an inverter composed of an NMOS transistor 754*c* and a PMOS transistor 754*d*. The size of the NMOS transistor 754*c* is larger than that of the NMOS transistor 754*a*, and the size of the PMOS transistor 754*d* is larger than that of the PMOS transistor 754*b*. The gates of the NMOS transistor 754*a* and the PMOS transistor 754*b* serve as an input node that is the first node FN4 of the inter-chip buffer 704*a*. The drains of the NMOS transistor 754*c* and the PMOS transistor 754*d* serve as an output node that is the second node SN4 of the inter-chip buffer 704*a*. The drains of the NMOS transistor 754*a* and the PMOS transistor 754*b* are connected to the gates of the NMOS transistor 754*c* and the PMOS transistor 754*d*.

Referring to FIG. 276, the off-chip circuit 57*a* of the circuits 700 may include an off-chip buffer 61*a* and an off-chip ESD (electro static discharge) circuit 59*a*. The off-chip buffer 61*a* has a first node FN5 and a second node SN5, and the off-chip ESD circuit 59*a* has a node En connected to the first node FN5. The off-chip buffer 61*a* can be an off-chip receiver which can be an inverter composed of an NMOS transistor 4205 and a PMOS transistor 4206. The gates of the NMOS transistor 4205 and the PMOS transistor 4206 serve as an input node that is the first node FN5 of the off-chip buffer 61*a*. The drains of the NMOS transistor 4205 and the PMOS transistor 4206 serve as an output node that is the second node SN5 of the off-chip buffer 61*a*.

Figure 281:
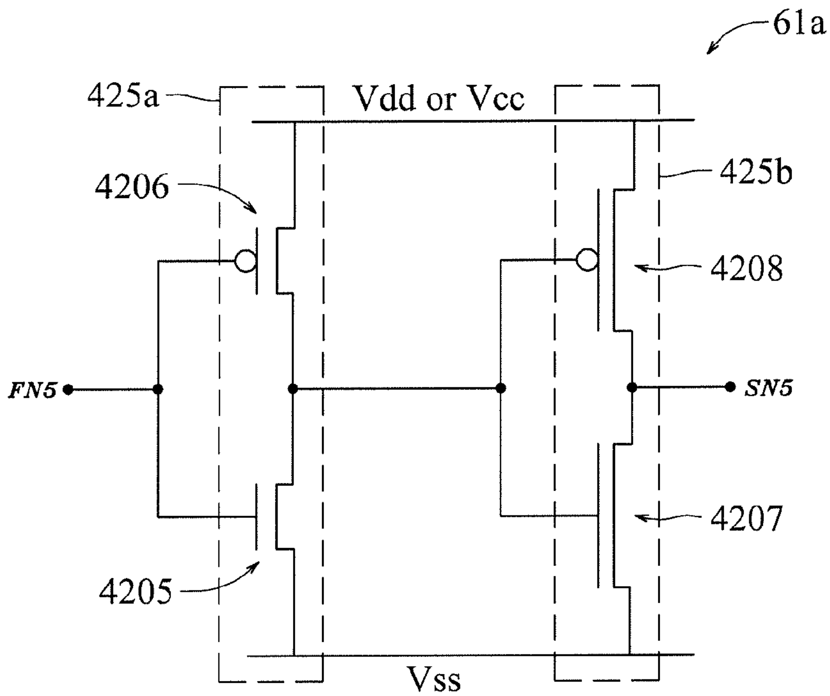
FIGS. 281 and 284 show two-stage cascade off-chip receivers according to an embodiment of the present disclosure.

Alternatively, the off-chip buffer 61*a* can be a multi-stage cascade off-chip receiver including several stages of inverters. For example, referring to FIG. 281, the off-chip buffer 61*a* can be a two-stage cascade off-chip receiver. The first stage 425*a* of the two-stage cascade off-chip receiver is an inverter composed of the NMOS transistor 4205 and the PMOS transistor 4206, and the second stage 425*b* (the last stage) of the two-stage cascade off-chip receiver is an inverter composed of an NMOS transistor 4207 and a PMOS transistor 4208. The size of the NMOS transistor 4207 is larger than that of the NMOS transistor 4205, and the size of the PMOS transistor 4208 is larger than that of the PMOS transistor 4206. The gates of the NMOS transistor 4205 and the PMOS transistor 4206 serve as an input node that is the first node FN5 of the off-chip buffer 61*a*. The drains of the NMOS transistor 4207 and the PMOS transistor 4208 serve as an output node that is the second node SN5 of the off-chip buffer 61*a*. The drains of the NMOS transistor 4205 and the PMOS transistor 4206 are connected to the gates of the NMOS transistor 4207 and the PMOS transistor 4208.

Referring to FIG. 276, the off-chip circuit 57*b* of the circuits 700 may include an off-chip buffer 61*b* and an off-chip ESD (electro static discharge) circuit 59*b*. The off-chip buffer 61*b* has a first node FN6 and a second node SN6, and the off-chip ESD circuit 59*b* has a node En connected to the second node SN6. The off-chip buffer 61*b* can be an off-chip driver which can be an inverter composed of an NMOS transistor 4203 and a PMOS transistor 4204. The gates of the NMOS transistor 4203 and the PMOS transistor 4204 serve as an input node that is the first node FN6 of the off-chip buffer 61*b*, and the drains of the NMOS transistor 4203 and the PMOS transistor 4204 serve as an output node that is the second node SN6 of the off-chip buffer 61*b*.

Figure 282:
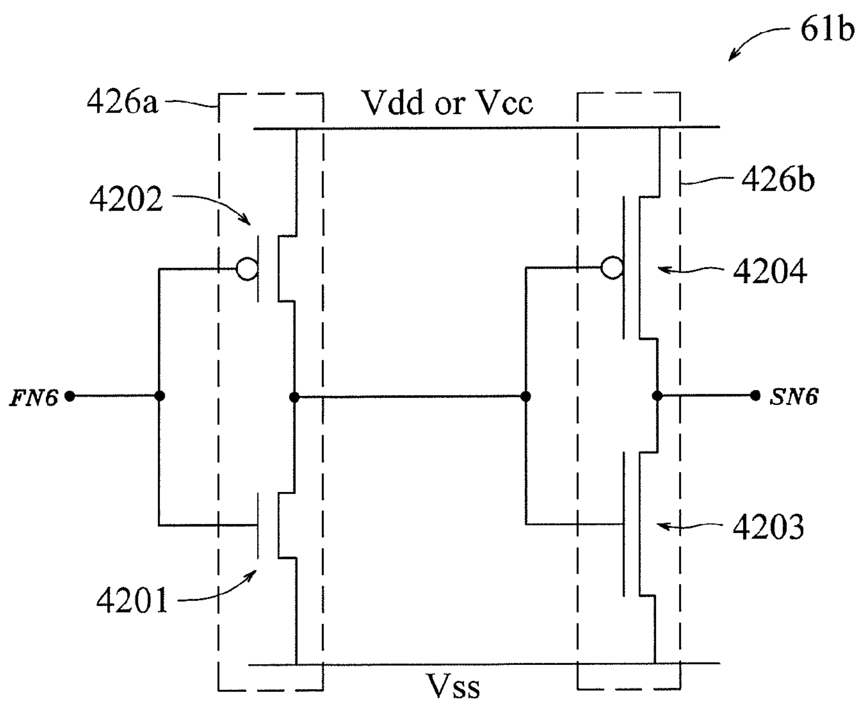
FIGS. 282 and 283 show two-stage cascade off-chip drivers according to an embodiment of the present disclosure.

Alternatively, the off-chip buffer 61*b* can be a multi-stage cascade off-chip driver including several stages of inverters. For example, referring to FIG. 282, the off-chip buffer 61*b* can be a two-stage cascade off-chip driver. The first stage 426*a* of the two-stage cascade off-chip driver is an inverter composed of an NMOS transistor 4201 and a PMOS transistor 4202, and the second stage 426*b* (the last stage) of the two-stage cascade off-chip driver is an inverter composed of the NMOS transistor 4203 and the PMOS transistor 4204. The size of the NMOS transistor 4203 is larger than that of the NMOS transistor 4201, and the size of the PMOS transistor 4204 is larger than that of the PMOS transistor 4202. The gates of the NMOS transistor 4201 and the PMOS transistor 4202 serve as an input node that is the first node FN6 of the off-chip buffer 61*b*. The drains of the NMOS transistor 4203 and the PMOS transistor 4204 serve as an output node that is the second node SN6 of the off-chip buffer 61*b*. The drains of the NMOS transistor 4201 and the PMOS transistor 4202 are connected to the gates of the NMOS transistor 4203 and the PMOS transistor 4204.

Referring to FIG. 276, the off-chip circuit 57*c* of the circuits 800 may include an off-chip buffer 61*c* and an off-chip ESD (electro static discharge) circuit 59*c*. The off-chip buffer 61*c* has a first node FN7 and a second node SN7, and the off-chip ESD circuit 59*c* has a node En connected to the second node SN7. The off-chip buffer 61*c* can be an off-chip driver which can be an inverter composed of an NMOS transistor 4303 and a PMOS transistor 4304. The gates of the NMOS transistor 4303 and the PMOS transistor 4304 serve as an input node that is the first node FN7 of the off-chip buffer 61*c*. The drains of the NMOS transistor 4303 and the PMOS transistor 4304 serve as an output node that is the second node SN7 of the off-chip buffer 61*c*.

Figure 283:
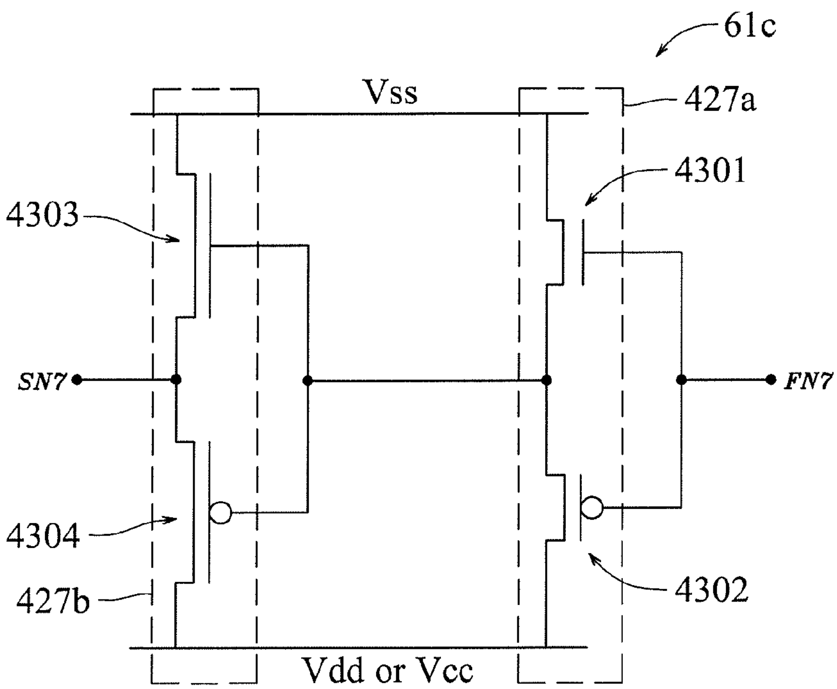

Alternatively, the off-chip buffer 61*c* can be a multi-stage cascade off-chip driver including several stages of inverters. For example, referring to FIG. 283, the off-chip buffer 61*c* can be a two-stage cascade off-chip driver. The first stage 427*a* of the two-stage cascade off-chip driver is an inverter composed of an NMOS transistor 4301 and a PMOS transistor 4302, and the second stage 427*b* (the last stage) of the two-stage cascade off-chip driver is an inverter composed of the NMOS transistor 4303 and the PMOS transistor 4304. The size of the NMOS transistor 4303 is larger than that of the NMOS transistor 4301, and the size of the PMOS transistor 4304 is larger than that of the PMOS transistor 4302. The gates of the NMOS transistor 4301 and the PMOS transistor 4302 serve as an input node that is the first node FN7 of the off-chip buffer 61*c*. The drains of the NMOS transistor 4303 and the PMOS transistor 4304 serve as an output node that is the second node SN7 of the off-chip buffer 61*c*. The drains of the NMOS transistor 4301 and the PMOS transistor 4302 are connected to the gates of the NMOS transistor 4303 and the PMOS transistor 4304.

Referring to FIG. 276, the off-chip circuit 57*d* of the circuits 800 may include an off-chip buffer 61*d* and an off-chip ESD (electro static discharge) circuit 59*d*. The off-chip buffer 61*d* has a first node FN8 and a second node SN8, and the off-chip ESD circuit 59*d* has a node En connected to the first node FN8. The off-chip buffer 61*d* can be an off-chip receiver which can be an inverter composed of an NMOS transistor 4305 and a PMOS transistor 4306. The gates of the NMOS transistor 4305 and the PMOS transistor 4306 serve as an input node that is the first node FN8 of the off-chip buffer 61*d*. The drains of the NMOS transistor 4305 and the PMOS transistor 4306 serve as an output node that is the second node SN8 of the off-chip buffer 61*d*.

Figure 284:
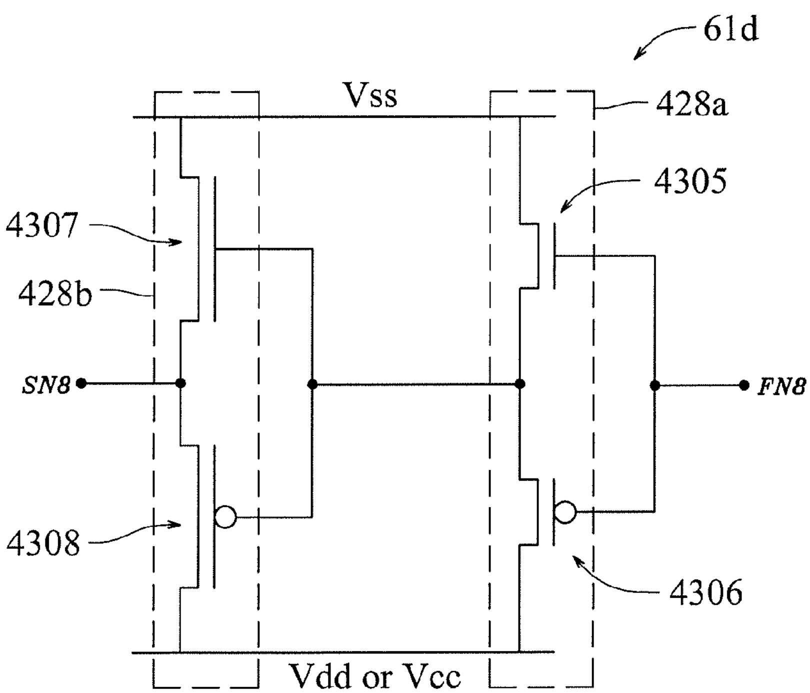

Alternatively, the off-chip buffer 61*d* can be a multi-stage cascade off-chip receiver including several stages of inverters. For example, referring to FIG. 284, the off-chip buffer 61*d* can be a two-stage cascade off-chip receiver. The first stage 428*a* of the two-stage cascade off-chip receiver is an inverter composed of the NMOS transistor 4305 and the PMOS transistor 4306, and the second stage 428*b* (the last stage) of the two-stage cascade off-chip receiver is an inverter composed of an NMOS transistor 4307 and a PMOS transistor 4308. The size of the NMOS transistor 4307 is larger than that of the NMOS transistor 4305, and the size of the PMOS transistor 4308 is larger than that of the PMOS transistor 4306. The gates of the NMOS transistor 4305 and the PMOS transistor 4306 serve as an input node that is the first node FN8 of the off-chip buffer 61*d*. The drains of the NMOS transistor 4307 and the PMOS transistor 4308 serve as an output node that is the second node SN8 of the off-chip buffer 61*d*. The drains of the NMOS transistor 4305 and the PMOS transistor 4306 are connected to the gates of the NMOS transistor 4307 and the PMOS transistor 4308.

Figure 285:
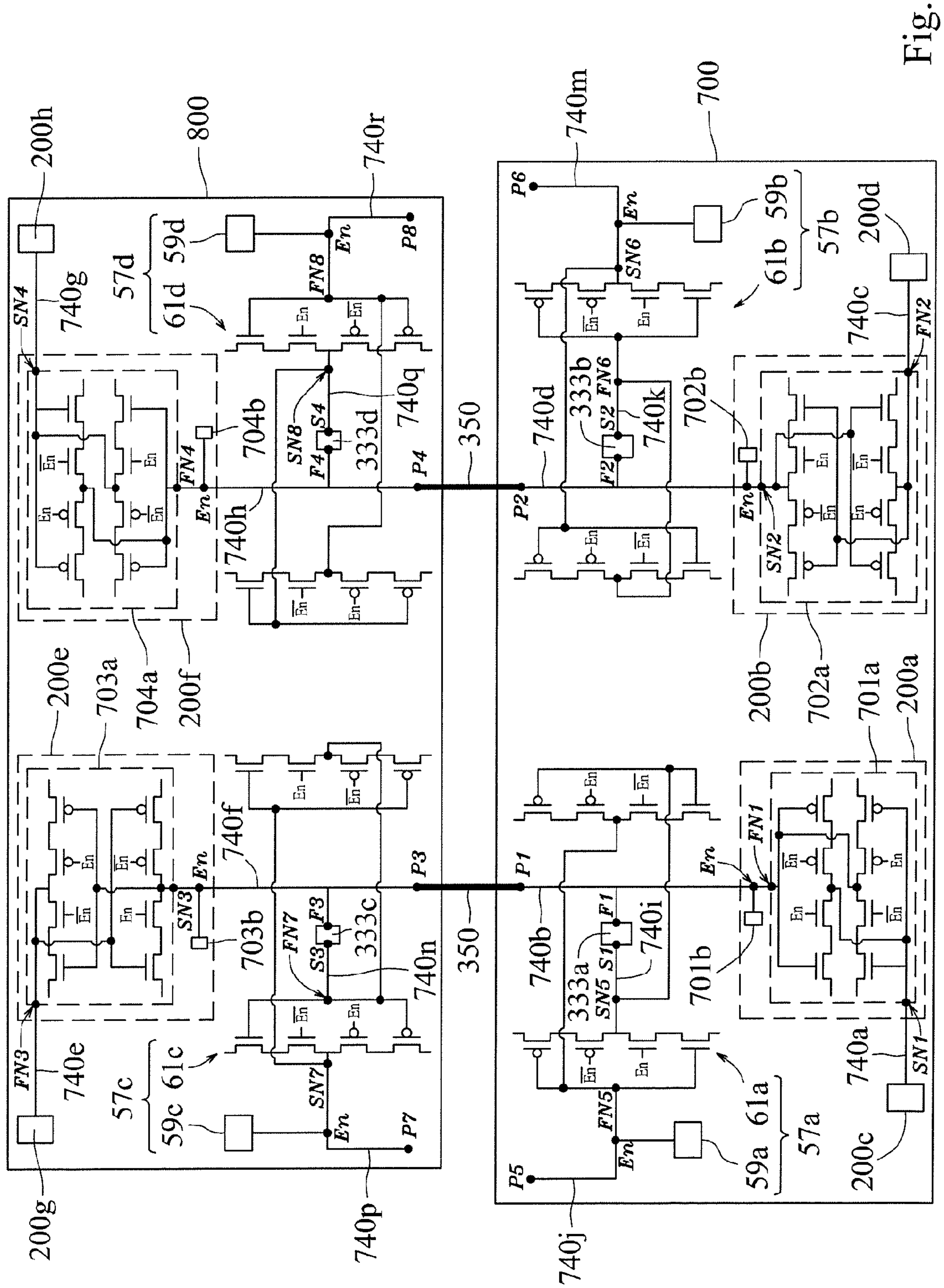

FIG. 285 is another example of a circuit diagram. The circuit diagram shown in FIG. 285 is similar to that shown in FIG. 276 except that the inter-chip buffers 701*a*, 702*a*, 703*a* and 704*a* shown in FIG. 285 are designed with inter-chip tri-state buffers each including a tri-state driver and a tri-state receiver, instead of the inter-chip receivers and drivers, and the off-chip buffers 61*a*, 61*b*, 61*c* and 61*d* shown in FIG. 285 are designed with off-chip tri-state buffers each including a tri-state driver and a tri-state receiver, instead of the off-chip receivers and drivers. In FIG. 285, the inter-chip buffer 701*a* of the circuits 700 can be an inter-chip tri-state buffer having a first I/O (input/output) node serving as the first node FN1 of the inter-chip buffer 701*a*, and having a second I/O node serving as the second node SN1 of the inter-chip buffer 701*a*. The inter-chip buffer 702*a* of the circuits 700 can be an inter-chip tri-state buffer having a first I/O node serving as the first node FN2 of the inter-chip buffer 702*a*, and having a second I/O node serving as the second node SN2 of the inter-chip buffer 702*a*. The inter-chip buffer 703*a* of the circuits 800 can be an inter-chip tri-state buffer having a first I/O node serving as the first node FN3 of the inter-chip buffer 703*a*, and having a second I/O node serving as the second node SN3 of the inter-chip buffer 703*a*. The inter-chip buffer 704*a* of the circuits 800 can be an inter-chip tri-state buffer having a first I/O node serving as the first node FN4 of the inter-chip buffer 704*a*, and having a second I/O node serving as the second node SN4 of the inter-chip buffer 704*a*. The off-chip buffer 61*a* of the circuits 700 can be an off-chip tri-state buffer having a first I/O node serving as the first node FN5 of the off-chip buffer 61*a*, and having a second I/O node serving as the second node SN5 of the off-chip buffer 61*a*. The off-chip buffer 61*b* of the circuits 700 can be an off-chip tri-state buffer having a first I/O node serving as the first node FN6 of the off-chip buffer 61*b*, and having a second I/O node serving as the second node SN6 of the off-chip buffer 61*b*. The off-chip buffer 61*c* of the circuits 800 can be an off-chip tri-state buffer having a first I/O node serving as the first node FN7 of the off-chip buffer 61*c*, and having a second I/O node serving as the second node SN7 of the off-chip buffer 61*c*. The off-chip buffer 61*d* of the circuits 800 can be an off-chip tri-state buffer having a first I/O node serving as the first node FN8 of the off-chip buffer 61*d*, and having a second I/O node serving as the second node SN8 of the off-chip buffer 61*d*.

Referring to FIG. 276 or 285, each of the internal circuits 200*c*, 200*d*, 200*g* and 200*h* can be a NOR gate, a NAND gate, an AND gate, an OR gate, an operational amplifier, a flash memory cell, a dynamic-random-access-memory (DRAM) cell, a static-random-access-memory (SRAM) cell, a non-volatile memory cell, an erasable programmable read-only memory (EPROM) cell, a read-only memory (ROM) cell, a magnetic random access memory (MRAM) cell, a sense amplifier, an analog-to-digital (A/D) converter, a digital-to-analog (D/A) converter, an inverter, an adder, a multiplexer, a diplexer, a multiplier, a complementary-metal-oxide-semiconductor (CMOS) device, a bi-polar CMOS device, a bipolar circuit, or an analog circuit. Each of the internal circuits 200*c*, 200*d*, 200*g* and 200*h* may include a NMOS transistor (n-type metal-oxide-semiconductor transistor) having a ratio of a physical channel width thereof to a physical channel length thereof ranging from, e.g., about 0.1 and 20, ranging from, e.g., about 0.1 and 10, or ranging from, e.g., about 0.2 and 2. Alternatively, each of the internal circuits 200*c*, 200*d*, 200*g* and 200*h* may include a PMOS transistor (p-type metal-oxide-semiconductor transistor) having a ratio of a physical channel width thereof to a physical channel length thereof ranging from, e.g., about 0.2 and 40, ranging from, e.g., about 0.2 and 20, or ranging from, e.g., about 0.4 and 4. Each of the inter-chip ESD circuits 701*b*, 702*b*, 703*b* and 704*b* and each of the off-chip ESD circuits 59*a*, 59*b*, 59*c* and 59*d* may include one or more ESD (electro static discharge) units each composed of two reverse-biased diodes or of a PMOS transistor and an NMOS transistor.

The first node FN1 of the inter-chip buffer 701*a* can be connected to the node En of the inter-chip ESD circuit 701*b*, to a first terminal F1 of the testing interface circuit 333*a* through a metal interconnect 740*b* of the circuits 700, and to the contact point P1 of the circuits 700 through the metal interconnect 740*b*. The second node SN1 of the inter-chip buffer 701*a* can be connected to the internal circuit 200*c* through a metal interconnect 740*a* of the circuits 700.

The first node FN2 of the inter-chip buffer 702*a* can be connected to the internal circuit 200*d* through a metal interconnect 740*c* of the circuits 700. The second node SN2 of the inter-chip buffer 702*a* can be connected to the node En of the inter-chip ESD circuit 702*b*, to a first terminal F2 of the testing interface circuit 333*b* through a metal interconnect 740*d* of the circuits 700, and to the contact point P2 of the circuits 700 through the metal interconnect 740*d*.

The first node FN3 of the inter-chip buffer 703*a* can be connected to the internal circuit 200*g* through a metal interconnect 740*e* of the circuits 800. The second node SN3 of the inter-chip buffer 703*a* can be connected to the node En of the inter-chip ESD circuit 703*b*, to a first terminal F3 of the testing interface circuit 333*c* through a metal interconnect 740*f* of the circuits 800, and to the contact point P3 of the circuits 800 through the metal interconnect 740*f*.

The first node FN4 of the inter-chip buffer 704*a* can be connected to the node En of the inter-chip ESD circuit 704*b*, to a first terminal F4 of the testing interface circuit 333*d* through a metal interconnect 740*h* of the circuits 800, and to the contact point P4 of the circuits 800 through the metal interconnect 740*h*. The second node SN4 of the inter-chip buffer 704*a* can be connected to the internal circuit 200*h* through a metal interconnect line 740*g* of the circuits 800.

The first node FN5 of the off-chip buffer 61*a* can be connected to the node En of the off-chip ESD circuit 59*a*, and to the contact point P5 of the circuits 700 through a metal interconnect 740*j* of the circuits 700. The second node SN5 of the off-chip buffer 61*a* can be connected to a second terminal S1 of the testing interface circuit 333*a* through a metal interconnect 740*i* of the circuits 700.

The first node FN6 of the off-chip buffer 61*b* can be connected to a second terminal S2 of the testing interface circuit 333*b* through a metal interconnect 740*k* of the circuits 700. The second node SN6 of the off-chip buffer 61*b* can be connected to the node En of the off-chip ESD circuit 59*b* and to the contact point P6 of the circuits 700 through a metal interconnect 740*m* of the circuits 700.

The first node FN7 of the off-chip buffer 61*c* can be connected to a second terminal S3 of the testing interface circuit 333*c* through a metal interconnect 740*n* of the circuits 800. The second node SN7 of the off-chip buffer 61*c* can be connected to the node En of the off-chip ESD circuit 59*c* and to the contact point P7 of the circuits 800 through a metal interconnect 740*p* of the circuits 800.

The first node FN8 of the off-chip buffer 61*d* can be connected to the node En of the off-chip ESD circuit 59*d* and to the contact point P8 of the circuits 800 through a metal interconnect 740*r* of the circuits 800. The second node SN8 of the off-chip buffer 61*d* can be connected to a second terminal S4 of the testing interface circuit 333*d* through a metal interconnect 740*q* of the circuits 800.

The metal interconnects 740*a*, 740*b*, 740*c*, 740*d*, 740*i*, 740*j*, 740*k*, and 740*m* of the circuits 700 can be provided by the layers 26 and 34 and the via plugs 26*a* and 34*a* of the chip 68 while the circuits 700 are provided in the chip 68; alternatively, the metal interconnects 740*a*, 740*b*, 740*c*, 740*d*, 740*i*, 740*j*, 740*k*, and 740*m* of the circuits 700 can be provided by the layers 106 and 114 and the via plugs 106*a* and 114*a* of the chip 72 while the circuits 700 are provided in the chip 72; alternatively, the metal interconnects 740*a*, 740*b*, 740*c*, 740*d*, 740*i*, 740*j*, 740*k*, and 740*m* of the circuits 700 can be provided by the layers 17 and 19 and the via plugs 17*a* and 19*a* of the chip 118 while the circuits 700 are provided in the chip 118.

The metal interconnects 740*e*, 740*f*, 740*g*, 740*h*, 740*n*, 740*p*, 740*q*, and 740*r* of the circuits 800 can be provided by the layers 26 and 34 and the via plugs 26*a* and 34*a* of the chip 68 while the circuits 800 are provided in the chip 68; alternatively, the metal interconnects 740*e*, 740*f*, 740*g*, 740*h*, 740*n*, 740*p*, 740*q*, and 740*r* of the circuits 800 can be provided by the layers 106 and 114 and the via plugs 106*a* and 114*a* of the chip 72 while the circuits 800 are provided in the chip 72; alternatively, the metal interconnects 740*e*, 740*f*, 740*g*, 740*h*, 740*n*, 740*p*, 740*q*, and 740*r* of the circuits 800 can be provided by the layers 17 and 19 and the via plugs 17*a* and 19*a* of the chip 118 while the circuits 800 are provided in the chip 118.

The small inter-chip buffers 701*a*, 702*a*, 703*a* and 704*a* are designed in the circuits 700 and 800 for signal, clock or data transmission between the circuits 700 and 800. The total number of inter-chip buffers including the inter-chip buffers 701*a* and 702*a* on the chip having the circuits 700 may be equal to or more than, e.g., 512, and preferably equal to or more than, e.g., 1024. The total number of inter-chip buffers including the inter-chip buffers 703*a* and 704*a* on the chip having the circuits 800 may be equal to or more than, e.g., 512, and preferably equal to or more than, e.g., 1024.

The large off-chip buffers 61*a*, 61*b*, 61*c* and 61*d*, such as off-chip drivers, off-chip receivers or off-chip tri-sate buffers, are designed in the circuits 700 and 800 for circuit testing and/or for signal, clock or data transmission from/to an external circuit of the system-in package or multichip module, such as mother board, metal substrate, glass substrate, ceramic substrate or the previously described carrier 176, through the previously described solder bumps or balls 126, through the previously described metal bumps 672, or through the previously described wirebonded wires 184. The testing circuit is either (i) the wafer level testing performed before the chip having the circuits 700 or 800 is sawed or diced apart from a wafer, or (ii) the package level testing (the final testing) after the chip having the circuits 700 and the chip having the circuits 800 are connected to each other.

The testing interface circuits 333*a* and 333*b* are designed in the circuits 700, and the testing interface circuits 333*c* and 333*d* are designed in the circuits 800. The output capacitance at the first terminal F1 or F4 of the testing interface circuit 333*a* or 333*d* shown in FIG. 276 as seen from the inter-chip buffer 701*a* or 704*a* is less than 2 pF, exemplary less than 1 pF or less than 0.2 pF. The output loading capacitance of the first terminal F1 or F4 of the testing interface circuit 333*a* or 333*d* shown in FIG. 276 is less than 2 pF, exemplary less than 1 pF or less than 0.2 pF. The input capacitance at the first terminal F2 or F3 of the testing interface circuit 333*b* or 333*c* shown in FIG. 276 as seen from the inter-chip buffer 702*a* or 703*a* is less than 2 pF, exemplary less than 1 pF or less than 0.2 pF. The input loading capacitance of the first terminal F2 or F3 of the testing interface circuit 333*b* or 333*c* shown in FIG. 276 is less than 2 pF, exemplary less than 1 pF or less than 0.2 pF. The input or output capacitance at the first terminal F1, F2, F3 or F4 of the testing interface circuit 333*a*, 333*b*, 333*c* or 333*d* shown in FIG. 285 as seen from the inter-chip buffer 701*a*, 702*a*, 703*a* or 704*a* is less than 2 pF, exemplary less than 1 pF or less than 0.2 pF. The input or output loading capacitance of the first terminal F1, F2, F3 or F4 of the testing interface circuit 333*a*, 333*b*, 333*c* or 333*d* shown in FIG. 285 is less than 2 pF, exemplary less than 1 pF or less than 0.2 pF. Each of the test interface circuits 333*a*, 333*b*, 333*c* and 333*d* shown in FIG. 276 or 285 can be a scan test circuit, and the scan test circuit can be used for scan testing performed at the wafer level testing, via the contact point P5, P6, P7 or P8 connecting to a testing probe, before the chip having the circuits 700 or 800 is sawed or diced apart from a wafer or at the package level testing (the final testing) after the chip having the circuits 700 and the chip having the circuits 800 are connected to each other using the previously described process. The scan test circuit is used to test flip flops by input the scan-in signal or output the scan-out signal.

Referring to FIG. 276 or 285, the metal interconnects 350 can be used for clock lines or interconnects, or for signal lines or interconnects, such as bit lines, bit interconnects, address lines or address interconnects.

The total number of bit lines or bit interconnects, provided by the two metal interconnects 350, in parallel data communication between the chip having the circuits 700 and the chip having the circuit 800 can be two, for example, as shown in FIG. 276 or 285. In this case, the bit width of the parallel data communication between the chip having the circuits 700 and the chip having the circuits 800 is two. Alternatively, the total number of the bit lines or bit interconnects in parallel data communication between the chip having the circuits 700 and the chip having the circuit 800 can be equal to or more than 4, 8, 16, 32, 64, 128, 256, 512 or 1024; that means the bit width of the parallel data communication can be equal to or more than 4, 8, 16, 32, 64, 128, 256, 512 or 1024. Note that, in these alternatives, only two bit lines or bit interconnects 350 (and their corresponding inter-chip buffers 701*a*, 702*a*, 703*a* and 704*a*) are shown in FIG. 276 or 285, and other bit lines or bit interconnects (and their corresponding inter-chip buffers) are not shown in FIG. 276 or 285, but they (and their corresponding inter-chip buffers) are designed as same as the two bit lines or bit interconnects 350 (and their corresponding inter-chip buffers 701*a*, 702*a*, 703*a* and 704*a*) shown in FIG. 276 or 285. Each of the metal interconnects 350 used for the bit lines or bit interconnects connects the inter-chip buffer 701*a* or 702*a* of the circuits 700 to the inter-chip buffer 703*a* or 704*a* of the circuits 800. As an example of a case of bit width of 1024, there are 1024 inter-chip buffers, such as 701*a* or 702*a*, of the chip having the circuits 700, connected to 1024 bit lines or bit interconnects, such as 350, and then connected to 1024 inter-chip buffers, such as 703*a* or 704*a*, of the chip having the circuits 800. Accordingly, the total number of the inter-chip buffers 701*a* and 702*a* connected with the bit lines or bit interconnects in parallel data communication between the chip having the circuits 700 and the chip having the circuits 800 is equal to the total number of the bit lines or bit interconnects, and is also equal to the total number of the inter-chip buffers 703*a* and 703*a* connected with the bit lines or bit interconnects. The data communication of the bit lines or bit interconnects, like the metal interconnects 350, between the chip having the circuits 700 and the chip having the circuits 800 may have a data bit width equal to or more than e.g., 2, 4, 8, 16, 32, 64, 128, 256, 512 or 1024, and preferably equal to or more than 512 or 1024.

Referring to FIG. 276 or 285, the small inter-chip ESD circuits 701*b*, 702*b*, 703*b* and 704*b* are used for the small inter-chip buffers 701*a*, 702*a*, 703*a* and 704*a* between the chip having the circuits 700 and the chip having the circuits 800 for electrostatic charge protection during the chip packaging or assembly manufacturing process. Alternatively, no ESD circuit can be required for the small inter-chip buffers 701*a*, 702*a*, 703*a* and 704*a* between the chip having the circuits 700 and the chip having the circuits 800, that is, the inter-chip ESD circuits 701*b*, 702*b*, 703*b* and 704*b* can be omitted. In other words, there is no ESD circuit connected to the metal interconnects 740*b*, 740*d*, 740*f* and 740*h*.

The large off-chip ESD circuits 59*a*, 59*b*, 59*c* and 59*d* required for the large off-chip buffers 61*a*, 61*b*, 61*c*, and 61*d* are designed in both the circuits 700 and 800 for the circuit testing and/or for signal, clock or data transmission from/to an external circuit of the system-in package or multichip module, such as mother board, metal substrate, glass substrate, ceramic substrate or the previously described carrier 176, through the previously described solder bumps or balls 126, through the previously described metal bumps 672, or through the previously described wirebonded wires 184. The circuit testing is either (i) the wafer level testing performed before the chip having the circuits 700 or 800 is sawed or diced apart from a wafer, or (ii) the package level testing (the final testing) after the chip having the circuits 700 and the chip having the circuits 800 are connected to each other. The large off-chip ESD circuits 59*a*, 59*b*, 59*c* and 59*d* are used for electrostatic charge protection during the circuit testing, such as the wafer level testing or the package level testing (the final testing).

The size of the small inter-chip ESD circuit 701*b*, 702*b*, 703*b* or 704*b* can be less than the size of the large off-chip ESD circuit 59*a*, 59*b*, 59*c* or 59*d*, respectively. For example, the size of the inter-chip ESD circuit 701*b*, 702*b*, 703*b* or 704*b* can be defined as the loading or capacitance of the inter-chip ESD circuit 701*b*, 702*b*, 703*b* or 704*b*, and the size of the off-chip ESD circuit 59*a*, 59*b*, 59*c* or 59*d* can be defined as the loading or capacitance of the off-chip ESD circuit 59*a*, 59*b*, 59*c* or 59*d*. In a case, each of the small inter-chip ESD circuits 701*b*, 702*b*, 703*b* and 704*b* has a size (loading or capacitance) less than 2 pF (pico Farads), such as between 0.01 and 2 pF, exemplary less than 0.5 pF, such as between 0.01 and 0.5 pF, and each of the large off-chip ESD circuits 59*a*, 59*b*, 59*c* and 59*d* has a size (loading or capacitance) larger than 2 pF, such as between 2 and 100 pF, exemplary larger than 5 pF, such as between 5 and 100 pF. In another case, each of the small inter-chip ESD circuits 701*b*, 702*b*, 703*b* and 704*b* has a size (loading or capacitance) less than 1 pF, such as between 0.01 and 1 pF, and each of the large off-chip ESD circuits 59*a*, 59*b*, 59*c* and 59*d* has a size (loading or capacitance) larger than 1 pF, such as between 1 and 100 pF.

Alternatively, the size of the small inter-chip ESD circuit 701*b*, 702*b*, 703*b* or 704*b* or the size of the large off-chip ESD circuit 59*a*, 59*b*, 59*c* or 59*d* can be defined as below. An ESD (electro static discharge) circuit, such as the inter-chip ESD circuit 701*b*, 702*b*, 703*b* or 704*b* or the off-chip ESD circuit 59*a*, 59*b*, 59*c* or 59*d*, may include one or more ESD units, and each of the ESD units may include a $P^+$ active region and an $N^+$ active region connected to the $P^+$ active region and to an I/O (input/output) contact point or testing contact point, such as the contact point P1, P2, P3, P4, P5, P6, P7 or P8 shown in FIG. 276 or 285, of a chip. The area of the $P^+$ active region plus the area of the $N^+$ active region equals the active area of each of the ESD units. The total of the active areas of the ESD units equals the active area of the ESD circuit. If the ESD circuit is composed of only one ESD unit, the active area of the ESD circuit equals the active area of the only one ESD unit. If the ESD circuit is composed of multiple ESD units, the active area of the ESD circuit equals the total of the active areas of the ESD units connected in parallel. The active area of the ESD circuit can be used to define the size of the ESD circuit. FIGS. 286-291 show how to calculate the active area of an ESD unit of a chip and define the size of an ESD circuit composed of one or more the ESD units.

Figure 286:
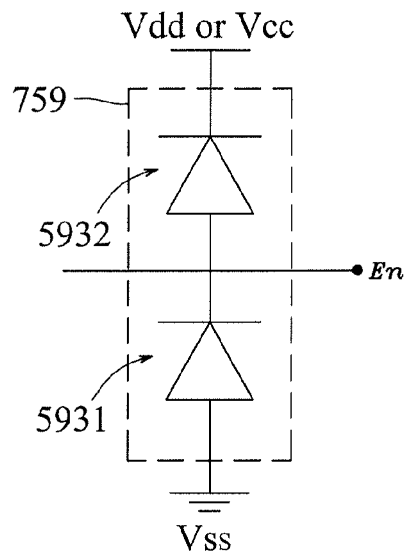
FIGS. 286-291 show a method for calculating an active area of an ESD unit of a chip and define a size of an ESD circuit composed of one or more of the ESD units according to an embodiment of the present disclosure.
Figure 288:
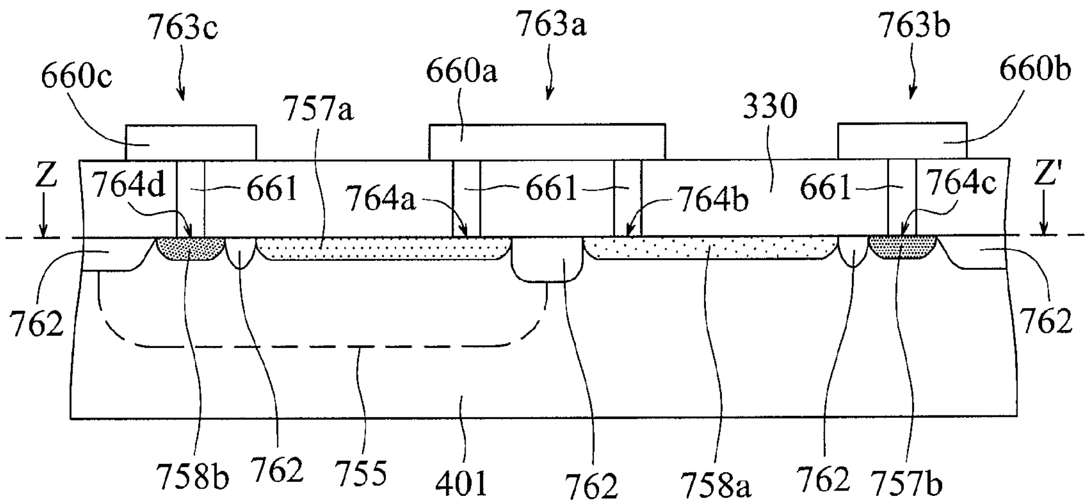

Referring to FIG. 286, an electro static discharge (ESD) unit 759 of a chip can be composed of two reverse-biased diodes 5931 and 5932. FIG. 288 shows a cross-sectional view of the ESD unit 759 shown in FIG. 286, and FIG. 289 is a top perspective view showing the topography of the ESD unit 759 derived from the top surface Z-Z' of a p-type silicon substrate 401 shown in FIG. 288.

Figure 289:
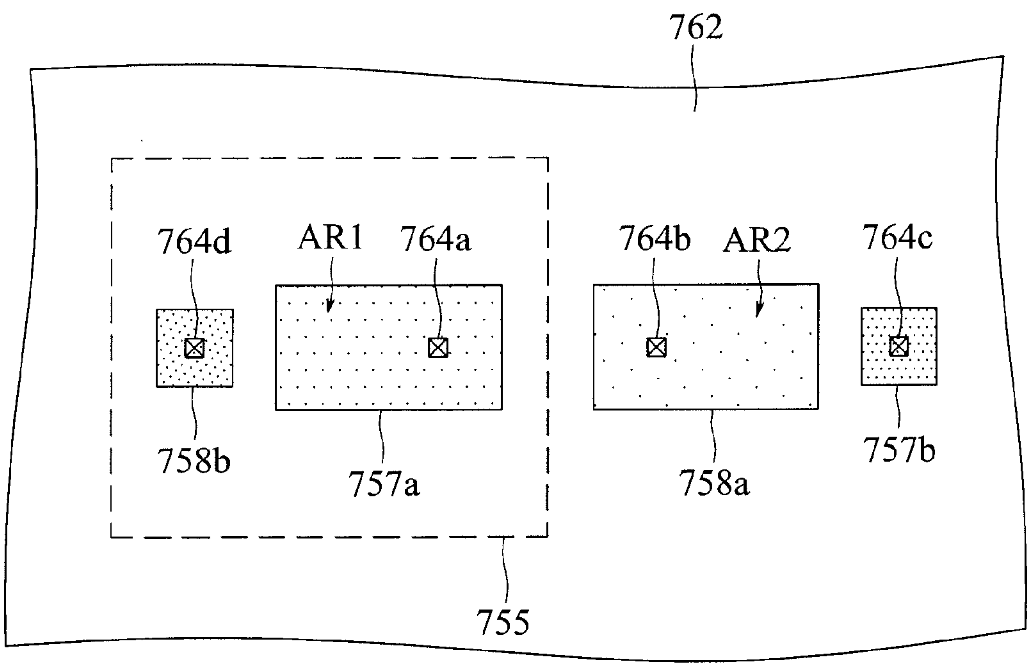

Referring to FIGS. 286, 288 and 289, the ESD unit 759 includes two $P^+$ active regions 757*a* and 757*b* and two $N^+$ active regions 758*a* and 758*b*. The $P^+$ active region 757*a* is in an N-well 755 in the p-type silicon substrate 401, and the $N^+$ active region 758*a* is in the p-type silicon substrate 401. The $P^+$ active region 757*a* is connected to an I/O contact point or testing contact point, such as the contact point P1, P2, P3 or P4 of the circuits 700 shown in FIG. 276 or 285 or the contact point P5, P6, P7 or P8 of the circuits 800 shown in FIG. 276 or 285, of the chip through a metal interconnect 763*a* of the chip. The $N^+$ active region 758*a* is connected to the $P^+$ active region 757*a* and to the I/O contact point or testing contact point of the chip through the metal interconnect 763*a*. The metal interconnect 763*a* includes a fine-line metal layer 660*a* formed on a dielectric layer 330 over the p-type silicon substrate 401, a first via plug 661 formed on a contact region 764*a* of the $P^+$ active region 757*a* and in the dielectric layer 330, and a second via plug 661 formed on a contact region 764*b* of the $N^+$ active region 758*a* and in the dielectric layer 330. The $P^+$ active region 757*b* is in the p-type silicon substrate 401, and the $N^+$ active region 758*b* is in the N-well 755 in the p-type silicon substrate 401. The $P^+$ active region 757*b* is connected to a ground bus through a metal interconnect 763*b*, and the $N^+$ active region 758*b* is connected to a power bus through a metal interconnect 763*c*. The metal interconnect 763*b* contains a fine-line metal layer 660*b* formed on the dielectric layer 330 over the p-type silicon substrate 401, and a third via plug 661 formed on a contact region 764*c* of the $P^+$ active region 757*b* and in the dielectric layer 330. The metal interconnect 763*c* contains a fine-line metal layer 660*c* formed on the dielectric layer 330 over the p-type silicon substrate 401, and a fourth via plug 661 formed on a contact region 764*d* of the $N^+$ active region 758*b* and in the dielectric layer 330.

Referring to FIG. 289, the $P^+$ active region 757*a*, connected to the I/O contact point or testing contact point of the chip, has an area AR1, from a top view, enclosed by a field oxide 762 in the p-type silicon substrate 401. The $N^+$ active region 758*a*, connected to the I/O contact point or testing contact point of the chip, has an area AR2, from a top view, enclosed by the field oxide 762 in the p-type silicon substrate 401. The active area of the ESD unit 759 equals the area AR1 plus the area AR2.

Figure 287:
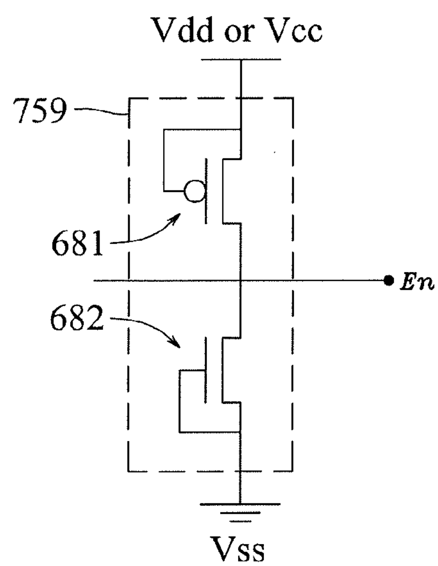
Figure 290:
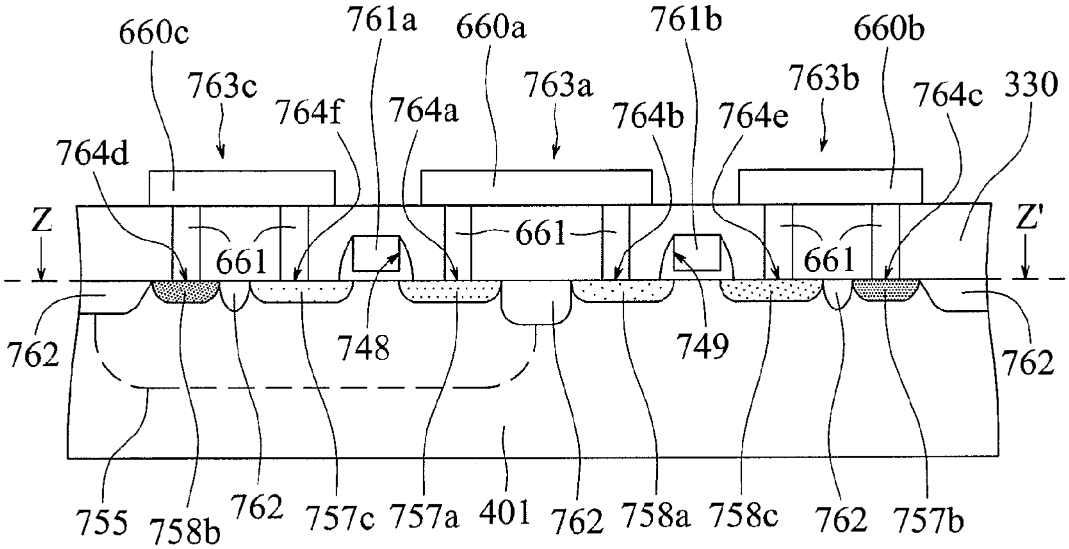

Alternatively, referring to FIG. 287, the ESD unit 759 of the chip can be composed of a PMOS transistor 681 and an NMOS transistor 682. FIG. 290 shows a cross-sectional view of the ESD unit 759 shown in FIG. 287, and FIG. 291 is a top perspective view showing the topography of the ESD unit 759 derived from the top surface Z-Z' of the p-type silicon substrate 401 shown in FIG. 290.

Figure 291:
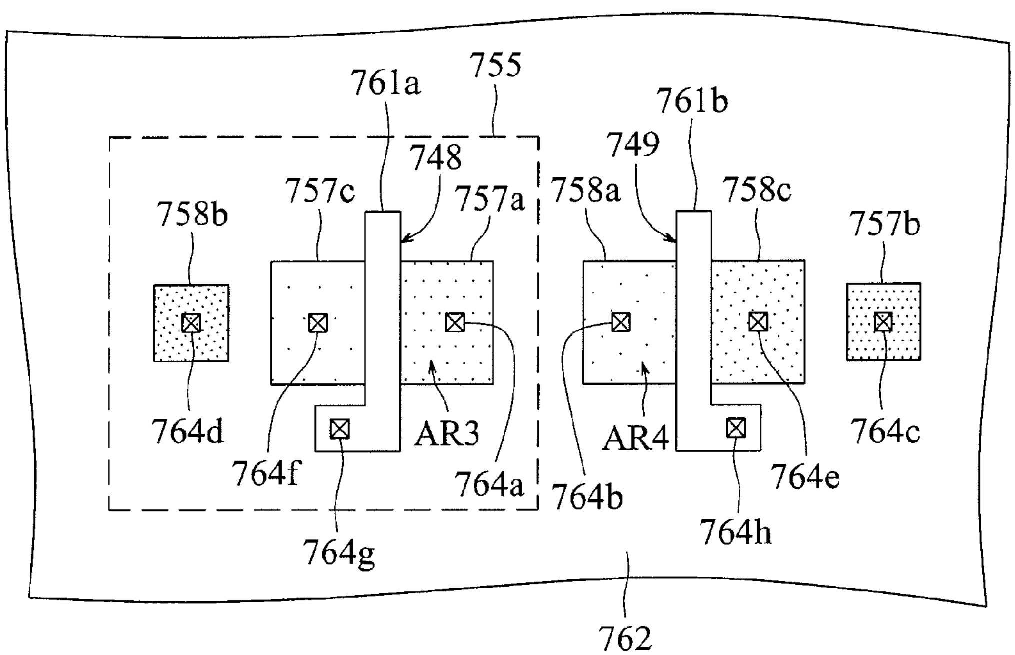

Referring to FIGS. 287, 290 and 291, the PMOS transistor 681 of the ESD unit 759 includes a gate 761*a* and two $P^+$ active regions 757*a* and 757*c* at two opposite sides of the gate 761*a*, and the NMOS transistor 682 of the ESD unit 759 includes a gate 761*b* and two $N^+$ active regions 758*a* and 758*c* at two opposite sides of the gate 761*b*. The $P^+$ active region 757*a* is in an N-well 755 in the p-type silicon substrate 401, and the $N^+$ active region 758*a* is in the p-type silicon substrate 401. The $P^+$ active region 757*a* is connected to an I/O contact point or testing contact point, such as the contact point P1, P2, P3 or P4 of the circuits 700 shown in FIG. 276 or 285 or the contact point P5, P6, P7 or P8 of the circuits 800 shown in FIG. 276 or 285, of the chip through a metal interconnect 763*a* of the chip. The $N^+$ active region 758*a* is connected to the $P^+$ active region 757*a* and to the I/O contact point or the testing contact point of the chip through the metal interconnect 763*a*. The metal interconnect 763*a* contains a fine-line metal layer 660*a* formed on a dielectric layer 330 over the p-type silicon substrate 401, a first via plug 661 formed on a contact region 764*a* of the $P^+$ active region 757*a* and in the dielectric layer 330, and a second via plug 661 formed on a contact region 764*b* of the $N^+$ active region 758*a* and in the dielectric layer 330. The $P^+$ active region 757*b* is in the p-type silicon substrate 401, and the $N^+$ active region 758*b* is in the N-well 755 in the p-type silicon substrate 401. The $P^+$ active region 757*c* is in the N-well 755 in the p-type silicon substrate 401, and the $N^+$ active region 758*c* is in the p-type silicon substrate 401. The $N^+$ active region 758*c* is connected to a ground bus of the chip through a metal interconnect 763*b* of the chip and to the $P^+$ active region 757*b* through the metal interconnect 763*b*, and the $P^+$ active region 757*b* is connected to the ground bus through the metal interconnect 763*b*. The $P^+$ active region 757*c* is connected to a power bus of the chip through a metal interconnect 763*c* of the chip and to the $N^+$ active region 758*b* through the metal interconnect 763*c*, and the $N^+$ active region 758*b* is connected to the power bus through the metal interconnect 763*c*. The metal interconnect 763*b* contains a fine-line metal layer 660*b* formed on the dielectric layer 330 over the p-type silicon substrate 401, a third via plug 661 formed on a contact region 764*c* of the $P^+$ active region 757*b* and in the dielectric layer 330, and a fourth via plug 661 formed on a contact region 764*e* of the $N^+$ active region 758*c* and in the dielectric layer 330. The metal interconnect 763*c* contains a fine-line metal layer 660*c* formed on the dielectric layer 330 over the p-type silicon substrate 401, a fifth via plug 661 formed on a contact region 764*d* of the $N^+$ active region 758*b*, and a sixth via plug 661 formed on a contact region 764*f* of the $P^+$ active region 757*c*. The gate 761*a* has a contact region 764*g* connected to the power bus of the chip and to the contact regions 764*d* and 764*f* through the metal interconnect 763*c*. The gate 761*b* has a contact region 764*h* connected to the ground bus of the chip and to the contact regions 764*c* and 764*e* through the metal interconnect 763*b*.

Referring to FIG. 291, the $P^+$ active region 757*a*, connected to the I/O contact point or testing contact point of the chip, has an area AR3, from a top view, enclosed by the boundary defined by a sidewall 748 of the gate 761*a* and the border between a field oxide 762 and the $P^+$ active region 757*a*. The $N^+$ active region 758*a*, connected to the I/O contact point or testing contact point of the chip, has an area AR4, from a top view, enclosed by the boundary defined by a sidewall 749 of the gate 761*b* and the border between the field oxide 762 and the $N^+$ active region 758*a*. The active area of the ESD unit 759 equals the area AR3 plus the area AR4.

Based on the previously described definition or calculation illustrated in FIGS. 286-291, the active area of each of ESD units of an ESD circuit can be calculated, and the total of active areas of the ESD units equals the active area of the ESD circuit. If the ESD circuit is composed of only one ESD unit, the active area of the ESD circuit equals the active area of the only one ESD unit. If the ESD circuit is composed of multiple ESD units, the active area of the ESD circuit equals the total of the active areas of the ESD units connected in parallel.

Accordingly, the active area of each of the inter-chip ESD circuits 701*b*, 702*b*, 703*b* and 704*b* and the active area of each of the off-chip ESD circuits 59*a*, 59*b*, 59*c* and 59*d* can be calculated. For example, the small inter-chip ESD circuit 701*b*, 702*b*, 703*b* or 704*b* may have an active area less than 1300 square millimeters, such as between 6.5 and 1300 square millimeters, exemplary less than 325 square millimeters, such as between 6.5 and 325 square millimeters, and the large off-chip ESD circuit 59*a*, 59*b*, 59*c* or 59*d* may have an active area larger than 1300 square millimeters, such as between 1300 and 65,000 square millimeters, exemplary larger than 3250 square millimeters, such as between 3250 and 65,000 square millimeters. Alternatively, the small inter-chip ESD circuit 701*b*, 702*b*, 703*b* or 704*b* may have an active area less than 650 square millimeters, and the large off-chip ESD circuit 59*a*, 59*b*, 59*c* or 59*d* may have an active area larger than 650 square millimeters.

The size of the large off-chip ESD circuit 59*a* of the circuits 700, defined as the total of the active areas of the one or more ESD units in the large off-chip ESD circuit 59*a* or the loading or capacitance of the large off-chip ESD circuit 59*a*, can be larger than the size of the small inter-chip ESD circuit 701*b* of the circuits 700, defined as the total of the active areas of the one or more ESD units in the small inter-chip ESD circuit 701*b* or the loading or capacitance of the small inter-chip ESD circuit 701*b*, by more than 3 times, 10 times, 25 times or 50 times, such as between 3 and 50 times.

The size of the large off-chip ESD circuit 59*b* of the circuits 700, defined as the total of the active regions of the one or more ESD units in the large off-chip ESD circuit 59*b* or the loading or capacitance of the large off-chip ESD circuit 59*b*, can be larger than the size of the small inter-chip ESD circuit 702*b* of the circuits 700, defined as the total of the active regions of the one or more ESD units in the small inter-chip ESD circuit 702*b* or the loading or capacitance of the small inter-chip ESD circuit 702*b*, by more than 3 times, 10 times, 25 times or 50 times, such as between 3 and 50 times.

The size of the large off-chip ESD circuit 59*c* of the circuits 800 defined as the total of the active regions of the one or more ESD units in the large off-chip ESD circuit 59*c* or the loading or capacitance of the large off-chip ESD circuit 59*c*, can be larger than the size of the small inter-chip ESD circuit 703*b* of the circuits 800, defined as the total of the active regions of the one or more ESD units in the small inter-chip ESD circuit 703*b* or the loading or capacitance of the small inter-chip ESD circuit 703*b*, by more than 3 times, 10 times, 25 times or 50 times, such as between 3 and 50 times.

The size of the large off-chip ESD circuit 59*d* of the circuits 800 defined as the total of the active regions of the one or more ESD units in the large off-chip ESD circuit 59*d* or the loading or capacitance of the large off-chip ESD circuit 59*d*, can be larger than the size of the small inter-chip ESD circuit 704*b* of the circuits 800, defined as the total of the active regions of the one or more ESD units in the small inter-chip ESD circuit 704*b* or the loading or capacitance of the small inter-chip ESD circuit 704*b*, by more than 3 times, 10 times, 25 times or 50 times, such as between 3 and 50 times.

Referring to FIG. 276, the size of the inter-chip buffer 702*a* or 703*a* can be characterized by the load or loading of the inter-chip buffer 702*a* or 703*a*. The load or loading of the inter-chip buffer 702*a* or 703*a* is total equivalent capacitance load of the inter-chip buffer 702*a* or 703*a*. The load or loading (capacitance) of the inter-chip buffer 702*a* or 703*a*, such as the load or loading (capacitance) of the last stage inverter 585*b* or 586*b*, with drains of the NMOS transistor 752*a* or 753*a* and the PMOS transistor 752*b* or 753*b* connected to the contact point P2 or P3, of the two-stage cascade inter-chip driver shown in FIG. 278 or 279, can be less than 10 pF, such as between 0.01 pF and 10 pF or between 0.1 pF and 5 pF, less than 2 pF, such as between 0.001 pF and 2 pF, or less than 1 pF, such as between 0.01 pF and 1 pF. The size of the inter-chip buffer 701*a* or 704*a* can be characterized by an input capacitance (loading) of the inter-chip buffer 701*a* or 704*a*, and the input capacitance (loading) of the inter-chip buffer 701*a* or 704*a* may be less than 10 pF, such as between 0.01 pF and 10 pF or between 0.1 pF and 5 pF, less than 2 pF, such as between 0.001 pF and 2 pF, or less than 1 pF, such as between 0.01 pF and 1 pF.

Referring to FIG. 285, the size of the inter-chip buffer 701*a*, 702*a*, 703*a* or 704*a* can be characterized by the load or loading of the inter-chip buffer 701*a*, 702*a*, 703*a* or 704*a*. The load or loading of the inter-chip buffer 701*a*, 702*a*, 703*a* or 704*a* is total equivalent capacitance load of the inter-chip buffer 701*a*, 702*a*, 703*a* or 704*a*. The load or loading (capacitance) of the inter-chip buffer 701*a*, 702*a*, 703*a* or 704*a*, such as the load or loading (capacitance) of a last stage tri-state driver, with drains of an NMOS transistor and a PMOS transistor connected to the contact point P1, P2, P3 or P4, of a multi-stage cascade tri-state buffer, can be less than 10 pF, such as between 0.01 pF and 10 pF or between 0.1 pF and 5 pF, less than 2 pF, such as between 0.001 pF and 2 pF, or less than 1 pF, such as between 0.01 pF and 1 pF.

Referring to FIG. 276, the size of the off-chip buffer 61*b* or 61*c* can be characterized by the load or loading of the off-chip buffer 61*b* or 61*c*. The load or loading of the off-chip buffer 61*b* or 61*c* is total equivalent capacitance load of the off-chip buffer 61*b* or 61*c*. The load or loading (capacitance) of the off-chip buffer 61*b* or 61*c*, such as the load or loading (capacitance) of the last stage driver 426*b* or 427*b*, with drains of the NMOS transistor 4203 or 4303 and the PMOS transistor 4204 or 4304 connected to the contact point P6 or P7, of the multi-stage cascade off-chip driver shown in FIG. 282 or 283, can be larger than 10 pF, such as between 10 pF and 100 pF, larger than 2 pF, such as between 2 and 100 pF, or larger than 1 pF, such as between 1 pF and 100 pF. The size of the off-chip buffer 61*a* or 61*d* can be characterized by an input capacitance (loading) of the off-chip buffer 61*a* or 61*d*, and the input capacitance (loading) of the off-chip buffer 61*a* or 61*d* may be larger than 10 pF, such as between 10 pF and 100 pF, larger than 2 pF, such as between 2 and 100 pF, or larger than 1 pF, such as between 1 pF and 100 pF.

Referring to FIG. 285, the size of the off-chip buffer 61*a*, 61*b*, 61*c* or 61*d* can be characterized by the load or loading of the off-chip buffer 61*a*, 61*b*, 61*c* or 61*d*. The load or loading of the off-chip buffer 61*a*, 61*b*, 61*c* or 61*d* is total equivalent capacitance load of the off-chip buffer 61*a*, 61*b*, 61*c* or 61*d*. The load or loading (capacitance) of the off-chip buffer 61*a*, 61*b*, 61*c* or 61*d*, such as the load or loading (capacitance) of a last stage tri-state driver, with drains of an NMOS transistor and a PMOS transistor connected to the contact point P5, P6, P7 or P8, of a multi-stage cascade tri-state buffer, can be larger than 10 pF, such as between 10 pF and 100 pF, larger than 2 pF, such as between 2 and 100 pF, or larger than 1 pF, such as between 1 pF and 100 pF.

The load or loading (capacitance) of the off-chip buffer 61*b* shown in FIG. 276 or 285 is larger than the load or loading (capacitance) of the inter-chip buffer 702*a* shown in FIG. 276 or 285 by more than 3 times, 10 times, 25 times or 50 times, such as between 3 and 100 times. The load or loading (capacitance) of the off-chip buffer 61*c* shown in FIG. 276 or 285 is larger than the load or loading (capacitance) of the inter-chip buffer 703*a* shown in FIG. 276 or 285 by more than 3 times, 10 times, 25 times or 50 times, such as between 3 and 100 times.

Referring to FIG. 276 or 285, the size of the inter-chip buffer 702*a* or 703*a* can be characterized by a peak drive current of the inter-chip buffer 702*a* or 703*a*, and the size of the off-chip buffer 61*b* or 61*c* can be characterized by a peak drive current of the off-chip buffer 61*b* or 61*c*. The peak drive current of the off-chip buffer 61*b* or 61*c* is larger than the peak drive current of the inter-chip buffer 702*a* or 703*a* by more than 3 times, 10 times, 25 times or 50 times, such as between 3 and 100 times.

For example, regarding to the inter-chip buffer 702*a* shown in FIG. 276, when the PMOS transistor 752*b* is on and the NMOS transistor 752*a* is off, the previously described load or loading driven by the inter-chip buffer 702*a* is charged with a charging current. When the NMOS transistor 752*a* is on and the PMOS transistor 752*b* is off, the load or loading the previously described load or loading driven by the inter-chip buffer 702*a* is discharged with a discharging current. The peak charging or discharging current (a function of bias-voltages) of the NMOS transistor 752*a* or PMOS transistor 752*b* can be used to define the peak drive current of the inter-chip buffer 702*a*. Regarding to the off-chip buffer 61*b* shown in FIG. 276, when the PMOS transistor 4204 is on and the NMOS transistor 4203 is off, the previously described load or loading driven by the off-chip buffer 61*b* is charged with a charging current. When the NMOS transistor 4203 is on and the PMOS transistor 4204 is off, the previously described load or loading driven by the off-chip buffer 61*b* is discharged with a discharging current. The peak charging or discharging current (a function of bias-voltages) of the NMOS transistor 4203 or PMOS transistor 4204 can be used to define the peak drive current of the off-chip buffer 61*b*. The peak drive current of the off-chip buffer 61*b* is larger than the peak drive current of the inter-chip buffer 702*a* by more than 3 times, 10 times, 25 times or 50 times, such as between 3 and 100 times.

Referring to FIG. 276 or 285, the size of the inter-chip buffer 702*a* or 703*a* can be characterized by an on-resistance of a transistor in the last stage driver of the inter-chip buffer 702*a* or 703*a*, and the size of the off-chip buffer 61*b* or 61*c* can be characterized by an on-resistance of a transistor in the last stage driver of the off-chip buffer 61*b* or 61*c*. The on-resistance of the off-chip buffer 61*b* or 61*c* is larger than the on-resistance of the inter-chip buffer 702*a* or 703*a* by more than 3 times, 10 times, 25 times or 50 times, such as between 3 and 100 times.

For example, regarding to the inter-chip buffer 702*a* shown in FIG. 276, when the PMOS transistor 752*b* is on and the NMOS transistor 752*a* is off, the previously described load or loading driven by the inter-chip buffer 702*a* is charged, and the PMOS transistor 752*b* is equivalent to a resister with an on-resistance. When the NMOS transistor 752*a* is on and the PMOS transistor 752*b* is off, the previously described load or loading driven by the inter-chip buffer 702*a* is discharged, and the NMOS transistor 752*a* is equivalent to a resister with resistance of an on-resistance. The on-resistance (a function of bias-voltages) of the NMOS transistor 752*a* or PMOS transistor 752*b* can be used to characterize the size of the inter-chip buffer 702*a*. Regarding to the off-chip buffer 61*b* shown in FIG. 276, when the PMOS transistor 4204 is on and the NMOS transistor 4203 is off, the previously described load or loading driven by the off-chip buffer 61*b* is charged, and the PMOS transistor 4204 is equivalent to a resister with an on-resistance. When the NMOS transistor 4203 is on and the PMOS transistor 4204 is off, the previously described load or loading driven by the off-chip buffer 61*b* is discharged, and the NMOS transistor 4203 is equivalent to a resister with an on-resistance. The on-resistance (a function of bias-voltages) of the NMOS transistor 4203 or PMOS transistor 4204 can be used to characterize the size of the off-chip buffer 61*b*.

Figure 292:
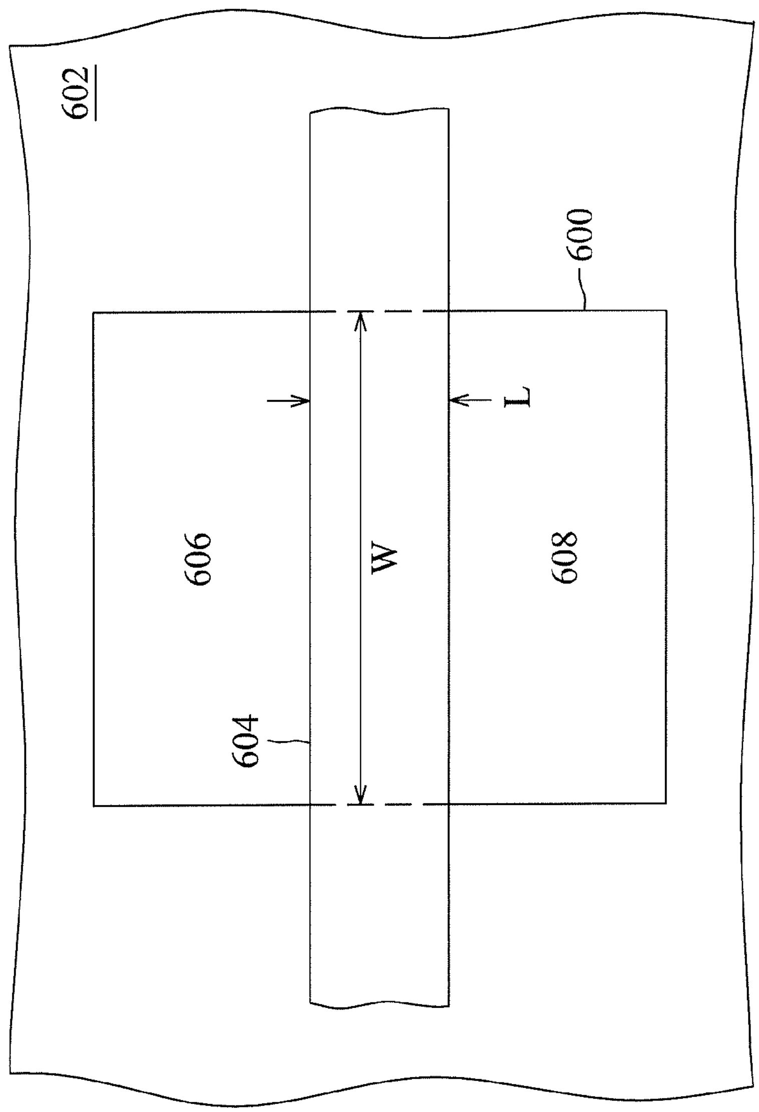
FIGS. 292 and 293 show a method for defining or calculating a physical channel width and a physical channel length of a MOS transistor according to an embodiment of the present disclosure.
Figure 293:
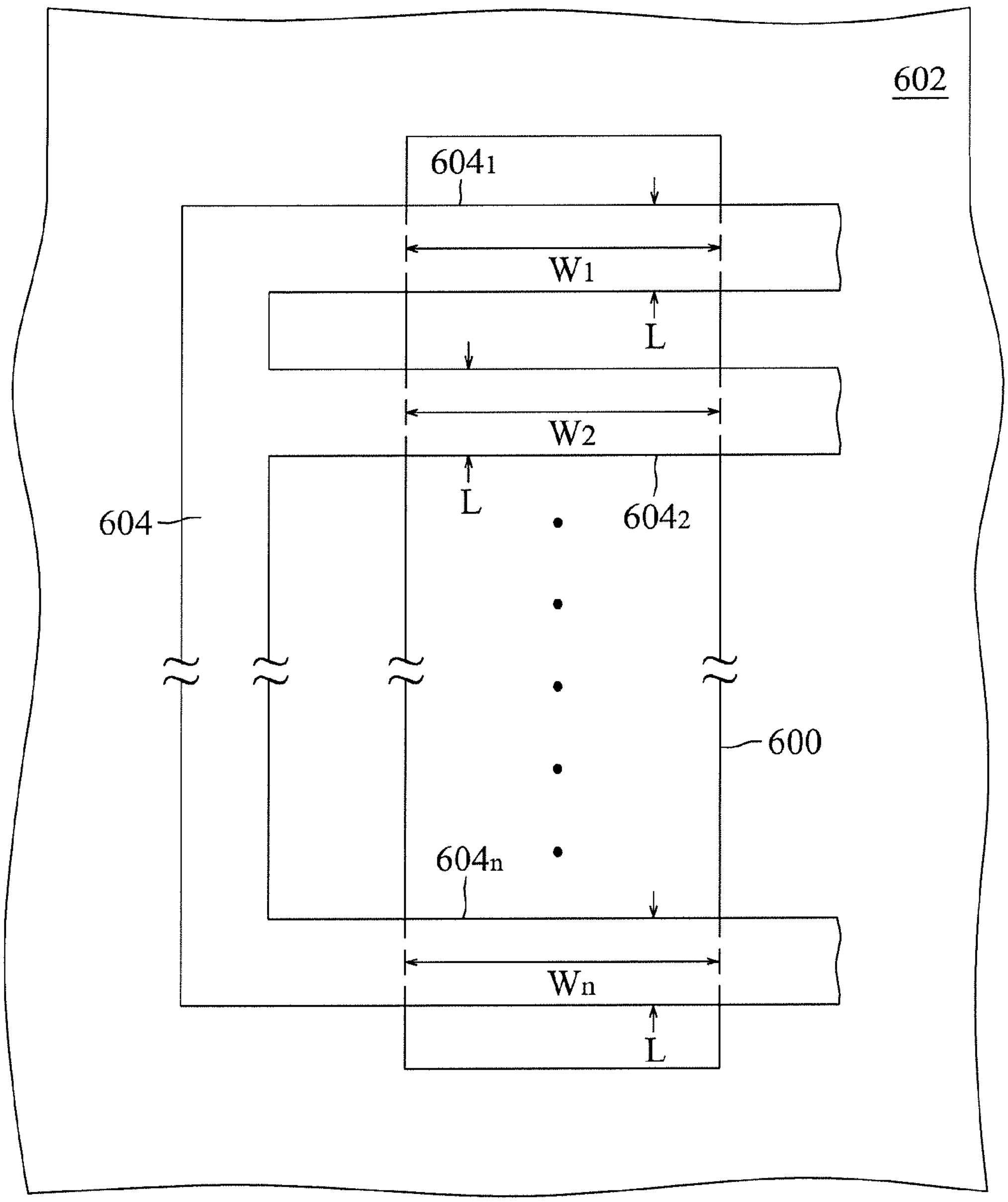

Referring to FIG. 276 or 285, the size of the inter-chip buffer 701*a*, 702*a*, 703*a* or 704*a* or the size of the off-chip buffer 61*a*, 61*b*, 61*c* or 61*d* can be characterized by a ratio of a physical channel width to a physical channel length of an NMOS transistor or PMOS transistor. FIG. 292 or 293 shows how to define or calculate a physical channel width and a physical channel length of an NMOS transistor or PMOS transistor.

FIG. 292 or 293 shows a top view of a MOS transistor (metal-oxide-semiconductor transistor) that can be a PMOS transistor or an NMOS transistor. Referring to FIG. 292, a MOS transistor of a chip includes an active region 600, diffusion region, in a semiconductor substrate of the chip, a field oxide region 602 in the semiconductor substrate and around the active region 600, a gate 604 on the field oxide region 602 and across the active region 600, and a gate oxide (not shown) between the active region 600 and the gate 604. The active region 600 can be defined as a source 606 at a side of the gate 604, and a drain 608 at the other side of the gate 604. The material of the gate 604 may be poly silicon, metal silicide or composite layer of above materials, and the metal silicide may be NiSi, CoS, $TiSi_2$ or WSi. Alternatively, the material of the gate 604 may be a metal, such as W, WN, TiN, Ta, TaN, Mo, or alloy or composite layer of above materials. The material of the gate oxide may be silicon oxide or high k oxide, such as Hf containing oxide. The Hf containing oxide may be $HfO_2$, HfSiON or HfSiO. The reference mark of W is defined as the physical channel width of the MOS transistor, the length of the gate 604 crossing over the diffusion region 600; the reference mark of L is defined as the physical channel length of the MOS transistor, the width of the gate 604 over the diffusion region 600.

Referring to FIG. 293, alternatively, a MOS transistor may include a gate 604 with multiple portions $\mathbf{604}_1$-$\mathbf{604}_n$ over one or more diffusion regions 600. The reference marks of $W_1$-$W_n$ are defined as the physical channel width of each portion $\mathbf{604}_1$-$\mathbf{604}_n$ of the gate 604, the length of each portion $\mathbf{604}_1$-$\mathbf{604}_n$ of the gate 604 crossing over the diffusion region (s) 600; the reference mark of L is defined as the physical channel length of one of the portions $\mathbf{604}_1$-$\mathbf{604}_n$ of the gate 604, the width of one of the portions $\mathbf{604}_1$-$\mathbf{604}_n$ of the gate 604 over the diffusion region(s) 600. In this case, the physical channel width of the MOS transistor is the summation of the physical channel widths $W_1$-$W_n$ of each portions $\mathbf{604}_1$-$\mathbf{604}_n$ of the gate 604, and the physical channel length of the MOS transistor is the physical channel length L of one of the portions $\mathbf{604}_1$-$\mathbf{604}_n$ of the gate 604.

Accordingly, the definition of the physical channel width and physical channel length of the MOS transistor as illustrated in FIG. 292 or 293 can be applicable to various features/structures described herein.

The size of the inter-chip buffer 702*a* shown in FIG. 276 can be characterized by a ratio of a physical channel width to a physical channel length of the NMOS transistor 752*a* or PMOS transistor 752*b*. As shown, the drains of the NMOS transistor 752*a* and the PMOS transistor 752*b* can be connected to the contact point P2 of the circuits 700 through the metal interconnect line 740*d*. If the inter-chip buffer 702*a* is the two-stage cascade inter-chip driver shown in FIG. 278, the size of the inter-chip buffer 702*a* can be characterized by the ratio of the physical channel width to the physical channel length of the NMOS transistor 752*a* or PMOS transistor 752*b* in the last stage driver 585*b*, and the drains of the NMOS transistor 752*a* and the PMOS transistor 752*b* are connected to the contact point P2 of the circuits 700 through the metal interconnect 740*d*. The ratio of the physical channel width to the physical channel length of the NMOS transistor 752*a* can be, e.g., between 1 and 50, and in exemplary embodiments the ratio can be between 1 and 20. The ratio of the physical channel width to the physical channel length of the PMOS transistor 752*b* can be a suitable value, e.g., between 1 and 100, in exemplary embodiments the ratio can be between 1 and 40.

The size of the inter-chip buffer 703*a* shown in FIG. 276 can be characterized by a ratio of a physical channel width to a physical channel length of the NMOS transistor 753*a* or PMOS transistor 753*b*. As shown, the drains of the NMOS transistor 753*a* and the PMOS transistor 753*b* can be connected to the contact point P3 of the circuits 800 through the metal interconnect 740*f*. If the inter-chip buffer 703*a* is the two-stage cascade inter-chip driver shown in FIG. 279, the size of the inter-chip buffer 703*a* can be characterized by the ratio of the physical channel width to the physical channel length of the NMOS transistor 753*a* or PMOS transistor 753*b* in the last stage driver 586*b*, and the drains of the NMOS transistor 753*a* and the PMOS transistor 753*b* are connected to the contact point P3 of the circuits 800 through the metal interconnect 740*f*. The ratio of the physical channel width to the physical channel length of the NMOS transistor 753*a* can be, e.g., between 1 and 50, and in exemplary embodiments, the ratio can be between 1 and 20. The ratio of the physical channel width to the physical channel length of the PMOS transistor 753*b* can be, e.g., between 1 and 100, and in exemplary embodiments, the ratio can be between 1 and 40.

The size of the off-chip buffer 61*b* shown in FIG. 276 can be characterized by a ratio of a physical channel width to a physical channel length of the NMOS transistor 4203 or PMOS transistor 4204. As shown, the drains of the NMOS transistor 4203 and the PMOS transistor 4204 can be connected to the contact point P6 of the circuits 700 through the metal interconnect 740*m*. If the off-chip buffer 61*b* is the two-stage cascade off-chip driver shown in FIG. 282, the size of the off-chip buffer 61*b* can be characterized by the ratio of the physical channel width to the physical channel length of the NMOS transistor 4203 or PMOS transistor 4204 in the last stage driver 426*b*, and the drains of the NMOS transistor 4203 and the PMOS transistor 4204 are connected to the contact point P6 of the circuits 700 through the metal interconnect 740*m*. The ratio of the physical channel width to the physical channel length of the NMOS transistor 4203 can be, e.g., larger than 30, such as between 30 and 20,000, and in exemplary embodiments the ratio can be larger than 50, such as between 50 and 300. The ratio of the physical channel width to the physical channel length of the PMOS transistor 4204 can be, e.g., larger than 60, such as between 60 and 40,000, and in exemplary embodiments the ratio can be larger than 100, such as between 100 and 600. For exemplary embodiments, the ratio of the physical channel width to the physical channel length of the NMOS transistor 4203 may be larger than the ratio of the physical channel width to the physical channel length of the NMOS transistor 752*a* by, e.g., more than 3 times, 10 times, 25 times or 50 times, such as between 3 and 100 times. Moreover, for exemplary embodiments, the ratio of the physical channel width to the physical channel length of the PMOS transistor 4204 may be larger than the ratio of the physical channel width to the physical channel length of the PMOS transistor 752*b* by, e.g., more than 3 times, 10 times, 25 times or 50 times, such as between 3 and 100 times.

The size of the off-chip buffer 61*c* shown in FIG. 276 can be characterized by a ratio of a physical channel width to a physical channel length of the NMOS transistor 4303 or PMOS transistor 4304. As shown, the drains of the NMOS transistor 4303 and the PMOS transistor 4304 can be connected to the contact point P7 of the circuits 800 through the metal interconnect 740*p*. If the off-chip buffer 61*c* is the two-stage cascade off-chip driver shown in FIG. 283, the size of the off-chip buffer 61*c* can be characterized by the ratio of the physical channel width to the physical channel length of the NMOS transistor 4303 or PMOS transistor 4304 in the last stage driver 427*b*, and the drains of the NMOS transistor 4303 and the PMOS transistor 4304 are connected to the contact point P7 of the circuits 800 through the metal interconnect 740*p*. The ratio of the physical channel width to the physical channel length of the NMOS transistor 4303 can be, e.g., larger than 30, such as between 30 and 20,000, and in exemplary embodiments the ratio can be larger than 50, such as between 50 and 300. The ratio of the physical channel width to the physical channel length of the PMOS transistor 4304 can be, e.g., larger than 60, such as between 60 and 40,000, and in exemplary embodiments the ratio can be larger than 100, such as between 100 and 600. The ratio of the physical channel width to the physical channel length of the NMOS transistor 4303 may be larger than the ratio of the physical channel width to the physical channel length of the NMOS transistor 753*a* by, e.g., more than 3 times, 10 times, 25 times or 50 times, such as between 3 and 100 times. The ratio of the physical channel width to the physical channel length of the PMOS transistor 4304 may be larger than the ratio of the physical channel width to the physical channel length of the PMOS transistor 753*b* by, e.g., more than 3 times, 10 times, 25 times or 50 times, such as between 3 and 100 times.

The size of the inter-chip buffer 701*a* or 702*a* shown in FIG. 285 can be characterized by a ratio of a physical channel width to a physical channel length of an NMOS transistor or PMOS transistor of the tri-state driver of the inter-chip tri-state buffer. As shown, the tri-state driver can be connected to the contact point P1 or P2 of the circuits 700 through the metal interconnect 740*b* or 740*d*. The ratio of the physical channel width to the physical channel length of the NMOS transistor of the tri-state driver can be, e.g., between 1 and 50, and in exemplary embodiments between 1 and 20. The ratio of the physical channel width to the physical channel length of the PMOS transistor of the tri-state driver can be, e.g., between 1 and 100, and in exemplary embodiments between 1 and 40.

If the inter-chip buffer 701*a* or 702*a* shown in FIG. 285 is a multi-stage tri-state buffer, the size of the inter-chip buffer 701*a* or 702*a* can be characterized by a ratio of a physical channel width to a physical channel length of an NMOS transistor or PMOS transistor in the last stage tri-state driver of the multi-stage tri-state buffer. As shown, the last stage tri-state driver can be connected to the contact point P1 or P2 of the circuits 700 through the metal interconnect 740*b* or 740*d*. The ratio of the physical channel width to the physical channel length of the NMOS transistor of the last stage tri-state driver can be, for example, between 1 and 50, and in exemplary embodiments the ratio can be between 1 and 20. The ratio of the physical channel width to the physical channel length of the PMOS transistor of the last stage tri-state driver can be between 1 and 100, and in exemplary embodiments the ratio can be between 1 and 40.

The size of the inter-chip buffer 703*a* or 704*a* shown in FIG. 285 can be characterized by a ratio of a physical channel width to a physical channel length of an NMOS transistor or PMOS transistor of the tri-state driver of the inter-chip tri-state buffer. As shown, the tri-state driver can be connected to the contact point P3 or P4 of the circuits 800 through the metal interconnect 740*f* or 740*h*. The ratio of the physical channel width to the physical channel length of the NMOS transistor of the tri-state driver is between 1 and 50, and in exemplary embodiments between 1 and 20. The ratio of the physical channel width to the physical channel length of the PMOS transistor of the tri-state driver is between 1 and 100, and in exemplary embodiments can be between 1 and 40.

If the inter-chip buffer 703*a* or 704*a* shown in FIG. 285 is a multi-stage tri-state buffer, the size of the inter-chip buffer 703*a* or 704*a* can be characterized by a ratio of a physical channel width to a physical channel length of an NMOS transistor or PMOS transistor in the last stage tri-state driver of the multi-stage tri-state buffer. As shown, the last stage tri-state driver can be connected to the contact point P3 or P4 of the circuits 800 through the metal interconnect 740*f* or 740*h*. The ratio of the physical channel width to the physical channel length of the NMOS transistor of the last stage tri-state driver can be, e.g., between 1 and 50, and in exemplary embodiments can be between 1 and 20. The ratio of the physical channel width to the physical channel length of the PMOS transistor of the last stage tri-state driver can be, e.g., between 1 and 100, and in exemplary embodiments can be between 1 and 40.

The size of the off-chip buffer 61a or 61b shown in FIG. 285 can be characterized by a ratio of a physical channel width to a physical channel length of an NMOS transistor or PMOS transistor of a tri-state driver of the off-chip tri-state buffer. As shown, the tri-state driver can be connected to the contact point P5 or P6 of the circuits 700 through the metal interconnect 740j or 740m. The ratio of the physical channel width to the physical channel length of the NMOS transistor of the tri-state driver can be, e.g., larger than 30, such as between 30 and 20,000, and in exemplary embodiments the ratio can be larger than 50, such as between 50 and 300. The ratio of the physical channel width to the physical channel length of the PMOS transistor of the tri-state driver can be, e.g., larger than 60, such as between 60 and 40,000, and in exemplary embodiments can be larger than 100, such as between 100 and 600.

If the off-chip buffer 61a or 61b shown in FIG. 285 is a multi-stage tri-state buffer, the size of the off-chip buffer 61a or 61b can be characterized by a ratio of a physical channel width to a physical channel length of an NMOS transistor or PMOS transistor in the last stage tri-state driver of the multi-stage tri-state buffer. As shown, the last stage tri-state driver can be connected to the contact point P5 or P6 of the circuits 700 through the metal interconnect 740j or 740m. The ratio of the physical channel width to the physical channel length of the NMOS transistor of the last stage tri-state driver can be, for example, larger than 30, such as between 30 and 20,000, and in exemplary embodiments the ratio can be larger than 50, such as between 50 and 300. The ratio of the physical channel width to the physical channel length of the PMOS transistor of the last stage tri-state driver can be larger than 60, such as between 60 and 40,000, and in exemplary embodiments can be larger than 100, such as between 100 and 600.

The ratio of the physical channel width to the physical channel length of the NMOS transistor of the tri-state driver (at the last stage) of the off-chip tri-state buffer 61a or 61b shown in FIG. 285 may be larger than the ratio of the physical channel width to the physical channel length of the NMOS transistor of the tri-state driver (at the last stage) of the inter-chip tri-state buffer 701a or 702a shown in FIG. 285 by, e.g., more than 3 times, 10 times, 25 times or 50 times, such as between 3 and 100 times. The ratio of the physical channel width to the physical channel length of the PMOS transistor of the tri-state driver (at the last stage) of the off-chip tri-state buffer 61a or 61b shown in FIG. 285 may be larger than the ratio of the physical channel width to the physical channel length of the PMOS transistor of the tri-state driver (at the last stage) of the inter-chip tri-state buffer 701a or 702a shown in FIG. 285 by, e.g., more than 3 times, 10 times, 25 times or 50 times, such as between 3 and 100 times.

The size of the off-chip buffer 61c or 61d shown in FIG. 285 can be characterized by a ratio of a physical channel width to a physical channel length of an NMOS transistor or PMOS transistor of a tri-state driver of the off-chip tri-state buffer. As shown, the tri-state driver can be connected to the contact point P7 or P8 of the circuits 800 through the metal interconnect 740p or 740r. The ratio of the physical channel width to the physical channel length of the NMOS transistor of the tri-state driver can be, e.g., larger than 30, such as between 30 and 20,000, and in exemplary embodiments can be larger than 50, such as between 50 and 300. The ratio of the physical channel width to the physical channel length of the PMOS transistor of the tri-state driver can be, e.g., larger than 60, such as between 60 and 40,000, and in exemplary embodiments the ratio can be larger than 100, such as between 100 and 600.

If the off-chip buffer 61c or 61d shown in FIG. 285 is a multi-stage tri-state buffer, the size of the off-chip buffer 61c or 61d can be characterized by a ratio of a physical channel width to a physical channel length of an NMOS transistor or PMOS transistor in the last stage tri-state driver of the multi-stage tri-state buffer. As shown, the last stage tri-state driver can be connected to the contact point P7 or P8 of the circuits 800 through the metal interconnect 740p or 740r. The ratio of the physical channel width to the physical channel length of the NMOS transistor of the last stage tri-state driver can be, e.g., larger than 30, such as between 30 and 20,000, and in exemplary embodiments the ratio can be larger than 50, such as between 50 and 300. The ratio of the physical channel width to the physical channel length of the PMOS transistor of the last stage tri-state driver can be, e.g., larger than 60, such as between 60 and 40,000, and in exemplary embodiments can be larger than 100, such as between 100 and 600.

The ratio of the physical channel width to the physical channel length of the NMOS transistor of the tri-state driver (at the last stage) of the off-chip tri-state buffer 61c or 61d shown in FIG. 285 may be larger than the ratio of the physical channel width to the physical channel length of the NMOS transistor of the tri-state driver (at the last stage) of the inter-chip tri-state buffer 703a or 704a shown in FIG. 285 by, e.g., more than 3 times, 10 times, 25 times or 50 times, such as between 3 and 100 times. The ratio of the physical channel width to the physical channel length of the PMOS transistor of the tri-state driver (at the last stage) of the off-chip tri-state buffer 61c or 61d shown in FIG. 285 may be larger than the ratio of the physical channel width to the physical channel length of the PMOS transistor of the tri-state driver (at the last stage) of the inter-chip tri-state buffer 703a or 704a shown in FIG. 285 by, e.g., more than 3 times, 10 times, 25 times or 50 times, such as between 3 and 100 times.

Figure 294:
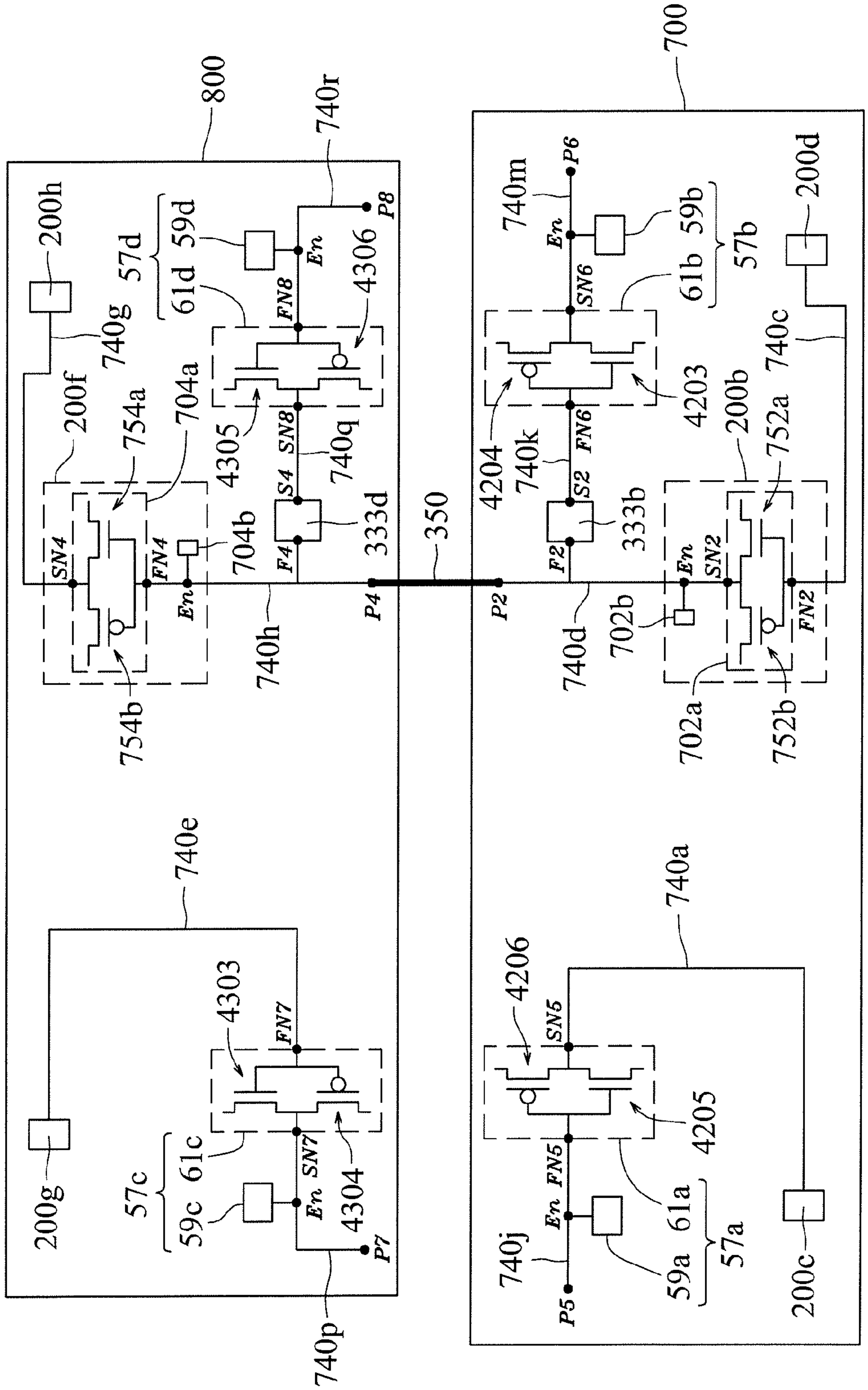
FIGS. 294 and 295 are circuit diagrams each showing interface circuits between two chips, according to an embodiment of the present disclosure.

Referring to FIG. 294, alternatively, the internal circuit 200c of the circuits 700 can be connected to the second node SN5 of the off-chip buffer 61a through the metal interconnect 740a of the circuits 700 without passing through any inter-chip circuit and any testing interface circuit of the circuits 700. The internal circuit 200g of the circuits 800 can be connected to the first node FN7 of the off-chip buffer 61c through the metal interconnect 740e of the circuits 800 without passing through any inter-chip circuit and any testing interface circuit of the circuits 800. Comparing to the circuit diagram of FIG. 276, the inter-chip circuits 200a and 200e and the testing interface circuits 333a and 333c can be omitted. The element in FIG. 294 indicated by a same reference number as indicates the element in FIG. 276 has a same material and spec as the element illustrated in FIG. 276.

Figure 295:
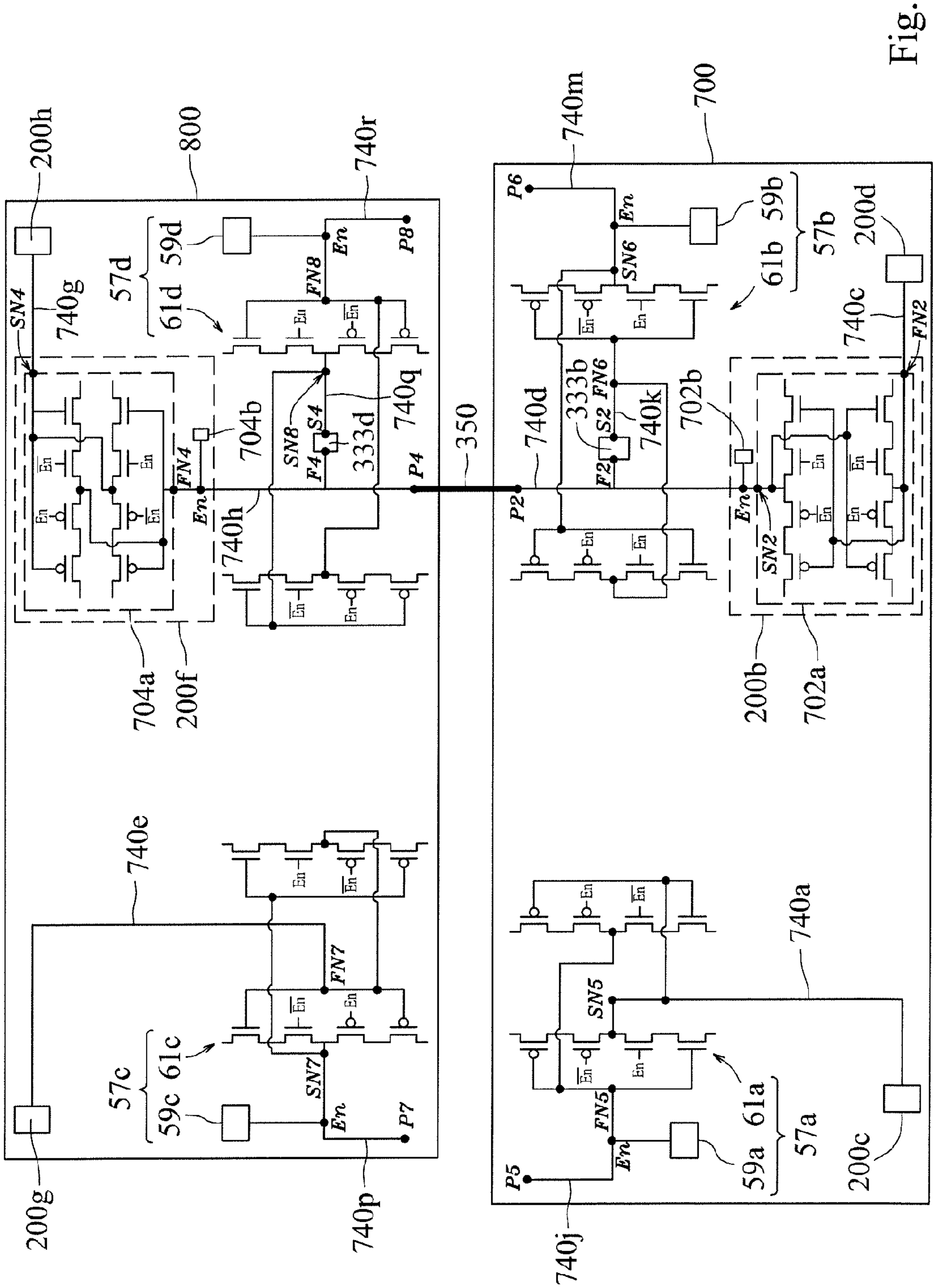

Referring to FIG. 295, alternatively, the internal circuit 200c of the circuits 700 can be connected to the second node SN5 of the off-chip buffer 61a through the metal interconnect 740a of the circuits 700 without passing through any inter-chip circuit and any testing interface circuit of the circuits 700. The internal circuit 200g of the circuits 800 can be connected to the first node FN7 of the off-chip buffer 61c through the metal interconnect 740e of the circuits 800 without passing through any inter-chip circuit and any testing interface circuit of the circuits 800. Comparing to the circuit diagram of FIG. 285, the inter-chip circuits 200a and 200e and the testing interface circuits 333a and 333c can be omitted. The element in FIG. 295 indicated by a same reference number as indicates the element in FIGS. 276 and 285 has a same material and spec as the element illustrated in FIGS. 276 and 285.

Figure 296:
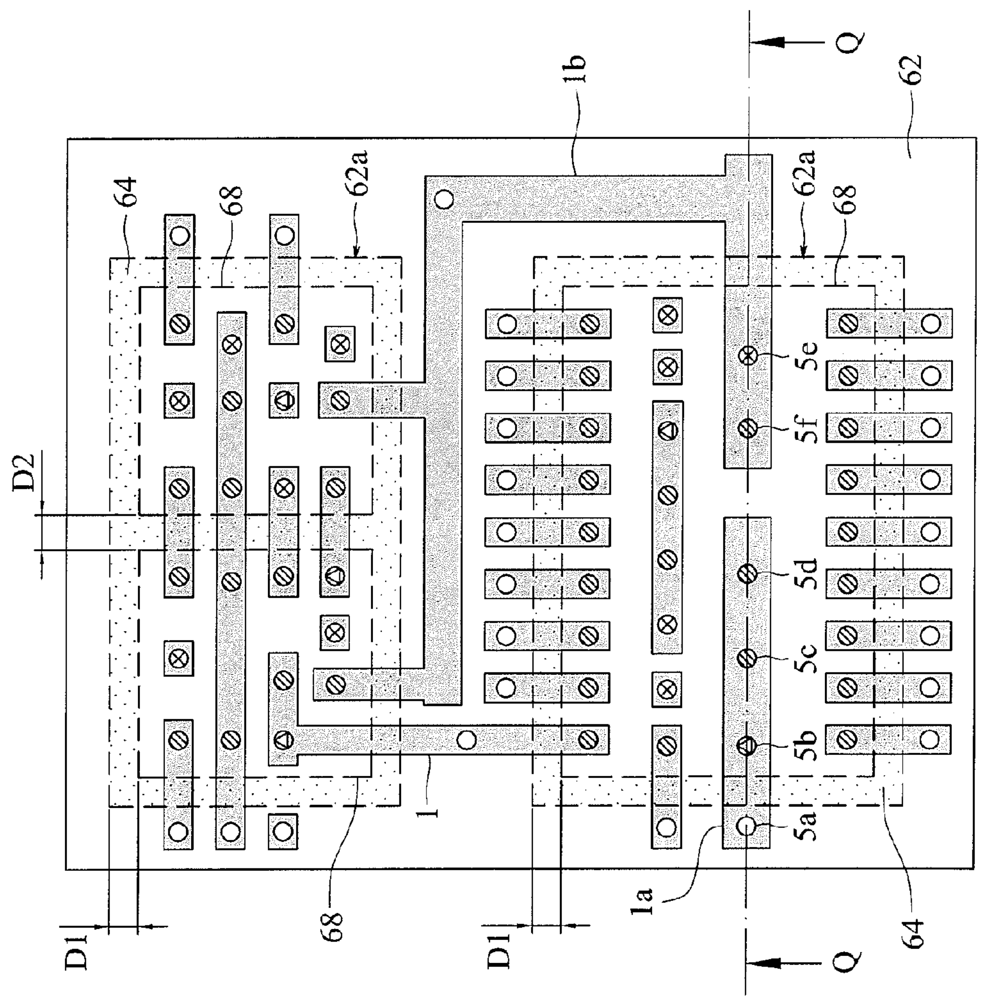
FIG. 296 is a schematic top perspective view showing the arrangement of a bottom tier of chips, a dummy substrate, metal plugs and metal interconnects of a system-in package or multichip module according to an embodiment of the present disclosure.

FIG. 296 is an example of a schematic top perspective view showing the arrangement of the chips 68, the dummy substrate 62, the metal plugs 5*p* (including the metal plugs 5*a*-5*f*) and the metal interconnects 1 (including the metal interconnects 1*a* and 1*b*) of the previously described system-in package or multichip module 555, 555*b*, 555*c*, 555*e*, 555*g*, 555*h*, 555*s*, 555*u*, 555*v*, 555*w*, 555*y*, 555*z*, 556*a*, 556*c*, 556*d*, 556*e*, 556*g*, or 556*h* that is shown with a cross sectional view cut along the line Q-Q in FIG. 296. Referring to FIG. 296, the chips 68 are placed in the openings 62*a* that are formed in the dummy substrate 62, and the encapsulation/gap filling material 64 is formed in the gaps 4 each having the transverse distance or spacing D1 and in the gaps 8 each having the transverse distance or spacing D2. Hollow circles enclosing no oblique lines indicate the metal plugs 5*p*, like the previously described metal plug 5*a*, formed in and through the dummy substrate 62 and connected to the overlying metal interconnects 1, like the previously described metal interconnect 1*a*, contacting the underlying contact points of the conductive layer 18 of the carrier 11. Circles enclosing triangles indicate the metal plugs 5*p*, like the previously described metal plug 5*b*, formed in and through the chips 68 and connected to the overlying metal interconnects 1, like the previously described metal interconnect 1*a*, contacting the underlying contact points of the conductive layer 18 of the carrier 11. Circles enclosing oblique lines indicate the metal plugs 5*p*, like the previously described metal plug 5*c*, 5*d* or 5*f*, formed in the chips 68 and connected to the overlying metal interconnects 1, like the previously described metal interconnect 1*a* or 1*b*, contacting the underlying interconnects or metal traces, like the previously described interconnect or metal trace 35*d*, 35*c* or 35*b*, in the chips 68. Circles enclosing cross lines indicate the metal plugs 5*p*, like the previously described metal plug 5*e*, formed in and through the chips 68 and connected to the overlying metal interconnects 1, like the previously described metal interconnect 1*b*, connecting the interconnects or metal traces, like the previously described interconnect or metal trace 35*a*, on the supporters, like the previously described supporter 801, in the chips 68 down to the underlying contact points of the conductive layer 18 of the carrier 11.

Figure 297:
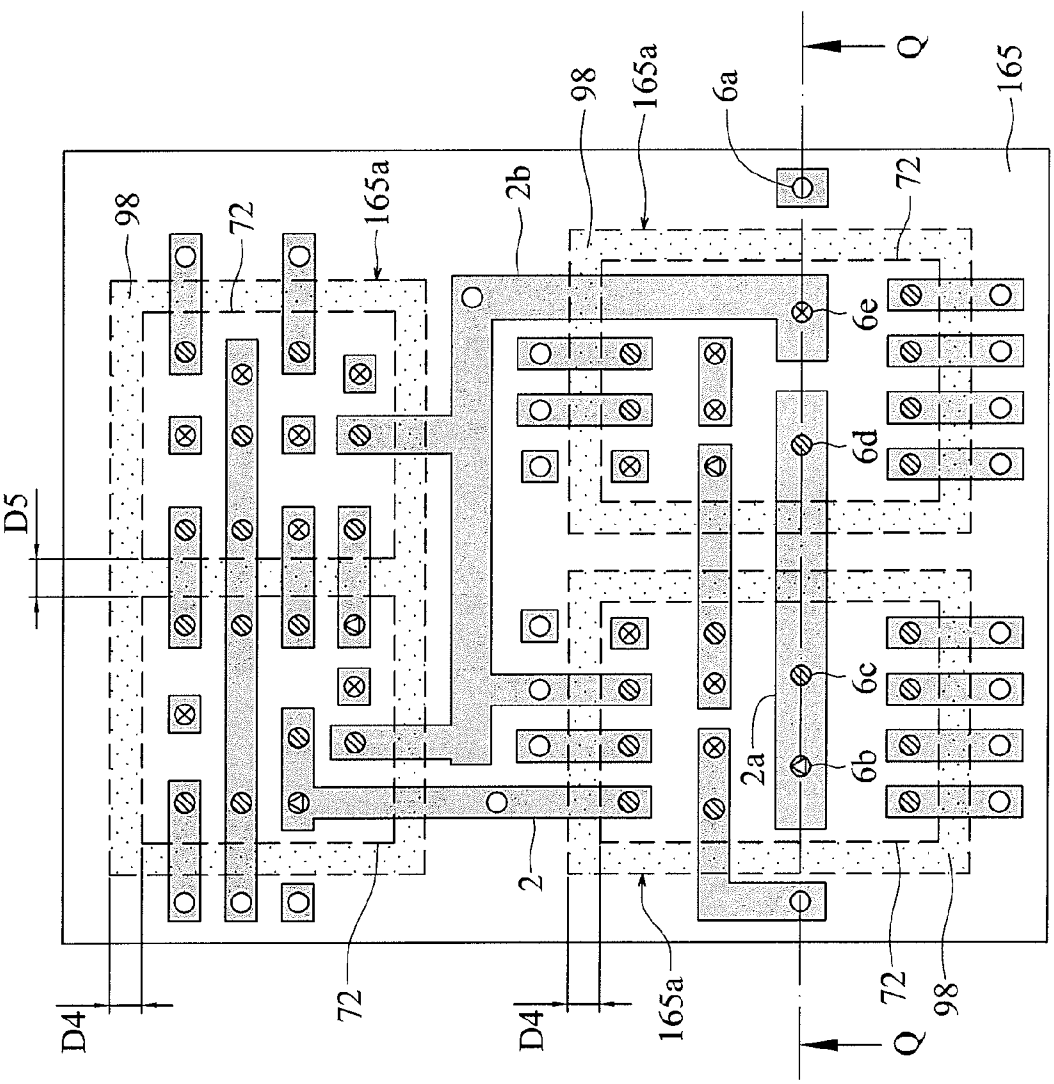
FIG. 297 is a schematic top perspective view showing the arrangement of a middle tier of chips, a dummy substrate, metal plugs and metal interconnects of a system-in package or multichip module according to an embodiment of the present disclosure.

FIG. 297 is an example of a schematic top perspective view showing the arrangement of the chips 72, the dummy substrate 165, the metal plugs 6*p* (including the metal plugs 6*a*-6*e*) and the metal interconnects 2 (including the metal interconnects 2*a* and 2*b*) of the previously described system-in package or multichip module 555, 555*b*, 555*c*, 555*e*, 555*g*, 555*h*, 555*j*, 555*m*, 555*n*, 555*o*, 555*q*, 555*r*, 555*s*, 555*u*, 555*v*, 555*w*, 555*y*, 555*z*, 556*a*, 556*c*, 556*d*, 556*e*, 556*g*, or 556*h* that is shown with a cross sectional view cut along the line Q-Q in FIG. 297. Referring to FIG. 297, the chips 72 are placed in the openings 165*a* that are formed in the dummy substrate 165, and the encapsulation/gap filling material 98 is formed in the gaps 4*a* each having the transverse distance or spacing D4 and in the gaps 8*a* each having the transverse distance or spacing D5. Hollow circles enclosing no oblique lines indicate the metal plugs 6*p*, like the previously described metal plug 6*a*, formed in and through the dummy substrate 165 and connected to the overlying metal interconnects 2, contacting the underlying metal interconnects 1, like the previously described metal interconnect 1*b*. Circles enclosing triangles indicate the metal plugs 6*p*, like the previously described metal plug 6*b*, formed in and through the chips 72 and connected to the overlying metal interconnects 2, like the previously described metal interconnect 2*a*, contacting the underlying metal interconnects 1, like the previously described metal interconnect 1*a*. Circles enclosing oblique lines indicate the metal plugs 6*p*, like the previously described metal plug 6*c* or 6*d*, formed in the chips 72 and connected to the overlying metal interconnects 2, like the previously described metal interconnect 2*a*, contacting the underlying interconnects or metal traces, like the previously described interconnect or metal trace 55*c* or 55*b*, in the chips 72. Circles enclosing cross lines indicate the metal plugs 6*p*, like the previously described metal plug 6*e*, formed in and through the chips 72 and connected to the overlying metal interconnects 2, like the previously described metal interconnect 2*b*, connecting the interconnects or metal traces, like the previously described interconnect or metal trace 55*a*, on the supporters, like the previously described supporter 802, in the chips 72 down to the underlying metal interconnects 1, like the previously described metal interconnect 1*b*.

Figure 298:
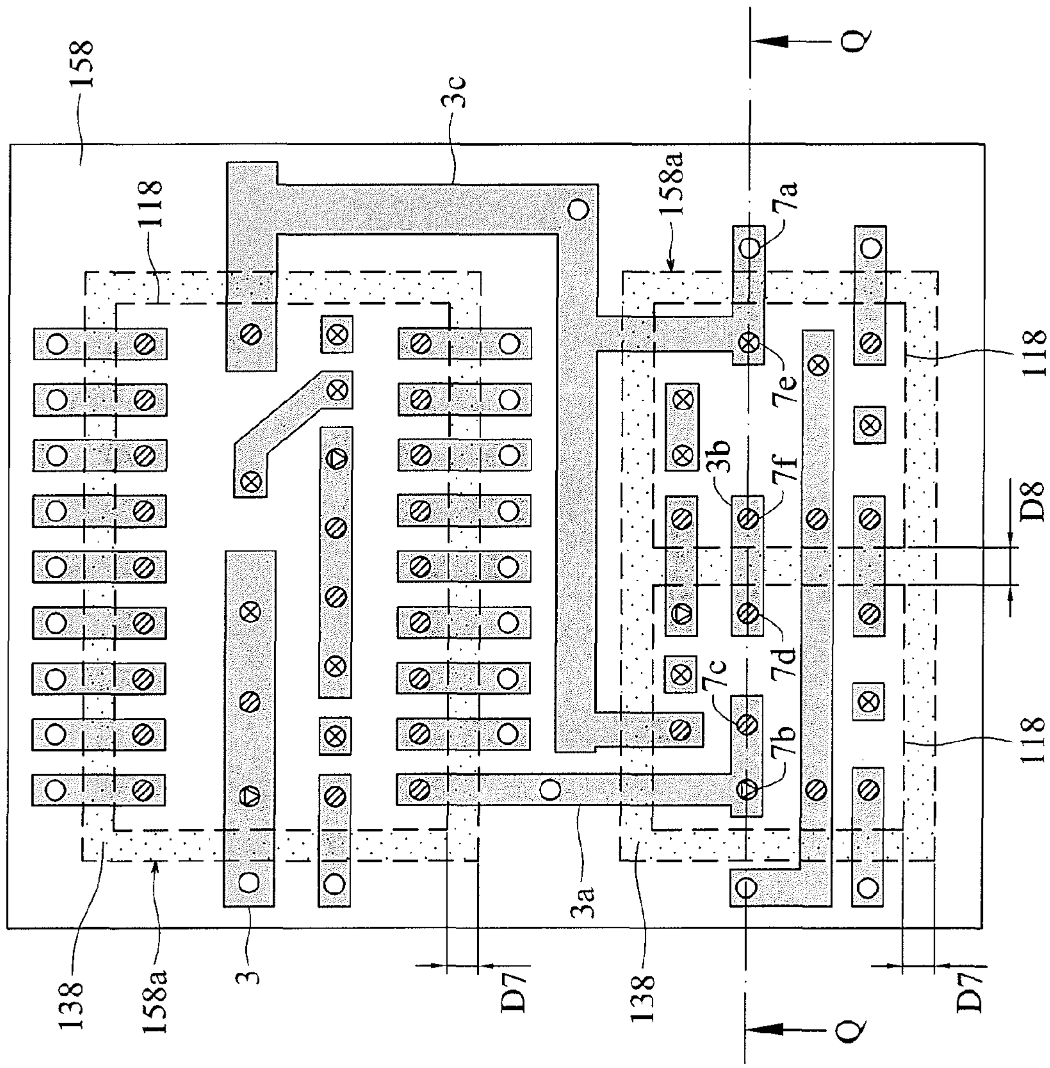
FIG. 298 is a schematic top perspective view showing the arrangement of a top tier of chips, a dummy substrate, metal plugs and metal interconnects of a system-in package or multichip module according to an embodiment of the present disclosure.

FIG. 298 is an example of a schematic top perspective view showing the arrangement of the chips 118, the dummy substrate 165, the metal plugs 7*p* (including the metal plugs 7*a*-7*f*) and the metal interconnects 3 (including the metal interconnects 3*a*, 3*b* and 3*c*) of the previously described system-in package or multichip module 555, 555*b*, 555*c*, 555*e*, 555*g*, 555*h*, 555*j*, 555*m*, 555*n*, 555*o*, 555*q*, 555*r*, 555*s*, 555*u*, 555*v*, 555*w*, 555*y*, 555*z*, 556*a*, 556*c*, 556*d*, 556*e*, 556*g*, or 556*h* that is shown with a cross sectional view cut along the line Q-Q in FIG. 298. Referring to FIG. 298, the chips 118 are placed in the openings 158*a* that are formed in the dummy substrate 158, and the encapsulation/gap filling material 138 is formed in the gaps 4*b* each having the transverse distance or spacing D7 and in the gaps 8*b* each having the transverse distance or spacing D8. Hollow circles enclosing no oblique lines indicate the metal plugs 7*p*, like the previously described metal plug 7*a*, formed in and through the dummy substrate 158 and connected to the overlying metal interconnects 3, like the previously described metal interconnect 3*c*, contacting the underlying metal interconnects 2. Circles enclosing triangles indicate the metal plugs 7*p*, like the previously described metal plug 7*b*, formed in and through the chips 118 and connected to the overlying metal interconnects 3, like the previously described metal interconnect 3*a*, contacting the underlying metal interconnects 2, like the previously described metal interconnect 2*a*. Circles enclosing oblique lines indicate the metal plugs 7*p*, like the previously described metal plug 7*c*, 7*d* or 7*f*, formed in the chips 118 and connected to the overlying metal interconnects 3, like the previously described metal interconnect 3*a* or 3*b*, contacting the underlying interconnects or metal traces, like the previously described interconnect or metal trace 75*d*, 75*c* or 75*b*, in the chips 118. Circles enclosing cross lines indicate the metal plugs 7*p*, like the previously described metal plug 7*e*, formed in and through the chips 118 and connected to the overlying metal interconnects 3, like the previously described metal interconnect 3*c*, connecting the interconnects or metal traces, like the previously described interconnect or metal trace 75*a*, on the supporters, like the previously described supporter 803, in the chips 118 down to the underlying metal interconnects 2, like the previously described metal interconnect 2*b*.

The system-in package or multichip module shown in FIG. 82, 84, 103, 105, 128, 130, 136, 138, 181, 183, 207, 209, 250, 252, 270 or 272, or the multichip package shown in FIG. 83, 85, 88, 104, 106, 109, 129, 131, 132, 137, 139, 140, 182, 184, 185, 208, 210, 211, 251, 253, 254, 271, 273 or 274 can be used in a wide variety of electronic devices, including, but not limited to, e.g., a telephone, a cordless phone, a mobile phone, a smart phone, a netbook computer, a notebook computer, a digital camera, a digital video camera, a digital picture frame, a personal digital assistant (PDA), a pocket personal computer, a portable personal computer, an electronic book, a digital book, a desktop computer, a tablet or slate computer, an automobile electronic product, a mobile internet device (MID), a mobile television, a projector, a mobile projector, a pico projector, a smart projector, a three-dimensional (3D) video display, a 3D television (3D TV), a 3D video game player, a mobile computer device, a mobile compuphone (also called mobile phoneputer or mobile personal computer phone) which is a device or a system combining and providing functions of computers and phones, or a high performance and/or low power computer or server, for example, used for cloud computing.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure, e.g., design of structure and/or control of methods described herein, can be implemented in hardware, software, firmware, or any combinations of such, and over one or more networks. Suitable software can include computer-readable or machine-readable instructions for performing methods and techniques (and portions thereof) of designing and/or controlling the implementation of tailored RF pulse trains. Any suitable software language (machine-dependent or machine-independent) may be utilized. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A system-in package comprising:

a carrier;

a first chip over said carrier, wherein said first chip comprises a first semiconductor substrate having a thickness between 1 and 50 micrometers, a first metal layer under a bottom surface of said first semiconductor substrate, and a dielectric layer under said bottom surface of said first semiconductor substrate and over said first metal layer;

a second chip over said carrier, wherein said second chip comprises a second semiconductor substrate, wherein said second semiconductor substrate has a top surface substantially coplanar with a top surface of said first semiconductor substrate, wherein said second chip is separated from said first chip;

a gap filling material disposed in a gap between said first chip and said second chip;

a first metal plug in said first chip, wherein said first metal plug passes through said first semiconductor substrate and said dielectric layer and contacts said first metal layer;

a first insulating material enclosing said first metal plug, wherein said first insulating material is enclosed by said first semiconductor substrate;

a first dielectric structure on said top surface of said first semiconductor substrate, on said top surface of said second semiconductor substrate, and on said gap filling material;

a first metal interconnect in said first dielectric structure and over said first chip, wherein said first metal interconnect is connected to said first metal plug;

a third chip over said first dielectric structure and over said first metal interconnect, wherein said third chip comprises a third semiconductor substrate having a thickness between 1 and 50 micrometers;

a second metal plug in said third chip, wherein said second metal plug passes through said third chip and contacts said first metal interconnect;

a second insulating material enclosing said second metal plug, wherein said second insulating material is enclosed by said third semiconductor substrate;

a second dielectric structure on a top surface of said third semiconductor substrate; and a second metal interconnect in said second dielectric structure and over said third chip, wherein said second metal interconnect is connected to said second metal plug.

2. The system-in package of claim 1, wherein said carrier comprises one of a silicon substrate, a glass substrate, a ceramic substrate, a metal substrate, and an organic polymer substrate.

3. The system-in package of claim 1, wherein said first chip comprises one of a central-processing-unit (CPU) chip, a graphics-processing-unit (GPU) chip, a digital-signal-processing (DSP) chip, a flash memory chip, a dynamic-random-access-memory (DRAM) chip, a static-random-access-memory (SRAM) chip, a wireless local area network (WLAN) chip, a baseband chip, a logic chip, an analog chip, a power device, a regulator, a power management device, a global-positioning-system (GPS) chip, a Bluetooth chip, and a system-on chip (SOC) comprising one or more of a central-processing-unit (CPU) circuit block, a graphics-processing-unit (GPU) circuit block, a digital-signal-processing (DSP) circuit block, a memory circuit block, a baseband circuit block, a Bluetooth circuit block, a global-positioning-system (GPS) circuit block, a wireless local area network (WLAN) circuit block and a modem circuit block.

4. The system-in package of claim 1, wherein said thickness of said first semiconductor substrate is between 2 and 20 micrometers.

5. The system-in package of claim 1, wherein said second metal plug further contacts a second metal layer of said third chip, wherein said second metal layer is under said third semiconductor substrate.

6. The system-in package of claim 1 further comprising a third metal plug in said second chip, wherein said third metal plug passes through said second semiconductor substrate and contacts a second metal layer of said second chip, wherein said second metal layer is under a bottom surface of said second semiconductor substrate, wherein said first metal interconnect is further over said second chip and connected to said third metal plug.

7. The system-in package of claim 1, wherein said first metal plug passes through said first chip and contacts a contact point of said carrier.

8. The system-in package of claim 1 further comprising a third metal plug in said first chip, a fourth metal plug in said second chip, and a third metal interconnect in said first dielectric structure and over said first and second chips, wherein said third metal plug passes through said first semiconductor substrate and contacts a second metal layer of said first chip, wherein said second metal layer is under said bottom surface of said first semiconductor substrate, wherein said fourth metal plug passes through said second semiconductor substrate and contacts a third metal layer of said second chip, wherein said third metal layer is under a bottom surface of said second semiconductor substrate, wherein said third metal interconnect connects said third metal plug and said fourth metal plug.

9. The system-in package of claim 1, wherein said first chip has a different circuit design from a circuit design of said second chip.

10. The system-in package of claim 1 further comprising a dummy substrate over said carrier and in said gap, wherein said dummy substrate has a top surface substantially coplanar with said top surface of said first semiconductor substrate, wherein said first dielectric structure is further on said top surface of said dummy substrate.

11. The system-in package of claim 1 further comprising a metal bump connected to said second metal interconnect, wherein said metal bump comprises one of tin, copper, nickel, and gold.

12. The system-in package of claim 1, wherein said first metal interconnect comprises one of a signal trace, a power trace, and a ground trace.

13. The system-in package of claim 1, wherein said first insulating material comprises a sidewall dielectric layer on a sidewall of said first metal plug and on a top surface of said first metal layer, wherein said first metal plug is enclosed by said sidewall dielectric layer.

14. The system-in package of claim 1, wherein said second insulating material comprises an insulating ring in said third semiconductor substrate, wherein said second metal plug passes through and is enclosed by said insulating ring.

15. The system-in package of claim 1, wherein said second metal plug comprises an electroplated copper and a titanium-containing or tantalum-containing layer enclosing said electroplated copper.

16. The system-in package of claim 1, wherein said first metal interconnect comprises an electroplated copper layer and a titanium-containing or tantalum-containing layer at multiple sidewalls and a bottom of said electroplated copper layer, wherein said electroplated copper layer is in said first dielectric structure and over said first chip.

17. The system-in package of claim 1, wherein said first metal interconnect comprises an electroplated copper layer and a titanium-containing or tantalum-containing layer at a bottom of said electroplated copper layer but not at any sidewall of said electroplated copper layer, wherein said electroplated copper layer is in said first dielectric structure and over said first chip.

18. The system-in package of claim 1 further comprising a third metal plug in said third chip, wherein said third metal plug passes through said third semiconductor substrate and contacts a second metal layer of said third chip, wherein said second metal layer is under a bottom surface of said third semiconductor substrate, wherein said second metal interconnect is further connected to said third metal plug.

19. The system-in package of claim 18, wherein a total number of bit lines in parallel data communication between said first and third chips is more than 128, and one of said bit lines is provided by said first, second and third metal plugs and said first and second metal interconnects.

20. The system-in package of claim 1, wherein said first metal interconnect has a top surface substantially coplanar with a top surface of said first dielectric structure.

* * * * *